US011600790B2

(12) United States Patent
Hatakeyama et al.

(10) Patent No.: US 11,600,790 B2
(45) **Date of Patent: *Mar. 7, 2023**

(54) POLYCYCLIC AROMATIC COMPOUND FOR ORGANIC ELECTROLUMINESCENT DEVICE

(71) Applicants: Kwansei Gakuin Educational Foundation, Nishinomiya (JP); SK Materials JNC Co., Ltd., Gyeonggi-do (KR)

(72) Inventors: Takuji Hatakeyama, Hyogo (JP); Akio Tajima, Chiba (JP); Akihide Mizutani, Chiba (JP); Daisuke Baba, Chiba (JP); Yuko Yamaga, Chiba (JP)

(73) Assignees: Kwansei Gakuin Educational Foundation, Hyogo (JP); SK Materials JNC Co., Ltd., Gyeonggi-do (KR)

( * ) Notice: Subject to any disclaimer, the term of this patent is extended or adjusted under 35 U.S.C. 154(b) by 350 days.

This patent is subject to a terminal disclaimer.

(21) Appl. No.: 16/625,700

(22) PCT Filed: Jun. 18, 2018

(86) PCT No.: PCT/JP2018/023072

§ 371 (c)(1),
(2) Date: Dec. 21, 2019

(87) PCT Pub. No.: WO2019/009052

PCT Pub. Date: Jan. 10, 2019

(65) Prior Publication Data

US 2021/0167288 A1 Jun. 3, 2021

(30) Foreign Application Priority Data

Jul. 7, 2017 (JP) ............................ JP2017-133654
Dec. 25, 2017 (JP) ............................ JP2017-247187

(51) Int. Cl.
*H01L 51/00* (2006.01)
*C07F 5/02* (2006.01)
(Continued)

(52) U.S. Cl.
CPC ........... *H01L 51/008* (2013.01); *C07F 5/027* (2013.01); *C09K 11/06* (2013.01);
(Continued)

(58) Field of Classification Search
CPC ............... H01L 51/008; H01L 51/5012; H01L 51/5016; H01L 51/5072; H01L 51/5092; C07F 5/027; C09K 11/06
See application file for complete search history.

(56) References Cited

U.S. PATENT DOCUMENTS 11,248,009 B2 * 2/2022 Hatakeyama ............. C07F 5/02
2004/0131881 A1 7/2004 Zheng et al.
(Continued)

FOREIGN PATENT DOCUMENTS

EP 3109253 A1 12/2016
EP 3345911 A1 7/2018
(Continued)

OTHER PUBLICATIONS

RN 2182628-31-3, Registry [Online] American Chemical Society, entered Mar. 1, 2018, retrieved Sep. 4, 2018, 1 page.
(Continued)

*Primary Examiner* — Michael Jung
(74) *Attorney, Agent, or Firm* — Foley & Lardner LLP

(57) ABSTRACT

By using a polycyclic aromatic compound as a material for a light-emitting layer, formed by connecting a plurality of aromatic rings with a boron atom and an oxygen, sulfur, or selenium atom, which have been substituted by a specific
(Continued)

aryl such as anthracene, an organic EL element having at least one of excellent quantum efficiency and element life can be provided.

13 Claims, 1 Drawing Sheet

(51) Int. Cl.
*C09K 11/06* (2006.01)
*H01L 51/50* (2006.01)

(52) U.S. Cl.
CPC ................ *C09K 2211/1007* (2013.01); *C09K 2211/1018* (2013.01); *H01L 51/5012* (2013.01); *H01L 51/5016* (2013.01); *H01L 51/5072* (2013.01); *H01L 51/5092* (2013.01)

(56) References Cited

U.S. PATENT DOCUMENTS

| | | | |
|---|---|---|---|
| 2005/0202279 A1 | 9/2005 | Zheng et al. | |
| 2007/0106103 A1 | 5/2007 | Ikeda et al. | |
| 2015/0236274 A1 | 8/2015 | Hatakeyama et al. | |
| 2018/0069182 A1 | 3/2018 | Hatakeyama et al. | |
| 2020/0176679 A1 | 6/2020 | Jeong et al. | |
| 2020/0266350 A1* | 8/2020 | Hatakeyama .......... | C09K 11/06 |

FOREIGN PATENT DOCUMENTS

| | | |
|---|---|---|
| JP | 2001-172232 A | 6/2001 |
| JP | 2005-170911 A | 6/2005 |
| JP | 2018-043984 A | 3/2018 |
| JP | 2020-520976 A | 7/2020 |
| KR | 10-1876763 B1 | 7/2018 |
| WO | WO 2004/061047 A2 | 7/2004 |
| WO | WO 2015/102118 A1 | 7/2015 |

OTHER PUBLICATIONS

RN 2182628-32-4, Registry [Online] American Chemical Society, entered Mar. 1, 2018, retrieved Sep. 4, 2018, 1 page.
RN 2182628-34-6, Registry [Online] American Chemical Society, entered Mar. 1, 2018, retrieved Sep. 4, 2018, 1 page.
RN 2182628-33-5, Registry [Online] American Chemical Society, entered Mar. 1, 2018, retrieved Sep. 4, 2018, 1 page.
RN 2182628-35-7, Registry [Online] American Chemical Society, entered Mar. 1, 2018, retrieved Sep. 4, 2018, 1 page.
Office Action dated Jan. 12, 2022 in JP 2019-527609, with English translation.

* cited by examiner

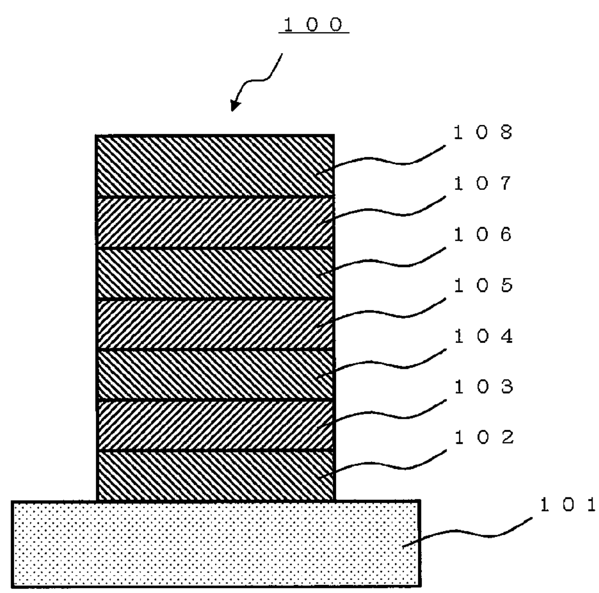
100
108
107
106
105
104
103
102
101

POLYCYCLIC AROMATIC COMPOUND FOR ORGANIC ELECTROLUMINESCENT DEVICE

CROSS-REFERENCE TO RELATED APPLICATIONS

This application is the U.S. National Stage of PCT/JP2018/023072, filed Jun. 18, 2018, which claims priority to JP 2017-133654, filed Jul. 7, 2017, and JP 2017-247187, filed Dec. 25, 2017.

TECHNICAL FIELD

The present invention relates to a polycyclic aromatic compound, and an organic device such as an organic electroluminescent element, an organic field effect transistor, and an organic thin film solar cell using the polycyclic aromatic compound, as well as a display apparatus and a lighting apparatus.

BACKGROUND ART

Conventionally, a display apparatus employing a luminescent element that is electroluminescent can be subjected to reduction of power consumption and thickness reduction, and therefore various studies have been conducted thereon. Furthermore, an organic electroluminescent element (hereinafter, referred to as an organic EL element) formed from an organic material has been studied actively because weight reduction or size expansion can be easily achieved. Particularly, active studies have been hitherto conducted on development of an organic material having light emitting characteristics for blue light which is one of the primary colors of light, or the like, and a combination of a plurality of materials having optimum light emitting characteristics, irrespective of whether the organic material is a high molecular weight compound or a low molecular weight compound.

An organic EL element has a structure having a pair of electrodes composed of a positive electrode and a negative electrode, and a single layer or a plurality of layers disposed between the pair of electrodes and containing an organic compound. The layer containing an organic compound includes a light emitting layer and a charge transport/injection layer for transporting or injecting charges such as holes or electrons. Various organic materials suitable for these layers have been developed.

As a material for a light emitting layer, for example, a benzofluorene-based compound has been developed (WO 2004/061047 A). Furthermore, as a hole transport material, for example, a triphenylamine-based compound has been developed (JP 2001-172232 A). Furthermore, as an electron transport material, for example, an anthracene-based compound has been developed (JP 2005-170911 A).

Furthermore, in recent years, a compound having a plurality of aromatic rings fused with a boron atom or the like as a central atom has also been reported (WO 2015/102118 A). This literature has evaluated an organic EL element in a case where the compound having a plurality of aromatic rings fused is selected as a dopant material of a light emitting layer, and particularly an anthracene-based compound (BH1 on page 442) or the like is selected among a very large number of materials described as a host material. However, a combination other than the above combination has not been specifically verified. Furthermore, if a combination constituting the light emitting layer is different, light emitting characteristics are also different. Therefore, characteristics obtained from another combination have not been found.

CITATION LIST

Patent Literature

Patent Literature WO 2004/061047 A
Patent Literature JP 2001-172232 A
Patent Literature JP 2005-170911 A
Patent Literature WO 2015/102118 A

SUMMARY OF INVENTION

Technical Problem

As described above, various materials used in an organic EL element have been developed. However, in order to further enhance light emitting characteristics or to increase options of a material for a light emitting layer, it is desired to develop a combination of materials different from a conventional combination. Particularly, organic EL characteristics (particularly optimal light emitting characteristics) obtained from a combination other than the specific combination of host and dopant reported in Examples of WO 2015/102118 A have not been found.

Solution to Problem

As a result of intensive studies to solve the above problems, the present inventors have found that an excellent organic EL element can be obtained by disposing a light emitting layer containing a compound having a plurality of aromatic rings linked with a boron atom and an oxygen atom, a sulfur atom or a selenium atom between a pair of electrodes to constitute an organic EL element, and have completed the present invention.

Item 1. A polycyclic aromatic compound represented by the following formula (1).

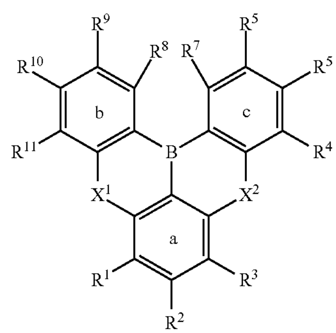

(1)

(In the above formula (1), $X^1$ and $X^2$ each independently represent >O, >S, or >Se, $R^1$, $R^2$, $R^3$, $R^4$, $R^5$, $R^6$, $R^7$, $R^8$, $R^9$, $R^{10}$, and $R^{11}$ each independently represent a hydrogen atom, an alkyl, or an aryl optionally substituted by an alkyl, adjacent groups of $R^1$ to $R^{11}$ may be bonded to each other to form an aryl ring together with ring a, ring b, or ring c, at least one hydrogen atom in the aryl ring thus formed may be substituted by an alkyl, at least one of $R^1$ to $R^{11}$ each independently represent a group represented by the following formula (Z-1), (Z-2), (Z-3), (Z-4), (Z-5), or (Z-6), (Z-1)
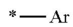
(Z-2)
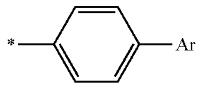
(Z-3)
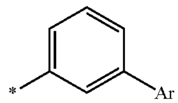
(Z-4)
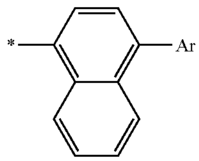
(Z-5)
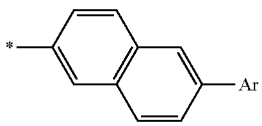
(Z-6)
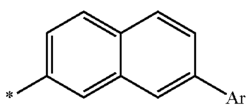

the group represented by each of the above formulas (Z-1) to (Z-6) is bonded to the compound represented by the above formula (1) at * in each of the formulas, Ar's in the above formulas (Z-1) to (Z-6) each independently represent a group represented by the following formula (Ar-1), (Ar-2), (Ar-3), (Ar-4), (Ar-5), (Ar-6), (Ar-7), (Ar-8), (Ar-9), (Ar-10), (Ar-11), or (Ar-12), (Ar-1)
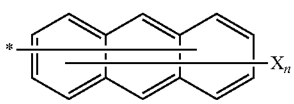
(Ar-2)
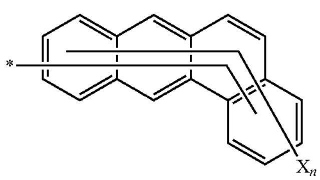
(Ar-3)
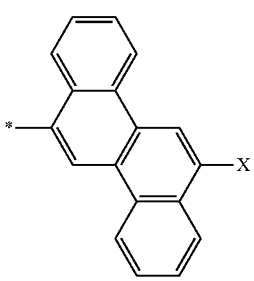

-continued (Ar-4)
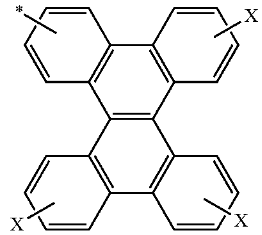
(Ar-5)
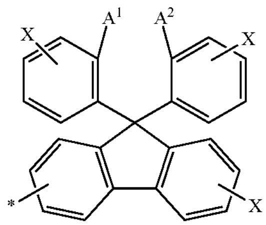
(Ar-6)
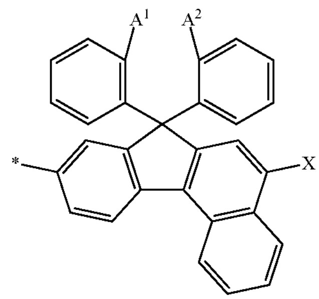
(Ar-7)
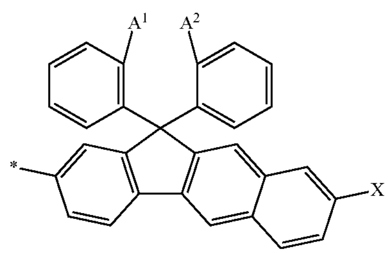
(Ar-8)
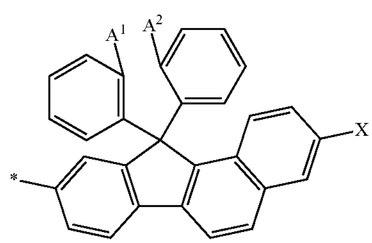
(Ar-9)
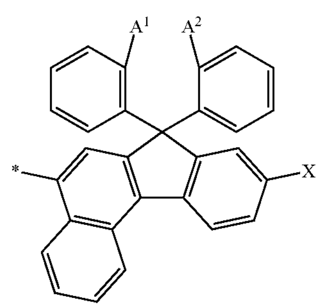

-continued (Ar-10)

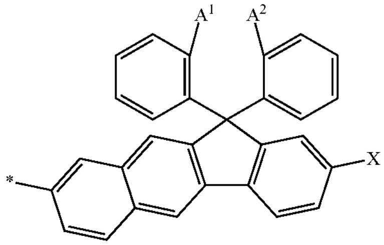

(Ar-11)

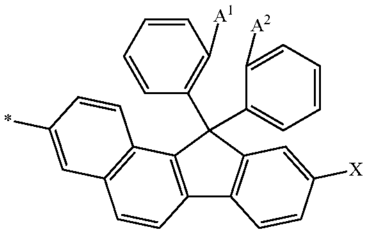

(Ar-12)

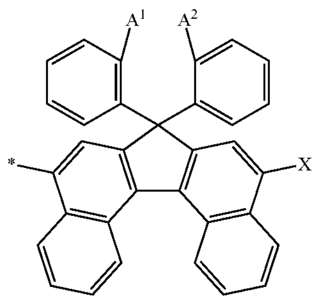

the group represented by each of the above formulas (Ar-1) to (Ar-12) is bonded to the group represented by each of the above formulas (Z-1) to (Z-6) at * in each of the formulas, in the above formulas (Ar-1) to (Ar-12), X's each independently represent a hydrogen atom, an alkyl having 1 to 4 carbon atoms, an aryl having 6 to 18 carbon atoms optionally substituted by an alkyl having 1 to 4 carbon atoms, or a heteroaryl having 2 to 18 carbon atoms optionally substituted by an alkyl having 1 to 4 carbon atoms, $A^1$ and $A^2$ both represent hydrogen atoms or may be bonded to each other to form a Spiro ring, "—Xn" in formulas (Ar-1) and (Ar-2) indicates that nX's are each independently bonded to an arbitrary position, n represents an integer of 1 to 4, and at least one hydrogen atom in the compound represented by the above formula (1) may be substituted by a deuterium atom.)

Item 2. The polycyclic aromatic compound according to Item 1, wherein in the above formula (1), $X^1$ and $X^2$ each independently represent >O, >S, or >Se, $R^1$ to $R^{11}$ each independently represent a hydrogen atom, an alkyl having 1 to 12 carbon atoms, or an aryl having 6 to 24 carbon atoms optionally substituted by an alkyl having 1 to 12 carbon atoms, adjacent groups of $R^1$ to $R^{11}$ may be bonded to each other to form an aryl ring having 10 to 20 carbon atoms together with ring a, ring b, or ring c, at least one hydrogen atom in the aryl ring thus formed may be substituted by an alkyl having 1 to 12 carbon atoms, one or two of $R^1$ to $R^{11}$ each independently represent a group represented by the above formula (Z-1), (Z-2), (Z-3), (Z-4), (Z-5), or (Z-6), Ar's in the above formulas (Z-1) to (Z-6) each independently represent a group represented by the above formula (Ar-1), (Ar-2), (Ar-3), (Ar-4), (Ar-5), (Ar-6), (Ar-7), (Ar-8), (Ar-9), (Ar-10), (Ar-11), or (Ar-12), in the above formulas (Ar-1) to (Ar-12), X's each independently represent a hydrogen atom, an alkyl having 1 to 4 carbon atoms, an aryl having 6 to 18 carbon atoms optionally substituted by an alkyl having 1 to 4 carbon atoms, or a heteroaryl having 4 to 16 carbon atoms optionally substituted by an alkyl having 1 to 4 carbon atoms, $A^1$ and $A^2$ both represent hydrogen atoms or may be bonded to each other to form a Spiro ring, "—Xn" in formulas (Ar-1) and (Ar-2) indicates that nX's are each independently bonded to an arbitrary position, n represents an integer of 1 to 4, and at least one hydrogen atom in the compound represented by the above formula (1) may be substituted by a deuterium atom.

Item 3. The polycyclic aromatic compound according to Item 1, wherein in the above formula (1), $X^1$ and $X^2$ each represent >O, $R^1$ to $R^{11}$ each independently represent a hydrogen atom, an alkyl having 1 to 6 carbon atoms, or an aryl having 6 to 18 carbon atoms optionally substituted by an alkyl having 1 to 6 carbon atoms, adjacent groups of $R^1$ to $R^{11}$ may be bonded to each other to form an aryl ring having 10 to 18 carbon atoms together with ring a, ring b, or ring c, at least one hydrogen atom in the aryl ring thus formed may be substituted by an alkyl having 1 to 6 carbon atoms, one or two of $R^1$ to $R^{11}$ each independently represent a group represented by the above formula (Z-1), (Z-2), (Z-3), (Z-4), (Z-5), or (Z-6), Ar's in the above formulas (Z-1) to (Z-6) each independently represent a group represented by the following formula (Ar-1-1), (Ar-1-2), (Ar-2-1), (Ar-2-2), (Ar-2-3), (Ar-3), (Ar-4-1), (Ar-5-1), (Ar-5-2), (Ar-5-3), (Ar-6), (Ar-7), (Ar-8), (Ar-9), (Ar-10), (Ar-11), or (Ar-12), (Ar-1-1)

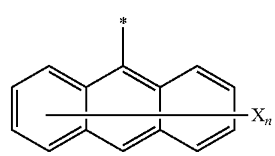

(Ar-1-2)

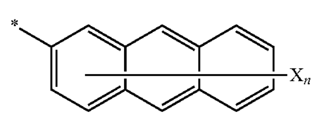

(Ar-3)

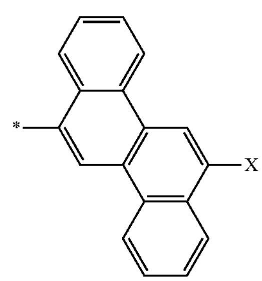

-continued
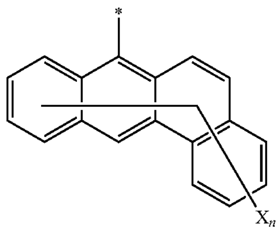
(Ar-2-1)
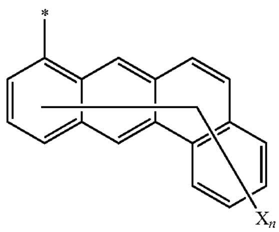
(Ar-2-2)
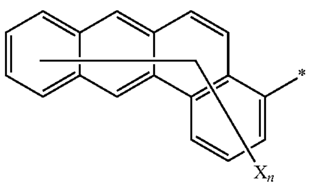
(Ar-2-3)
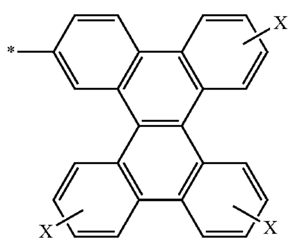
(Ar-4-1)
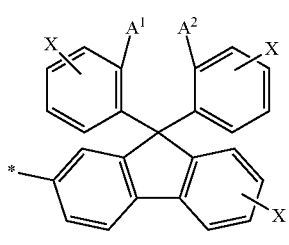
(Ar-5-1)
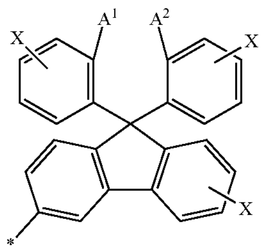
(Ar-5-2)
-continued
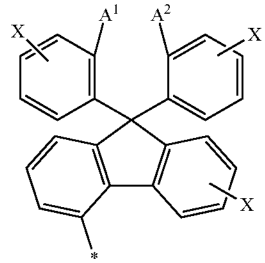
(Ar-5-3)
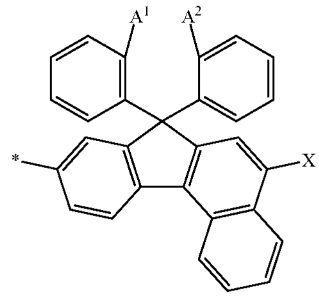
(Ar-6)
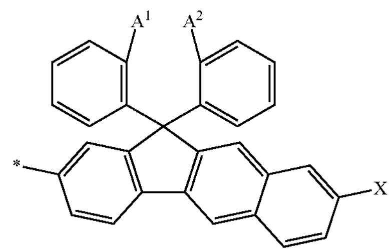
(Ar-7)
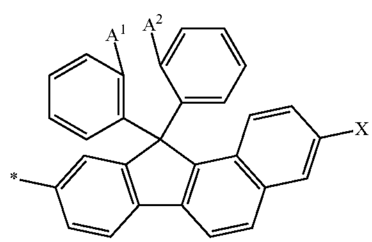
(Ar-8)
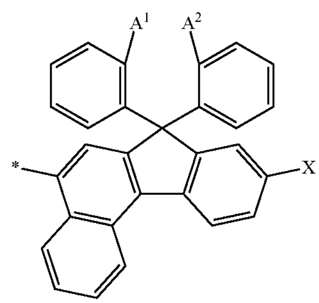
(Ar-9)
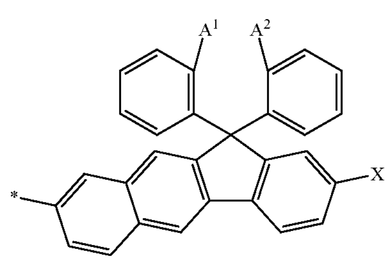
(Ar-10)

-continued (Ar-11)

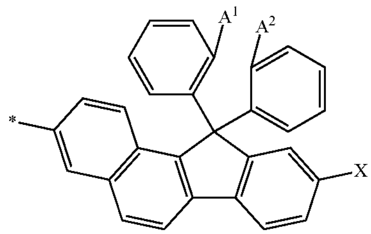

(Ar-12)

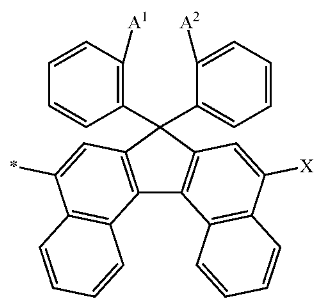

in the above formulas (Ar-1-1) to (Ar-12), X's each independently represent a hydrogen atom, an alkyl having 1 to 4 carbon atoms, or an aryl having 6 to 10 carbon atoms, $A^1$ and $A^2$ both represent hydrogen atoms or may be bonded to each other to form a Spiro ring, "—Xn" in formulas (Ar-1-1), (Ar-1-2), (Ar-2-1), (Ar-2-2), and (Ar-2-3) indicates that nX's are each independently bonded to an arbitrary position, n represents an integer of 1 or 2.

Item 4. The polycyclic aromatic compound according to Item 1, which is represented by any one of the following formulas.

(1-1)

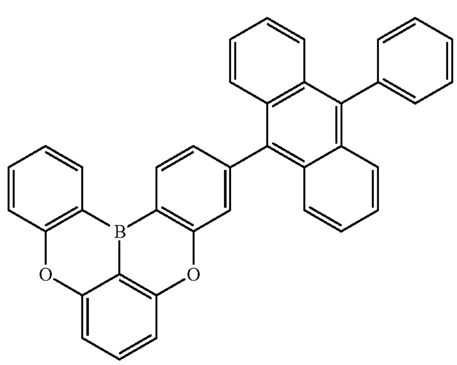

-continued (1-2)

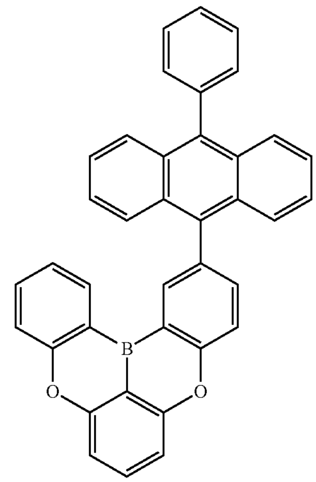

(1-4)

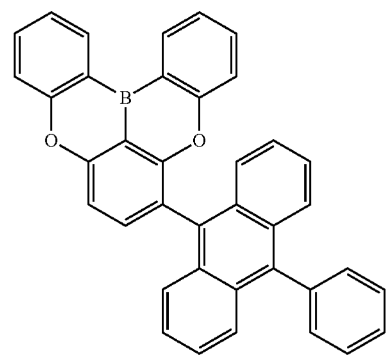

(1-3)

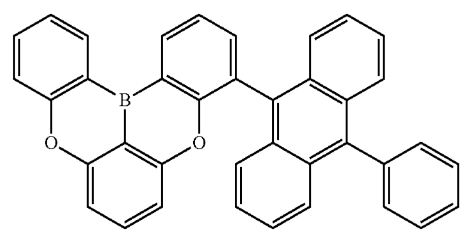

(1-5)

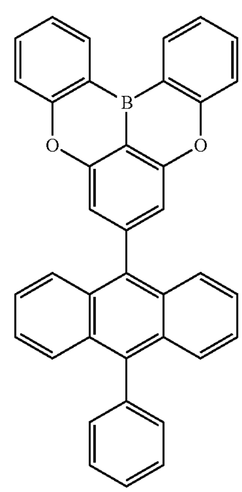

-continued
(1-121)
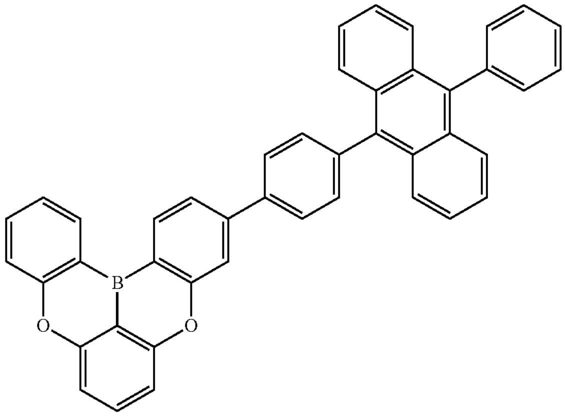
(1-122)
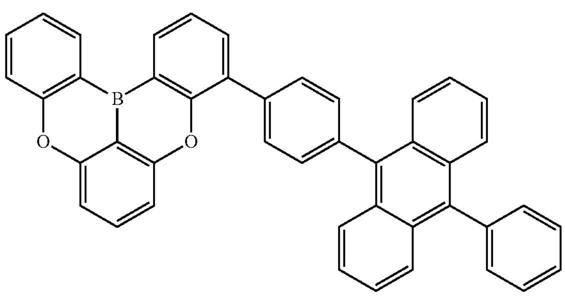
(1-123)
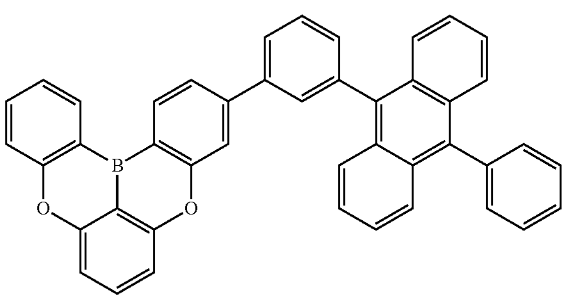
-continued
(1-124)
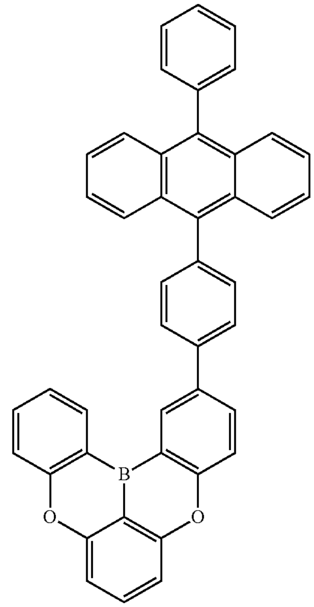
(1-144)
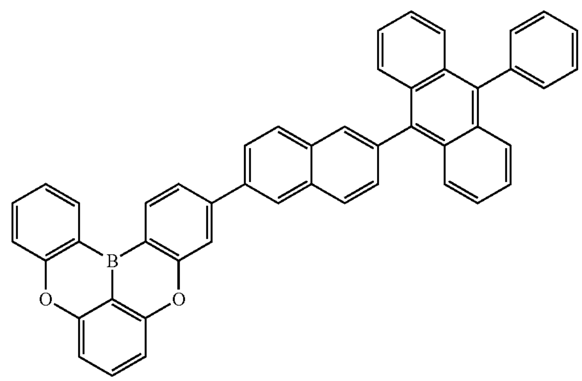
(1-145)
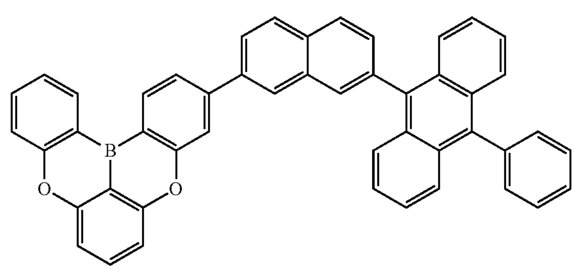

-continued
(1-146)
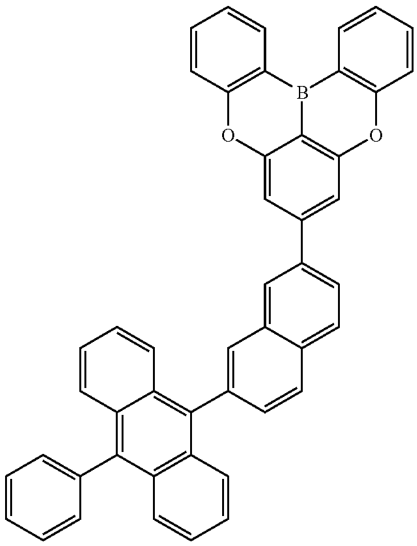
(1-147)
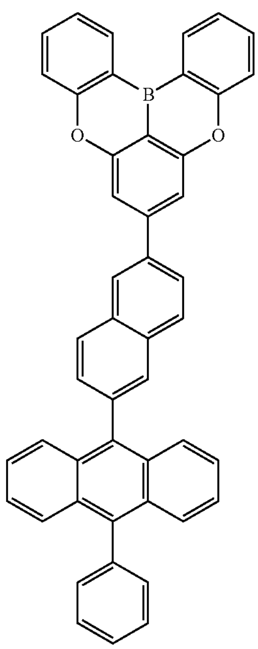
-continued
(1-148)
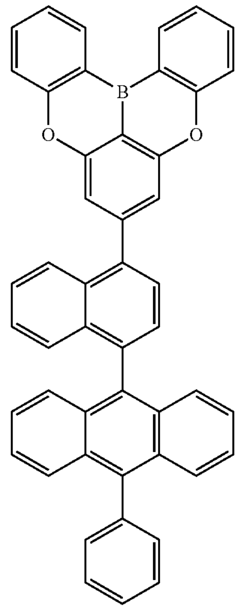
(1-156)
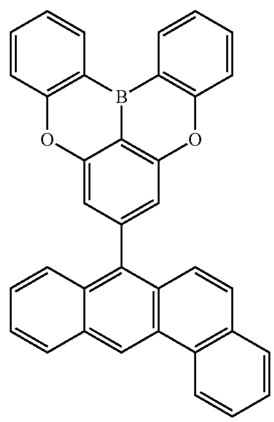
(1-174)
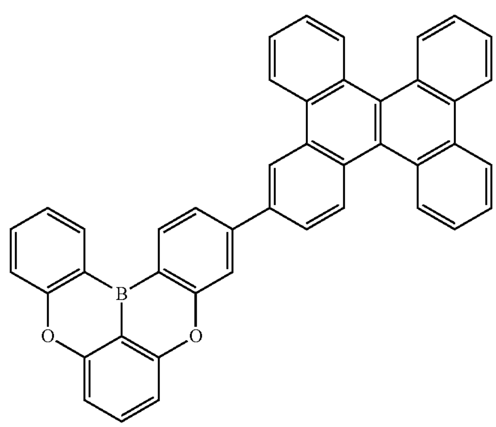

-continued
(1-191)
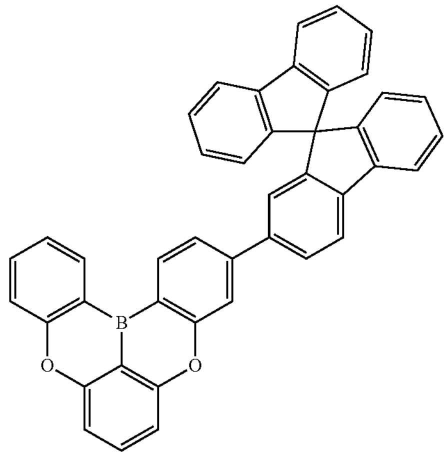
(1-198)
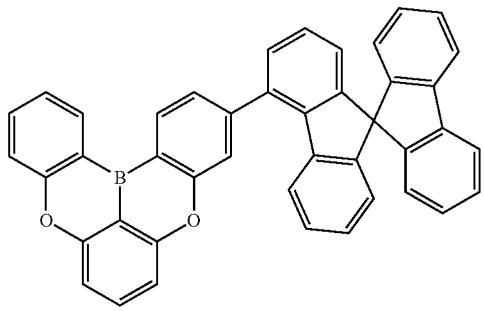
(1-221)
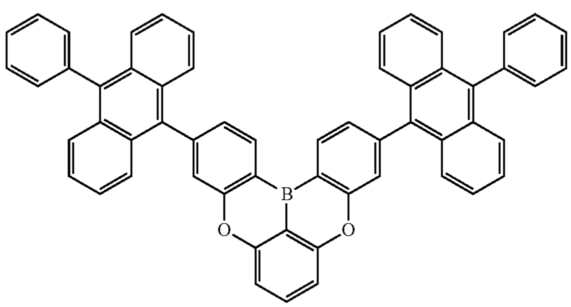
(1-12)
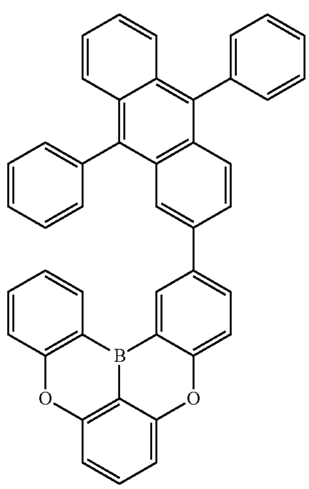
-continued
(1-46)
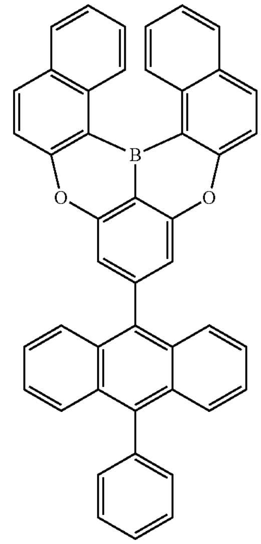
(1-52)
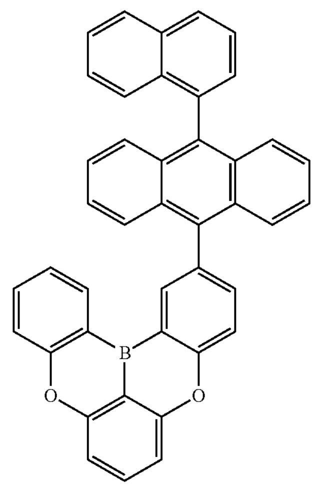
(1-55)
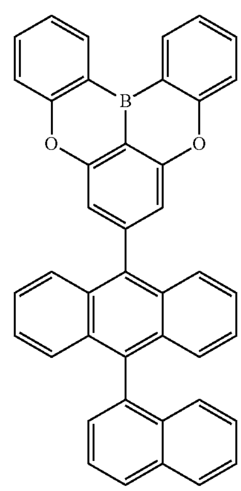

(1-57)

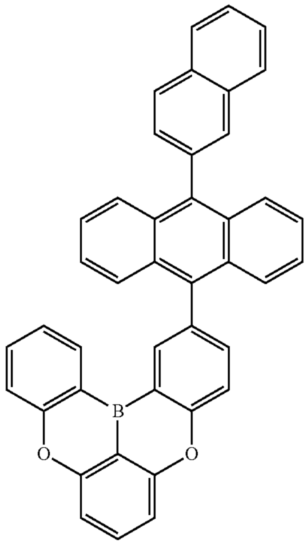

(1-82)

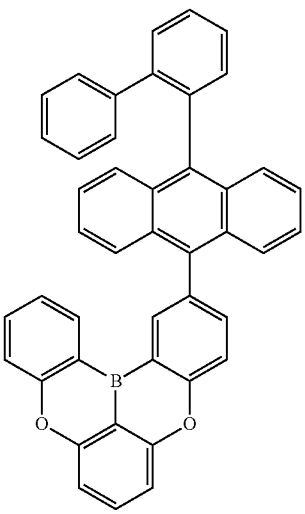

(1-85)

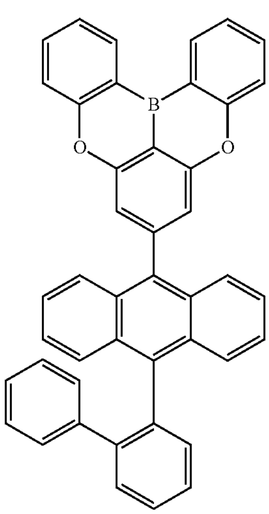

(1-102)

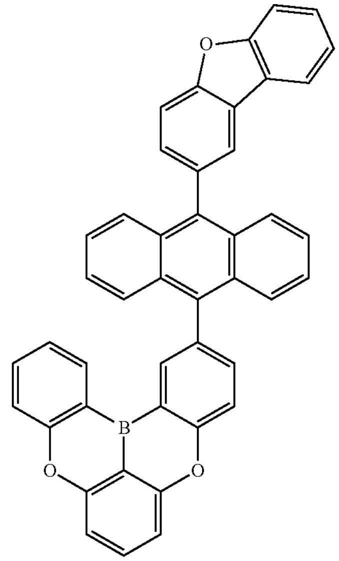

(1-166)

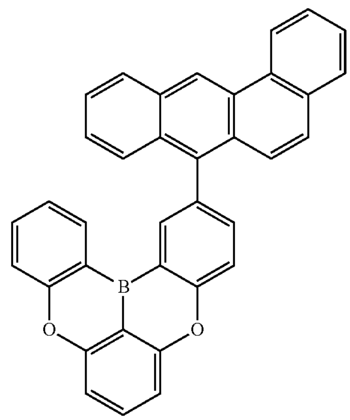

(1-182)

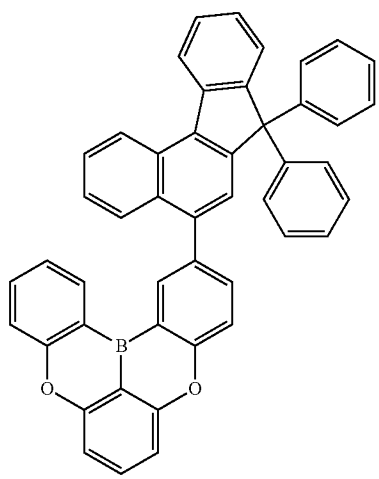

Item 5. A material for an organic device, comprising the polycyclic aromatic compound according to any one of Items 1 to 4.

Item 6. The material for an organic device according to Item 5, wherein the material for an organic device is a material for an organic electroluminescent element, a material for an organic field effect transistor, or a material for an organic thin film solar cell.

Item 7. The material for an organic electroluminescent element according to Item 6, which is a material for a light emitting layer.

Item 8. The material for a light emitting layer according to Item 7, wherein further comprising at least one of a polycyclic aromatic compound represented by the following general formula (2) and a multimer having a plurality of structures represented by the following general formula (2).

(2)

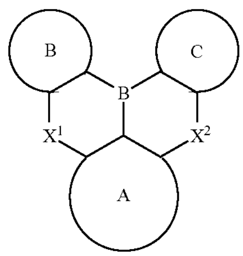

(In the above formula (2), ring A, ring B and ring C each independently represent an aryl ring or a heteroaryl ring, while at least one hydrogen atom in these rings may be substituted, $X^1$ and $X^2$ each independently represent >O or >N—R, R of the >N—R is an optionally substituted aryl, an optionally substituted heteroaryl or an optionally substituted alkyl, R of the >N—R may be bonded to the ring A, ring B, and/or ring C with a linking group or a single bond, and at least one hydrogen atom in a compound or a structure represented by formula (2) may be substituted by a halogen atom, a cyano or a deuterium atom.)

Item 9. An organic electroluminescent element comprising: a pair of electrodes composed of a positive electrode and a negative electrode; and a light emitting layer disposed between the pair of electrodes and comprising the material for a light emitting layer according to Item 7 or 8.

Item 10. The organic electroluminescent element according to Item 9, further comprising an electron transport layer and/or an electron injection layer disposed between the negative electrode and the light emitting layer, wherein at least one of the electron transport layer and the electron injection layer contains at least one selected from the group consisting of a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, and a quinolinol-based metal complex.

Item 11. The organic electroluminescent element according to Item 10, wherein the electron transport layer and/or electron injection layer further include/includes at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

Item 12. A display apparatus comprising the organic electroluminescent element according to any one of Items 9 to 11.

Item 13. A lighting apparatus comprising the organic electroluminescent element according to any one of Items 9 to 11.

Advantageous Effects of Invention

According to a preferable embodiment of the present invention, it is possible to provide an organic EL element that is excellent in at least one of quantum efficiency, and lifetime of the element by manufacturing an organic EL element using a material for a light emitting layer comprising a polycyclic aromatic compound represented by formula (1), especially a material for a light emitting layer comprising at least one of a polycyclic aromatic compound represented by formula (2) and a multimer having a plurality of structures represented by the following general formula (2), capable of obtaining optimum light emitting characteristics in combination with the polycyclic aromatic compound represented by formula (1).

BRIEF DESCRIPTION OF DRAWINGS

FIG. 1 is a schematic cross-sectional view illustrating an organic EL element according to the present embodiment.

DESCRIPTION OF EMBODIMENTS

1. Polycyclic Aromatic Compound Represented by General Formula (1)

The present invention relates to a polycyclic aromatic compound represented by general formula (1).

(1)

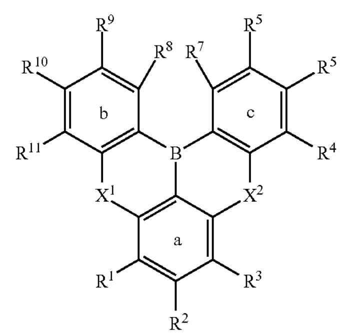

$X^1$ and $X^2$ in general formula (1) each independently represent >O, >S, or >Se. Preferably, at least one of $X^1$ and $X^2$ represents >O. More preferably, both $X^1$ and $X^2$ represent >O.

$R^1$, $R^2$, $R^3$, $R^4$, $R^5$, $R^6$, $R^7$, $R^8$, $R^9$, $R^{10}$, and $R^{11}$ in general formula (1) each independently represent a hydrogen atom, an alkyl, or an aryl optionally substituted by an alkyl. However, as described later, at least one of $R^1$ to $R^{11}$ each independently represent a group represented by formula (Z-1), (Z-2), (Z-3), (Z-4), (Z-5), or (Z-6).

The "alkyl" in $R^1$ to $R^{11}$ and the "alkyl" by which the "aryl" is optionally substituted may be linear or branched, and example thereof include a linear alkyl having 1 to 24 carbon atoms and a branched alkyl having 3 to 24 carbon atoms. The "alkyl" is preferably an alkyl having 1 to 18 carbon atoms (branched alkyl having 3 to 18 carbon atoms), more preferably an alkyl having 1 to 12 carbon atoms (branched alkyl having 3 to 12 carbon atoms, still more preferably an alkyl having 1 to 6 carbon atoms (branched alkyl having 3 to 6 carbon atoms), and particularly preferably an alkyl having 1 to 4 carbon atoms (branched alkyl having 3 or 4 carbon atoms).

Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Examples of the "aryl" in $R^1$ to $R^{11}$ include an aryl having 6 to 30 carbon atoms. The "aryl" is preferably an aryl having 6 to 24 carbon atoms, more preferably an aryl having 6 to 18 carbon atoms, still more preferably an aryl having 6 to 16 carbon atoms, particularly preferably an aryl having 6 to 12 carbon atoms, and most preferably an aryl having 6 to 10 carbon atoms.

Specific examples of the "aryl" include phenyl which is a monocyclic aryl; biphenylyl which is a bicyclic aryl; naphthyl (1-naphthyl or 2-naphthyl) which is a fused bicyclic aryl; terphenylyl (m-terphenylyl, o-terphenylyl, or p-terphenylyl) which is a tricyclic aryl; acenaphthylenyl, fluorenyl, phenalenyl, and phenanthrenyl which are fused tricyclic aryls; triphenylenyl, pyrenyl, and naphthacenyl which are fused tetracyclic aryls; and perylenyl and pentacenyl which are fused pentacyclic aryls.

In general formula (1), adjacent groups among the substituents $R^1$ to $R^{11}$ of the ring a, ring b, and ring c may be bonded to each other to form an aryl ring together with the ring a, ring b, and ring c, respectively. Therefore, in the polycyclic aromatic compound represented by general formula (1), a ring structure constituting the compound changes as represented by the following formulas (1A) and (1B) according to a mutual bonding form of substituents in the ring a, ring b, and ring c. Note that the reference numerals in formulas (1A) and (1B) are defined in the same manner as those in formula (1).

(1A)

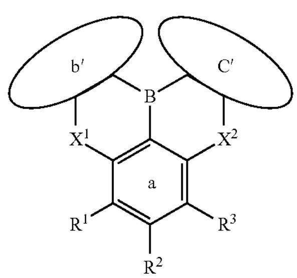

-continued (1B)

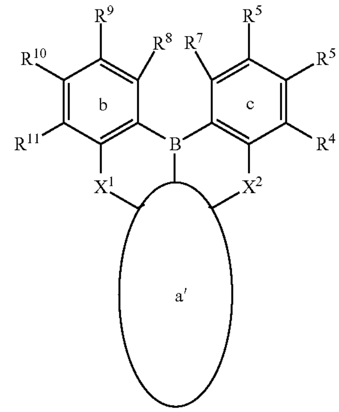

Ring a', ring b', and ring c' in the above formulas (1A) and (1B) each represent an aryl ring formed by bonding adjacent groups among the substituents $R^1$ to $R^{11}$ together with the ring a, ring b, and ring c, respectively (may also be a fused ring obtained by fusing another ring structure to the ring a, ring b, or ring c). Incidentally, although not indicated in a formula, there is also a compound in which all of the ring a, ring b, and ring c have been changed to the ring a', ring b', and ring c', respectively. Furthermore, as apparent from the above formulas (1A) and (1B), for example, $R^8$ of the ring b and $R^7$ of the ring c, $R^{11}$ of the ring b and $R^1$ of the ring a, $R^4$ of the ring c and $R^3$ of the ring a, and the like do not correspond to "adjacent groups", and these groups are not bonded to each other. That is, the term "adjacent groups" means adjacent groups on the same ring.

Examples of the "aryl ring" thus formed include an aryl having 10 to 20 carbon atoms. The "aryl ring" is preferably an aryl ring having 10 to 18 carbon atoms, more preferably an aryl ring having 10 to 16 carbon atoms, still more preferably an aryl ring having 10 to 14 carbon atoms, and particularly preferably an aryl ring having 10 to 12 carbon atoms. For specific examples thereof, the above description of the "aryl" in $R^1$ to $R^{11}$ can be cited.

At least one hydrogen atom in the aryl ring thus formed may be substituted by an alkyl. For detailed description of the alkyl, the above description of the "alkyl" in $R^1$ to $R^{11}$ can be cited.

A compound represented by the above formula (1A) or (1B) corresponds to, for example, a compound represented by any one of formulas (1-41) to (1-48) listed as specific compounds described below. That is, for example, the compound represented by formula (1A) or (1B) is a compound having ring a' (or ring b' or ring c') that is formed by fusing a benzene ring or a phenanthrene ring to a benzene ring which is ring a (or ring b or ring c), and the fused ring a' (or fused ring b' or fused ring c') thus formed is a naphthalene ring or a triphenylene ring.

At least one of $R^1$ to $R^{11}$, preferably one or two thereof, more preferably one thereof each independently represent a group represented by formula (Z-1), (Z-2), (Z-3), (Z-4), (Z-5), or (Z-6). Note that the group represented by each of formulas (Z-1) to (Z-6) is also referred to as an "intermediate group".

(Z-1)
(Z-2)
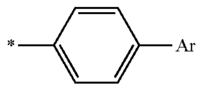
(Z-3)
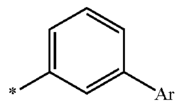
(Z-4)
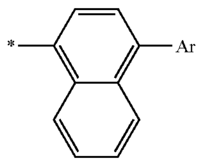
(Z-5)
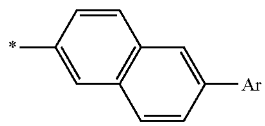
(Z-6)
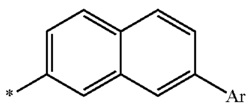
Ar's in the above intermediate groups each independently represent a group represented by formula (Ar-1), (Ar-2), (Ar-3), (Ar-4), (Ar-5), (Ar-6), (Ar-7), (Ar-8), (Ar-9), (Ar-10), (Ar-11), or (Ar-12). Note that the group represented by each of formulas (Ar-1) to (Ar-12) is also referred to as a "terminal group".
(Ar-1)
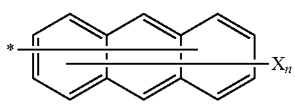
(Ar-2)
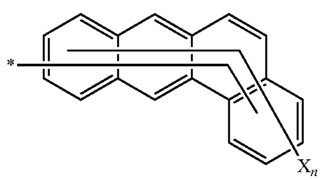
(Ar-3)
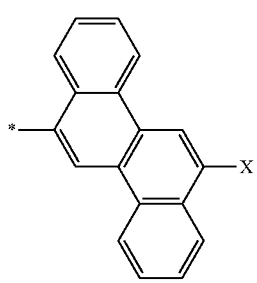
-continued
(Ar-4)
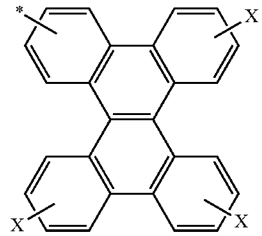
(Ar-5)
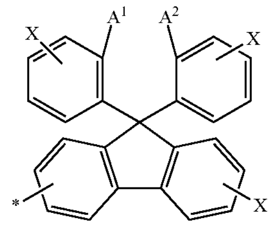
(Ar-6)
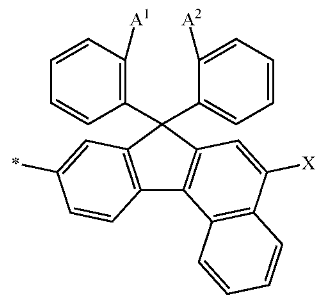
(Ar-7)
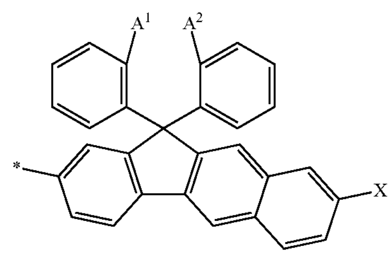
(Ar-8)
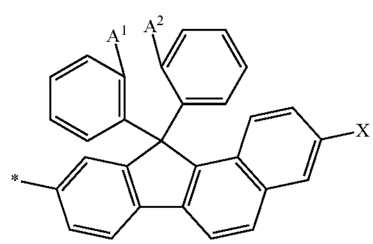
(Ar-9)
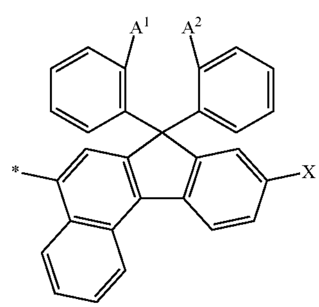

-continued (Ar-10)

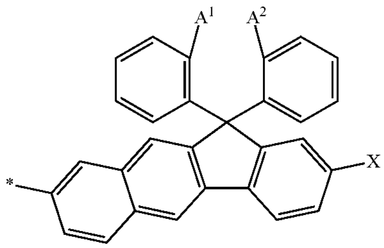

(Ar-11)

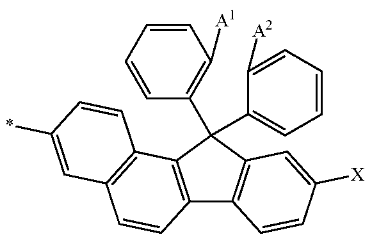

(Ar-12)

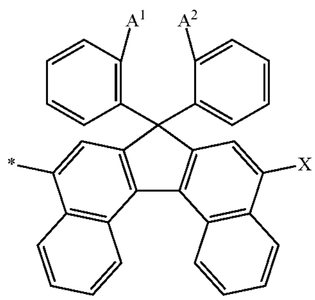

Preferable groups among the groups represented by the above formulas (Ar-1), (Ar-2), (Ar-4), and (Ar-5) are groups represented by the following formulas (Ar-1-1), (Ar-1-2), (Ar-2-1), (Ar-2-2), (Ar-2-3), (Ar-4-1), (Ar-5-1), (Ar-5-2), and (Ar-5-3).

(Ar1-1)

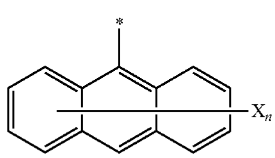

(Ar1-1-2)

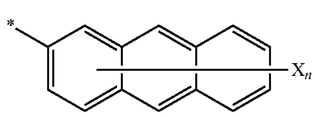

(Ar-2-1)

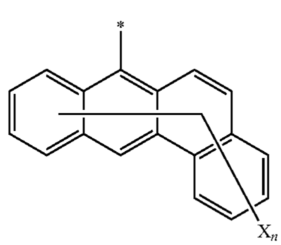

-continued (Ar-2-2)

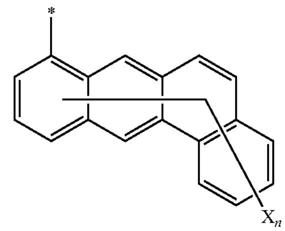

(Ar-2-3)

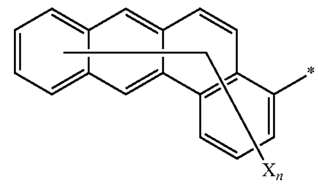

(Ar-4-1)

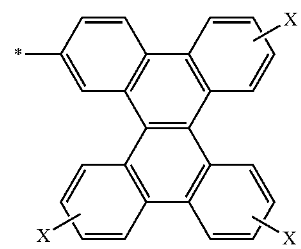

(Ar-5-1)

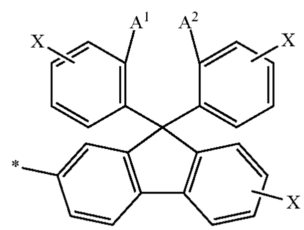

(Ar-5-2)

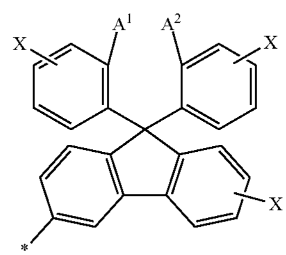

(Ar-5-3)

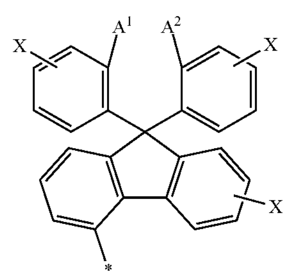

Note that the intermediate group is bonded to the polycyclic aromatic compound represented by the above formula (1) at * in each formula. The terminal group is bonded to the intermediate group at * in each formula.

In the above terminal group, X's each independently represent a hydrogen atom, an alkyl having 1 to 4 carbon atoms, an aryl having 6 to 18 carbon atoms optionally substituted by an alkyl having 1 to 4 carbon atoms, or a heteroaryl having 2 to 18 carbon atoms optionally substituted by an alkyl having 1 to 4 carbon atoms.

Note that "—Xn" in formulas (Ar-1), (Ar-2), (Ar-1-1), (Ar-1-2), (Ar-2-1), (Ar-2-2), and (Ar-2-3) indicates that nX's are each independently bonded to an arbitrary position. n represents an integer of 1 to 4, preferably 1 or 2, more preferably 1.

The "alkyl" in X in the terminal group and the "alkyl" by which the "aryl" or the "heteroaryl" is optionally substituted are each an alkyl having 1 to 4 carbon atoms (branched alkyl having 3 or 4 carbon atoms). Specific example thereof include methyl, ethyl, n-propyl, isopropyl, n-butyl, isobutyl, s-butyl, and t-butyl.

Examples of the "aryl" in X in the terminal group include an aryl having 6 to 18 carbon atoms. The "aryl" is preferably an aryl having 6 to 16 carbon atoms, more preferably an aryl having 6 to 12 carbon atoms, and still more preferably an aryl having 6 to 10 carbon atoms. Specific examples of the "aryl" include phenyl which is a monocyclic aryl; biphenylyl which is a bicyclic aryl; naphthyl (1-naphthyl or 2-naphthyl) which is a fused bicyclic aryl; terphenylyl (m-terphenylyl, o-terphenylyl, or p-terphenylyl) which is a tricyclic aryl; acenaphthylenyl, fluorenyl, phenalenyl, and phenanthrenyl which are fused tricyclic aryls; and triphenylenyl, pyrenyl, and naphthacenyl which are fused tetracyclic aryls.

The "heteroaryl" in X in the terminal group is, for example, a heteroaryl having 2 to 18 carbon atoms, and the heteroaryl is preferably a heteroaryl having 2 to 16 carbon atoms, more preferably a heteroaryl having 4 to 16 carbon atoms, still more preferably a heteroaryl having 4 to 14 carbon atoms, and particularly preferably a heteroaryl having 4 to 12 carbon atoms. Examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the "heteroaryl" include pyrrolyl, oxazolyl, isoxazolyl, thiazolyl, isothiazolyl, imidazolyl, oxadiazolyl, thiadiazolyl, triazolyl, tetrazolyl, pyrazolyl, pyridinyl, pyrimidinyl, pyridazinyl, pyrazinyl, triazinyl, indolyl, isoindolyl, 1H-indazolyl, benzoimidazolyl, benzoxazolyl, benzothiazolyl, 1H-benzotriazolyl, quinolinyl, isoquinolinyl, cinnolinyl, quinazolinyl, quinoxalinyl, phthalazinyl, naphthyridinyl, purinyl, pteridinyl, carbazolyl, acridinyl, phenoxathiinyl, phenoxazinyl, phenothiazinyl, phenazinyl, indolizinyl, furanyl, benzofuranyl, isobenzofuranyl, dibenzofuranyl, naphthobenzofuranyl, thiophenyl, benzothiophenyl, isobenzothiophenyl, dibenzothiophenyl, naphthobenzothiophenyl, furazanyl, oxadiazolyl, and thianthrenyl.

Note that $A^1$ and $A^2$ in the terminal group both represent hydrogen atoms or may be bonded to each other to form a spiro ring. For example, a compound represented by formula (1-195) described later is a compound in which $A^1$ and $A^2$ in the group of formula (Ar-5-1) both represent hydrogen atoms, and a compound represented by each of formulas (1-191) to (1-194) is a compound in which $A^1$ and $A^2$ in the group of formula (Ar-5-1) are bonded to each other to form a spiro ring. A compound represented by formula (1-201) is a compound in which $A^1$ and $A^2$ in the group of formula (Ar-9) are bonded to each other to form a spiro ring.

At least one hydrogen atom in the polycyclic aromatic compound represented by general formula (1) may be substituted by a deuterium atom.

Specific examples of the polycyclic aromatic compound represented by general formula (1) include the following compounds. In each of the structural formulas, "Me" represents a methyl group, and "tBu" represents a tertiary butyl group.

(1-1)

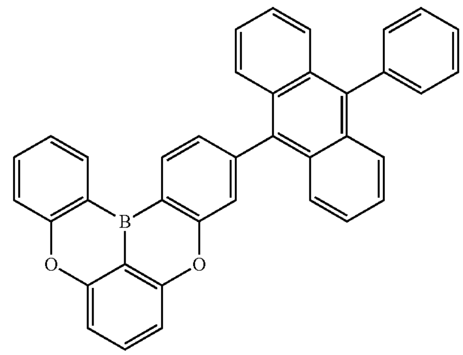

(1-2)

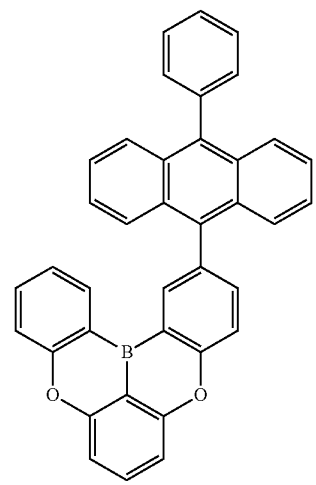

(1-3)

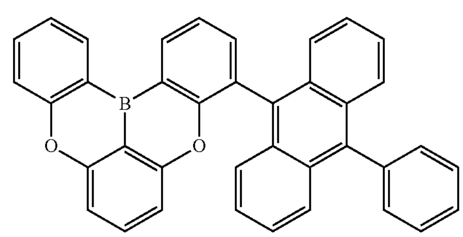

(1-4)

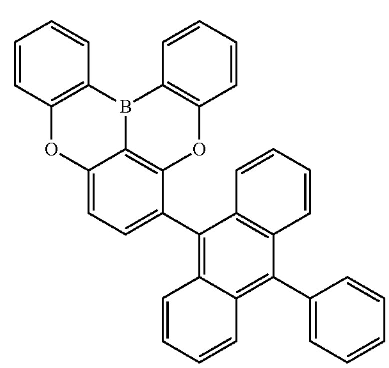

-continued
(1-5)
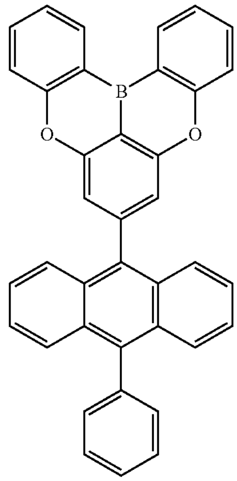
(1-6)
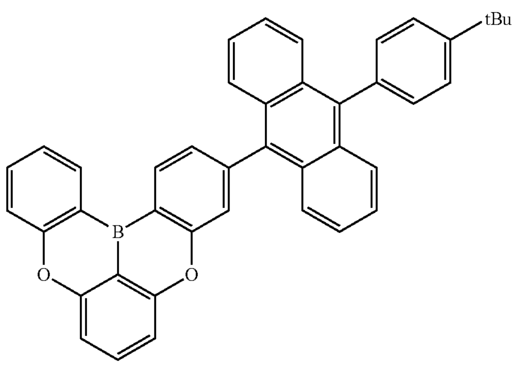
(1-7)
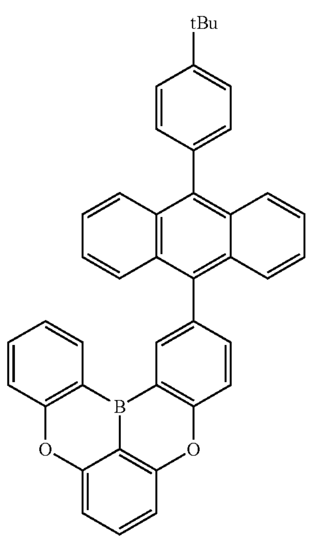
(1-8)
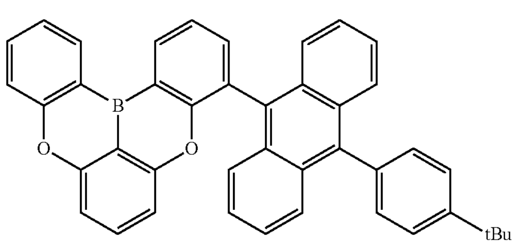
-continued
(1-9)
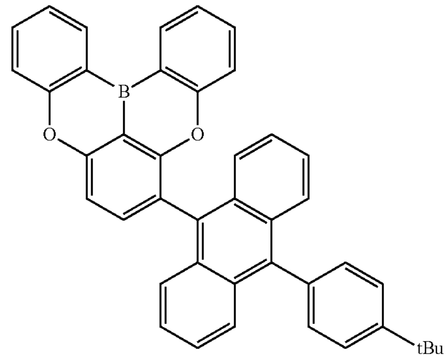
(1-10)
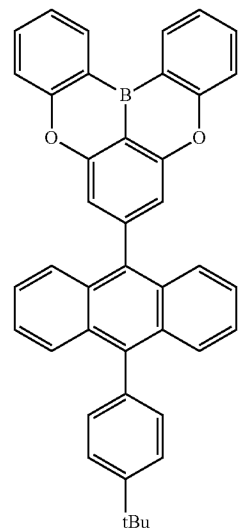
(1-11)
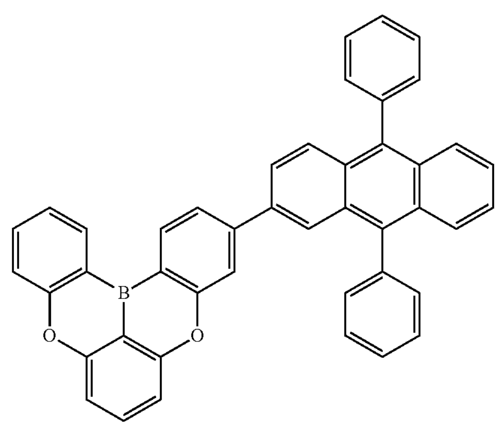

-continued
(1-12)
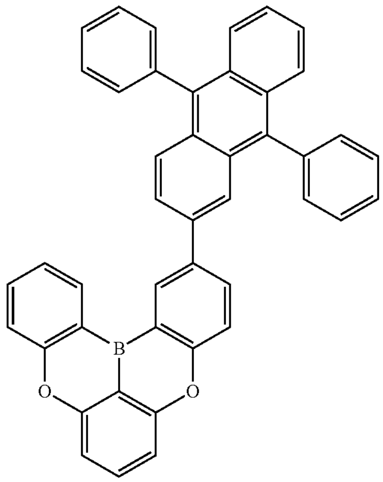
(1-13)
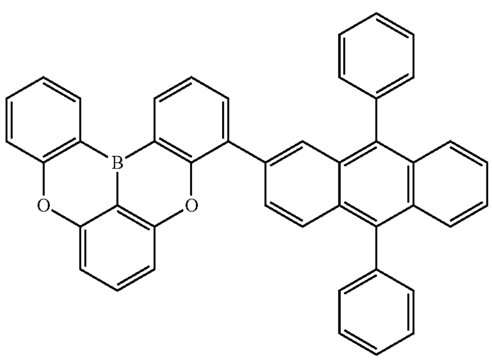
(1-14)
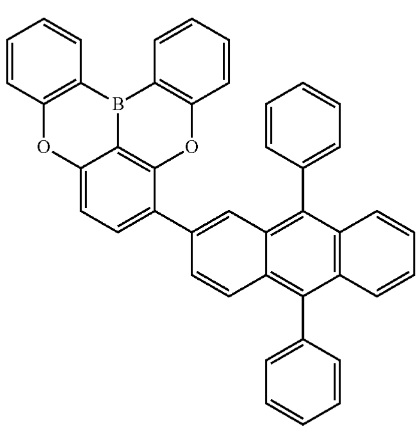
-continued
(1-15)
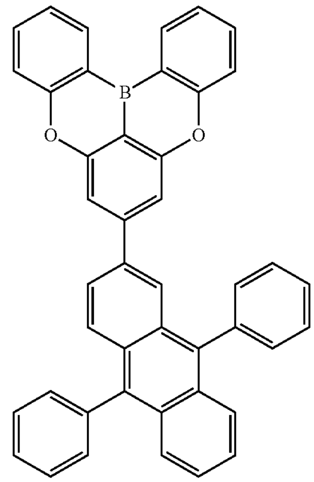
(1-21)
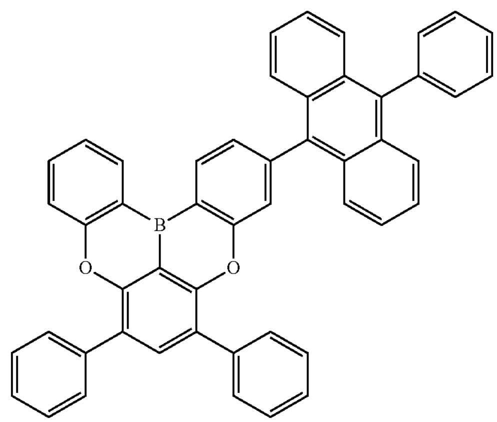
(1-22)
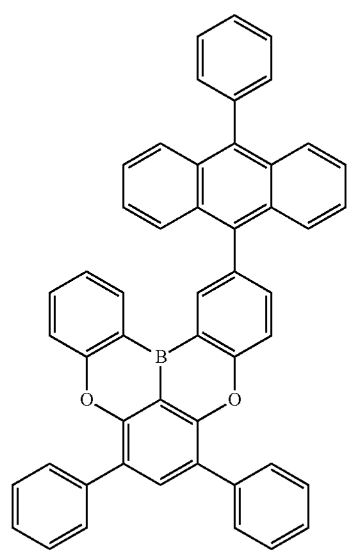

(1-23)
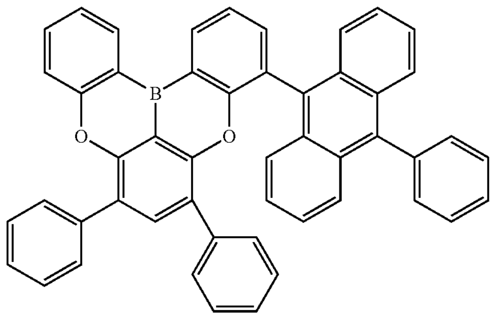
(1-24)
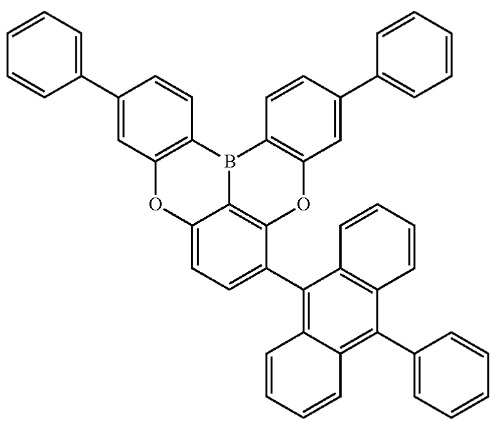
(1-25)
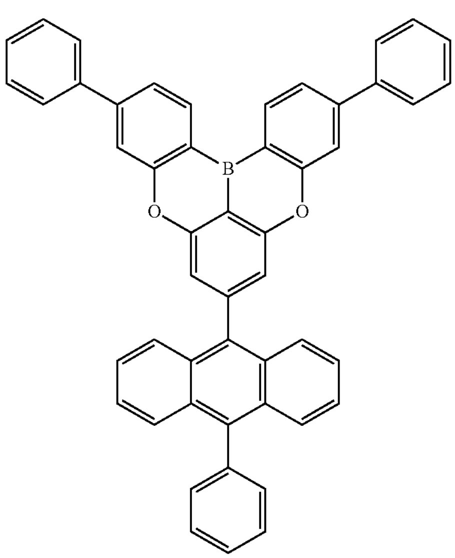
(1-26)
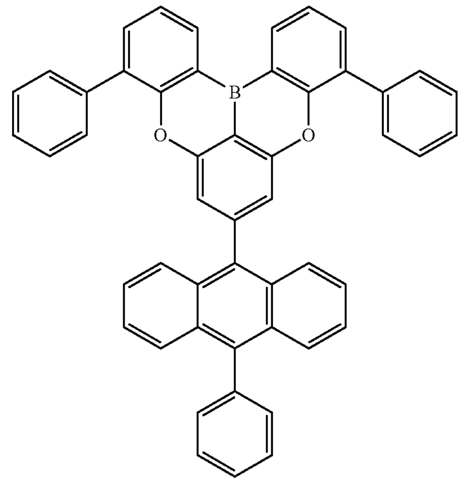
(1-27)
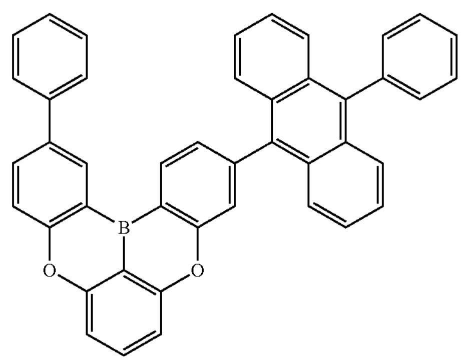
(1-28)
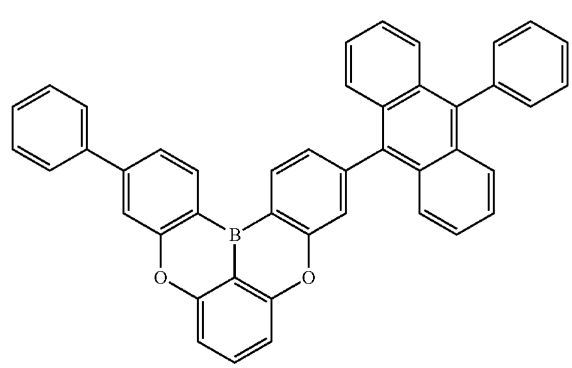

-continued
(1-29)
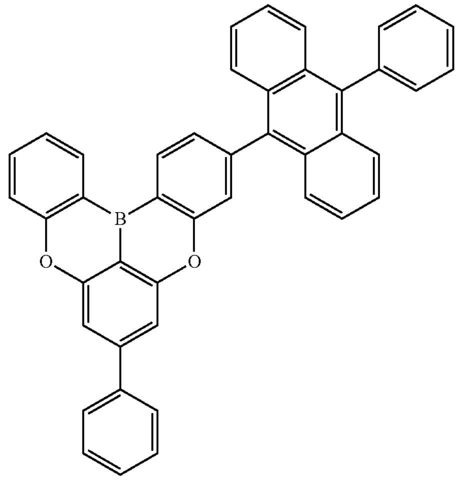
(1-30)
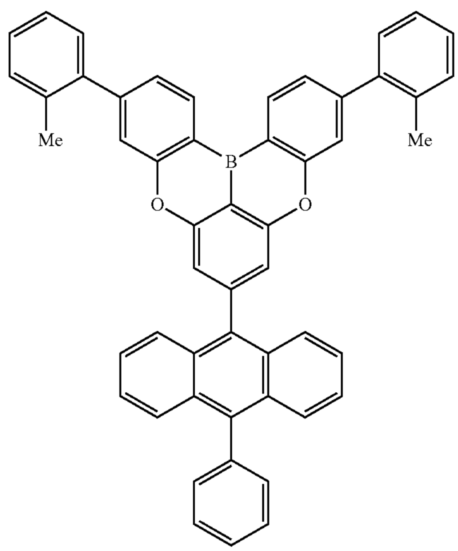
(1-31)
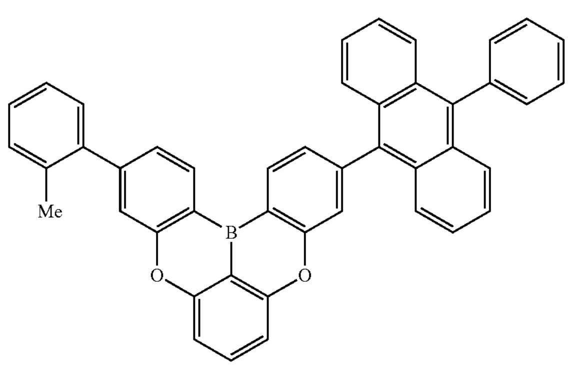
-continued
(1-32)
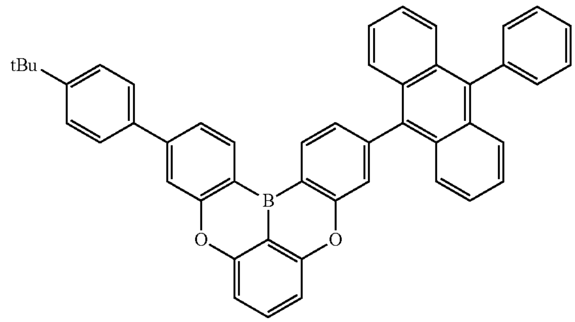
(1-33)
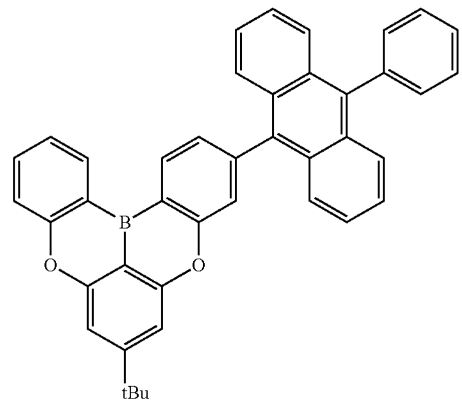
(1-34)
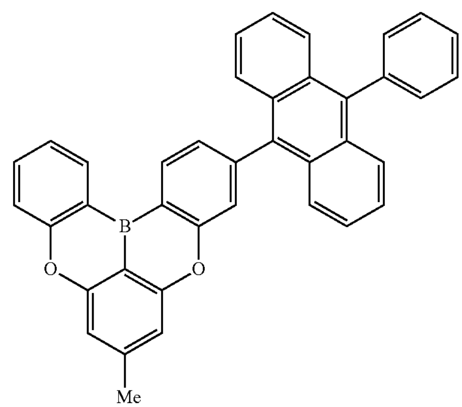
(1-41)
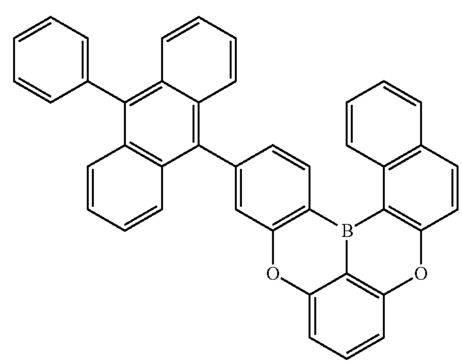

-continued
(1-42)
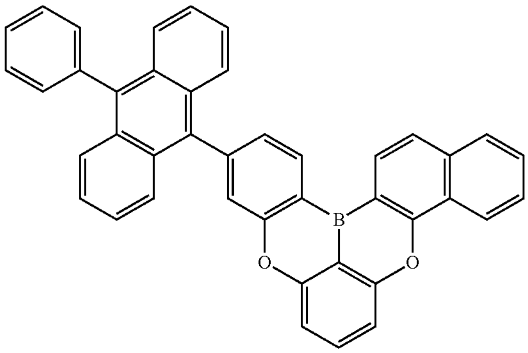
(1-43)
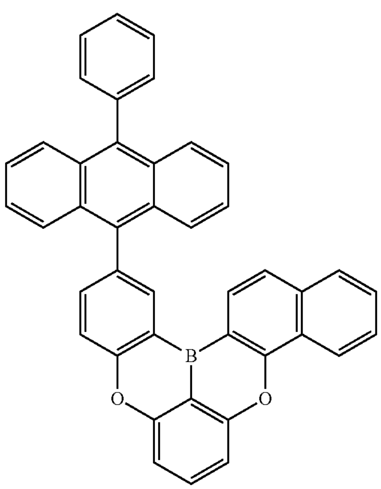
(1-44)
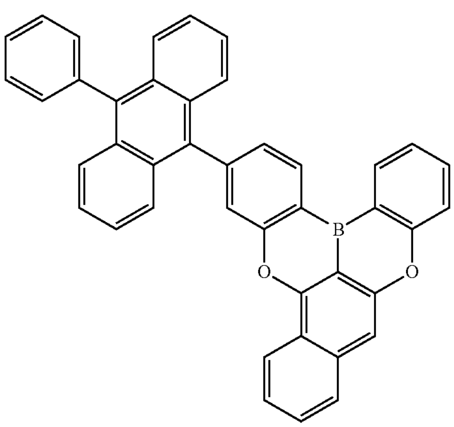
-continued
(1-45)
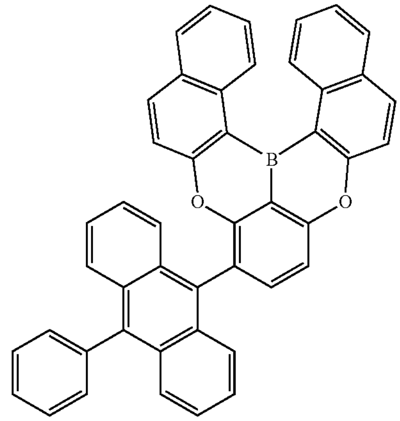
(1-46)
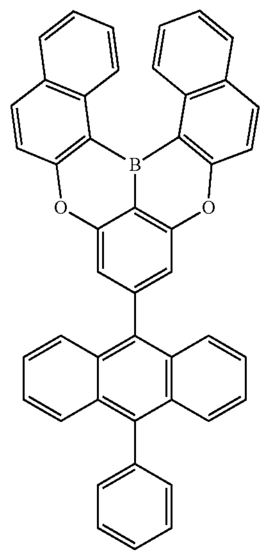
(1-47)
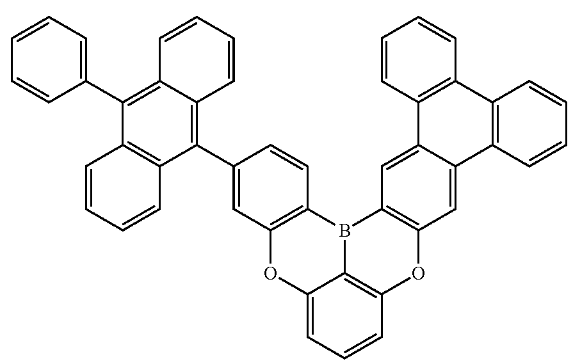

-continued
(1-48)
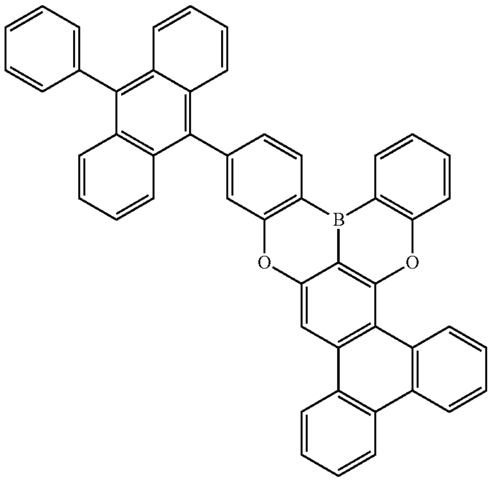
(1-51)
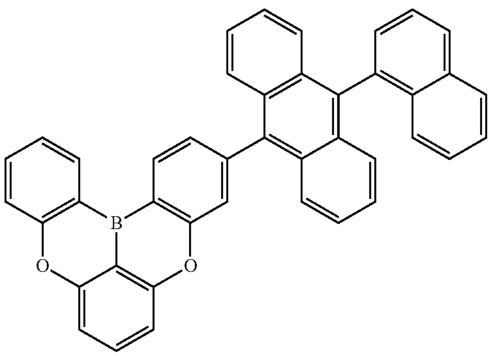
(1-52)
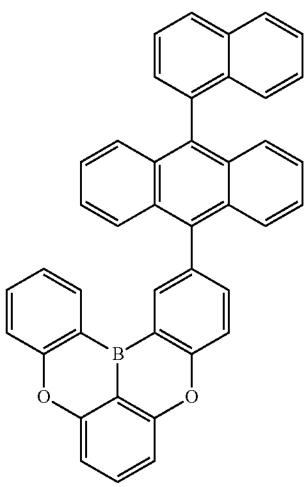
(1-53)
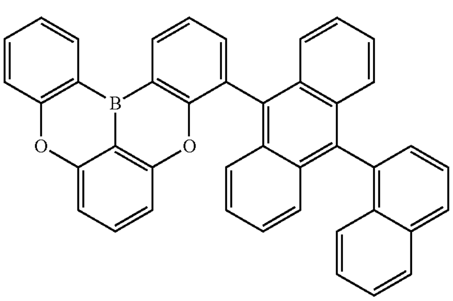
-continued
(1-54)
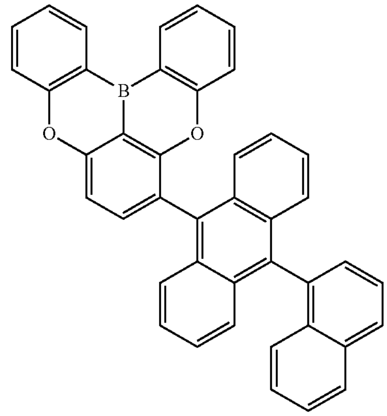
(1-55)
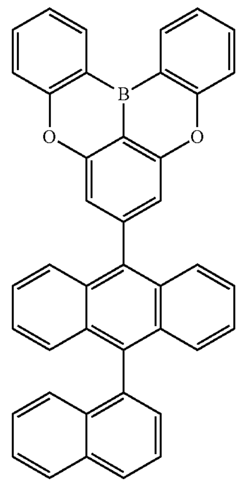
(1-56)
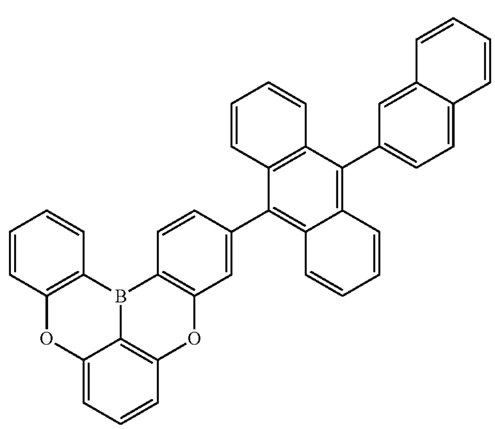

(1-57)
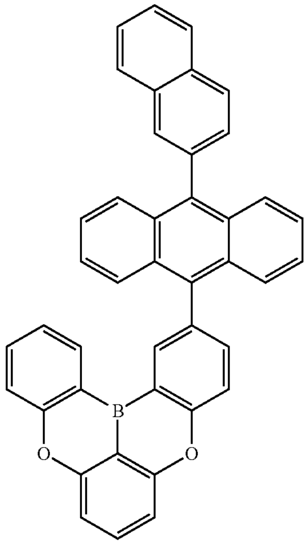
(1-58)
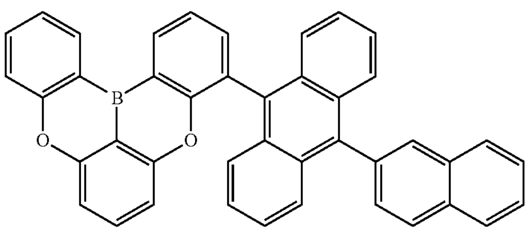
(1-59)
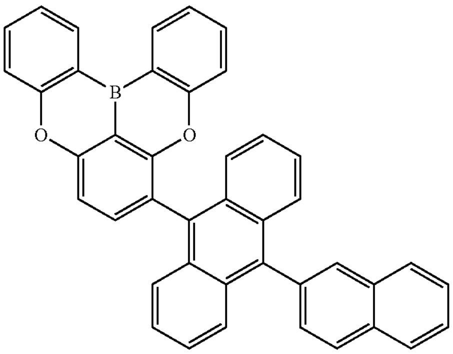
(1-60)
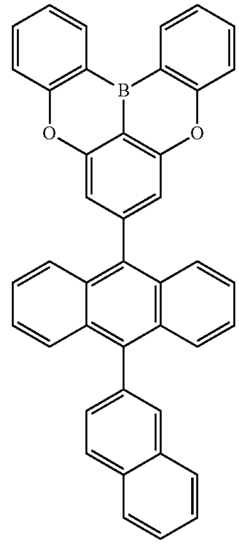
(1-71)
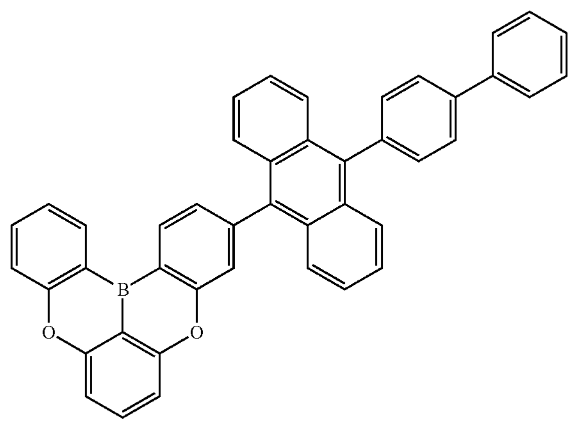
(1-72)
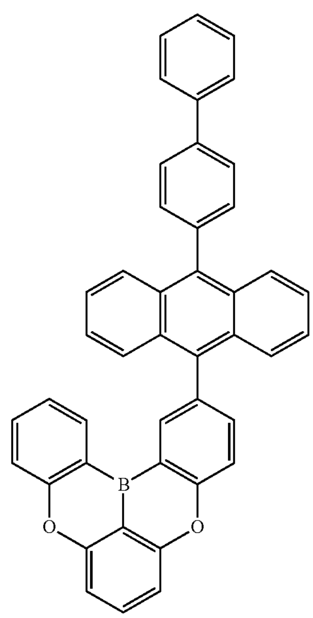

-continued
(1-73)
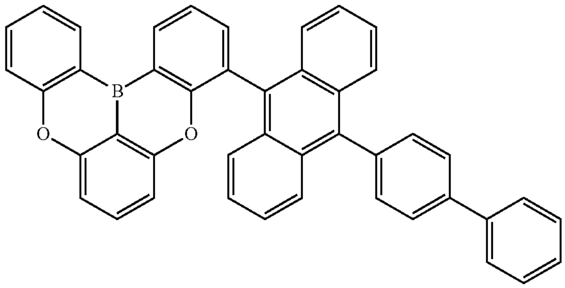
(1-74)
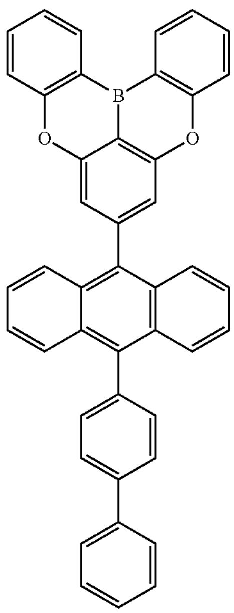
(1-75)
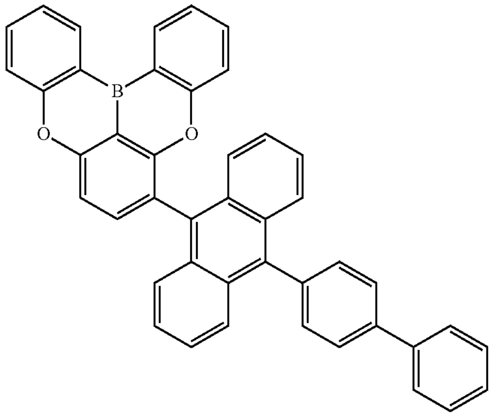
-continued
(1-76)
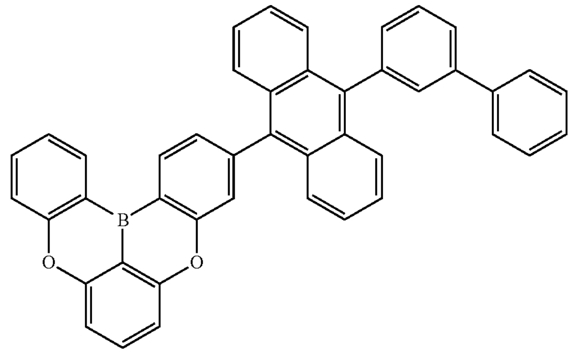
(1-77)
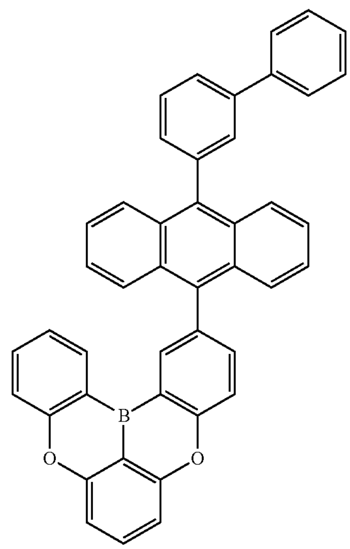
(1-78)
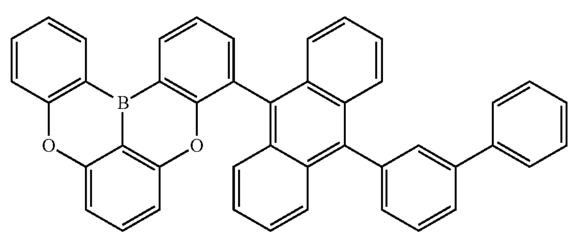

-continued
(1-79)
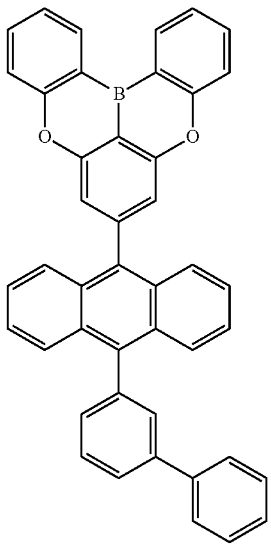
(1-80)
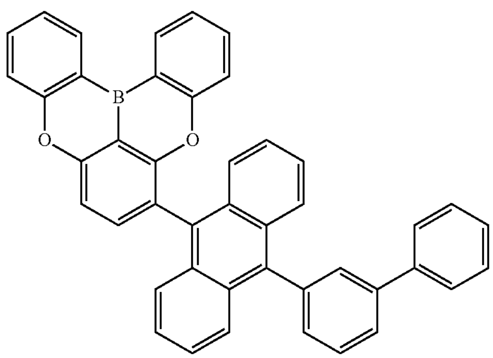
(1-81)
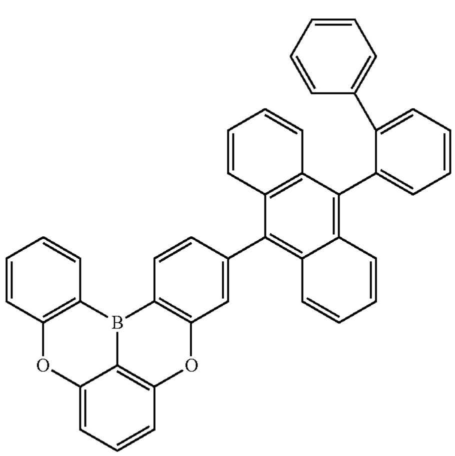
-continued
(1-82)
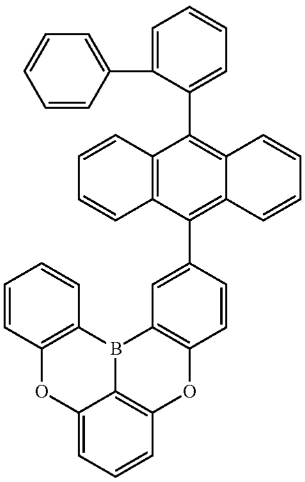
(1-83)
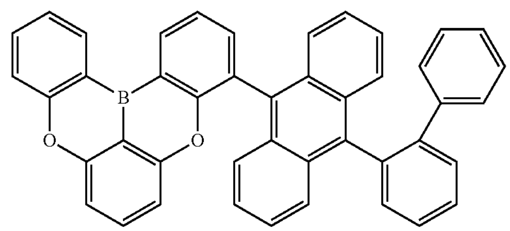
(1-84)
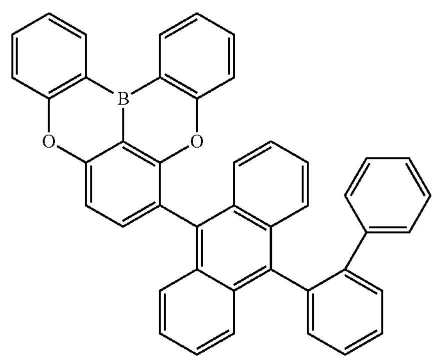
(1-85)
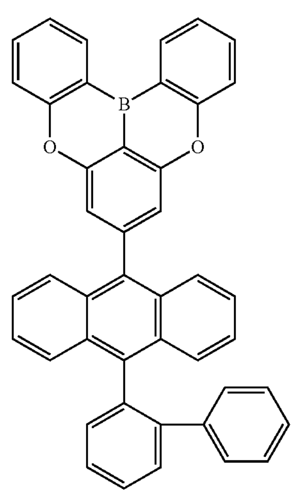

-continued
(1-91)
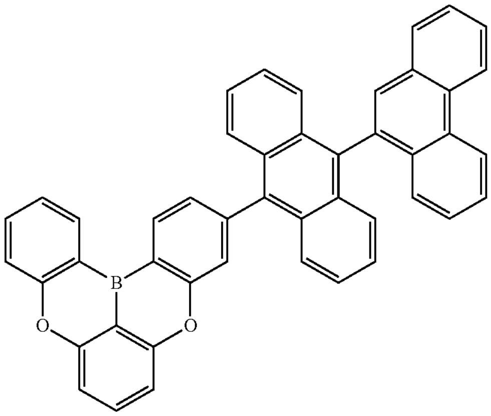
(1-92)
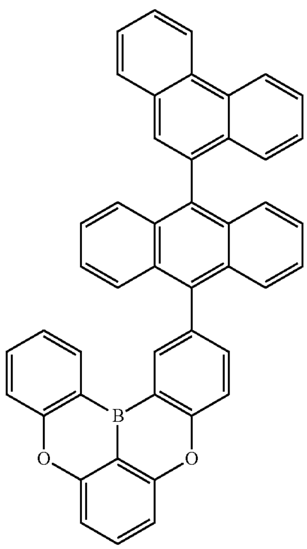
(1-93)
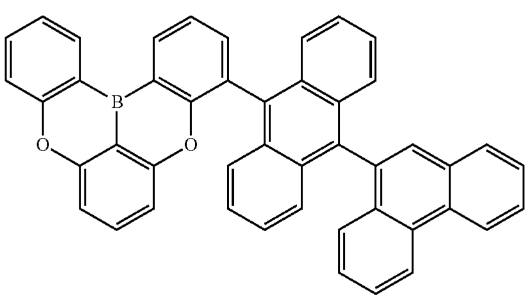
-continued
(1-94)
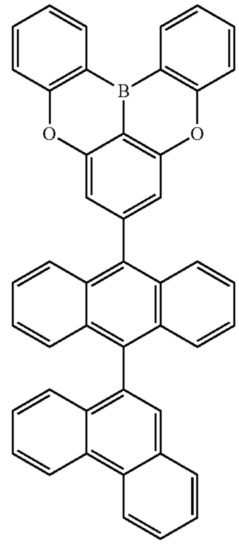
(1-95)
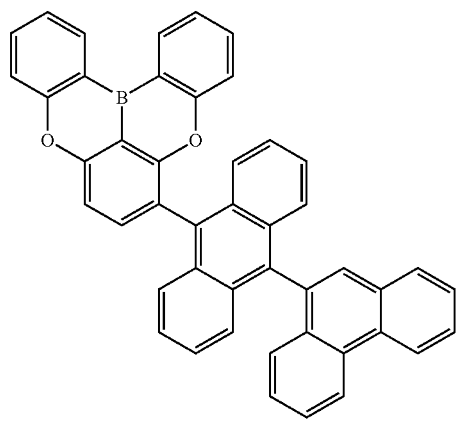
(1-101)
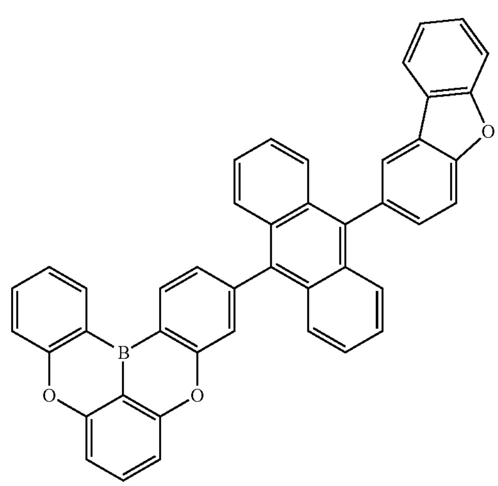

-continued
(1-102)
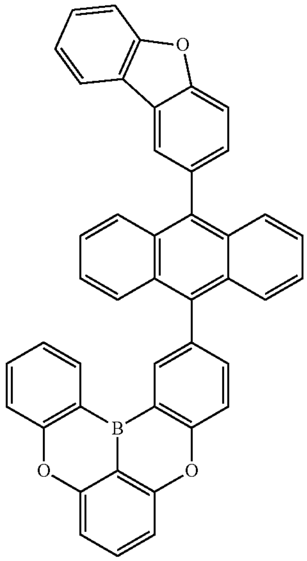
(1-103)
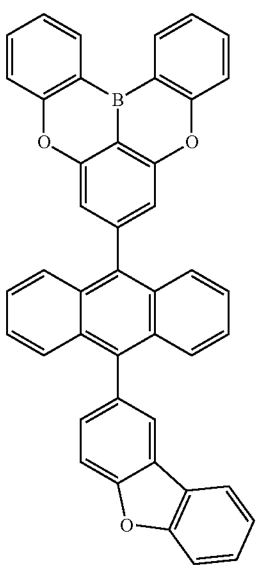
(1-104)
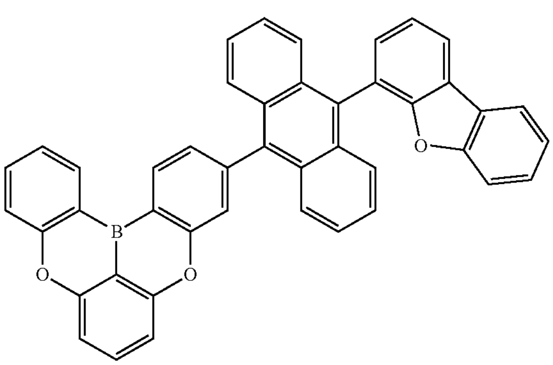
-continued
(1-105)
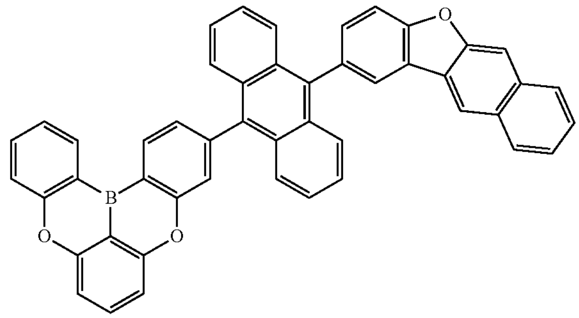
(1-106)
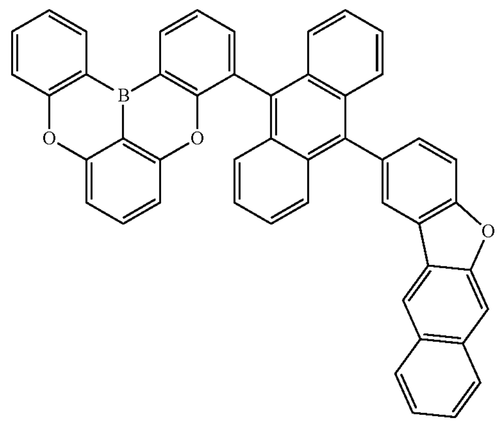
(1-107)
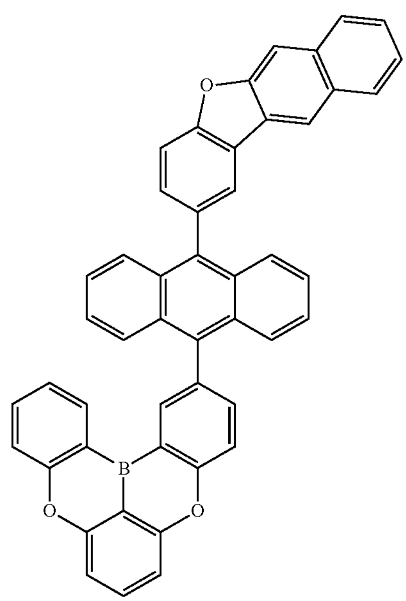

-continued
(1-108)
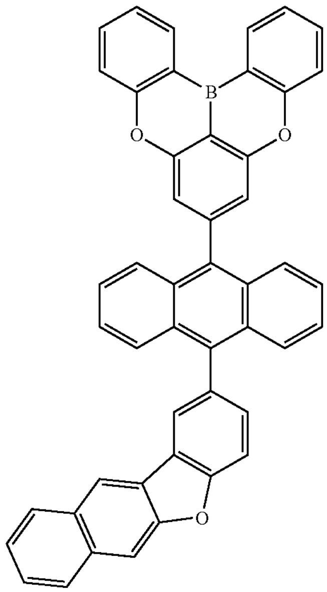
(1-109)
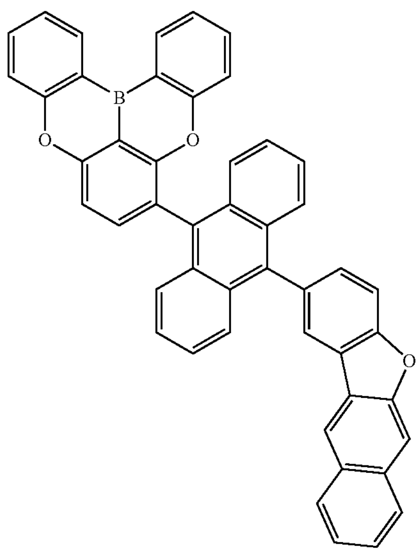
(1-121)
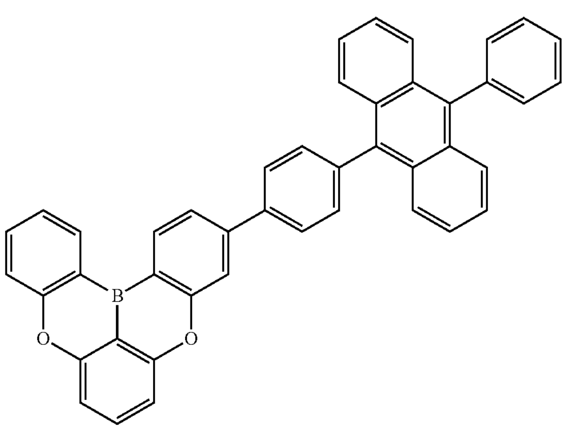
-continued
(1-122)
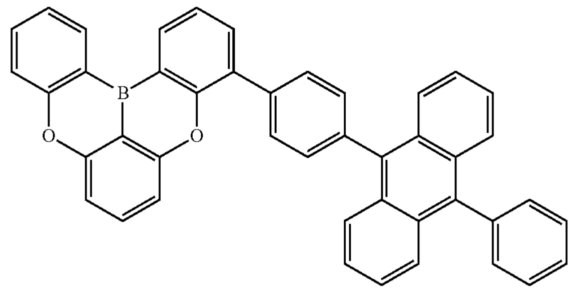
(1-123)
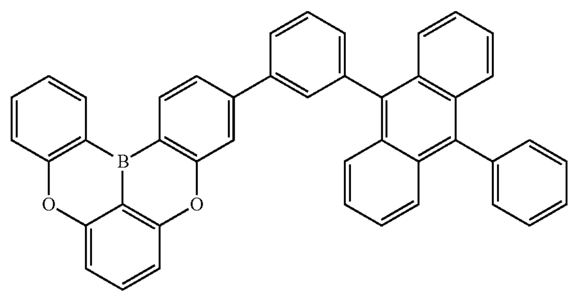
(1-124)
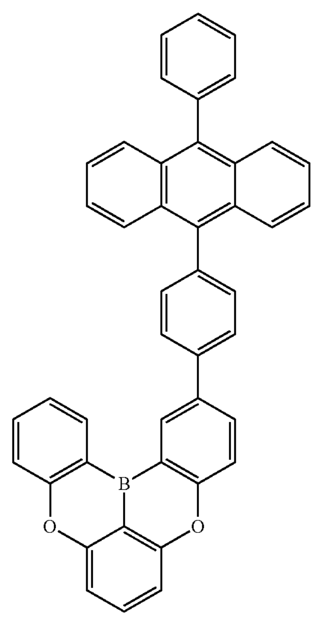
(1-125)
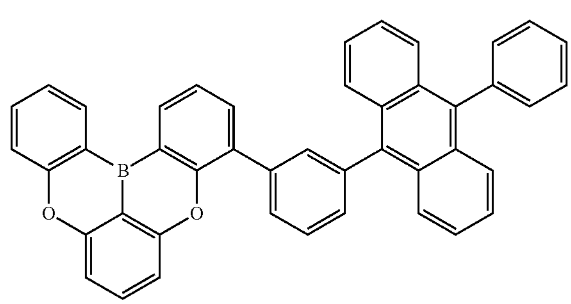

-continued
(1-126)
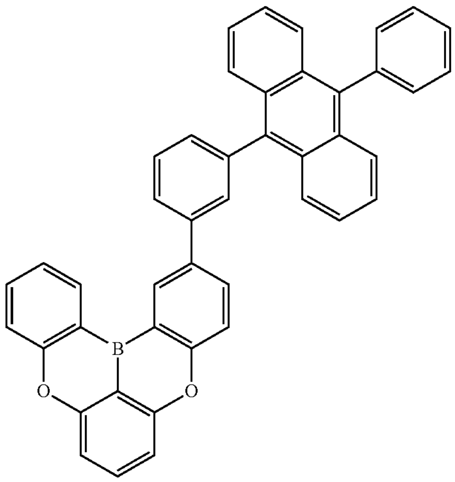
(1-127)
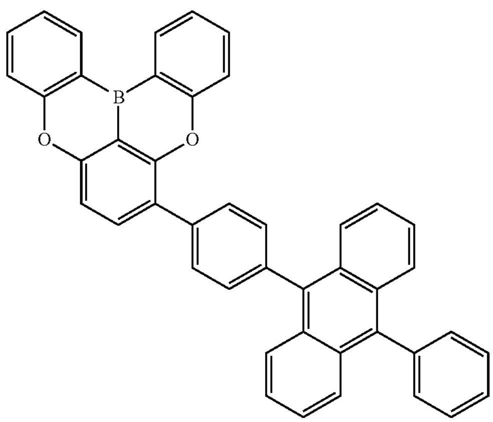
(1-128)
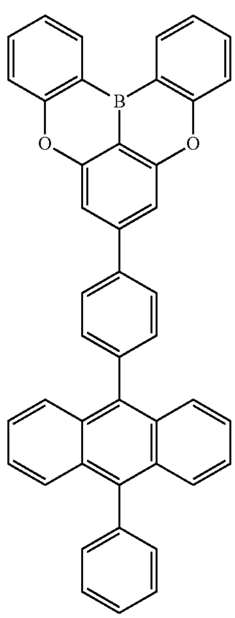
-continued
(1-129)
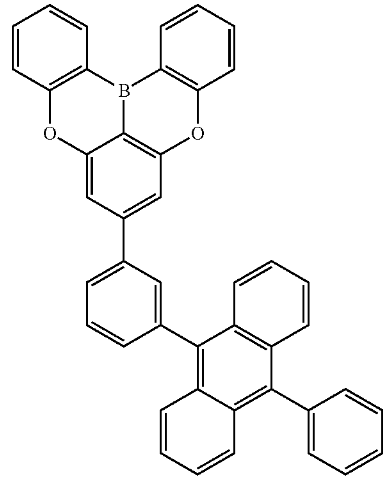
(1-130)
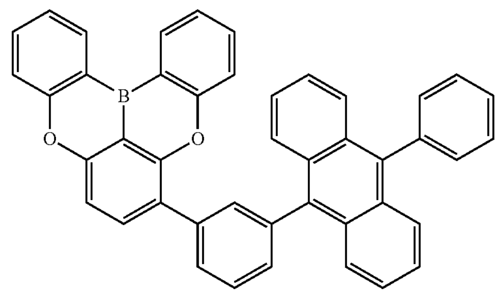
(1-131)
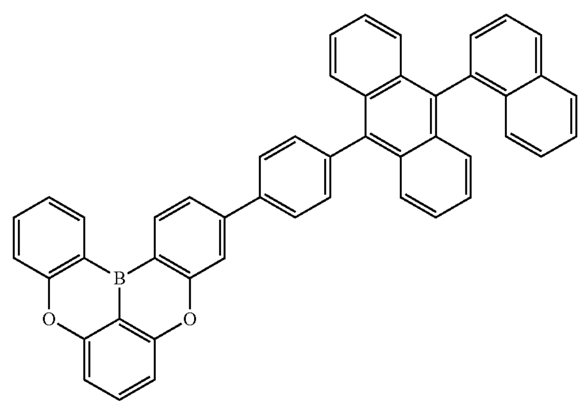
(1-132)
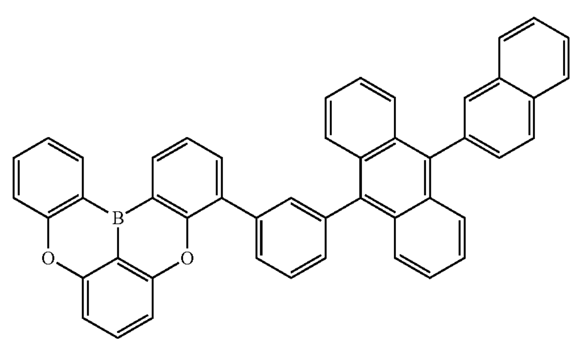

-continued
(1-133)
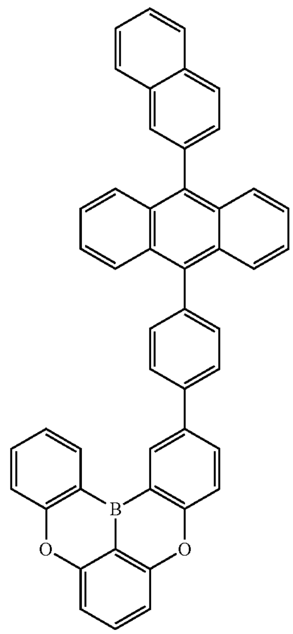
(1-134)
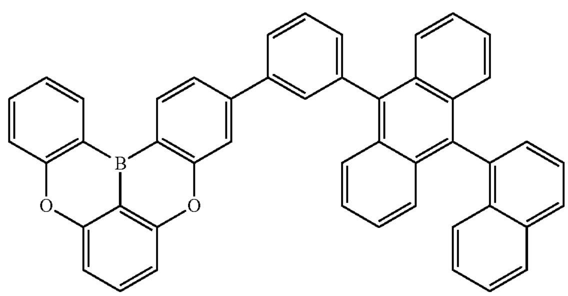
(1-141)
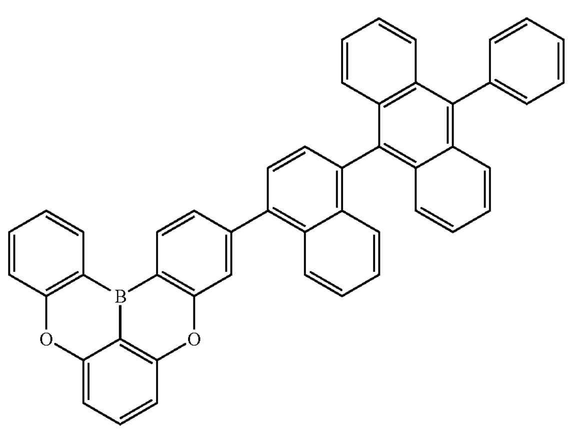
-continued
(1-142)
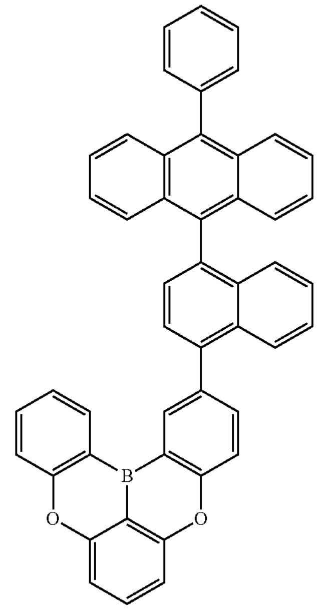
(1-143)
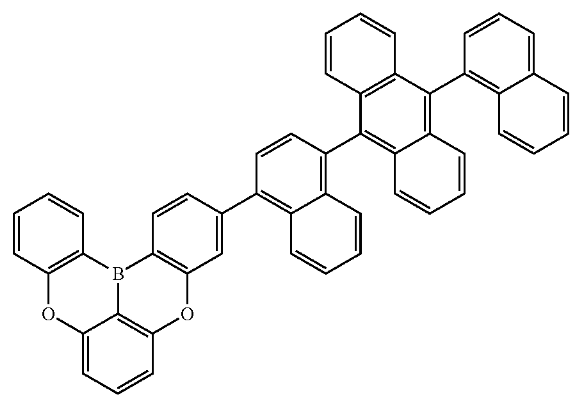
(1-144)
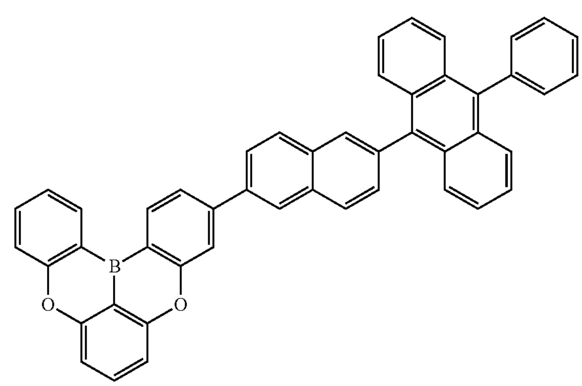

-continued
(1-145)
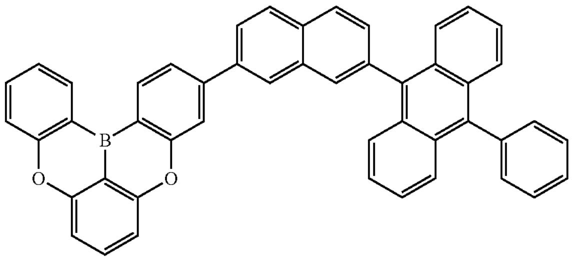
(1-146)
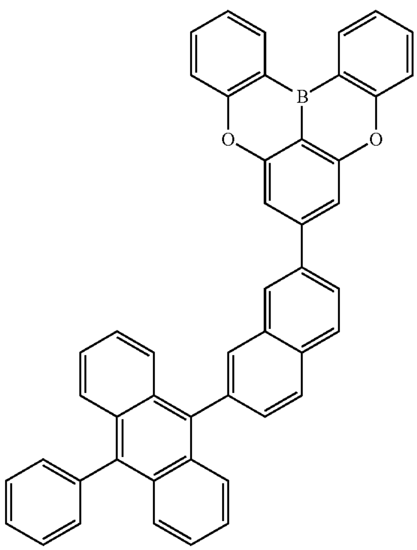
(1-147)
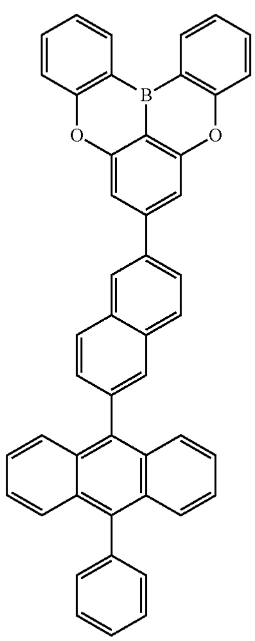
-continued
(1-148)
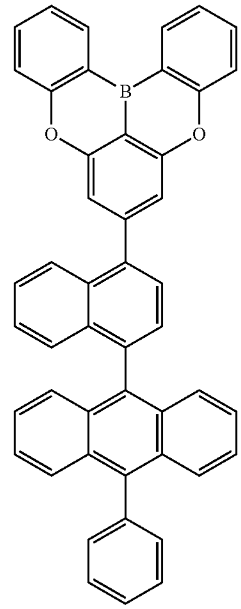
(1-151)
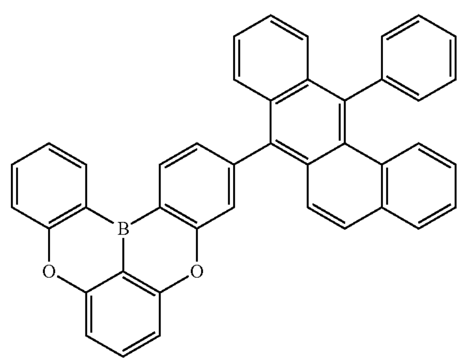
(1-152)
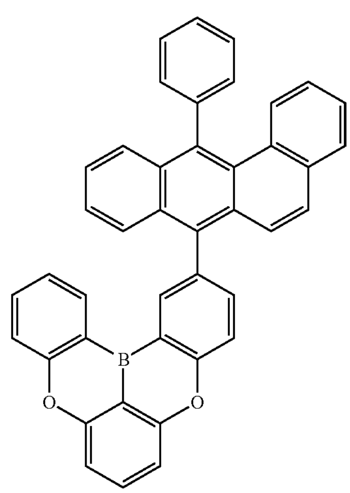

-continued
(1-153)
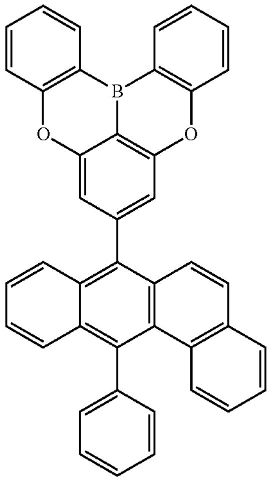
(1-154)
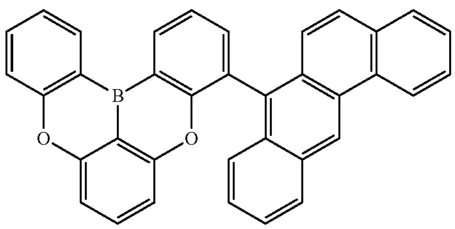
(1-155)
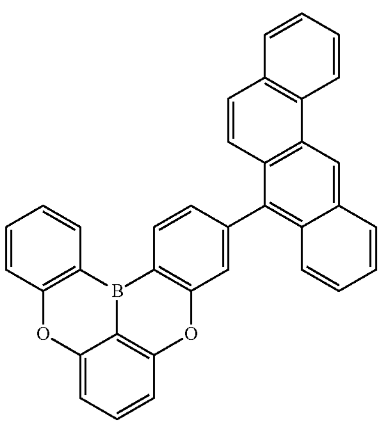
(1-156)
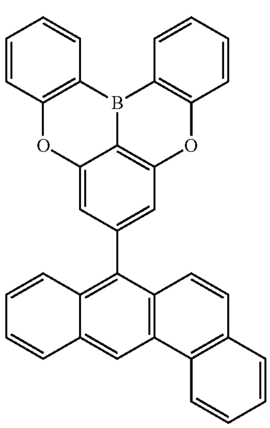
-continued
(1-157)
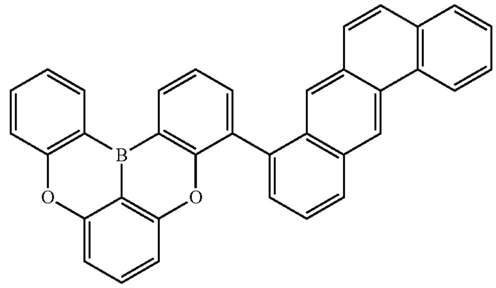
(1-158)
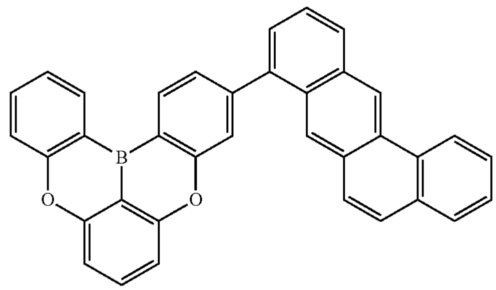
(1-159
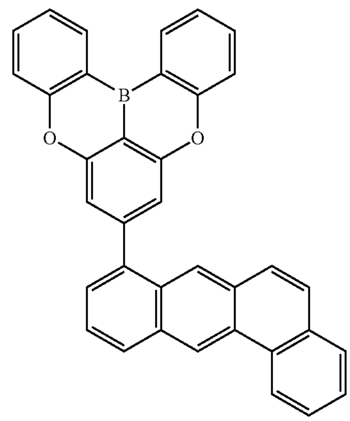
(1-160)
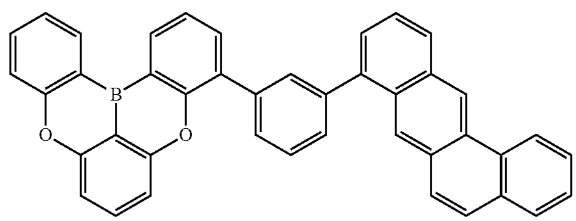
(1-161)
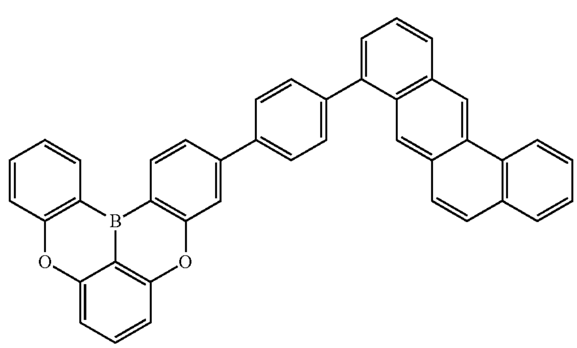

-continued
(1-162)
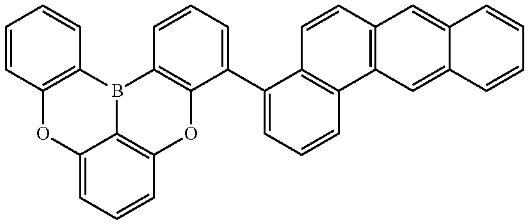
(1-163)
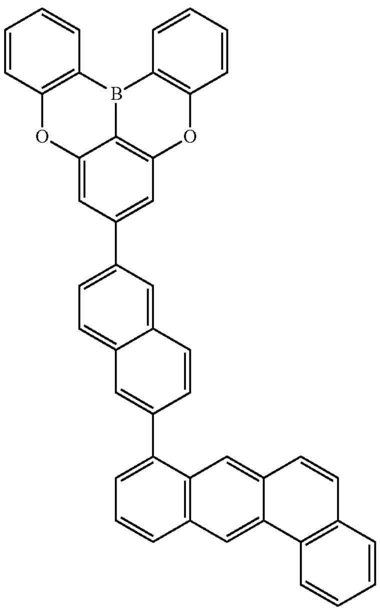
(1-164)
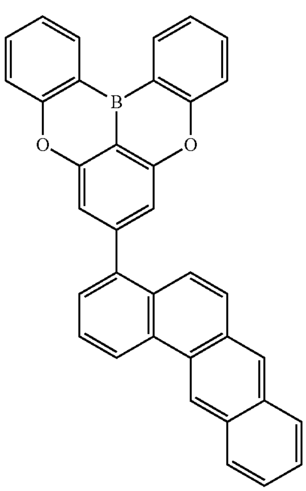
-continued
(1-165)
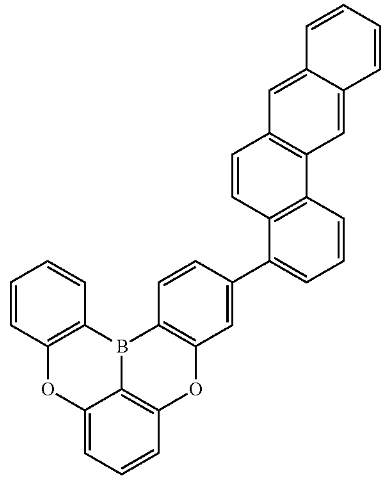
(1-166)
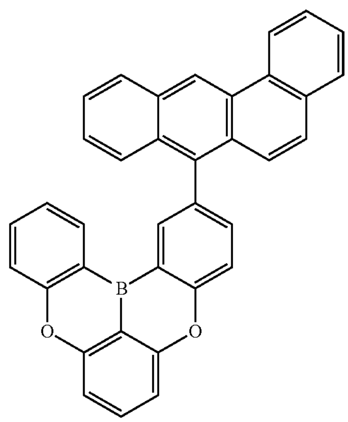
(1-171)
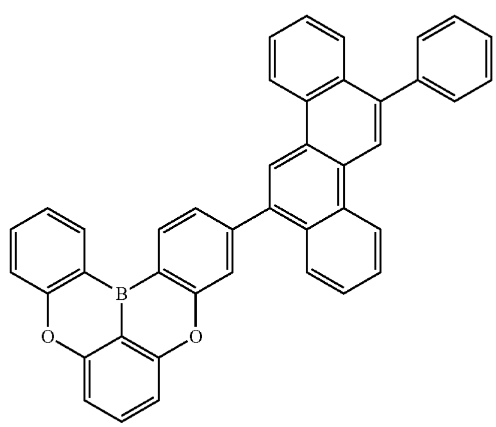

-continued
(1-172)
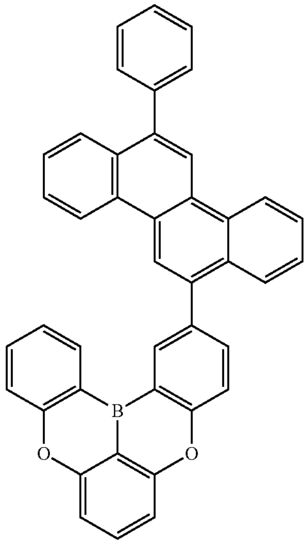
(1-173)
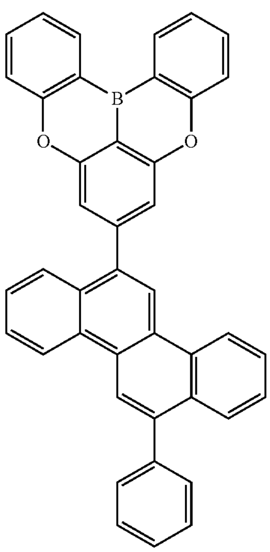
(1-174)
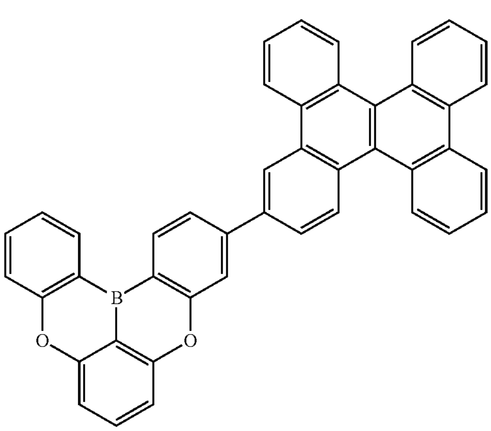
-continued
(1-175)
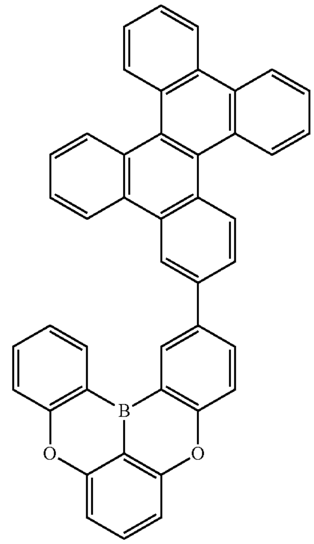
(1-176)
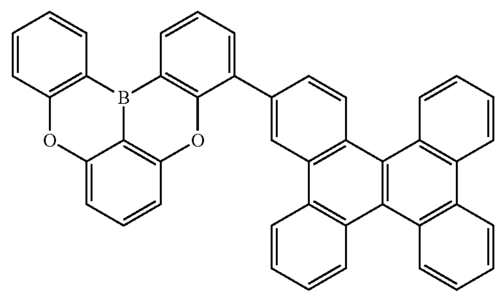
(1-177)
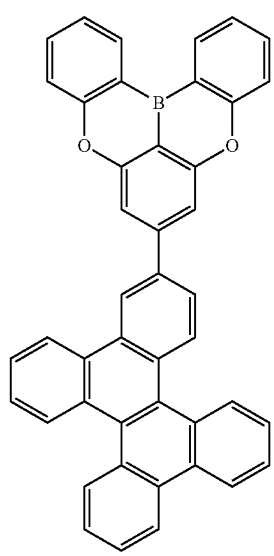

-continued
(1-178)
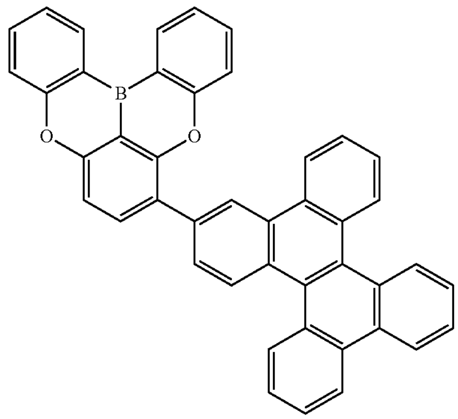
(1-179)
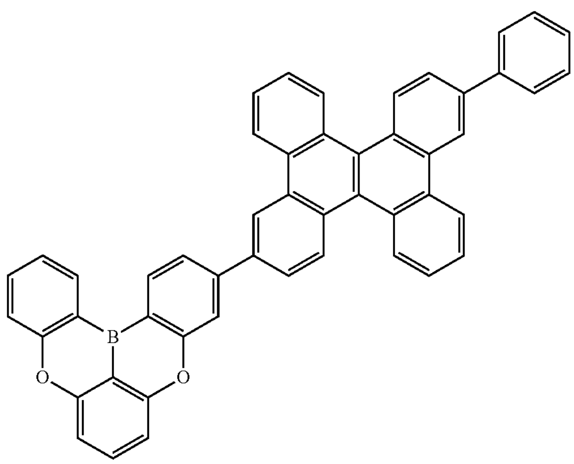
(1-180)
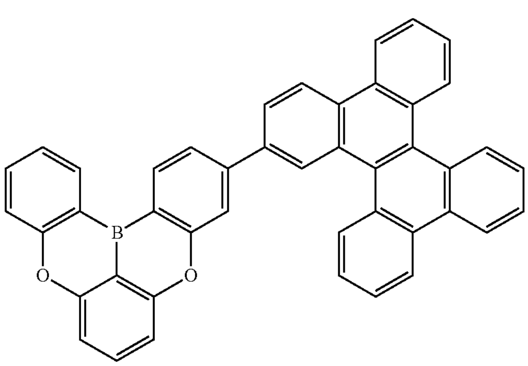
-continued
(1-181)
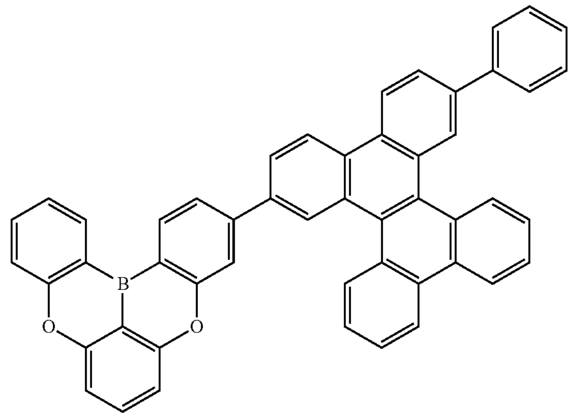
(1-182)
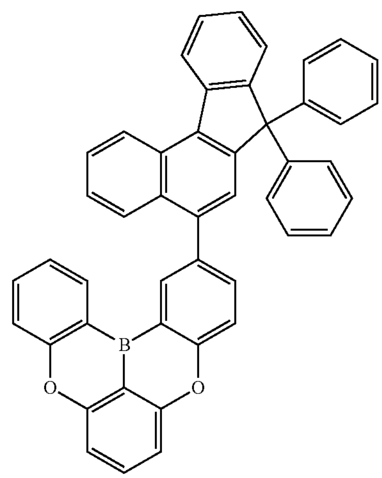
(1-191)
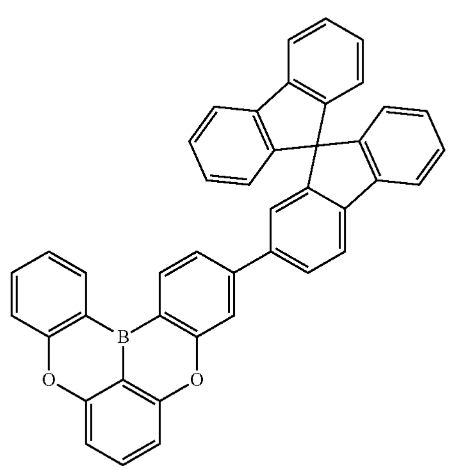

-continued
(1-192)
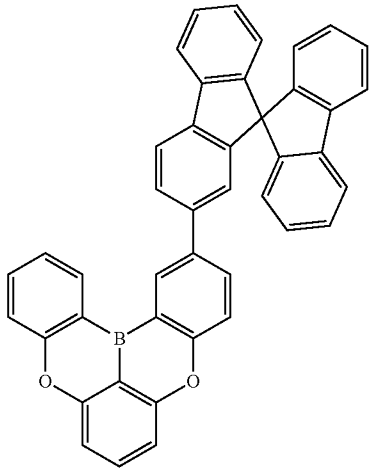
(1-193)
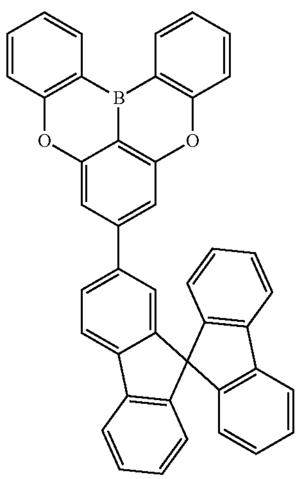
(1-194)
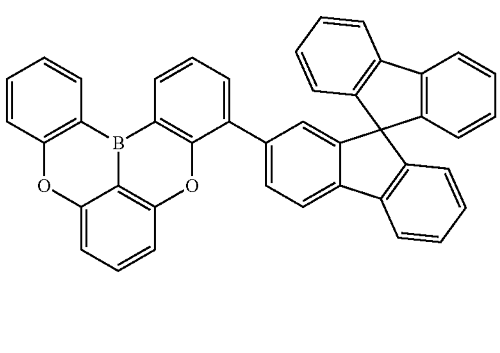
-continued
(1-195)
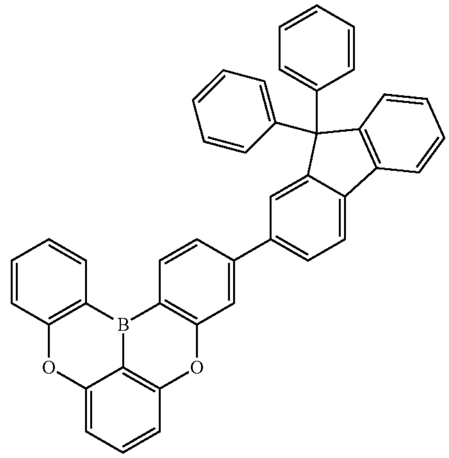
(1-196)
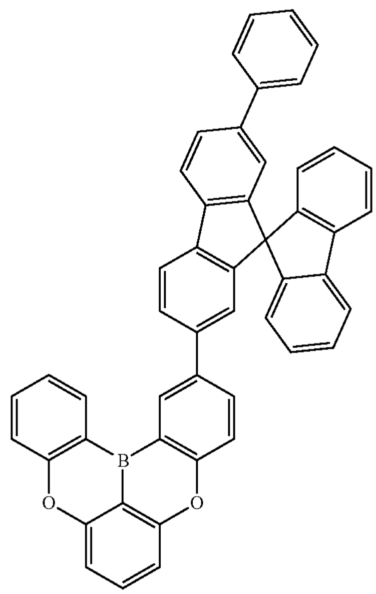
(1-197)
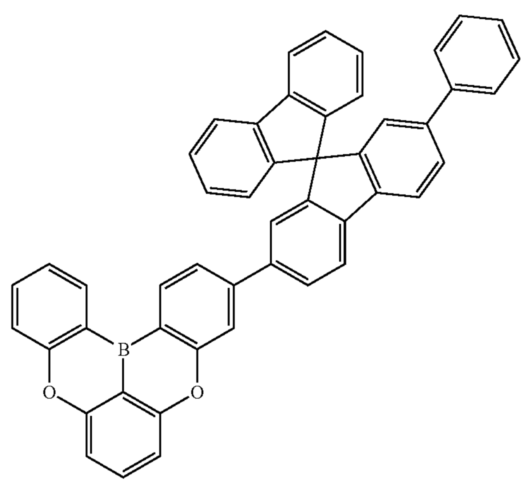

-continued
(1-198)
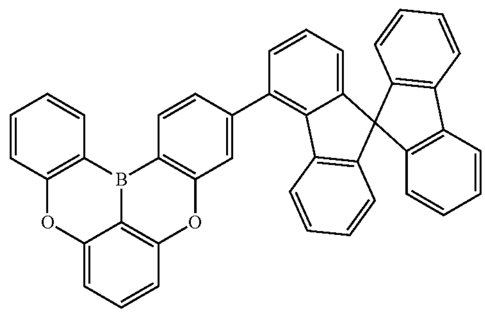
(1-201)
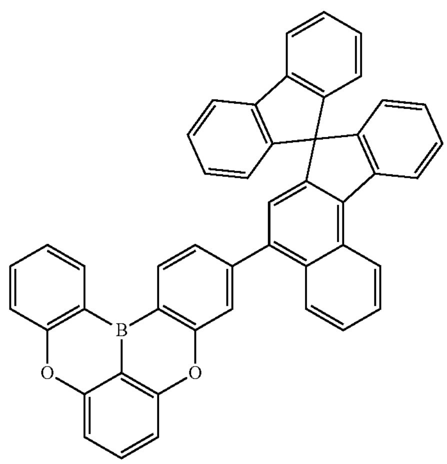
(1-202)
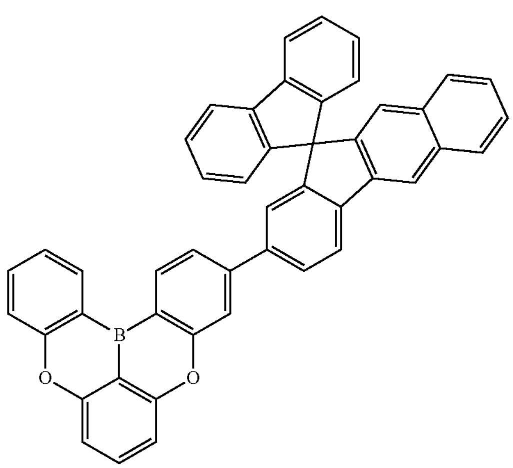
-continued
(1-203)
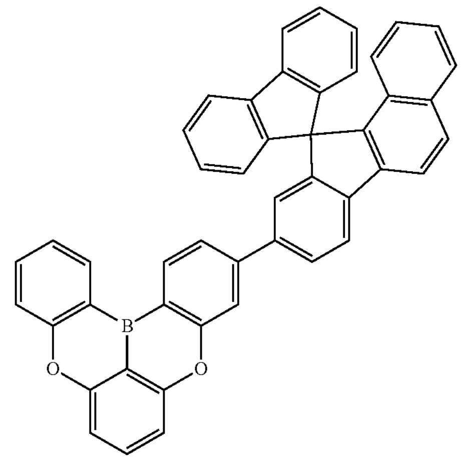
(1-204)
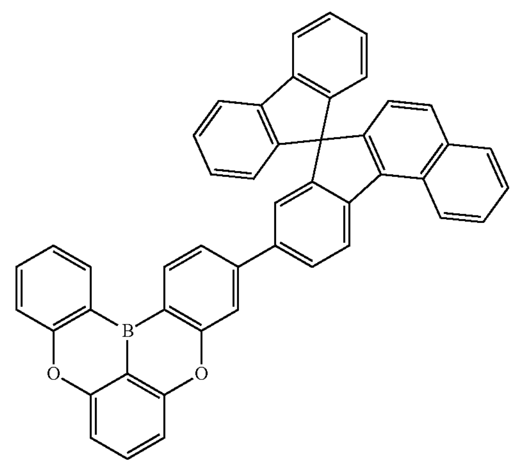
(1-205)
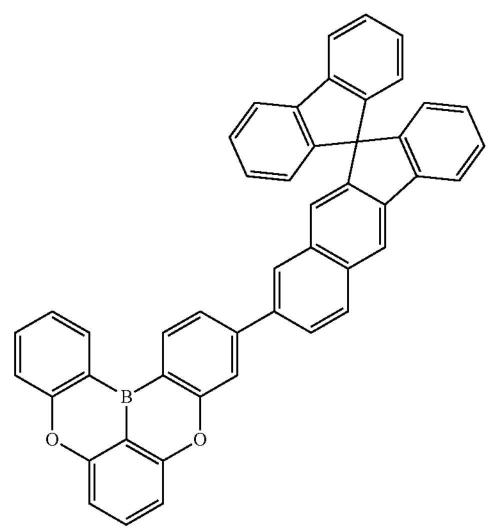

(1-206)
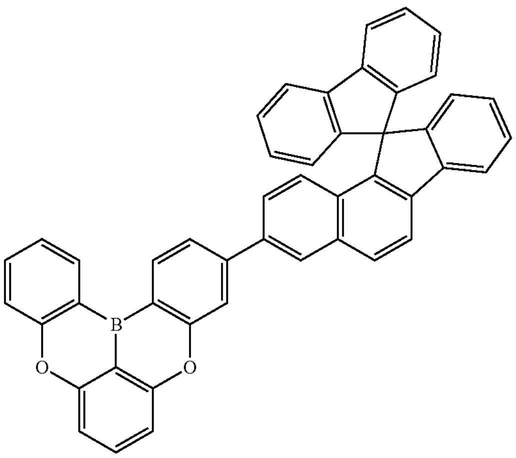
(1-207)
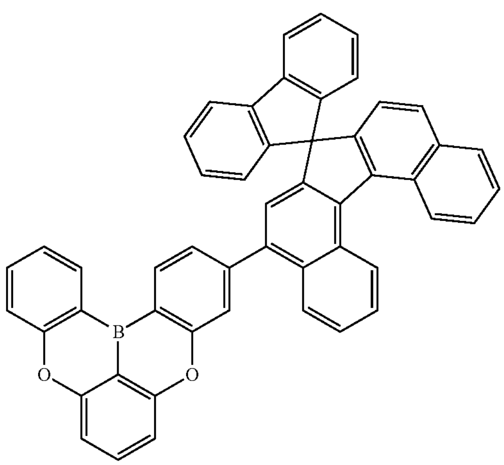
(1-208)
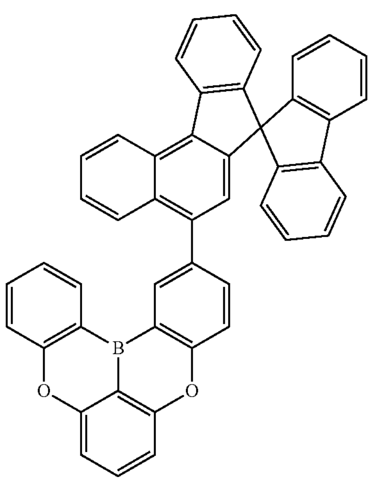
(1-209)
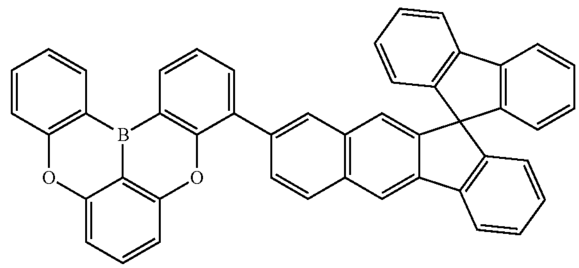
(1-210)
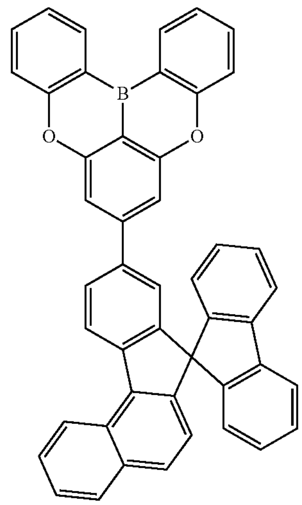
(1-221)
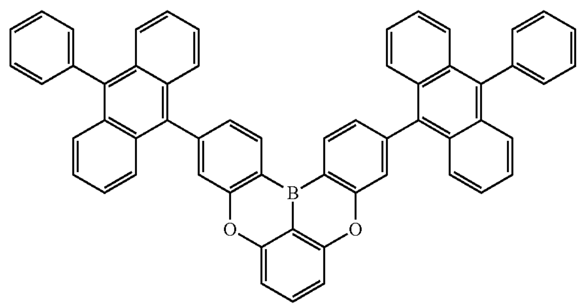
(1-222)
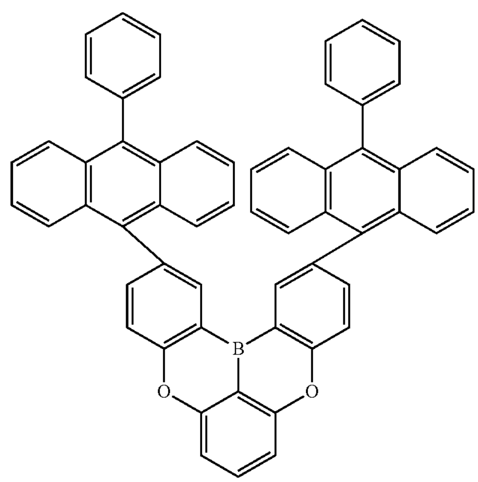

-continued
(1-223)
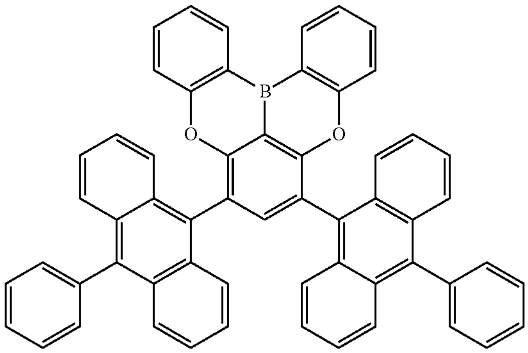
(1-224)
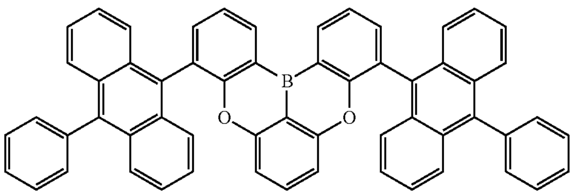
(1-225)
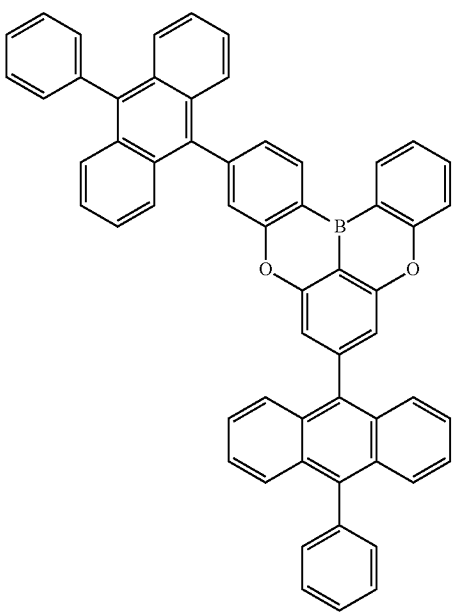
-continued
(1-226)
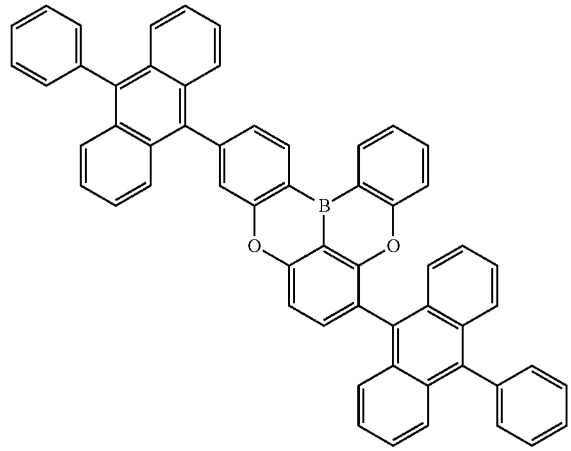
(1-227)
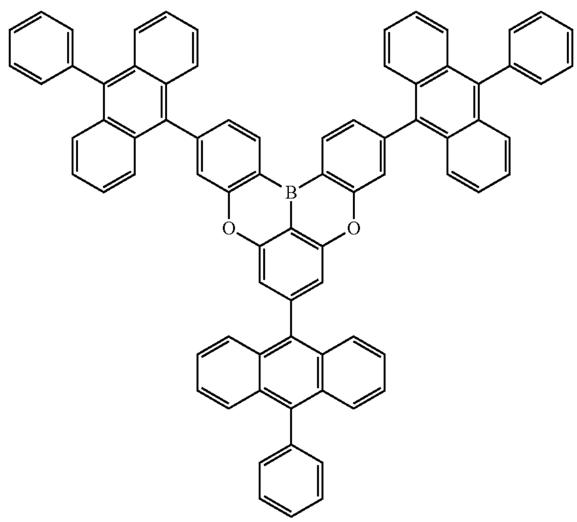
(1-228)
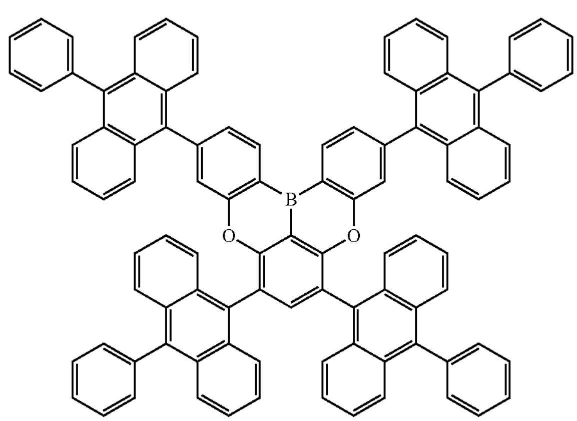

(1-229)
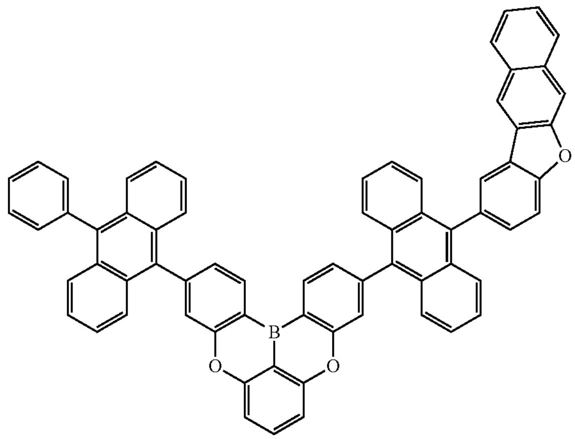
(1-230)
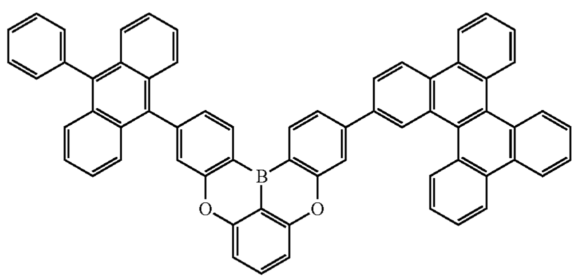
(1-301)
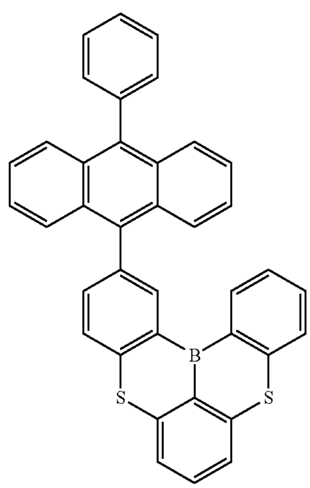
(1-302)
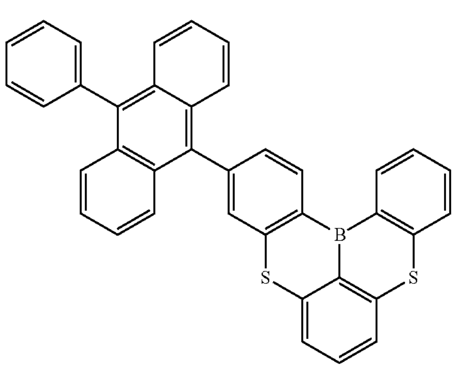
(1-303)
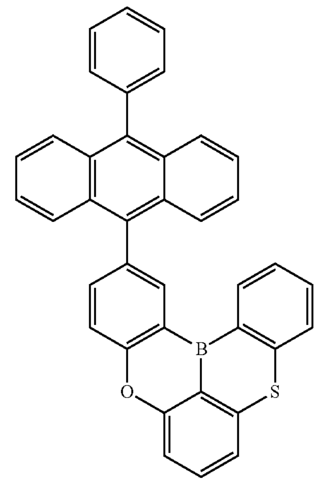
(1-401)
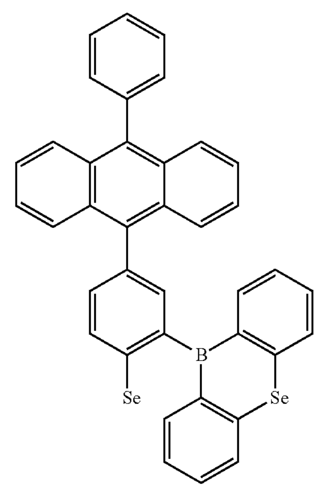
(1-402)
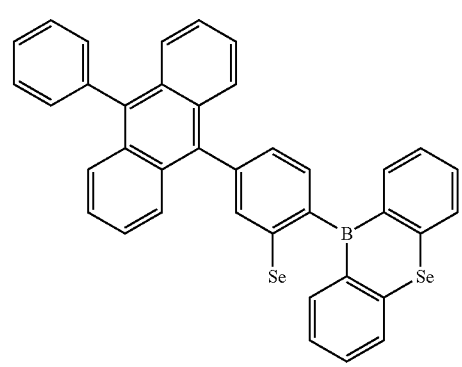

-continued (1-403)

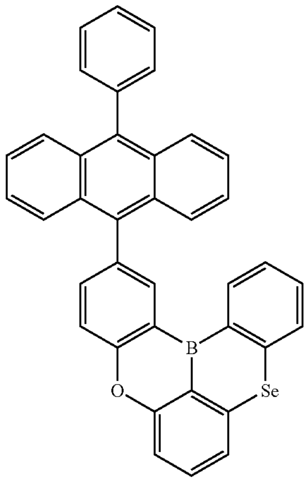

2. Method for Manufacturing Polycyclic Aromatic Compound Represented by General Formula (1)

The polycyclic aromatic compound represented by general formula (1) can be basically manufactured by bonding ring a, ring b, and ring c with bonding groups ($X^1$ and $X^2$) to manufacture a first intermediate (first reaction), then introducing a boronate group into the ring a (second intermediate), arbitrarily hydrolyzing the resulting product to manufacture boronic acid thereof (second intermediate) (second reaction), and then causing the second intermediate (boronic acid or boronate) to react with a Lewis acid such as aluminum chloride (third reaction).

Here, examples of a method for introducing the intermediate group represented by each of formulas (Z-1) to (z-6) and a group including each of the terminal groups represented by formulas (Ar-1) to (Ar-12) into the polycyclic aromatic compound include a method using a material in which the ring a, ring b, and/or ring c have been substituted by the "intermediate group and a group including the terminal group" as a raw material used in the first reaction; and a method using a material in which an active group such as a halogen atom or boronic acid (or a derivative thereof) has been introduced into the ring a, ring b, and/or ring c as a raw material used in the first reaction for substituting the active group by the "intermediate group and a group including the terminal group" having boronic acid (or a derivative thereof) or a halogen atom in an appropriate step thereafter. Examples of a substitution method include a cross coupling reaction such as a Suzuki coupling reaction. Since the skeleton of the polycyclic aromatic compound represented by general formula (1) can also be manufactured by a method for manufacturing a polycyclic aromatic compound represented by general formula (2) described later, the "intermediate group and a group including the terminal group" may be introduced during manufacture of the skeleton or after manufacture of the skeleton by the method. As an introduction method, after an active group such as a halogen atom or boronic acid (or a derivative thereof) is introduced, a cross coupling reaction can be used in a similar manner to the above. Examples of, the halogen include chlorine, bromine, and iodine. Here, as a halogenation method, a general method can be used. Examples thereof include halogenation using chlorine, bromine, iodine, N-chloro succinimide, or N-bromo succinimide.

In the first reaction, for example, if an etherification reaction is used in a case where $X^1$ and/or $X^2$ represent/represents >O, the first intermediate can be manufactured using a general reaction such as a nucleophilic substitution reaction or an Ullmann reaction. The second reaction is a reaction for introducing a boronate such as Bpin into the first intermediate obtained in the first reaction, as indicated in the following scheme (1). Note that Bpin in the following scheme is a group obtained by pinacol-esterifying —B$(OH)_2$. The reference numerals in the structural formulas in the schemes illustrated below are defined in the same manner as those described above.

Scheme (1)

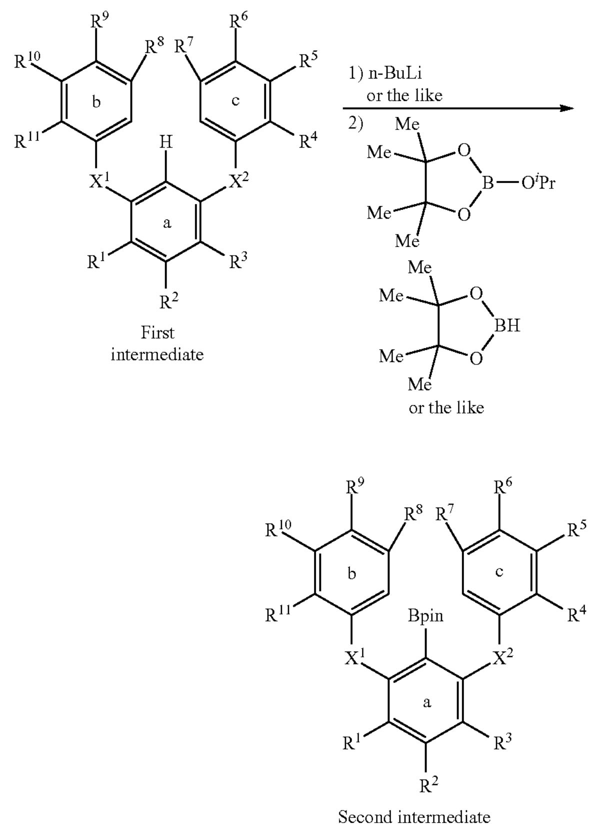

In the above scheme (1), first, a hydrogen atom is ortho-metalated with n-butyllithium, sec-butyllithium, t-butyllithium, or the like to perform lithiation. Here, the method using n-butyllithium, sec-butyllithium, t-butyllithium, or the like alone is described, but N,N,N',N'-tetramethylethylene diamine or the like may be added in order to improve reactivity. Then, by adding a boronic acid esterification agent such as 2-isopropoxy-4,4,5,5-tetramethyl-1,3,2-dioxaborolane to the resulting lithiated product, a pinacol ester of bornic acid can be manufactured. Here, the method using 2-isopropoxy-4,4,5,5-tetramethyl-1,3,2-dioxaborolane is described, but trimethoxyborane, tri isoprocoxy borane, or the like can also be used. By applying the method described in JP 2013-016185 A, 4,4,5,5-tetramethyl-1,3,2-dioxaborolane or the like can be used similarly.

As illustrated in the following scheme (2), by hydrolyzing the boronate manufactured by the method illustrated in the above scheme (1), boronic acid can be manufactured.

Scheme (2)

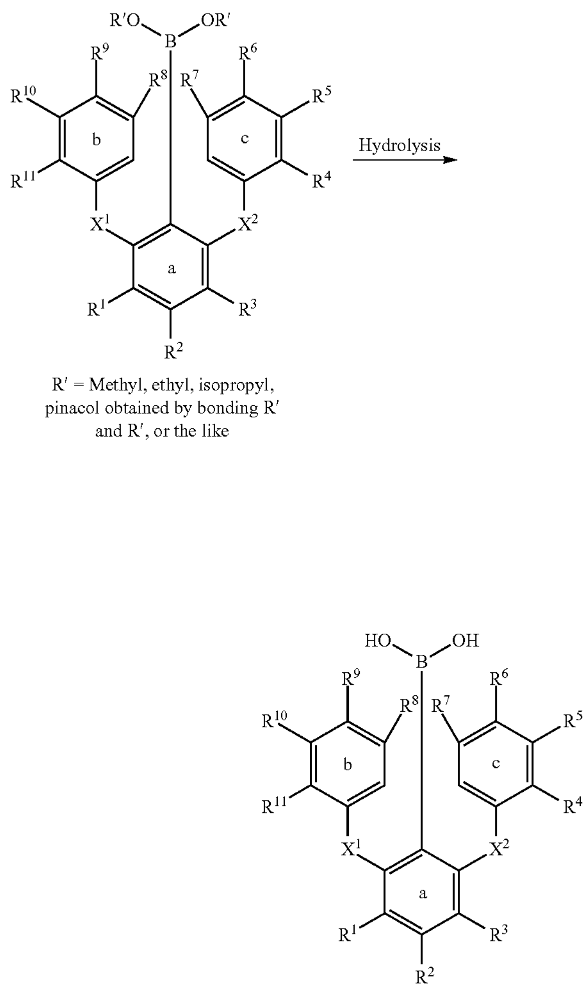

Second intermediate

Furthermore, by applying an appropriate alcohol to the boronate or boronic acid obtained in the above schemes (1) and (2), different boronates can be manufactured through transesterification or further through esterification.

By appropriately selecting a manufacturing method from the above manufacturing methods and appropriately selecting a raw material used, the second intermediate (boronic acid or boronate) having a substituent at a desired position can be manufactured.

In the above schemes (1) and (2), a lithium atom is introduced into a desired position by ortho-metalation. However, as in the following scheme (3), also by introducing a halogen atom such as a bromine atom into a position into which a lithium atom is to be introduced and performing halogen-metal exchange, a lithium atom can be introduced into a desired position. Then, the second intermediate such as a boronate can be manufactured from the resulting lithiated product.

Scheme (3)

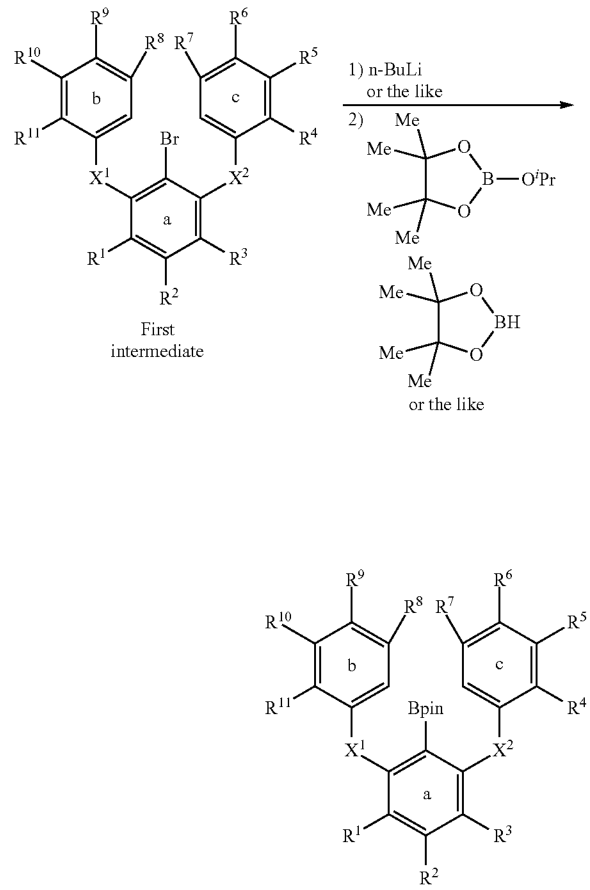

Second intermediate

In the above scheme (3), first, a hydrogen atom is halogen-lithium exchanged with n-butyllithium, sec-butyllithium, t-butyllithium, or the like to perform lithiation. Here, the method using n-butyllithium, sec-butyllithium, t-butyllithium, or the like alone is described, but N,N,N',N'-tetramethylethylene diamine or the like may be added in order to improve reactivity. Then, by adding a bornic acid esterification agent such as 2-isopropoxy-4,4,5,5-tetramethyl-1,3,2-dioxaborolane to the resulting lithiated product, a pinacol ester of bornic acid can be manufactured. Here, the method using 2-isopropoxy-4,4,5,5-tetramethyl-1,3,2-dioxaborolane is described, but trimethoxyborane, tri isoprocoxy borane, or the like can also be used. By applying the method described in JP 2013-016185 A, 4,4,5,5-tetramethyl-1,3,2-dioxaborolane or the like can be used similarly.

As illustrated in the following scheme (4), also by performing a coupling reaction between a brominated product and bis(pinacolato) diboron, 4,4,5,5-tetramethyl-1,3,2-dioxaborolane, or the like using a palladium catalyst or a base, the second intermediate of a boronate or the like can be manufactured similarly.

Scheme (4)

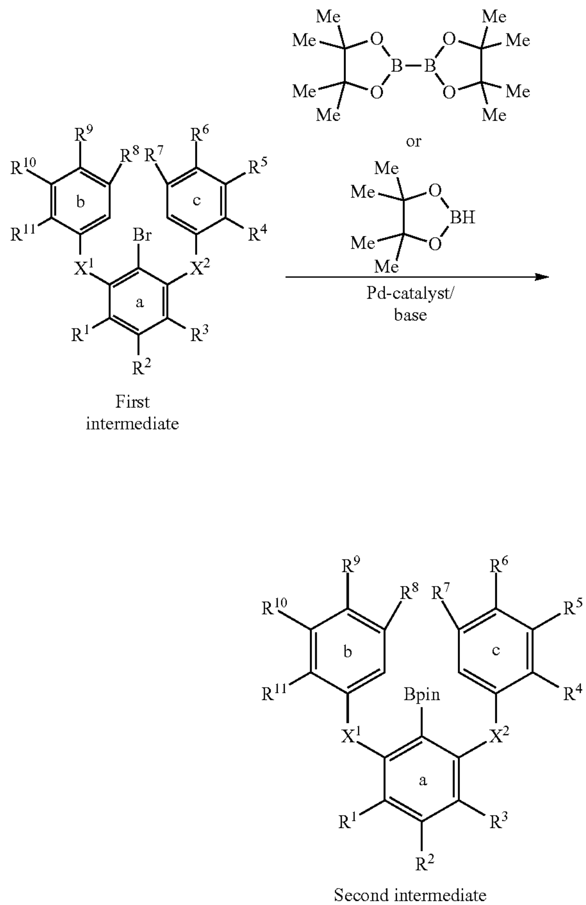

Scheme (5)

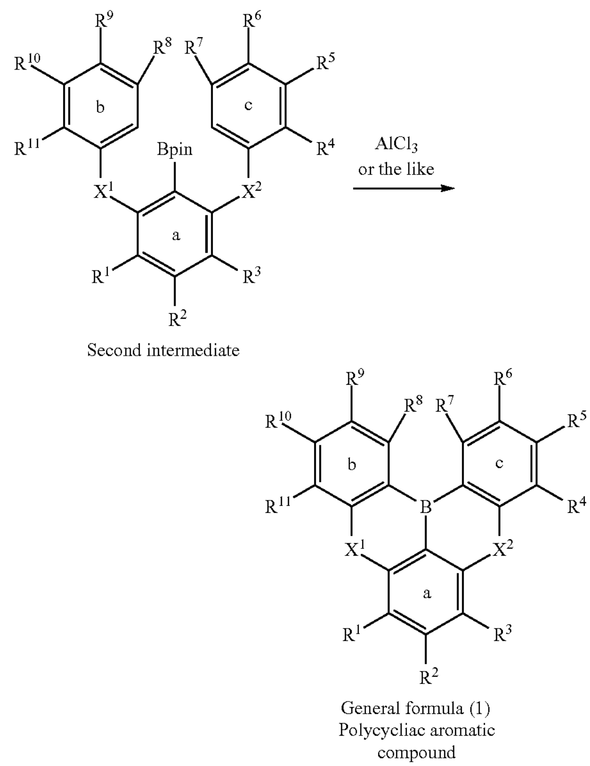

Note that examples of a metalation reagent used for the halogen-metal exchange in the schemes described above include an alkyllithium such as methyllithium, n-butyllithium, sec-butyllithium, or t-butyllithium; isopropylmagnesium chloride; isopropylmagnesium bromide; phenylmagnesium chloride; phenylmagnesium bromide; and a lithium chloride complex of isopropylmagnesium chloride known as a turbo Gringnard reagent.

Examples of a metalation reagent used for the ortho-metalation in the schemes described above include, in addition to the above reagents, an organic alkali compound such as lithium diisopropylamide, lithium tetramethylpiperidide, lithium hexamethyldisilazide, potassium hexamethyldisilazide, tetramethylpiperidinyl magnesium chloride/lithium chloride complex, or tri-n-butyl-magnesium acid lithium.

Furthermore, examples of an additive for accelerating a reaction in a case of using an alkyl lithium as a metalation reagent include N,N,N',N'-tetramethylethylene diamine, 1,4-diazabicyclo[2.2.2]octane, and N,N-dimethylpropylene urea.

In the third reaction, as illustrated in the following scheme (5), by causing the second intermediate such as a boronate to react with a Lewis acid such as aluminum chloride, the polycyclic aromatic compound represented by general formula (1) can be manufactured.

In addition, a Brønsted acid such as p-toluenesulfonic acid can also be used. In particular, in a case where a reaction is performed using a Lewis acid, a base such as diisopropyl ethylamine may be added in order to improve selectivity and yield.

Examples of the Lewis acid used in the above scheme (5) include $AlCl_3$, $AlBr_3$, $AlF_3$, $BF_3.OEt_2$, $BCl_3$, $BBr_3$, $GaCl_3$, $GaBr_3$, $InCl_3$, $InBr_3$, $In(OTf)_3$, $SnCl_4$, $SnBr_4$, AgOTf, $ScCl_3$, $Sc(OTf)_3$, $ZnCl_2$, $ZnBr_2$, $Zn(OTf)_2$, $MgCl_2$, $MgBr_2$, $Mg(OTf)_2$, LiOTf, NaOTf, KOTf, $Me_3SiOTf$, $Cu(OTf)_2$, $CuCl_2$, $YCl_3$, $Y(OTf)_3$, $TiCl_4$, $TiBr_4$, $ZrCl_4$, $ZrBr_4$, $FeCl_3$, $FeBr_3$, $CoCl_3$, and $CoBr_3$. These Lewis acids can be carried on a solid to be used.

Examples of the Brønsted acid used in the above scheme (5) include p-toluenesulfonic acid, methanesulfonic acid, trifluoromethanesulfonic acid, fluorosulfonic acid, carborane acid, trifluoroacetic acid, (trifluoromethanesulfonyl) imide, tris(trifluoromethanesulfonyl) methane, hydrogen chloride, hydrogen bromide, and hydrogen fluoride. Examples of a solid Brønsted acid include Amberlist (trade name: The Dow Chemical Company), Nafion (trade name: DuPont), zeolite, and Taycacure (trade name: Tayca Corporation).

Examples of the amine which may be added in the above scheme (5) include diisopropyl ethylamine, triethylamine, tributylamine, 1,4-diazabicyclo[2.2.2]octane, N,N-dimethyl-p-toluidine, N,N-dimethylaniline, pyridine, 2,6-lutidine, and 2,6-di-t-butylamine.

Examples of a solvent used in the above scheme (5) include o-dichlorobenzene, chlorobenzene, toluene, benzene, methylene chloride, chloroform, dichloroethylene, benzotrifluoride, decalin, cyclohexane, hexane, heptane, 1,2,4-trimethylbenzene, xylene, diphenylether, anisole, cyclopentylmethyl ether, tetrahydrofuran, dioxane, and methyl-t-butylether.

Note that the polycyclic aromatic compound represented by general formula (1) include a compound in which at least some hydrogen atoms are substituted by deuterium atoms. However, such a compound can be synthesized in a similar manner to the above by using a raw material in which deuteration has been performed at a desired position.

3. Polycyclic Aromatic Compound Represented by Formula (2) and Multimer Thereof

Each of a polycyclic aromatic compound represented by general formula (2) and a multimer having a plurality of structures represented by general formula (2) can be used as material for a light emitting layer in combination with the polycyclic aromatic compound represented by general formula (1), and basically functions as a dopant. The polycyclic aromatic compound and multimer thereof are preferably a polycyclic aromatic compound represented by the following general formula (2') or a multimer having a plurality of structures represented by the following general formula (2').

In addition, the compound of general formula (2) or general formula (2') and the multimer thereof are compounds different from the polycyclic aromatic compound represented by general formula (1). The polycyclic aromatic compound represented by general formula (1) is excluded from the definitions of the general formula (2) and the general formula (2').

(2)

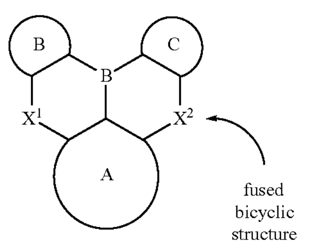

(2')

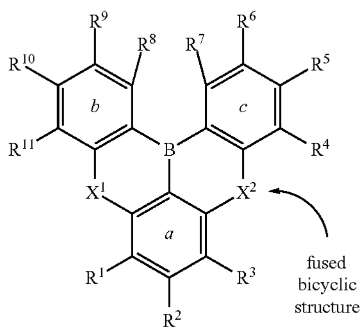

In the above formula (2), ring A, ring B and ring C each independently represent an aryl ring or a heteroaryl ring, while at least one hydrogen atom in these rings may be substituted, $X^1$ and $X^2$ each independently represent >O or >N—R, R of the >N—R is an optionally substituted aryl, an optionally substituted heteroaryl or an optionally substituted alkyl, R of the >N—R may be bonded to the ring A, ring B, and/or ring C with a linking group or a single bond, and at least one hydrogen atom in a compound or a structure represented by formula (2) may be substituted by a halogen atom, a cyano or a deuterium atom.

In the above formula (2'), $R^1$ to $R^{11}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these may be substituted by an aryl, a heteroaryl, or an alkyl, adjacent groups among $R^1$ to $R^{11}$ may be bonded to each other to form an aryl ring or a heteroaryl ring together with the ring a, ring b, or ring c, at least one hydrogen atom in the ring thus formed may be substituted by an aryl, a heteroaryl, a diarylamino, a diheteroarylamino, an arylheteroarylamino, an alkyl, an alkoxy, or an aryloxy, and at least one hydrogen atom in these may be substituted by an aryl, a heteroaryl, or an alkyl, $X^1$ and $X^2$ each independently represent >N—R, R of the >N—R represents an aryl having 6 to 12 carbon atoms, a heteroaryl having 2 to 15 carbon atoms, or an alkyl having 1 to 6 carbon atoms, R of the >N—R may be bonded to the ring a, ring b, and/or ring c with —O—, —S—, —C(—R)$_2$, or a single bond, R of the —C(—R)$_2$ represents an alkyl having 1 to 6 carbon atoms, and at least one hydrogen atom in the compound represented by formula (2') may be substituted by a halogen atom or a deuterium atom.

The ring A, ring B and ring C in general formula (2) each independently represent an aryl ring or a heteroaryl ring, and at least one hydrogen atom in these rings may be substituted by a substituent. This substituent is preferably a substituted or unsubstituted aryl, a substituted or unsubstituted heteroaryl, a substituted or unsubstituted diarylamino, a substituted or unsubstituted diheteroarylamino, a substituted or unsubstituted arylheteroarylamino (an amino group having an aryl and a heteroaryl), a substituted or unsubstituted alkyl, a substituted or unsubstituted alkoxy, or a substituted or unsubstituted aryloxy. In a case where these groups have substituents, examples of the substituents include an aryl, a heteroaryl, and an alkyl. Furthermore, the aryl ring or heteroaryl ring preferably has a 5-membered ring or 6-membered ring sharing a bond with a fused bicyclic structure at the center of general formula (2) constituted by "B", "$X^1$", and "$X^2$" (hereinafter, this structure is also referred to as "structure D").

Here, the "fused bicyclic structure (structure D)" means a structure in which two saturated hydrocarbon rings that are configured to include "B", "$X^1$" and "$X^2$" and indicated at the center of general formula (2) are fused. Furthermore, a "6-membered ring sharing a bond with the fused bicyclic structure" means, for example, ring a (benzene ring (6-membered ring)) fused to the structure D as represented by the above general formula (2'). Furthermore, the phrase "aryl ring or heteroaryl ring (which is ring A) has this 6-membered ring" means that the ring A is formed only from this 6-membered ring, or the ring A is formed such that other rings are further fused to this 6-membered ring so as to include this 6-membered ring. In other words, the "aryl ring or heteroaryl ring (which is ring A) having a 6-membered ring" as used herein means that the 6-membered ring that constitutes the entirety or a portion of the ring A is fused to the structure D. The same description applies to the "ring B (ring b)", "ring C (ring c)", and the "5-membered ring".

The ring A (or ring B or ring C) in general formula (2) corresponds to ring a and its substituents $R^1$ to $R^3$ in general formula (2') (or ring b and its substituents $R^4$ to $R^7$, or ring c and its substituents $R^8$ to $R^{11}$). That is, general formula (2') corresponds to a structure in which "rings A to C having 6-membered rings" have been selected as the rings A to C of general formula (2). For this meaning, the rings of general formula (2') are represented by small letters a to c.

In general formula (2'), adjacent groups among the substituents $R^1$ to $R^{11}$ of the ring a, ring b, and ring c may be bonded to each other to form an aryl ring or a heteroaryl ring together with the ring a, ring b, or ring c, and at least one hydrogen atom in the ring thus formed may be substituted by an aryl, a heteroaryl, a diarylamino, a diheteroarylamino, an arylheteroarylamino, an alkyl, an alkoxy or an aryloxy, while at least one hydrogen atom in these may be substituted by an aryl, a heteroaryl, or an alkyl. Therefore, in a compound represented by general formula (2'), a ring structure constituting the compound changes as represented by the following formulas (2'-1) and (2'-2) according to a mutual bonding form of substituents in the ring a, ring b or ring c. Ring A', ring B' and ring C' in each formula correspond to the ring A, ring B and ring C in general formula (2), respectively. Note that $R^1$ to $R^{11}$, a, b, c, $X^1$, and $X^2$ in each formula are defined in the same manner as those in formula (2').

(2'-1)

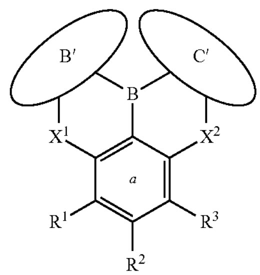

(2'-2)

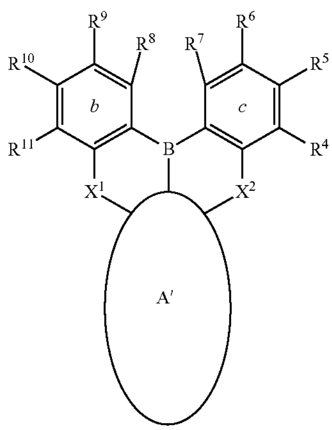

The ring A', ring B' and, ring C' in the above formulas (2'-1) and (2'-2) each represent, to be described in connection with general formula (2'), an aryl ring or a heteroaryl ring formed by bonding adjacent groups among the substituents $R^1$ to $R^{11}$ together with the ring a, ring b, and ring c, respectively (may also be referred to as a fused ring obtained by fusing another ring structure to the ring a, ring b, or ring c). Incidentally, although not indicated in the formula, there is also a compound in which all of the ring a, ring b, and ring c have been changed to the ring A', ring B' and ring C'. Furthermore, as apparent from the above formulas (2'-1) and (2'-2), for example, $R^8$ of the ring b and $R^7$ of the ring c, $R^{11}$ of the ring b and $R^1$ of the ring a, $R^4$ of the ring c and $R^3$ of the ring a, and the like do not correspond to "adjacent groups", and these groups are not bonded to each other. That is, the term "adjacent groups" means adjacent groups on the same ring.

A compound represented by the above formula (2'-1) or (2'-2) corresponds to, for example, a compound represented by any one of formulas (2-402) to (2-409) and (2-412) to (2-419) listed as specific compounds that are described below. That is, for example, the compound represented by formula (2'-1) or (2'-2) is a compound having ring A' (or ring B' or ring C') that is formed by fusing a benzene ring, an indole ring, a pyrrole ring, a benzofuran ring, a benzothiophene ring or the like to a benzene ring which is ring a (or ring b or ring c), and the fused ring A' (or fused ring B' or fused ring C') that has been formed is a naphthalene ring, a carbazole ring, an indole ring, a dibenzofuran ring, a dibenzothiophene ring or the like.

$X^1$ and $X^2$ in general formula (2) each independently represent ">O" or ">N—R", while R of the >N—R represents an optionally substituted aryl, or an optionally substituted heteroaryl or an optionally substituted alkyl, and R of the >N—R may be bonded to the ring B and/or ring C with a linking group or a single bond. The linking group is preferably —O—, —S— or —C(—R)$_2$—. Incidentally, R of the "—C(—R)$_2$—" represents a hydrogen atom or an alkyl. This description also applies to $X^1$ and $X^2$ in general formula (2').

Here, the provision that "R of the >N—R is bonded to the ring A, ring B and/or ring C with a linking group or a single bond" for general formula (2) corresponds to the provision that "R of the >N—R is bonded to the ring a, ring b and/or ring c with —O—, —S—, —C(—R)$_2$— or a single bond" for general formula (2').

This provision can be expressed by a compound having a ring structure represented by the following formula (2'-3-1), in which $X^1$ or $X^2$ is incorporated into the fused ring B' or C'. That is, for example, the compound is a compound having ring B' (or ring C') formed by fusing another ring to a benzene ring which is ring b (or ring c) in general formula (2') so as to incorporate $X^1$ (or $X^2$). This compound corresponds to, for example, a compound represented by any one of formulas (2-451) to (2-462) or a compound represented by any one of formulas (2-1401) to (2-1460), listed as specific examples that are described below, and the fused ring B' (or fused ring C') that has been formed is, for example, a phenoxazine ring, a phenothiazine ring, or an acridine ring.

The above provision can be expressed by a compound having a ring structure in which $X^1$ and/or $X^2$ are/is incorporated into the fused ring A', represented by the following formula (2'-3-2) or (2'-3-3). That is, for example, the compound is a compound having ring A' formed by fusing another ring to a benzene ring which is ring a in general formula (2') so as to incorporate $X^1$ (and/or $X^2$). This compound corresponds to, for example, a compound represented by any one of formulas (2-471) to (2-479) listed as specific examples that are described below, and the fused ring $A^1$ that has been formed is, for example, a phenoxazine ring, a phenothiazine ring, or an acridine ring. Note that $R^1$ to $R^{11}$, a, b, c, $X^1$, and $X^2$ in formulas (2'-3-1), (2'-3-2) and (2'-3-3) are defined in the same manner as those in formula (2').

(2'-3-1)

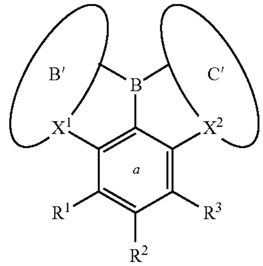

-continued (2′-3-2)

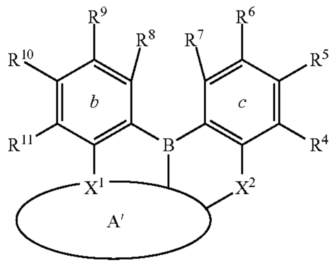

(2′-3-3)

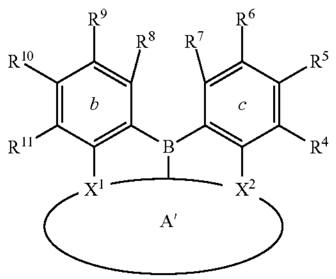

The "aryl ring" as the ring A, ring B or ring C of the general formula (2) is, for example, an aryl ring having 6 to 30 carbon atoms, and the aryl ring is preferably an aryl ring having 6 to 16 carbon atoms, more preferably an aryl ring having 6 to 12 carbon atoms, and particularly preferably an aryl ring having 6 to 10 carbon atoms. Incidentally, this "aryl ring" corresponds to the "aryl ring formed by bonding adjacent groups among $R^1$ to $R^{11}$ together with the ring a, ring b, or ring c" defined by general formula (2'). Ring a (or ring b or ring c) is already constituted by a benzene ring having 6 carbon atoms, and therefore the carbon number of 9 in total of a fused ring obtained by fusing a 5-membered ring to this benzene ring becomes a lower limit of the carbon number.

Specific examples of the "aryl ring" include a benzene ring which is a monocyclic system; a biphenyl ring which is a bicyclic system; a naphthalene ring which is a fused bicyclic system; a terphenyl ring (m-terphenyl, o-terphenyl, or p-terphenyl) which is a tricyclic system; an acenaphthylene ring, a fluorene ring, a phenalene ring and a phenanthrene ring which are fused tricyclic systems; a triphenylene ring, a pyrene ring and a naphthacene ring which are fused tetracyclic systems; and a perylene ring and a pentacene ring which are fused pentacyclic systems.

The "heteroaryl ring" as the ring A, ring B or ring C of general formula (2) is, for example, a heteroaryl ring having 2 to 30 carbon atoms, and the heteroaryl ring is preferably a heteroaryl ring having 2 to 25 carbon atoms, more preferably a heteroaryl ring having 2 to 20 carbon atoms, still more preferably a heteroaryl ring having 2 to 15 carbon atoms, and particularly preferably a heteroaryl ring having 2 to 10 carbon atoms. In addition, examples of the "heteroaryl ring" include a heterocyclic ring containing 1 to 5 heteroatoms selected from an oxygen atom, a sulfur atom, and a nitrogen atom in addition to a carbon atom as a ring-constituting atom.

Incidentally, this "heteroaryl ring" corresponds to the "heteroaryl ring formed by bonding adjacent groups among the $R^1$ to $R^{11}$ together with the ring a, ring b, or ring c" defined by general formula (2'). The ring a (or ring b or ring c) is already constituted by a benzene ring having 6 carbon atoms, and therefore the carbon number of 6 in total of a fused ring obtained by fusing a 5-membered ring to this benzene ring becomes a lower limit of the carbon number.

Specific examples of the "heteroaryl ring" include a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, and a thianthrene ring.

At least one hydrogen atom in the above "aryl ring" or "heteroaryl ring" may be substituted by a substituted or unsubstituted "aryl", a substituted or unsubstituted "heteroaryl", a substituted or unsubstituted "diarylamino", a substituted or unsubstituted "diheteroarylamino", a substituted or unsubstituted "arylheteroarylamino", a substituted or unsubstituted "alkyl", a substituted or unsubstituted "alkoxy", or a substituted or unsubstituted "aryloxy", which is a primary substituent. Examples of the aryl of the "aryl", "heteroaryl" and "diarylamino", the heteroaryl of the "diheteroarylamino", the aryl and the heteroaryl of the "arylheteroarylamino", and the aryl of the "aryloxy" as these primary substituents include a monovalent group of the "aryl ring" or "heteroaryl ring" described above.

Furthermore, the "alkyl" as the primary substituent may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 to 4 carbon atoms) is particularly preferable.

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Furthermore, the "alkoxy" as a primary substituent may be, for example, a linear alkoxy having 1 to 24 carbon atoms or a branched alkoxy having 3 to 24 carbon atoms. The alkoxy is preferably an alkoxy having 1 to 18 carbon atoms (branched alkoxy having 3 to 18 carbon atoms), more preferably an alkoxy having 1 to 12 carbon atoms (branched alkoxy having 3 to 12 carbon atoms), still more preferably an alkoxy having 1 to 6 carbon atoms (branched alkoxy having 3 to 6 carbon atoms), and particularly preferably an alkoxy having 1 to 4 carbon atoms (branched alkoxy having 3 to 4 carbon atoms).

Specific examples of the alkoxy include a methoxy, an ethoxy, a propoxy, an isopropoxy, a butoxy, an isobutoxy, a s-butoxy, a t-butoxy, a pentyloxy, a hexyloxy, a heptyloxy, and an octyloxy.

In the substituted or unsubstituted "aryl", substituted or unsubstituted "heteroaryl", substituted or unsubstituted "diarylamino", substituted or unsubstituted "diheteroarylamino", substituted or unsubstituted "arylheteroarylamino", substituted or unsubstituted "alkyl", substituted or unsubstituted "alkoxy", or substituted or unsubstituted "aryloxy", which is the primary substituent, at least one hydrogen atom may be substituted by a secondary substituent, as described to be substituted or unsubstituted. Examples of this secondary substituent include an aryl, a heteroaryl, and an alkyl, and for the details thereof, reference can be made to the above description on the monovalent group of the "aryl ring" or "heteroaryl ring" and the "alkyl" as the primary substituent. Furthermore, regarding the aryl or heteroaryl as the secondary substituent, an aryl or heteroaryl in which at least one hydrogen atom is substituted by an aryl such as phenyl (specific examples are described above), or an alkyl such as methyl (specific examples are described above), is also included in the aryl or heteroaryl as the secondary substituent. For instance, when the secondary substituent is a carbazolyl group, a carbazolyl group in which at least one hydrogen atom at the 9-position is substituted by an aryl such as phenyl, or an alkyl such as methyl, is also included in the heteroaryl as the secondary substituent.

Examples of the aryl, the heteroaryl, the aryl of the diarylamino, the heteroaryl of the diheteroarylamino, the aryl and the heteroaryl of the arylheteroarylamino, or the aryl of the aryloxy for $R^1$ to $R^{11}$ of general formula (2') include the monovalent groups of the "aryl ring" or "heteroaryl ring" described in general formula (2). Furthermore, regarding the alkyl or alkoxy for $R^1$ to $R^{11}$, reference can be made to the description on the "alkyl" or "alkoxy" as the primary substituent in the above description of general formula (2). In addition, the same also applies to the aryl, heteroaryl or alkyl as the substituents for these groups. Furthermore, the same also applies to the heteroaryl, diarylamino, diheteroarylamino, arylheteroarylamino, alkyl, alkoxy, or aryloxy in a case of forming an aryl ring or a heteroaryl ring by bonding adjacent groups among $R^1$ to $R^{11}$ together with the ring a, ring b or ring c, and the aryl, heteroaryl, or alkyl as a further substituent.

R of the >N—R for $X^1$ and $X^2$ of general formula (2) represents an aryl, a heteroaryl, or an alkyl which may be substituted by the secondary substituent described above, and at least one hydrogen atom in the aryl or heteroaryl may be substituted by, for example, an alkyl. Examples of this aryl, heteroaryl or alkyl include those described above. Particularly, an aryl having 6 to 10 carbon atoms (for example, a phenyl or a naphthyl), a heteroaryl having 2 to 15 carbon atoms (for example, carbazolyl), and an alkyl having 1 to 4 carbon atoms (for example, methyl or ethyl) are preferable. This description also applies to $X^1$ and $X^2$ in general formula (2').

R of the "—C(—R)$_2$—" as a linking group for general formula (2) represents a hydrogen atom or an alkyl, and examples of this alkyl include those described above. Particularly, an alkyl having 1 to 4 carbon atoms (for example, methyl or ethyl) is preferable. This description also applies to "—C(—R)$_2$—" as a linking group for general formula (2').

Furthermore, the light emitting layer may contain a multimer having a plurality of unit structures each represented by general formula (2), and preferably a multimer having a plurality of unit structures each represented by general formula (2'). The multimer is preferably a dimer to a hexamer, more preferably a dimer to a trimer, and a particularly preferably a dimer. The multimer may be in a form having a plurality of unit structures described above in one compound, and for example, the multimer may be in a form in which a plurality of unit structures are bonded with a linking group such as a single bond, an alkylene group having 1 to 3 carbon atoms, a phenylene group, or a naphthylene group. In addition, the multimer may be in a form in which a plurality of unit structures are bonded such that any ring contained in the unit structure (ring A, ring B or ring C, or ring a, ring b or ring c) is shared by the plurality of unit structures, or may be in a form in which the unit structures are bonded such that any rings contained in the unit structures (ring A, ring B or ring C, or ring a, ring b or ring c) are fused.

Examples of such a multimer include multimer compounds represented by the following formula (2'-4), (2'-4-1), (2'-4-2), (2'-5-1) to (2'-5-4), and (2'-6). A multimer compound represented by the following formula (2'-4) corresponds to, for example, a compound represented by formula (2-423) described below. That is, to be described in connection with general formula (2'), the multimer compound includes a plurality of unit structures each represented by general formula (2') in one compound so as to share a benzene ring as ring a. Furthermore, a multimer compound represented by the following formula (2'-4-1) corresponds to, for example, a compound represented by the following formula (2-2665). That is, to be described in connection with general formula (2'), the multimer compound includes two unit structures each represented by general formula (2') in one compound so as to share a benzene ring as ring a. Furthermore, a multimer compound represented by the following formula (2'-4-2) corresponds to, for example, a compound represented by the following formula (2-2666). That is, to be described in connection with general formula (2'), the multimer compound includes two unit structures each represented by general formula (2') in one compound so as to share a benzene ring as ring a. Furthermore, multimer compounds represented by the following formulas (2'-5-1) to (2'-5-4) correspond to, for example, compounds represented by the following formulas (2-421), (2-422), (2-424), and (2-425). That is, to be described in connection with general formula (2'), the multimer compound includes a plurality of unit structures each represented by general formula (2') in one compound so as to share a benzene ring as ring b (or ring c) Furthermore, a multimer compound represented by the following formula (2'-6) corresponds to, for example, a compound represented by any one of the following formulas (2-431) to (2-435). That is, to be described in connection with general formula (2'), for example, the multimer compound includes a plurality of unit structures each represented by general formula (2') in one compound such that a benzene ring as ring b (or ring a or ring c) of a certain unit structure and a benzene ring as ring b (or ring a or ring c) of a certain unit structure are fused. Note that each code in the following structural formulas are defined in the same manner as those in formula (2').

-continued
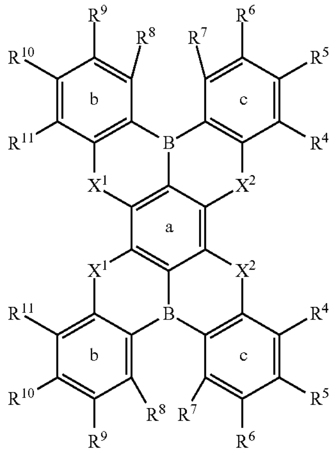
(2′-4)
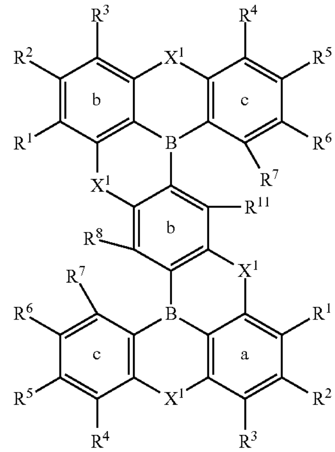
(2′-5-1)
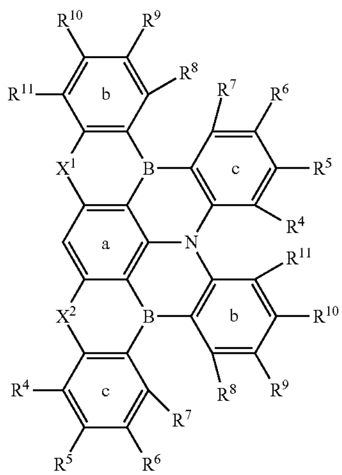
(2′-4-1)
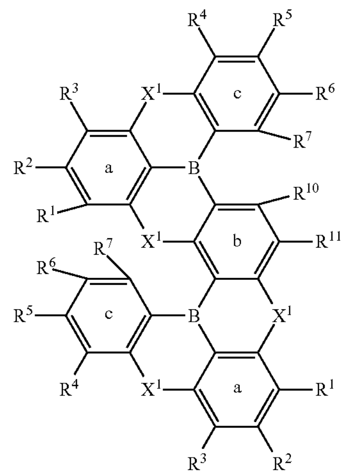
(2′-5-2)
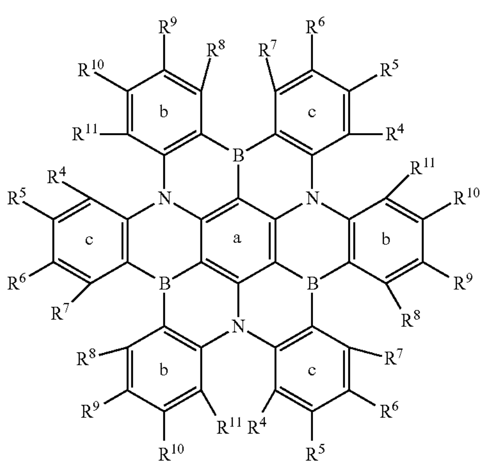
(2′-4-2)
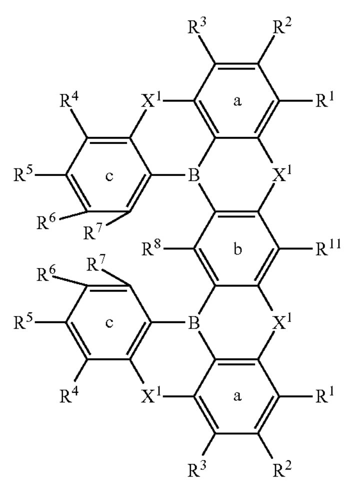
(2′-5-3)

-continued (2'-5-4)

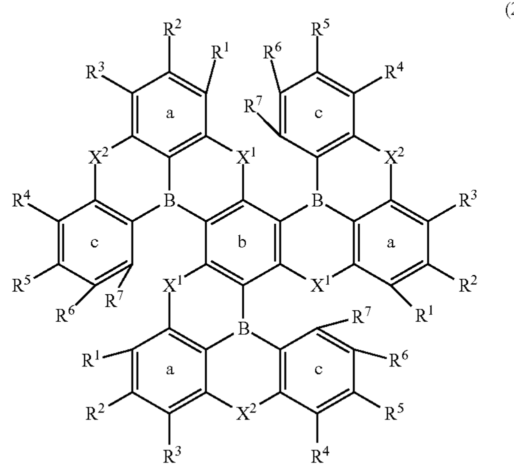

(2'-6)

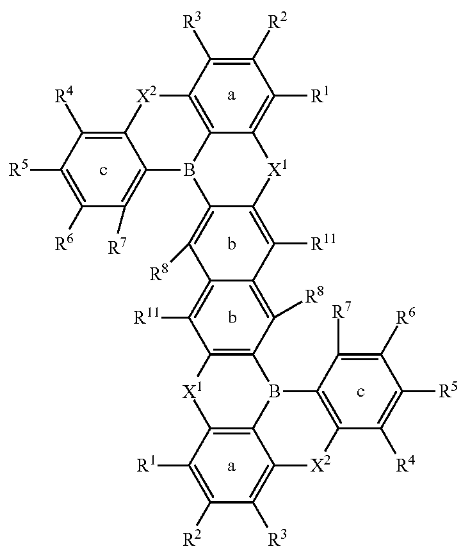

The multimer compound may be a multimer in which a multimer form represented by formula (2'-4), (2'-4-1) or (2'-4-2) and a multimer form represented by any one of formula (2'-5-1) to (2'-5-4) or (2'-6) are combined, may be a multimer in which a multimer form represented by any one of formula (2'-5-1) to (2'-5-4) and a multimer form represented by formula (2'-6) are combined, or may be a multimer in which a multimer form represented by formula (2'-4), (2'-4-1) or (2'-4-2), a multimer form represented by any one of formulas (2'-5-1) to (2'-5-4), and a multimer form represented by formula (2'-6) are combined.

Furthermore, all or a portion of the hydrogen atoms in the chemical structures of the compound represented by general formula (2) or (2') and a multimer thereof may be substituted by halogen atoms, cyanos or deuterium atoms. For example, in regard to formula (2), the hydrogen atoms in the ring A, ring B, ring C (ring A to ring C are aryl rings or heteroaryl rings), substituents on the ring A to ring C, and R (=alkyl or aryl) when $X^1$ and $X^2$ each represent >N—R, may be substituted by halogen atoms, cyanos or deuterium atoms and among these, a form in which all or a portion of the hydrogen atoms in the aryl or heteroaryl are substituted by halogen atoms, cyanos or deuterium atoms may be mentioned. The halogen is fluorine, chlorine, bromine, or iodine, preferably fluorine, chlorine, or bromine, and more preferably chlorine.

Note that more specific examples of the compound represented by general formula (2') include a compound represented by the following general formula (2").

(2")

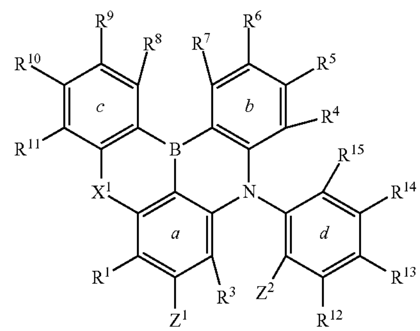

In the above formula (2"), $R^1$, $R^3$, $R^4$ to $R^7$, $R^8$ to $R^{11}$, and $R^{12}$ to $R^{15}$ each independently represent a hydrogen atom, an aryl, a heteroaryl, a diarylamino, a diheteroarylamino, an arylheteroarylamino, an alkyl, an alkoxy, or an aryloxy, at least one hydrogen atom in these may be substituted by an aryl, a heteroaryl, or an alkyl, $X^1$ represents —O— or >N—R, R of the >N—R represents an aryl having 6 to 12 carbon atoms, a heteroaryl having 2 to 15 carbon atoms, or an alkyl having 1 to 6 carbon atoms, and at least one hydrogen atom in these may be substituted by an aryl having 6 to 12 carbon atoms, a heteroaryl having 2 to 15 carbon atoms, or an alkyl having 1 to 6 carbon atoms, $Z^1$ and $Z^2$ each independently represent an aryl, a heteroaryl, a diarylamino, an aryloxy, an aryl-substituted alkyl, a hydrogen atom, an alkyl, or an alkoxy, at least one hydrogen atom in these may be substituted by an alkyl, and in a case where $Z^1$ represents a phenyl which is optionally substituted by an alkyl, m-biphenylyl which is optionally substituted by an alkyl, p-biphenylyl which is optionally substituted by an alkyl, a monocyclic heteroaryl which is optionally substituted by an alkyl, a diphenylamino which is optionally substituted by an alkyl, a hydrogen atom, an alkyl, or an alkoxy, $Z^2$ does not represent a hydrogen atom, an alkyl, or an alkoxy, and at least one hydrogen atom in the compound represented by formula (2") may be substituted by a halogen atom or a deuterium atom.

For description of the groups such as an aryl in the above formula (2"), the description of the groups in general formula (2) or (2') can be cited.

$Z^1$ and $Z^2$ preferably each independently represent an aryl having 6 to 10 carbon atoms, a diarylamino (in which the aryls each have 6 to 10 carbon atoms), an aryloxy having 6 to 10 carbon atoms, an alkyl having 1 to 4 carbon atoms, substituted by one to three aryls each having 6 to 10 carbon atoms, a hydrogen atom, or an alkyl having 1 to 4 carbon atoms, and at least one hydrogen atom in these may be substituted by an alkyl having 1 to 4 carbon atoms.

$Z^1$ more preferably represents a diarylamino, an aryloxy, a triaryl-substituted alkyl having 1 to 4 carbon atoms, a hydrogen atom, or an alkyl having 1 to 4 carbon atoms, and the aryls in these each independently represent a phenyl, a biphenylyl, or a naphthly which may be substituted by an alkyl having 1 to 4 carbon atoms. $Z^1$ still more preferably represents a diarylamino, a hydrogen atom, or an alkyl having 1 to 4 carbon atoms, and each of the aryls in the diarylamino represents a phenyl, a biphenylyl, or a naphthyl which may be substituted by an alkyl having 1 to 4 carbon atoms.

$Z^2$ more preferably represents a phenyl, a biphenylyl, or a naphthly which may be substituted by an alkyl having 1 to 4 carbon atoms, a hydrogen atom, or an alkyl having 1 to 4 carbon atoms.

However, even when a phenyl group is selected for the position of $Z^1$, the phenyl group is not a bulky substituent, but even when the phenyl group is not a bulky substituent as $Z^1$, the phenyl group plays a role as a bulky substituent at the position of $Z^2$ because the position of $Z^2$ is an ortho position of a >N-phenyl group, where a surrounding space is limited. Examples of such a group having different bulky effects depending on a position (a group not functioning as a bulky substituent at the position of $Z^1$) include, in addition to a phenyl group, a m-biphenylyl group, a p-biphenylyl group, a monocyclic heteroaryl group (a heteroaryl group containing one ring, such as a pyridyl group), and a diphenylamino group. A hydrogen atom, an alkyl group, or an alkoxy group does not become a bulky substituent as $Z^1$ or $Z^2$.

That is, as $Z^1$, a phenyl group, a m-biphenylyl group, and a p-biphenylyl group among aryls, a monocyclic heteroaryl group (a heteroaryl group containing one ring, such as a pyridyl group) among heteroaryls, a diphenylamino group among diarylaminos, a hydrogen atom, an alkyl group, an alkoxy group, and a group obtained by substituting at least one hydrogen atom in these by an alkyl do not play a role singly as a bulky substituent in the present application. Therefore, the substituent $Z^2$ needs to be bulky. As $Z^2$, a hydrogen atom, an alkyl group, an alkoxy group, and a group obtained by substituting at least one hydrogen atom in these groups by an alkyl are not bulky, and therefore the present application excludes a combination thereof with $Z^1$ and $Z^2$.

$Z^1$ preferably represents an o-biphenylyl group, an o-naphthylphenyl group (a group in which a 1- or 2-naphthyl group is substituted at an ortho position of a phenyl group), a phenylnaphthylamino group, a dinaphthylamino group, a phenyloxy group, a triphenymethyl group (trityl group), or a group obtained by substituting at least one of these groups by an alkyl (for example, methyl, ethyl, i-propyl, or t-butyl, preferably methyl or t-butyl, more preferably t-butyl).

$Z^2$ preferably represents a phenylyl group, a 1- or 2-naphthyl group, or a group obtained by substituting at least one of these groups by an alkyl (for example, methyl, ethyl, i-propyl, or t-butyl, preferably methyl or t-butyl, more preferably t-butyl).

More specific examples of the compound represented by formula (2) and a multimer thereof include compounds represented by the following structural formulas. In each of the structural formulas, "Me" represents a methyl group, "iPr" represents an isopropyl group, "tBu" represents a tertiary butyl group, "Ph" represents a phenyl group, and "D" represents a deuterium atom.

(2-50)

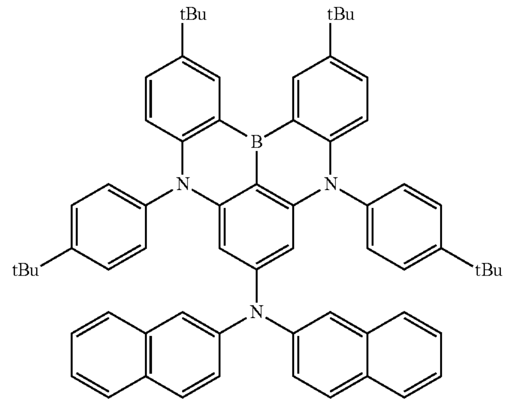

(2-51)

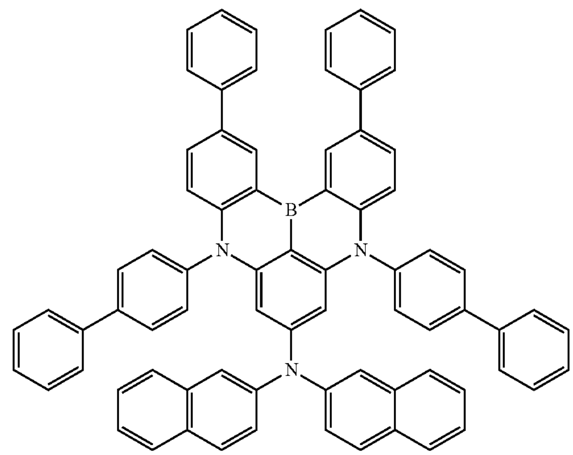

(2-52)

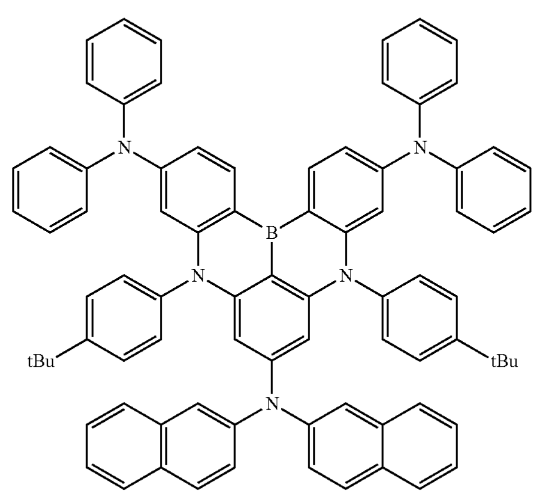

-continued
(2-53)
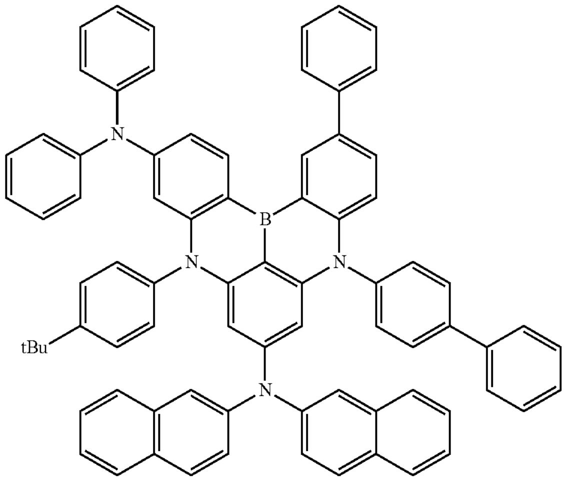
(2-54)
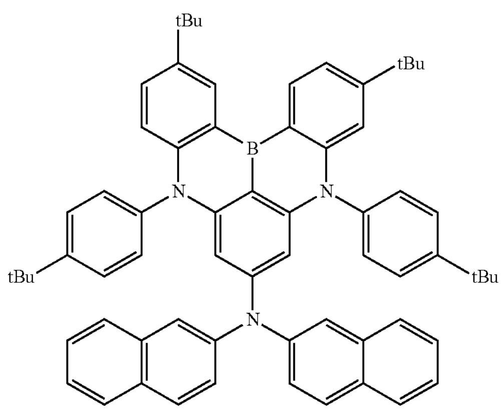
(2-55)
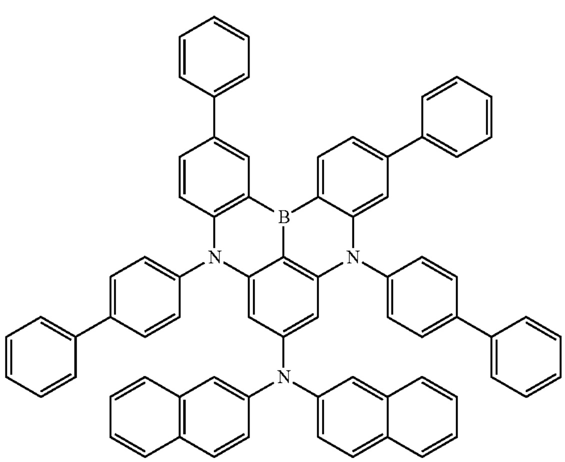
-continued
(2-56)
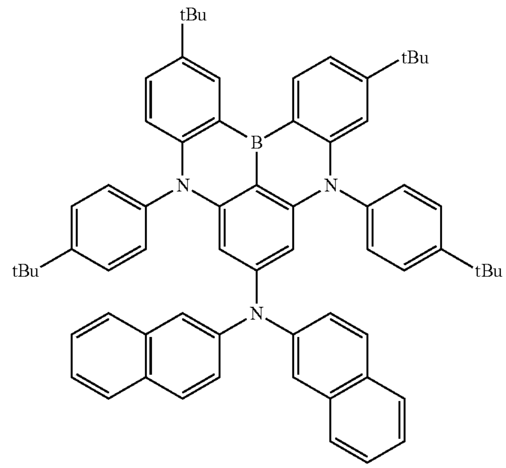
(2-57)
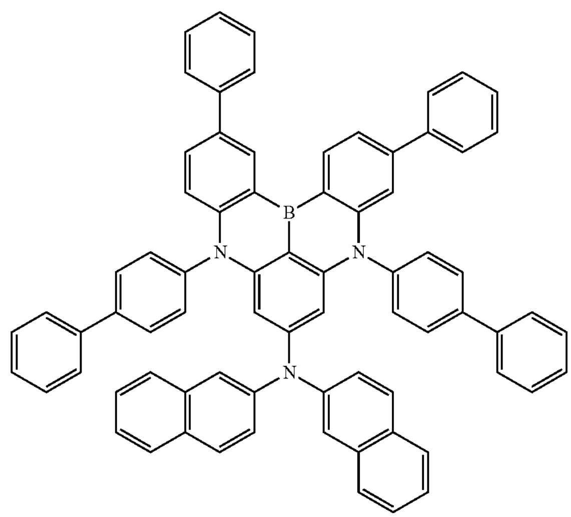
(2-58)
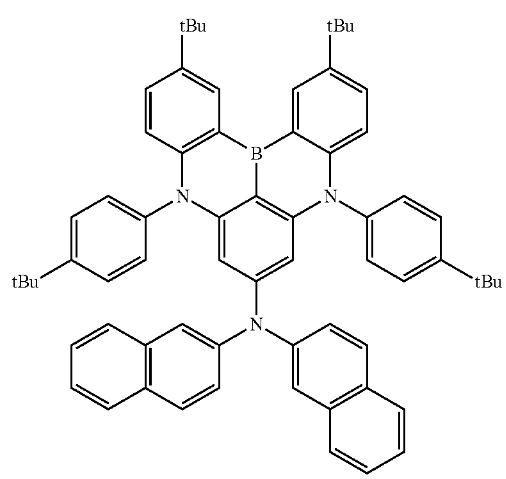

-continued
(2-59)
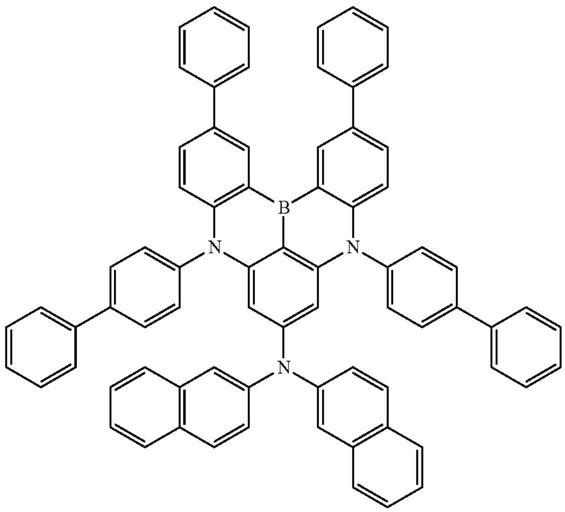
(2-60)
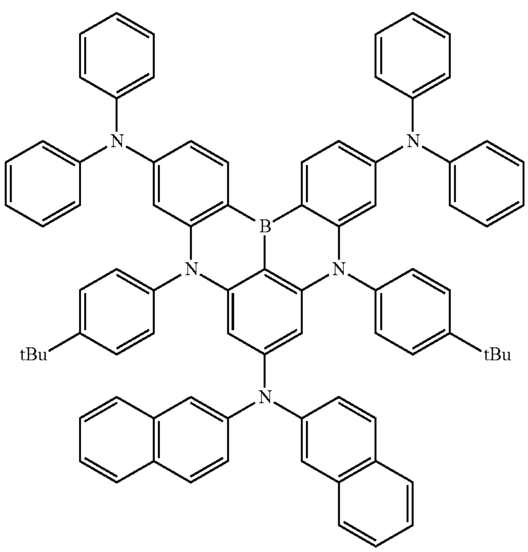
(2-61)
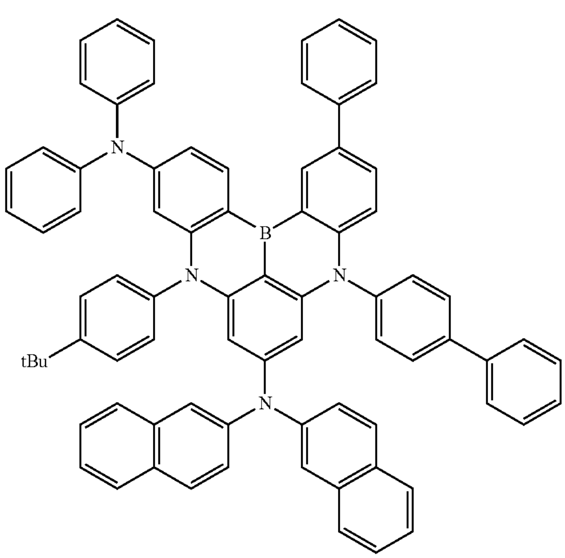
-continued
(2-62)
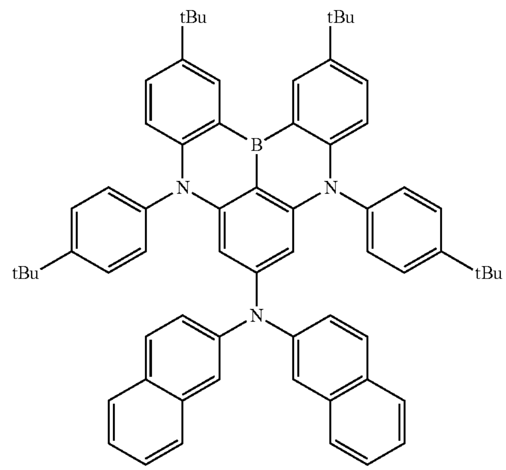
(2-63)
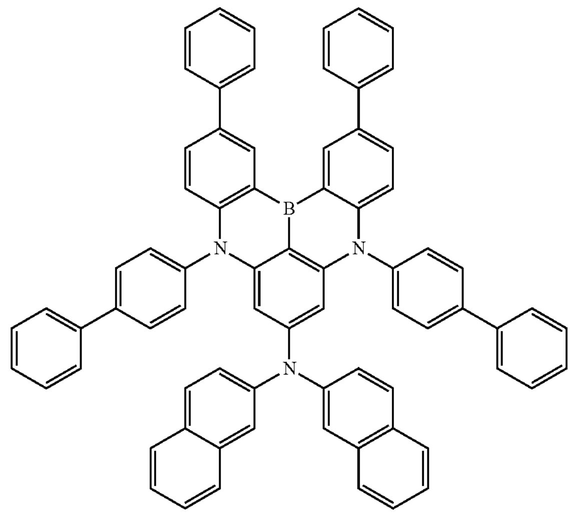
(2-64)
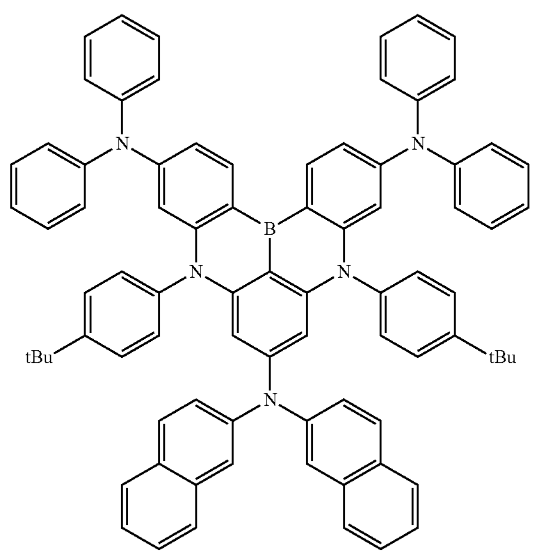

-continued
(2-65)
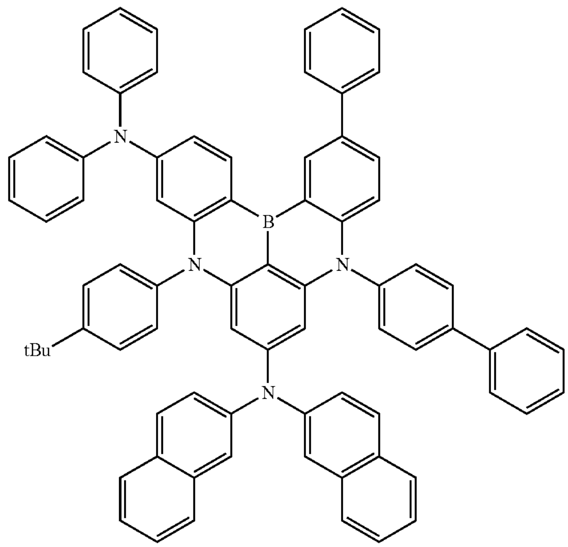
(2-66)
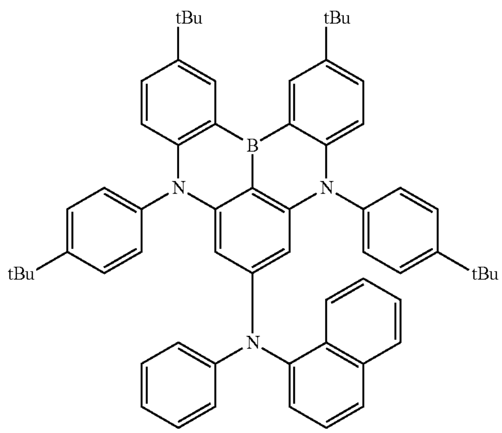
(2-67)
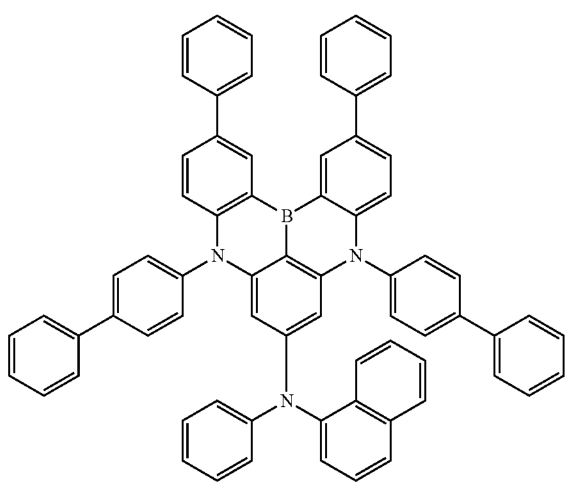
-continued
(2-68)
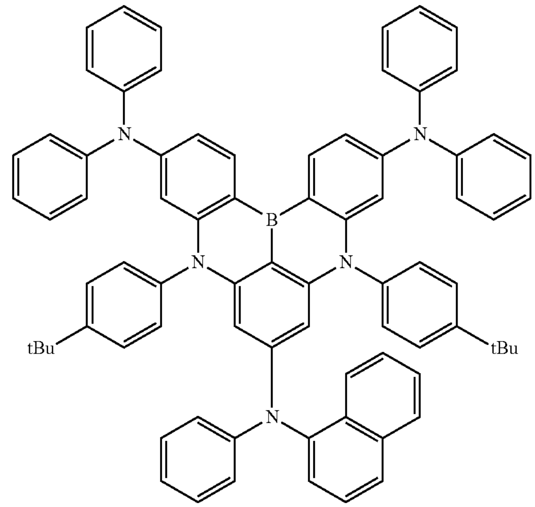
(2-69)
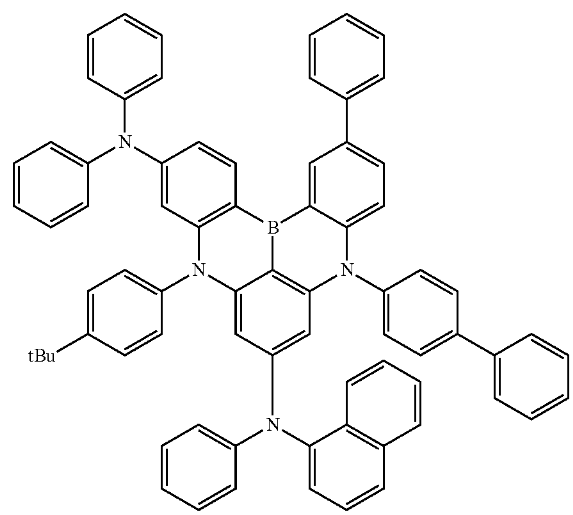
(2-120)
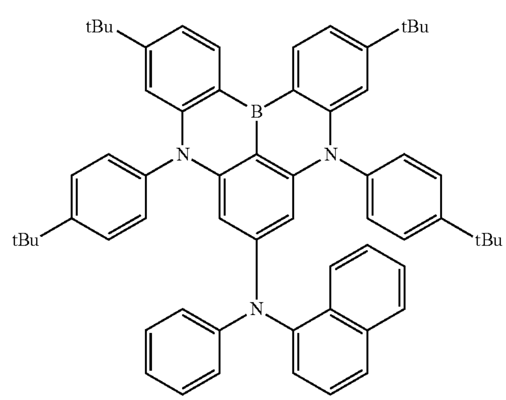

-continued
(2-121)
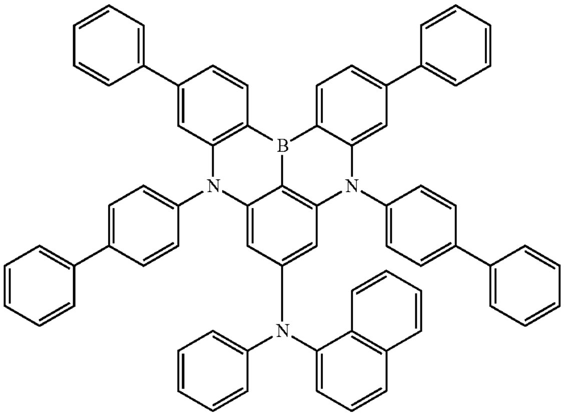
(2-122)
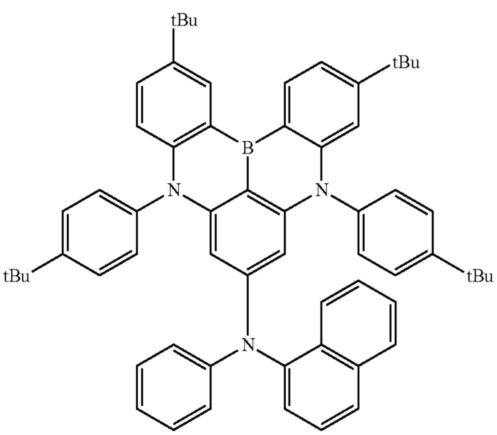
(2-123)
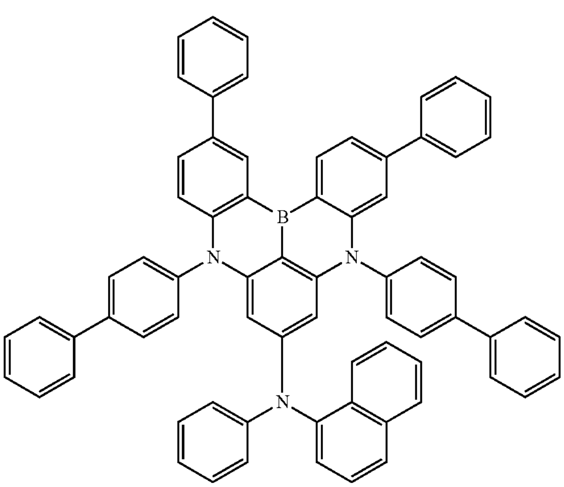
-continued
(2-124)
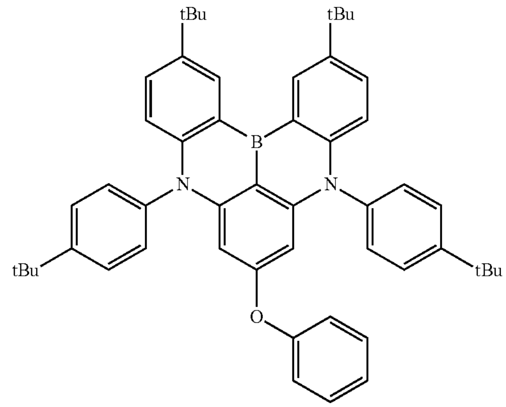
(2-125)
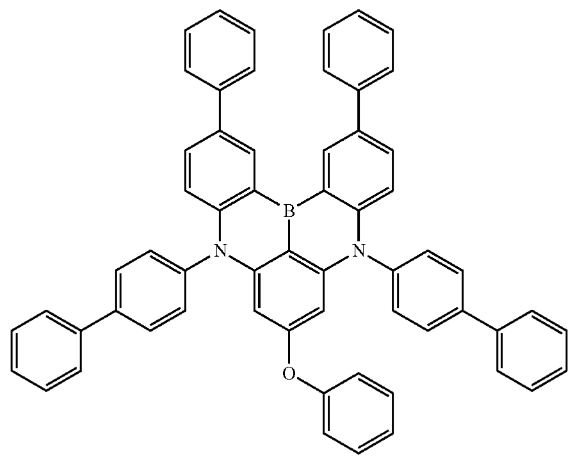
(2-126)
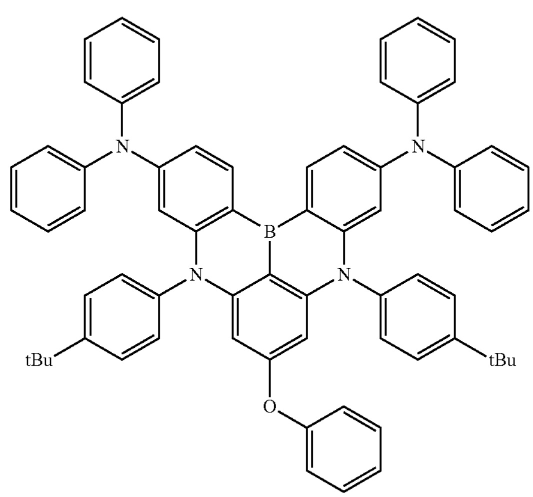

-continued
(2-127)
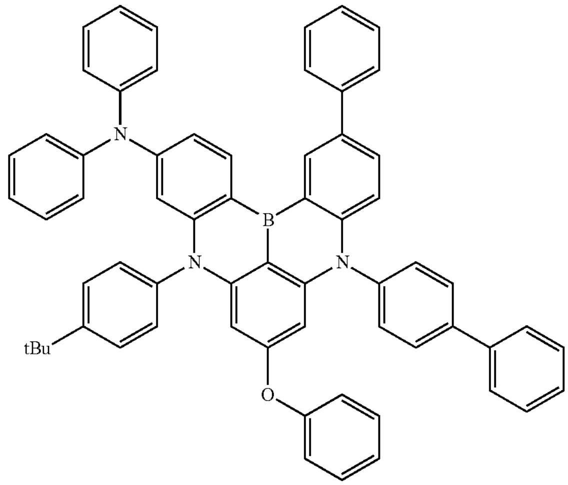
(2-128)
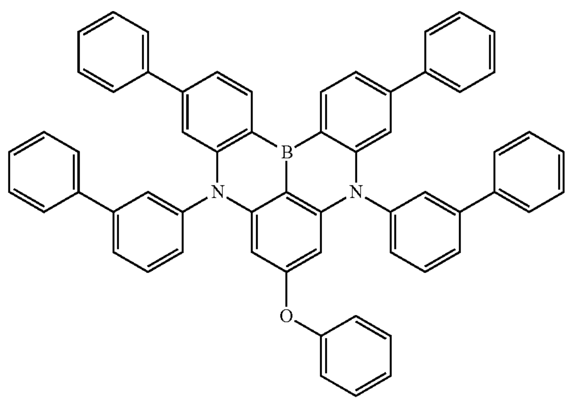
(2-129)
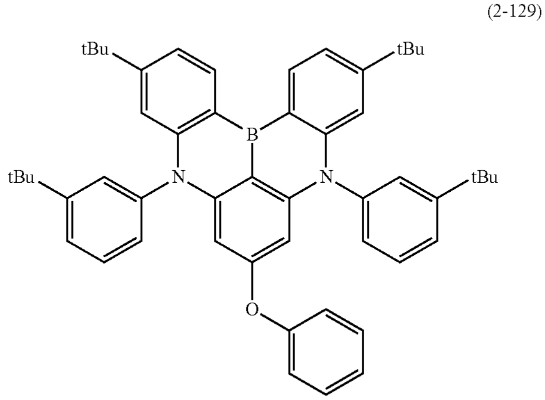
-continued
(2-130)
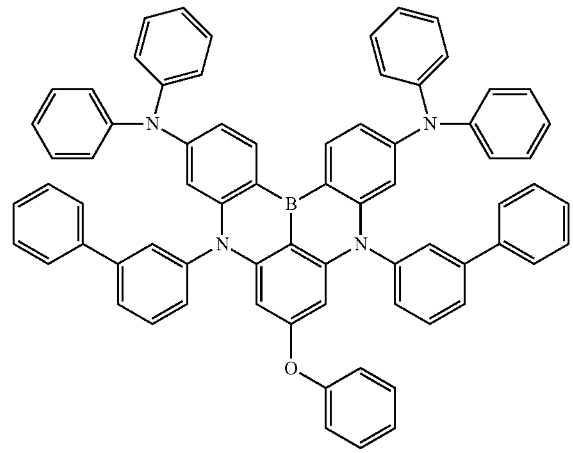
(2-131)
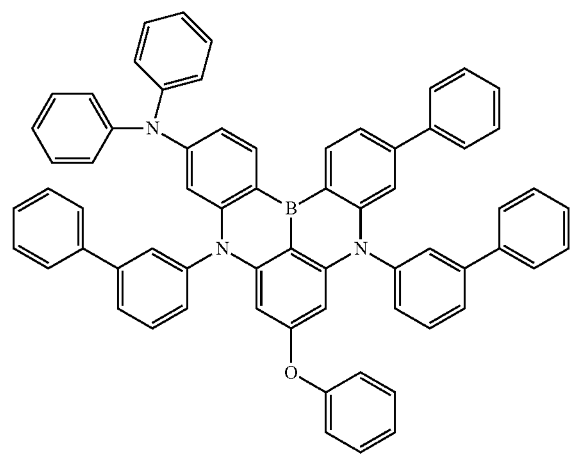
(2-132)
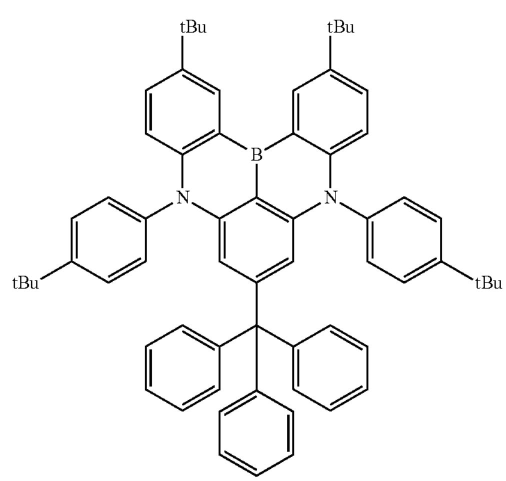

-continued
(2-133)
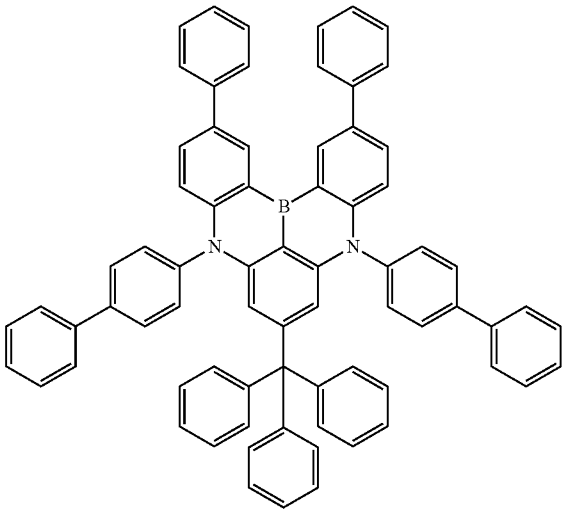
(2-134)
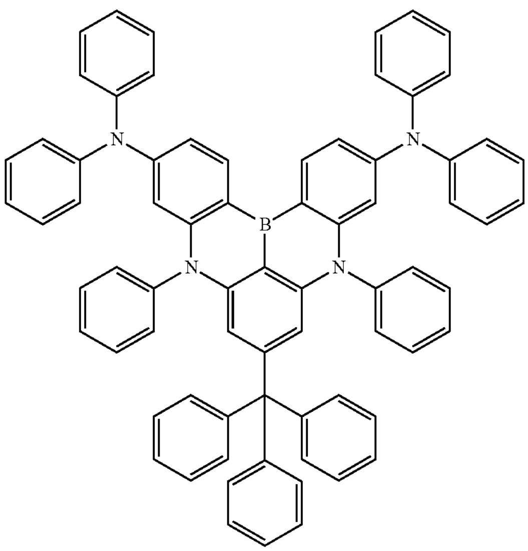
(2-135)
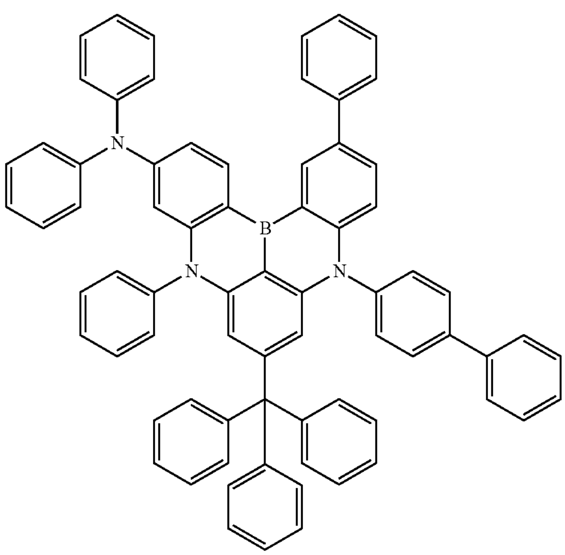
-continued
(2-136)
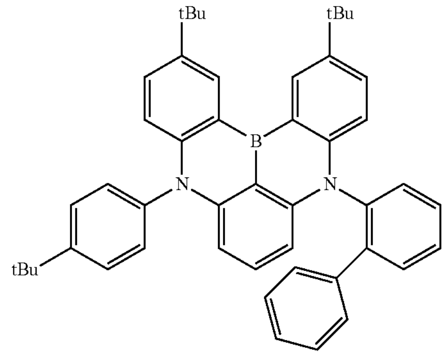
(2-137)
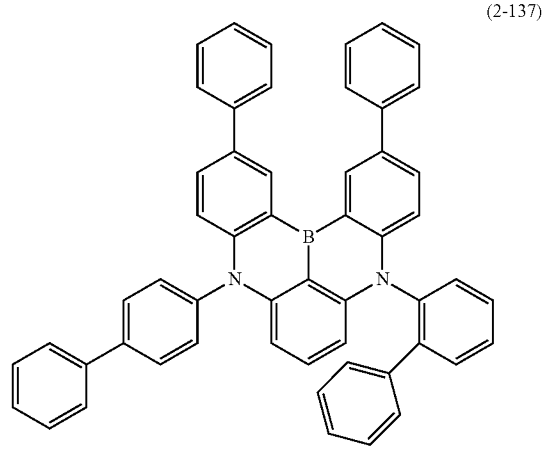
(2-138)
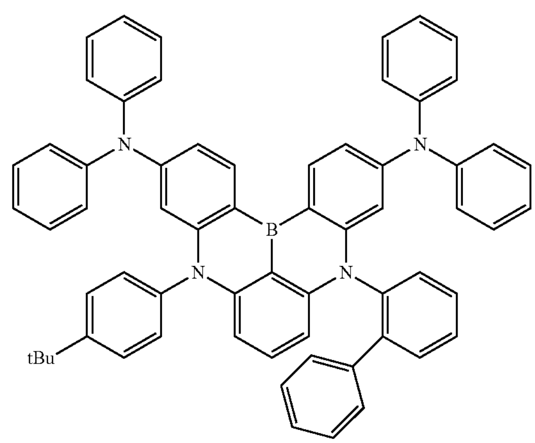

-continued
(2-139)
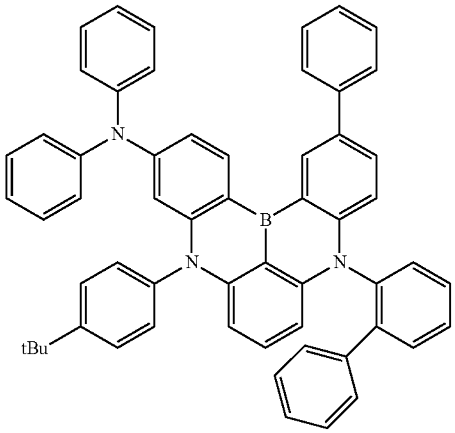
(2-140)
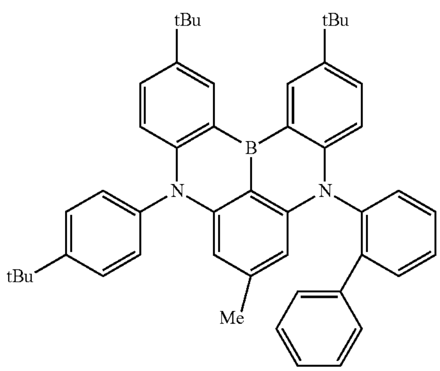
(2-141)
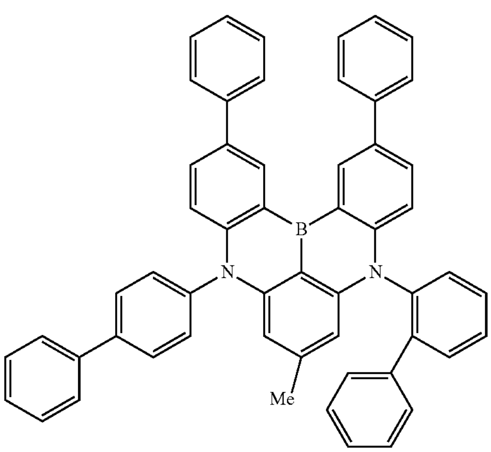
-continued
(2-142)
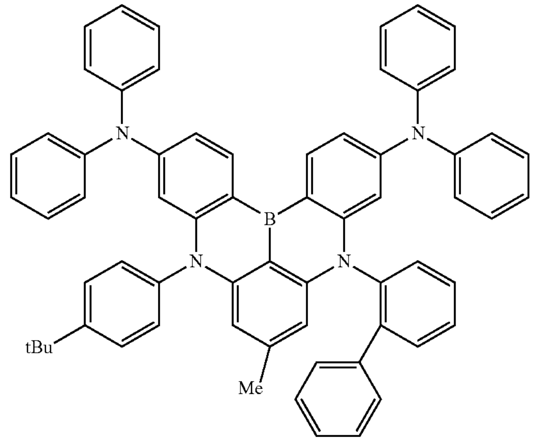
(2-143)
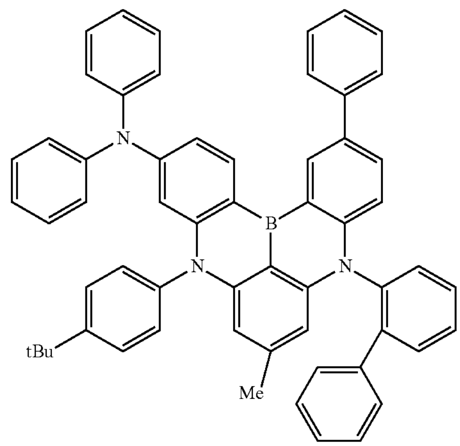
(2-160)
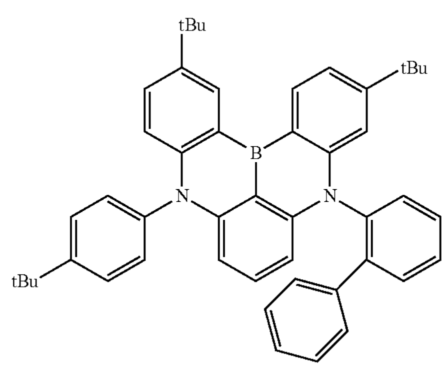

-continued
(2-161)
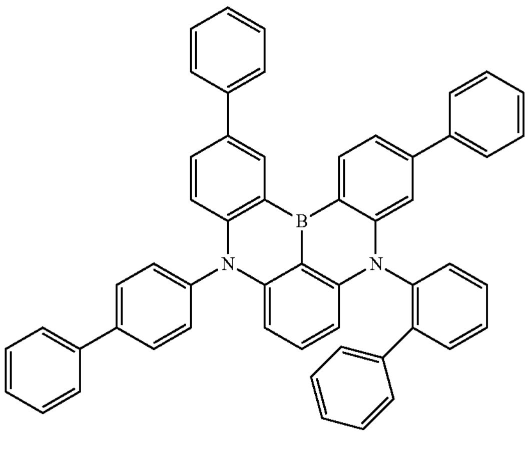
(2-162)
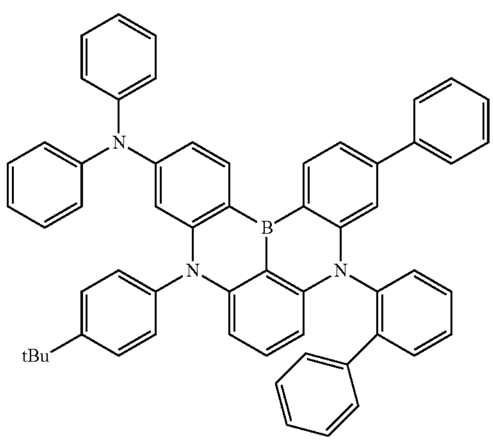
(2-163)
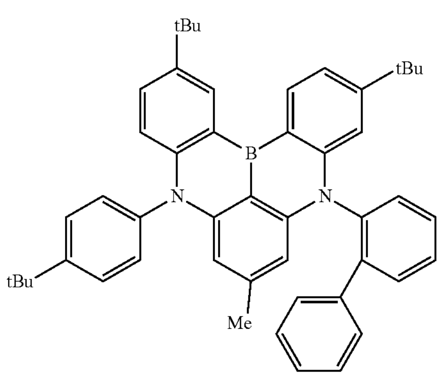
-continued
(2-164)
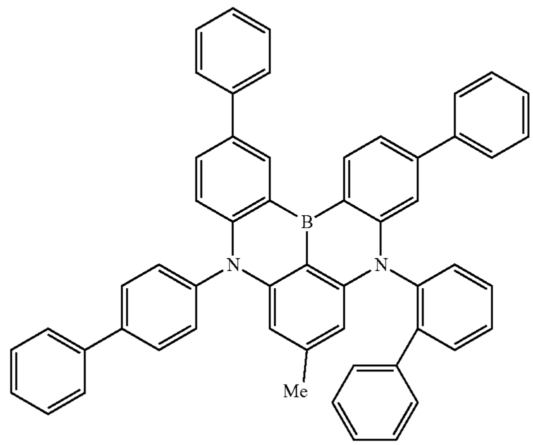
(2-165)
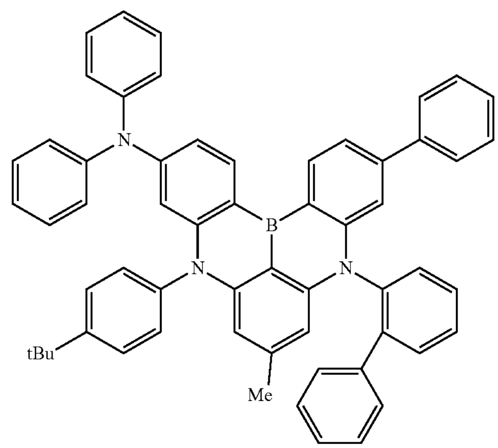
(2-166)
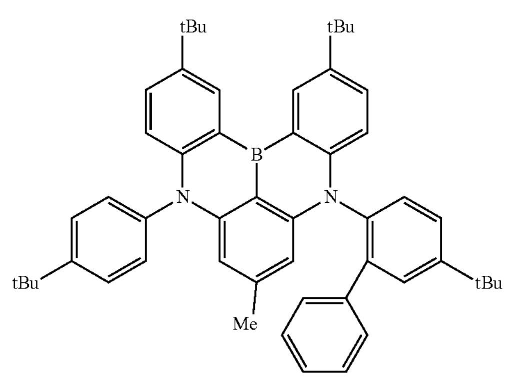

-continued
(2-167)
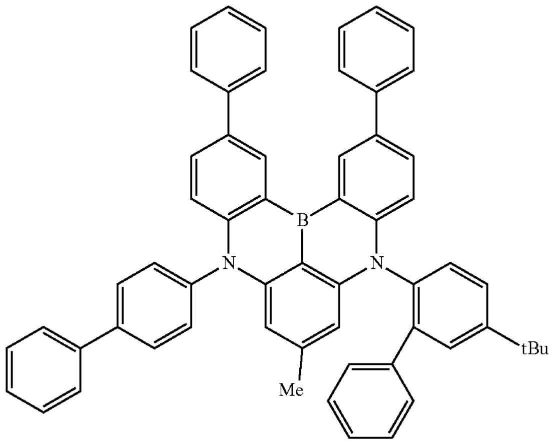
(2-168)
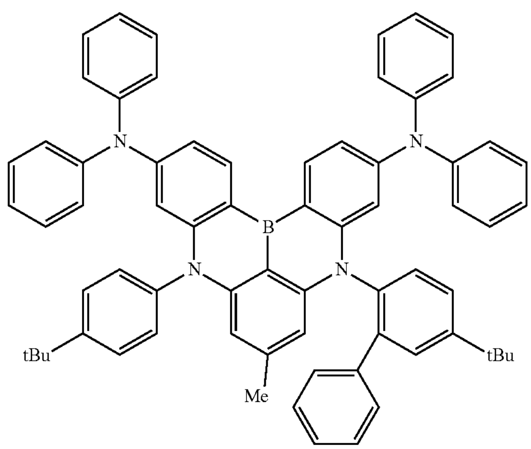
(2-169)
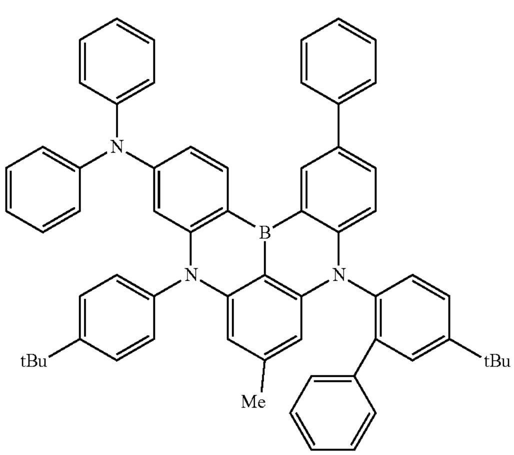
-continued
(2-170)
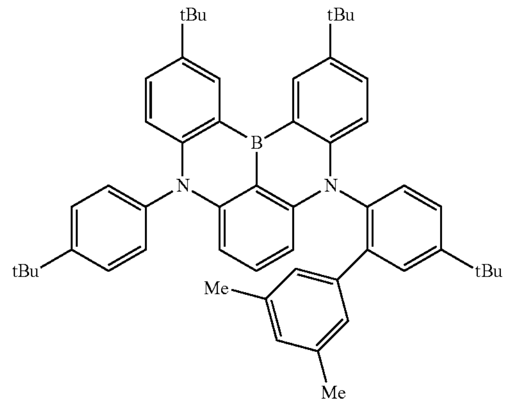
(2-171)
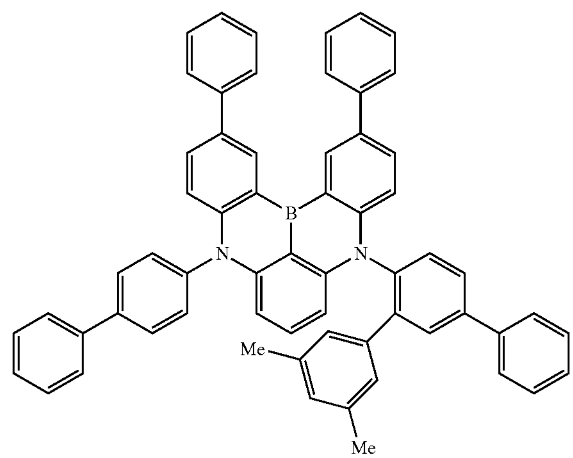
(2-172)
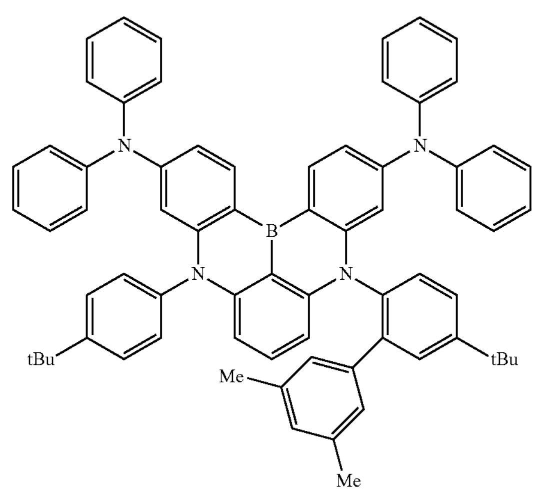

-continued
(2-173)
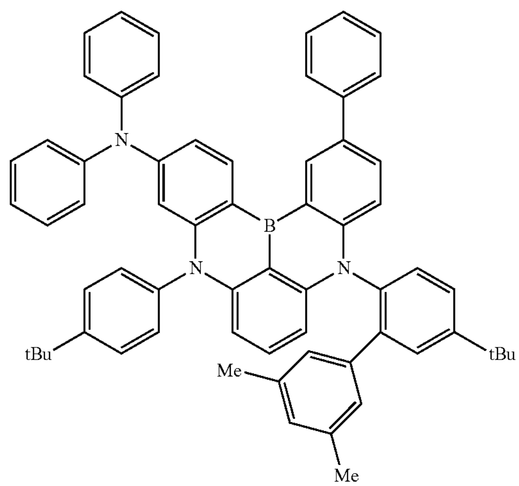
(2-174)
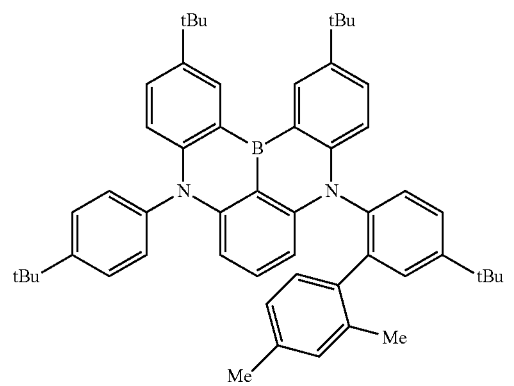
(2-175)
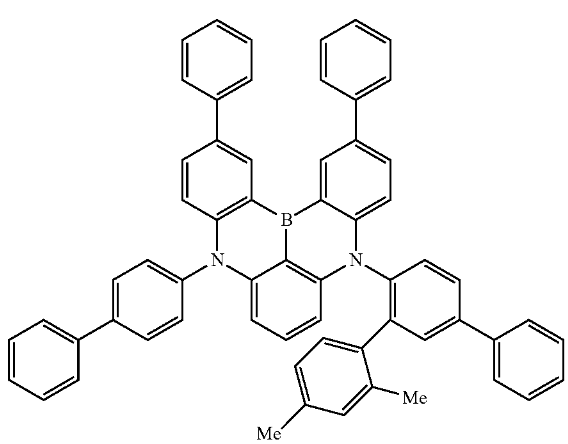
-continued
(2-176)
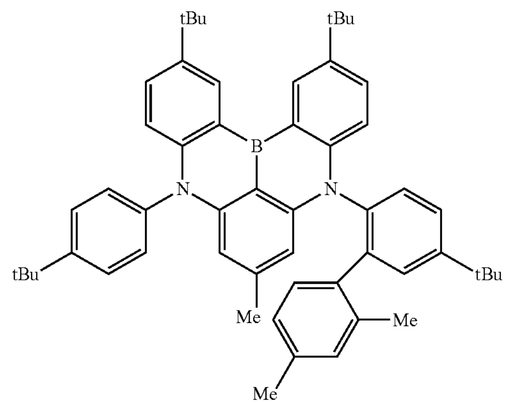
(2-177)
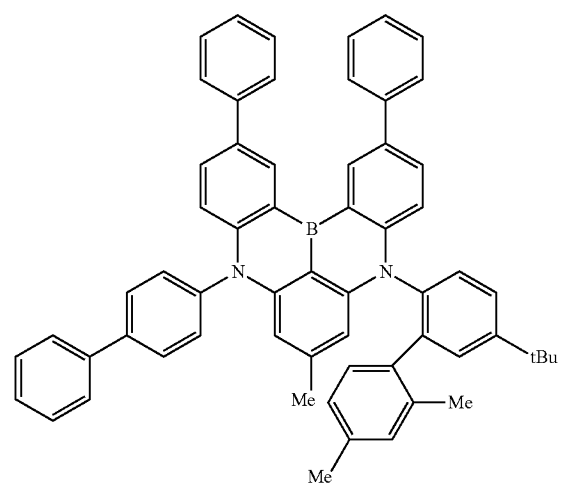
(2-178)
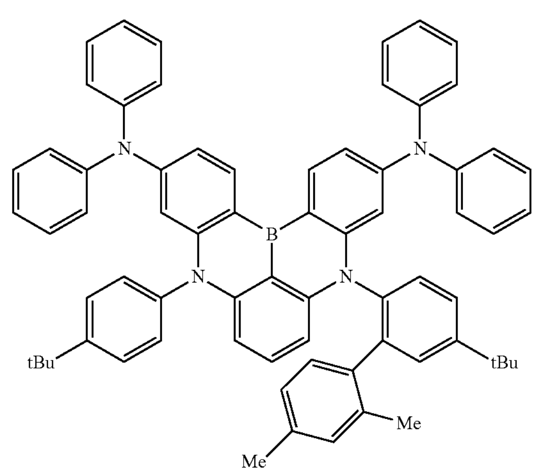

(2-179)
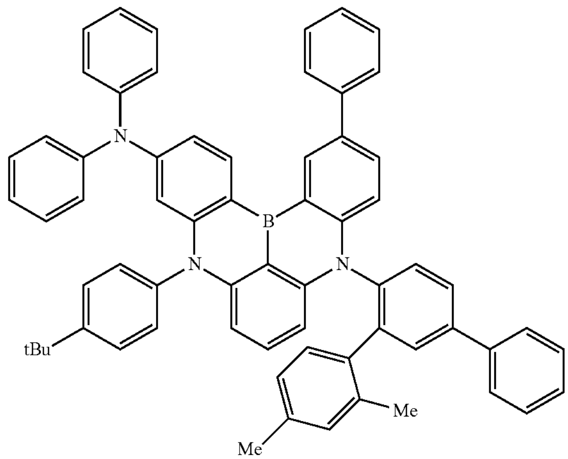
(2-180)
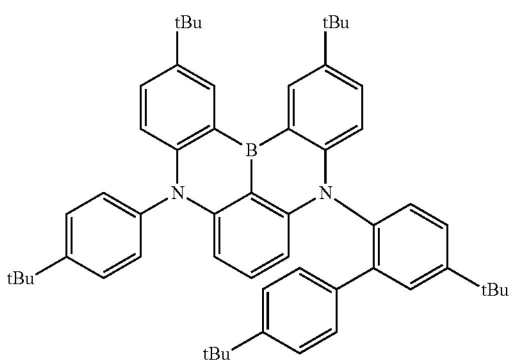
(2-181)
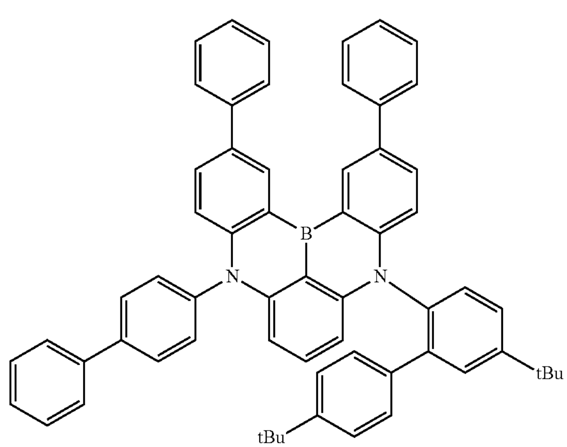
(2-182)
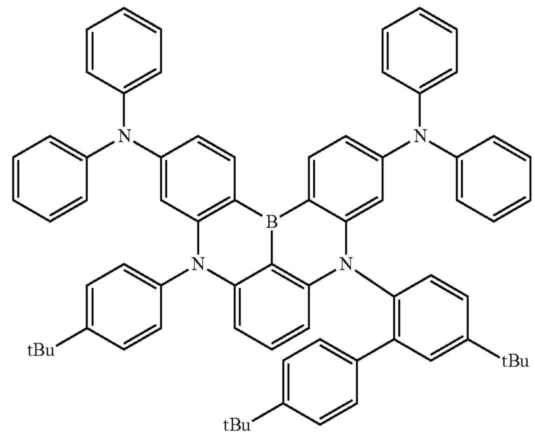
(2-183)
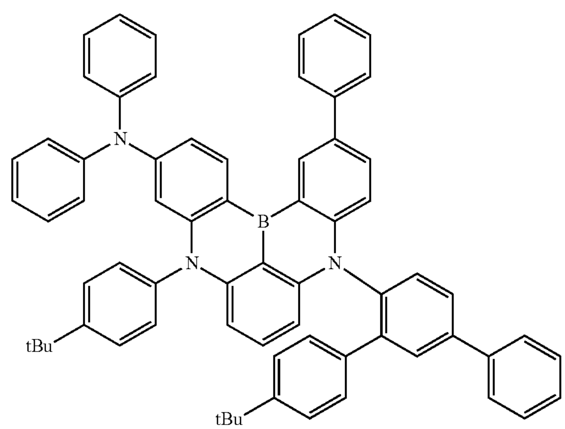
(2-200)
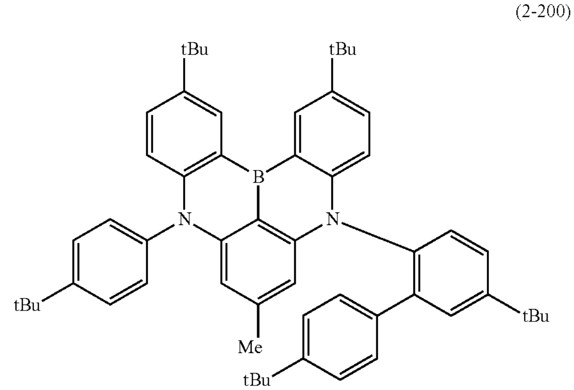

-continued
(2-201)
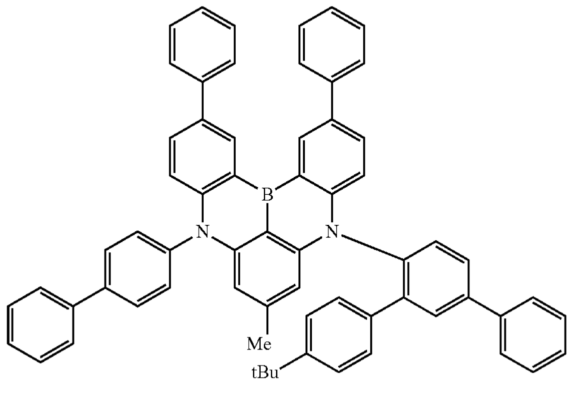
(2-202)
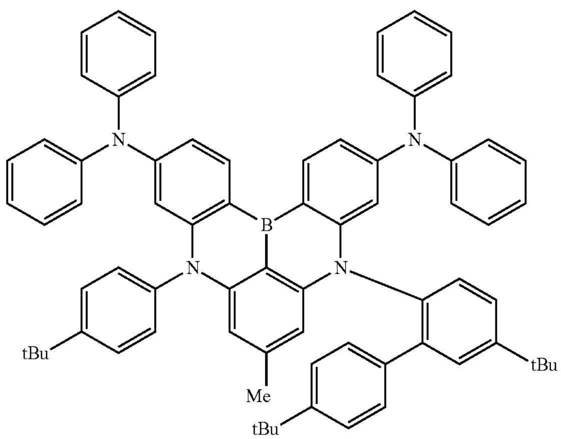
(2-203)
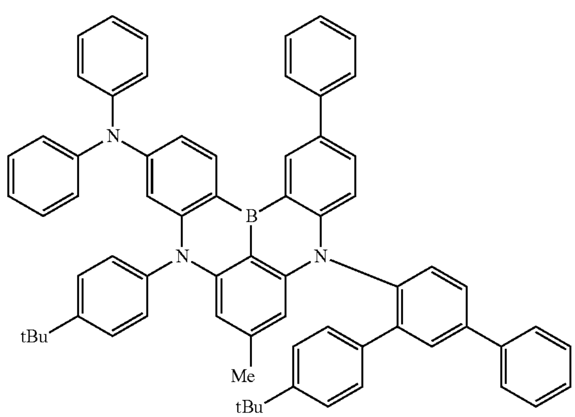
-continued
(2-204)
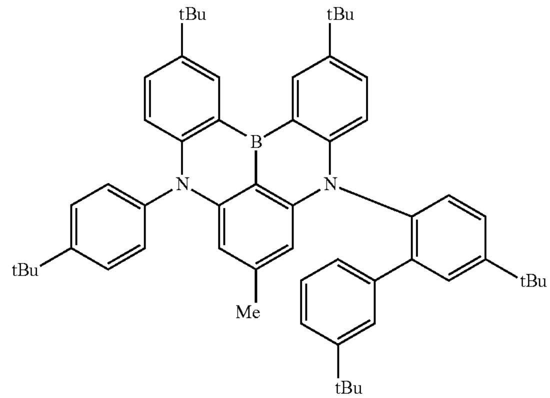
(2-205)
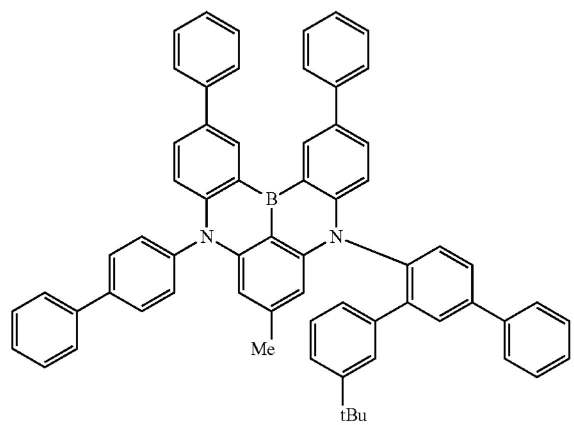
(2-206)
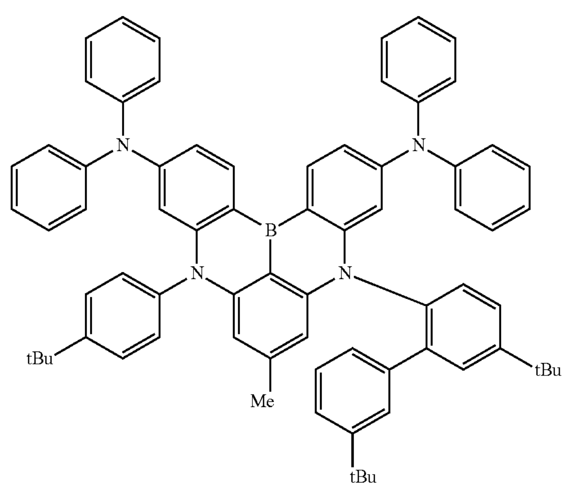

-continued
(2-207)
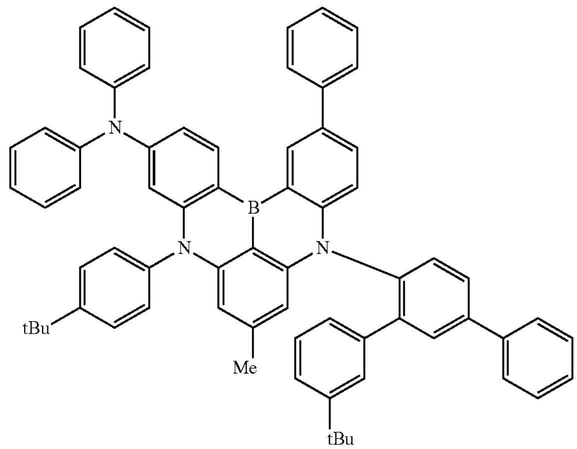
(2-208)
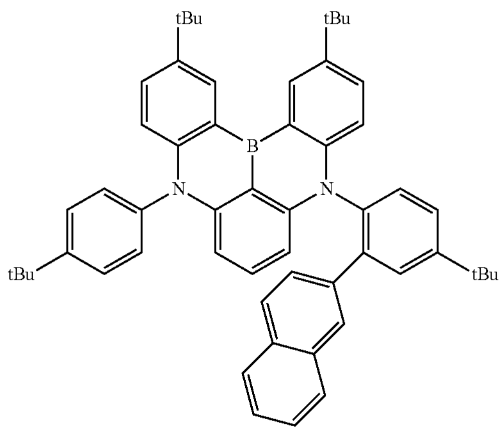
(2-209)
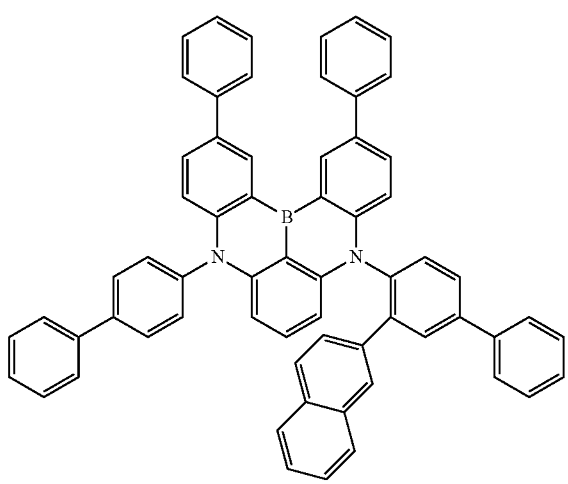
-continued
(2-210)
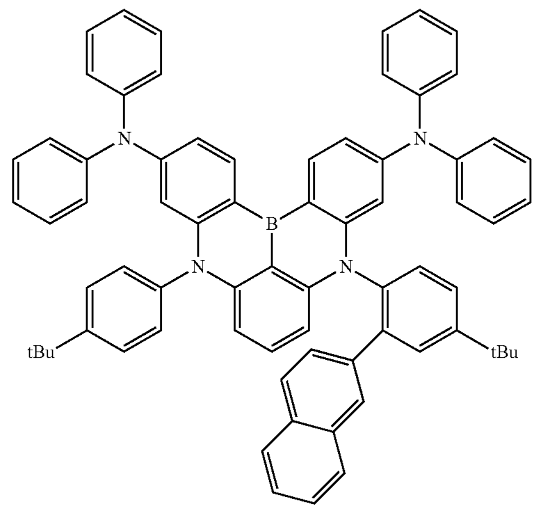
(2-211)
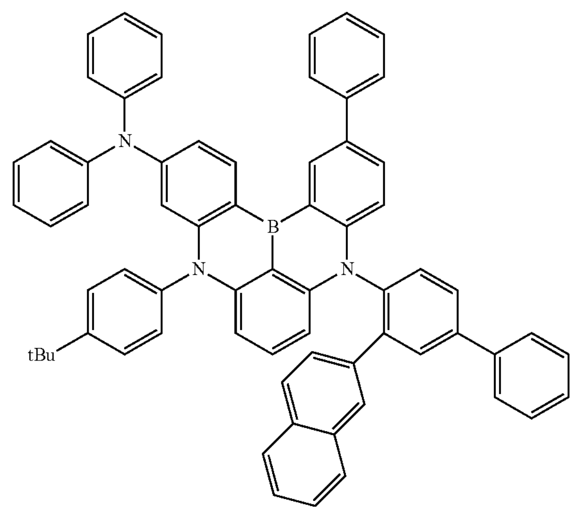
(2-212)
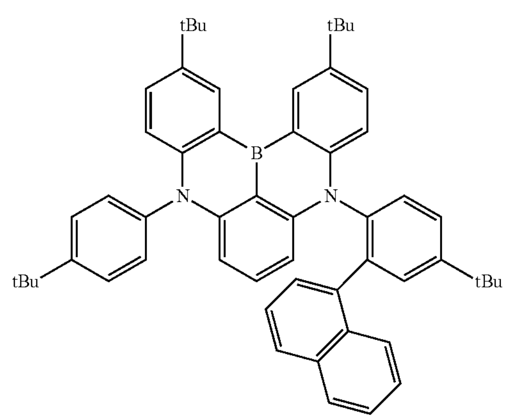

-continued
(2-213)
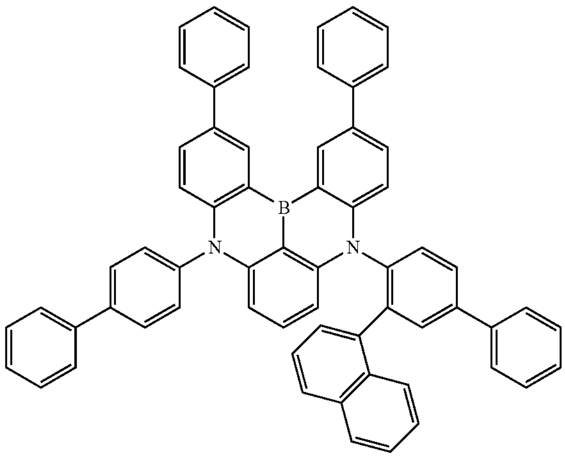
(2-214)
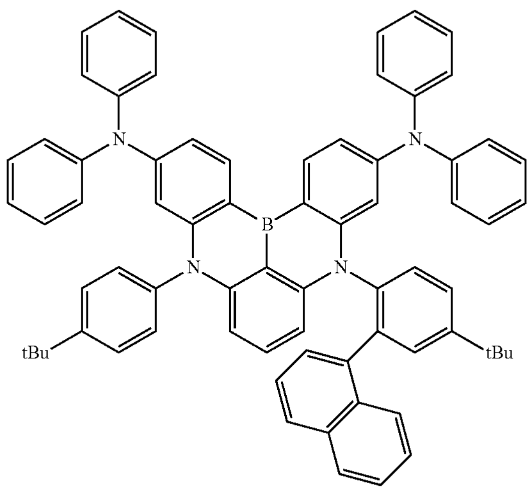
(2-215)
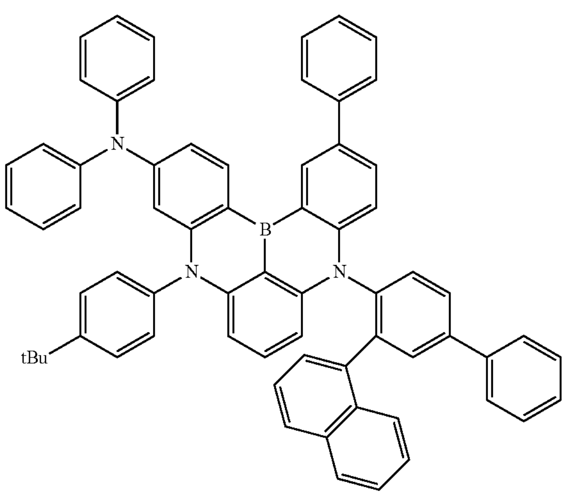
-continued
(2-216)
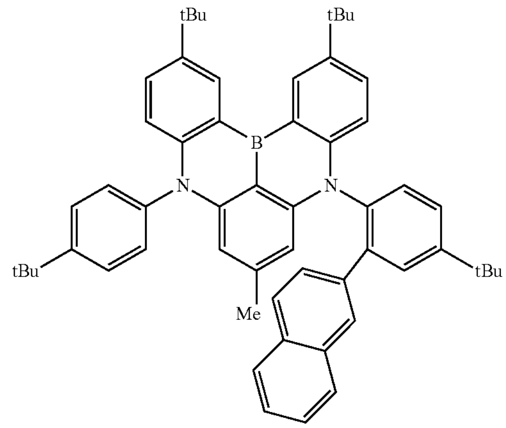
(2-217)
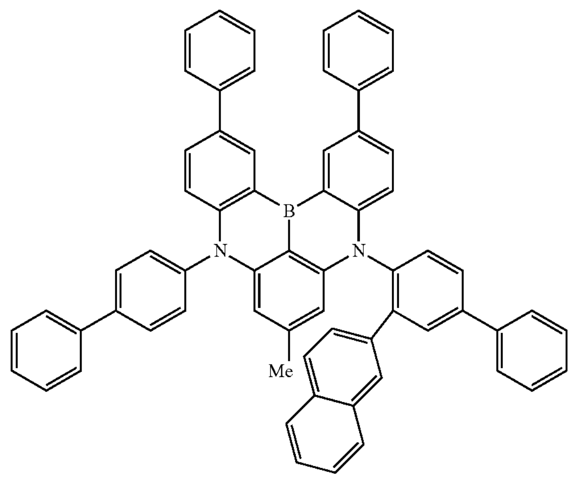
(2-218)
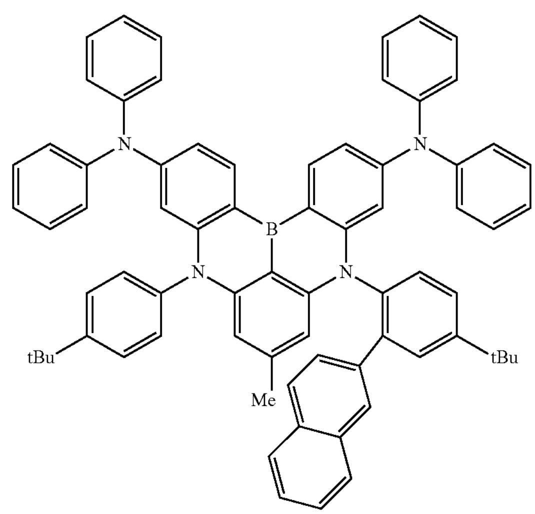

-continued
(2-219)
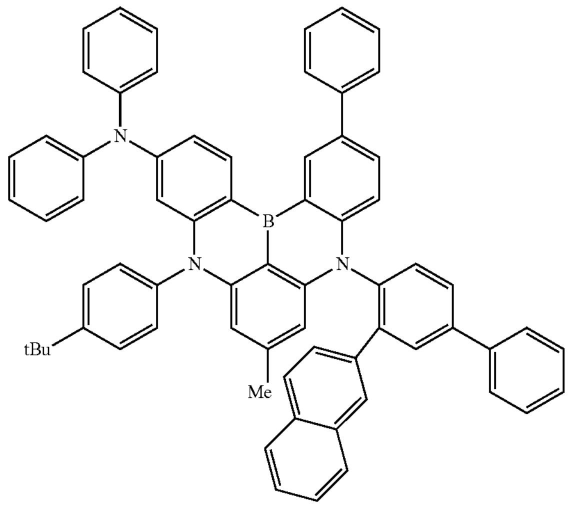
(2-220)
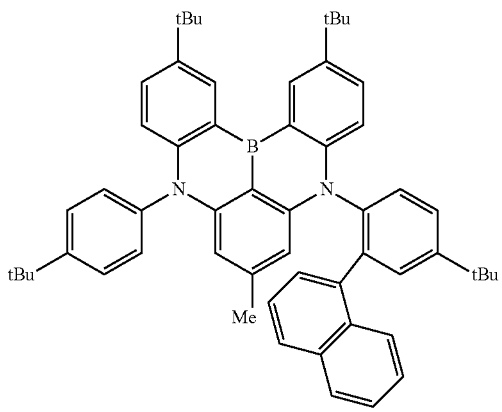
(2-221)
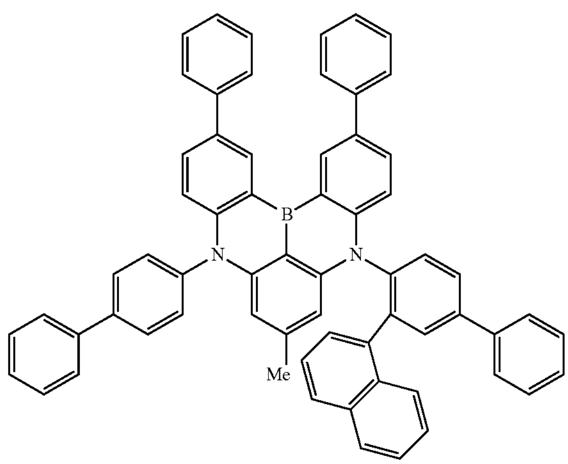
-continued
(2-222)
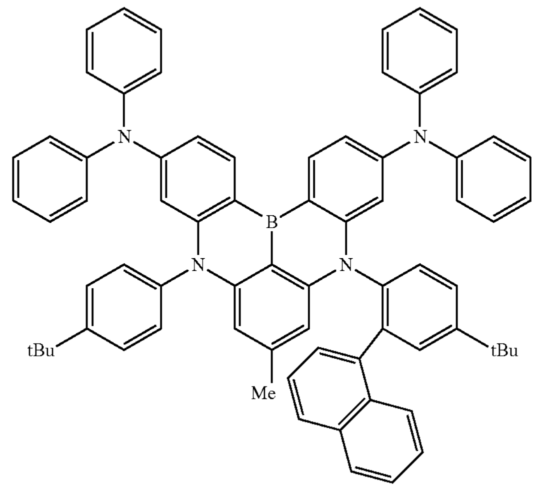
(2-223)
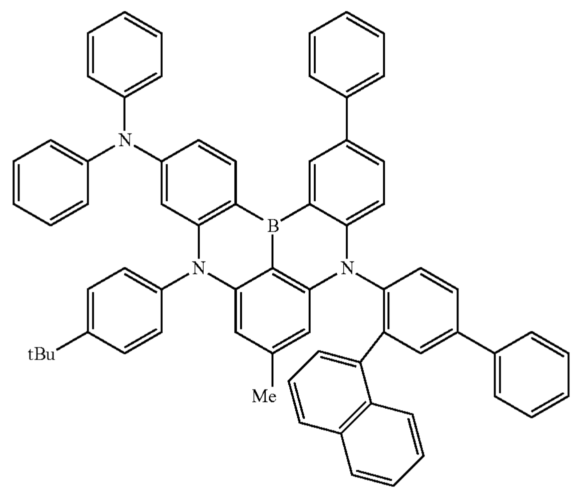
(2-240)
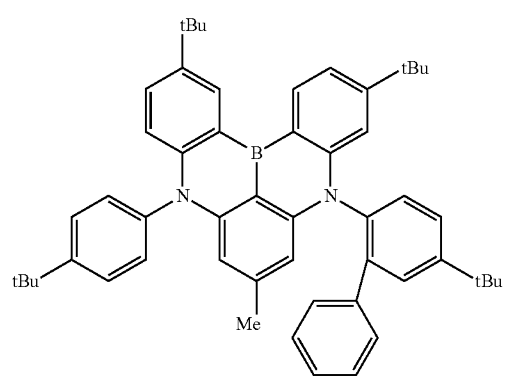

-continued
(2-241)
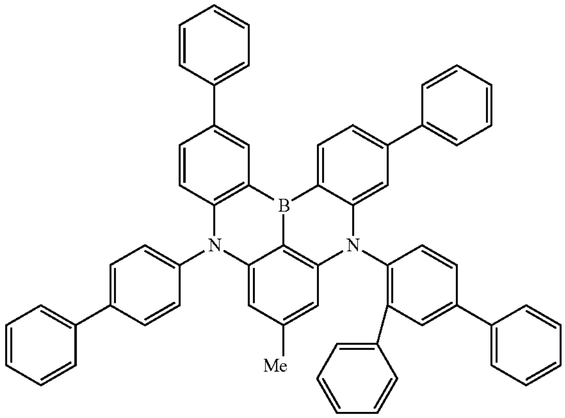
(2-242)
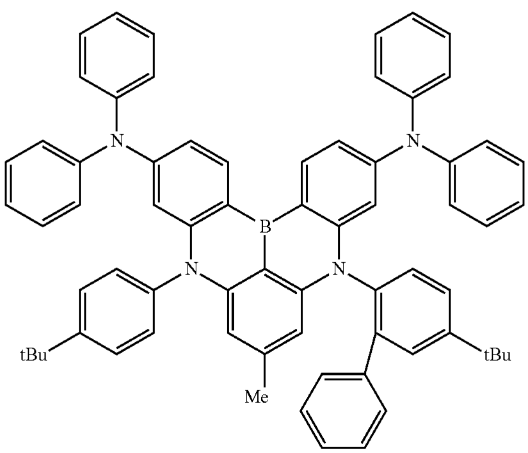
(2-243)
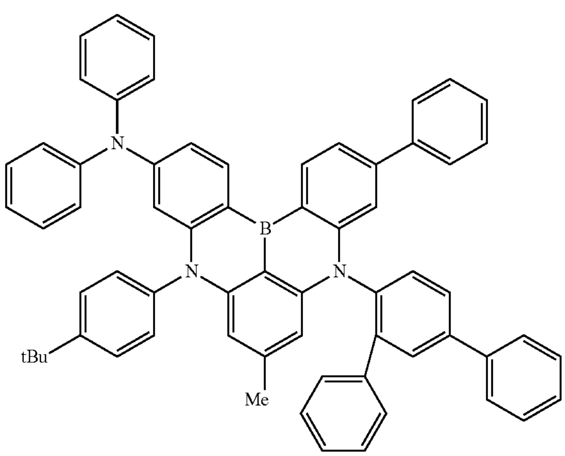
-continued
(2-244)
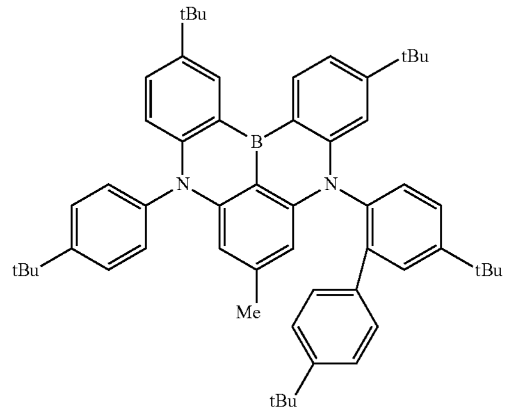
(2-245)
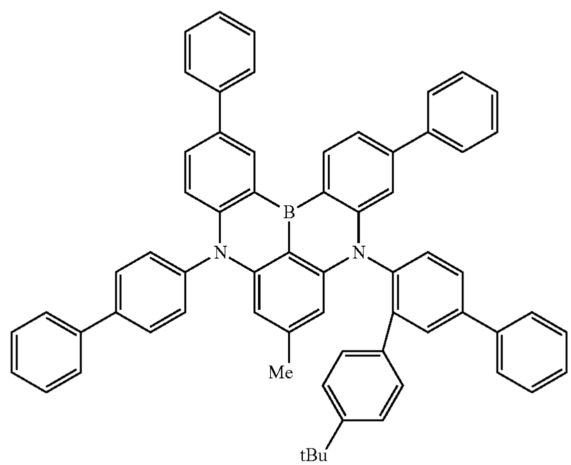
(2-246)
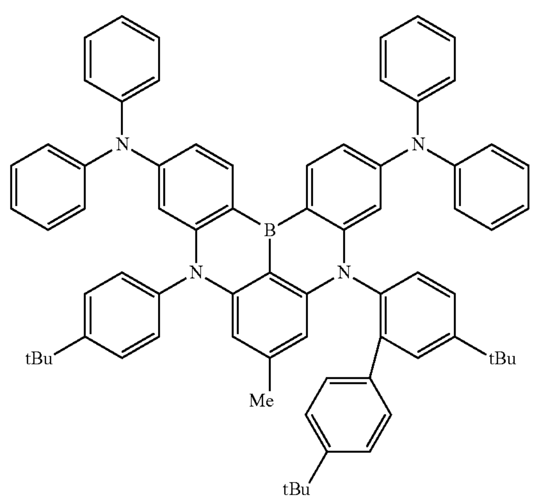

-continued
(2-247)
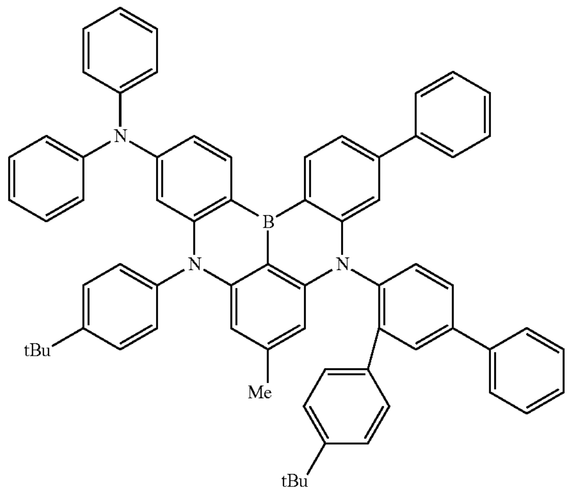
(2-248)
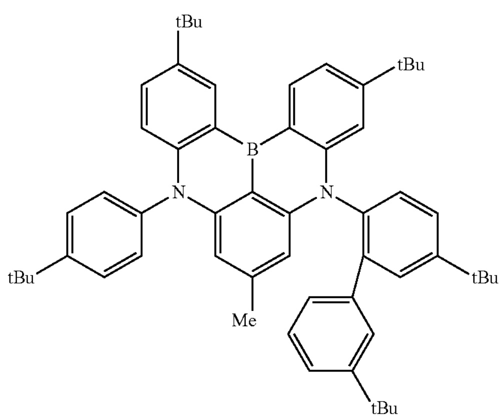
(2-249)
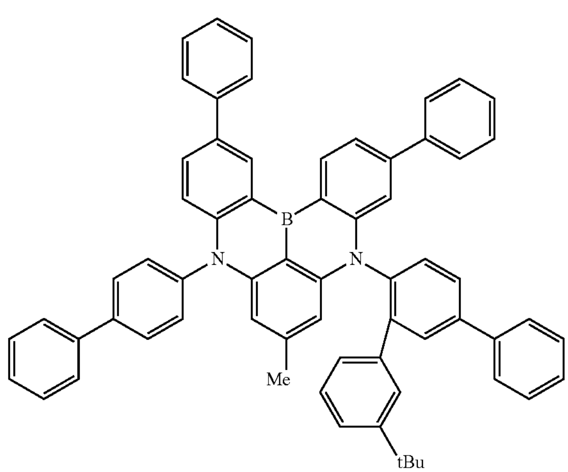
-continued
(2-250)
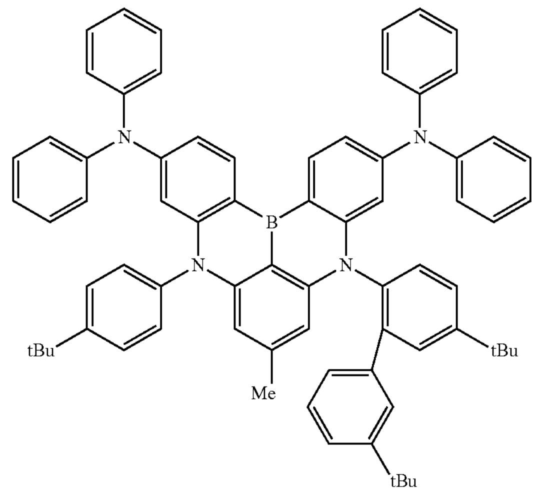
(2-251)
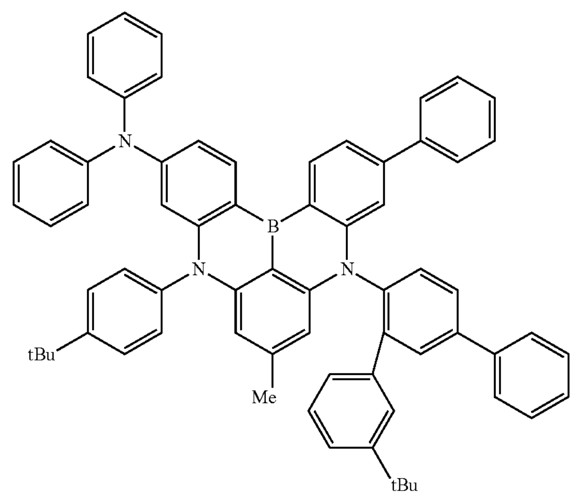
(2-252)
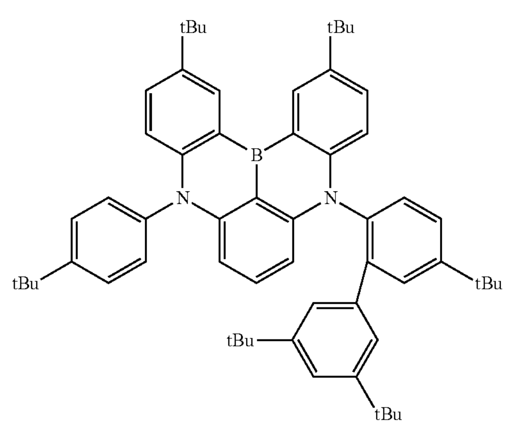

-continued
(2-253)
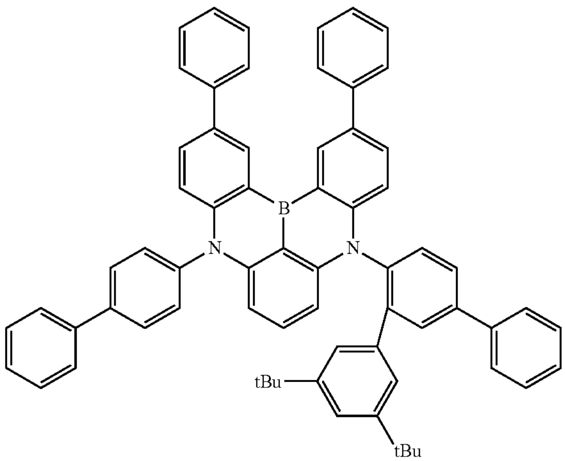
(2-254)
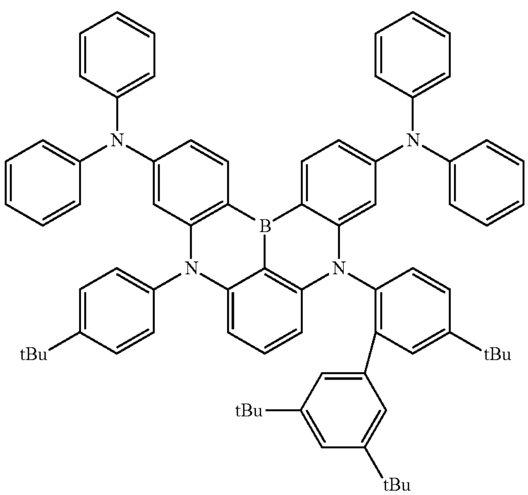
(2-255)
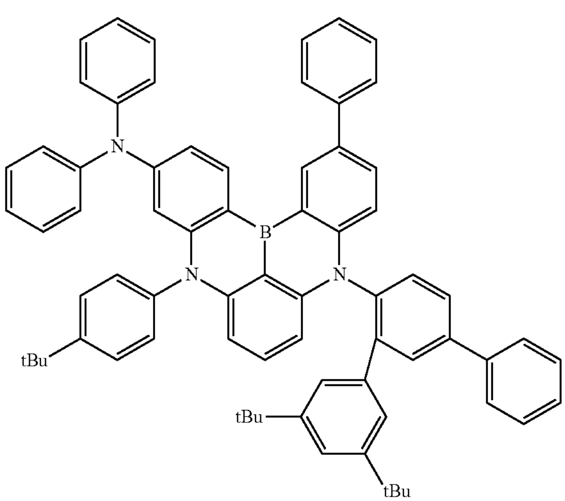
-continued
(2-256)
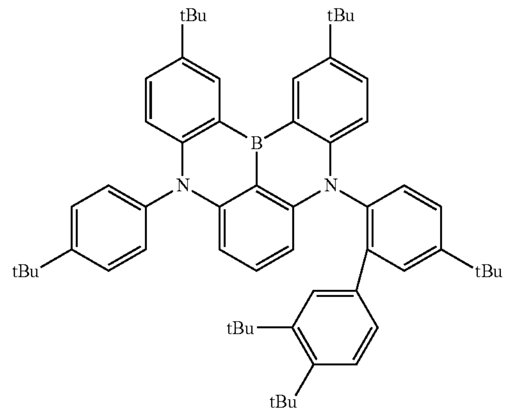
(2-257)
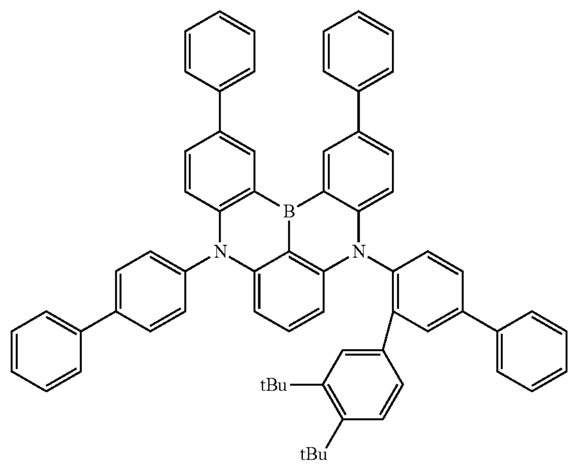
(2-258)
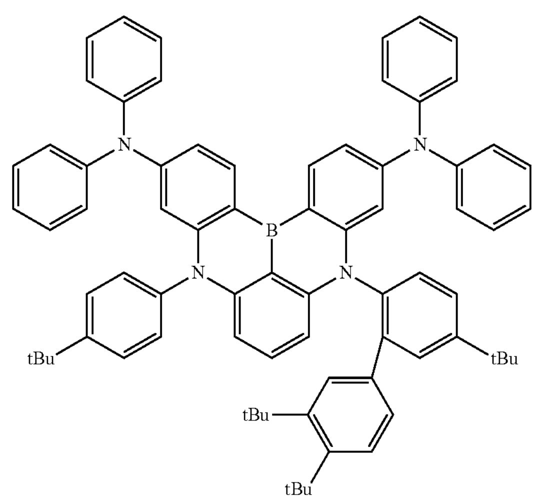

-continued
(2-259)
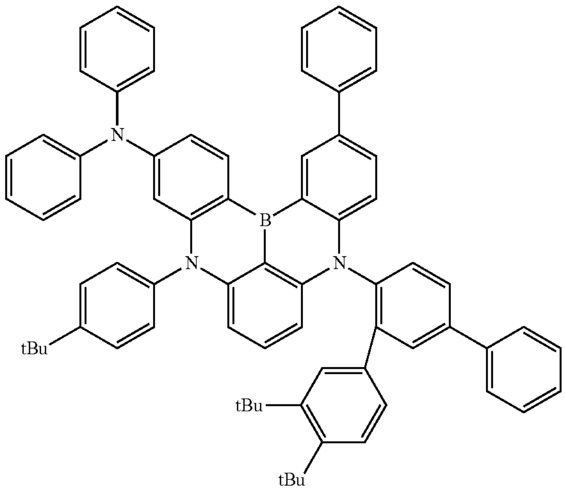
(2-260)
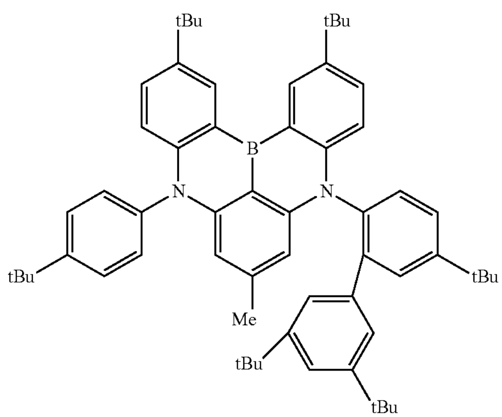
(2-261)
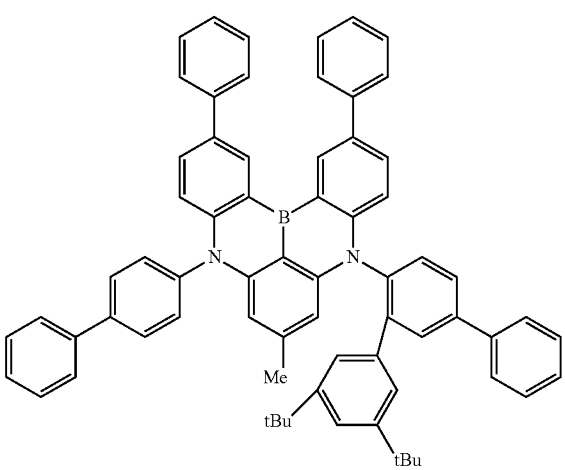
-continued
(2-262)
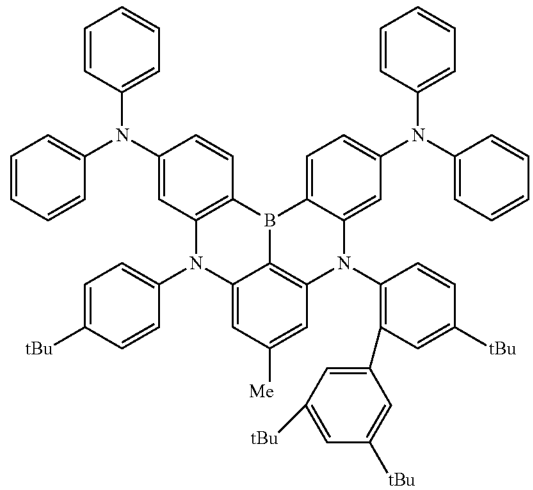
(2-263)
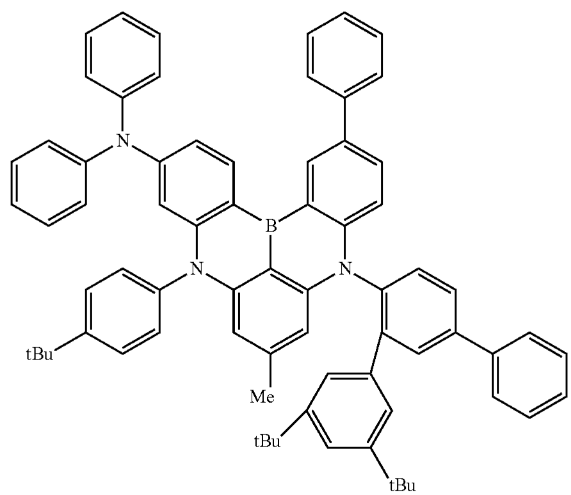
(2-280)
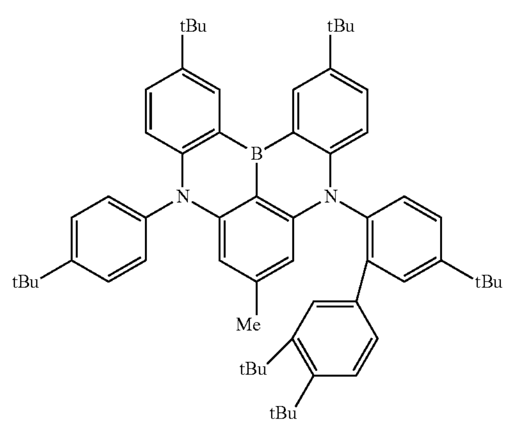

-continued
(2-281)
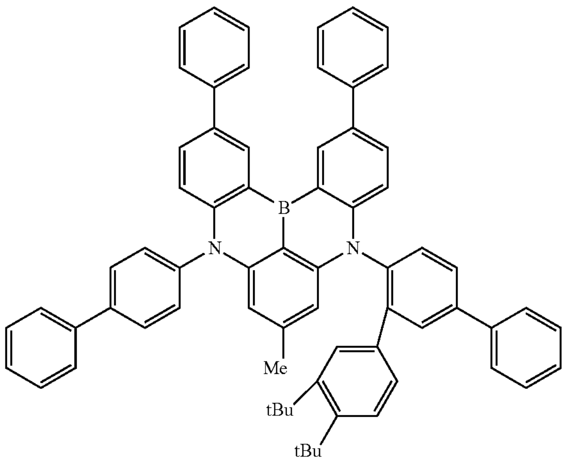
(2-282)
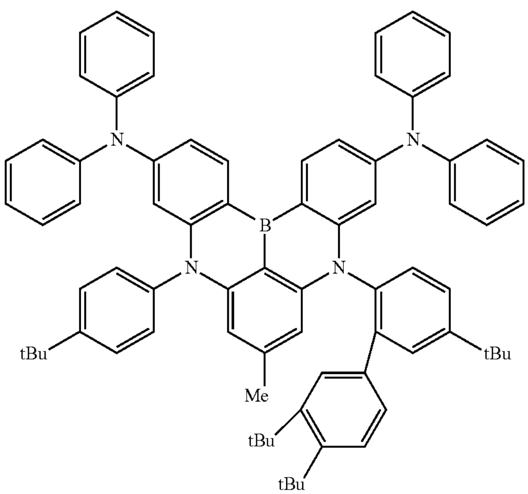
(2-283)
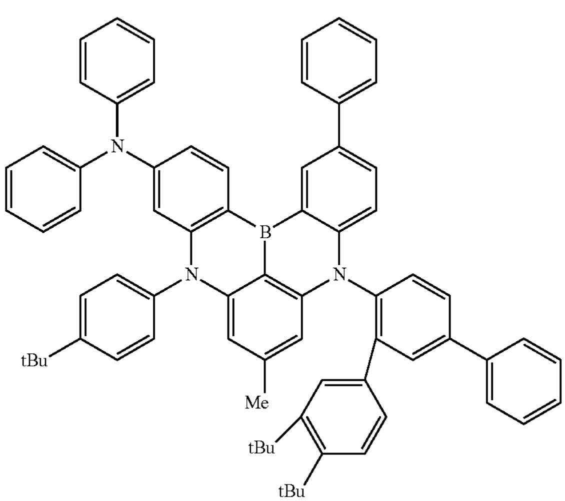
-continued
(2-284)
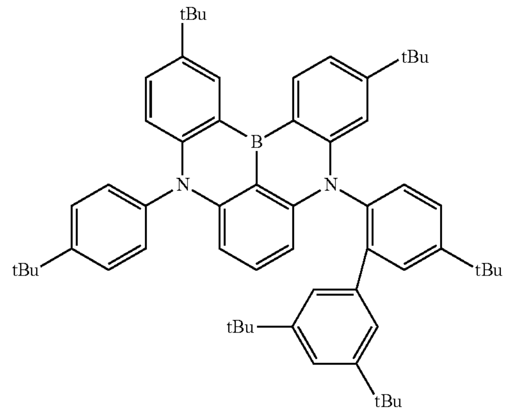
(2-285)
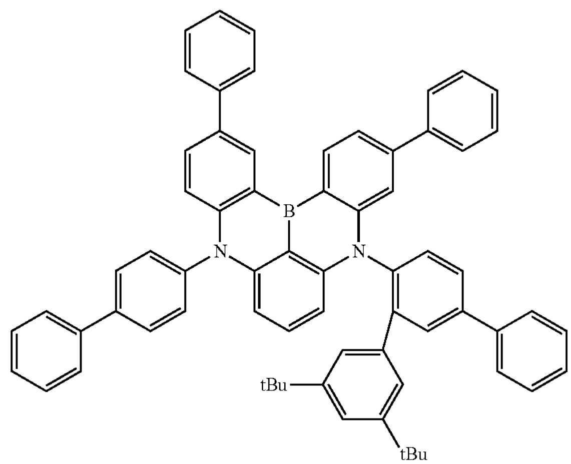
(2-286)
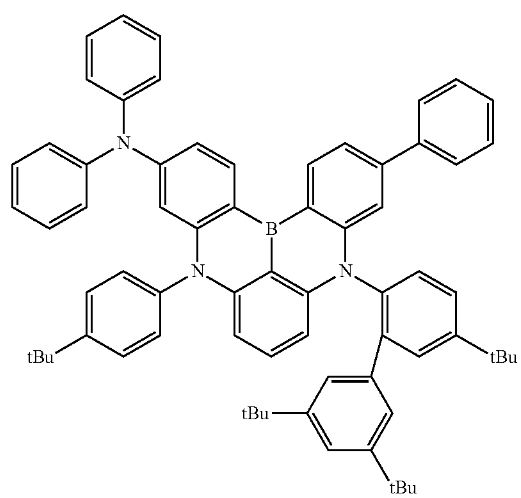

(2-287)
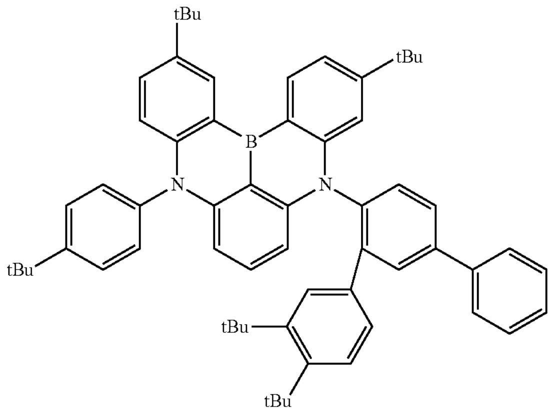
(2-288)
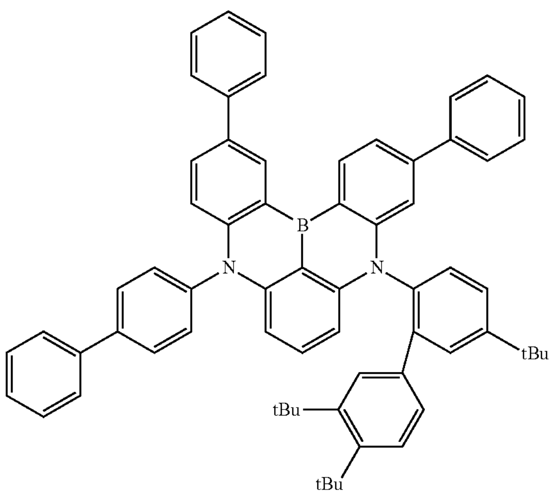
(2-289)
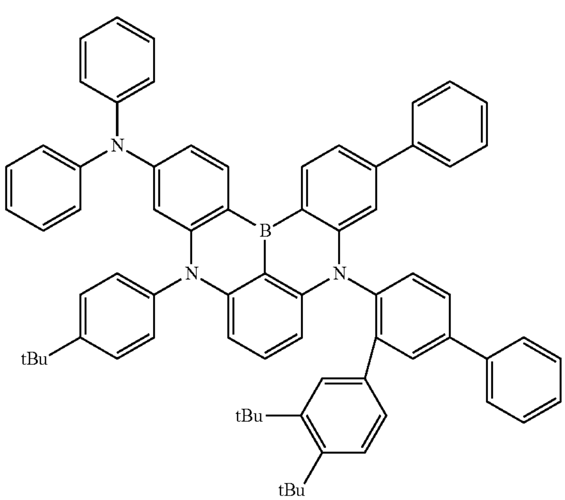
(2-290)
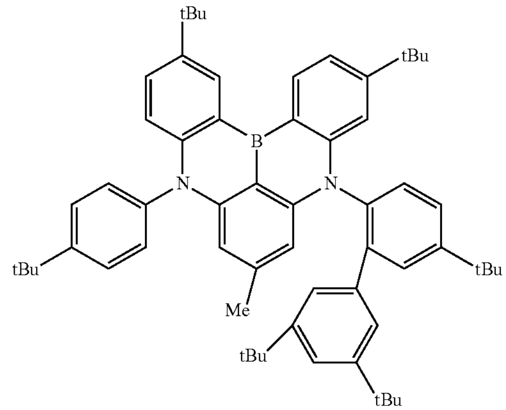
(2-291)
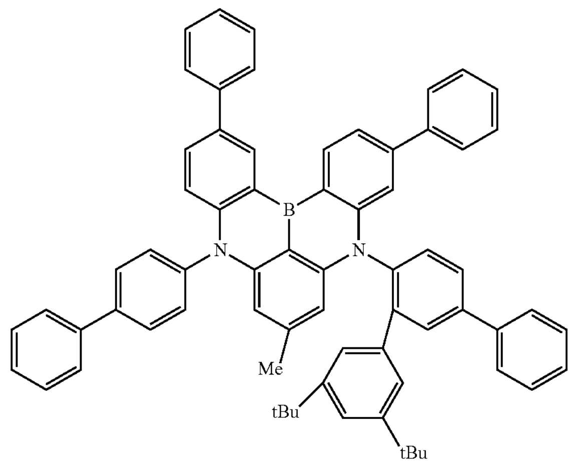
(2-292)
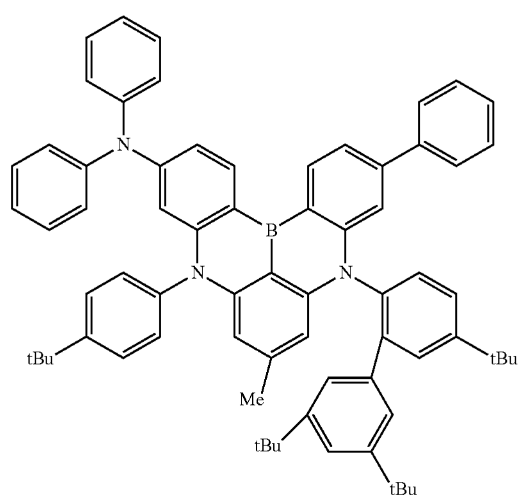

-continued
(2-293)
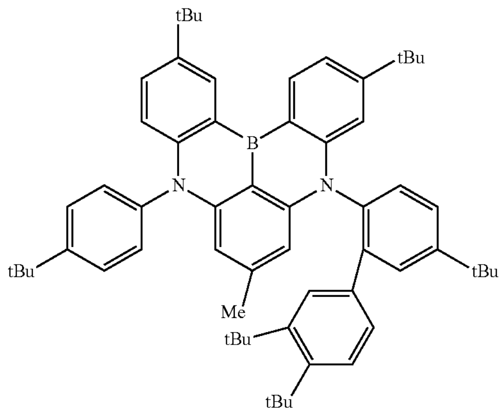
(2-294)
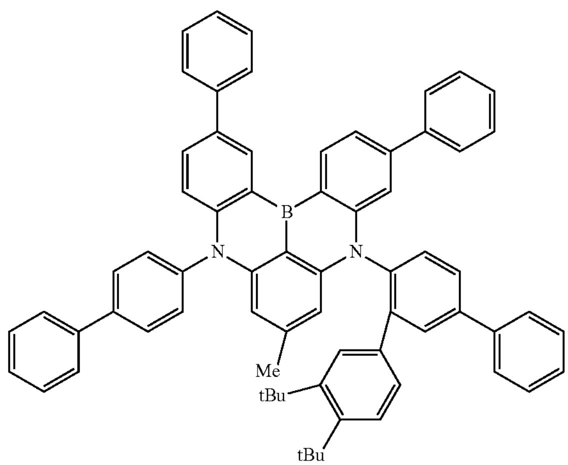
(2-295)
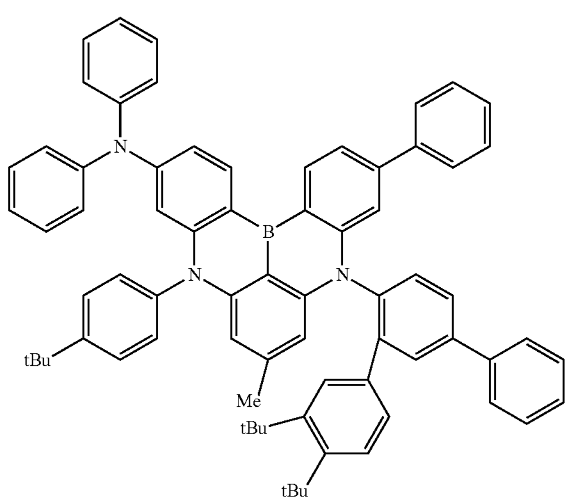
-continued
(2-296)
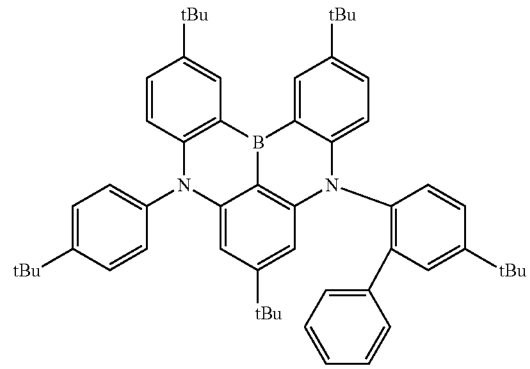
(2-297)
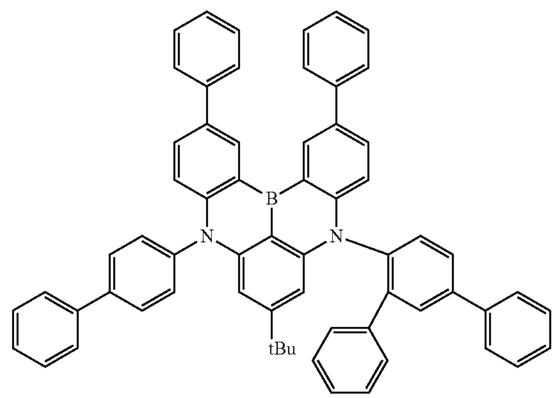
(2-298)
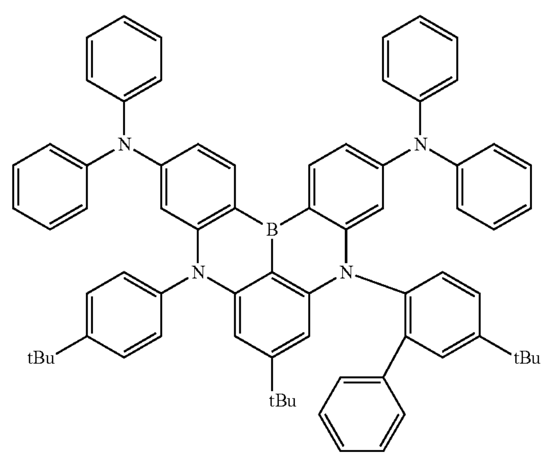

-continued
(2-299)
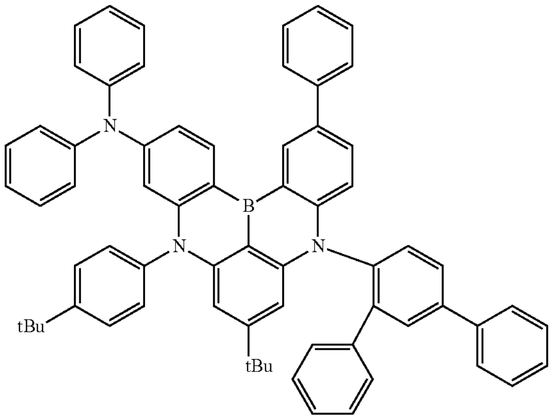
(2-300)
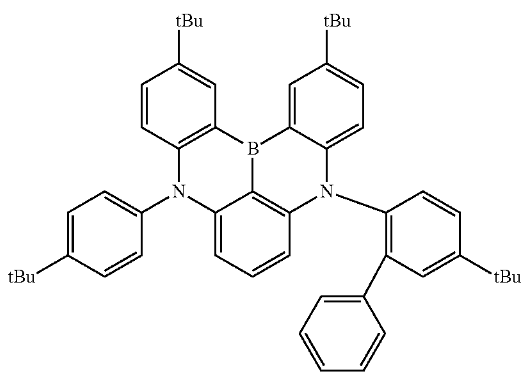
(2-301)
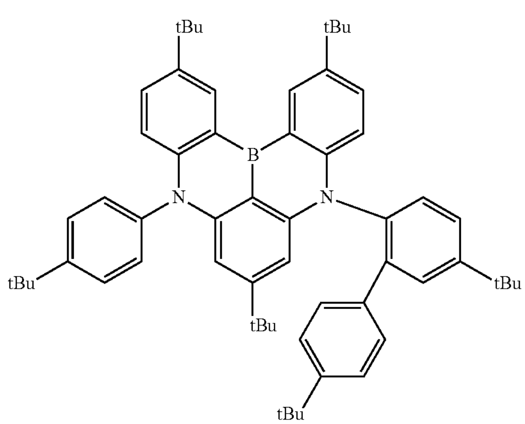
-continued
(2-302)
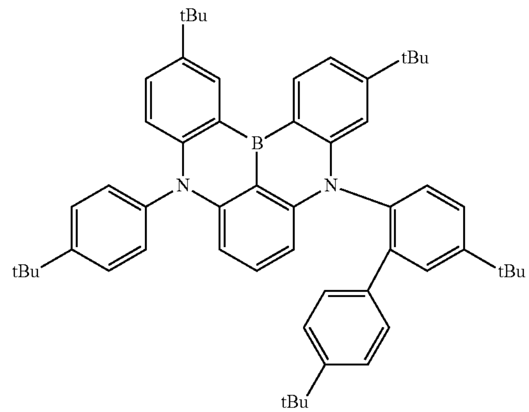
(2-303)
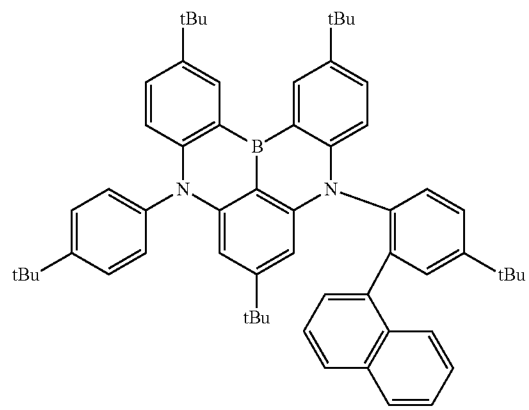
(2-304)
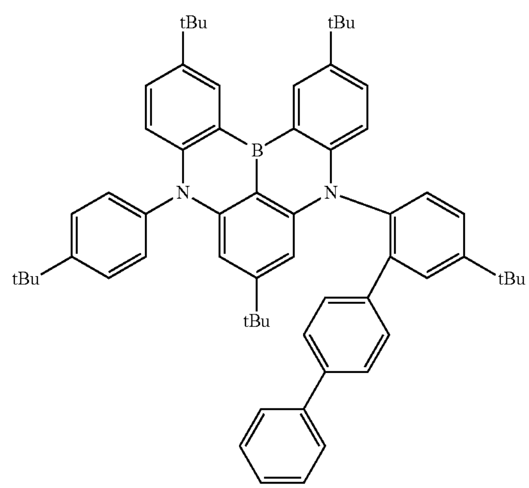
(2-401)
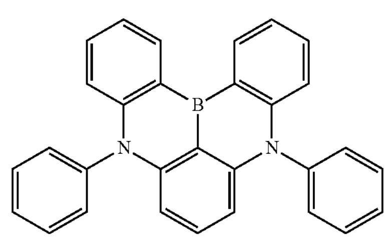

-continued
(2-402)
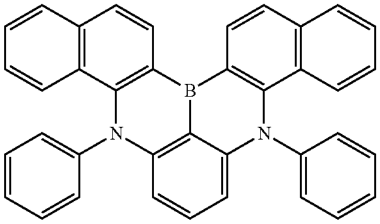
(2-403)
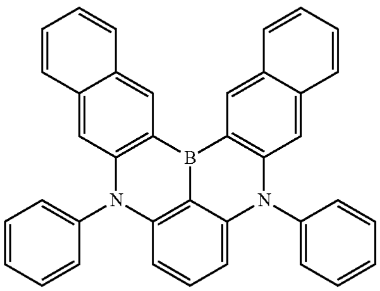
(2-404)
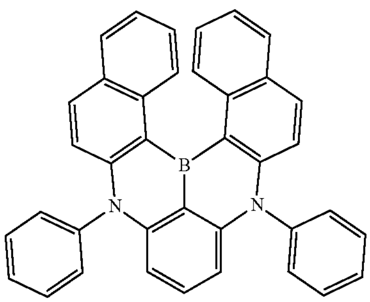
(2-405)
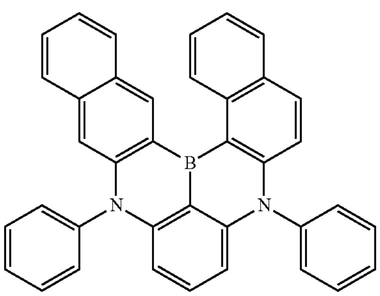
(2-406)
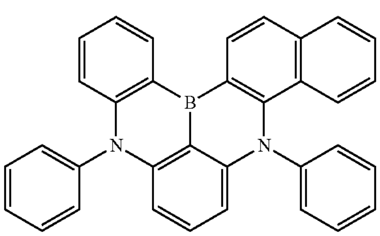
-continued
(2-407)
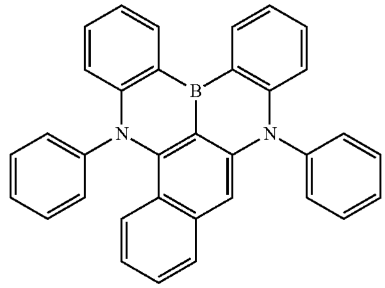
(2-408)
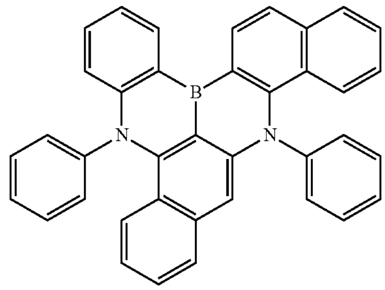
(2-409)
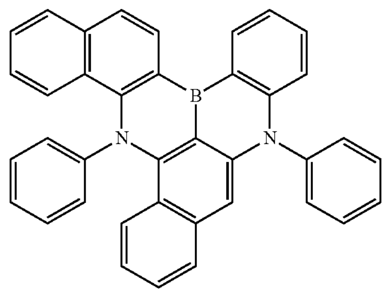
(2-411)
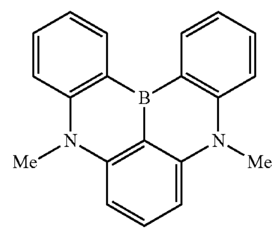
(2-412)
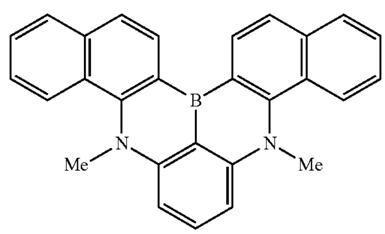
(2-413)
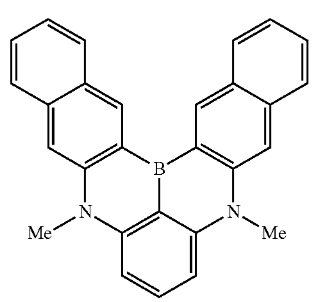

-continued
(2-414)
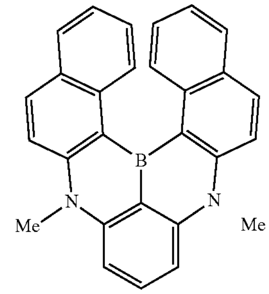
(2-415)
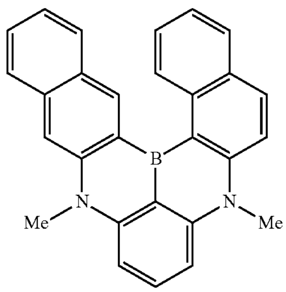
(2-416)
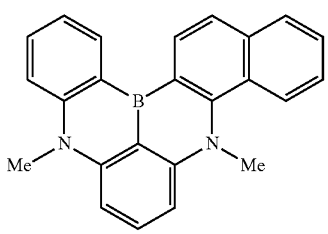
(2-417)
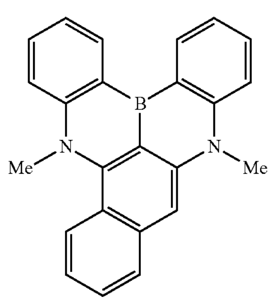
(2-418)
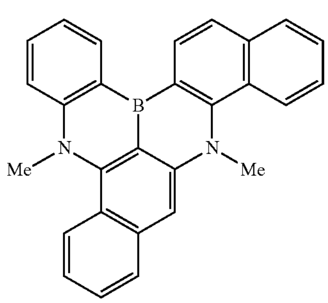
-continued
(2-419)
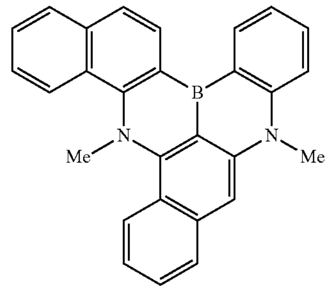
(2-421)
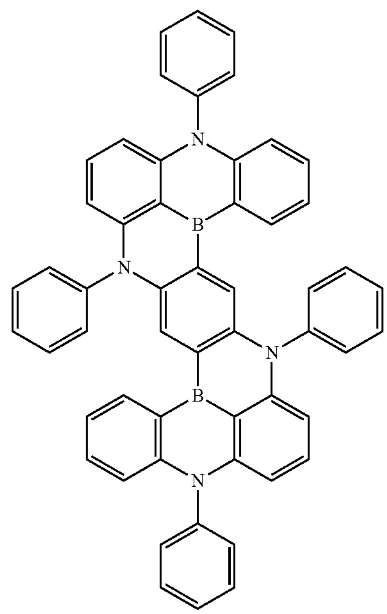
(2-422)
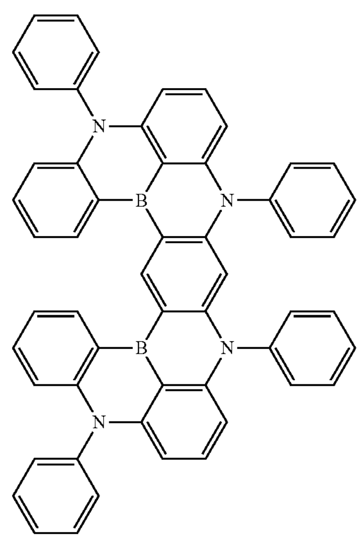

-continued
(2-423)
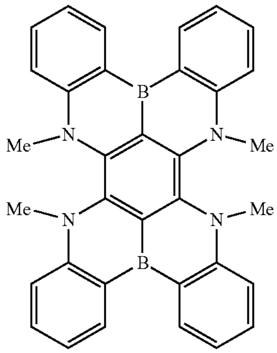
(2-424)
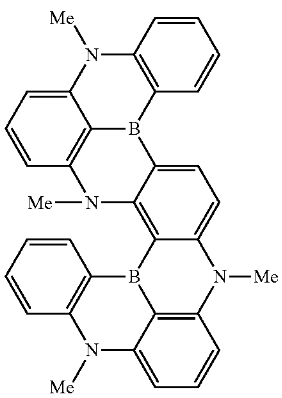
(2-425)
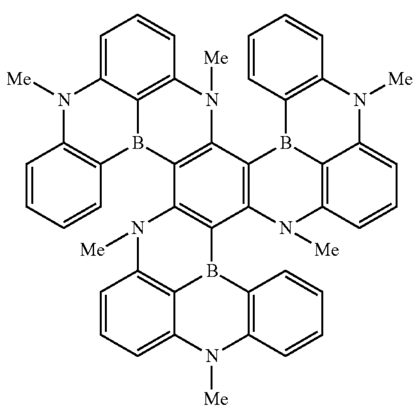
-continued
(2-431)
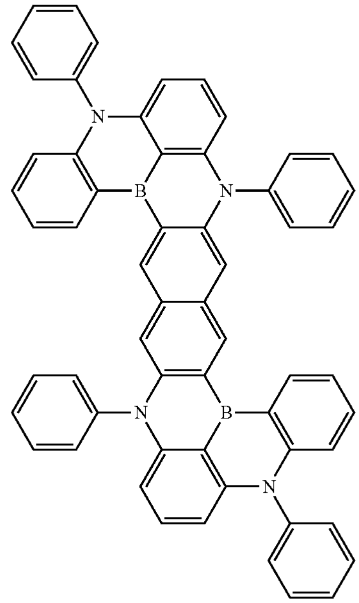
(2-432)
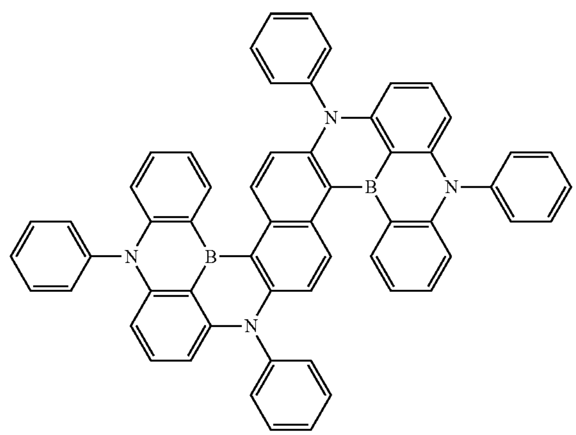
(2-433)
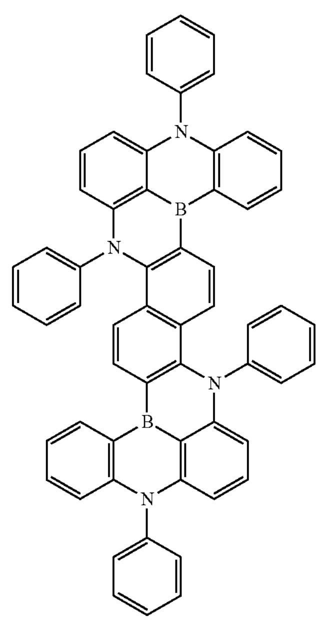

-continued
(2-434)
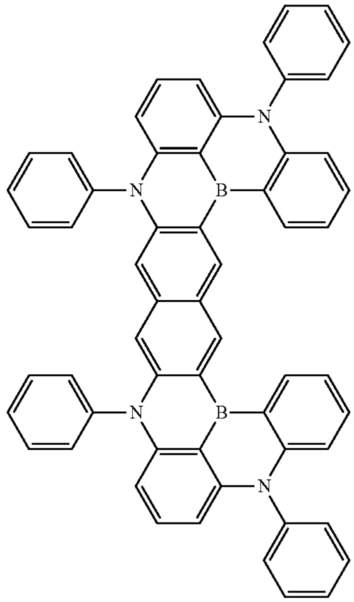
(2-435)
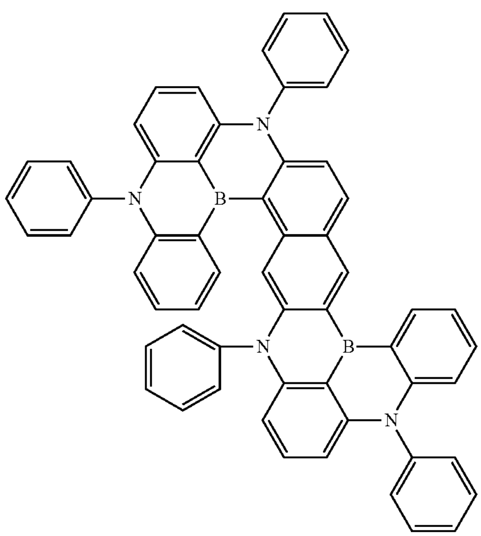
(2-441)
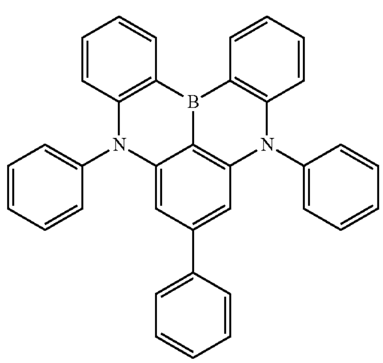
-continued
(2-442)
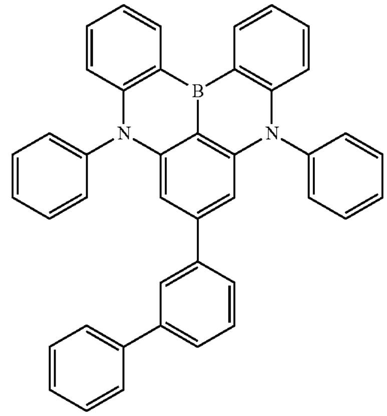
(2-443)
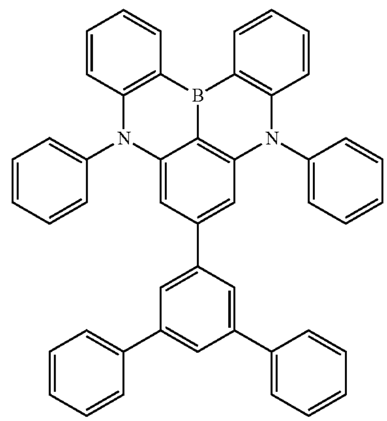
(2-444)
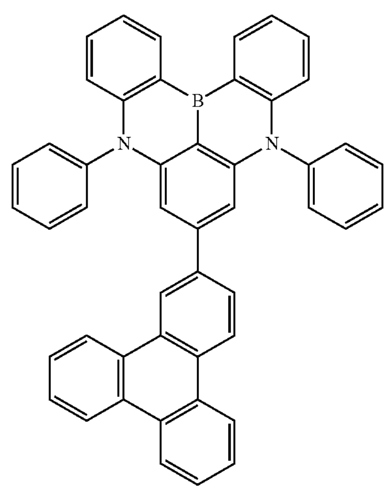

-continued
(2-445)
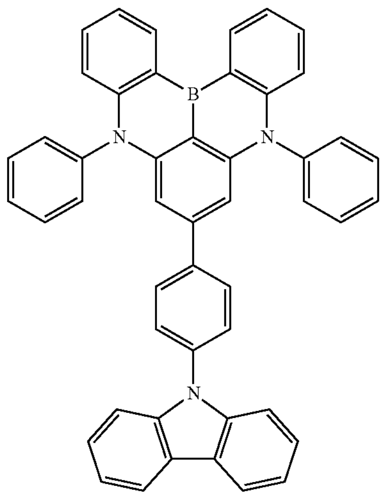
(2-446)
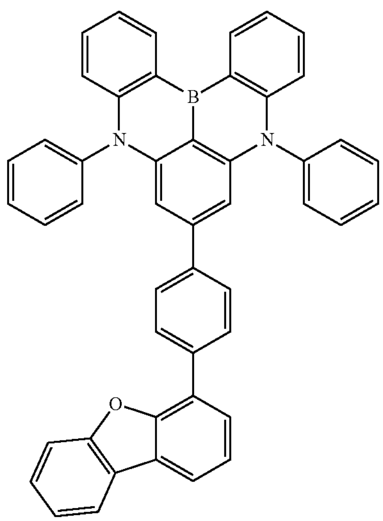
(2-447)
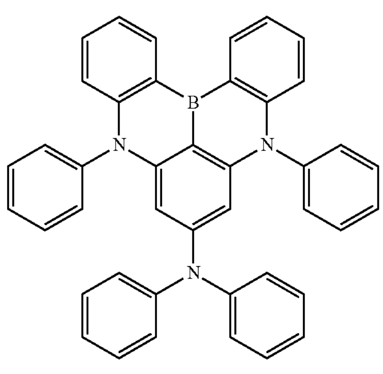
(2-451)
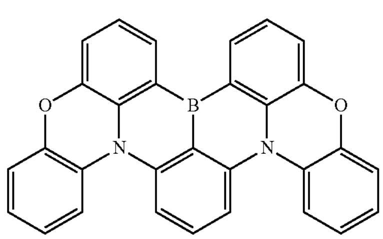
-continued
(2-452)
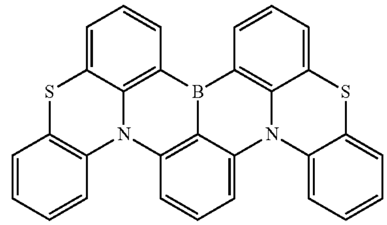
(2-453)
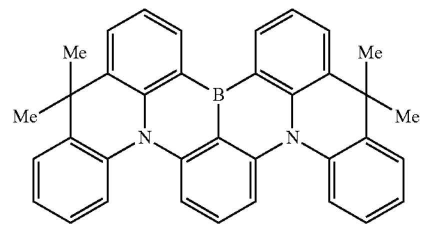
(2-454)
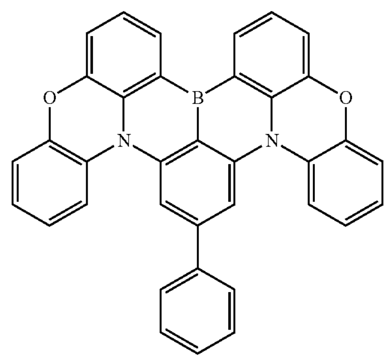
(2-455)
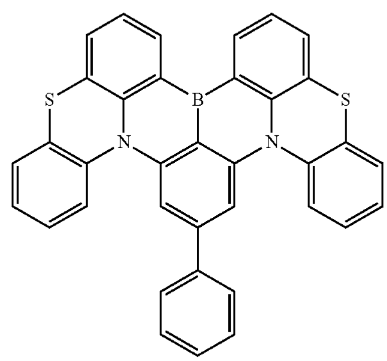
(2-456)
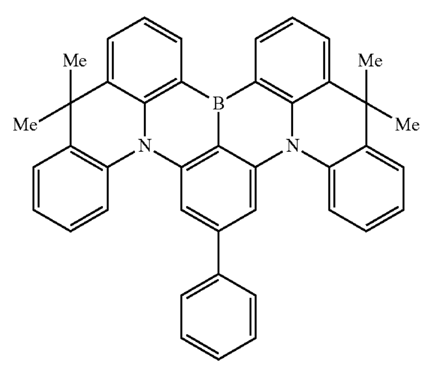

-continued
(2-457)
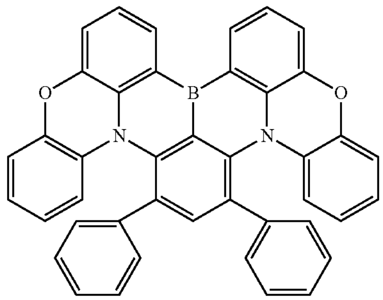
(2-458)
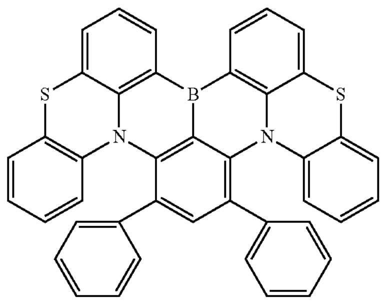
(2-459)
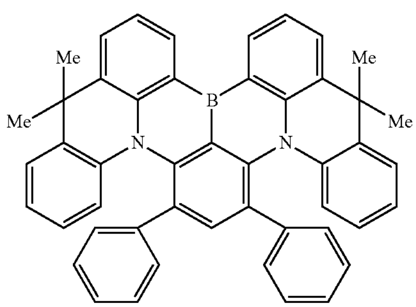
(2-460)
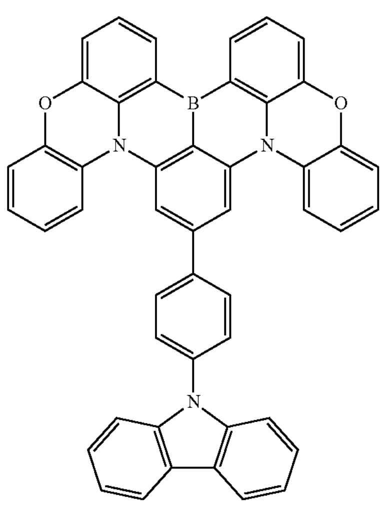
-continued
(2-461)
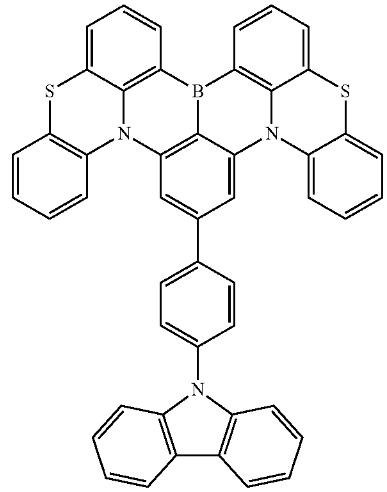
(2-462)
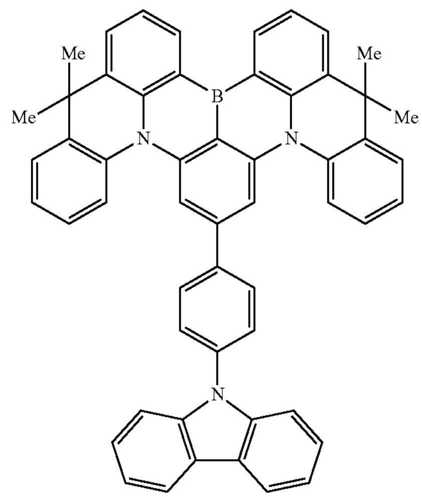
(2-1401)
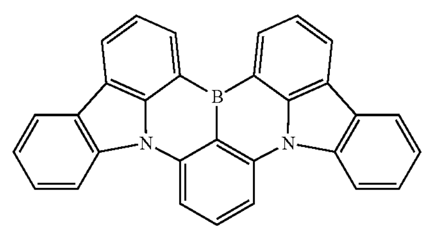
(2-1402)
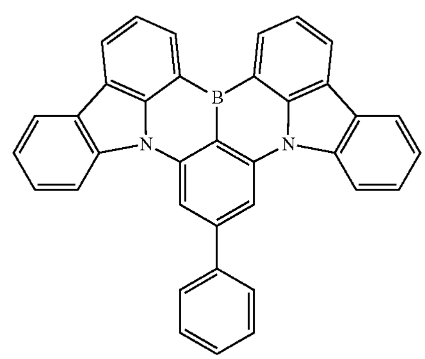

-continued
(2-1403)
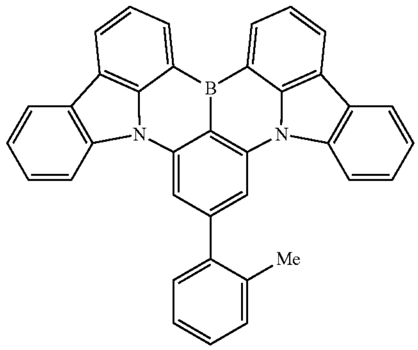
(2-1404)
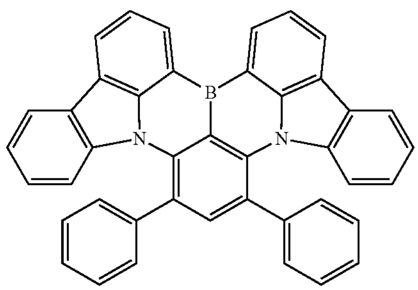
(2-1405)
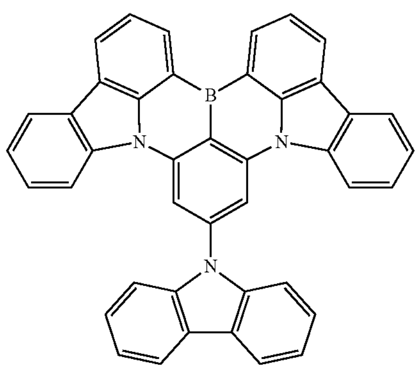
(2-1406)
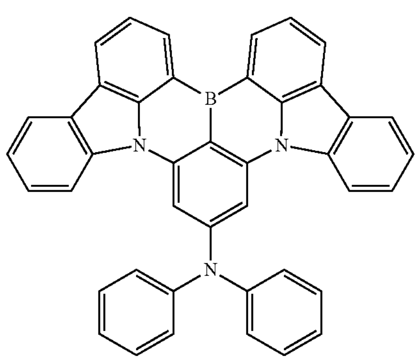
-continued
(2-1407)
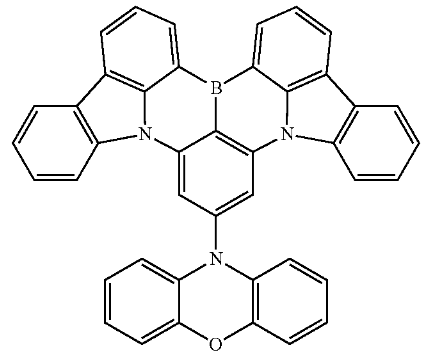
(2-1408)
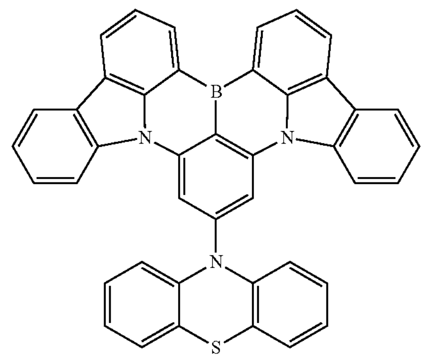
(2-1409)
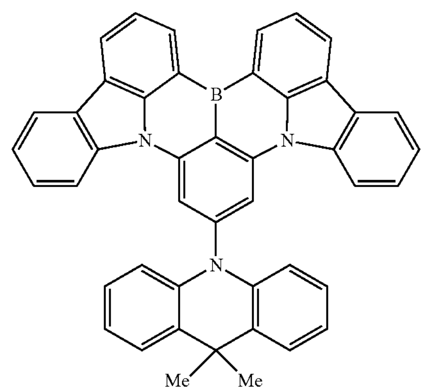
(2-1410)
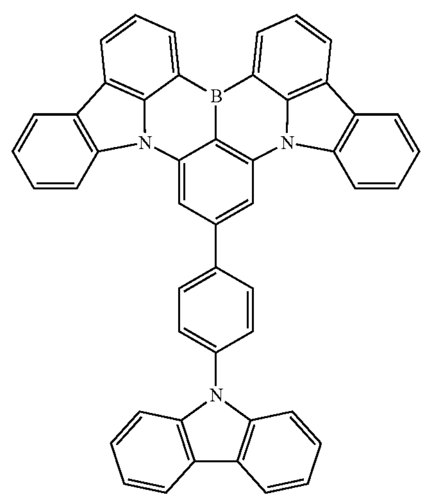

-continued
(2-1411)
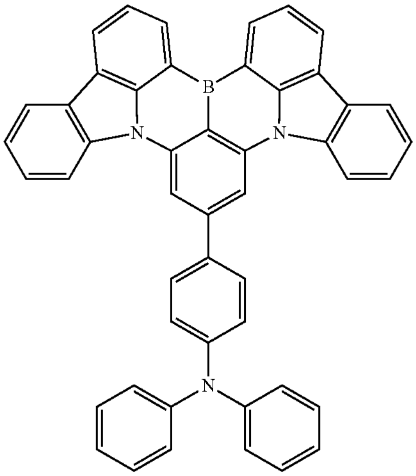
(2-1412)
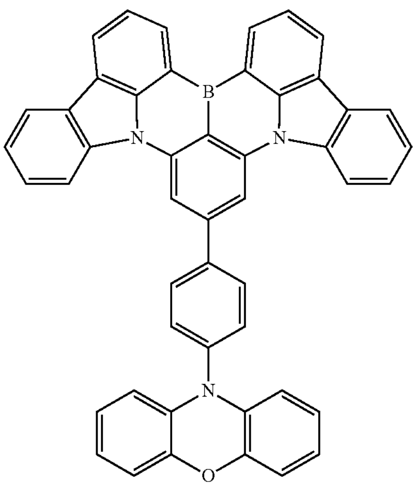
(2-1413)
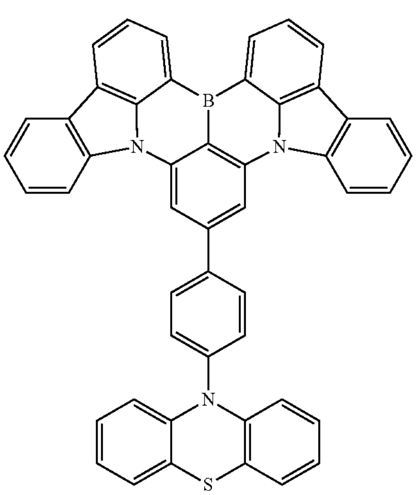
-continued
(2-1414)
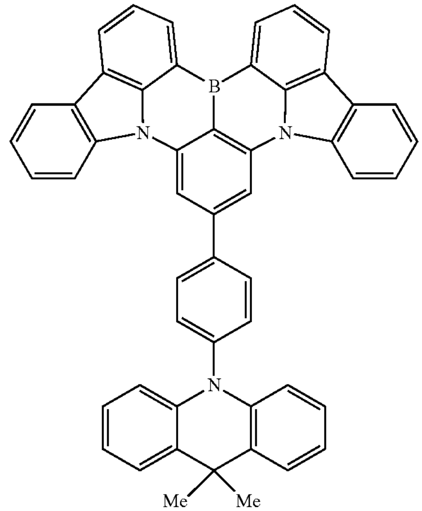
(2-1421)
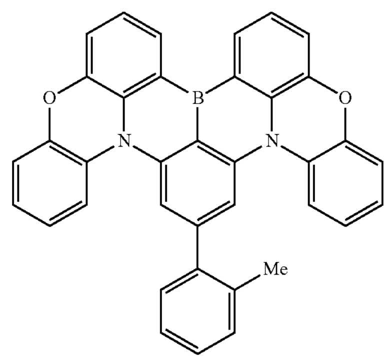
(2-1422)
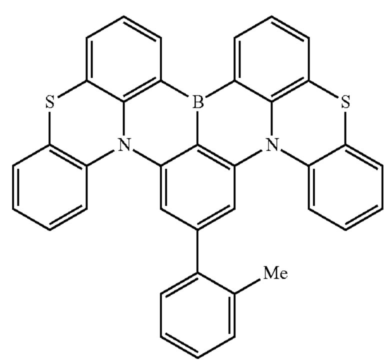
(2-1423)
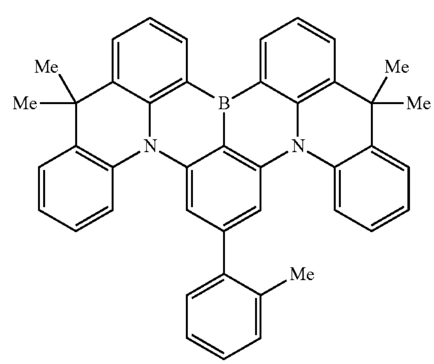

-continued
(2-1424)
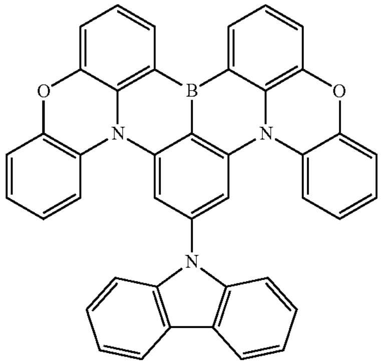
(2-1425)
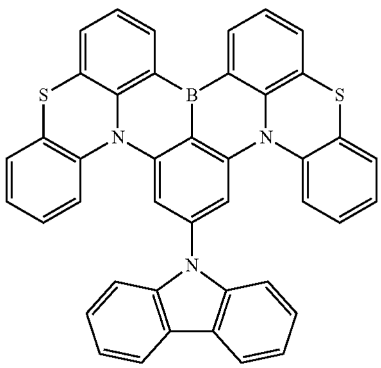
(2-1426)
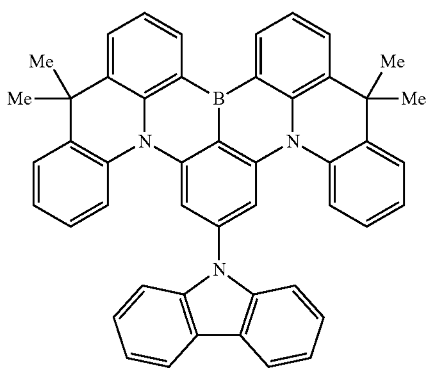
(2-1427)
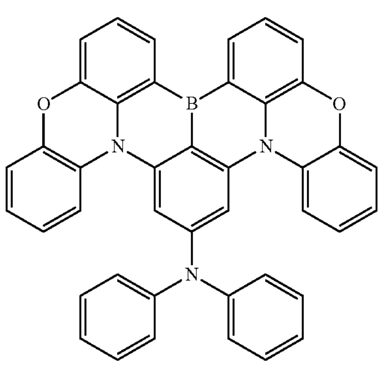
-continued
(2-1428)
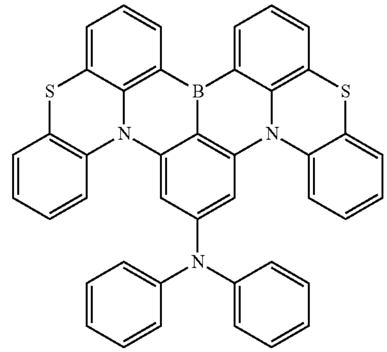
(2-1429)
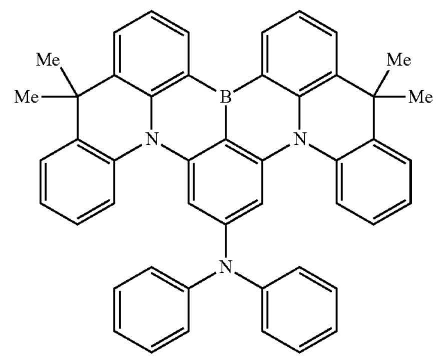
(2-1430)
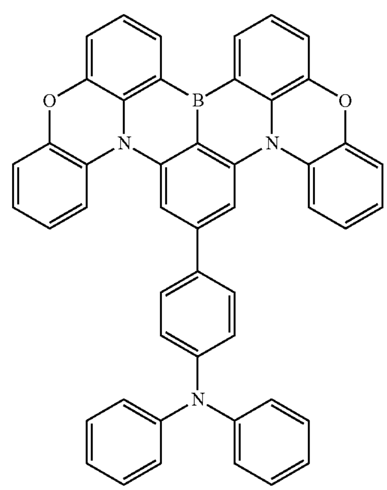

-continued
(2-1431)
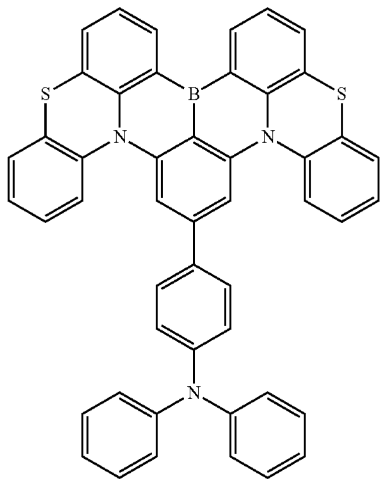
(2-1432)
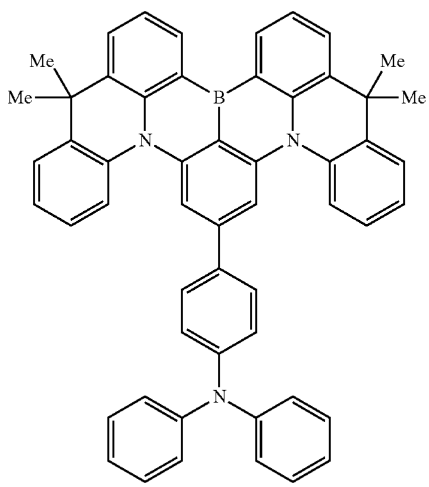
(2-1433)
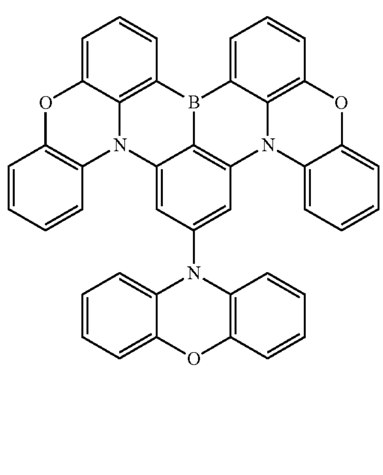
-continued
(2-1434)
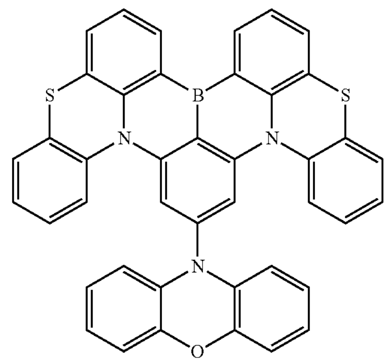
(2-1435)
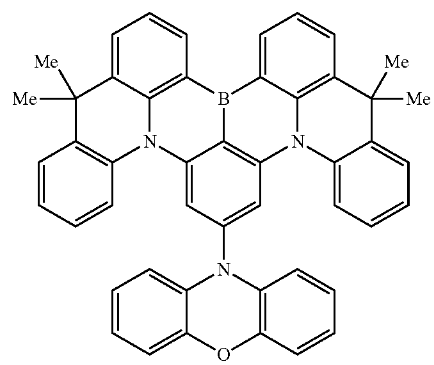
(2-1436)
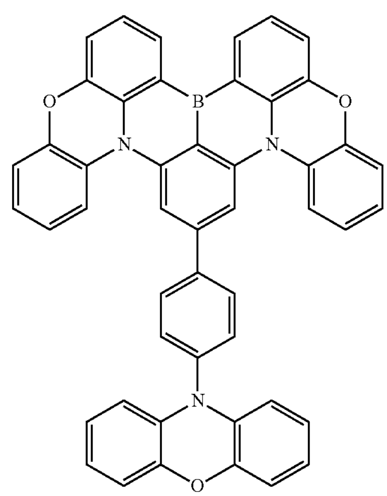

-continued
(2-1437)
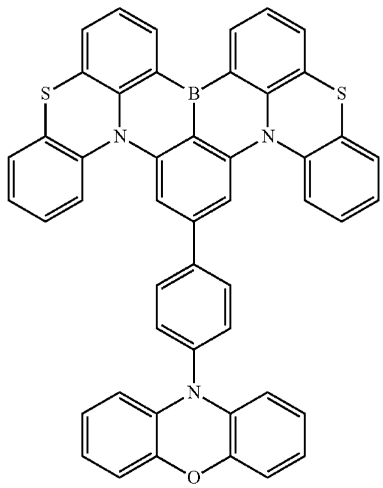
(2-1438)
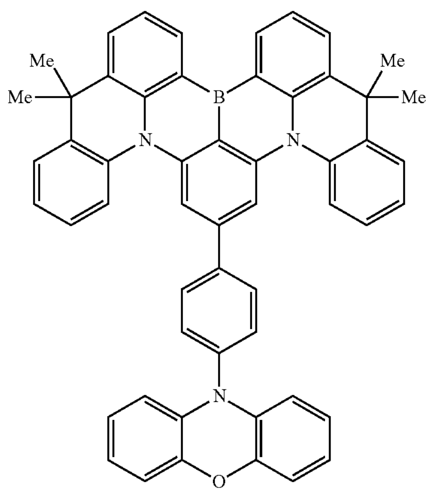
(2-1439)
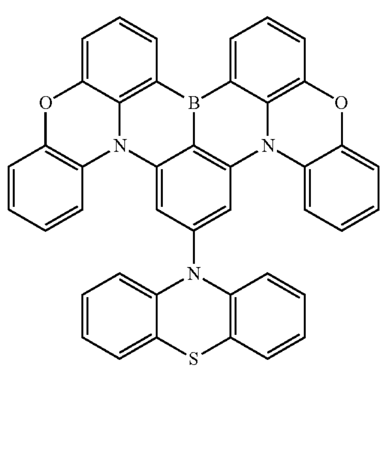
-continued
(2-1450)
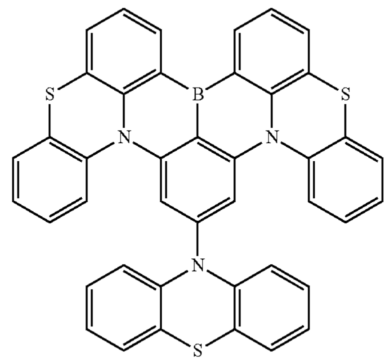
(2-1451)
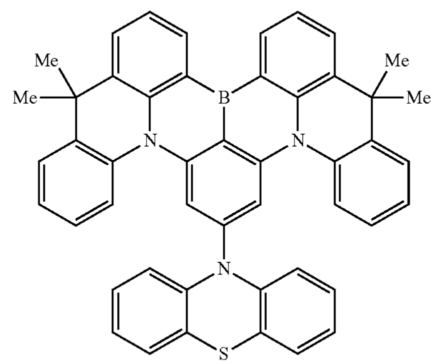
(2-1452)
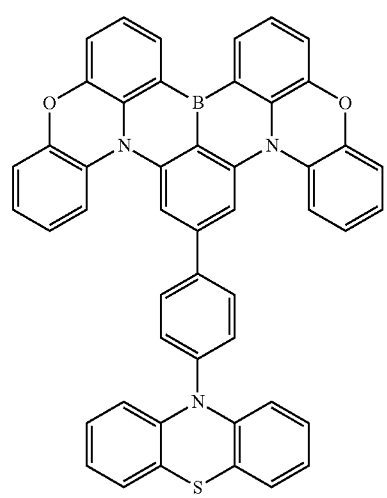

-continued
(2-1453)
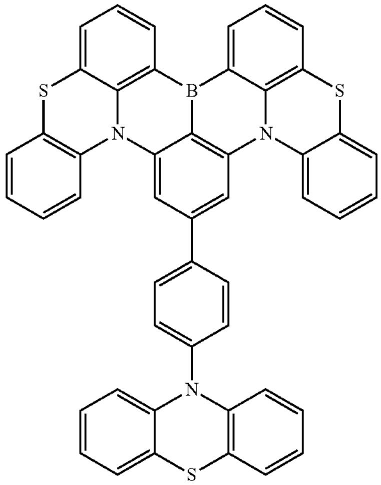
(2-1454)
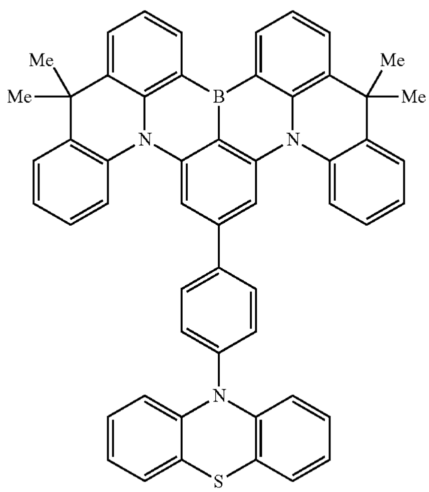
(2-1455)
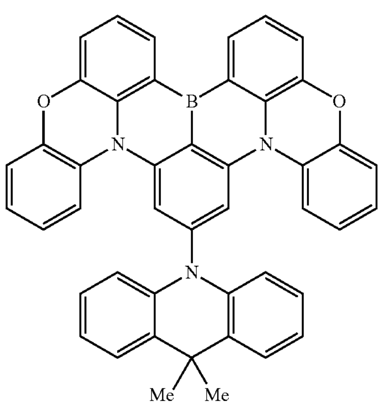
-continued
(2-1456)
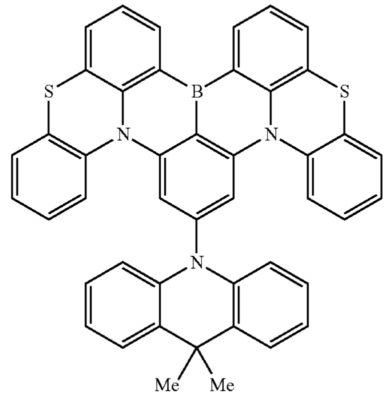
(2-1457)
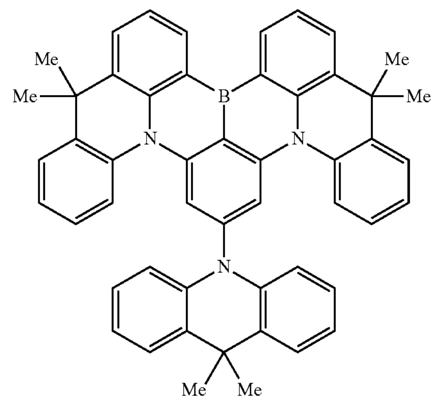
(2-1458)
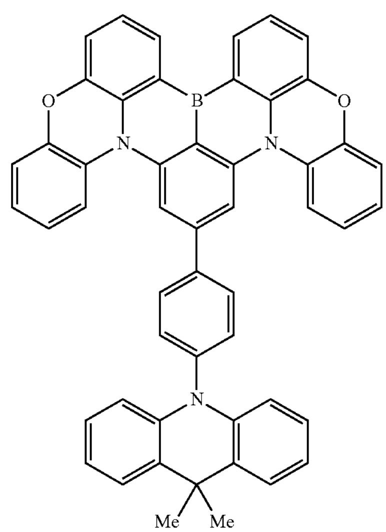

(2-1459)
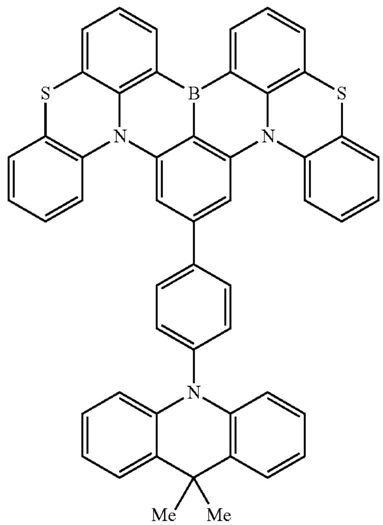
(2-1460)
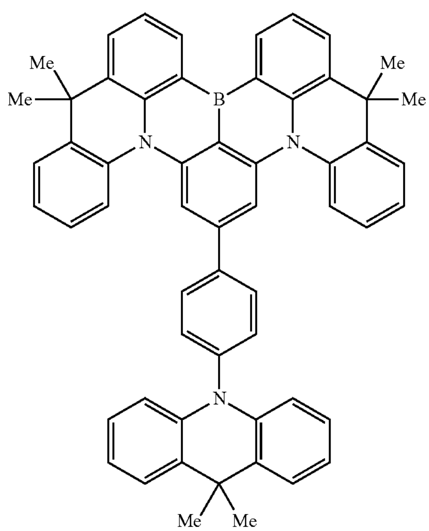
(2-471)
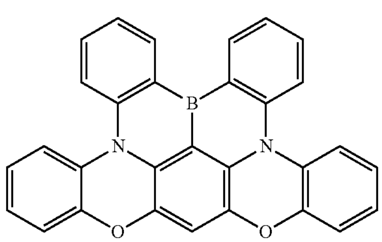
(2-472)
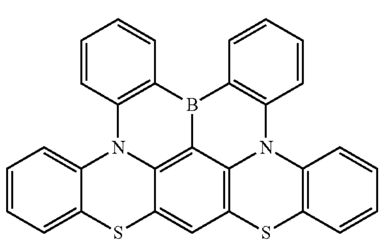
(2-473)
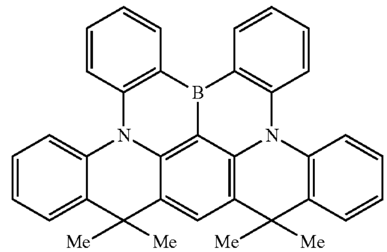
(2-474)
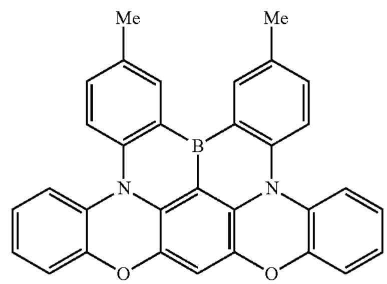
(2-475)
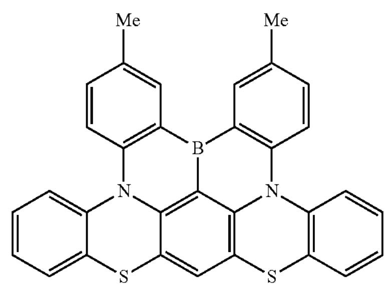
(2-476)
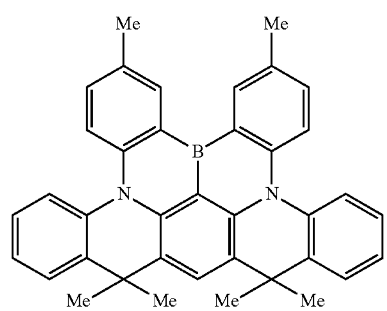
(2-477)
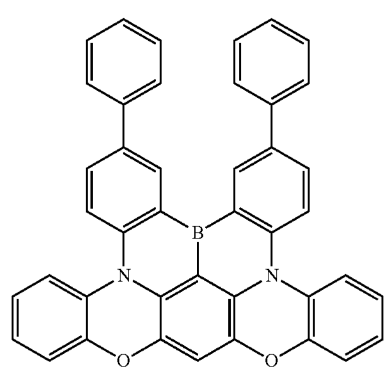

-continued
(2-478)
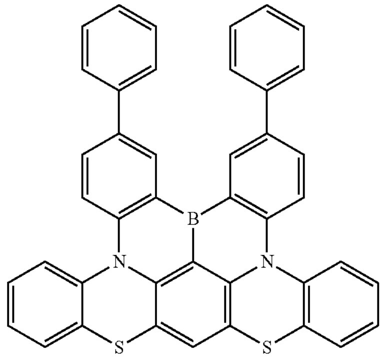
(2-479)
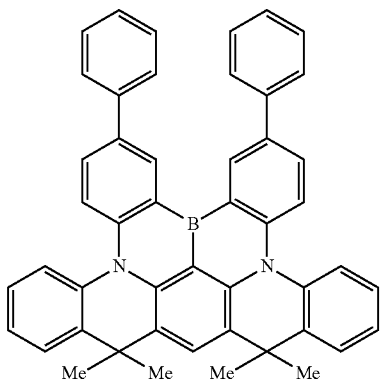
(2-1151)
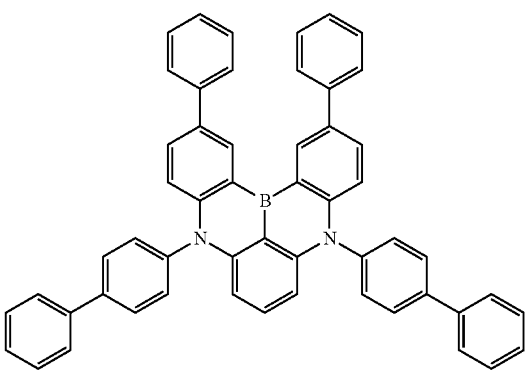
(2-1152)
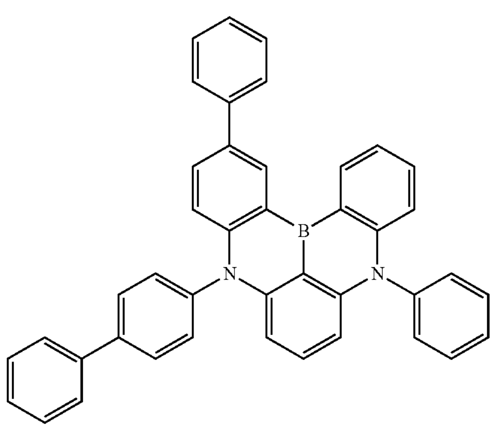
-continued
(2-1153)
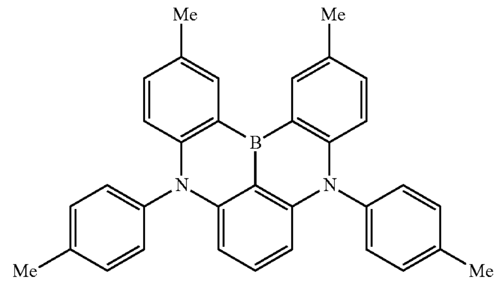
(2-1154)
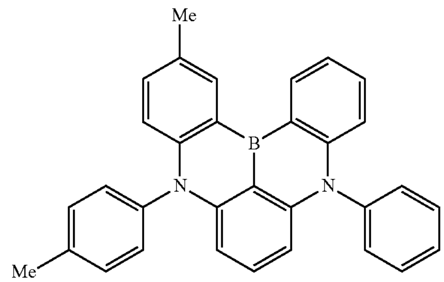
(2-1155)
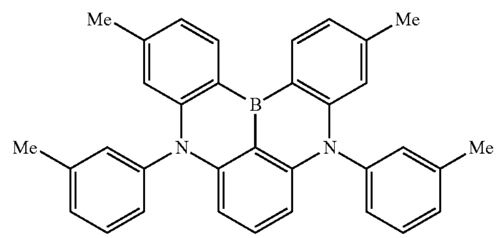
(2-1156)
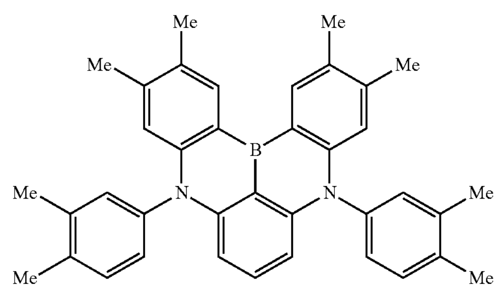
(2-1157)
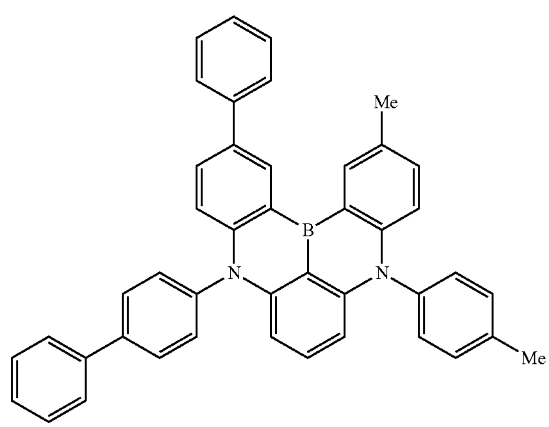

-continued
(2-1158)
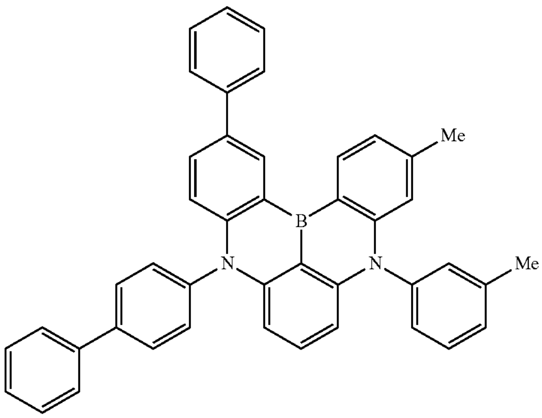
(2-1159)
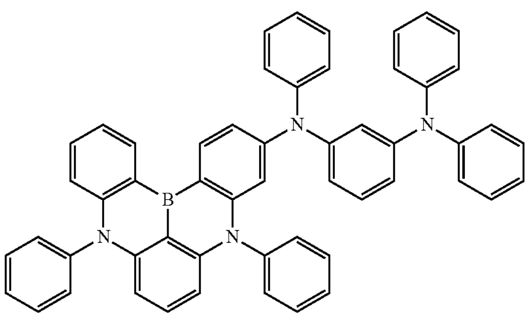
(2-2619)
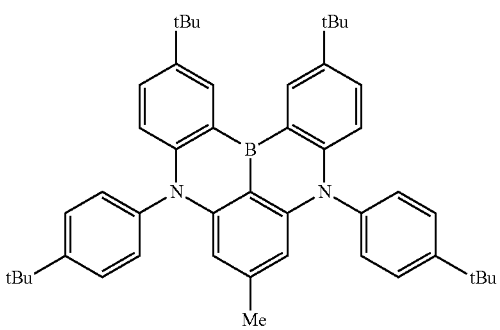
(2-2620)
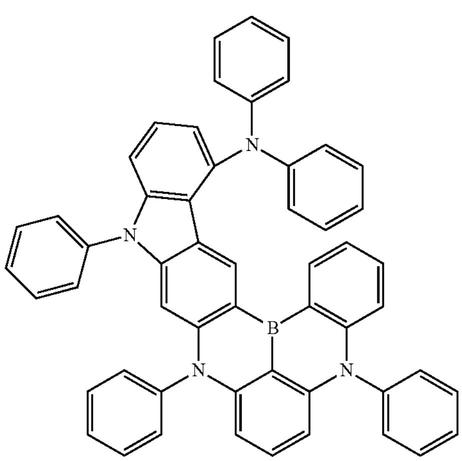
-continued
(2-2621)
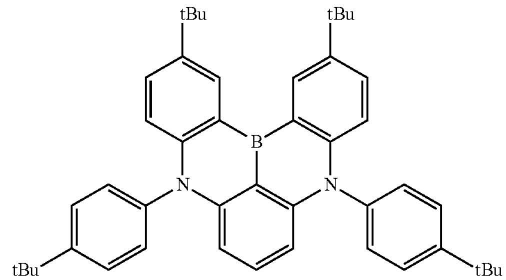
(2-2622)
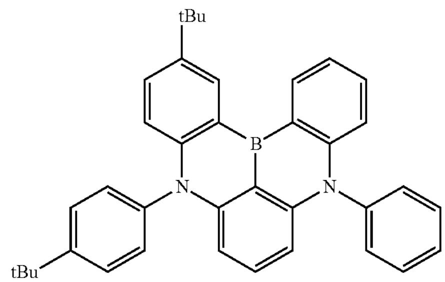
(2-2623)
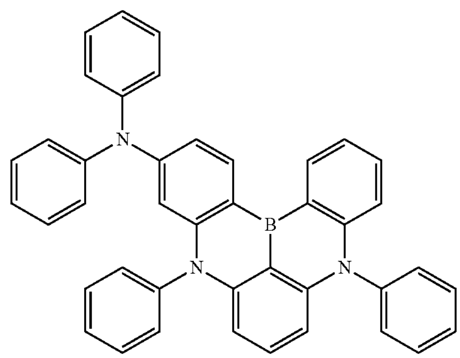
(2-2624)
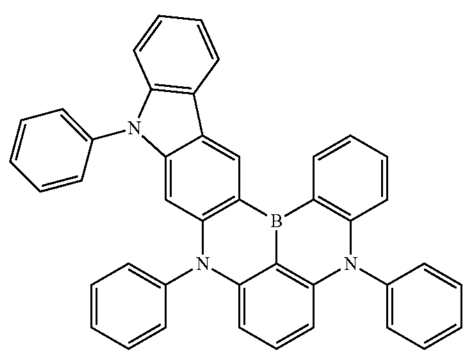
(2-2625)
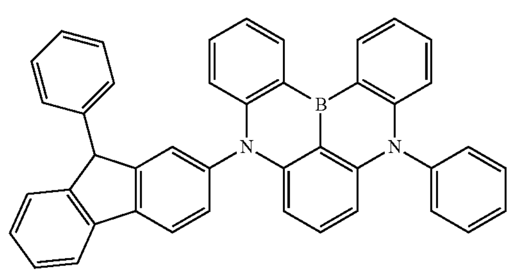

(2-2626)
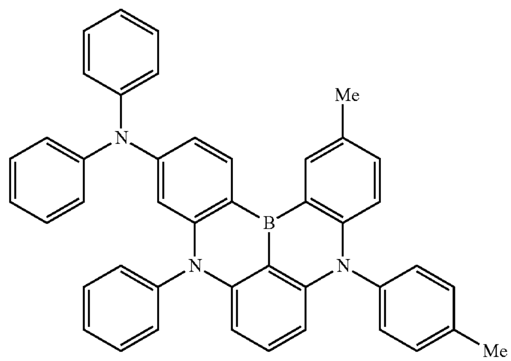
(2-2627)
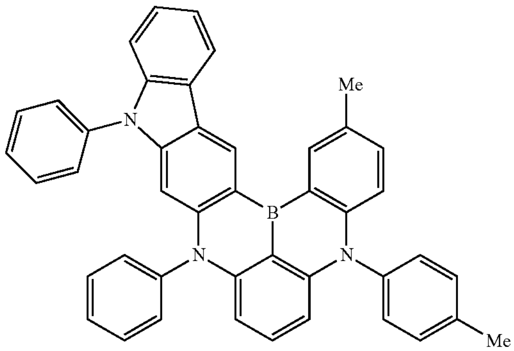
(2-2628)
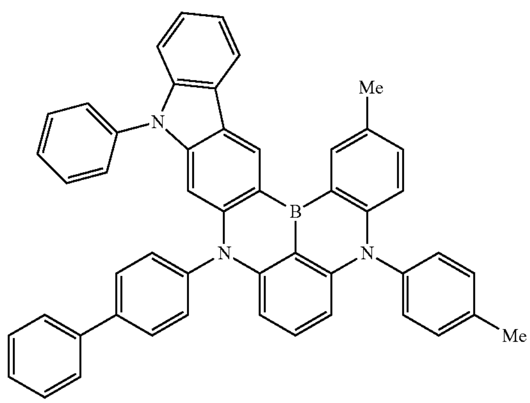
(2-2629)
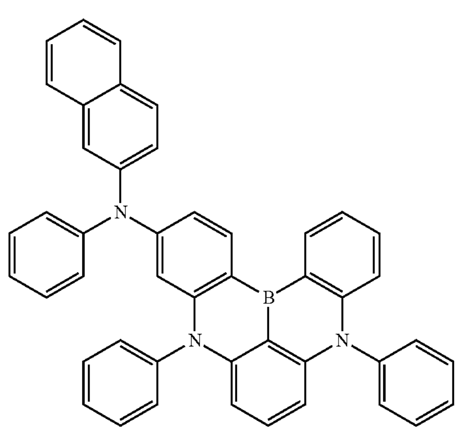
(2-2630)
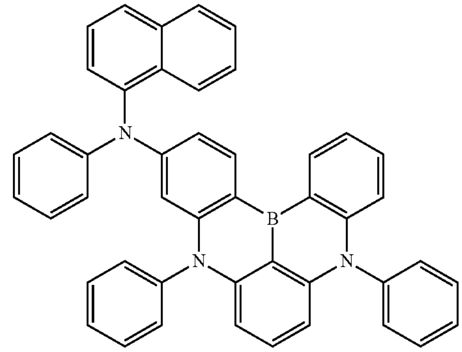
(2-2631)
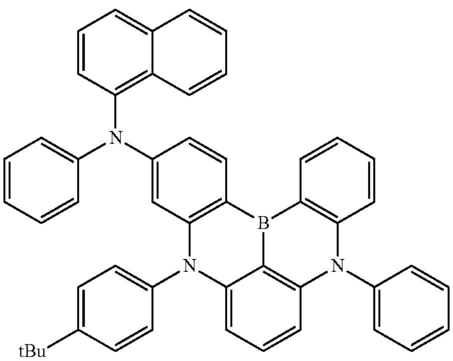
(2-2632)
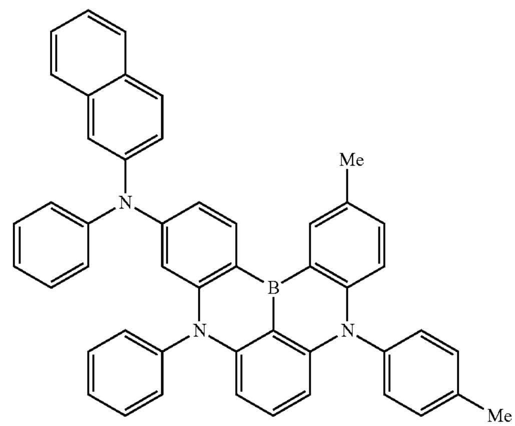
(2-2633)
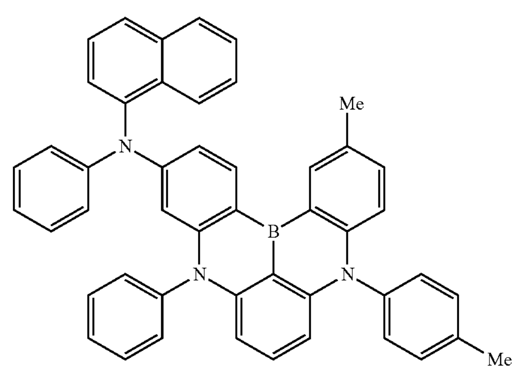

(2-2634)
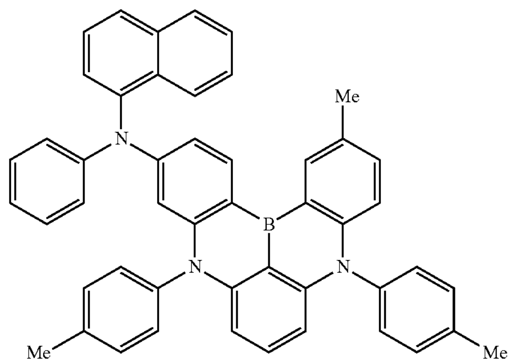
(2-2635)
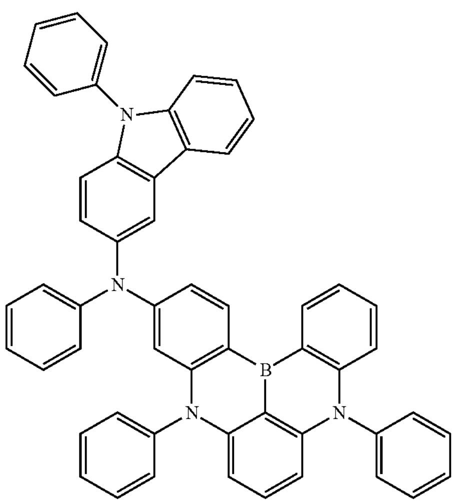
(2-2636)
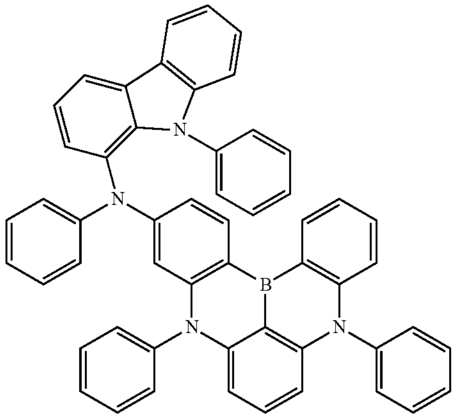
(2-2637)
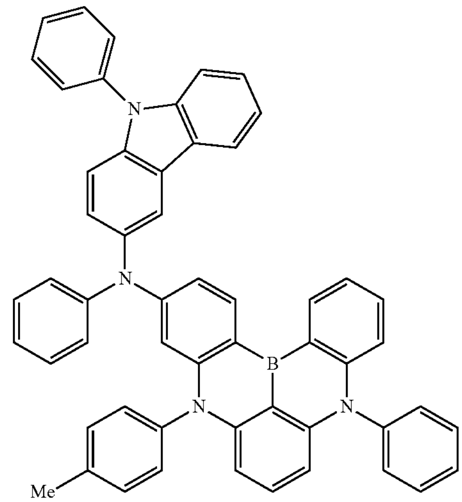
(2-2638)
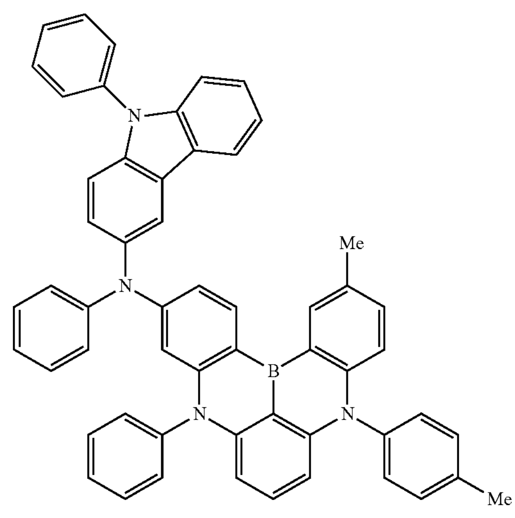
(2-2639)
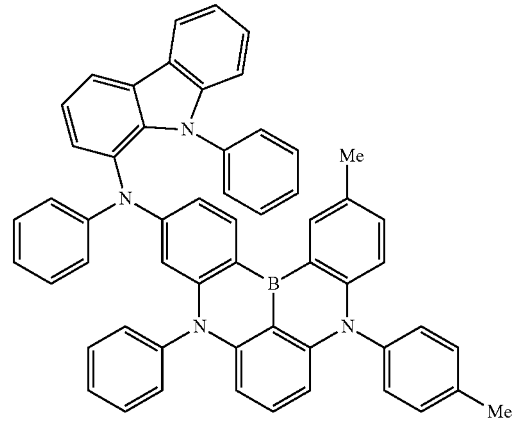

-continued
(2-2640)
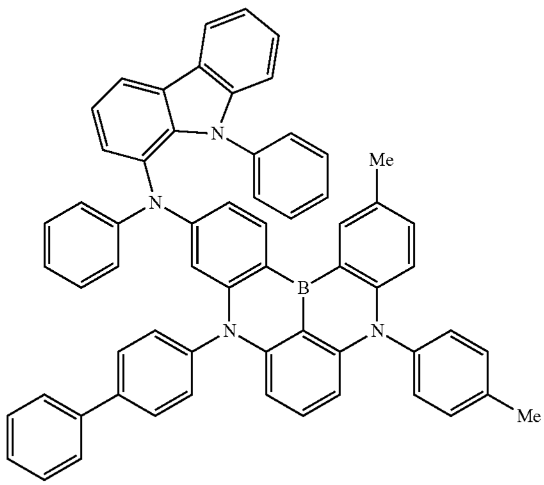
(2-2641)
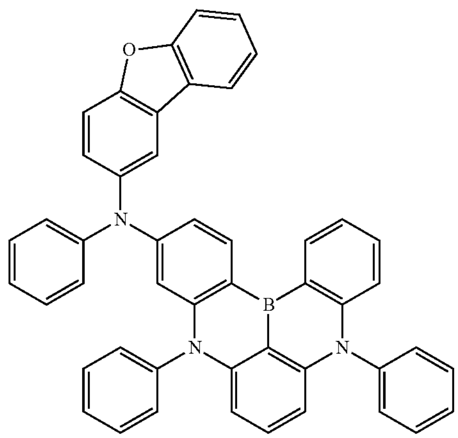
(2-2642)
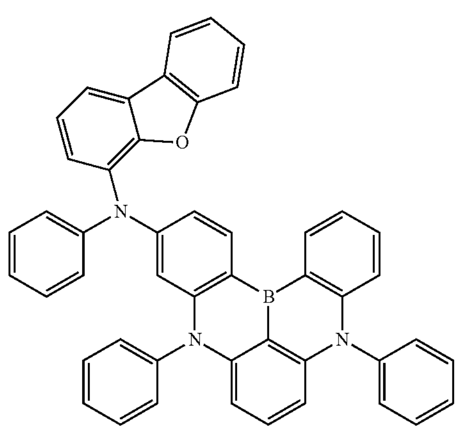
-continued
(2-2643)
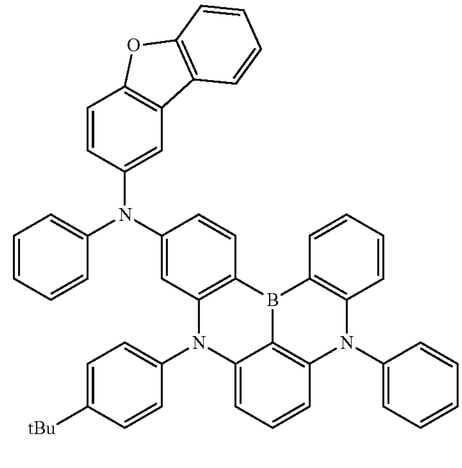
(2-2644)
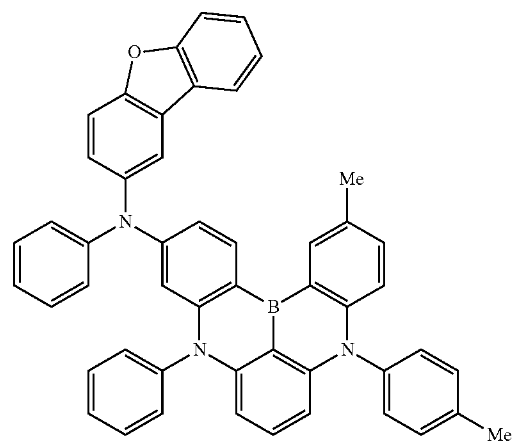
(2-2645)
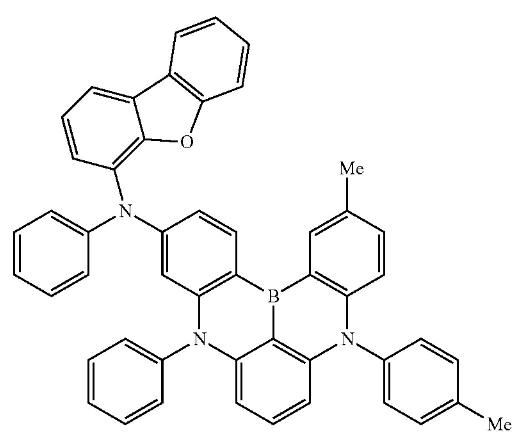

-continued
(2-2646)
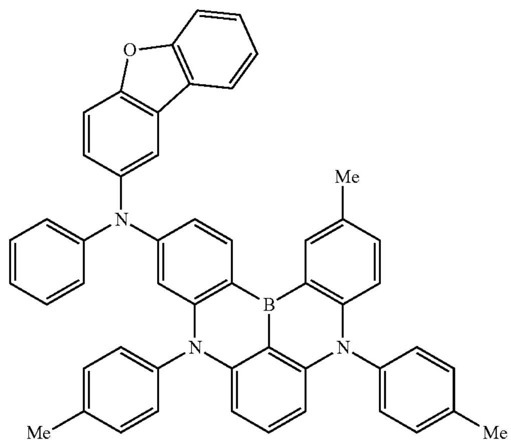
(2-2647)
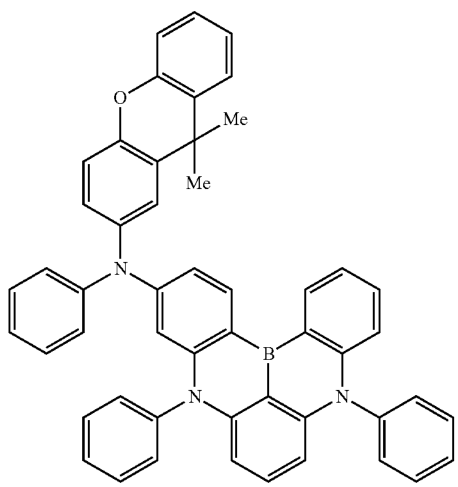
(2-2648)
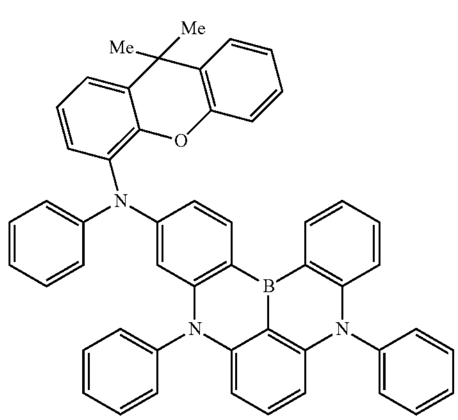
-continued
(2-2649)
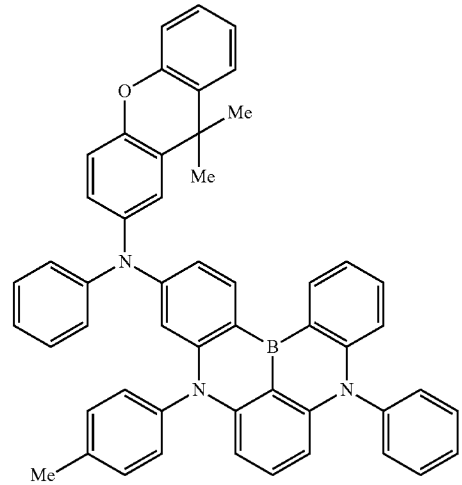
(2-2650)
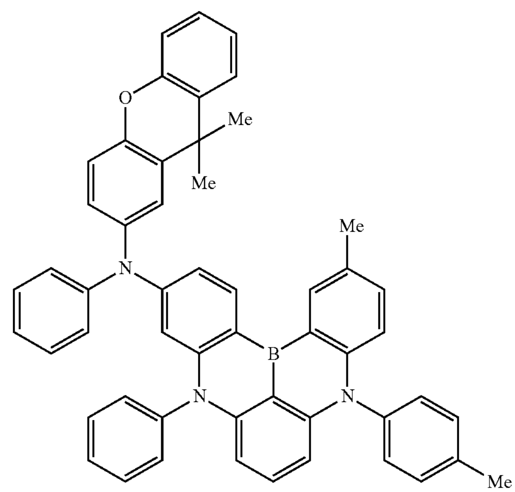
(2-2651)
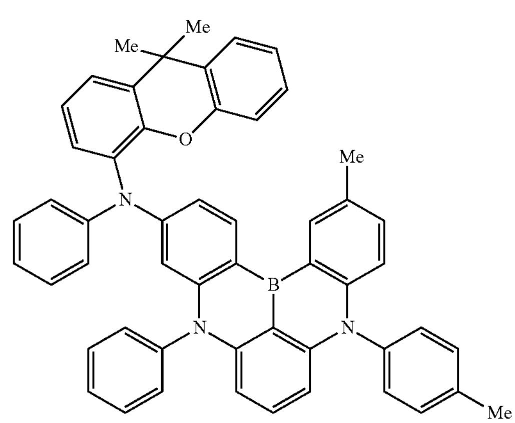

-continued
(2-2652)
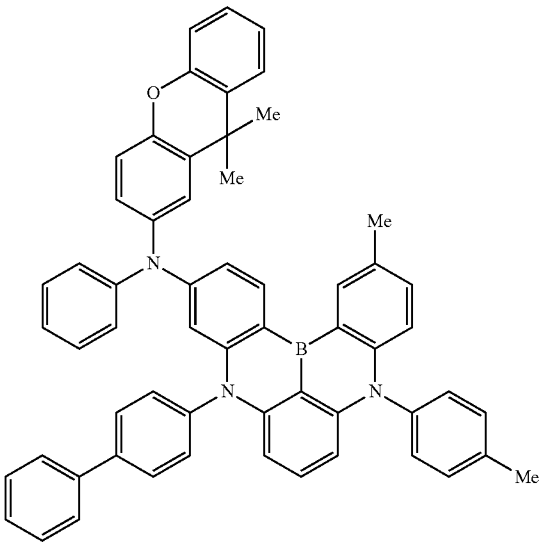
(2-2653)
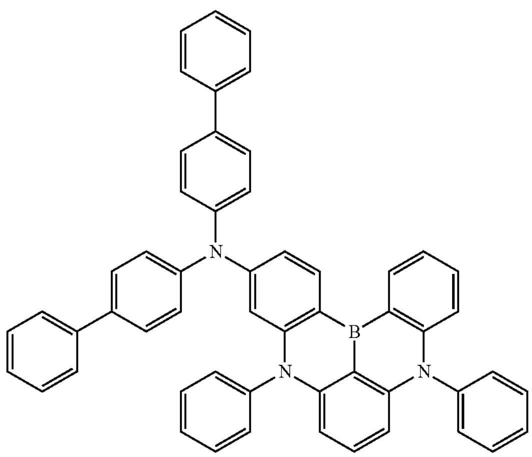
(2-2654)
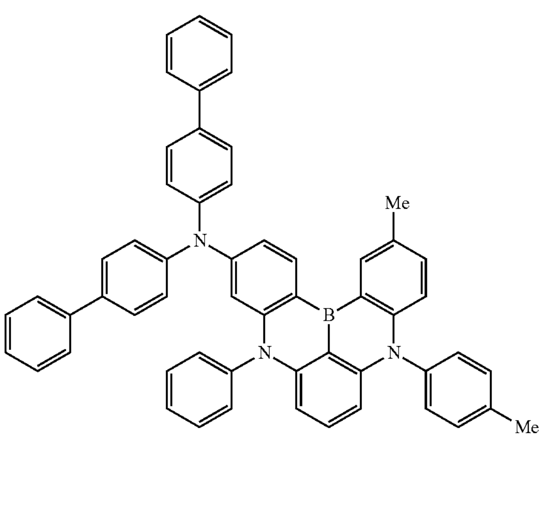
-continued
(2-2655)
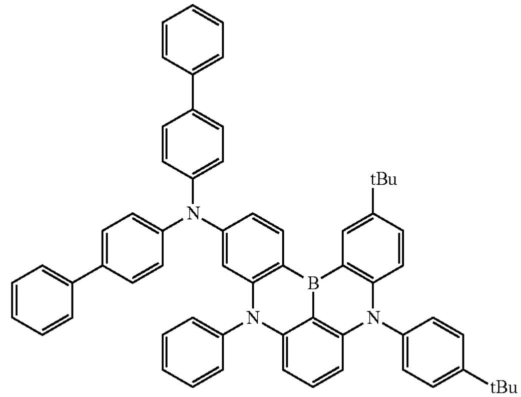
(2-2656)
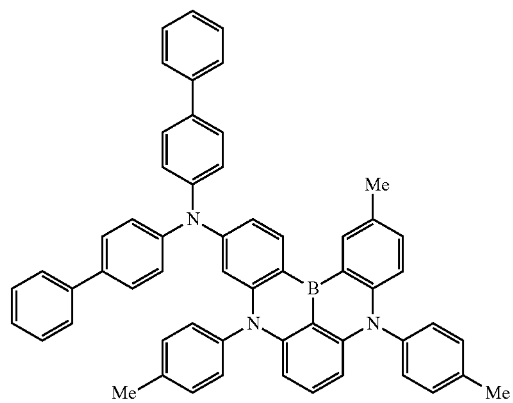
(2-2657)
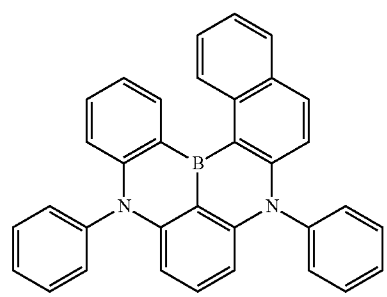
(2-2658)
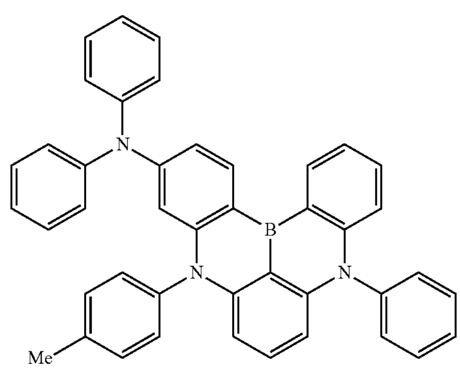

-continued
(2-2659)
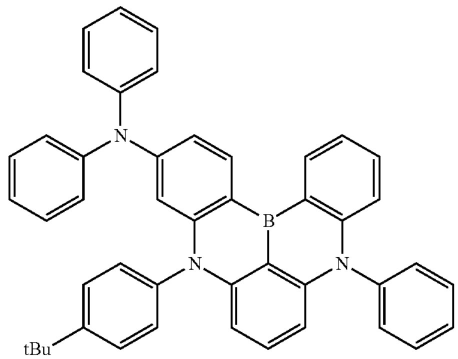
(2-2660)
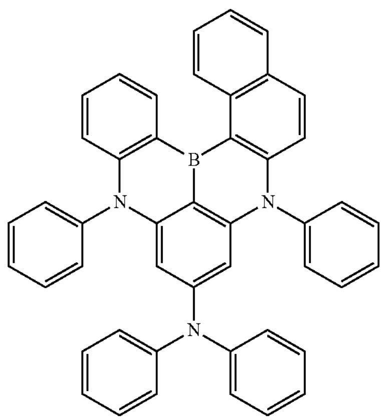
(2-2661)
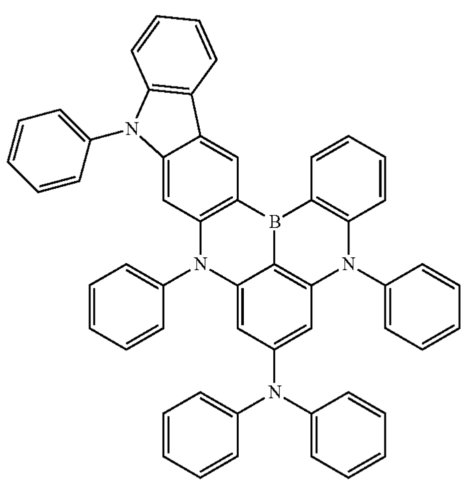
-continued
(2-2662)
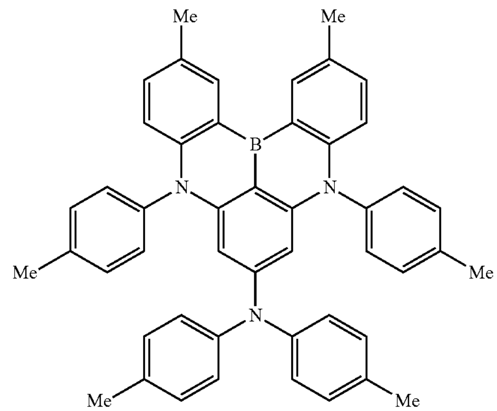
(2-2663)
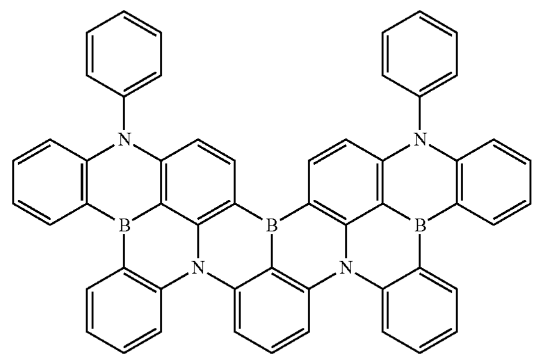
(2-2664)
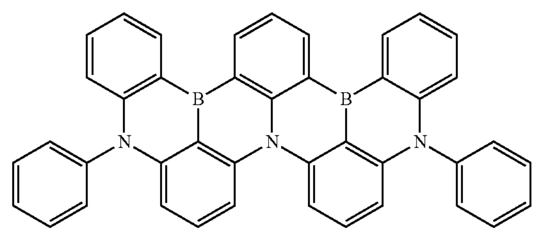
(2-2665)
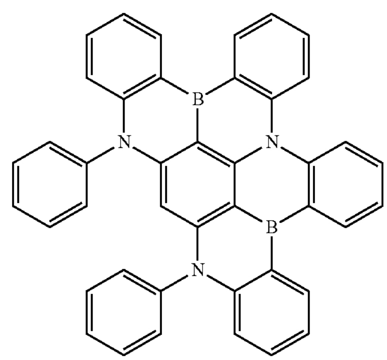

-continued
(2-2666)
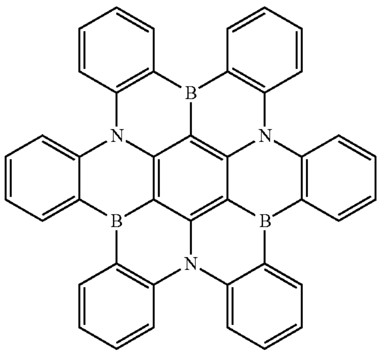
(2-2667)
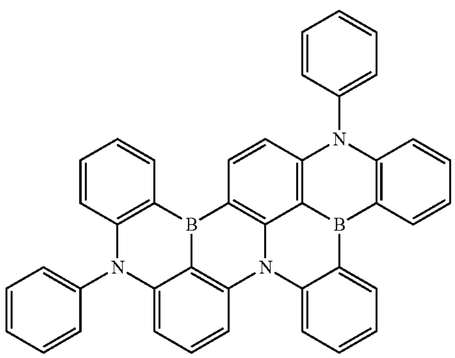
(2-2668)
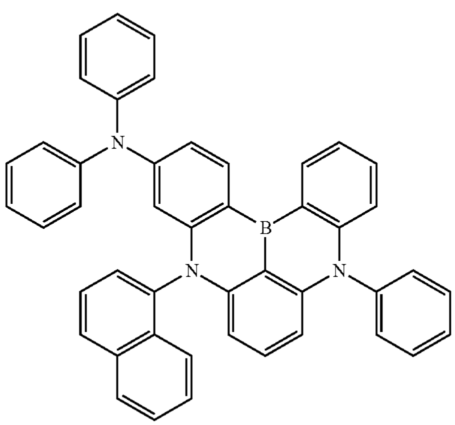
(2-2669)
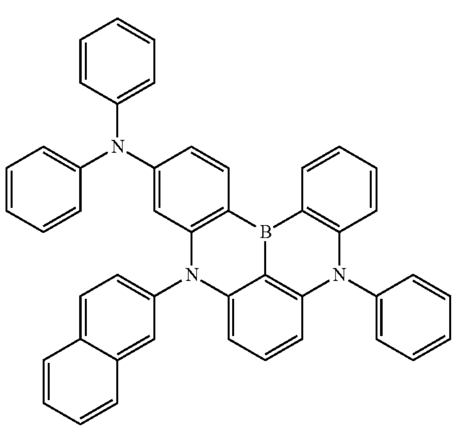
-continued
(2-2670)
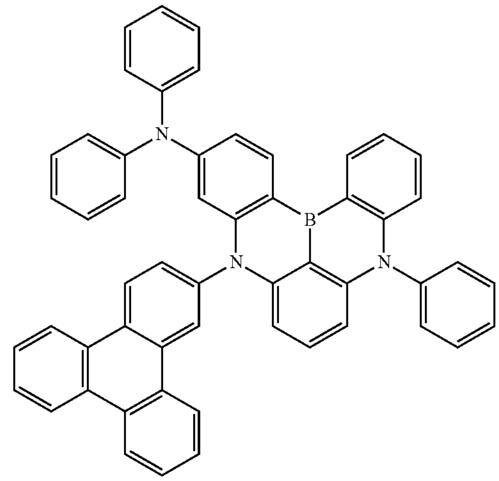
(2-2671)
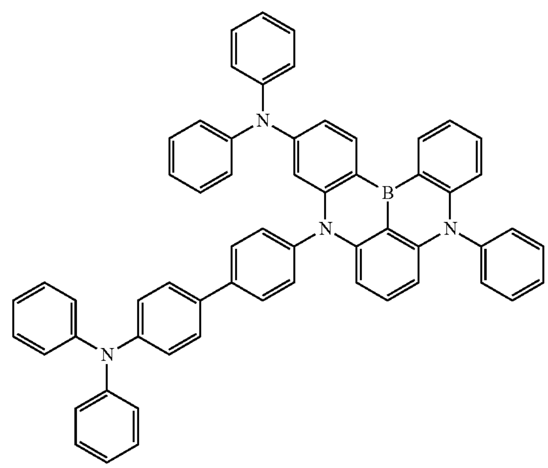
(2-2672)
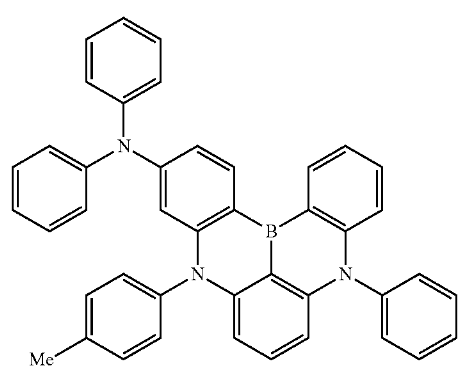

-continued
(2-2673)
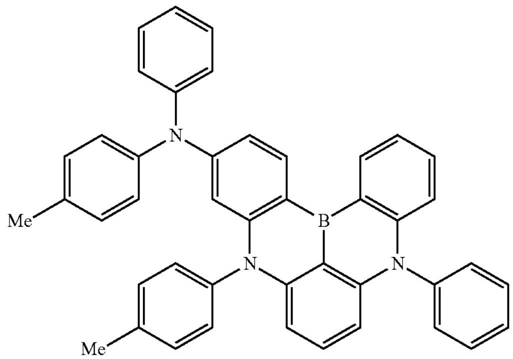
(2-2674)
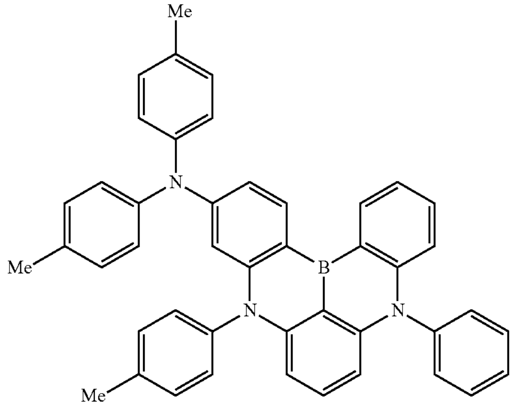
(2-2675)
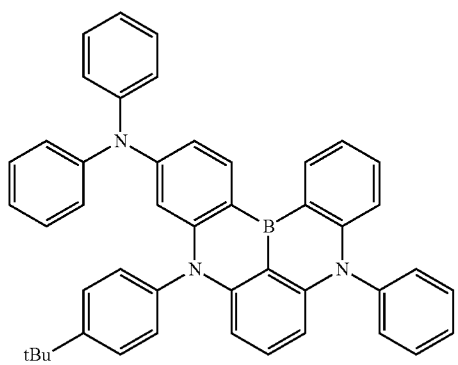
(2-2676)
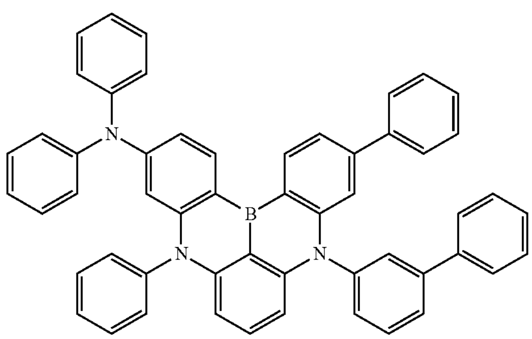
-continued
(2-2677)
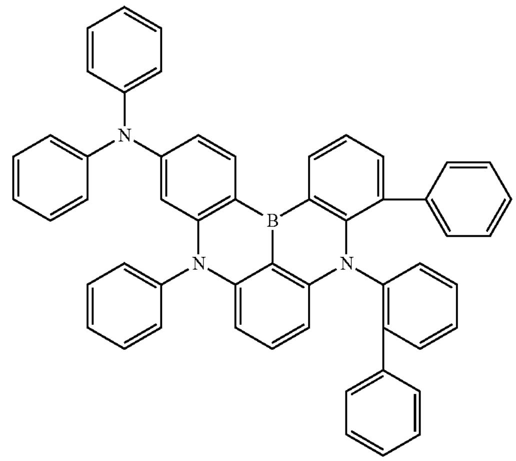
(2-2678)
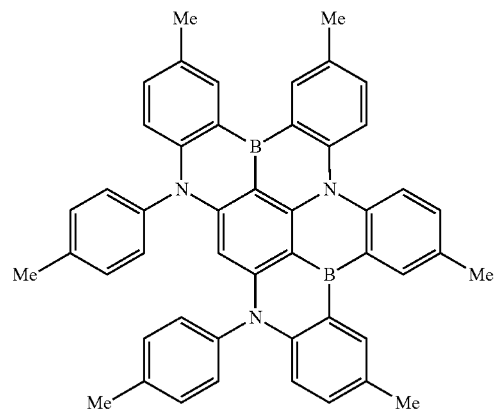
(2-2679)
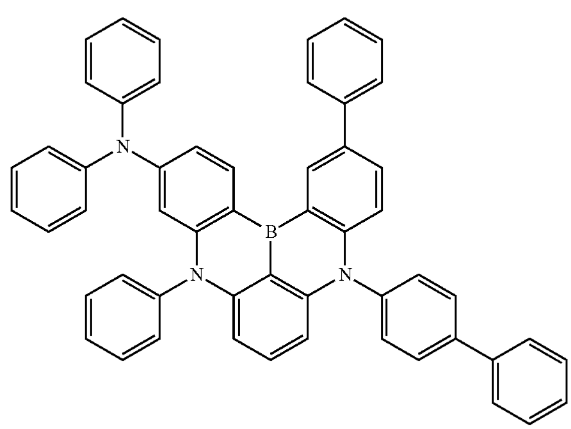

-continued
(2-2680)
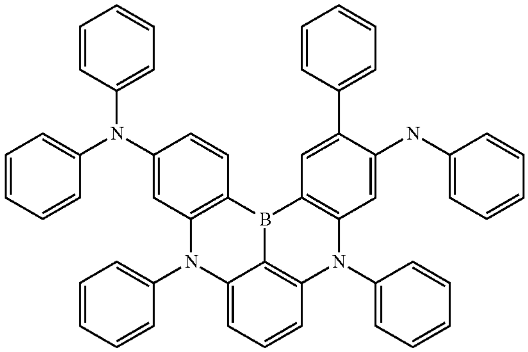
(2-2681)
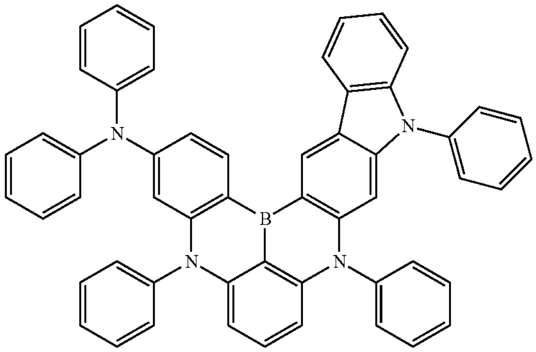
(2-2682)
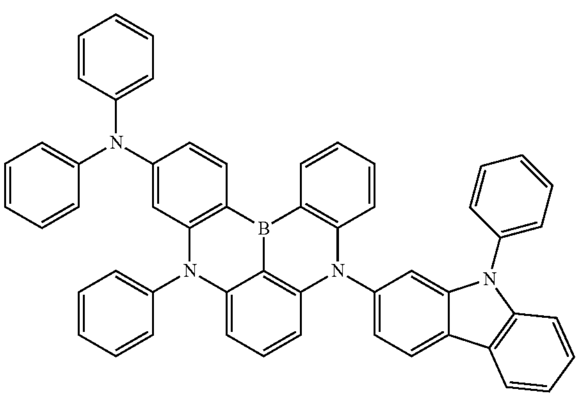
(2-2683)
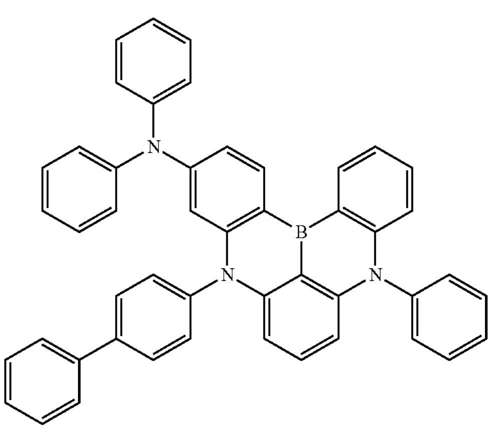
-continued
(2-2684)
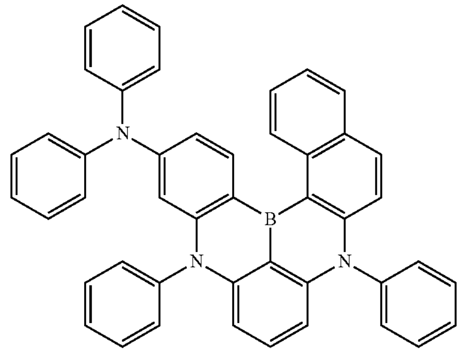
(2-2685)
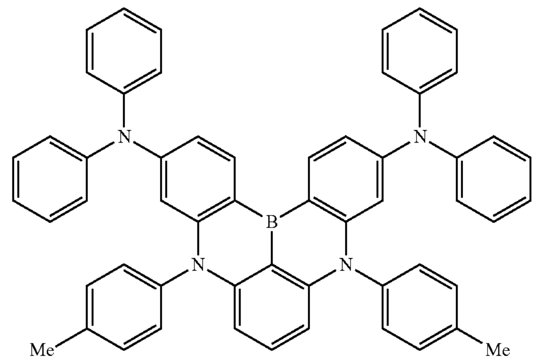
(2-2686)
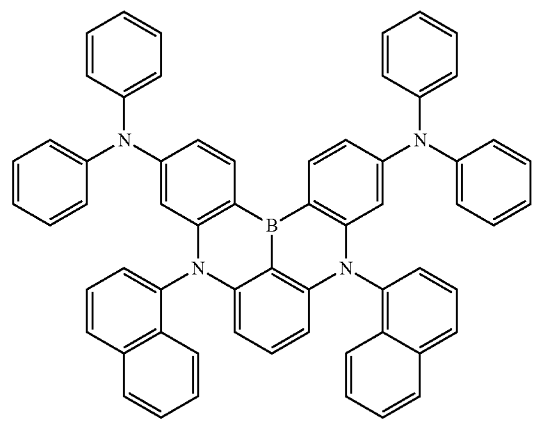
(2-2687)
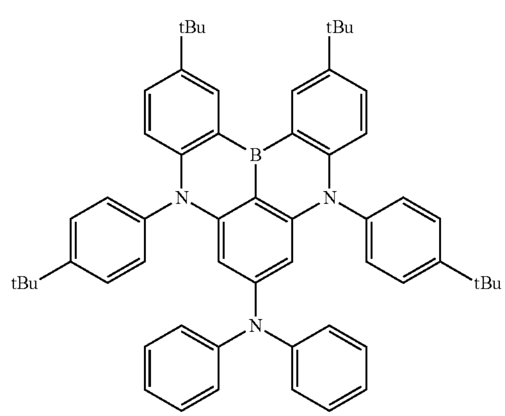

-continued
(2-2688)
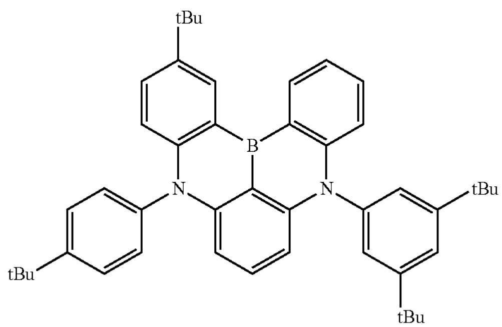
(2-2689)
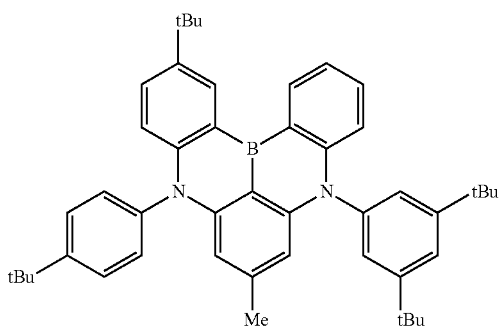
(2-2691)
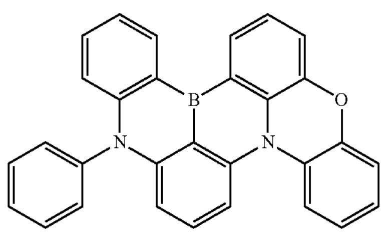
(2-2692)
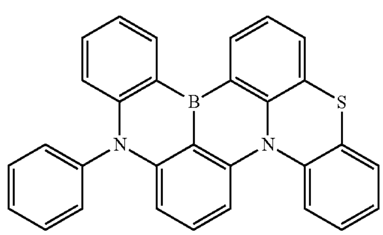
(2-2693)
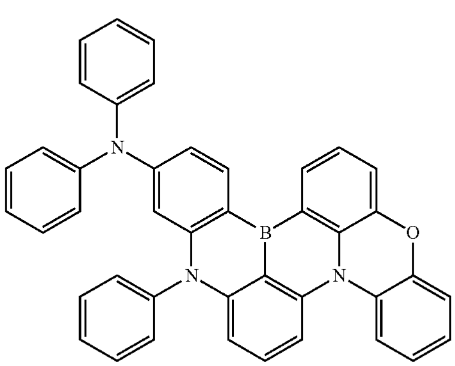
-continued
(2-2694)
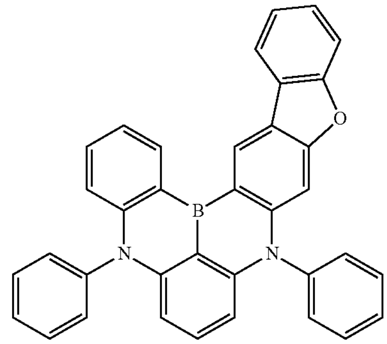
(2-2695)
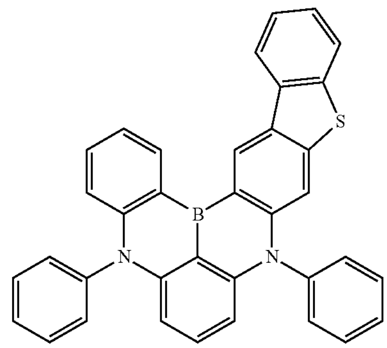
(2-2696)
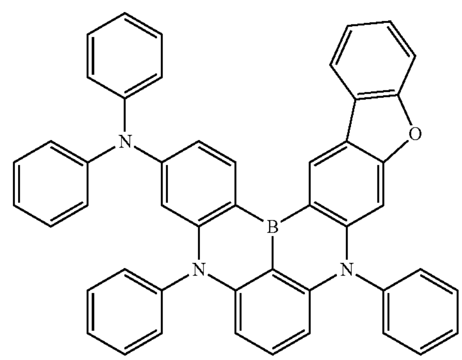
(2-2697)
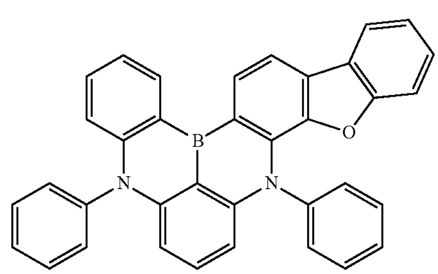
(2-2698)
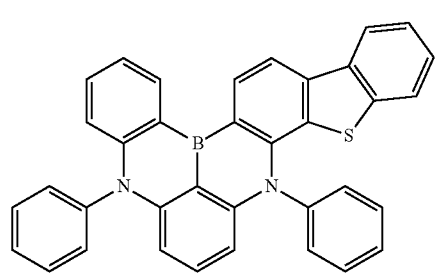

(2-2699)
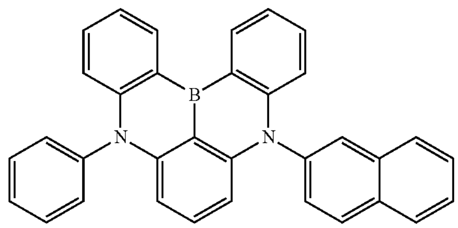
(2-2700)
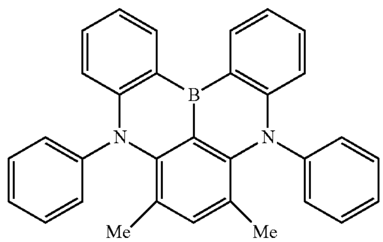
(2-2701)
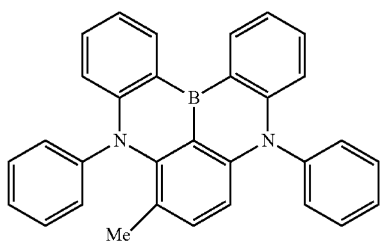
(2-2702)
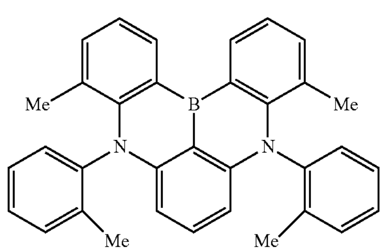
(2-2703)
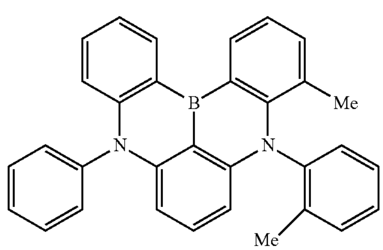
(2-2704)
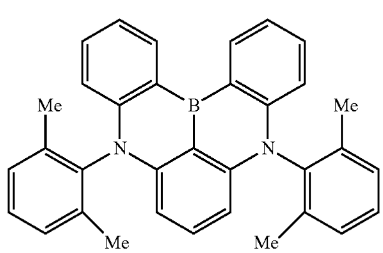
(2-2705)
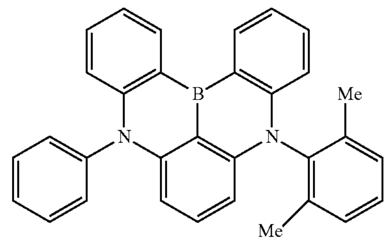
(2-2710)
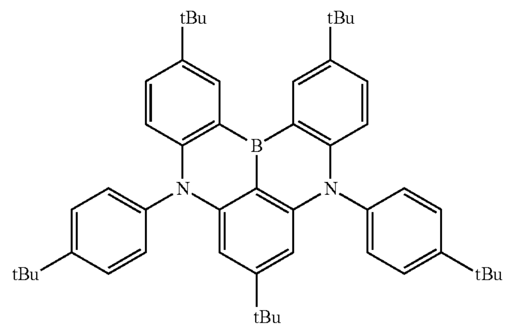
(2-2711)
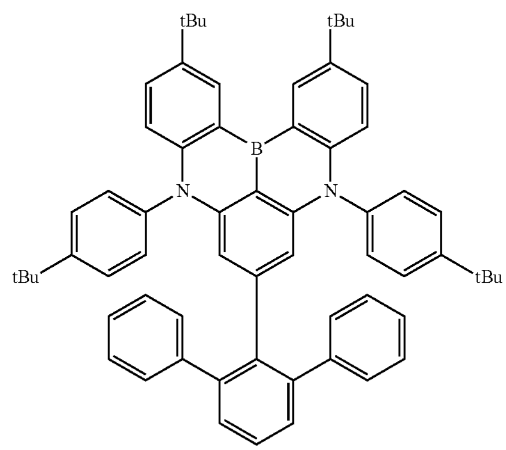
(2-2712)
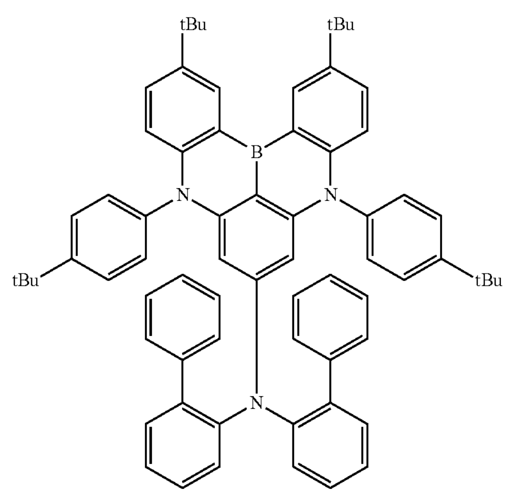

-continued
(2-2713)
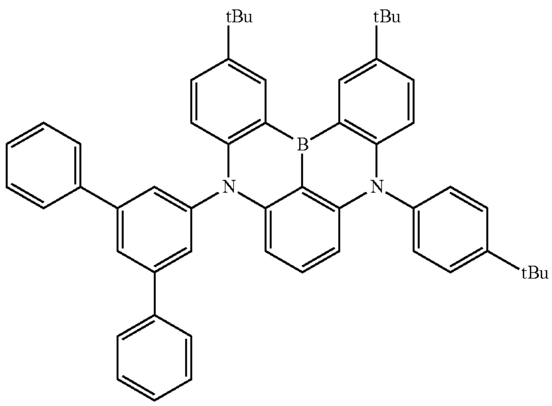
(2-2714)
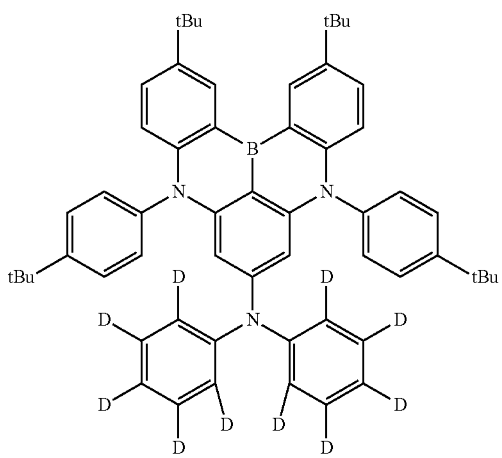
(2-2721)
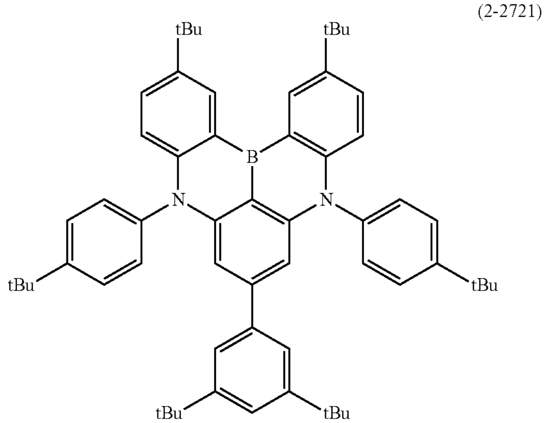
-continued
(2-2722)
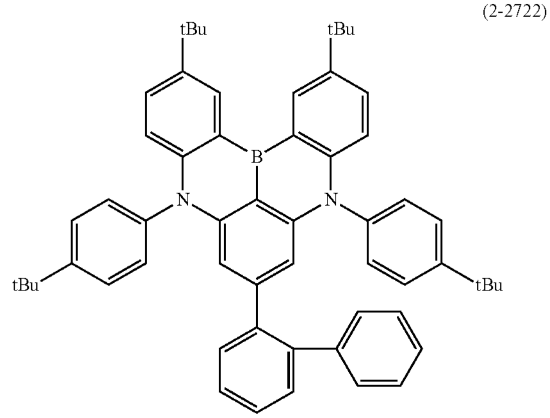
(2-2723)
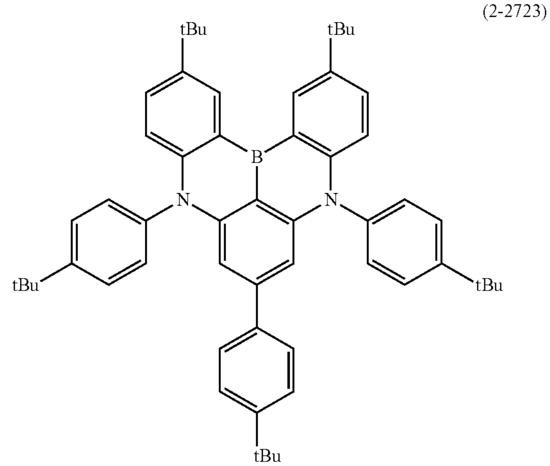
(2-2724)
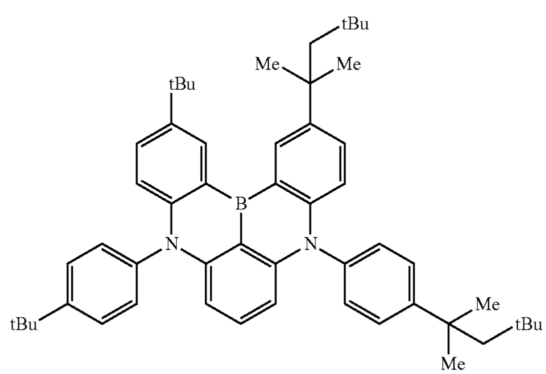
(2-2725)
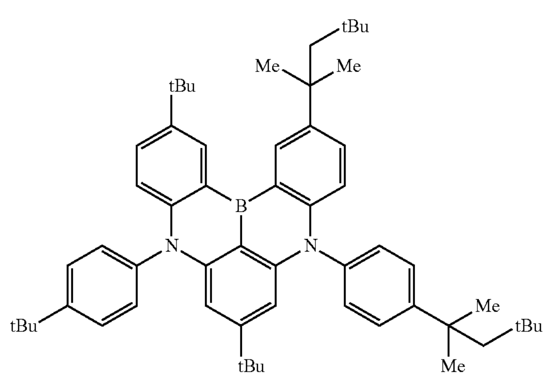

-continued
(2-2726)
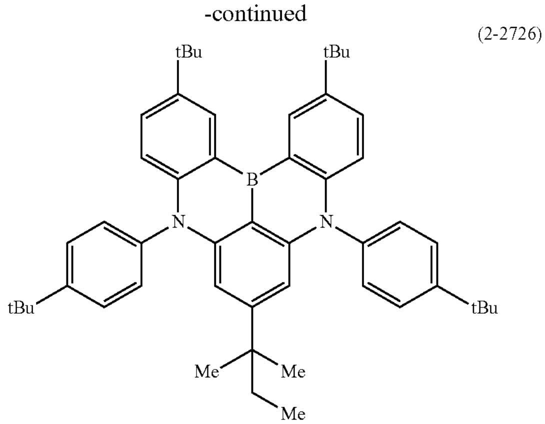
(2-2727)
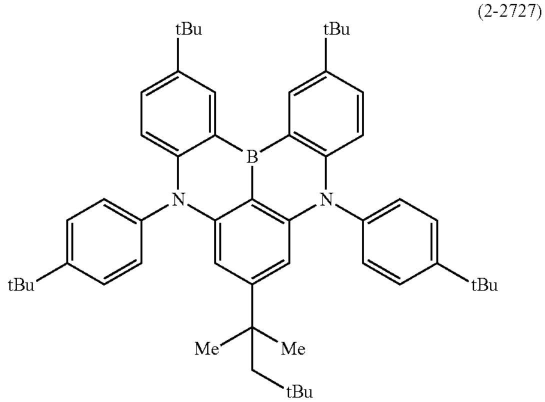
(2-2728)
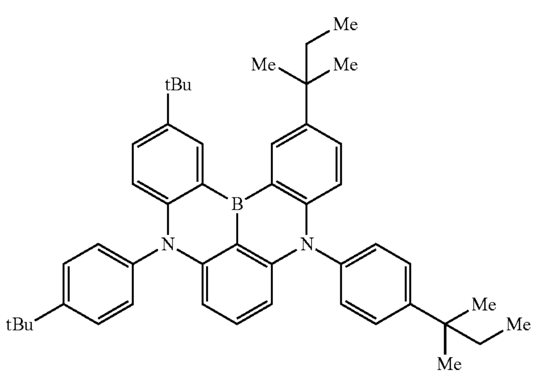
(2-2729)
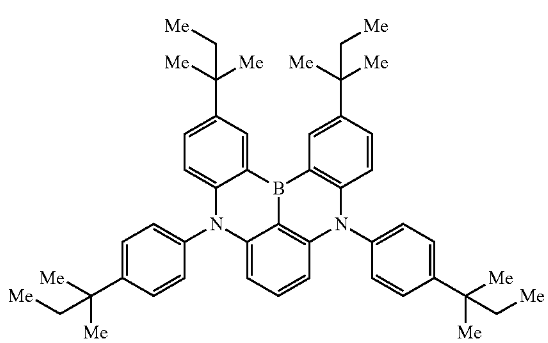
-continued
(2-2730)
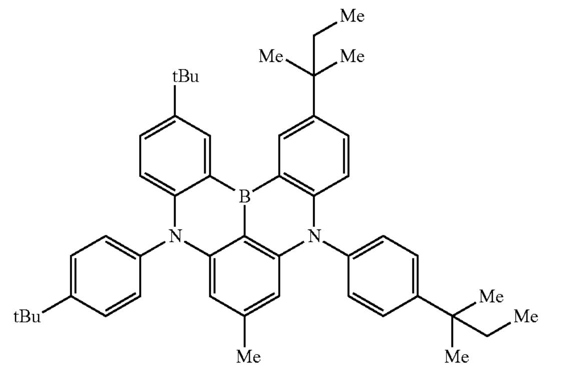
(2-2731)
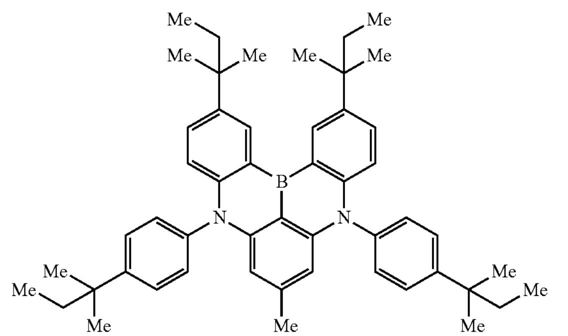
(2-2732)
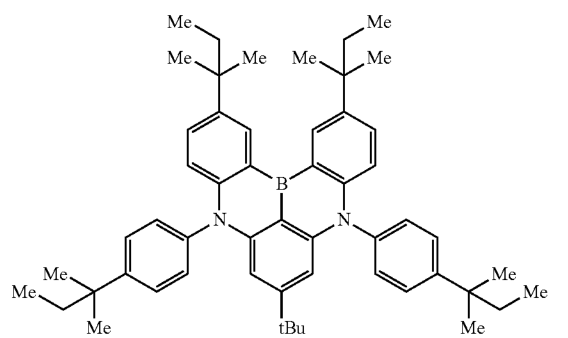
(2-2733)
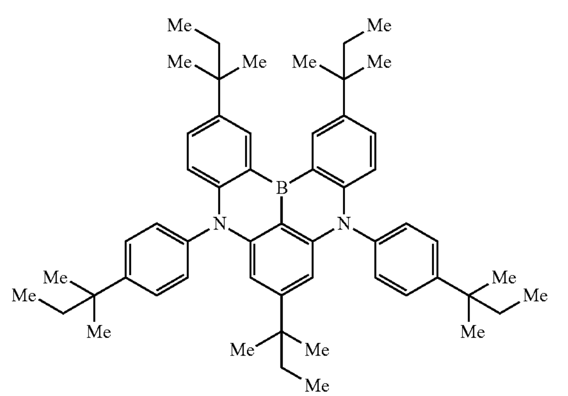

-continued
(2-2741)
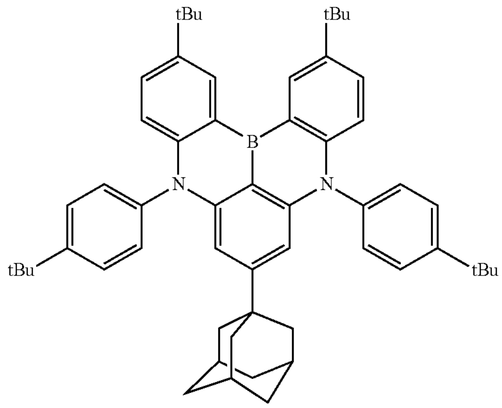
(2-2742)
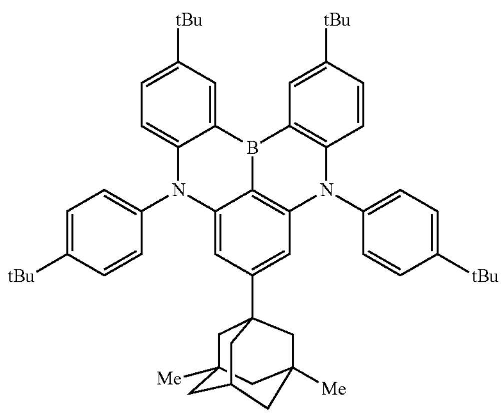
(2-2743)
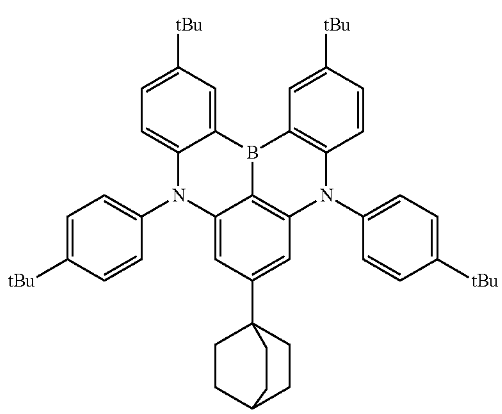
-continued
(2-2744)
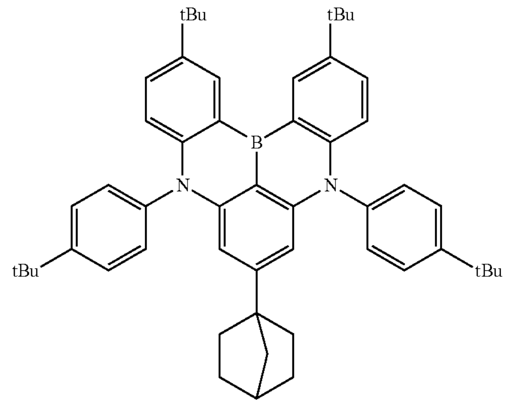
(2-2745)
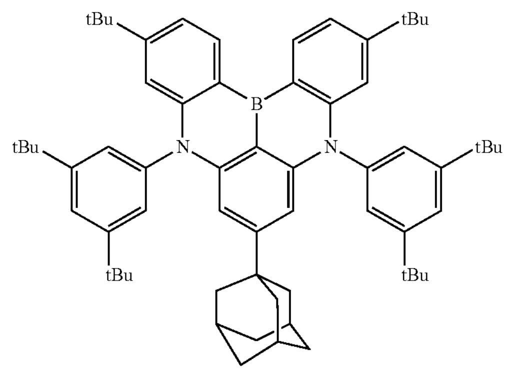
(2-5001)
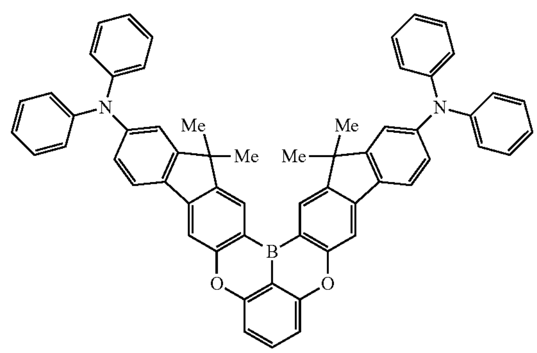
(2-5002)
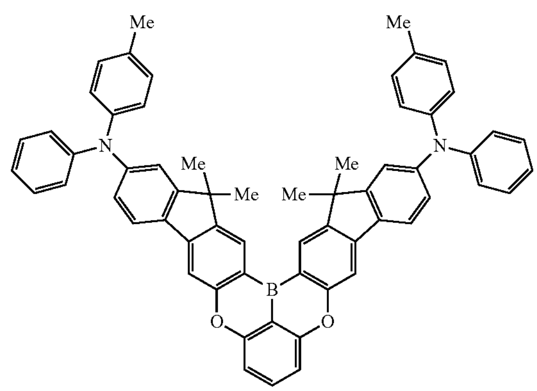

-continued
(2-5003)
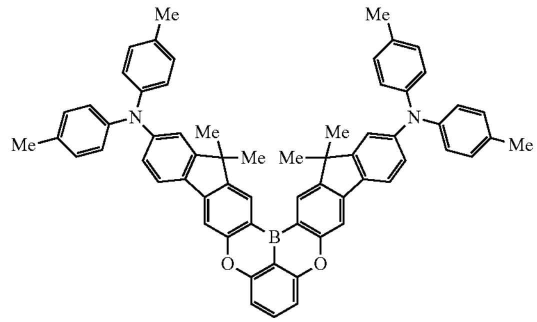
(2-5004)
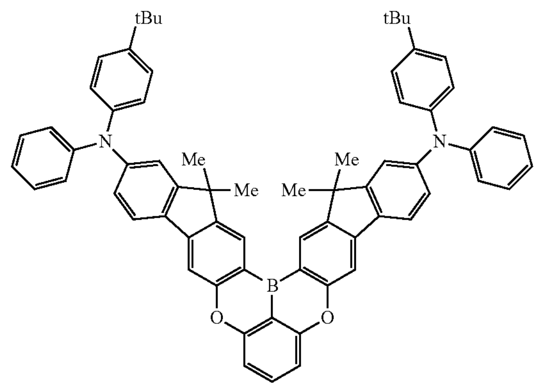
(2-5005)
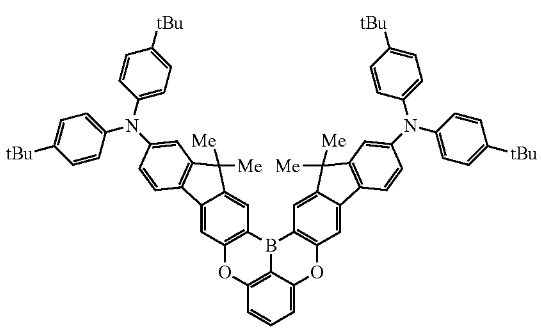
(2-5006)
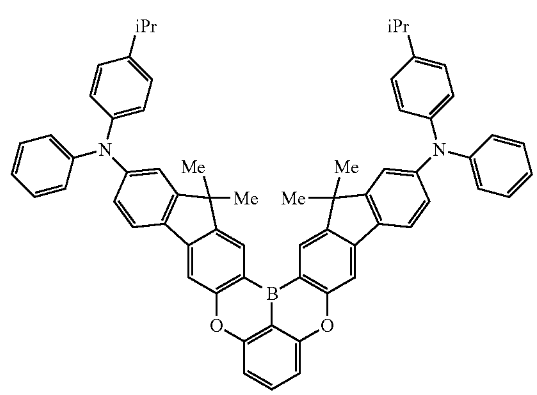
-continued
(2-5007)
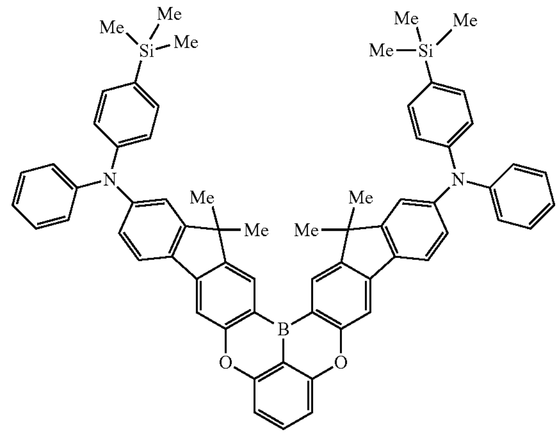
(2-5008)
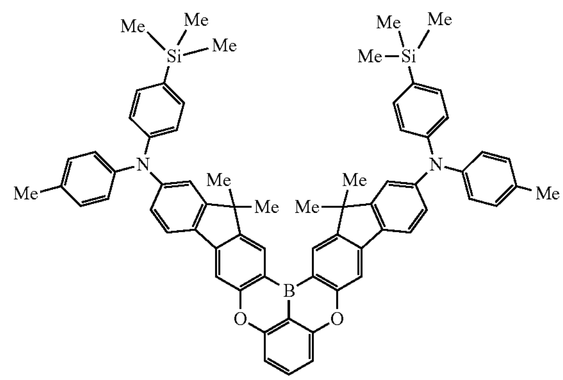
(2-5009)
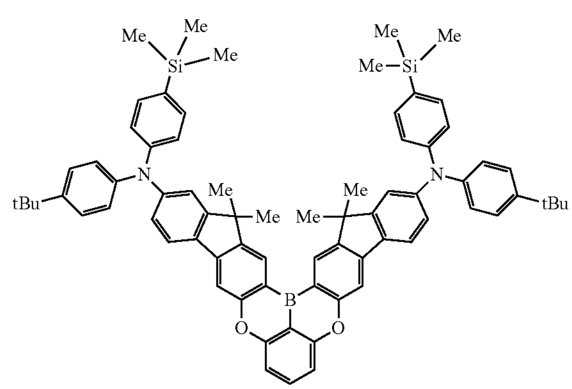

-continued
(2-5010)
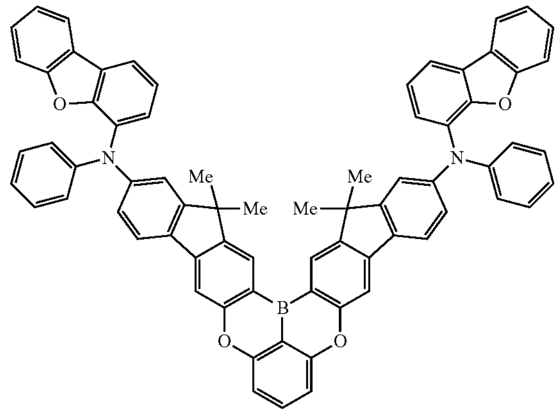
(2-5011)
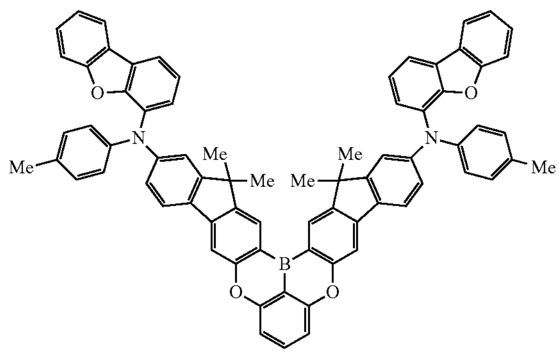
(2-5012)
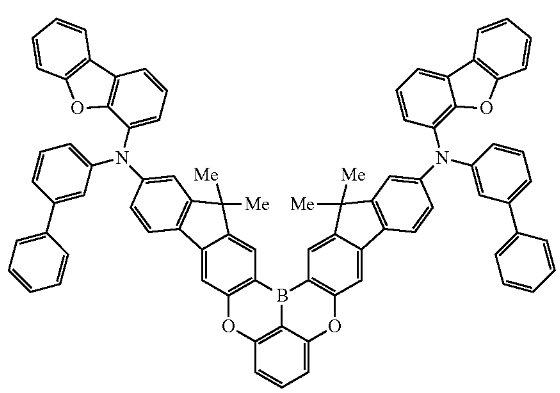
-continued
(2-5013)
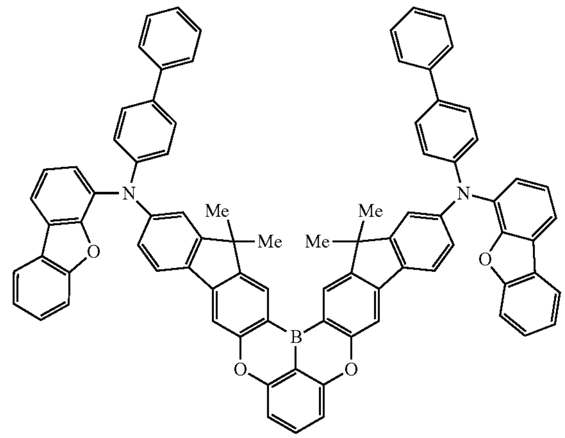
(2-5014)
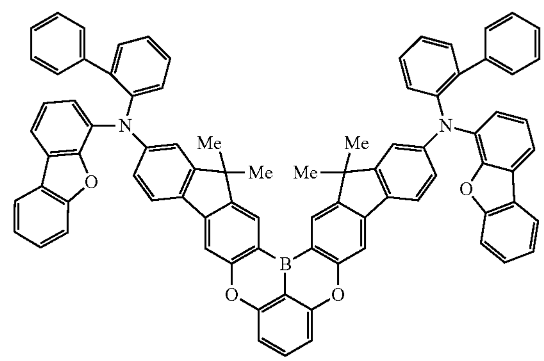
(2-5015)
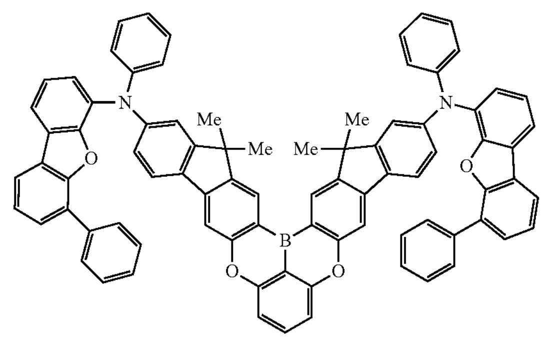
(2-5016)
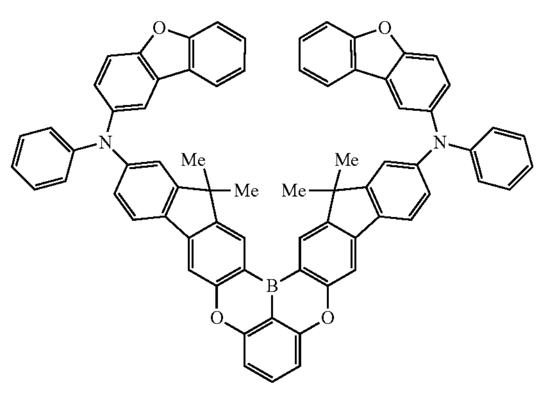

-continued
(2-5017)
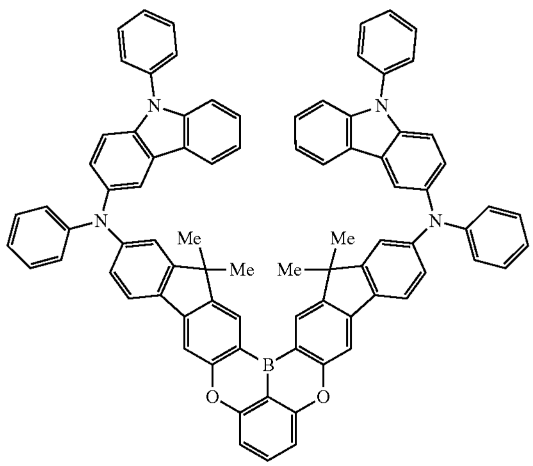
(2-5018)
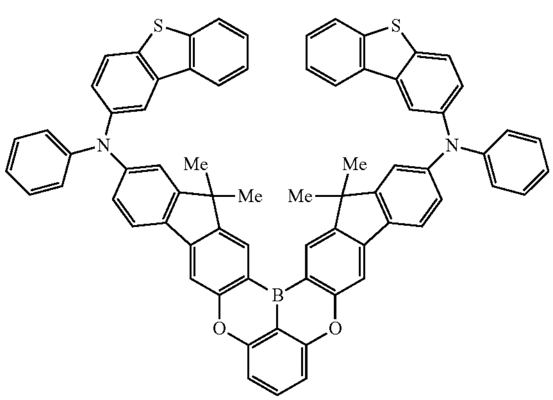
(2-5019)
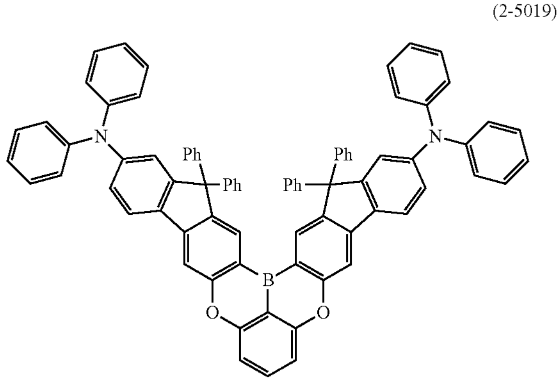
-continued
(2-5020)
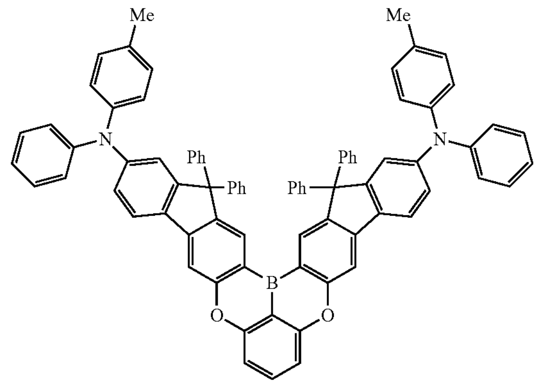
(2-5021)
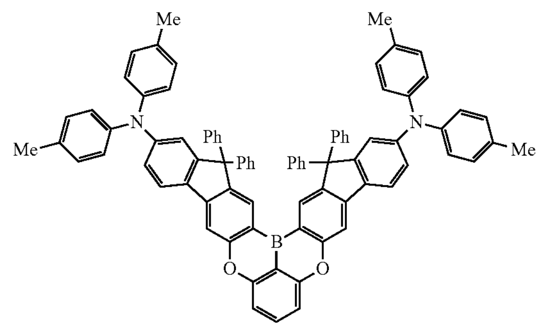
(2-5022)
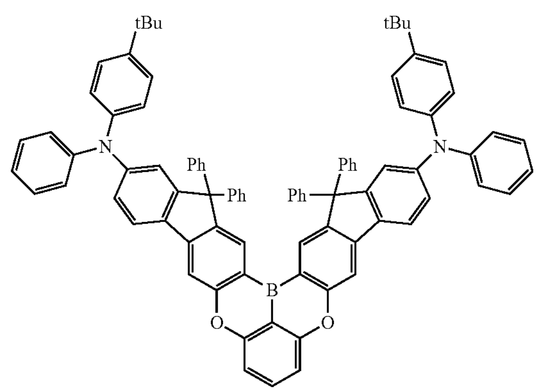
(2-5023)
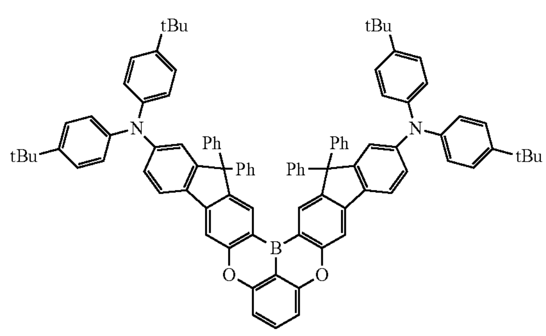

-continued
(2-5024)
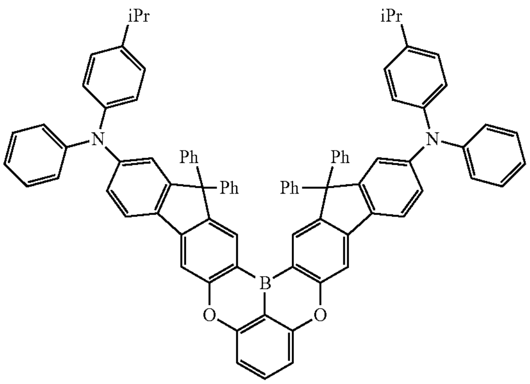
(2-5025)
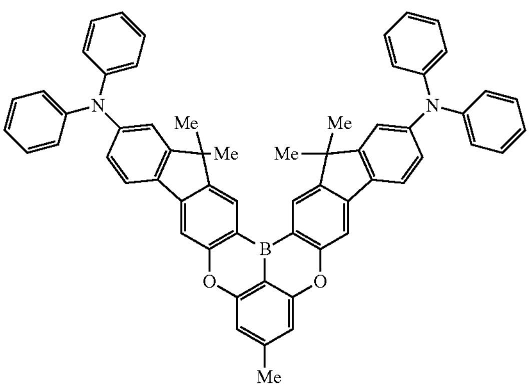
(2-5026)
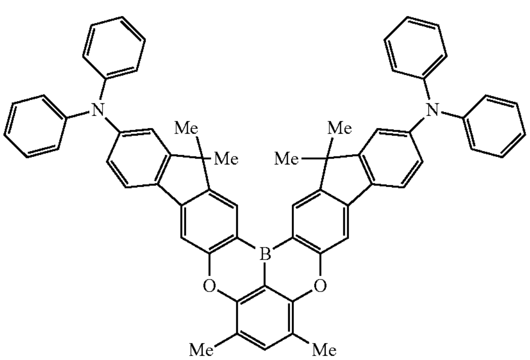
(2-5027)
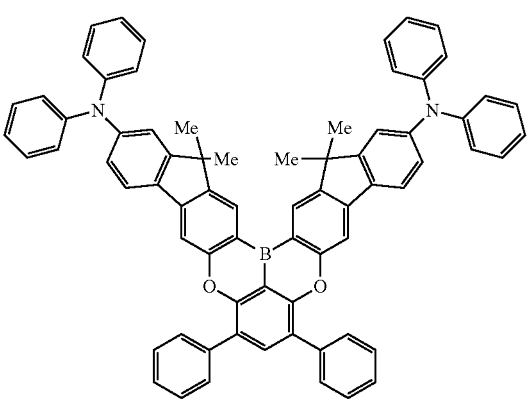
-continued
(2-5028)
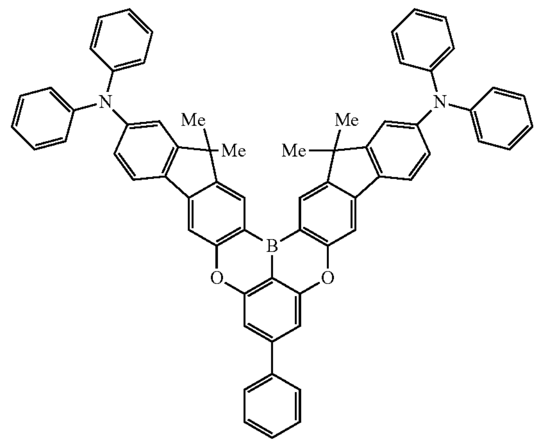
(2-5101)
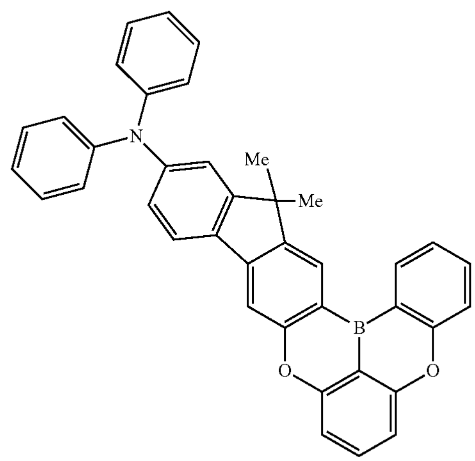
(2-5102)
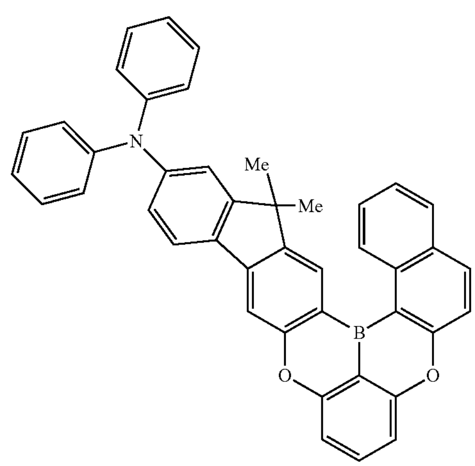

-continued
(2-5103)
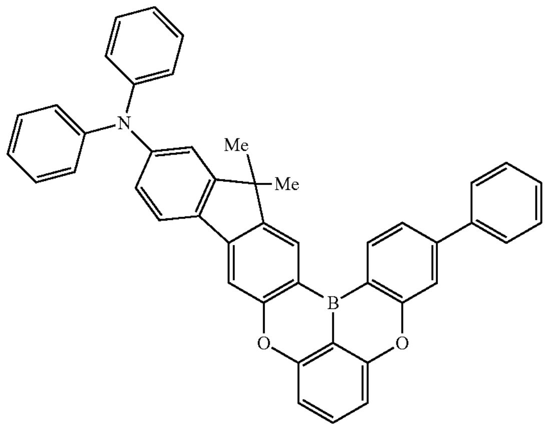
(2-5104)
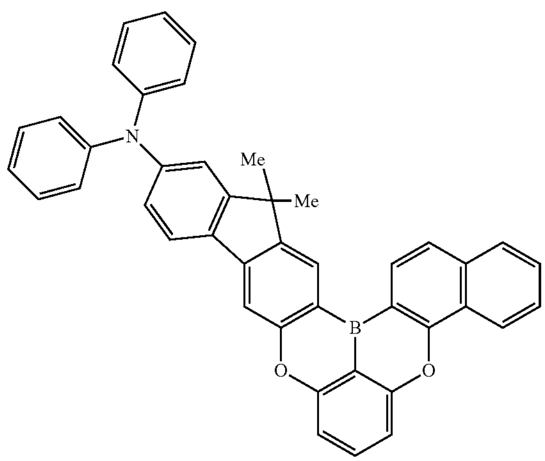
(2-5105)
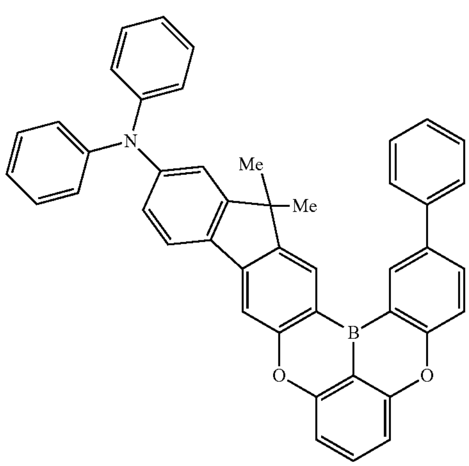
-continued
(2-5106)
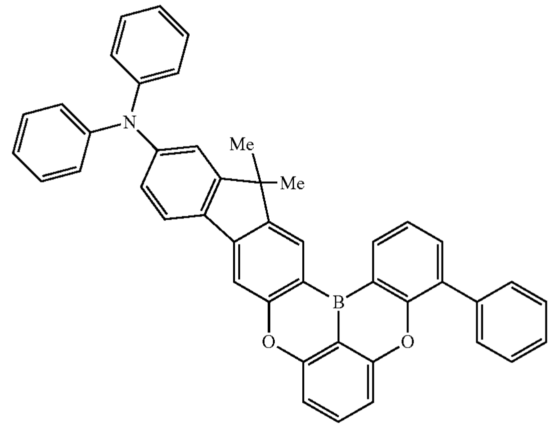
(2-5107)
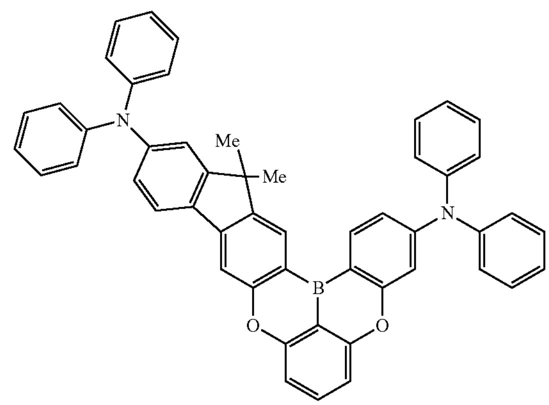
(2-5108)
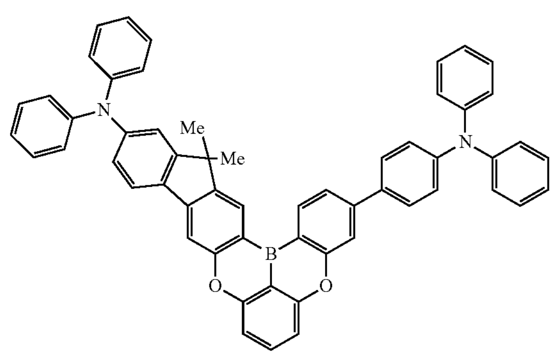

-continued
(2-5109)
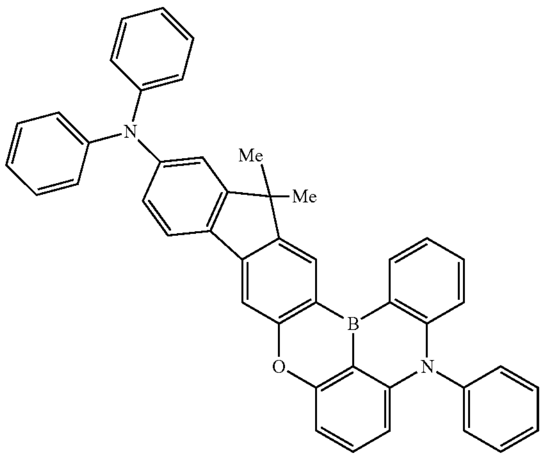
(2-5110)
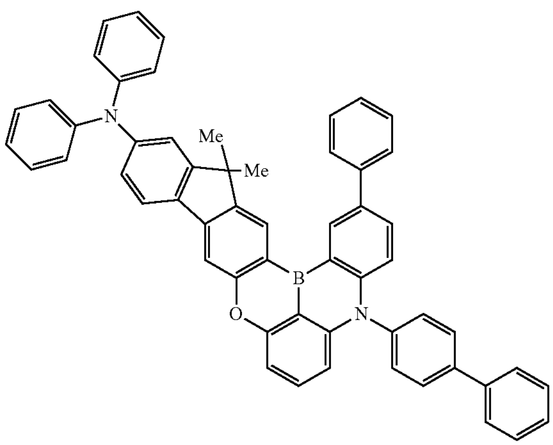
(2-5111)
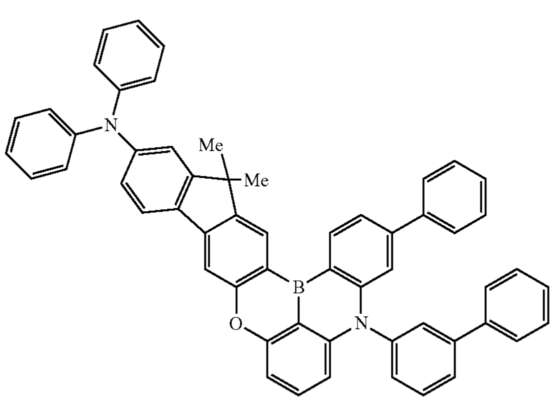
-continued
(2-5112)
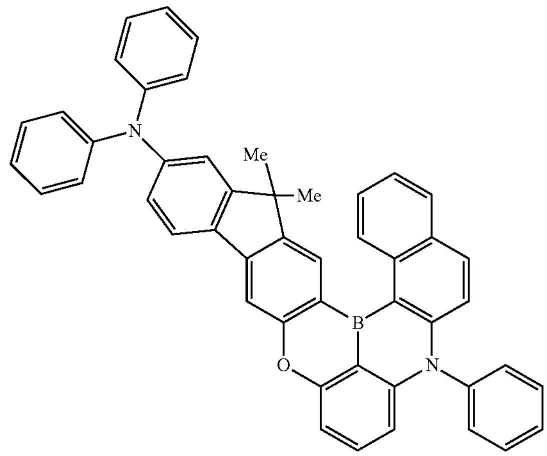
(2-5113)
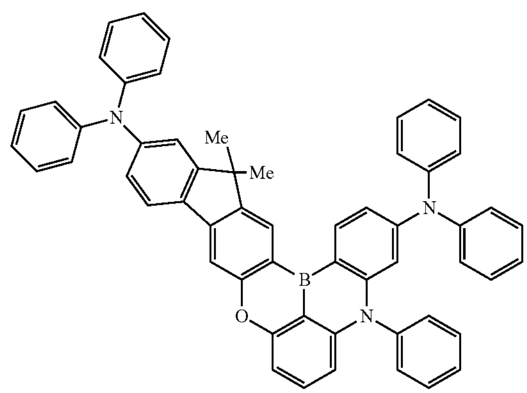
(2-5114)
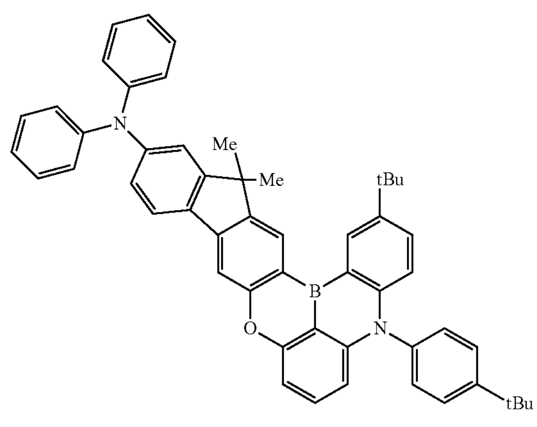

-continued
(2-5115)
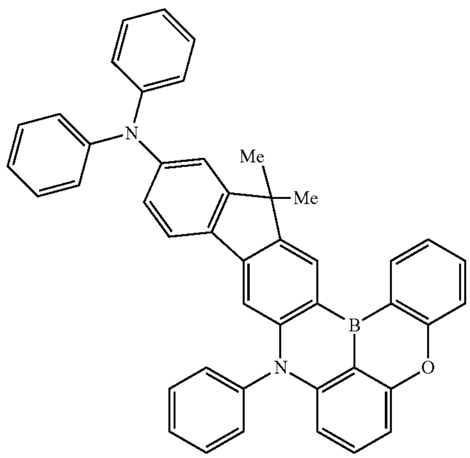
(2-5116)
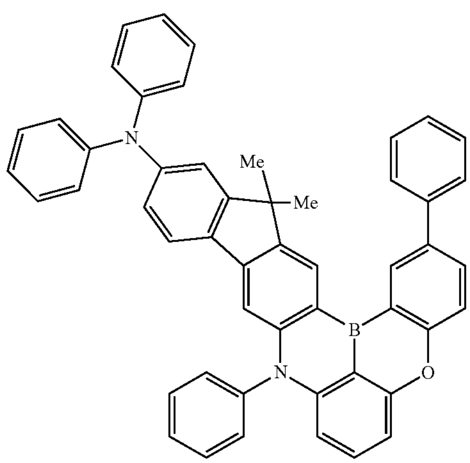
(2-5117)
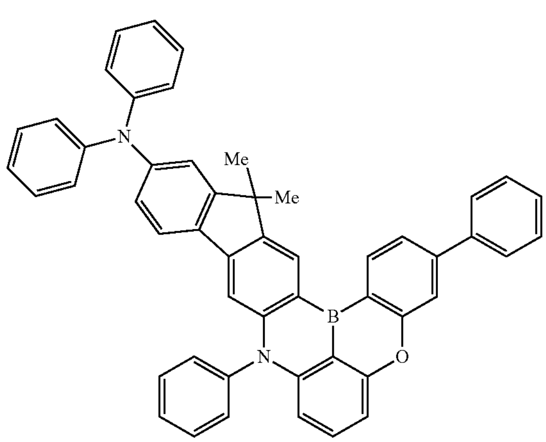
-continued
(2-5118)
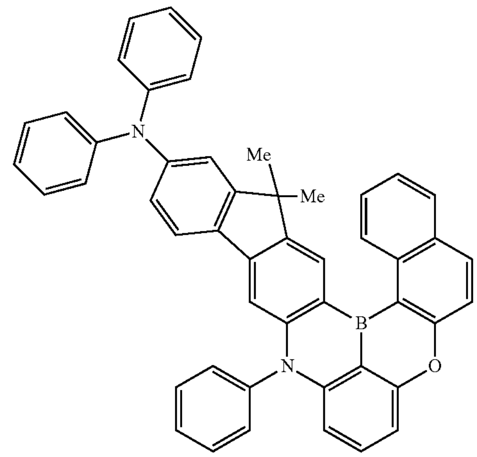
(2-5119)
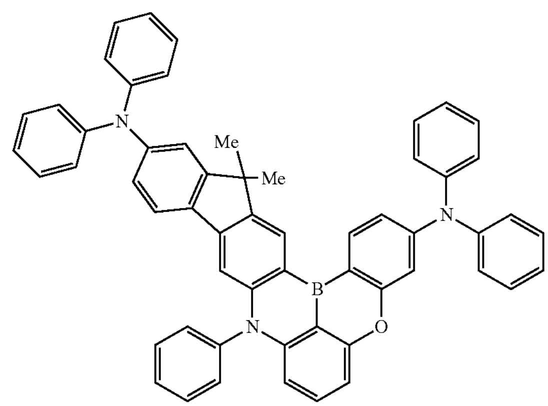
(2-5120)
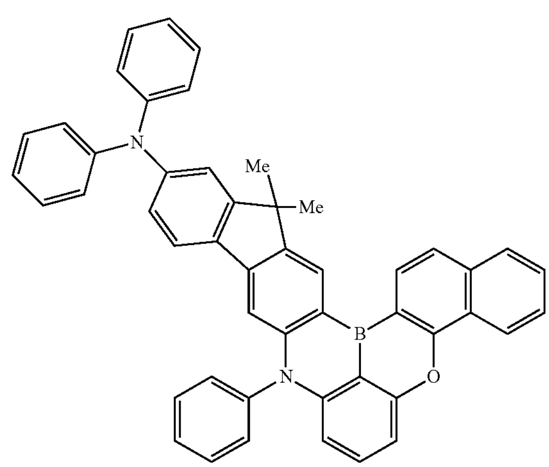

-continued (2-5121)

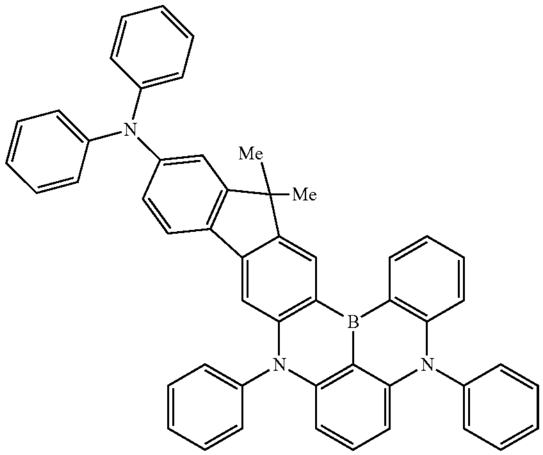

(2-5122)

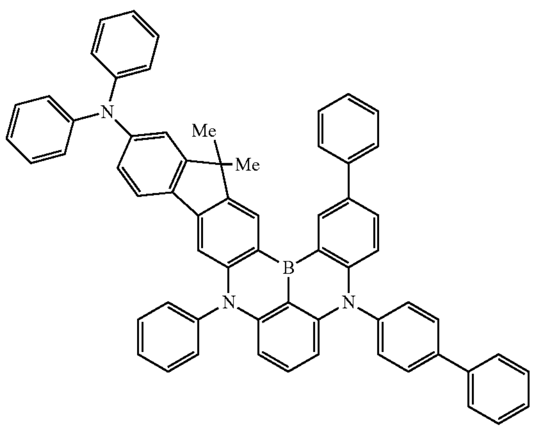

(2-5123)

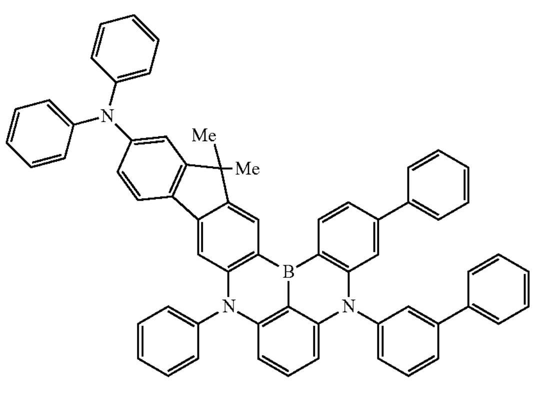

-continued (2-5124)

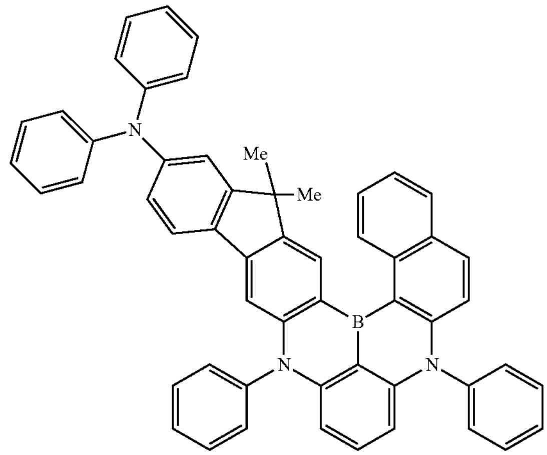

(2-5125)

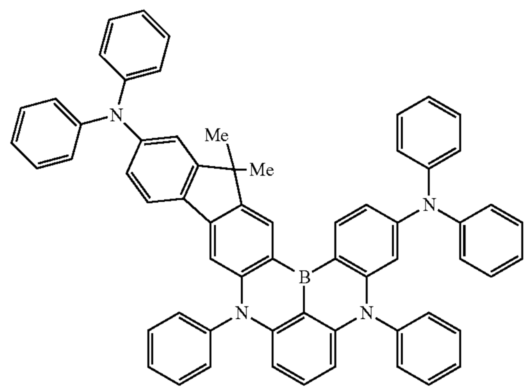

(2-5126)

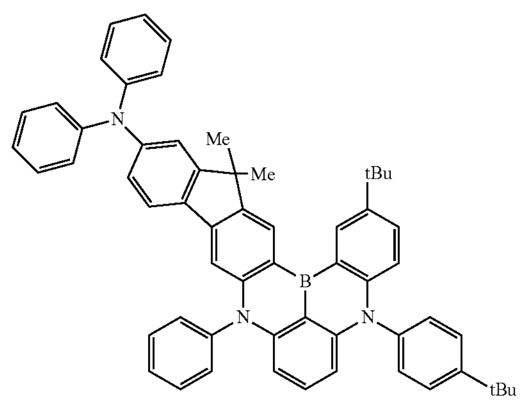

In regard to the compound represented by formula (2) and a multimer thereof, an increase in the T1 energy (an increase by approximately 0.01 to 0.1 eV) can be expected by introducing a phenyloxy group, a carbazolyl group or a diphenylamino group into the para-position with respect to central atom "B" (boron atom) in at least one of the ring A, ring B and ring C (ring a, ring b and ring c). Particularly, when a phenyloxy group is introduced into the para-position with respect to B (boron), the HOMO on the benzene rings which are the ring A, ring B and ring C (ring a, ring b and ring c) is more localized to the meta-position with respect to the boron, while the LUMO is localized to the ortho-position and the para-position with respect to the boron. Therefore, particularly, an increase in the T1 energy can be expected.

Specific examples of such a compound include compounds represented by the following formulas (2-4501) to (2-4522).

Note that R in the formulas represents an alkyl, and may be either linear or branched. Examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 to 4 carbon atoms) is particularly preferable. Other examples of R include phenyl.

Furthermore, "PhO—" represents a phenyloxy group, and this phenyl may be substituted by a linear or branched alkyl. For example, the phenyl may be substituted by a linear alkyl having 1 to 24 carbon atoms or a branched alkyl having 3 to 24 carbon atoms, an alkyl having 1 to 18 carbon atoms (a branched alkyl having 3 to 18 carbon atoms), an alkyl having 1 to 12 carbon atoms (a branched alkyl having 3 to 12 carbon atoms), an alkyl having 1 to 6 carbon atoms (a branched alkyl having 3 to 6 carbon atoms), or an alkyl having 1 to 4 carbon atoms (a branched alkyl having 3 or 4 carbon atoms).

(2-4501)

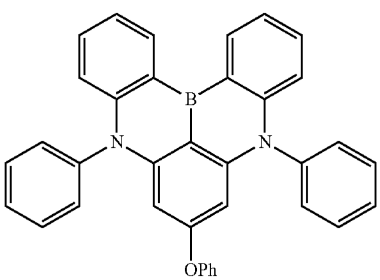

(2-4502)

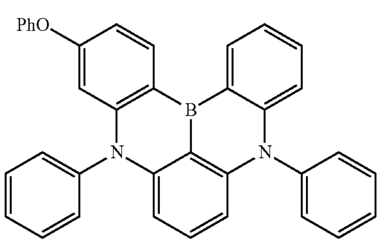

(2-4503)

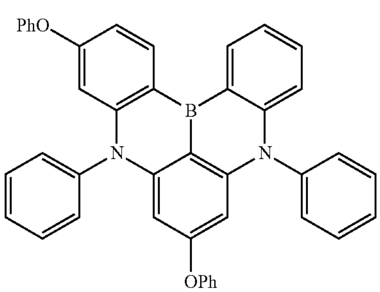

-continued (2-4504)

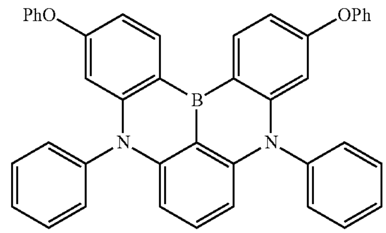

(2-4505)

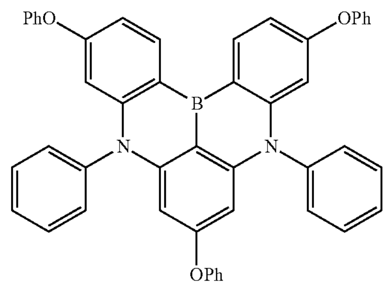

(2-4506)

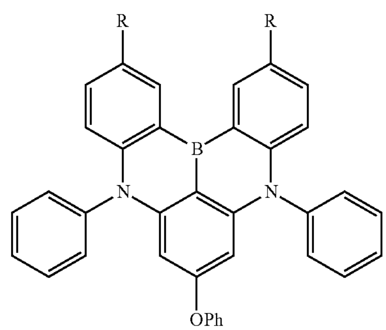

(2-4507)

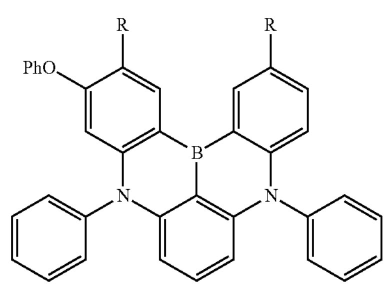

(2-4508)

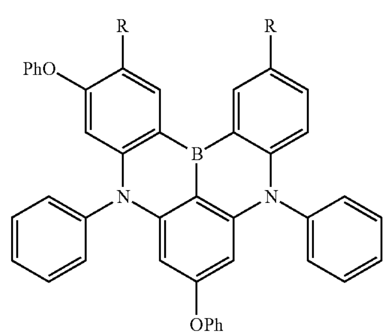

-continued
(2-4509)
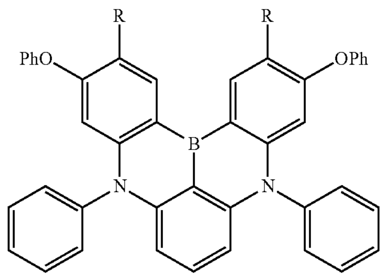
(2-4510)
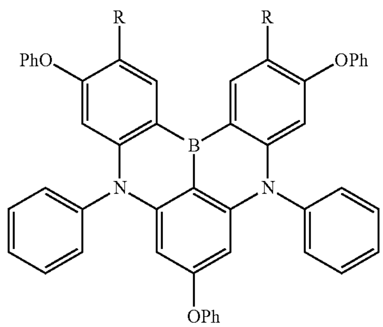
(2-4511)
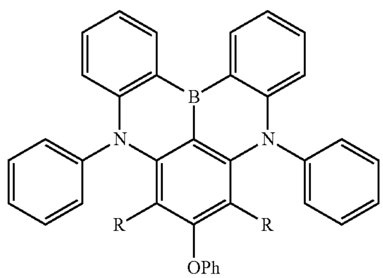
(2-4512)
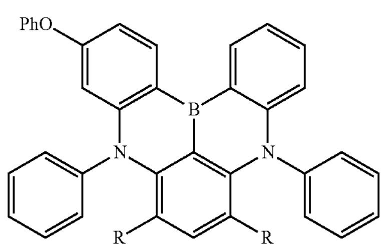
(2-4513)
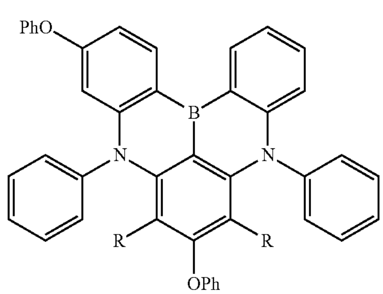
-continued
(2-4514)
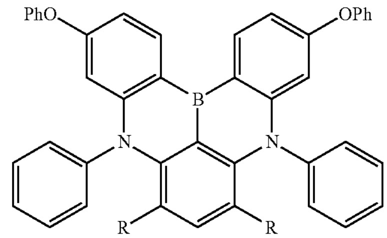
(2-4515)
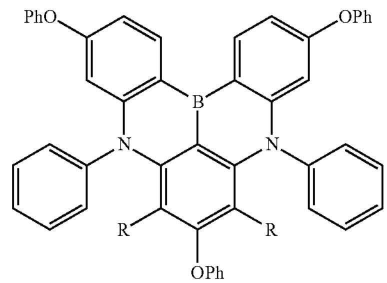
(2-4516)
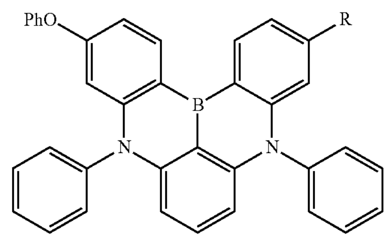
(2-4517)
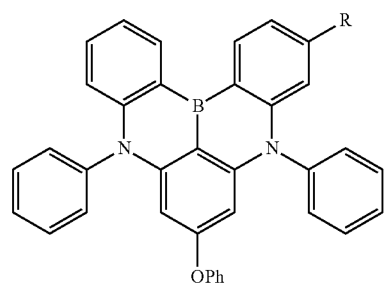
(2-4518)
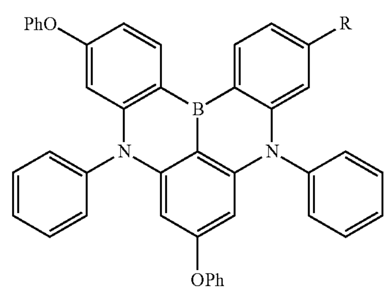
(2-4519)
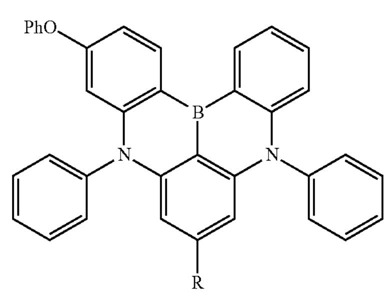

-continued (2-4520)

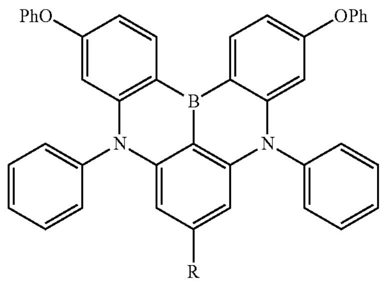

(2-4521)

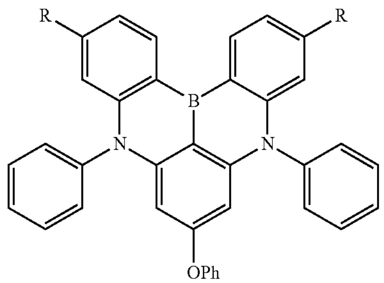

(2-4522)

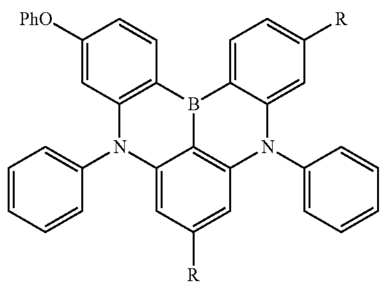

Specific examples of the compound represented by formula (2) and a multimer thereof include the above compounds in which at least one hydrogen atom in one or more aromatic rings in the compound is substituted by one or more alkyls or aryls. More preferable examples thereof include a compound substituted by 1 or 2 of alkyls each having 1 to 12 carbon atoms and aryls each having 6 to 10 carbon atoms.

Specific examples thereof include the following compounds. R's in the following formulas each independently represent an alkyl having 1 to 12 carbon atoms or an aryl having 6 to 10 carbon atoms, and preferably an alkyl or phenyl having 1 to 4 carbon atoms, and n's each independently represent 0 to 2, and preferably 1.

(2-401-R)

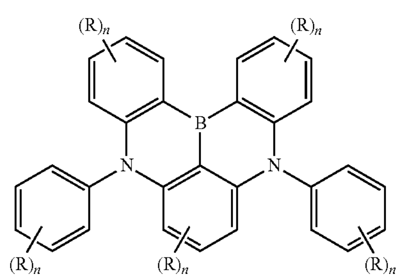

-continued (2-411-R)

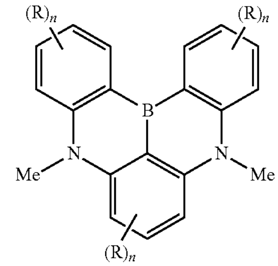

(2-447-R)

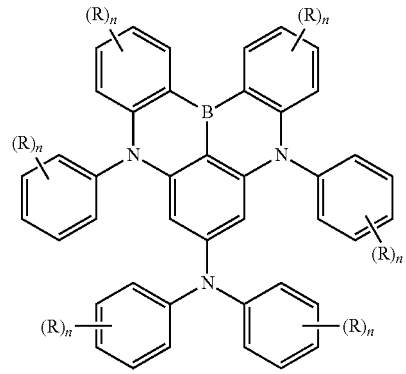

(2-1152-R)

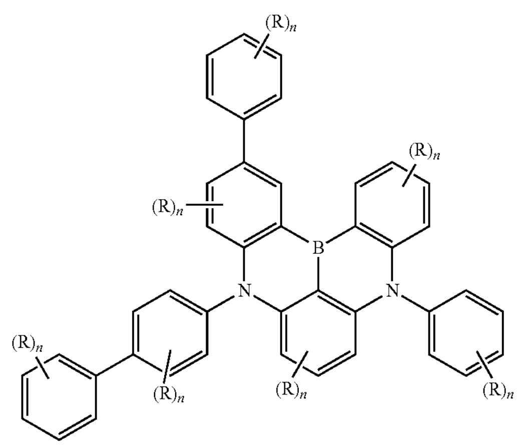

(2-2623-R)

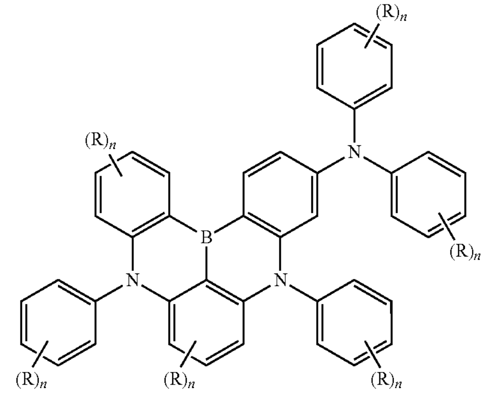

-continued
(2-422-R)
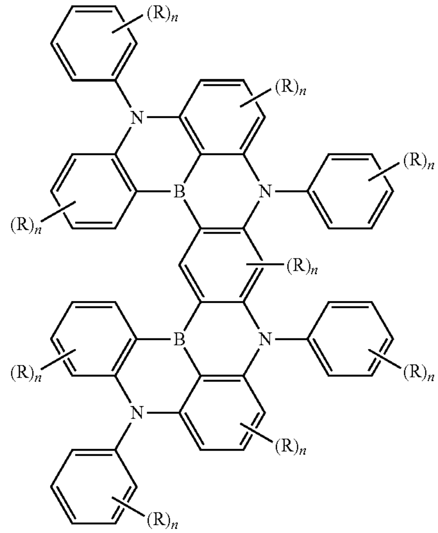
(2-1159-R)
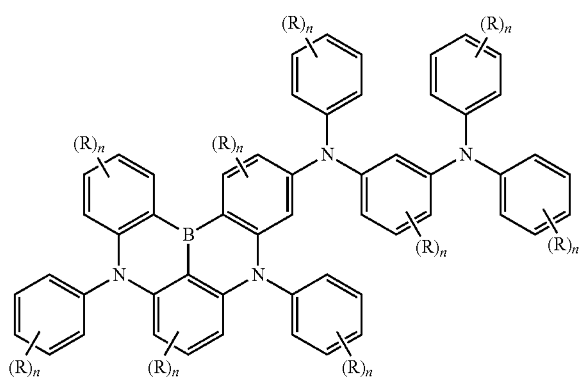
(2-2657-R)
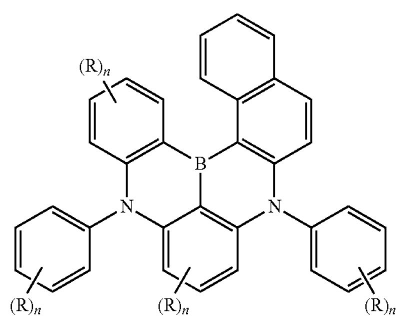
(2-2665-R)
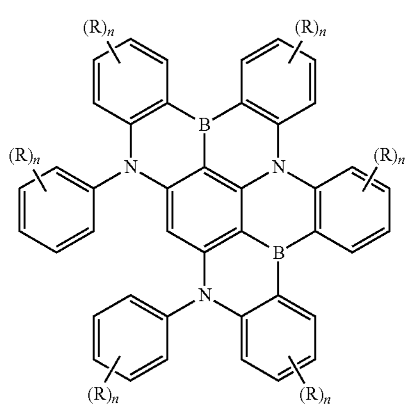
-continued
(2-2676-R)
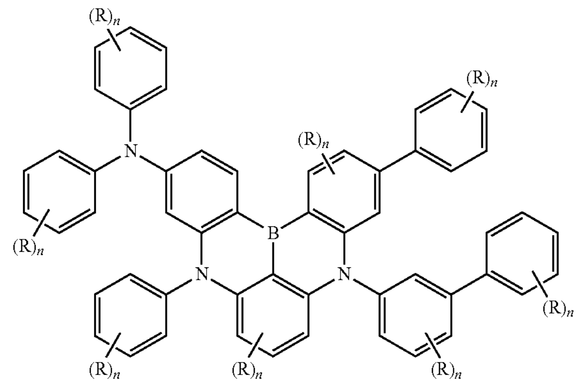
(2-2679-R)
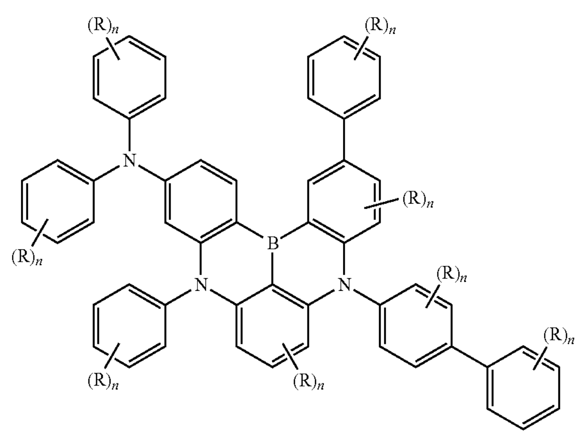
(2-2680-R)
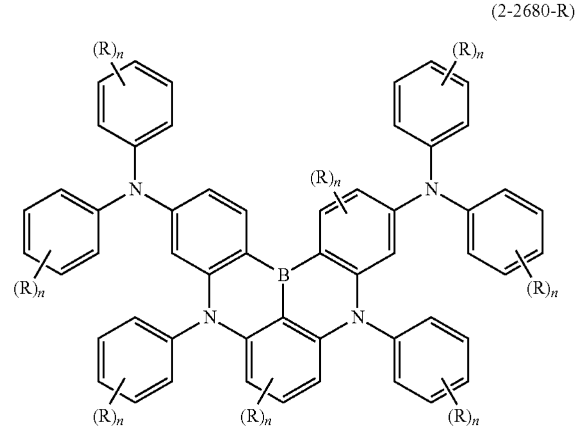

-continued (2-2681-R)

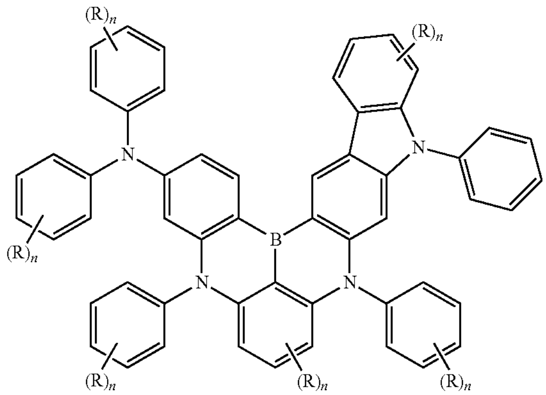

(2-2682-R)

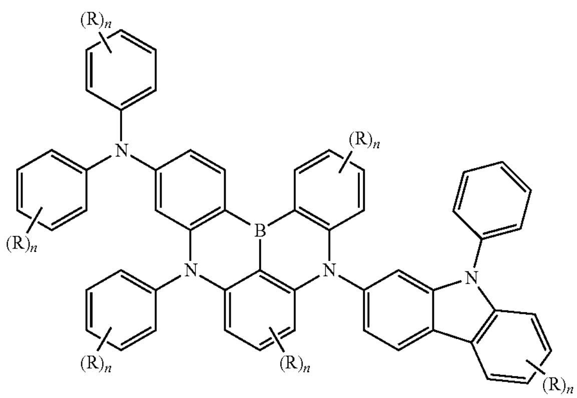

(2-2683-R)

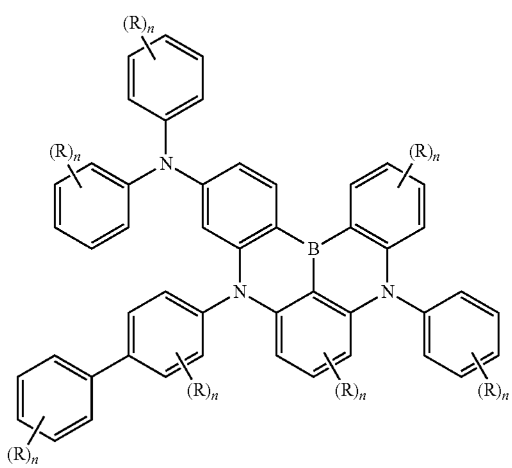

(2-2691-R)

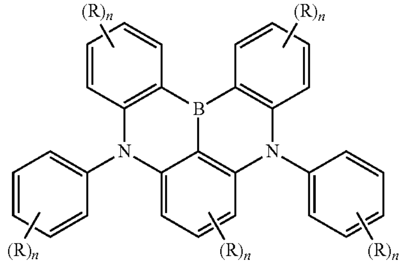

-continued (2-2699-R)

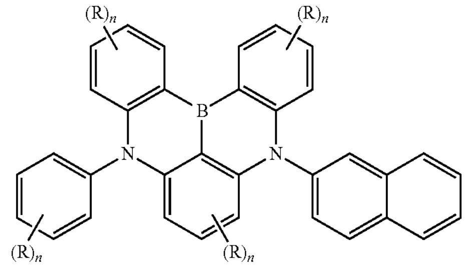

Furthermore, specific examples of the compound represented by formula (2) and a multimer thereof include a compound in which at least one hydrogen atom in one or more phenyl groups or one phenylene group in the compound is substituted by one or more alkyls each having 1 to 4 carbon atoms, and preferably one or more alkyls each having 1 to 3 carbon atoms (preferably one or more methyl groups). More preferable examples thereof include a compound in which the hydrogen atoms at the ortho-positions of one phenyl group (both of the two sites, preferably any one site) or the hydrogen atoms at the ortho-positions of one phenylene group (all of the four sites at maximum, preferably any one site) are substituted by methyl groups.

By substitution of at least one hydrogen atom at the ortho-position of a phenyl group or a p-phenylene group at a terminal in the compound by a methyl group or the like, adjacent aromatic rings are likely to intersect each other perpendicularly, and conjugation is weakened. As a result, triplet excitation energy ($E_T$) can be increased.

4. Method for Manufacturing a Polycyclic Aromatic Compound Represented by Formula (2) and Multimer Thereof In regard to the polycyclic aromatic compound represented by general formula (2) or (2') and a multimer thereof, basically, an intermediate is manufactured by first bonding the ring A (ring a), ring B (ring b) and ring C (ring c) with bonding groups (groups containing $X^1$ or $X^2$) (first reaction), and then a final product can be manufactured by bonding the ring A (ring a), ring B (ring b) and ring C (ring c) with bonding groups (groups containing a central atom "B" (boron)) (second reaction).

In the first reaction, a general reaction such as a Buchwald-Hartwig reaction can be utilized in a case of an amination reaction. In the second reaction, a Tandem Hetero-Friedel-Crafts reaction (continuous aromatic electrophilic substitution reaction, the same hereinafter) can be utilized. In addition, in the schemes (1) to (13) described later, although the case of ">N—R" as $X^1$ and $X^2$ is described, the same applies to the case of ">O". Note that each code in the structural formulas the following schemes (1) to (13) are defined in the same manner as those in formulas (2) and (2').

As illustrated in the following schemes (1) and (2), the second reaction is a reaction for introducing a central atom "B" (boron) which bonds the ring A (ring a), ring B (ring b) and ring C (ring c). First, a hydrogen atom between $X^1$ and $X^2$ (>N—R) is ortho-metalated with n-butyllithium, sec-butyllithium, t-butyllithium, or the like. Subsequently, boron trichloride, boron tribromide, or the like is added thereto to perform lithium-boron metal exchange, and then a Brønsted base such as N,N-diisopropylethylamine is added thereto to induce a Tandem Bora-Friedel-Crafts reaction. Thus, a desired product can be obtained. In the second reaction, a Lewis acid such as aluminum trichloride may be added in order to accelerate the reaction.

Scheme (1)

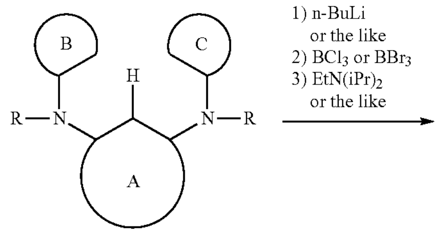

(Intermediate)

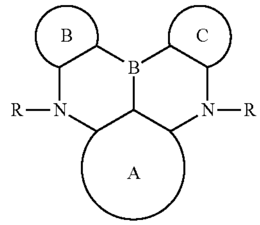

General formula (2) type compound

Scheme (2)

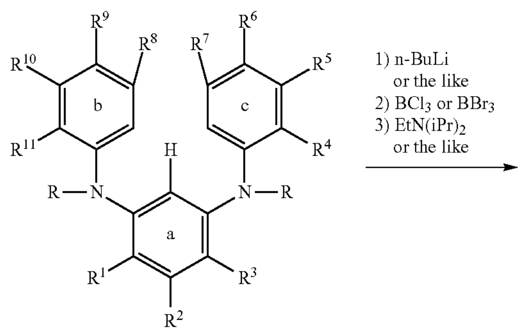

(Intermediate)

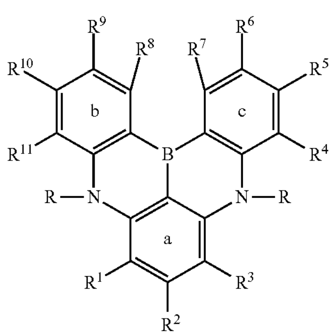

General formula (2′) type compound

Incidentally, the scheme (1) or (2) mainly illustrates a method for manufacturing a compound represented by general formula (2) or (2'). However, a multimer thereof can be manufactured using an intermediate having a plurality of ring A's (ring a's), ring B's (ring b's) and ring C's (ring c's). More specifically, the manufacturing method will be described by the following schemes (3) to (5). In this case, a desired product may be obtained by increasing the amount of the reagent used therein such as butyllithium to a double amount or a triple amount.

Scheme 3

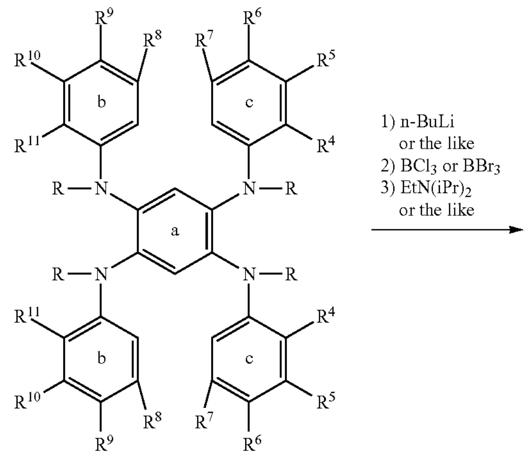

(Intermediate)

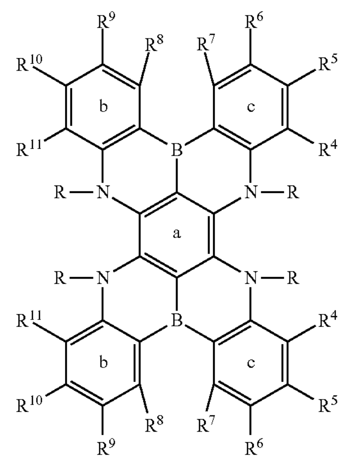

Scheme (4)

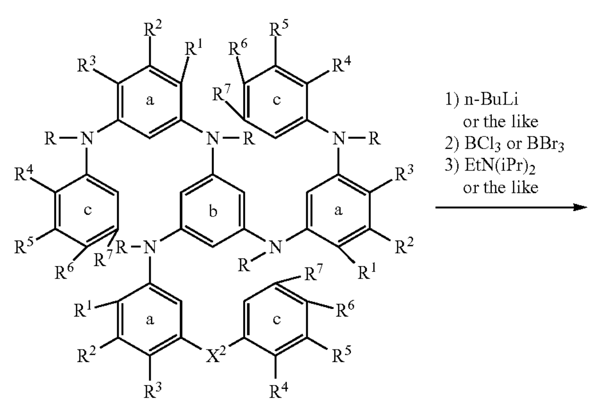

(Intermediate)

-continued

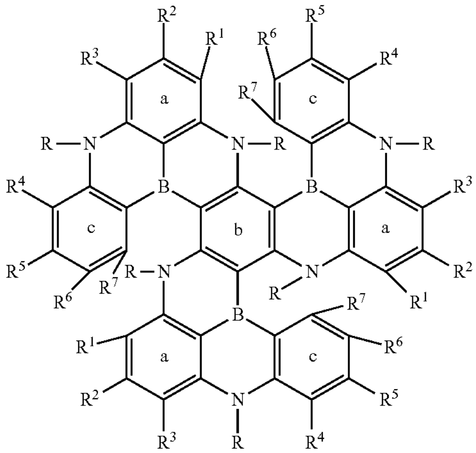

Scheme (5)

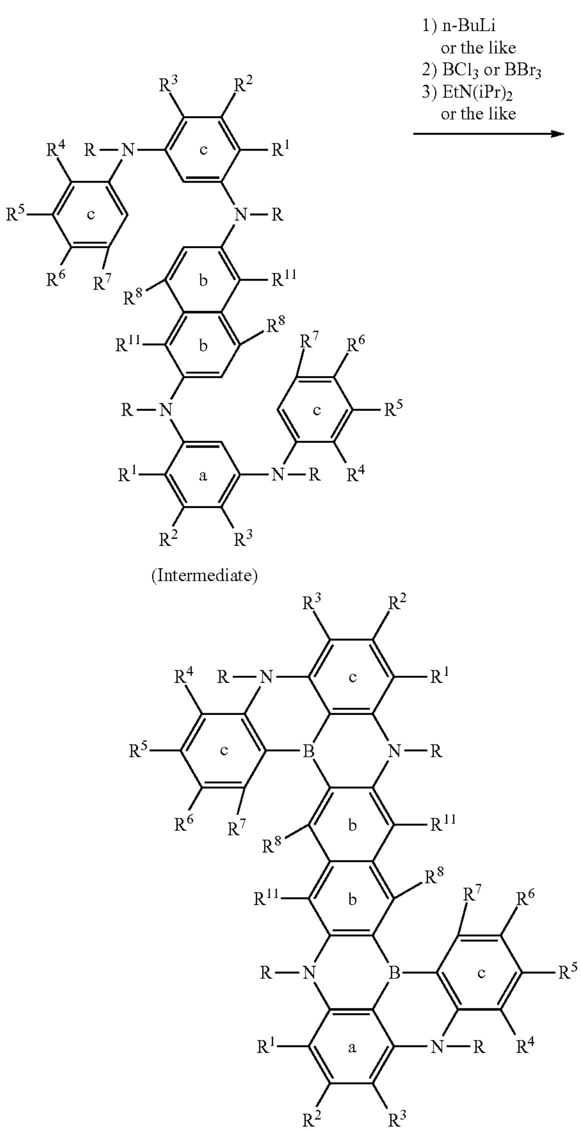

In the above schemes, lithium is introduced into a desired position by ortho-metalation. However, lithium can also be introduced into a desired position by halogen-metal exchange by introducing a bromine atom or the like to a position to which it is wished to introduce lithium, as in the following schemes (6) and (7).

Scheme (6)

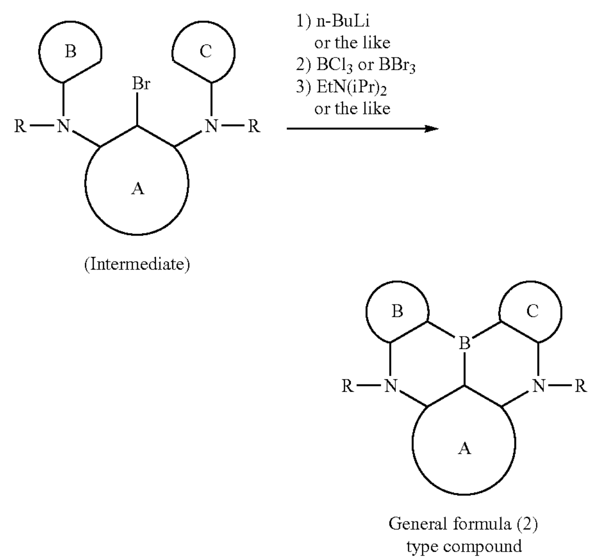

Scheme (7)

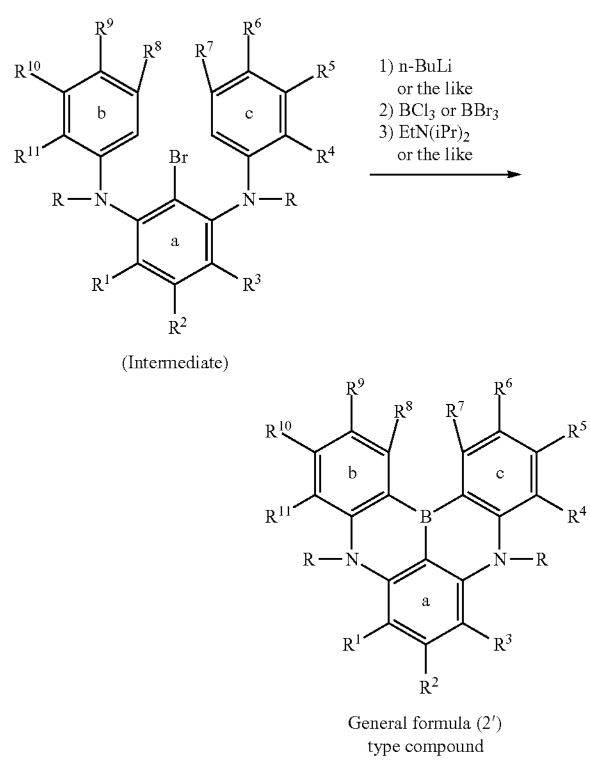

Furthermore, also in regard to the method for manufacturing a multimer described in scheme (3), a lithium atom can be introduced to a desired position also by halogen-metal exchange by introducing a halogen atom such as a bromine atom or a chlorine atom to a position to which it is wished to introduce a lithium atom, as in the above schemes (6) and (7) (the following schemes (8), (9), and (10)).
-continued
Scheme (8)
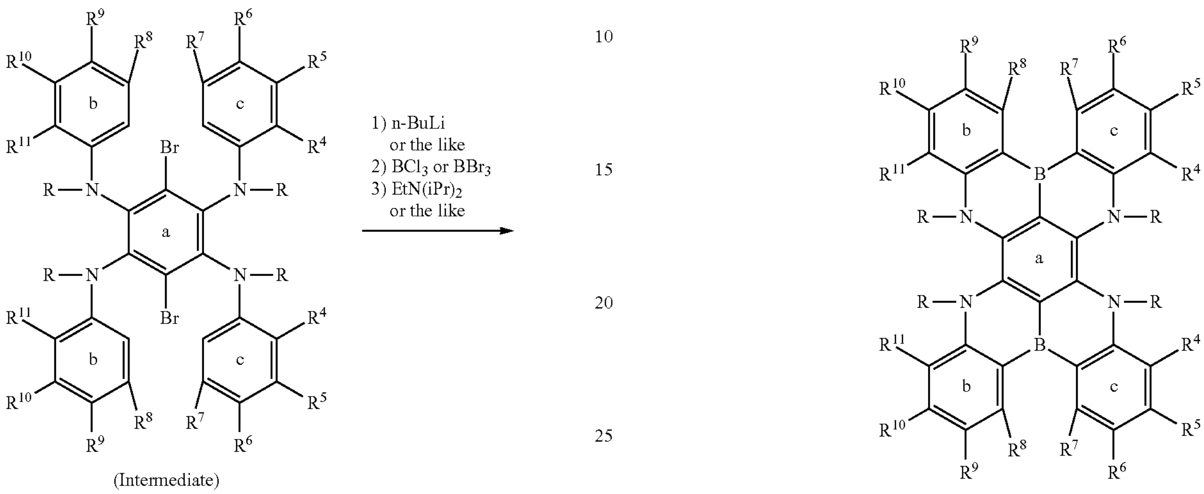
(Intermediate)
Scheme (9)
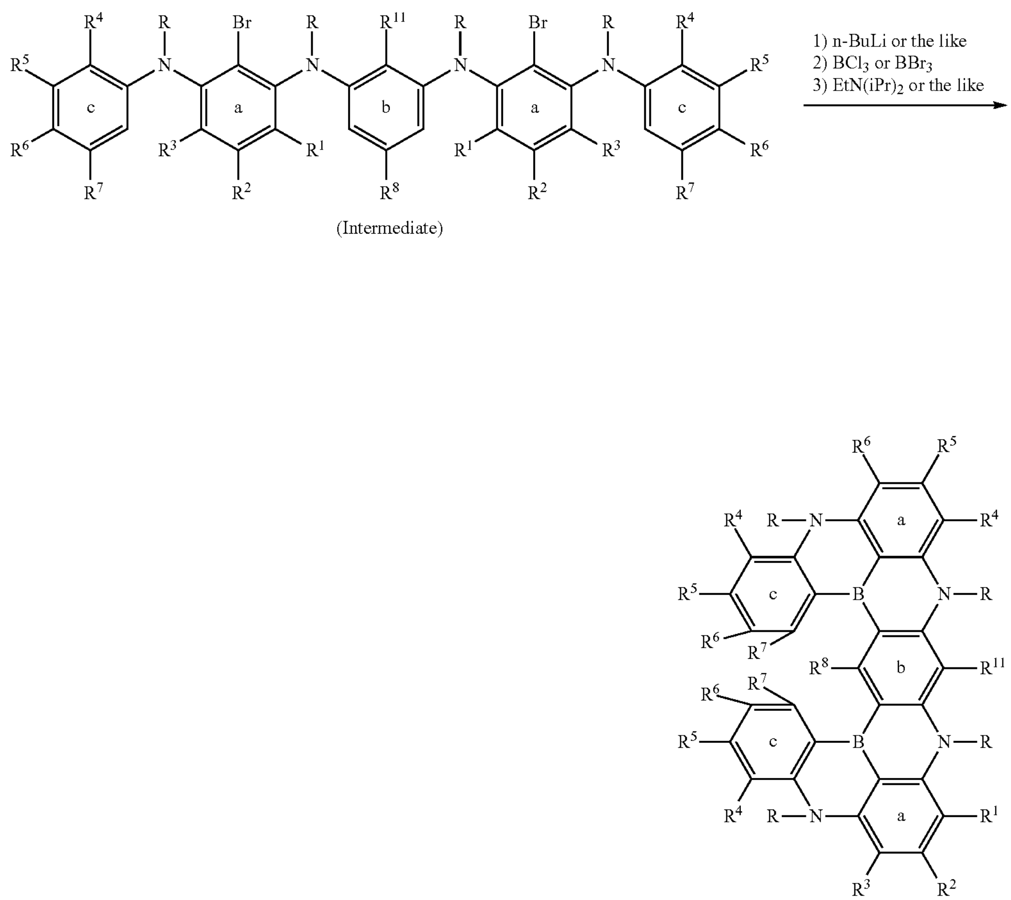
(Intermediate)

Scheme (10)

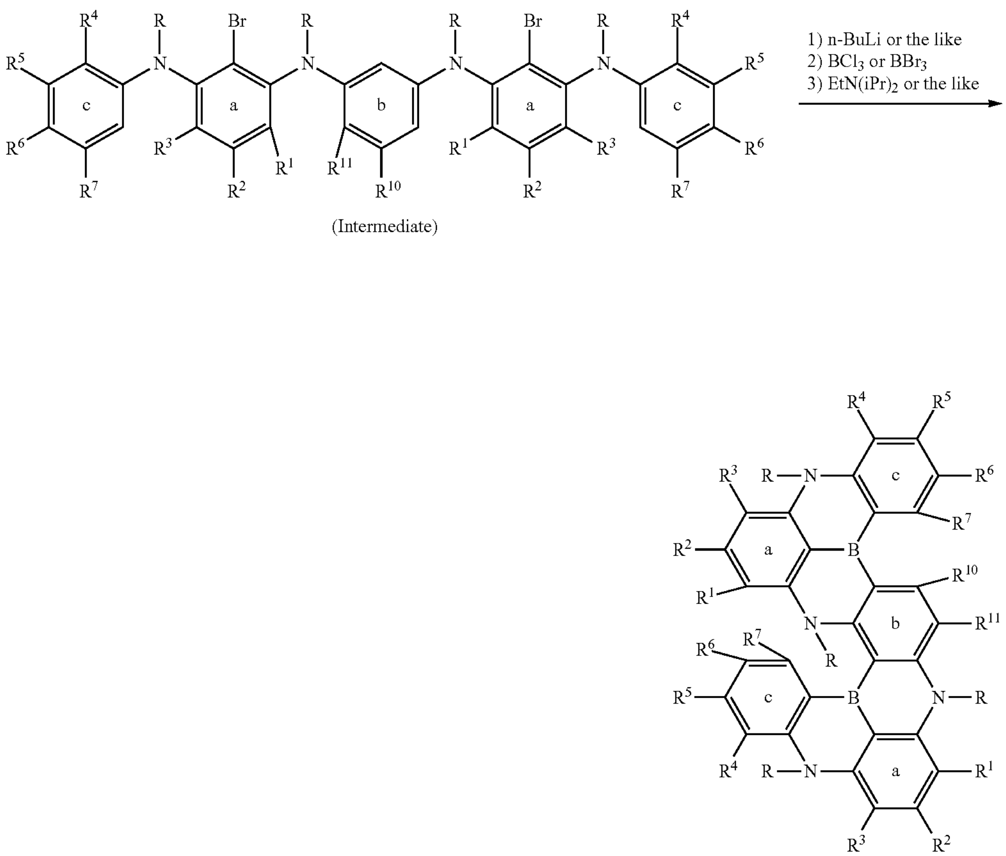

According to this method, a desired product can also be synthesized even in a case in which ortho-metalation cannot be achieved due to the influence of substituents, and therefore the method is useful.

Specific examples of the solvent used in the above reactions include t-butylbenzene and xylene.

By appropriately selecting the above synthesis method and appropriately selecting raw materials to be used, it is possible to synthesize a compound having a substituent at a desired position and a multimer thereof.

Furthermore, in general formula (2'), adjacent groups among the substituents $R^1$ to $R^{11}$ of the ring a, ring b and ring c may be bonded to each other to form an aryl ring or a heteroaryl ring together with the ring a, ring b or ring c, and at least one hydrogen atom in the ring thus formed may be substituted by an aryl or a heteroaryl. Therefore, in a compound represented by general formula (2'), a ring structure constituting the compound changes as represented by formulas (2'-1) and (2'-2) of the following schemes (11) and (12) according to a mutual bonding form of substituents in the ring a, ring b, and ring c. These compounds can be synthesized by applying synthesis methods illustrated in the above schemes (1) to (10) to intermediates illustrated in the following schemes (11) and (12).

Scheme (11)

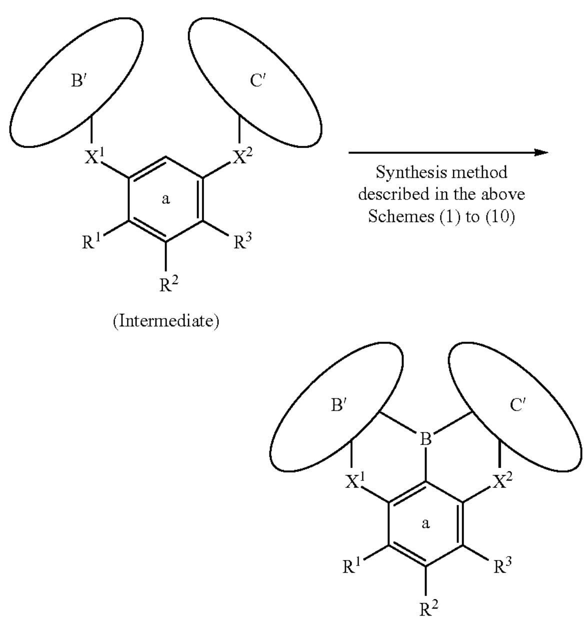

(2'-1)

Scheme (12)

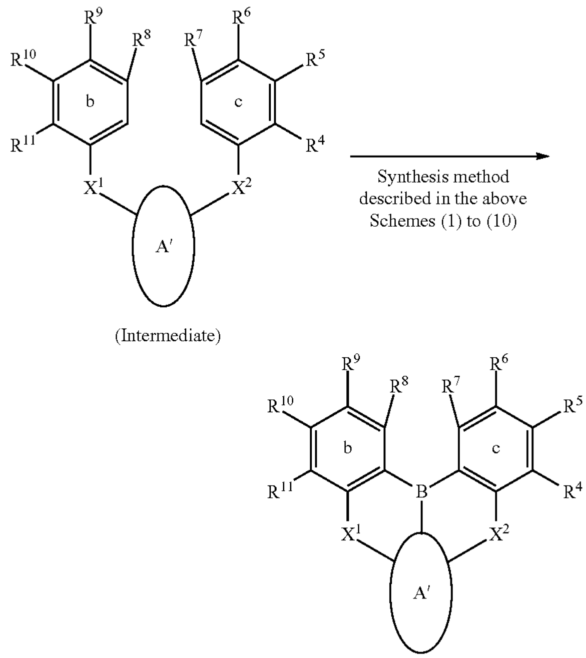

(Intermediate)

(2'-2)

Ring A', ring B' and ring C' in the above formulas (2'-1) and (2'-2) each represent an aryl ring or a heteroaryl ring formed by bonding adjacent groups among the substituents $R^1$ to $R^{11}$ together with the ring a, ring b, and ring c, respectively (may also be a fused ring obtained by fusing another ring structure to the ring a, ring b, or ring c). Incidentally, although not indicated in the formula, there is also a compound in which all of the ring a, ring b, and ring c have been changed to the ring A', ring B' and ring C'.

Furthermore, the provision that "R of the >N—R is bonded to the ring a, ring b, and/or ring c with —O—, —S—, —C(—R)$_2$—, or a single bond" in general formulas (2') can be expressed as a compound having a ring structure represented by formula (2'-3-1) of the following scheme (13), in which $X^1$ or $X^2$ is incorporated into the fused ring B' or fused ring C', or a compound having a ring structure represented by formula (2'-3-2) or (2'-3-3), in which $X^1$ or $X^2$ is incorporated into the fused ring A'. Such a compound can be synthesized by applying the synthesis methods illustrated in the schemes (1) to (10) to the intermediate represented by the following scheme (13).

Scheme 13

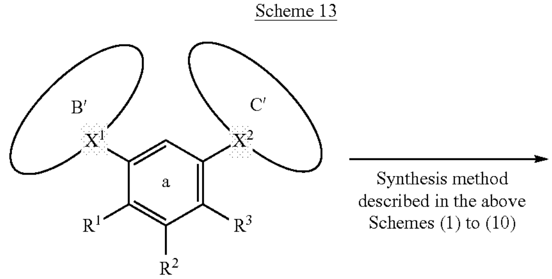

(Intermediate)

-continued

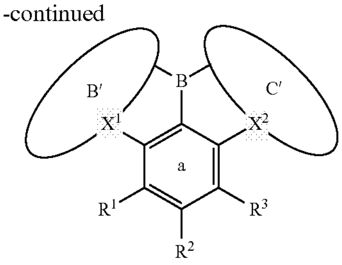

(2'-3-1)

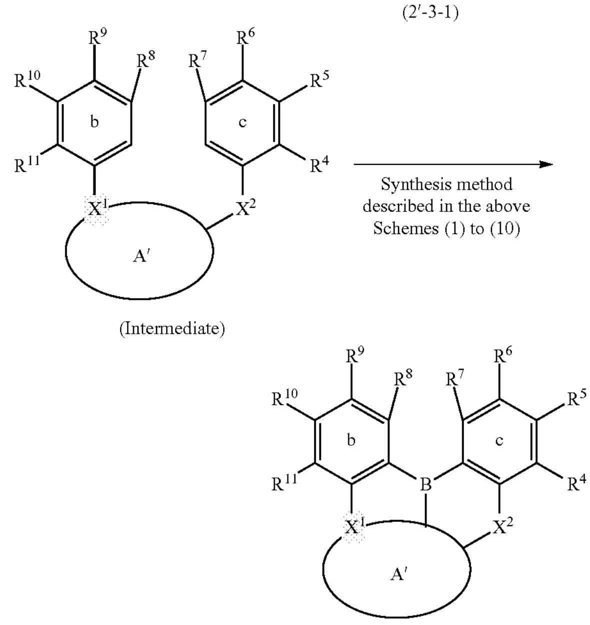

(Intermediate)

(2'-3-2)

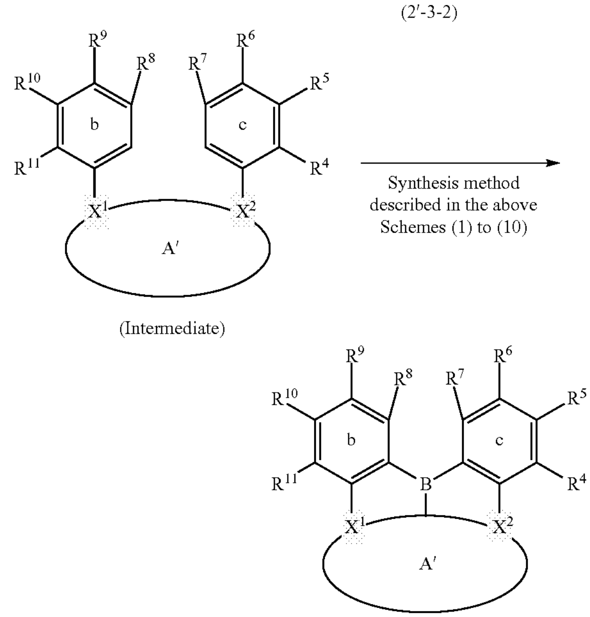

(Intermediate)

(2'-3-3)

Furthermore, regarding the synthesis methods of the above schemes (1) to (13), there is shown an example of carrying out the Tandem Hetero-Friedel-Crafts reaction by ortho-metalating a hydrogen atom (or a halogen atom) between $X^1$ and $X^2$ with butyllithium or the like, before boron trichloride, boron tribromide or the like is added.

However, the reaction may also be carried out by adding boron trichloride, boron tribromide or the like without conducting ortho-metalation using buthyllithium or the like.

Note that examples of an ortho-metalation reagent used for the above schemes (1) to (13) include an alkyllithium such as methyllithium, n-butyllithium, sec-butyllithium, or t-butyllithium; and an organic alkali compound such as lithium diisopropylamide, lithium tetramethylpiperidide, lithium hexamethyldisilazide, or potassium hexamethyldisilazide.

Incidentally, examples of a metal exchanging reagent for metal-"B" (boron) used for the above schemes (1) to (13) include a halide of boron such as trifluoride of boron, trichloride of boron, tribromide of boron, or triiodide of boron; an aminated halide of boron such as $CIPN(NEt_2)_2$; an alkoxylation product of boron; and an aryloxylation product of boron.

Incidentally, examples of the Brønsted base used for the above schemes (1) to (13) include N,N-diisopropylethylamine, triethylamine, 2,2,6,6-tetramethylpiperidine, 1,2,2,6,6-pentamethylpiperidine, N,N-dimethylaniline, N,N-dimethyltoluidine, 2,6-lutidine, sodium tetraphenylborate, potassium tetraphenylborate, triphenylborane, tetraphenylsilane, $Ar_4BNa$, $Ar_4BK$, $Ar_3B$, and $Ar_4Si$ (Ar represents an aryl such as phenyl).

Examples of a Lewis acid used for the above schemes (1) to (13) include $AlCl_3$, $AlBr_3$, $AlF_3$, $BF_3$. $OEt_2$, $BCl_3$, $BBr_3$, $GaCl_3$, $GaBr_3$, $InCl_3$, $InBr_3$, $In(OTf)_3$, $SnCl_4$, $SnBr_4$, AgOTf, $ScCl_3$, $Sc(OTf)_3$, $ZnCl_2$, $ZnBr_2$, $Zn(OTf)_2$, $MgCl_2$, $MgBr_2$, $Mg(OTf)_2$, LiOTf, NaOTf, KOTf, $Me_3SiOTf$, $Cu(OTf)_2$, $CuCl_2$, $YCl_3$, $Y(OTf)_3$, $TiCl_4$, $TiBr_4$, $ZrCl_4$, $ZrBr_4$, $FeCl_3$, $FeBr_3$, $CoCl_3$, and $CoBr_3$.

In the above schemes (1) to (13), a Brønsted base or a Lewis acid may be used in order to accelerate the Tandem Hetero Friedel-Crafts reaction. However, in a case where a halide of boron such as trifluoride of boron, trichloride of boron, tribromide of boron, or triiodide of boron is used, an acid such as hydrogen fluoride, hydrogen chloride, hydrogen bromide, or hydrogen iodide is generated along with progress of an aromatic electrophilic substitution reaction. Therefore, it is effective to use a Brønsted base that captures an acid. On the other hand, in a case where an aminated halide of boron or an alkoxylation product of boron is used, an amine or an alcohol is generated along with progress of the aromatic electrophilic substitution reaction. Therefore, in many cases, it is not necessary to use a Brønsted base. However, leaving ability of an amino group or an alkoxy group is low, and therefore it is effective to use a Lewis acid that promotes leaving of these groups.

A compound represented by formula (1) or a multimer thereof also includes compounds in which at least a portion of hydrogen atoms are substituted by deuterium atoms or substituted by cyanos or halogen atoms such as fluorine atoms or chlorine atoms. However, these compounds can be synthesized as described above using raw materials that are deuterated, fluorinated, chlorinated or cyanated at desired sites.

5. Organic Device

The polycyclic aromatic compound according to an aspect of the present invention can be used as a material for an organic device. Examples of the organic device include an organic electroluminescent element, an organic field effect transistor, and an organic thin film solar cell.

5-1. Organic Electroluminescent Element

The polycyclic aromatic compound represented by general formula (1) can be used as, for example, a material for an organic electroluminescent element. Hereinafter, an organic EL element according to the present embodiment will be described in detail based on the drawings. FIG. 1 is a schematic cross-sectional view illustrating the organic EL element according to the present embodiment.

<Structure of Organic Electroluminescent Element>

An organic electroluminescent element 100 illustrated in FIG. 1 includes a substrate 101, a positive electrode 102 provided on the substrate 101, a hole injection layer 103 provided on the positive electrode 102, a hole transport layer 104 provided on the hole injection layer 103, a light emitting layer 105 provided on the hole transport layer 104, an electron transport layer 106 provided on the light emitting layer 105, an electron injection layer 107 provided on the electron transport layer 106, and a negative electrode 108 provided on the electron injection layer 107.

Incidentally, the organic electroluminescent element 100 may be constituted, by reversing the manufacturing order, to include, for example, the substrate 101, the negative electrode 108 provided on the substrate 101, the electron injection layer 107 provided on the negative electrode 108, the electron transport layer 106 provided on the electron injection layer 107, the light emitting layer 105 provided on the electron transport layer 106, the hole transport layer 104 provided on the light emitting layer 105, the hole injection layer 103 provided on the hole transport layer 104, and the positive electrode 102 provided on the hole injection layer 103.

Not all of the above layers are essential. The configuration includes the positive electrode 102, the light emitting layer 105, and the negative electrode 108 as a minimum constituent unit, while the hole injection layer 103, the hole transport layer 104, the electron transport layer 106, and the electron injection layer 107 are optionally provided. Furthermore, each of the above layers may be formed of a single layer or a plurality of layers.

A form of layers constituting the organic electroluminescent element may be, in addition to the above structure form of "substrate/positive electrode/hole injection layer/hole transport layer/light emitting layer/electron transport layer/electron injection layer/negative electrode", a structure form of "substrate/positive electrode/hole transport layer/light emitting layer/electron transport layer/electron injection layer/negative electrode", "substrate/positive electrode/hole injection layer/light emitting layer/electron transport layer/electron injection layer/negative electrode", "substrate/positive electrode/hole injection layer/hole transport layer/light emitting layer/electron injection layer/negative electrode", "substrate/positive electrode/hole injection layer/hole transport layer/light emitting layer/electron transport layer/negative electrode", "substrate/positive electrode/light emitting layer/electron transport layer/electron injection layer/negative electrode", "substrate/positive electrode/hole transport layer/light emitting layer/electron injection layer/negative electrode", "substrate/positive electrode/hole transport layer/light emitting layer/electron transport layer/negative electrode", "substrate/positive electrode/hole injection layer/light emitting layer/electron injection layer/negative electrode", "substrate/positive electrode/hole injection layer/light emitting layer/electron transport layer/negative electrode", "substrate/positive electrode/light emitting layer/electron transport layer/negative electrode", or "substrate/positive electrode/light emitting layer/electron injection layer/negative electrode".

<Substrate in Organic Electroluminescent Element>

The substrate 101 serves as a support of the organic electroluminescent element 100, and usually, quartz, glass, metals, plastics, and the like are used therefor. The substrate

101 is formed into a plate shape, a film shape, or a sheet shape according to a purpose, and for example, a glass plate, a metal plate, a metal foil, a plastic film, and a plastic sheet are used. Among these examples, a glass plate and a plate made of a transparent synthetic resin such as polyester, polymethacrylate, polycarbonate, or polysulfone are preferable. For a glass substrate, soda lime glass, alkali-free glass, and the like are used. The thickness is only required to be a thickness sufficient for maintaining mechanical strength. Therefore, the thickness is only required to be 0.2 mm or more, for example. The upper limit value of the thickness is, for example, 2 mm or less, and preferably 1 mm or less. Regarding a material of glass, glass having fewer ions eluted from the glass is desirable, and therefore alkali-free glass is preferable. However, soda lime glass which has been subjected to barrier coating with $SiO_2$ or the like is also commercially available, and therefore this soda lime glass can be used. Furthermore, the substrate 101 may be provided with a gas barrier film such as a dense silicon oxide film on at least one surface in order to increase a gas barrier property. Particularly in a case of using a plate, a film, or a sheet made of a synthetic resin having a low gas barrier property as the substrate 101, a gas barrier film is preferably provided.

<Positive Electrode in Organic Electroluminescent Element>

The positive electrode 102 plays a role of injecting a hole into the light emitting layer 105. Incidentally, in a case where the hole injection layer 103 and/or the hole transport layer 104 are/is provided between the positive electrode 102 and the light emitting layer 105, a hole is injected into the light emitting layer 105 through these layers.

Examples of a material to form the positive electrode 102 include an inorganic compound and an organic compound. Examples of the inorganic compound include a metal (aluminum, gold, silver, nickel, palladium, chromium, and the like), a metal oxide (indium oxide, tin oxide, indium-tin oxide (ITO), indium-zinc oxide (IZO), and the like), a metal halide (copper iodide and the like), copper sulfide, carbon black, ITO glass, and Nesa glass. Examples of the organic compound include an electrically conductive polymer such as polythiophene such as poly(3-methylthiophene), polypyrrole, or polyaniline. In addition to these compounds, a material can be appropriately selected for use from materials used as a positive electrode of an organic electroluminescent element.

A resistance of a transparent electrode is not limited as long as a sufficient current can be supplied to light emission of a luminescent element. However, low resistance is desirable from a viewpoint of consumption power of the luminescent element. For example, an ITO substrate having a resistance of 300Ω/□ or less functions as an element electrode. However, a substrate having a resistance of about 10Ω/□ (can be also supplied at present, and therefore it is particularly desirable to use a low resistance product having a resistance of, for example, 100 to 5Ω/□, preferably 50 to 5Ω/□. The thickness of an ITO can be arbitrarily selected according to a resistance value, but an ITO having a thickness of 50 to 300 nm is often used.

<Hole Injection Layer and Hole Transport Layer in Organic Electroluminescent Element>

The hole injection layer 103 plays a role of efficiently injecting a hole that migrates from the positive electrode 102 into the light emitting layer 105 or the hole transport layer 104. The hole transport layer 104 plays a role of efficiently transporting a hole injected from the positive electrode 102 or a hole injected from the positive electrode 102 through the hole injection layer 103 to the light emitting layer 105. The hole injection layer 103 and the hole transport layer 104 are each formed by laminating and mixing one or more kinds of hole injection/transport materials, or by a mixture of a hole injection/transport material and a polymer binder. Furthermore, a layer may be formed by adding an inorganic salt such as iron(III) chloride to the hole injection/transport materials.

A hole injecting/transporting substance needs to efficiently inject/transport a hole from a positive electrode between electrodes to which an electric field is applied, and preferably has high hole injection efficiency and transports an injected hole efficiently. For this purpose, a substance which has low ionization potential, large hole mobility, and excellent stability, and in which impurities that serve as traps are not easily generated at the time of manufacturing and at the time of use, is preferable.

As a material to form the hole injection layer 103 and the hole transport layer 104, any compound can be selected for use among compounds that have been conventionally used as charge transporting materials for holes, p-type semiconductors, and known compounds used in a hole injection layer and a hole transport layer of an organic electroluminescent element.

Specific examples thereof include a heterocyclic compound including a carbazole derivative (N-phenylcarbazole, polyvinylcarbazole, and the like), a biscarbazole derivative such as bis(N-arylcarbazole) or bis(N-alkylcarbazole), a triarylamine derivative (a polymer having an aromatic tertiary amino in a main chain or a side chain, 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N, N'-diphenyl-4,4'-dphenyl-1,1'-diamine, $N^4$,$N^{4'}$-diphenyl-$N^4$,$N^{4'}$-bis(9-phenyl-9H-carbazol-3-yl)-[1,1'-biphenyl]-4,4'-diamine, $N^4$,$N^4$,$N^{4'}$, $N^{4'\text{-}tetra}$[1,1'-biphenyl]-4-yl)-[1,1'-biphenyl]-4,4'-diamine, a triphenylamine derivative such as 4,4',4"-tris(3-methylphenyl(phenyl)amino)triphenylamine, a starburst amine derivative, and the like), a stilbene derivative, a phthalocyanine derivative (non-metal, copper phthalocyanine, and the like), a pyrazoline derivative, a hydrazone-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile, and the like), and a porphyrin derivative, and a polysilane. Among the polymer-based materials, a polycarbonate, a styrene derivative, a polyvinylcarbazole, a polysilane, and the like having the above monomers in side chains are preferable. However, there is no particular limitation as long as a compound can form a thin film required for manufacturing a luminescent element, can inject a hole from a positive electrode, and can further transport a hole.

Furthermore, it is also known that electroconductivity of an organic semiconductor is strongly affected by doping into the organic semiconductor. Such an organic semiconductor matrix substance is formed of a compound having a good electron-donating property, or a compound having a good electron-accepting property. For doping with an electron-donating substance, a strong electron acceptor such as tetracyanoquinonedimethane (TCNQ) or 2,3,5,6-tetrafluorotetracyano-1,4-benzoquinonedimethane (F4TCNQ) is known (see, for example, "M. Pfeiffer, A. Beyer, T. Fritz, K. Leo, Appl. Phys. Lett., 73(22), 3202-3204 (1998)" and "J. Blochwitz, M. Pheiffer, T. Fritz, K. Leo, Appl. Phys. Lett., 73(6), 729-731 (1998)"). These compounds generate a socalled hole by an electron transfer process in an electron-donating type base substance (hole transporting substance). Electroconductivity of the base substance depends on the number and mobility of the holes fairly significantly. Known examples of a matrix substance having a hole transporting characteristic include a benzidine derivative (TPD and the like), a starburst amine derivative (TDATA and the like), and a specific metal phthalocyanine (particularly, zinc phthalocyanine (ZnPc) and the like) (JP 2005-167175 A).

<Light Emitting Layer in Organic Electroluminescent Element>

The light emitting layer 105 emits light by recombining a hole injected from the positive electrode 102 and an electron injected from the negative electrode 108 between electrodes to which an electric field is applied. A material to form the light emitting layer 105 is only required to be a compound which is excited by recombination between a hole and an electron and emits light (luminescent compound), and is preferably a compound which can form a stable thin film shape, and exhibits strong light emission (fluorescence) efficiency in a solid state. For example, a material for a light-emitting layer containing a polycyclic aromatic compound represented by the general formula (1) as a host material and a polycyclic aromatic compound represented by the general formula (2) or a multimer thereof as a dopant material can be used.

The light emitting layer may be formed of a single layer or a plurality of layers, and each layer is formed of a material for a light emitting layer (a host material and a dopant material). Each of the host material and the dopant material may be formed of a single kind, or a combination of a plurality of kinds. The dopant material may be included in the host material wholly or partially. Regarding a doping method, doping can be performed by a co-deposition method with a host material, or alternatively, a dopant material may be mixed in advance with a host material, and then vapor deposition may be carried out simultaneously.

The amount of use of the host material depends on the kind of the host material, and may be determined according to a characteristic of the host material. The reference of the amount of use of the host material is preferably from 50 to 99.999% by weight, more preferably from 80 to 99.95% by weight, and still more preferably from 90 to 99.9% by weight with respect to the total amount of a material for a light emitting layer.

The amount of use of the dopant material depends on the kind of the dopant material, and may be determined according to a characteristic of the dopant material. The reference of the amount of use of the dopant is preferably from 0.001 to 50% by weight, more preferably from 0.05 to 20% by weight, and still more preferably from 0.1 to 10% by weight with respect to the total amount of a material for a light emitting layer. The amount of use within the above range is preferable, for example, from a viewpoint of being able to prevent a concentration quenching phenomenon.

Examples of the host material include a fused ring derivative of anthracene, pyrene, or the like conventionally known as a luminous body, a bisstyryl derivative such as a bisstyrylanthracene derivative, a distyrylbenzene derivative, or the like, a tetraphenylbutadiene derivative, a cyclopentadiene derivative, a fluorene derivative, and a benzofluorene derivative.

Examples of the host material include a carbazole type compounds and an anthracene type compounds represented by the following formulas.

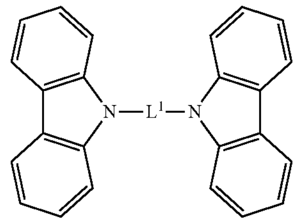

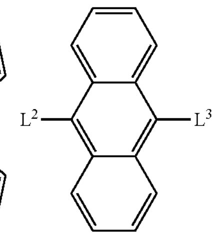

In the above formula, $L^1$ represents an arylene having 6 to 24 carbon atoms, preferably an arylene having 6 to 16 carbon atoms, more preferably an arylene having 6 to 12 carbon atoms, and particularly preferably an arylene having 6 to 10 carbon atoms. Specific examples include divalent groups of a benzene ring, a biphenyl ring, a naphthalene ring, a terphenyl ring, an acenaphthylene ring, a fluorene ring, a phenalene ring, a phenanthrene ring, a triphenylene ring, a pyrene ring, a naphthacene ring, a perylene ring, a pentacene ring, and the like.

In the above formula, $L^2$ and $L^3$ represent each independently an aryl having 6 to 30 carbon atoms or a heteroaryl having 2 to 30 carbon atoms. As the aryl, an aryl having 6 to 24 carbon atoms is preferable, an aryl having 6 to 16 carbon atoms is more preferable, an aryl having 6 to 12 carbon atoms is further preferable, an aryl having 6 to 10 carbon atoms is particularly preferable. Specific examples include monovalent groups of a benzene ring, a biphenyl ring, a naphthalene ring, a terphenyl ring, an acenaphthylene ring, a fluorene ring, a phenalene ring, a phenanthrene ring, a triphenylene ring, a pyrene ring, a naphthacene ring, a perylene ring, a pentacene ring, and the like. As the heteroaryl, a heteroaryl having 2 to 25 carbon atoms is preferable, a heteroaryl having 2 to 20 carbon atoms is more preferable, a heteroaryl having 2 to 15 carbon atoms is more preferable, and a heteroaryl having 2 to 10 carbon atoms is particularly preferable. Specific examples include a pyrrole ring, an oxazole ring, an isoxazole ring, a thiazole ring, an isothiazole ring, an imidazole ring, an oxadiazole ring, a thiadiazole ring, a triazole ring, a tetrazole ring, a pyrazole ring, a pyridine ring, a pyrimidine ring, a Pyridazine ring, a pyrazine ring, a triazine ring, an indole ring, an isoindole ring, a 1H-indazole ring, a benzimidazole ring, a benzoxazole ring, a benzothiazole ring, a 1H-benzotriazole ring, a quinoline ring, an isoquinoline ring, a cinnoline ring, a quinazoline ring, a quinoxaline ring, a phthalazine ring, a naphthyridine ring, a purine ring, a pteridine ring, a carbazole ring, an acridine ring, a phenoxathiin ring, a phenoxazine ring, a phenothiazine ring, a phenazine ring, an indolizine ring, a furan ring, a benzofuran ring, an isobenzofuran ring, a dibenzofuran ring, a thiophene ring, a benzothiophene ring, a dibenzothiophene ring, a furazane ring, an oxadiazole ring, a thianthrene ring, and the like.

At least one hydrogen atom in the carbazole type compounds and the anthracene type compounds represented by the above formulas may be substituted by an alkyl having 1 to 6 carbons, cyano, halogen atom, or deuterium atom.

Regarding the host material, as other examples, host materials described in Advanced Materials, 2017, 29, 1605444, Journal of Material Chemistry C, 2016, 4, 11355-11381, Chemical Science, 2016, 7, 3355-3363, and Thin Solid Films, 2016, 619, 120-124 can be used. Since the TADF organic EL element requires high T1 energy as a host material of a light emitting layer, the host material for a phosphorescent organic EL element described in Chemistry Society Reviews, 2011, 40, 2943-2970 can also be used as a host material for the TADF organic EL element.

More specifically, the host compound has at least one structure selected from a partial structure (H-A) group represented by the following formulas. At least one hydrogen atom in each structure in the partial structure (H-A) group may be substituted by any structure in the partial structure (H-A) group or a partial structure (H-B) group, and at least one hydrogen atom in these structures may be substituted by a deuterium atom, a halogen atom, cyano, an alkyl having 1 to 4 carbon atoms (for example, methyl or t-butyl), trimethylsilyl, or phenyl.

(H-A)

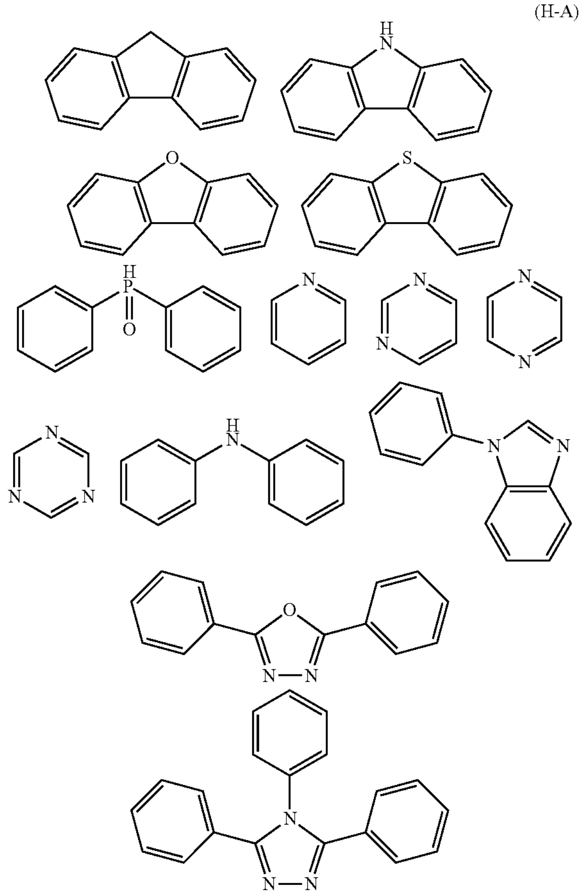

(H-B)

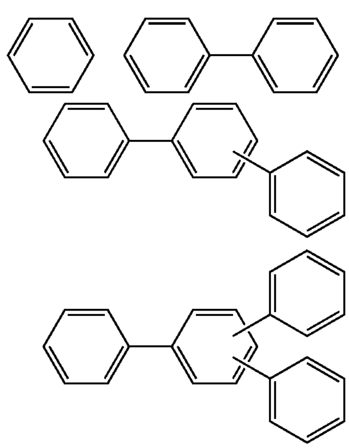

-continued

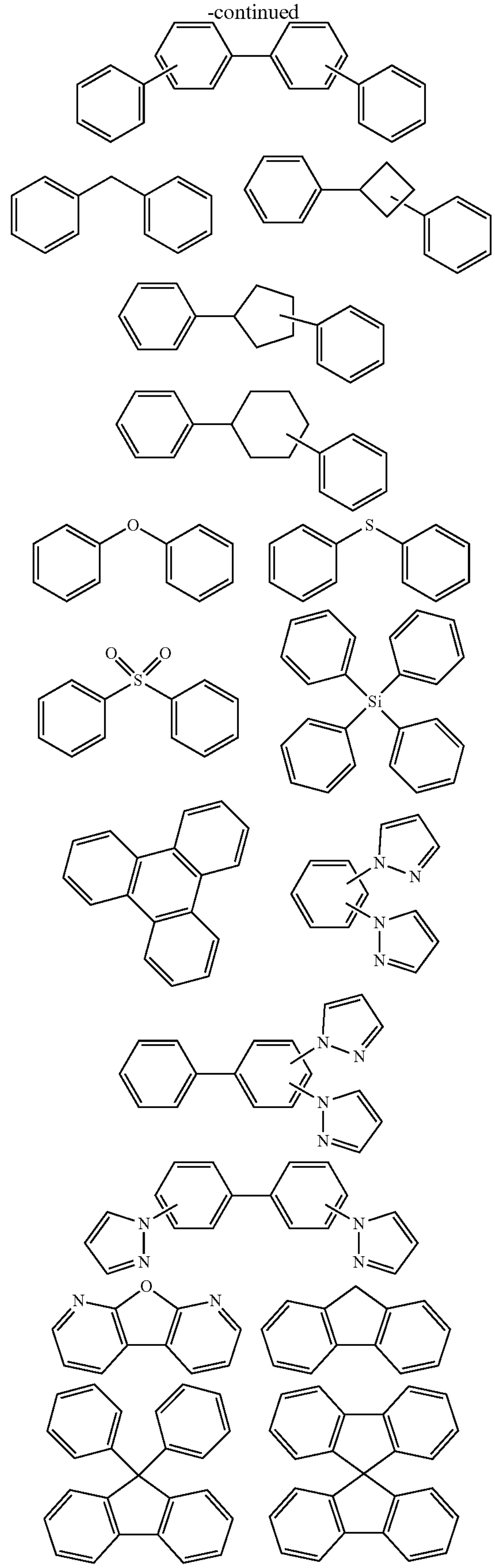

-continued

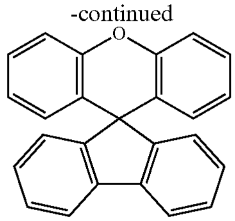

The host compound is preferably a compound represented by any one of structural formulas listed below. Among these compounds, the host compound is more preferably a compound having one to three structures selected from the above partial structure (H-A) group and one structure selected from the above partial structure (H-B) group, still more preferably a compound having a carbazole group as the partial structure (H-A) group, and particularly preferably a compound represented by the following formula (Cz-201), (Cz-202), (Cz-203), (Cz-204), (Cz-212), (Cz-221), (Cz-222), (Cz-261), or (Cz-262). Note that in the structural formulas listed below, at least one hydrogen atom may be substituted by a halogen atom, cyano, an alkyl having 1 to 4 carbon atoms (for example, methyl or t-butyl), phenyl, naphthyl, or the like.

(Cz-201)

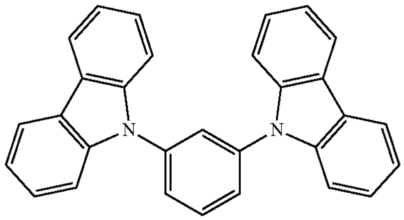

(Cz-202)

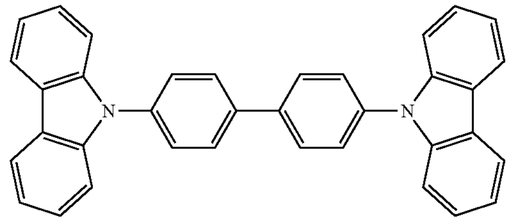

(Cz-203)

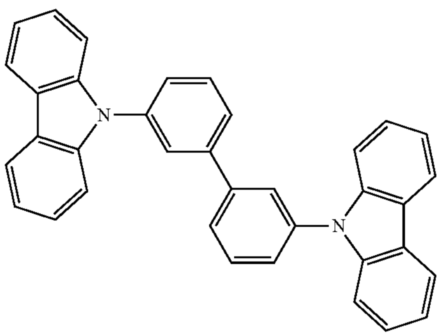

(Cz-204)

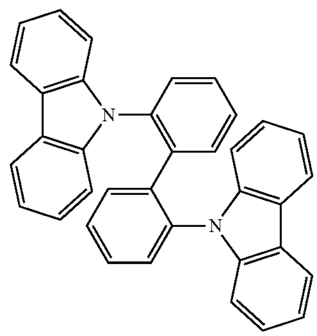

(Cz-212)

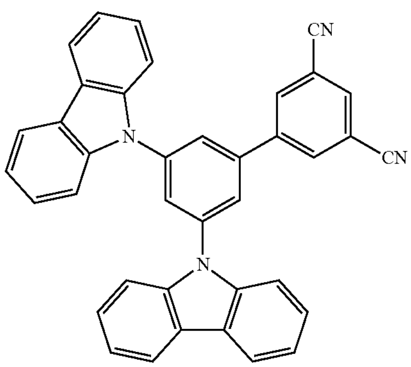

(Cz-221)

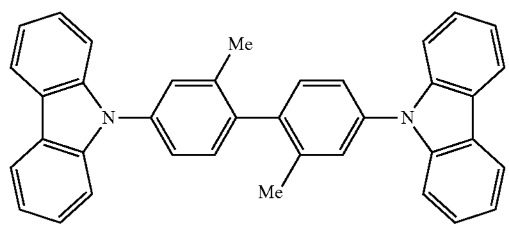

(Cz-222)

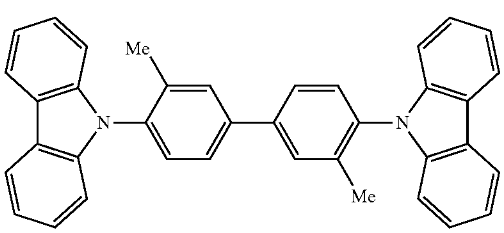

(Cz-261)

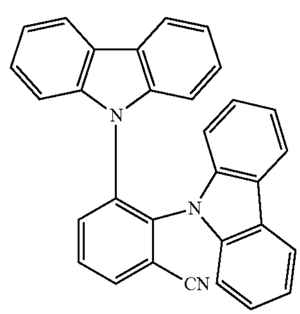

-continued
(Cz-262)
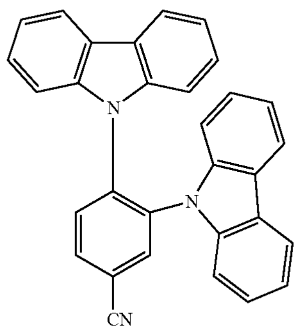
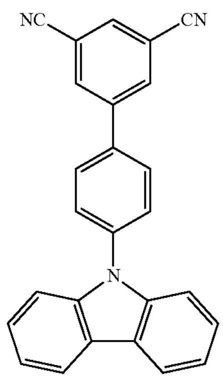
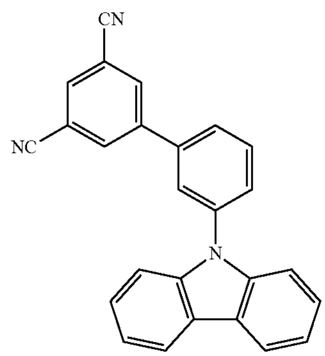
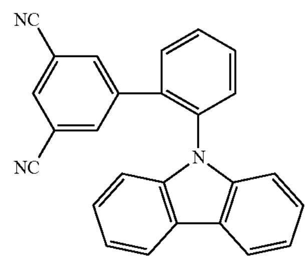
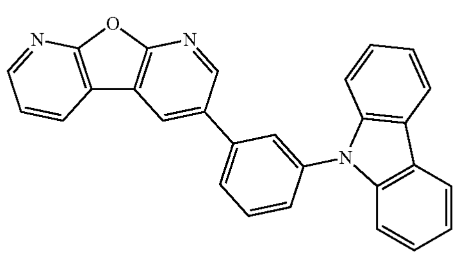
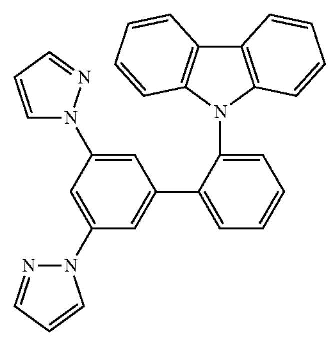
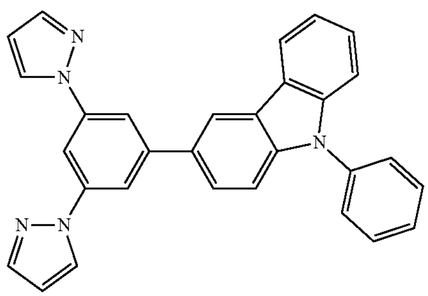
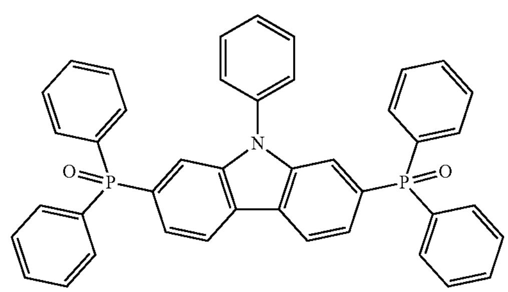
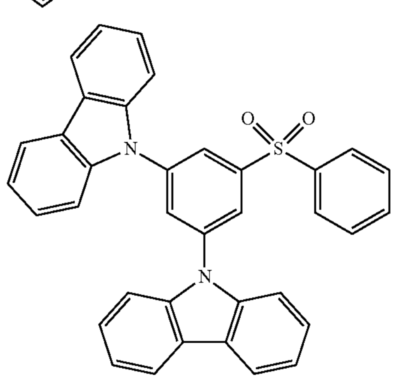
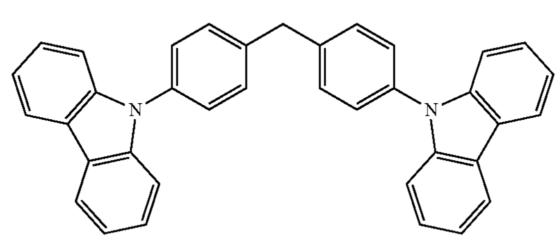

-continued
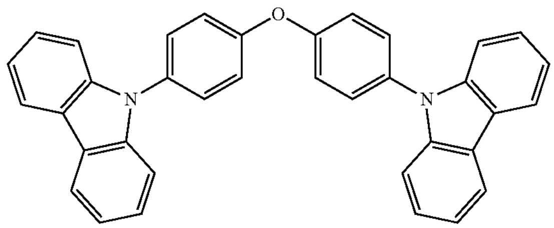
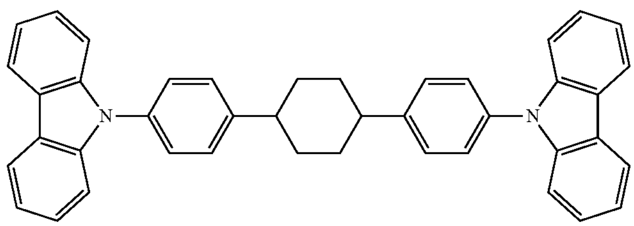
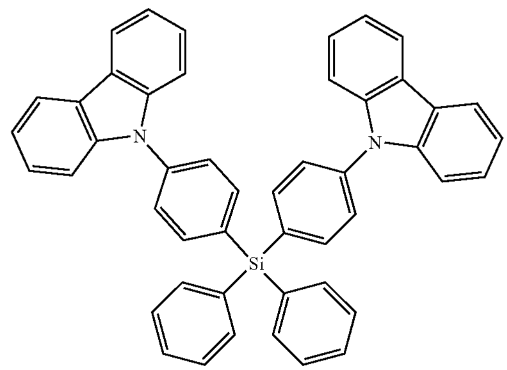
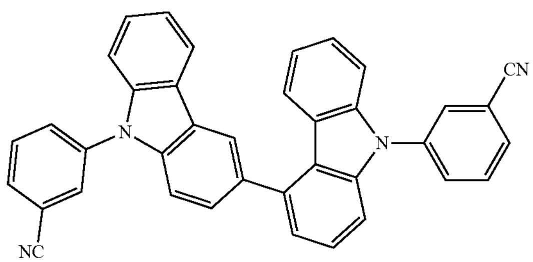
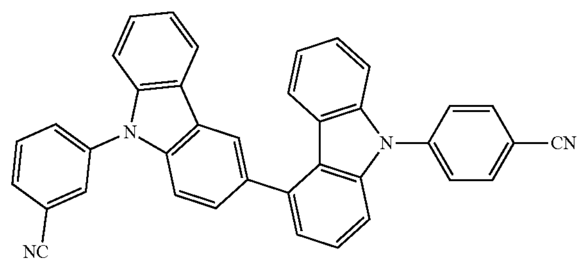
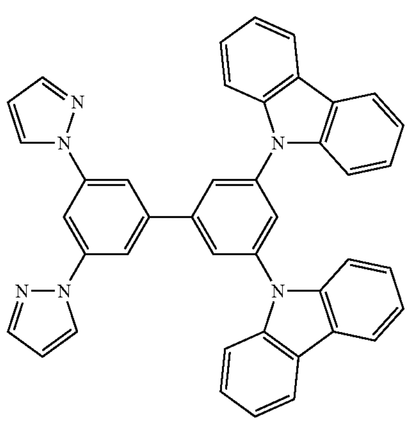
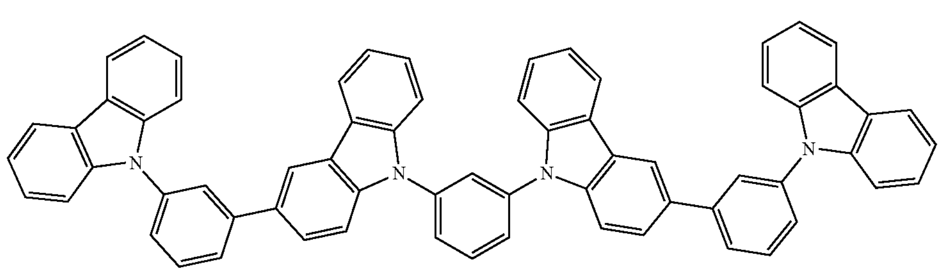

-continued
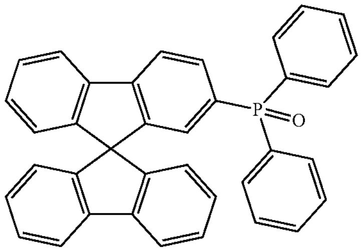
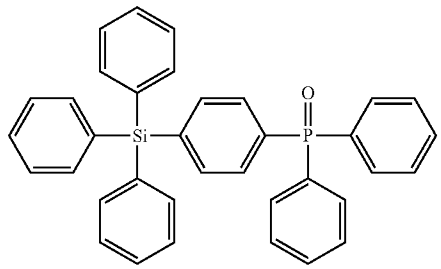
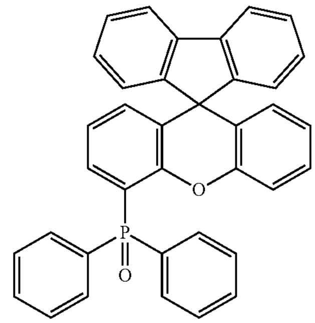
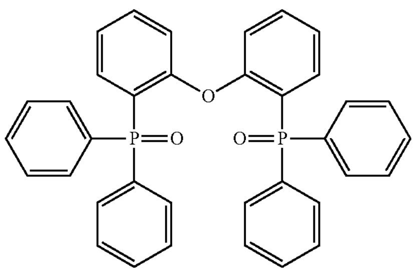
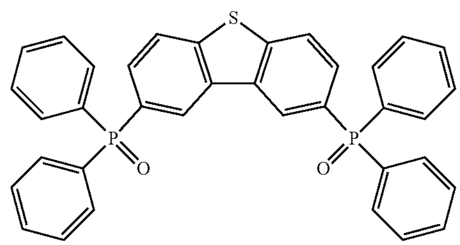
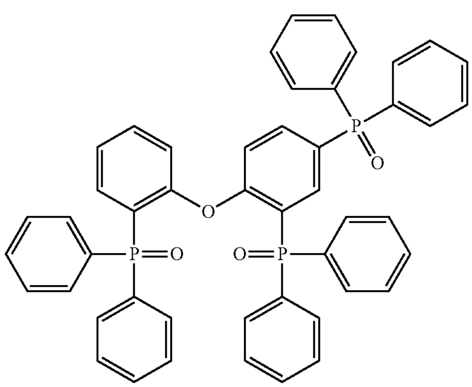
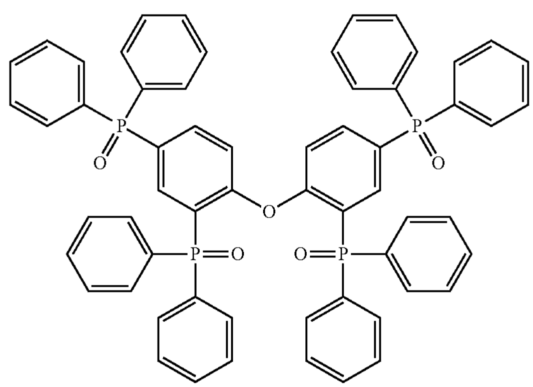
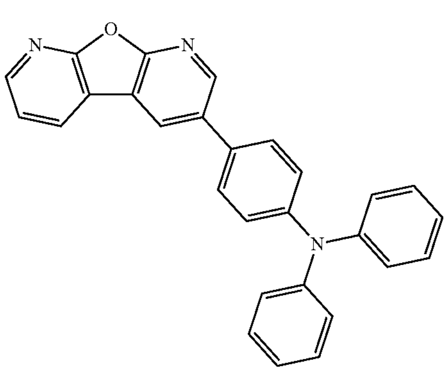
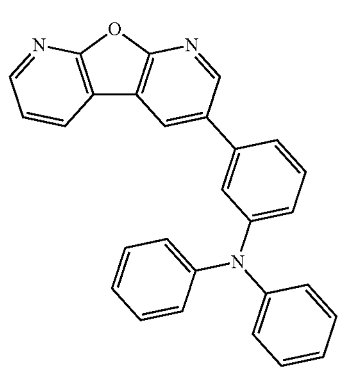
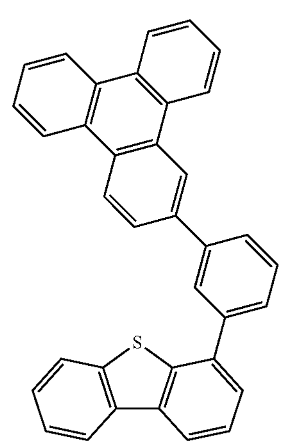

-continued

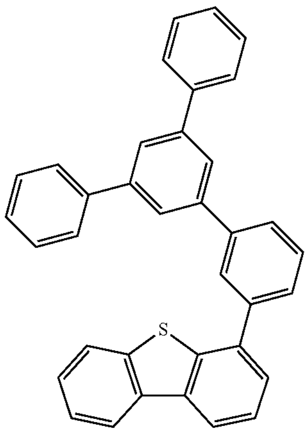

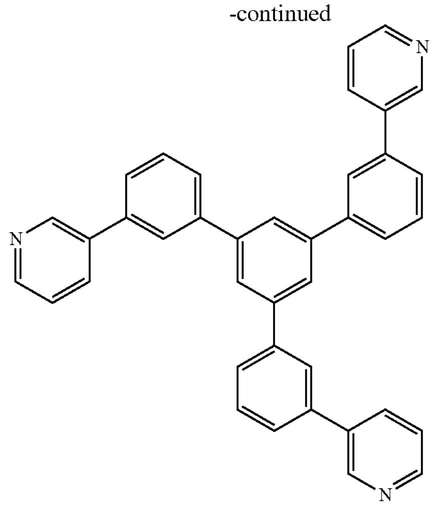

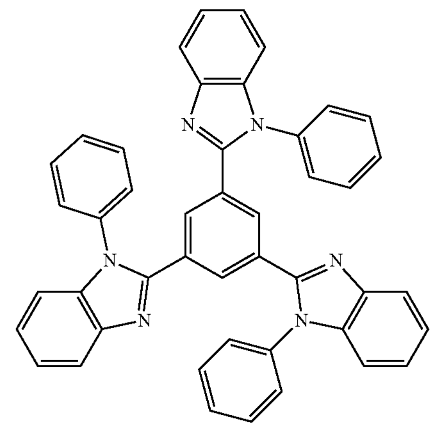

The dopant material that can be used in combination with the polycyclic aromatic amino compound represented by the above general formula (1A) or (1B) is not particularly limited, and an existing compound can be used. The dopant material can be selected from among various materials depending on a desired color of emitted light. Specific examples thereof include a fused ring derivative such as phenanthrene, anthracene, pyrene, tetracene, pentacene, perylene, naphthopyrene, dibenzopyrene, rubrene, or chrysene, a benzoxazole derivative, a benzothiazole derivative, a benzimidazole derivative, a benzotriazole derivative, an oxazole derivative, an oxadiazole derivative, a thiazole derivative, an imidazole derivative, a thiadiazole derivative, a triazole derivative, a pyrazoline derivative, a stilbene derivative, a thiophene derivative, a tetraphenylbutadiene derivative, a cyclopentadiene derivative, a bisstyryl derivative such as a bisstyrylanthracene derivative or a distyrylbenzene derivative (JP 1-245087 A), a bisstyrylarylene derivative (JP 2-247278 A), a diazaindacene derivative, a furan derivative, a benzofuran derivative, an isobenzofuran derivative such as phenylisobenzofuran, dimesitylisobenzofuran, di(2-methylphenyl)isobenzofuran, di(2-trifluoromethylphenyl)isobenzofuran, or phenylisobenzofuran, a dibenzofuran derivative, a coumarin derivative such as a 7-dialkylaminocoumarin derivative, a 7-piperidinocoumarin derivative, a 7-hydroxycoumarin derivative, a 7-methoxycoumarin derivative, a 7-acetoxycoumarin derivative, a 3-benzothiazolylcoumarin derivative, a 3-benzimidazolylcoumarin derivative, or a 3-benzoxazolylcoumarin derivative, a dicyanomethylenepyran derivative, a dicyanomethylenethiopyran derivative, a polymethine derivative, a cyanine derivative, an oxobenzoanthracene derivative, a xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, a furopyridine derivative, a 1,2,5-thiadiazolopyrene derivative, a pyromethene derivative, a perinone derivative, a pyrrolopyrrole derivative, a squarylium derivative, a violanthrone derivative, a phenazine derivative, an acridone derivative, a deazaflavine derivative, a fluorene derivative, and a benzofluorene derivative.

When the materials are exemplified for each emission color, examples of blue to bluish green dopant materials include an aromatic hydrocarbon compound and a derivative thereof, such as naphthalene, anthracene, phenanthrene, pyrene, triphenylene, perylene, fluorene, indene, or chrysene; an aromatic heterocyclic compound and a derivative thereof, such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthyridine, quinoxaline, pyrrolopyridine, or thioxanthene, a distyrylbenzene derivative, a tetraphenylbutadiene derivative, a stilbene derivative, an aldazine derivative, a coumarin derivative, an azole derivative such as imidazole, thiazole, thiadiazole, carbazole, oxazole, oxadiazole, or triazole and a metal complex thereof, and an aromatic amine derivative represented by N,N'-diphenyl-N,N'-di(3-methylphenyl)-4,4'-diphenyl-1,1'-diamine.

Examples of green to yellow dopant materials include a coumarin derivative, a phthalimide derivative, a naphthalimide derivative, a perinone derivative, a pyrrolopyrrole derivative, a cyclopentadiene derivative, an acridone derivative, a quinacridone derivative, and a naphthacene derivative such as rubrene. Furthermore, suitable examples thereof include compounds obtained by introducing a substituent capable of making a wavelength longer, such as an aryl, a heteroaryl, an arylvinyl, an amino, or cyano, into the above compounds exemplified as the blue to bluish green dopant material.

Furthermore, examples of orange to red dopant materials include a naphthalimide derivative such as bis(diisopropylphenyl) perylene tetracarboxylic acid imide, a perinone derivative, a rare earth complex containing acetylacetone, benzoylacetone, or phenanthroline as a ligand, such as an Eu complex, 4-(dicyanomethylene)-2-methyl-6-(p-dimethylaminostyryl)-4H-pyran and an analogue thereof, a metal phthalocyanine derivative such as magnesium phthalocyanine or aluminum chlorophthalocyanine, a rhodamine compound, a deazaflavine derivative, a coumarin derivative, a quinacridone derivative, a phenoxazine derivative, an oxazine derivative, a quinazoline derivative, a pyrrolopyridine derivative, a squarylium derivative, a violanthrone derivative, a phenazine derivative, a phenoxazone derivative, and a thiadiazolopyrene derivative. Furthermore, suitable examples thereof include compounds obtained by introducing a substituent capable of making a wavelength longer, such as an aryl, a heteroaryl, an arylvinyl, an amino, or cyano, into the above compounds exemplified as blue to bluish green and green to yellow dopant materials.

In addition, dopants can be appropriately selected for use from among compounds described in "Kagaku Kogyo (Chemical Industry)", June 2004, p. 13, and reference documents described therein.

Among the dopant materials described above, particularly, an amine having a stilbene structure, a perylene derivative, a borane derivative, an aromatic amine derivative, a coumarin derivative, a pyran derivative, and a pyrene derivative are preferable.

An amine having a stilbene structure is represented by, for example, the following formula:

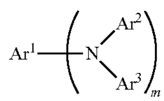

In the formula, $Ar^1$ represents an m-valent group derived from an aryl having 6 to 30 carbon atoms, and $Ar^2$ and $Ar^3$ each independently represent an aryl having 6 to 30 carbon atoms, in which at least one of $Ar^1$ to $Ar^3$ has a stilbene structure, $Ar^1$ to $Ar^3$ may be substituted by an aryl, a heteroaryl, an alkyl, a trisubstituted silyl (silyl trisubstituted by an aryl and/or an alkyl), or cyano, and m represents an integer of 1 to 4.

The amine having a stilbene structure is more preferably a diaminostilbene represented by the following formula:

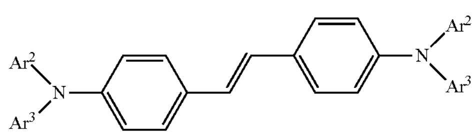

In the formula, $Ar^2$ and $Ar^3$ each independently represent an aryl having 6 to 30 carbon atoms, and $Ar^2$ and $Ar^3$ may be substituted by an aryl, a heteroaryl, an alkyl, a trisubstituted silyl (silyl trisubstituted by an aryl and/or an alkyl), or cyano.

Specific examples of the aryl having 6 to 30 carbon atoms include phenyl, naphthyl, acenaphthylenyl, fluorenyl, phenalenyl, phenanthrenyl, anthryl, fluoranthenyl, triphenylenyl, pyrenyl, chrysenyl, naphthacenyl, perylenyl, stilbenyl, distyrylphenyl, distyrylbiphenylyl, and distyrylfluorenyl.

Specific examples of the amine having a stilbene structure include N,N,N',N'-tetra(4-biphenylyl)-4,4'-diaminostilbene, N,N,N',N'-tetra(1-naphthyl)-4,4'-diaminostilbene, N,N,N',N'-tetra(2-naphthyl)-4,4'-diaminostilbene, N,N'-di(2-naphthyl)-N,N'-diphenyl-4,4'-diaminostilbene, N,N'-di(9-phenanthryl)-N,N'-diphenyl-4,4'-diaminostilbene, 4,4'-bis[4"-bis(diphenylamino)styryl]-biphenyl, 1,4-bis[4'-bis(diphenylamino)styryl]-benzene, 2,7-bis[4'-bis(diphenylamino)styryl]-9,9-dimethylfluorene, 4,4'-bis(9-ethyl-3-carbazovinylene)-biphenyl, and 4,4'-bis(9-phenyl-3-carbazovinylene)-biphenyl.

Amines having a stilbene structure described in JP 2003-347056 A, JP 2001-307884 A, and the like may also be used.

Examples of the perylene derivative include 3,10-bis(2,6-dimethylphenyl)perylene, 3,10-bis(2,4,6-trimethylphenyl)perylene, 3,10-diphenylperylene, 3,4-diphenylperylene, 2,5,8,11-tetra-t-butylperylene, 3,4,9,10-tetraphenylperylene, 3-(1'-pyrenyl)-8,11-di(t-butyl)perylene, 3-(9'-anthryl)-8,11-di(t-butyl)perylene, and 3,3'-bis(8,11-di(t-butyl)perylenyl).

Perylene derivatives described in JP 11-97178 A, JP 2000-133457 A, JP 2000-26324 A, JP 2001-267079 A, JP 2001-267078 A, JP 2001-267076 A, JP 2000-34234 A, JP 2001-267075 A, JP 2001-217077 A, and the like may also be used.

Examples of the borane derivative include 1,8-diphenyl-10-(dimesitylboryl)anthracene, 9-phenyl-10-(dimesitylboryl)anthracene, 4-(9'-anthryl)dimesitylborylnaphthalene, 4-(10'-phenyl-9'-anthryl)dimesitylborylnaphthalene, 9-(dimesitylboryl)anthracene, 9-(4'-biphenylyl)-10-(dimesitylboryl)anthracene, and 9-(4'-(N-carbazolyl)phenyl)-10-(dimesitylboryl)anthracene.

A borane derivative described in WO 2000/40586 A or the like may also be used.

The aromatic amine derivative is represented by, for example, the following formula:

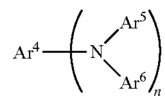

In the formula, $Ar^4$ represents an n-valent group derived from an aryl having 6 to 30 carbon atoms, $Ar^5$ and $Ar^6$ each independently represent an aryl having 6 to 30 carbon atoms, $Ar^4$ to $Ar^6$ may be substituted by an aryl, a heteroaryl, an alkyl, a trisubstituted silyl (silyl trisubstituted by an aryl and/or an alkyl), or cyano, and n represents an integer of 1 to 4.

Particularly, $Ar^4$ is a divalent group derived from anthracene, chrysene, fluorene, benzofluorene, or pyrene, $Ar^5$ and $Ar^6$ each independently represent an aryl having 6 to 30 carbon atoms, $Ar^4$ to $Ar^6$ may be substituted by an aryl, a heteroaryl, an alkyl, a trisubstituted silyl (silyl trisubstituted by an aryl and/or an alkyl), or cyano, and n represents 2.

Specific examples of the aryl having 6 to 30 carbon atoms include phenyl, naphthyl, acenaphthylenyl, fluorenyl, phenalenyl, phenanthryl, triphenylenyl, pyrenyl, naphthacenyl, perylenyl, and pentacenyl.

Examples of a chrysene-based aromatic amine derivative include N,N,N',N'-tetraphenylchrysene-6,12-diamine, N,N,N',N'-tetra(p-tolyl)chrysene-6,12-diamine, N,N,N',N'-tetra(m-tolyl)chrysene-6,12-diamine, N,N,N',N'-tetrakis(4-isopropylphenyl)chrysene-6,12-diamine, N,N,N',N'-tetra(naphthalen-2-yl)chrysene-6,12-dimine, N,N'-diphenyl-N,N'-di(p-tolyl)chrysene-6,12-diamine, N,N'-diphenyl-N,N'-bis(4-ethylphenyl)chrysene-6,12-diamine, N,N'-diphenyl-N,N'-bis(4-ethylphenyl)chrysene-6,12-diamine, N,N'-diphenyl-N,N'-bis(4-isopropylphenyl)chrysene-6,12-diamine, N,N'-diphenyl-N,N'-bis(4-t-butylphenyl)chrysene-6,12-diamine, and N,N'-bis(4-isopropylphenyl)-N,N'-di(p-tolyl) chrysene-6,12-diamine.

Examples of a pyrene-based aromatic amine derivative include N,N,N',N'-tetraphenylpyrene-1,6-diamine, N,N,N',N'-tetra(p-tolyl)pyrene-1,6-diamine, N,N,N',N'-tetra(m-tolyl)pyrene-1,6-diamine, N,N,N',N'-tetrakis(4-isopropyophenyl)pyrene-1,6-diamine, N,N,N',N'-tetrakis(3,4-dimethylphenyl)pyrene-1,6-diamine, N,N'-diphenyl-N,N'-di(p-tolyl)pyrene-1,6-diamine, N,N'-diphenyl-N,N'-bis(4-ethylphenyl)pyrene-1,6-diamine, N,N'-diphenyl-N,N'-bis(4-ethylphenyl)pyrene-1,6-diamine, N,N'-diphenyl-N,N'-bis(4-isopropylphenyl)pyrene-1,6-diamine, N,N'-diphenyl-N,N'-bis(4-t-butylphenyl)pyrene-1,6-diamine, N,N'-bis(4-isopropylphenyl)-N,N'-di(p-tolyl)pyrene-1,6-diamine, N,N,N',N'-tetrakis(3,4-dimethylphenyl)-3,8-diphenylpyrene-1,6-diamine, N,N,N,N-tetraphenylpyrene-1,8-diamine, N,N'-bis (biphenyl-4-yl)-N,N'-diphenylpyrene-1,8-diamine, and $N^1$,$N^6$-diphenyl-$N^1$,$N^6$-bis(4-trimethylsilanyl-phenyl)-1H,8H-pyrene-1,6-diamine.

Examples of an anthracene-based aromatic amine derivative include N,N,N,N-tetraphenylanthracene-9,10-diamine, N,N,N',N'-tetra(p-tolyl)anthracene-9,10-diamine, N,N,N',N'-tetra(m-tolyl)anthracene-9,10-diamine, N,N,N',N'-tetrakis(4-isopropylphenyl)anthracene-9,10-diamine, N,N'-diphenyl-N,N'-di(p-tolyl)anthracene-9,10-diamine, N,N'-diphenyl-N,N'-di(m-tolyl)anthracene-9,10-diamine, N,N'-diphenyl-N,N'-bis(4-ethylphenyl)anthracene-9,10-diamine, N,N'-diphenyl-N,N'-bis(4-ethylphenyl)anthracene-9,10-diamine, N,N'-diphenyl-N,N'-bis(4-isopropylphenyl)anthracene-9,10-diamine, N,N'-diphenyl-N,N'-bis(4-t-butylphenyl)anthracene-9,10-diamine, N,N'-bis(4-isopropylphenyl)-N,N'-di(p-tolyl)anthracene-9,10-diamine, 2,6-di-t-butyl-N,N,N',N'-tetra(p-tolyl)anthracene-9,10-diamine, 2,6-di-t-butyl-N,N'-diphenyl-N,N'-bis(4-isopropylphenyl) anthracene-9,10-diamine, 2,6-di-t-butyl-N,N'-bis(4-isopropylphenyl)-N,N'-di(p-tolyl)anthracene-9,10-diamine, 2,6-dicyclohexyl-N,N'-bis(4-isopropylphenyl)-N,N'-di(p-tolyl)anthracene-9,10-diamine, 2,6-dicyclohexyl-N,N'-bis(4-isopropylphenyl)-N,N'-bis(4-t-butylphenyl)anthracene-9,10-diamine, 9,10-bis(4-diphenylaminophenyl)anthracene-9,10-bis(4-di(1-naphthylamino)phenyl)anthracene, 9,10-bis(4-di(2-naphthylamino)phenyl) anthracene, 10-di-p-tolylamino-9-(4-di-p-tolylamino-1-naphthyl)anthracene, 10-diphenylamino-9-(4-diphenylamino-1-naphthyl)anthracene, and 10-diphenylamino-9-(6-diphenylamino-2-naphthyl) anthracene.

Other examples include [4-(4-diphenylaminophenyl) naphthalen-1-yl]-diphenylamine, [6-(4-diphenylaminophenyl)naphthalen-2-yl]-diphenylamine, 4,4'-bis[4-diphenylaminonaphthalen-1-yl]biphenyl, 4,4'-bis[6-diphenylaminonaphthalen-2-yl]biphenyl, 4,4"-bis[4-diphenylaminonaphthalen-1-yl]-p-terphenyl, and 4,4"-bis[6-diphenylaminonaphthalen-2-yl]-p-terphenyl.

An aromatic amine derivative described in JP 2006-156888 A or the like may also be used.

Examples of the coumarin derivative include coumarin-6 and coumarin-334.

Coumarin derivatives described in JP 2004-43646 A, JP 2001-76876 A, JP 6-298758 A, and the like may also be used.

Examples of the pyran derivative include DCM and DCJTB described below.

DCM

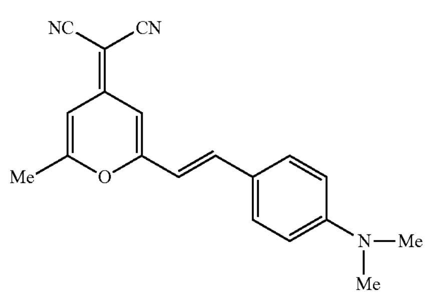

-continued

DCJTB

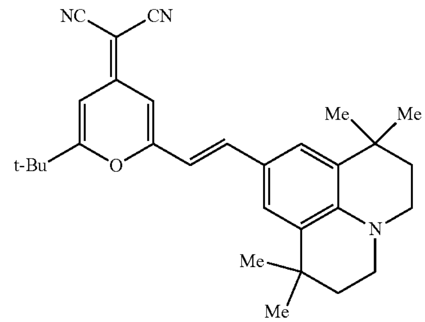

Pyran derivatives described in JP 2005-126399 A, JP 2005-097283 A, JP 2002-234892 A, JP 2001-220577 A, JP 2001-081090 A, JP 2001-052869 A, and the like may also be used.

<Electron Injection Layer and Electron Transport Layer in Organic Electroluminescent Element>

The electron injection layer 107 plays a role of efficiently injecting an electron migrating from the negative electrode 108 into the light emitting layer 105 or the electron transport layer 106. The electron transport layer 106 plays a role of efficiently transporting an electron injected from the negative electrode 108, or an electron injected from the negative electrode 108 through the electron injection layer 107 to the light emitting layer 105. The electron transport layer 106 and the electron injection layer 107 are each formed by laminating and mixing one or more kinds of electron transport/injection materials, or by a mixture of an electron transport/injection material and a polymeric binder.

An electron injection/transport layer is a layer that manages injection of an electron from a negative electrode and transport of an electron, and is preferably a layer that has high electron injection efficiency and can efficiently transport an injected electron. For this purpose, a substance which has high electron affinity, large electron mobility, and excellent stability, and in which impurities that serve as traps are not easily generated at the time of manufacturing and at the time of use, is preferable. However, when a transport balance between a hole and an electron is considered, in a case where the electron injection/transport layer mainly plays a role of efficiently preventing a hole coming from a positive electrode from flowing toward a negative electrode side without being recombined, even if electron transporting ability is not so high, an effect of enhancing luminous efficiency is equal to that of a material having high electron transporting ability. Therefore, the electron injection/transport layer according to the present embodiment may also include a function of a layer that can efficiently prevent migration of a hole.

A material (electron transport material) for forming the electron transport layer 106 or the electron injection layer 107 can be arbitrarily selected for use from compounds conventionally used as electron transfer compounds in a photoconductive material, and known compounds that are used in an electron injection layer and an electron transport layer of an organic EL element.

A material used in an electron transport layer or an electron injection layer preferably includes at least one selected from a compound formed of an aromatic ring or a heteroaromatic ring including one or more kinds of atoms selected from carbon, hydrogen, oxygen, sulfur, silicon, and phosphorus atoms, a pyrrole derivative and a fused ring derivative thereof, and a metal complex having an electron-accepting nitrogen atom. Specific examples of the material include a fused ring-based aromatic ring derivative of naphthalene, anthracene, or the like, a styryl-based aromatic ring derivative represented by 4,4'-bis(diphenylethenyl)biphenyl, a perinone derivative, a coumarin derivative, a naphthalimide derivative, a quinone derivative such as anthraquinone or diphenoquinone, a phosphorus oxide derivative, a carbazole derivative, and an indole derivative. Examples of the metal complex having an electron-accepting nitrogen atom include a hydroxyazole complex such as a hydroxyphenyloxazole complex, an azomethine complex, a tropolone metal complex, a flavonol metal complex, and a benzoquinoline metal complex. These materials are used singly, but may also be used in a mixture with other materials.

Furthermore, specific examples of other electron transfer compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (1,3-bis[(4-t-butylphenyl)-1,3,4-oxadiazolyl]phenylene and the like), a thiophene derivative, a triazole derivative (N-naphthyl-2,5-diphenyl-1,3,4-triazole and the like), a thiadiazole derivative, a metal complex of an oxine derivative, a quinolinol-based metal complex, a quinoxaline derivative, a polymer of a quinoxaline derivative, a benzazole compound, a gallium complex, a pyrazole derivative, a perfluorinated phenylene derivative, a triazine derivative, a pyrazine derivative, a benzoquinoline derivative (2,2'-bis(benzo[h]quinolin-2-yl)-9,9'-spirobifluorene and the like), an imidazopyridine derivative, a borane derivative, a benzimidazole derivative (tris(N-phenylbenzimidazol-2-yl)benzene and the like), a benzoxazole derivative, a benzothiazole derivative, a quinoline derivative, an oligopyridine derivative such as terpyridine, a bipyridine derivative, a terpyridine derivative (1,3-bis(4'-(2,2':6'2"-terpyridinyl))benzene and the like), a naphthyridine derivative (bis(1-naphthyl)-4-(1,8-naphthyridin-2-yl)phenylphosphine oxide and the like), an aldazine derivative, a carbazole derivative, an indole derivative, a phosphorus oxide derivative, and a bisstyryl derivative.

Furthermore, a metal complex having an electron-accepting nitrogen atom can also be used, and examples thereof include a quinolinol-based metal complex, a hydroxyazole complex such as a hydroxyphenyloxazole complex, an azomethine complex, a tropolone-metal complex, a flavonol-metal complex, and a benzoquinoline-metal complex.

The materials described above are used singly, but may also be used in a mixture with other materials.

Among the above materials, a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, and a quinolinol-based metal complex are preferable.

<Borane Derivative>

The borane derivative is, for example, a compound represented by the following general formula (ETM-1), and specifically disclosed in JP 2007-27587 A.

(ETM-1)

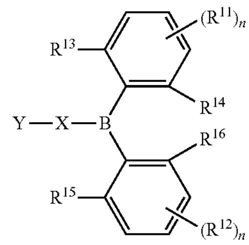

In the above formula (ETM-1), $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl, or an optionally substituted aryl, X represents an optionally substituted arylene, Y represents an optionally substituted aryl having 16 or fewer carbon atoms, a substituted boryl, or an optionally substituted carbazolyl, and n's each independently represent an integer of 0 to 3.

Among compounds represented by the above general formula (ETM-1), a compound represented by the following general formula (ETM-1-1) and a compound represented by the following general formula (ETM-1-2) are preferable.

(ETM-1-1)

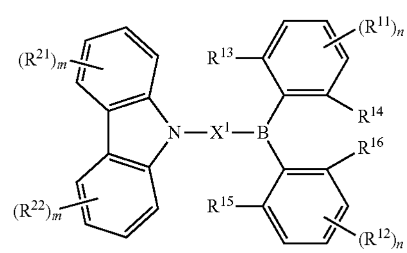

In formula (ETM-1-1), $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl, or an optionally substituted aryl, $R^{21}$ and $R^{22}$ each independently represent at least one of a hydrogen atom, an alkyl, an optionally substituted aryl, a substituted silyl, an optionally substituted nitrogen-containing heterocyclic ring, and cyano, $X^1$ represents an optionally substituted arylene having 20 or fewer carbon atoms, n's each independently represent an integer of 0 to 3, and m's each independently represent an integer of 0 to 4.

(ETM-1-2)

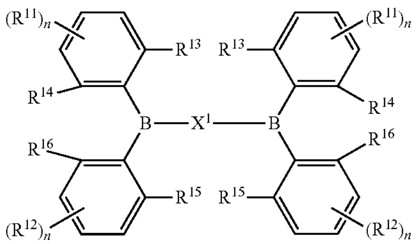

In formula (ETM-1-2), $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl, or an optionally substituted aryl, $X^1$ represents an optionally substituted arylene having 20 or fewer carbon atoms, and n's each independently represent an integer of 0 to 3.

Specific examples of $X^1$ include divalent groups represented by the following formulas (X-1) to (X-9).

(X-1)

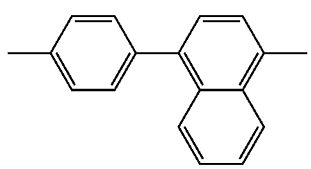

(X-2)

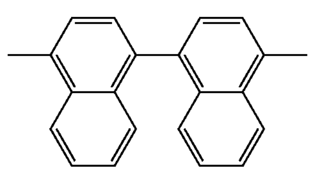

(X-3)

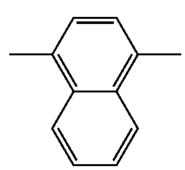

(X-4)

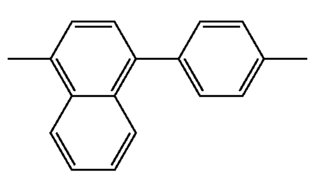

(X-5)

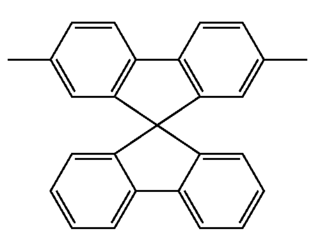

-continued (X-6)

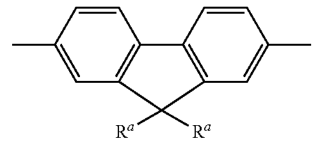

(X-7)

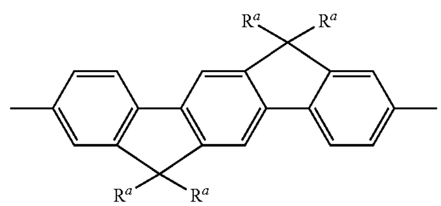

(X-8)

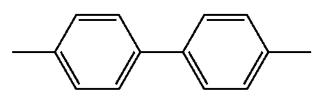

(X-9)

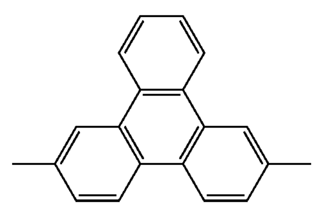

(In each formula, $R^a$'s each independently represent an alkyl group, or an optionally substituted phenyl group.)

Specific examples of this borane derivative include the following compounds.

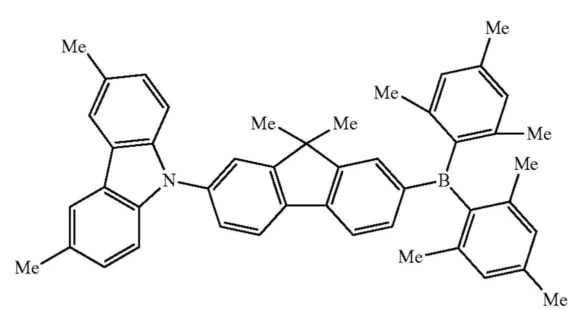 [SMILES: Cc1cc(C)c(B(c2ccc3c(c2)C(C)(C)c2cc(-n4c5ccc(C)cc5c5cc(C)ccc54)ccc2-3)c2c(C)cc(C)cc2C)c(C)c1]

This borane derivative can be manufactured using known raw materials and known synthesis methods.

<Pyridine Derivative>

A pyridine derivative is, for example, a compound represented by the following formula (ETM-2), and preferably a compound represented by formula (ETM-2-1) or (ETM-2-2).

(ETM-2)

$$\phi\text{—(Pyridine-based-substituent)}_n$$

(ETM-2-1)

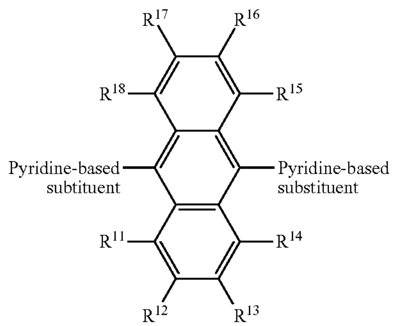

(ETM-2-2)

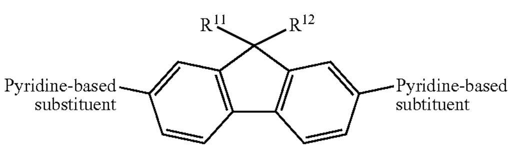

φ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4.

In the above formula (ETM-2-1), $R^{11}$ to $R^{18}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms).

In the above formula (ETM-2-2), $R^{11}$ and $R^{12}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms), and $R^{11}$ and $R^{12}$ may be bonded to each other to form a ring.

In each formula, the "pyridine-based substituent" is any one of the following formulas (Py-1) to (Py-15), and the pyridine-based substituents may be each independently substituted by an alkyl having 1 to 4 carbon atoms. Furthermore, the pyridine-based substituent may be bonded to φ, an anthracene ring, or a fluorene ring in each formula via a phenylene group or a naphthylene group.

(Py-1)

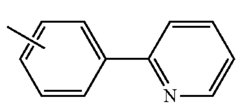

(Py-2)

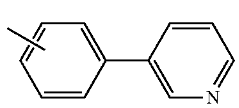

(Py-3)

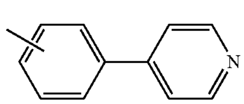

-continued (Py-4)

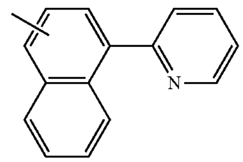

(Py-5)

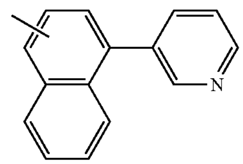

(Py-6)

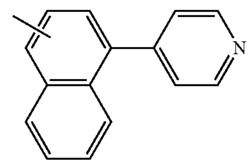

(Py-7)

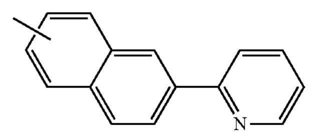

(Py-8)

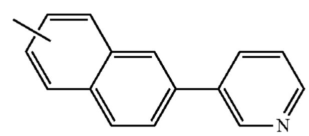

(Py-9)

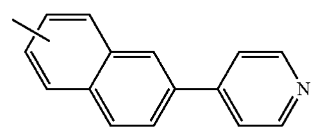

(Py-10)

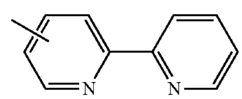

(Py-11)

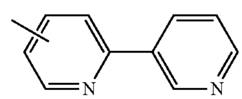

(Py-12)

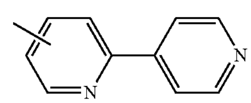

(Py-13)

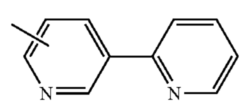

(Py-14)

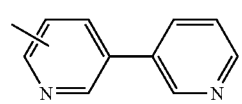

(Py-15)

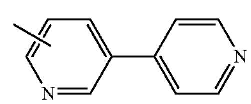

The pyridine-based substituent is any one of the above-formulas (Py-1) to (Py-15). However, among these formulas, the pyridine-based substituent is preferably any one of the following formulas (Py-21) to (Py-44).
(Py-21)
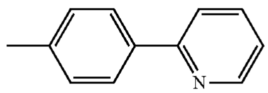
(Py-22)
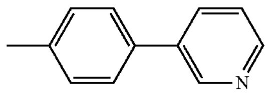
(Py-23)
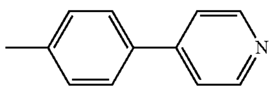
(Py-24)
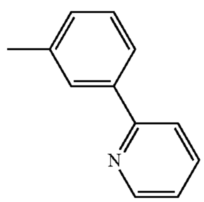
(Py-25)
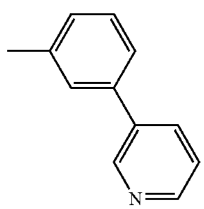
(Py-26)
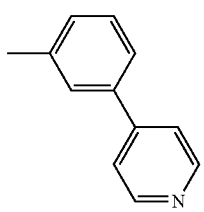
(Py-27)
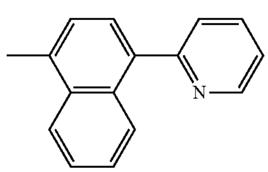
(Py-28)
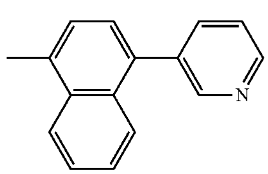
(Py-29)
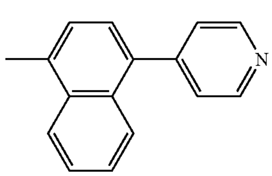
-continued
(Py-30)
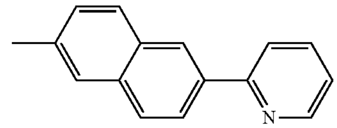
(Py-31)
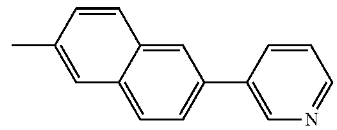
(Py-32)
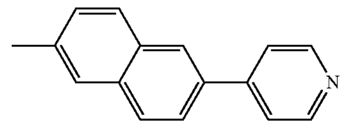
(Py-33)
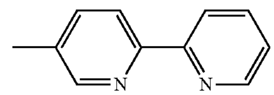
(Py-34)
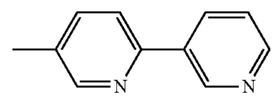
(Py-35)
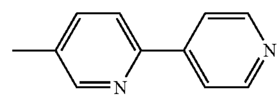
(Py-36)
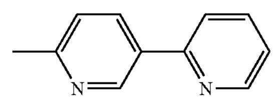
(Py-37)
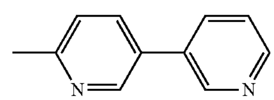
(Py-38)
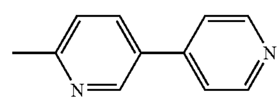
(Py-39)
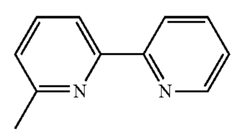
(Py-40)
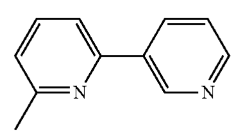
(Py-41)
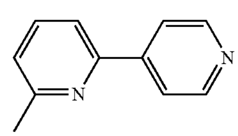
(Py-42)
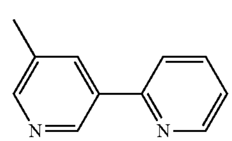

-continued (Py-43)

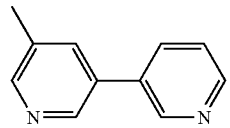

(Py-44)

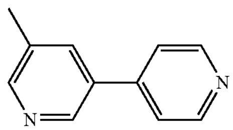

At least one hydrogen atom in each pyridine derivative may be substituted by a deuterium atom. Furthermore, one of the two "pyridine-based substituents" in the above formulas (ETM-2-1) and (ETM-2-2) may be substituted by an aryl.

The "alkyl" in $R^{11}$ to $R^{18}$ may be either linear or branched, and examples thereof include a linear alkyl having 1 to 24 carbon atoms and a branched alkyl having 3 to 24 carbon atoms. A preferable "alkyl" is an alkyl having 1 to 18 carbon atoms (branched alkyl having 3 to 18 carbon atoms) A more preferable "alkyl" is an alkyl having 1 to 12 carbons (branched alkyl having 3 to 12 carbons). A still more preferable "alkyl" is an alkyl having 1 to 6 carbon atoms (branched alkyl having 3 to 6 carbon atoms). A particularly preferable "alkyl" is an alkyl having 1 to 4 carbon atoms (branched alkyl having 3 to 4 carbon atoms).

Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

As the alkyl having 1 to 4 carbon atoms by which the pyridine-based substituent is substituted, the above description of the alkyl can be cited.

Examples of the "cycloalkyl" in $R^{11}$ to $R^{18}$ include a cycloalkyl having 3 to 12 carbon atoms. A preferable "cycloalkyl" is a cycloalkyl having 3 to 10 carbons. A more preferable "cycloalkyl" is a cycloalkyl having 3 to 8 carbon atoms. A still more preferable "cycloalkyl" is a cycloalkyl having 3 to 6 carbon atoms.

Specific examples of the "cycloalkyl" include cyclopropyl, cyclobutyl, cyclopentyl, cyclohexyl, methylcyclopentyl, cycloheptyl, methylcyclohexyl, cyclooctyl, and dimethylcyclohexyl.

As the "aryl" in $R^{11}$ to $R^{18}$, a preferable aryl is an aryl having 6 to 30 carbon atoms, a more preferable aryl is an aryl having 6 to 18 carbon atoms, a still more preferable aryl is an aryl having 6 to 14 carbon atoms, and a particularly preferable aryl is an aryl having 6 to 12 carbon atoms.

Specific examples of the "aryl having 6 to 30 carbon atoms" include phenyl which is a monocyclic aryl; (1-,2-) naphthyl which is a fused bicyclic aryl; acenaphthylene-(1-, 3-,4-,5-)yl, a fluorene-(1-,2-,3-,4-,9-)yl, phenalene-(1-, 2-)yl, and (1-,2-,3-,4-,9-)phenanthryl which are fused tricyclic aryls; triphenylene-(1-, 2-)yl, pyrene-(1-, 2-, 4-)yl, and naphthacene-(1-, 2-, 5-)yl which are fused tetracyclic aryls; and perylene-(1-,2-,3-)yl and pentacene-(1-, 2-, 5-, 6-)yl which are fused pentacyclic aryls.

Preferable examples of the "aryl having 6 to 30 carbon atoms" include a phenyl, a naphthyl, a phenanthryl, a chrysenyl, and a triphenylenyl. More preferable examples thereof include a phenyl, a 1-naphthyl, a 2-naphthyl, and a phenanthryl. Particularly preferable examples thereof include a phenyl, a 1-naphthyl, and a 2-naphthyl.

$R^{11}$ and $R^{12}$ in the above formula (ETM-2-2) may be bonded to each other to form a ring. As a result, cyclobutane, cyclopentane, cyclopentene, cyclopentadiene, cyclohexane, fluorene, indene, or the like may be spiro-bonded to a 5-membered ring of a fluorene skeleton.

Specific examples of this pyridine derivative include the following compounds.

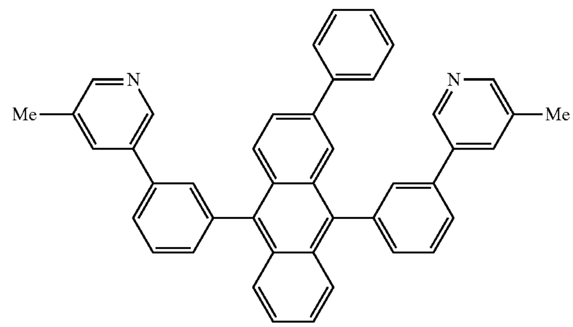

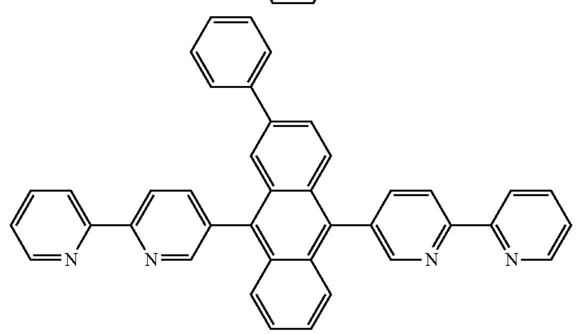

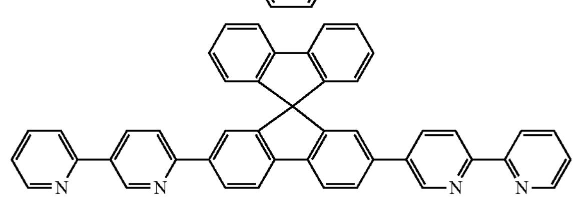

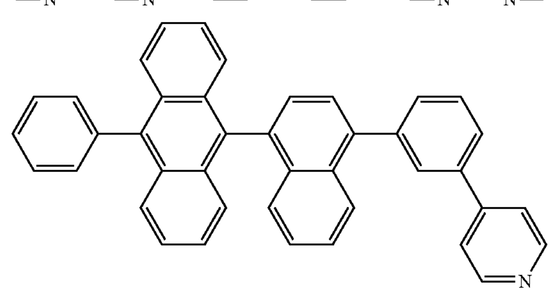

This pyridine derivative can be manufactured using known raw materials and known synthesis methods.

<Fluoranthene Derivative>

The fluoranthene derivative is, for example, a compound represented by the following general formula (ETM-3), and specifically disclosed in WO 2010/134352 A.

(ETM-3)

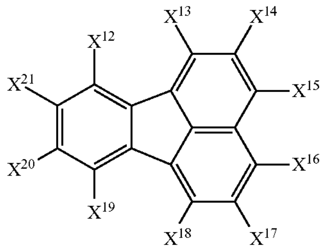

In the above formula (ETM-3), $X^{12}$ to $X^{21}$ each represent a hydrogen atom, a halogen atom, a linear, branched or cyclic alkyl, a linear, branched or cyclic alkoxy, a substituted or unsubstituted aryl, or a substituted or unsubstituted heteroaryl.

Specific examples of this fluoranthene derivative include the following compounds.

(ETM-3-1)

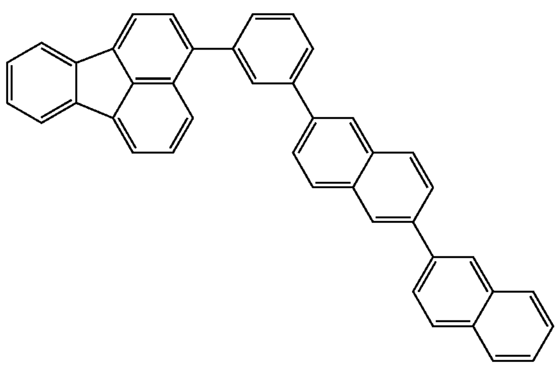

(ETM-3-2)

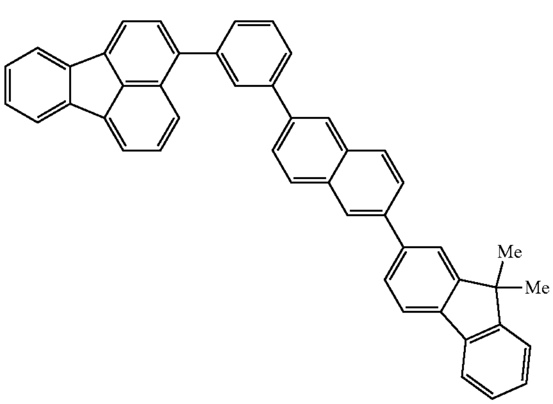

-continued (ETM-3-3)

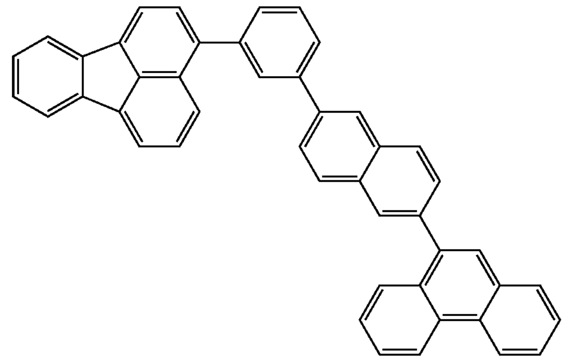

<BO-Based Derivative>

The BO-based derivative is, for example, a polycyclic aromatic compound represented by the following formula (ETM-4) or a polycyclic aromatic compound multimer having a plurality of structures represented by the following formula (ETM-4).

(ETM-4)

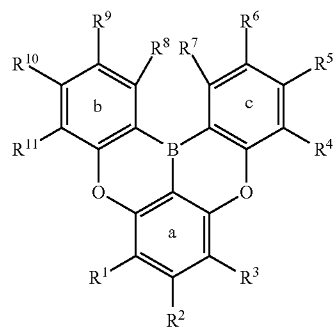

$R^1$ to $R^{11}$ each independently represent a hydrogen atom, an aryl, a heteroaryl, a diarylamino, a diheteroarylamino, an arylheteroarylamino, an alkyl, an alkoxy, or an aryloxy, while at least one hydrogen atom in these may be substituted by an aryl, a heteroaryl, or an alkyl.

Furthermore, adjacent groups among $R^1$ to $R^{11}$ may be bonded to each other to form an aryl ring or a heteroaryl ring together with the ring a, ring b, or ring c, and at least one hydrogen atom in the ring thus formed may be substituted by an aryl, a heteroaryl, a diarylamino, a diheteroarylamino, an arylheteroarylamino, an alkyl, an alkoxy, or an aryloxy, while at least one hydrogen atom in these may be substituted by an aryl, a heteroaryl, or an alkyl.

Furthermore, at least one hydrogen atom in a compound or structure represented by formula (ETM-4) may be substituted by a halogen atom or a deuterium atom.

For description of a substituent in formula (ETM-4), a form of ring formation, and a multimer formed by combining multiple structures of formula (ETM-4), the description of the polycyclic aromatic compound represented by the above general formula (2) and the multimer thereof can be cited.

Specific examples of this BO-based derivative include the following compounds.

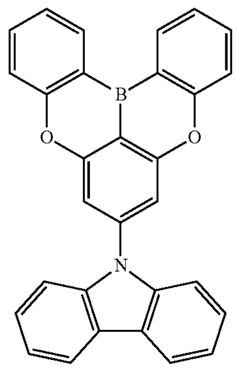 [SMILES: c1ccc2c(c1)Oc1cc(-n3c4ccccc4c4ccccc43)cc3c1B2c1ccccc1O3]

This BO-based derivative can be manufactured using known raw materials and known synthesis methods.

<Anthracene Derivative>

One of the anthracene derivatives is, for example, a compound represented by the following formula (ETM-5-1).

(ETM-5-1)

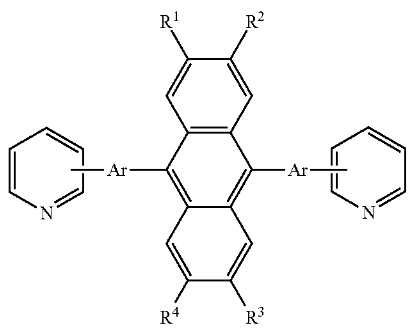

Ar's each independently represent a divalent benzene or naphthalene, $R^1$ to $R^4$ each independently represent a hydrogen atom, an alkyl having 1 to 6 carbon atoms, a cycloalkyl having 3 to 6 carbon atoms, or an aryl having 6 to 20 carbon atoms.

Ar's can be each independently selected from a divalent benzene and naphthalene appropriately. Two Ar's may be different from or the same as each other, but are preferably the same from a viewpoint of easiness of synthesis of an anthracene derivative. Ar is bonded to pyridine to form "a moiety formed of Ar and pyridine". For example, this moiety is bonded to anthracene as a group represented by any one of the following formulas (Py-1) to (Py-12).

(Py-1)

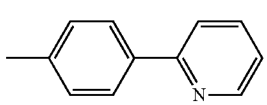

(Py-2)

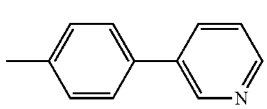

-continued (Py-3)

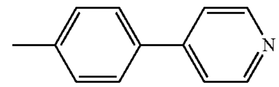

(Py-4)

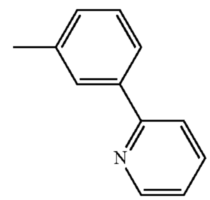

(Py-5)

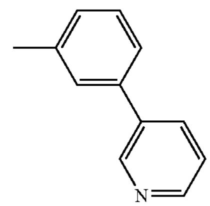

(Py-6)

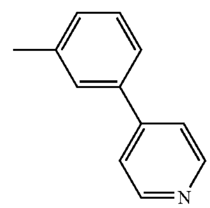

(Py-7)

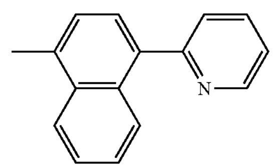

(Py-8)

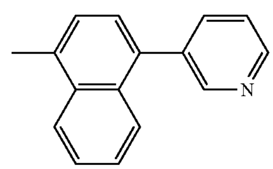

(Py-9)

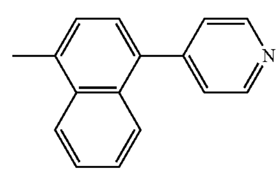

(Py-10)

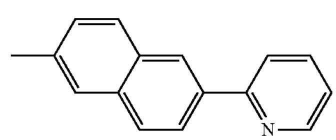

(Py-11)

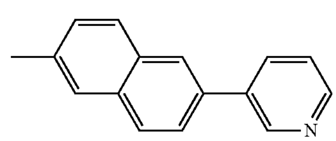

-continued (Py-12)

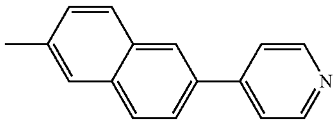

Among these groups, a group represented by any one of the above formulas (Py-1) to (Py-9) is preferable, and a group represented by any one of the above formulas (Py-1) to (Py-6) is more preferable. Two "moieties formed of Ar and pyridine" bonded to anthracene may have the same structure as or different structures from each other, but preferably have the same structure from a viewpoint of easiness of synthesis of an anthracene derivative. However, two "moieties formed of Ar and pyridine" preferably have the same structure or different structures from a viewpoint of element characteristics.

The alkyl having 1 to 6 carbon atoms in $R^1$ to $R^4$ may be either linear or branched. That is, the alkyl having 1 to 6 carbon atoms is a linear alkyl having 1 to 6 carbon atoms or a branched alkyl having 3 to 6 carbon atoms. More preferably, the alkyl having 1 to 6 carbon atoms is an alkyl having 1 to 4 carbon atoms (branched alkyl having 3 to 4 carbon atoms). Specific examples thereof include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, and 2-ethylbutyl. Methyl, ethyl, n-propyl, isopropyl, n-butyl, isobutyl, s-butyl, and t-butyl are preferable. Methyl, ethyl, and t-butyl are more preferable.

Specific examples of the cycloalkyl having 3 to 6 carbon atoms in $R^1$ to $R^4$ include cyclopropyl, cyclobutyl, cyclopentyl, cyclohexyl, methylcyclopentyl, cycloheptyl, methylcyclohexyl, cyclooctyl, and dimethylcyclohexyl.

For the aryl having 6 to 20 carbon atoms in $R^1$ to $R^4$, an aryl having 6 to 16 carbon atoms is preferable, an aryl having 6 to 12 carbon atoms is more preferable, and an aryl having 6 to 10 carbon atoms is particularly preferable.

Specific examples of the "aryl having 6 to 20 carbon atoms" include phenyl, (o-, m-, p-) tolyl, (2,3-, 2,4-, 2,5-, 2,6-, 3,4-, 3,5-) xylyl, mesityl (2,4,6-trimethylphenyl), and (o-, m-, p-)cumenyl which are monocyclic aryls; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; anthracene-(1-, 2-, 9-)yl, acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; triphenylene-(1-, 2-)yl, pyrene-(1-, 2-, 4-)yl, and tetracene-(1-, 2-, 5-)yl which are fused tetracyclic aryls; and perylene-(1-, 2-, 3-)yl which is a fused pentacyclic aryl.

The "aryl having 6 to 20 carbon atoms" is preferably a phenyl, a biphenylyl, a terphenylyl, or a naphthyl, more preferably a phenyl, a biphenylyl, a 1-naphthyl, a 2-naphthyl, or an m-terphenyl-5'-yl, still more preferably a phenyl, a biphenylyl, a 1-naphthyl, or a 2-naphthyl, and most preferably a phenyl.

One of the anthracene derivatives is, for example, a compound represented by the following formula (ETM-5-2).

(ETM-5-2)

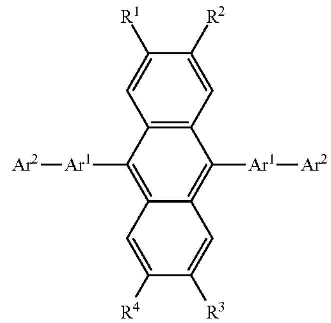

$Ar^1$'s each independently represent a single bond, a divalent benzene, naphthalene, anthracene, fluorene, or phenalene.

$Ar^2$'s each independently represent an aryl having 6 to 20 carbon atoms. The same description as the "aryl having 6 to 20 carbon atoms" in the above formula (ETM-5-1) can be cited. An aryl having 6 to 16 carbon atoms is preferable, an aryl having 6 to 12 carbon atoms is more preferable, and an aryl having 6 to 10 carbon atoms is particularly preferable. Specific examples thereof include phenyl, biphenylyl, naphthyl, terphenylyl, anthracenyl, acenaphthylenyl, fluorenyl, phenalenyl, phenanthryl, triphenylenyl, pyrenyl, tetracenyl, and perylenyl.

$R^1$ to $R^4$ each independently represent a hydrogen atom, an alkyl having 1 to 6 carbon atoms, a cycloalkyl having 3 to 6 carbon atoms, or an aryl having 6 to 20 carbon atoms. The same description as in the above formula (ETM-5-1) can be cited.

Specific examples of these anthracene derivatives include the following compounds.

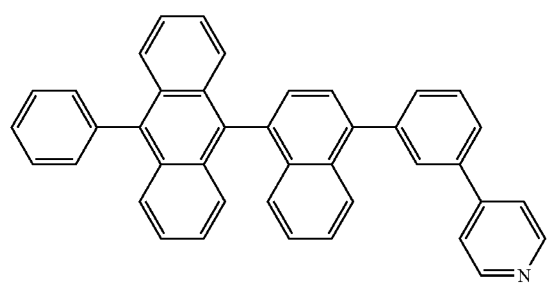

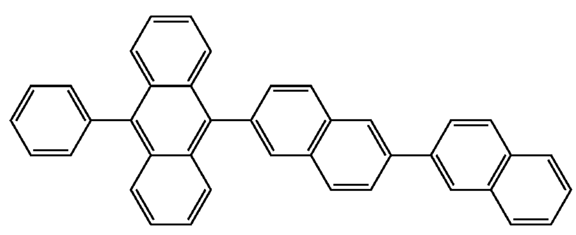

These anthracene derivatives can be manufactured using known raw materials and known synthesis methods.

<Benzofluorene Derivative>

The benzofluorene derivative is, for example, a compound represented by the following formula (ETM-6).

(ETM-6)

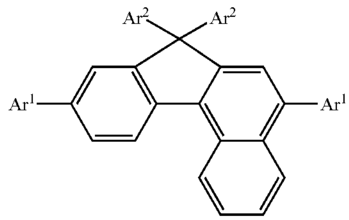

$Ar^1$'s each independently represent an aryl having 6 to 20 carbon atoms. The same description as the "aryl having 6 to 20 carbon atoms" in the above formula (ETM-5-1) can be cited. An aryl having 6 to 16 carbon atoms is preferable, an aryl having 6 to 12 carbon atoms is more preferable, and an aryl having 6 to 10 carbon atoms is particularly preferable. Specific examples thereof include phenyl, biphenylyl, naphthyl, terphenylyl, anthracenyl, acenaphthylenyl, fluorenyl, phenalenyl, phenanthryl, triphenylenyl, pyrenyl, tetracenyl, and perylenyl.

$Ar^2$'s each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms), and two $Ar^2$'s may be bonded to each other to form a ring.

The "alkyl" in $Ar^2$ may be either linear or branched, and examples thereof include a linear alkyl having 1 to 24 carbon atoms and a branched alkyl having 3 to 24 carbon atoms. A preferable "alkyl" is an alkyl having 1 to 18 carbon atoms (branched alkyl having 3 to 18 carbon atoms). A more preferable "alkyl" is an alkyl having 1 to 12 carbons (branched alkyl having 3 to 12 carbons). A still more preferable "alkyl" is an alkyl having 1 to 6 carbon atoms (branched alkyl having 3 to 6 carbon atoms). A particularly preferable "alkyl" is an alkyl having 1 to 4 carbon atoms (branched alkyl having 3 to 4 carbon atoms). Specific examples of the "alkyl" include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, and 1-methylhexyl.

Examples of the "cycloalkyl" in $Ar^2$ include a cycloalkyl having 3 to 12 carbon atoms. A preferable "cycloalkyl" is a cycloalkyl having 3 to 10 carbons. A more preferable "cycloalkyl" is a cycloalkyl having 3 to 8 carbon atoms. A still more preferable "cycloalkyl" is a cycloalkyl having 3 to 6 carbon atoms. Specific examples of the "cycloalkyl" include cyclopropyl, cyclobutyl, cyclopentyl, cyclohexyl, methylcyclopentyl, cycloheptyl, methylcyclohexyl, cyclooctyl, and dimethylcyclohexyl.

As the "aryl" in $Ar^2$, a preferable aryl is an aryl having 6 to 30 carbon atoms, a more preferable aryl is an aryl having 6 to 18 carbon atoms, a still more preferable aryl is an aryl having 6 to 14 carbon atoms, and a particularly preferable aryl is an aryl having 6 to 12 carbon atoms.

Specific examples of the "aryl having 6 to 30 carbon atoms" include phenyl, naphthyl, acenaphthylenyl, fluorenyl, phenalenyl, phenanthryl, triphenylenyl, pyrenyl, naphthacenyl, perylenyl, and pentacenyl.

Two $Ar^2$'s may be bonded to each other to form a ring. As a result, cyclobutane, cyclopentane, cyclopentene, cyclopentadiene, cyclohexane, fluorene, indene, or the like may be spiro-bonded to a 5-membered ring of a fluorene skeleton.

Specific examples of this benzofluorene derivative include the following compounds.

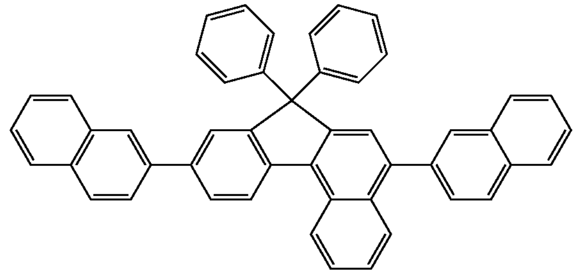

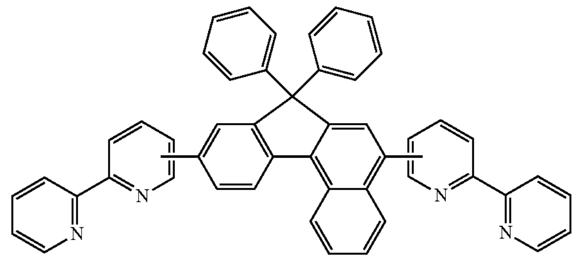

This benzofluorene derivative can be manufactured using known raw materials and known synthesis methods.

<Phosphine Oxide Derivative>

The phosphine oxide derivative is, for example, a compound represented by the following formula (ETM-7-1). Details are also described in WO 2013/079217 A.

(ETM-7-1)

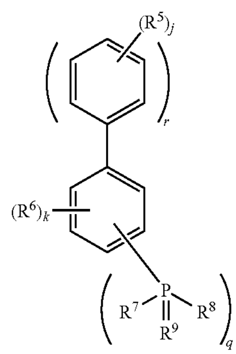

$R^5$ represents a substituted or unsubstituted alkyl having 1 to 20 carbon atoms, an aryl having 6 to 20 carbon atoms, or a heteroaryl having 5 to 20 carbon atoms, $R^6$ represents CN, a substituted or unsubstituted alkyl having 1 to 20 carbons, a heteroalkyl having 1 to 20 carbons, an aryl having 6 to 20 carbons, a heteroaryl having 5 to 20 carbons, an alkoxy having 1 to 20 carbons, or an aryloxy having 6 to 20 carbon atoms, $R^7$ and $R^8$ each independently represent a substituted or unsubstituted aryl having 6 to 20 carbon atoms or a heteroaryl having 5 to 20 carbon atoms, $R^9$ represents an oxygen atom or a sulfur atom, j represents 0 or 1, k represents 0 or 1, r represents an integer of 0 to 4, and q represents an integer of 1 to 3.

The phosphine oxide derivative may be, for example, a compound represented by the following formula (ETM-7-2).

(ETM-7-2)

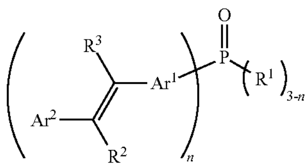

$R^1$ to $R^3$ may be the same as or different from each other and are selected from a hydrogen atom, an alkyl group, a cycloalkyl group, an aralkyl group, an alkenyl group, a cycloalkenyl group, an alkynyl group, an alkoxy group, an alkylthio group, an aryl ether group, an aryl thioether group, an aryl group, a heterocyclic group, a halogen atom, cyano group, an aldehyde group, a carbonyl group, a carboxyl group, an amino group, a nitro group, a silyl group, and a fused ring formed with an adjacent substituent.

$Ar^1$'s may be the same as or different from each other, and represents an arylene group or a heteroarylene group. $Ar^2$'s may be the same as or different from each other, and represents an aryl group or a heteroaryl group. However, at least one of $Ar^1$ and Are has a substituent or forms a fused ring with an adjacent substituent. n represents an integer of 0 to 3. When n is 0, no unsaturated structure portion is present. When n is 3, $R^1$ is not present.

Among these substituents, the alkyl group represents a saturated aliphatic hydrocarbon group such as a methyl group, an ethyl group, a propyl group, or a butyl group. This saturated aliphatic hydrocarbon group may be unsubstituted or substituted. The substituent in a case of being substituted is not particularly limited, and examples thereof include an alkyl group, an aryl group, and a heterocyclic group, and this point is also common to the following description. Furthermore, the number of carbon atoms in the alkyl group is not particularly limited, but is usually in a range of 1 to 20 from a viewpoint of availability and cost.

Furthermore, the cycloalkyl group represents a saturated alicyclic hydrocarbon group such as cyclopropyl, cyclohexyl, norbornyl, or adamantyl. This saturated alicyclic hydrocarbon group may be unsubstituted or substituted. The carbon number of the alkyl group moiety is not particularly limited, but is usually in a range of 3 to 20.

Furthermore, the aralkyl group represents an aromatic hydrocarbon group via an aliphatic hydrocarbon, such as a benzyl group or a phenylethyl group. Both the aliphatic hydrocarbon and the aromatic hydrocarbon may be unsubstituted or substituted. The carbon number of the aliphatic moiety is not particularly limited, but is usually in a range of 1 to 20.

Furthermore, the alkenyl group represents an unsaturated aliphatic hydrocarbon group containing a double bond, such as a vinyl group, an allyl group, or a butadienyl group. This unsaturated aliphatic hydrocarbon group may be unsubstituted or substituted. The carbon number of the alkenyl group is not particularly limited, but is usually in a range of 2 to 20.

Furthermore, the cycloalkenyl group represents an unsaturated alicyclic hydrocarbon group containing a double bond, such as a cyclopentenyl group, a cyclopentadienyl group, or a cyclohexene group. This unsaturated alicyclic hydrocarbon group may be unsubstituted or substituted.

Furthermore, the alkynyl group represents an unsaturated aliphatic hydrocarbon group containing a triple bond, such as an acetylenyl group. This unsaturated aliphatic hydrocarbon group may be unsubstituted or substituted. The carbon number of the alkynyl group is not particularly limited, but is usually in a range of 2 to 20.

Furthermore, the alkoxy group represents an aliphatic hydrocarbon group via an ether bond, such as a methoxy group. The aliphatic hydrocarbon group may be unsubstituted or substituted. The carbon number of the alkoxy group is not particularly limited, but is usually in a range of 1 to 20.

Furthermore, the alkylthio group is a group in which an oxygen atom of an ether bond of an alkoxy group is substituted by a sulfur atom.

Furthermore, the aryl ether group represents an aromatic hydrocarbon group via an ether bond, such as a phenoxy group. The aromatic hydrocarbon group may be unsubstituted or substituted. The carbon number of the aryl ether group is not particularly limited, but is usually in a range of 6 to 40.

Furthermore, the aryl thioether group is a group in which an oxygen atom of an ether bond of an aryl ether group is substituted by a sulfur atom.

Furthermore, the aryl group represents an aromatic hydrocarbon group such as a phenyl group, a naphthyl group, a biphenylyl group, a phenanthryl group, a terphenyl group, or a pyrenyl group. The aryl group may be unsubstituted or substituted. The carbon number of the aryl group is not particularly limited, but is usually in a range of 6 to 40.

Furthermore, the heterocyclic group represents a cyclic structural group having an atom other than a carbon atom, such as a furanyl group, a thiophenyl group, an oxazolyl group, a pyridyl group, a quinolinyl group, or a carbazolyl group. This cyclic structural group may be unsubstituted or substituted. The carbon number of the heterocyclic group is not particularly limited, but is usually in a range of 2 to 30.

Halogen refers to fluorine, chlorine, bromine, and iodine.

The aldehyde group, the carbonyl group, and the amino group can include a group substituted by an aliphatic hydrocarbon, an alicyclic hydrocarbon, an aromatic hydrocarbon, a heterocyclic ring, or the like.

Furthermore, the aliphatic hydrocarbon, the alicyclic hydrocarbon, the aromatic hydrocarbon, and the heterocyclic ring may be unsubstituted or substituted.

The silyl group represents, for example, a silicon compound group such as a trimethylsilyl group. This silicon compound group may be unsubstituted or substituted. The number of carbon atoms of the silyl group is not particularly limited, but is usually in a range of 3 to 20. Furthermore, the number of silicon atoms is usually 1 to 6.

The fused ring formed with an adjacent substituent is, for example, a conjugated or unconjugated fused ring formed between $Ar^1$ and $R^2$, $Ar^1$ and $R^3$, $Ar^2$ and $R^2$, $Ar^2$ and $R^3$, $R^2$ and $R^3$, or $Ar^1$ and $Ar^2$. Here, when n is 1, two $R^1$'s may form a conjugated or unconjugated fused ring. These fused rings may contain a nitrogen atom, an oxygen atom, or a sulfur atom in the ring structure, or may be fused with another ring.

Specific examples of this phosphine oxide derivative include the following compounds.

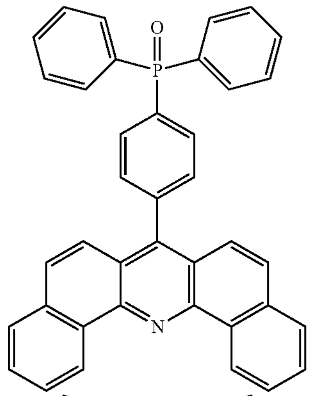

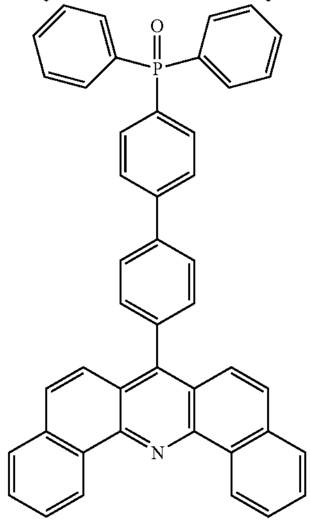

This phosphine oxide derivative can be manufactured using known raw materials and known synthesis methods.

<Pyrimidine Derivative>

The pyrimidine derivative is, for example, a compound represented by the following formula (ETM-8), and preferably a compound represented by the following formula (ETM-8-1). Details are also described in WO 2011/021689 A.

(ETM-8)

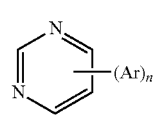

(ETM-8-1)

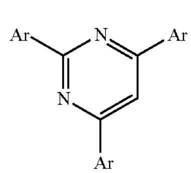

Ar's each independently represent an optionally substituted aryl or an optionally substituted heteroaryl. n represents an integer of 1 to 4, preferably an integer of 1 to 3, and more preferably 2 or 3.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. Furthermore, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the "heteroaryl" include furyl, thienyl, pyrrolyl, oxazolyl, isoxazolyl, thiazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl, and indolizinyl.

Furthermore, the above aryl and heteroaryl may be substituted, and may be each substituted by, for example, the above aryl or heteroaryl.

Specific examples of this pyrimidine derivative include the following compounds.

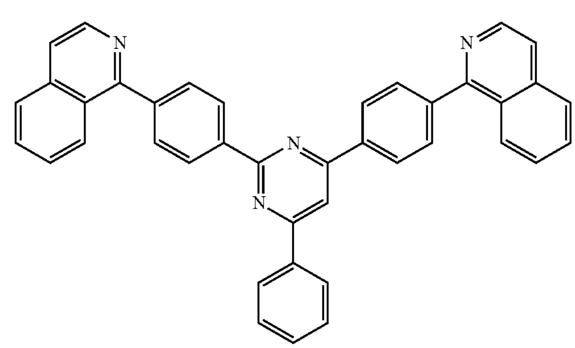 [SMILES: c1ccc(-c2cc(-c3ccc(-c4nccc5ccccc45)cc3)nc(-c3ccc(-c4nccc5ccccc45)cc3)n2)cc1]

This pyrimidine derivative can be manufactured using known raw materials and known synthesis methods.

<Carbazole Derivative>

The carbazole derivative is, for example, a compound represented by the following formula (ETM-9), or a multimer obtained by bonding a plurality of the compounds with a single bond or the like. Details are described in US 2014/0197386 A.

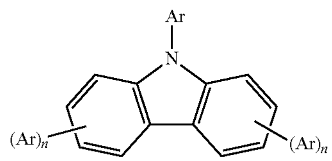

(ETM-9)

Ar's each independently represent an optionally substituted aryl or an optionally substituted heteroaryl. n represents an integer of 0 to 4, preferably an integer of 0 to 3, and more preferably 0 or 1.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. Furthermore, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the "heteroaryl" include furyl, thienyl, pyrrolyl, oxazolyl, isoxazolyl, thiazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl, and indolizinyl.

Furthermore, the above aryl and heteroaryl may be substituted, and may be each substituted by, for example, the above aryl or heteroaryl.

The carbazole derivative may be a multimer obtained by bonding a plurality of compounds represented by the above formula (ETM-9) with a single bond or the like. In this case, the compounds may be bonded with an aryl ring (preferably, a polyvalent benzene ring, naphthalene ring, anthracene ring, fluorene ring, benzofluorene ring, phenalene ring, phenanthrene ring or triphenylene ring) in addition to a single bond.

Specific examples of this carbazole derivative include the following compounds.

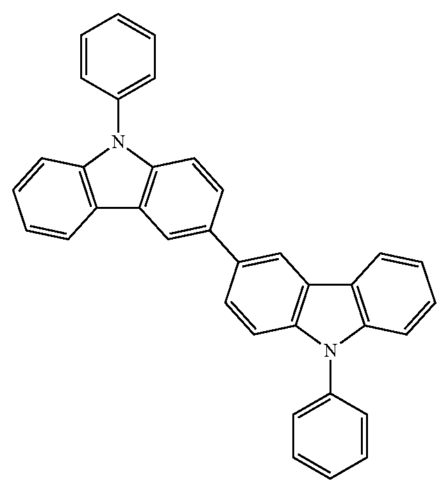

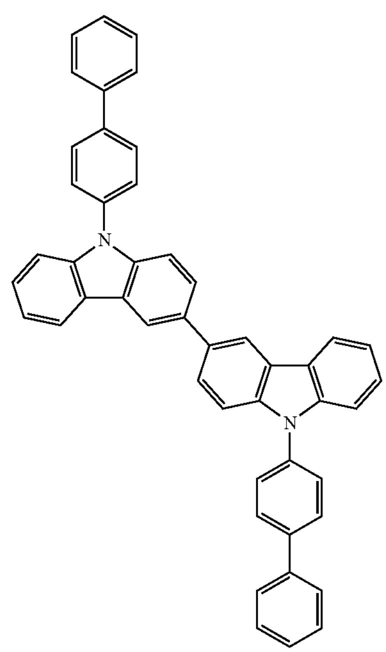

-continued

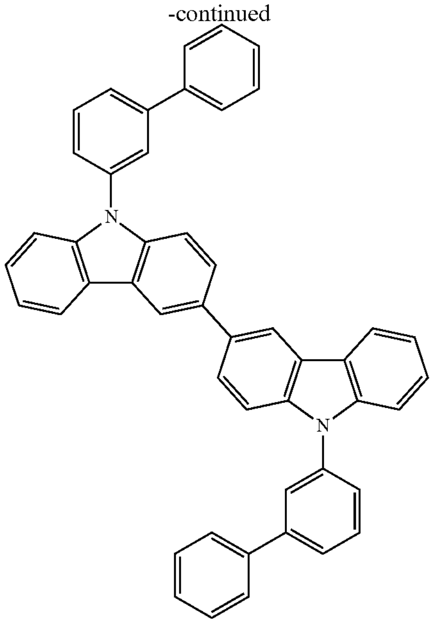

This carbazole derivative can be manufactured using known raw materials and known synthesis methods.

<Triazine Derivative>

The triazine derivative is, for example, a compound represented by the following formula (ETM-10), and preferably a compound represented by the following formula (ETM-10-1). Details are described in US 2011/0156013 A.

(ETM-10)

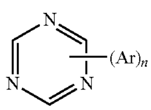

(ETM-10-1)

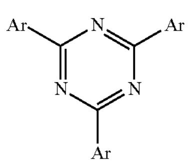

Ar's each independently represent an optionally substituted aryl or an optionally substituted heteroaryl. n represents an integer of 1 to 4, preferably an integer 1 to 3, more preferably 2 or 3.

Examples of the "aryl" as the "optionally substituted aryl" include an aryl having 6 to 30 carbon atoms. An aryl having 6 to 24 carbon atoms is preferable, an aryl having 6 to 20 carbon atoms is more preferable, and an aryl having 6 to 12 carbon atoms is still more preferable.

Specific examples of the "aryl" include phenyl which is a monocyclic aryl; (2-, 3-, 4-)biphenylyl which is a bicyclic aryl; (1-, 2-)naphthyl which is a fused bicyclic aryl; terphenylyl (m-terphenyl-2'-yl, m-terphenyl-4'-yl, m-terphenyl-5'-yl, o-terphenyl-3'-yl, o-terphenyl-4'-yl, p-terphenyl-2'-yl, m-terphenyl-2-yl, m-terphenyl-3-yl, m-terphenyl-4-yl, o-terphenyl-2-yl, o-terphenyl-3-yl, o-terphenyl-4-yl, p-terphenyl-2-yl, p-terphenyl-3-yl, p-terphenyl-4-yl) which is a tricyclic aryl; acenaphthylene-(1-, 3-, 4-, 5-)yl, fluorene-(1-, 2-, 3-, 4-, 9-)yl, phenalene-(1-, 2-)yl, and (1-, 2-, 3-, 4-, 9-)phenanthryl which are fused tricyclic aryls; quaterphenylyl-(5'-phenyl-m-terphenyl-2-yl, 5'-phenyl-m-terphenyl-3-yl, 5'-phenyl-m-terphenyl-4-yl, m-quaterphenylyl) which is a tetracyclic aryl; triphenylene-(1-, 2-)yl, pyrene-(1-, 2-, 4-)yl, and naphthacene-(1-, 2-, 5-)yl which are fused tetracyclic aryls; and perylene-(1-, 2-, 3-)yl and pentacene-(1-, 2-, 5-, 6-)yl which are fused pentacyclic aryls.

Examples of the "heteroaryl" as the "optionally substituted heteroaryl" include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. Furthermore, examples of the "heteroaryl" include a heterocyclic ring containing 1 to 5 heteroatoms selected from an oxygen atom, a sulfur atom, and a nitrogen atom in addition to a carbon atom as a ring-constituting atom.

Specific examples of the "heteroaryl" include furyl, thienyl, pyrrolyl, oxazolyl, isoxazolyl, thiazolyl, isothiazolyl, imidazolyl, pyrazolyl, oxadiazolyl, furazanyl, thiadiazolyl, triazolyl, tetrazolyl, pyridyl, pyrimidinyl, pyridazinyl, pyrazinyl, triazinyl, benzofuranyl, isobenzofuranyl, benzo[b]thienyl, indolyl, isoindolyl, 1H-indazolyl, benzoimidazolyl, benzoxazolyl, benzothiazolyl, 1H-benzotriazolyl, quinolyl, isoquinolyl, cinnolyl, quinazolyl, quinoxalinyl, phthalazinyl, naphthyridinyl, purinyl, pteridinyl, carbazolyl, acridinyl, phenoxazinyl, phenothiazinyl, phenazinyl, phenoxathiinyl, thianthrenyl, and indolizinyl.

Furthermore, the above aryl and heteroaryl may be substituted, and may be each substituted by, for example, the above aryl or heteroaryl.

Specific examples of this triazine derivative include the following compounds.

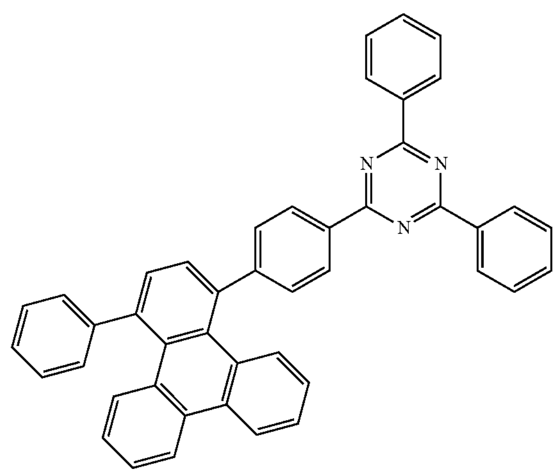

-continued

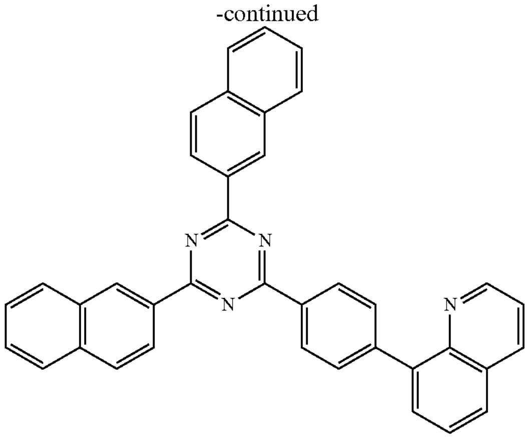

This triazine derivative can be manufactured using known raw materials and known synthesis methods.

<Benzimidazole Derivative>

The benzimidazole derivative is, for example, a compound represented by the following formula (ETM-11).

(ETM-11)

$$\phi \text{——(Benzimidazole-based substituent)}_n$$

φ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4. A "benzimidazole-based substituent" is a substituent in which the pyridyl group in the "pyridine-based substituent" in the formulas (ETM-2), (ETM-2-1), and (ETM-2-2) is substituted by a benzimidazole group, and at least one hydrogen atom in the benzimidazole derivative may be substituted by a deuterium atom.

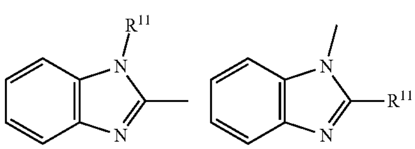

Benzimidazole group $R^{11}$ in the above benzimidazole represents a hydrogen atom, an alkyl having 1 to 24 carbon atoms, a cycloalkyl having 3 to 12 carbon atoms, or an aryl having 6 to 30 carbon atoms. The description of $R^{11}$ in the above formulas (ETM-2-1), and (ETM-2-2) can be cited.

Moreover, φ is preferably an anthracene ring or a fluorene ring. For the structure in this case, the description for the above formula (ETM-2-1) or (ETM-2-2) can be cited. For $R^{11}$ to $R^{18}$ in each formula, the description for the above formula (ETM-2-1) or (ETM-2-2) can be cited. Furthermore, in the above formula (ETM-2-1) or (ETM-2-2), a form in which two pyridine-based substituents are bonded has been described. However, when these substituents are substituted by benzimidazole-based substituents, both the pyridine-based substituents may be substituted by benzimidazole-based substituents (that is, n=2), or one of the pyridine-based substituents may be substituted by a benzimidazole-based substituent and the other pyridine-based substituent may be substituted by any one of $R^{11}$ to $R^{18}$ (that is, n=1). Moreover, for example, at least one of $R^{11}$ to $R^{18}$ in the above formula (ETM-2-1) may be substituted by a benzimidazole-based substituent and the "pyridine-based substituent" may be substituted by any one of $R^{11}$ to $R^{18}$.

Specific examples of this benzimidazole derivative include 1-phenyl-2-(4-(10-phenylanthracen-9-yl)phenyl)-1H-benzo[d]imidazole, 2-(4-(10-(naphthalen-2-yl)anthracen-9-yl)phenyl)-1-phenyl-1H-benzo[d]imidazole, 2-(3-(10-(naphthalen-2-yl)anthracen-9-yl)phenyl)-1-phenyl-1H-benzo[d]imidazole, 5-(10-(naphthlen-2-yl)anthracen-9-yl)-1,2-diphenyl-1H-benzo[d]imidazole, 1-(4-(10-(naphthalen-2-yl)anthracen-9-yl)phenyl)-2-phenyl-1H-benzo[d]imidazole, 2-(4-(9,10-di(naphthalen-2-yl)anthracen-2-yl)phenyl)-1-phenyl-1H-benzo[d]imidazole, 1-(4-(9,10-di(naphthalen-2-yl)anthracen-2-yl)phenyl)-2-phenyl-1H-benzo[d]imidazole, and 5-(9,10-di(naphthalen-2-yl)anthracen-2-yl)-1,2-diphenyl-1H-benzo[d]imidazole.

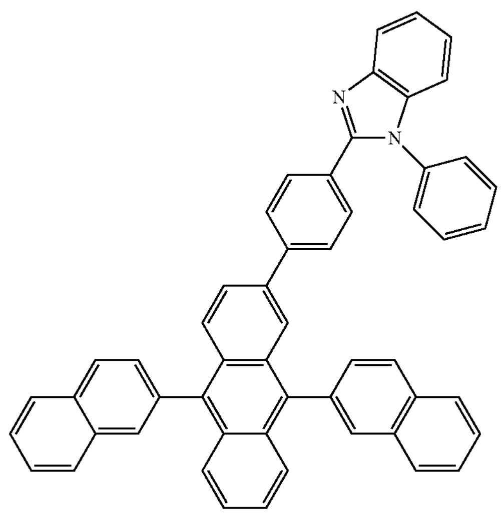

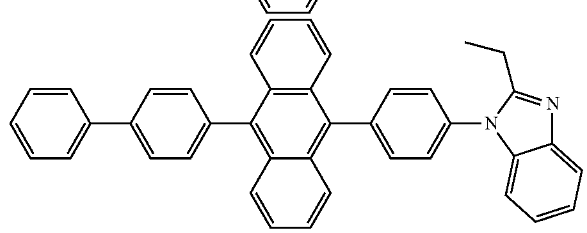

This benzimidazole derivative can be manufactured using known raw materials and known synthesis methods.

<Phenanthroline Derivative>

The phenanthroline derivative is, for example, a compound represented by the following formula (ETM-12) or (ETM-12-1). Details are described in WO 2006/021982 A.

(ETM-12)

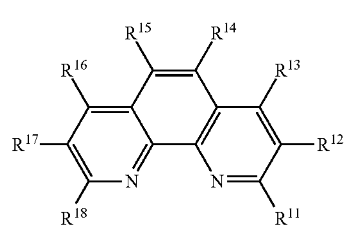

-continued (ETM-12-1)

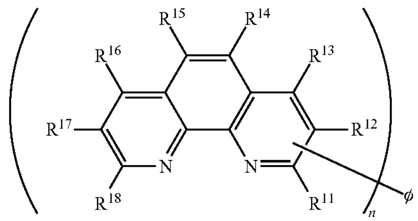

φ represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4.

In each formula, $R^{11}$ to $R^{18}$ each independently represent a hydrogen atom, an alkyl (preferably, an alkyl having 1 to 24 carbon atoms), a cycloalkyl (preferably, a cycloalkyl having 3 to 12 carbon atoms), or an aryl (preferably, an aryl having 6 to 30 carbon atoms). Furthermore, in the above formula (ETM-12-1), any one of $R^{11}$ to $R^{18}$ is bonded to φ which is an aryl ring.

At least one hydrogen atom in each phenanthroline derivative may be substituted by a deuterium atom.

For the alkyl, cycloalkyl, and aryl in $R^{11}$ to $R^{18}$, the description of $R^{11}$ to $R^{18}$ in the above formula (ETM-2) can be cited. Furthermore, in addition to the above examples, examples of the φ include those having the following structural formulas. Note that R's in the following structural formulas each independently represent a hydrogen atom, methyl, ethyl, isopropyl, cyclohexyl, phenyl, 1-naphthyl, 2-naphthyl, biphenylyl, or terphenylyl.

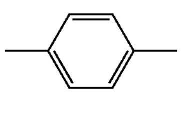
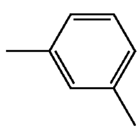
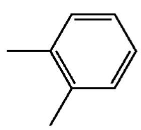

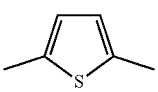
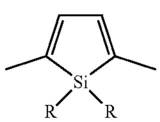
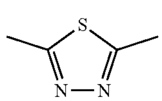

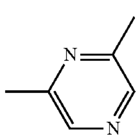
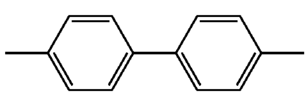

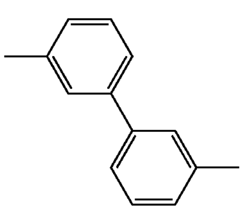
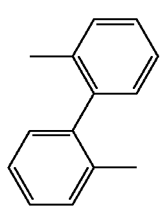

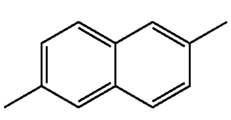
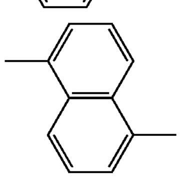

-continued

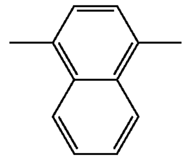
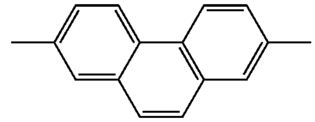

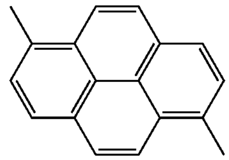
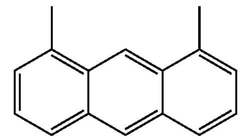

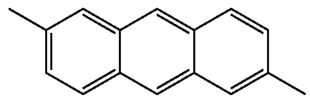

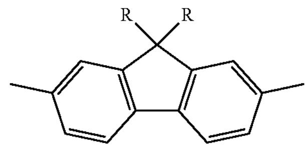

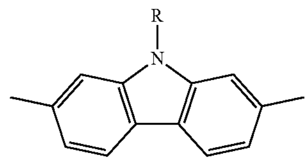
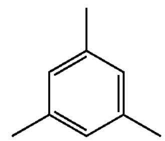

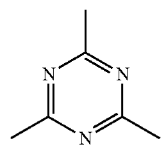
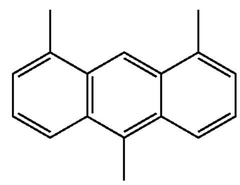

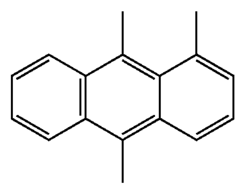
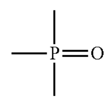

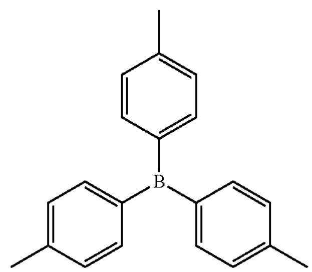

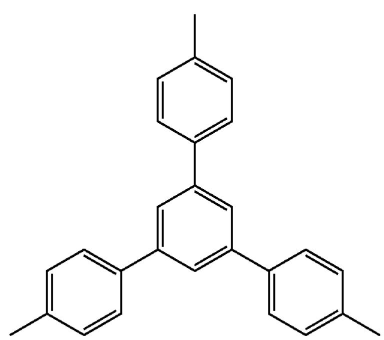

-continued

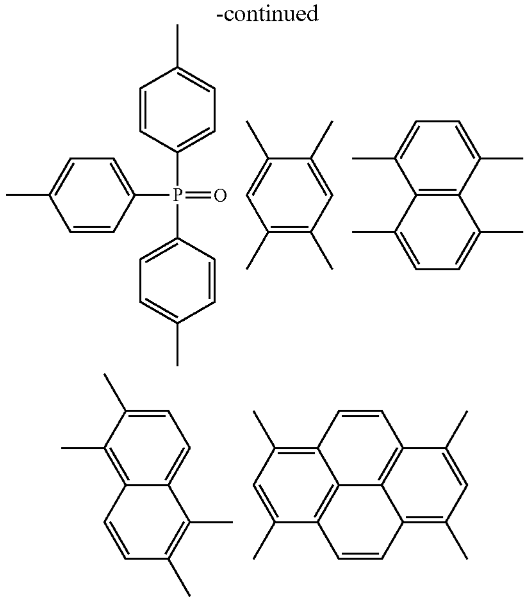

Specific examples of this phenanthroline derivative include 4,7-diphenyl-1,10-phenanthroline, 2,9-dimethyl-4,7-diphenyl-1,10-phenanthroline, 9,10-di(1,10-phenanthrolin-2-yl)anthracene, 2,6-di(1,10-phenanthrolin-5-yl)pyridine, 1,3,5-tri(1,10-phenanthrolin-5-yl)benzene, 9,9'-difluoro-bis(1,10-phenanthrolin-5-yl), bathocuproine, 1,3-bis(2-phenyl-1,10-phenanthrolin-9-yl) benzene, and the like.

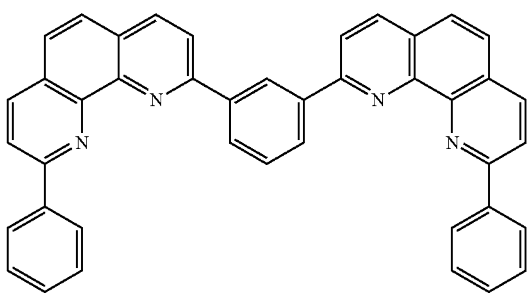 [SMILES: c1ccc(-c2ccc3ccc4ccc(-c5cccc(-c6ccc7ccc8ccc(-c9ccccc9)nc8c7n6)c5)nc4c3n2)cc1]

This phenanthroline derivative can be manufactured using known raw materials and known synthesis methods.

<Quinolinol-Based Metal Complex>

The quinolinol-based metal complex is, for example, a compound represented by the following general formula (ETM-13).

(ETM-13)

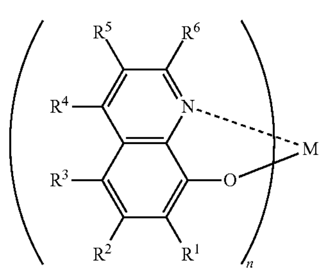

In the formula, $R^1$ to $R^6$ represent a hydrogen atom or substituent, M represents Li, Al, Ga, Be, or Zn, and n represents an integer of 1 to 3.

Specific examples of the quinolinol-based metal complex include 8-quinolinol lithium, tris(8-quinolinolato) aluminum, tris(4-methyl-8-quinolinolato) aluminum, tris(5-methyl-8-quinolinolato) aluminum, tris(3,4-dimethyl-8-quinolinolato) aluminum, tris(4,5-dimethyl-8-quinolinolato) aluminum, tris(4,6-dimethyl-8-quinolinolato) aluminum, bis(2-methyl-8-quinolinolato) (phenolato) aluminum, bis(2-methyl-8-quinolinolato) (2-methylphenolato) aluminum, bis(2-methyl-8-quinolinolato) (3-methylphenolato) aluminum, bis(2-methyl-8-quinolinolato) (4-methylphenolato) aluminum, bis(2-methyl-8-quinolinolato) (2-phenylphenolato) aluminum, bis(2-methyl-8-quinolinolato) (3-phenylphenolato) aluminum, bis(2-methyl-8-quinolinolato) (4-phenylphenolato) aluminum, bis(2-methyl-8-quinolinolato) (2,3-dimethylphenolato) aluminum, bis(2-methyl-8-quinolinolato) (2,6-dimethylphenolato) aluminum, bis(2-methyl-8-quinolinolato) (3,4-dimethylphenolato) aluminum, bis(2-methyl-8-quinolinolato) (3,5-dimethylphenolato) aluminum, bis(2-methyl-8-quinolinolato) (3,5-di-t-butylphenolato) aluminum, bis(2-methyl-8-quinolinolato) (2,6-diphenylphenolato) aluminum, bis(2-methyl-8-quinolinolato) (2,4,6-triphenylphenolato) aluminum, bis(2-methyl-8-quinolinolato) (2,4,6-trimethylphenolato) aluminum, bis(2-methyl-8-quinolinolato)(2,4,5,6-tetramethylphenolato) aluminum, bis(2-methyl-8-quinolinolato) (1-naphtholato) aluminum, bis(2-methyl-8-quinolinolato) (2-naphtholato) aluminum, bis(2,4-dimethyl-8-quinolinolato) (2-phenylphenolato) aluminum, bis(2,4-dimethyl-8-quinolinolato) (3-phenylphenolato) aluminum, bis(2,4-dimethyl-8-quinolinolato) (4-phenylphenolato) aluminum, bis(2,4-dimethyl-8-quinolinolato) (3,5-dimethylphenolato) aluminum, bis(2,4-dimethyl-8-quinolinolato) (3,5-di-t-butylphenolato) aluminum, bis(2-methyl-8-quinolinolato) aluminum-μ-oxo-bis(2-methyl-8-quinolinolato) aluminum, bis(2,4-dimethyl-8-quinolinolato) aluminum-μ-oxo-bis(2,4-dimethyl-8-quinolinolato) aluminum, bis(2-methyl-4-ethyl-8-quinolinolato) aluminum-μ-oxo-bis(2-methyl-4-ethyl-8-quinolinolato) aluminum, bis(2-methyl-4-methoxy-8-quinolinolato) aluminum-μ-oxo-bis(2-methyl-4-methoxy-8-quinolinolato) aluminum, bis(2-methyl-5-cyano-8-quinolinolato) aluminum-μ-oxo-bis(2-methyl-5-cyano-8-quinolinolato) aluminum, bis(2-methyl-5-trifluoromethyl-8-quinolinolato) aluminum-μ-oxo-bis(2-methyl-5-trifluoromethyl-8-quinolinolato) aluminum, and bis(10-hydroxybenzo[h]quinoline) beryllium.

This quinolinol-based metal complex can be manufactured using known raw materials and known synthesis methods.

<Thiazole Derivative and Benzothiazole Derivative>

The thiazole derivative is, for example, a compound represented by the following formula (ETM-14-1).

$$\phi\text{-(Thiazole-based substituent)}_n \qquad \text{(ETM-14-1)}$$

The benzothiazole derivative is, for example, a compound represented by the following formula (ETM-14-2).

$$\phi\text{-(Benzothiazole-based substituent)}_n \qquad \text{(ETM-14-2)}$$

φ in each formula represents an n-valent aryl ring (preferably, an n-valent benzene ring, naphthalene ring, anthracene ring, fluorene ring, benzofluorene ring, phenalene ring, phenanthrene ring, or triphenylene ring), and n represents an integer of 1 to 4. A "thiazole-based substituent" or a "benzothiazole-based substituent" is a substituent in which the pyridyl group in the "pyridine-based substituent" in the formulas (ETM-2), (ETM-2-1), and (ETM-2-2) is substituted by the following thiazole group or benzothiazole group, and at least one hydrogen atom in the thiazole derivative and the benzothiazole derivative may be substituted by a deuterium atom.

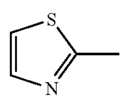
Thiazole group

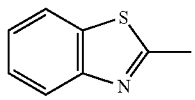
Benzothiazole group

Moreover, φ is preferably an anthracene ring or a fluorene ring. For the structure in this case, the description for the above formula (ETM-2-1) or (ETM-2-2) can be cited. For $R^{11}$ to $R^{18}$ in each formula, the description for the above formula (ETM-2-1) or (ETM-2-2) can be cited. Furthermore, in the above formula (ETM-2-1) or (ETM-2-2), a form in which two pyridine-based substituents are bonded has been described. However, when these substituents are substituted by thiazole-based substituents (or benzothiazole-based substituents), both the pyridine-based substituents may be substituted by thiazole-based substituents (or benzothiazole-based substituents) (that is, n=2), or one of the pyridine-based substituents may be substituted by a thiazole-based substituent (or benzothiazole-based substituent) and the other pyridine-based substituent may be substituted by any one of $R^{11}$ to $R^{18}$ (that is, n=1). Moreover, for example, at least one of $R^{11}$ to $R^{18}$ in the above formula (ETM-2-1) may be substituted by a thiazole-based substituent (or benzothiazole-based substituent) and the "pyridine-based substituent" may be substituted by any one of $R^{11}$ to $R^{18}$.

These thiazole derivatives or benzothiazole derivatives can be manufactured using known raw materials and known synthesis methods.

An electron transport layer or an electron injection layer may further contain a substance that can reduce a material to form an electron transport layer or an electron injection layer. As this reducing substance, various substances are used as long as having reducibility to a certain extent. For example, at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal, can be suitably used.

Preferable examples of the reducing substance include an alkali metal such as Na (work function 2.36 eV), K (work function 2.28 eV), Rb (work function 2.16 eV), or Cs (work function 1.95 eV); and an alkaline earth metal such as Ca (work function 2.9 eV), Sr (work function 2.0 to 2.5 eV), or Ba (work function 2.52 eV). A substance having a work function of 2.9 eV or less is particularly preferable. Among these substances, an alkali metal such as K, Rb, or Cs is a more preferable reducing substance, Rb or Cs is a still more preferable reducing substance, and Cs is the most preferable reducing substance. These alkali metals have particularly high reducing ability, and can enhance emission luminance of an organic EL element or can lengthen a lifetime thereof by adding the alkali metals in a relatively small amount to a material to form an electron transport layer or an electron injection layer. Furthermore, as the reducing substance having a work function of 2.9 eV or less, a combination of two or more kinds of these alkali metals is also preferable, and particularly, a combination including Cs, for example, a combination of Cs with Na, a combination of Cs with K, a combination of Cs with Rb, or a combination of Cs with Na and K, is preferable. By inclusion of Cs, reducing ability can be efficiently exhibited, and emission luminance of an organic EL element is enhanced, or a lifetime thereof is lengthened by adding Cs to a material to form an electron transport layer or an electron injection layer.

<Negative Electrode in Organic Electroluminescent Element>

The negative electrode 108 plays a role of injecting an electron to the light emitting layer 105 through the electron injection layer 107 and the electron transport layer 106.

A material to form the negative electrode 108 is not particularly limited as long as being a substance capable of efficiently injecting an electron to an organic layer. However, a material similar to a material to form the positive electrode 102 can be used. Among these materials, a metal such as tin, indium, calcium, aluminum, silver, copper, nickel, chromium, gold, platinum, iron, zinc, lithium, sodium, potassium, cesium, or magnesium, and an alloy thereof (a magnesium-silver alloy, a magnesium-indium alloy, an aluminum-lithium alloy such as lithium fluoride/aluminum, or the like) are preferable. In order to enhance element characteristics by increasing electron injection efficiency, lithium, sodium, potassium, cesium, calcium, magnesium, or an alloy containing these low work function-metals is effective. However, many of these low work function-metals are generally unstable in air. In order to ameliorate this problem, for example, a method for using an electrode having high stability obtained by doping an organic layer with a trace amount of lithium, cesium, or magnesium is known. Other examples of a dopant that can be used include an inorganic salt such as lithium fluoride, cesium fluoride, lithium oxide, or cesium oxide. However, the dopant is not limited thereto.

Furthermore, in order to protect an electrode, a metal such as platinum, gold, silver, copper, iron, tin, aluminum, or indium, an alloy using these metals, an inorganic substance such as silica, titania, or silicon nitride, polyvinyl alcohol, vinyl chloride, a hydrocarbon-based polymer compound, or the like may be laminated as a preferable example. These method for manufacturing an electrode are not particularly limited as long as being capable of conduction, such as resistance heating, electron beam deposition, sputtering, ion plating, or coating.

<Binder that May be Used in Each Layer>

The materials used in the above-described hole injection layer, hole transport layer, light emitting layer, electron transport layer, and electron injection layer can form each layer by being used singly. However, it is also possible to use the materials by dispersing the materials in a solvent-soluble resin such as polyvinyl chloride, polycarbonate, polystyrene, poly(N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin, or a polyurethane resin; or a curable resin such as a phenolic resin, a xylene resin, a petroleum resin, a urea resin, a melamine resin, an unsaturated polyester resin, an alkyd resin, an epoxy resin, or a silicone resin.

<Method for Manufacturing Organic Electroluminescent Element>

Each layer constituting an organic electroluminescent element can be formed by forming thin films of the materials to constitute each layer by methods such as a vapor deposition method, resistance heating deposition, electron beam deposition, sputtering, a molecular lamination method, a printing method, a spin coating method, a casting method, and a coating method. The film thickness of each layer thus formed is not particularly limited, and can be appropriately set according to a property of a material, but is usually within a range of 2 nm to 5000 nm. The film thickness can be usually measured using a crystal oscillation type film thickness analyzer or the like. In a case of forming a thin film using a vapor deposition method, deposition conditions depend on the kind of a material, an intended crystal structure and association structure of the film, and the like. It is preferable to appropriately set the vapor deposition conditions generally in ranges of a rucible for vapor deposition heating temperature of +50 to +400° C., a degree of vacuum of $10^{-6}$ to $10^{-3}$ Pa, a vapor deposition rate of 0.01 to 50 nm/sec, a substrate temperature of 150 to +300° C., and a film thickness of 2 nm to 5 μm.

As an example of a method for manufacturing an organic electroluminescent element, a method for manufacturing an organic electroluminescent element formed of positive electrode/hole injection layer/hole transport layer/light emitting layer including a host material and a dopant material/electron transport layer/electron injection layer/negative electrode will be described. A thin film of a positive electrode material is formed on an appropriate substrate to manufacture a positive electrode by a vapor deposition method or the like, and then thin films of a hole injection layer and a hole transport layer are formed on this positive electrode. A thin film is formed thereon by co-depositing a host material and a dopant material to obtain a light emitting layer. An electron transport layer and an electron injection layer are formed on this light emitting layer, and a thin film formed of a substance for a negative electrode is formed by a vapor deposition method or the like to obtain a negative electrode. An intended organic electroluminescent element is thereby obtained. Incidentally, in manufacturing the above organic EL element, it is also possible to manufacture the element by reversing the manufacturing order, that is, in order of a negative electrode, an electron injection layer, an electron transport layer, a light emitting layer, a hole transport layer, a hole injection layer, and a positive electrode.

In a case where a direct current voltage is applied to the organic electroluminescent element thus obtained, it is only required to apply the voltage by assuming a positive electrode as a positive polarity and assuming a negative electrode as a negative polarity. By applying a voltage of about 2 to 40 V, light emission can be observed from a transparent or semitransparent electrode side (the positive electrode or the negative electrode, or both the electrodes). Furthermore, this organic EL element also emits light even in a case where a pulse current or an alternating current is applied. Note that a waveform of an alternating current applied may be any waveform.

Application Examples of Organic Electroluminescent Element

Furthermore, the present invention can also be applied to a display apparatus including an organic electroluminescent element, a lighting apparatus including an organic electroluminescent element, or the like.

The display apparatus or lighting apparatus including an organic electroluminescent element can be manufactured by a known method such as connecting the organic electroluminescent element according to the present embodiment to a known driving apparatus, and can be driven by appropriately using a known driving method such as direct driving, pulse driving, or alternating driving.

Examples of the display apparatus include panel displays such as color flat panel displays; and flexible displays such as flexible organic electroluminescent (EL) displays (see, for example, JP 10-335066 A, JP 2003-321546 A, JP 2004-281086 A, and the like). Furthermore, examples of a display method of the display include a matrix method and/or a segment method. Note that the matrix display and the segment display may co-exist in the same panel.

In the matrix, pixels for display are arranged two-dimensionally as in a lattice form or a mosaic form, and characters or images are displayed by an assembly of pixels. The shape or size of a pixel depends on intended use. For example, for display of images and characters of a personal computer, a monitor, or a television, square pixels each having a size of 300 μm or less on each side are usually used. Furthermore, in a case of a large-sized display such as a display panel, pixels having a size in the order of millimeters on each side are used. In a case of monochromic display, it is only required to arrange pixels of the same color. However, in a case of color display, display is performed by arranging pixels of red, green and blue. In this case, typically, delta type display and stripe type display are available. For this matrix driving method, either a line sequential driving method or an active matrix method may be employed. The line sequential driving method has an advantage of having a simpler structure. However, in consideration of operation characteristics, the active matrix method may be superior. Therefore, it is necessary to use the line sequential driving method or the active matrix method properly according to intended use.

In the segment method (type), a pattern is formed so as to display predetermined information, and a determined region emits light. Examples of the segment method include display of time or temperature in a digital clock or a digital thermometer, display of a state of operation in an audio instrument or an electromagnetic cooker, and panel display in an automobile.

Examples of the lighting apparatus include a lighting apparatuses for indoor lighting or the like, and a backlight of a liquid crystal display apparatus (see, for example, JP 2003-257621 A, JP 2003-277741 A, and JP 2004-119211 A). The backlight is mainly used for enhancing visibility of a display apparatus that is not self-luminous, and is used in a liquid crystal display apparatus, a timepiece, an audio apparatus, an automotive panel, a display plate, a sign, and the like. Particularly, in a backlight for use in a liquid crystal display apparatus, among the liquid crystal display apparatuses, for use in a personal computer in which thickness reduction has been a problem to be solved, in consideration of difficulty in thickness reduction because a conventional type backlight is formed from a fluorescent lamp or a light guide plate, a backlight using the luminescent element according to the present embodiment is characterized by its thinness and lightweightness.

5-2. Other Organic Devices

The polycyclic aromatic compound according to an aspect of the present invention can be used for manufacturing an organic field effect transistor, an organic thin film solar cell, or the like, in addition to the organic electroluminescent element described above.

The organic field effect transistor is a transistor that controls a current by means of an electric field generated by voltage input, and is provided with a source electrode, a drain electrode, and a gate electrode. When a voltage is applied to the gate electrode, an electric field is generated, and the organic field effect transistor can control a current by arbitrarily damming a flow of electrons (or holes) that flow between the source electrode and the drain electrode. The field effect transistor can be easily miniaturized compared with a simple transistor (bipolar transistor), and is often used as an element constituting an integrated circuit or the like.

The structure of the organic field effect transistor is usually as follows. That is, a source electrode and a drain electrode are provided in contact with an organic semiconductor active layer formed using the polycyclic aromatic compound according to an aspect of the present invention, and it is only required that a gate electrode is further provided so as to interpose an insulating layer (dielectric layer) in contact with the organic semiconductor active layer. Examples of the element structure include the following structures.

(1) Substrate/gate electrode/insulator layer/source electrode and drain electrode/organic semiconductor active layer (2) Substrate/gate electrode/insulator layer/organic semiconductor active layer/source electrode and drain electrode (3) Substrate/organic semiconductor active layer/source electrode and drain electrode/insulator layer/gate electrode (4) Substrate/source electrode and drain electrode/organic semiconductor active layer/insulator layer/gate electrode An organic field effect transistor thus constituted can be applied as a pixel driving switching element of an active matrix driving type liquid crystal display or an organic electroluminescent display, or the like.

An organic thin film solar cell has a structure in which a positive electrode such as ITO, a hole transport layer, a photoelectric conversion layer, an electron transport layer, and a negative electrode are laminated on a transparent substrate of glass or the like. The photoelectric conversion layer has a p-type semiconductor layer on the positive electrode side, and has an n-type semiconductor layer on the negative electrode side. The polycyclic aromatic compound according to an aspect of the present invention can be used as a material for a hole transport layer, a p-type semiconductor layer, an n-type semiconductor layer, or an electron transport layer, depending on physical properties thereof. The polycyclic aromatic compound according to an aspect of the present invention can function as a hole transport material or an electron transport material in an organic thin film solar cell. The organic thin film solar cell may appropriately include a hole blocking layer, an electron blocking layer, an electron injection layer, a hole injection layer, a smoothing layer, and the like, in addition to the members described above. For the organic thin film solar cell, known materials used for an organic thin film solar cell can be appropriately selected and used in combination.

EXAMPLES

Hereinafter, the present invention will be described more specifically with Examples, but the present invention is not limited thereto. First, Synthesis Examples of the polycyclic aromatic compound will be described below.

Synthesis Example (1-1)

Synthesis of Compound (1-1): 3-(10-phenylanthracen-9-yl)-5,9-dioxa-13b-boranaphtho[3,2,1-de]anthracene (1-1)

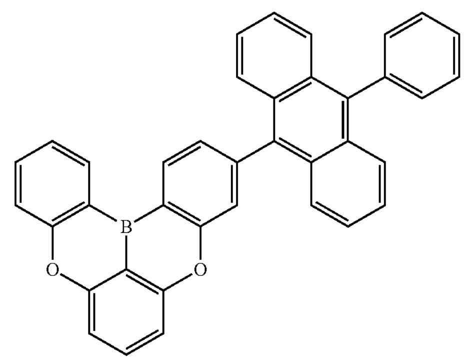

First, to phenol (24.6 g, 0.260 mol), potassium carbonate (36.0 g, 0.260 mol), and N-methylpyrolidone (NMP, 500 mL), 1-bromo-2,6-difluorobenzene (50.4 g, 0.260 mol) was added in a nitrogen atmosphere at room temperature, and the resulting mixture was heated and stirred at 120° C.; for 160 hours. Thereafter, NMP was distilled off under reduced pressure, and then toluene was added to the residue. The resulting product was filtered using a silica gel short pass column, and a solvent was distilled off under reduced pressure to obtain pale red liquid 2-bromo-1-fluoro-3-phenoxybenzene (52.8 g).

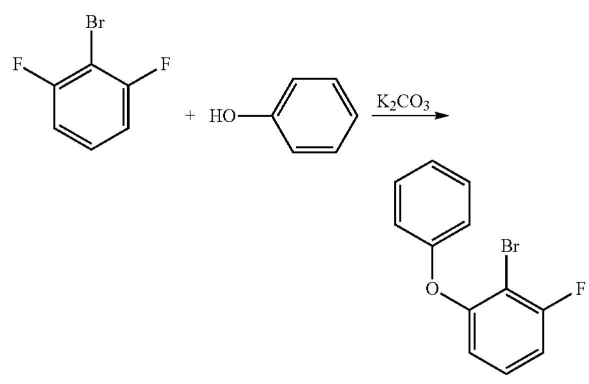

Next, a flask containing 2-bromo-1-fluoro-3-phenoxybenzene (43.3 g), 3-chlorophenol (25 g), potassium carbonate (44.8 g), and N-methylpyrolidone (50 mL) was stirred in a nitrogen atmosphere at reflux temperature for 42 hours. The reaction mixture was cooled, a solid was removed by filtration, and a solvent in a filtrate was condensed under reduced pressure. The resulting oil-like product was diluted with toluene and washed with water, and toluene in an organic layer was distilled off under reduced pressure. Heptane was added to the resulting oil-like product, a precipitate was filtered, and a solid was dried under reduced pressure to obtain brown solid 2-bromo-1-(3-chlorophenoxy)-3-phenoxybenzene (49 g).

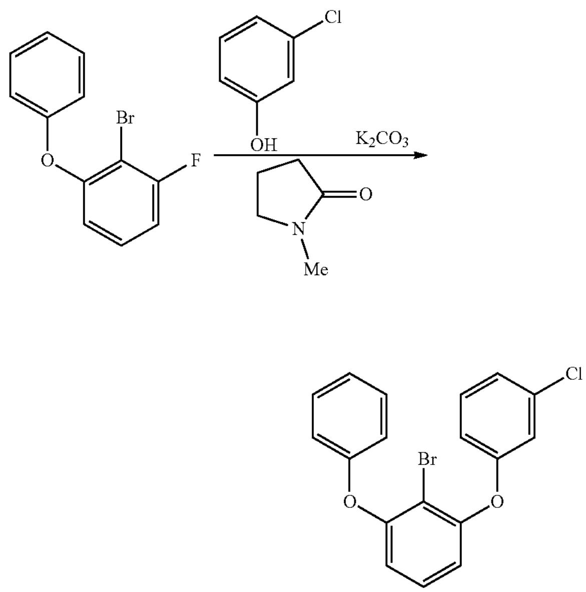

to a flask containing 2-bromo-1-(3-chlorophenoxy)-3-phenoxybenzene (49 g) and tetrahydrofuran (250 mL), a tetrahydrofuran solution of isopropylmagnesium chloride-lithium chloride complex (1.29 mol/L, 152 mL) was dropwise added, and the resulting mixture was stirred at room temperature for two hours. Furthermore, 2-isopropoxy-4,4,5,5-tetramethyl-1,3,2-dioxaborolane (43.7 g) was dropwise added thereto, and the resulting mixture was stirred at room temperature for two hours. To the reaction mixture, water and toluene were added, and tetrahydrofuran was distilled off under reduced pressure. To the residue, dilute hydrochloric acid was added. An organic layer was separated and washed with water. The organic layer was decolored using silica gel and condensed under reduced pressure to obtain pale brown oil-like 2-(2-(3-chlorophenoxy)-6-phenoxyphenyl)-4,4,5,5-tetramethyl-1,3,2-dioxaborolane (53.4 g).

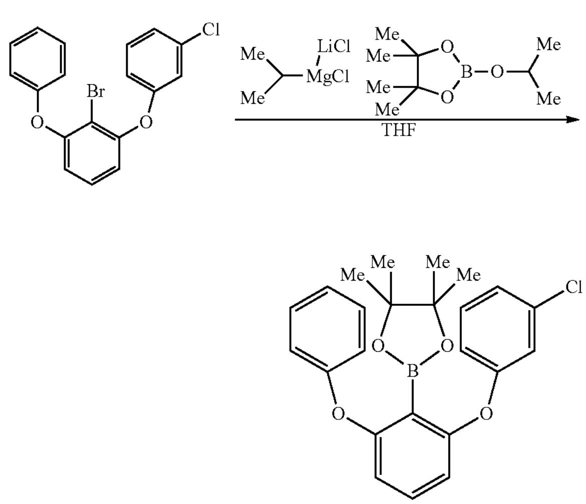

A flask containing chlorobenzene (400 mL) and aluminum chloride (50.5 g) was heated to 120° C. A solution of 2-(2-(3-chlorophenoxy)-6-phenoxyphenyl)-4,4,5,5-tetramethyl-1,3,2-dioxaborolane (53.4 g) and chlorobenzene (130 mL) was added thereto, and the resulting mixture was stirred at this temperature for two hours. The reaction mixture was cooled and added to ice water. To this mixture, heptane was added to precipitate a solid, and milky white solid was obtained by filtration. To a filtrate, toluene was added, and an organic layer was separated. The organic layer was condensed under reduced pressure, and a precipitate was washed with heptane to obtain a yellow solid. These solids were collected and decolored using silica gel to obtain white solid 3-chloro-5,9-dioxa-13b-boranaphtho[3,2,1-de]anthracene (16 g).

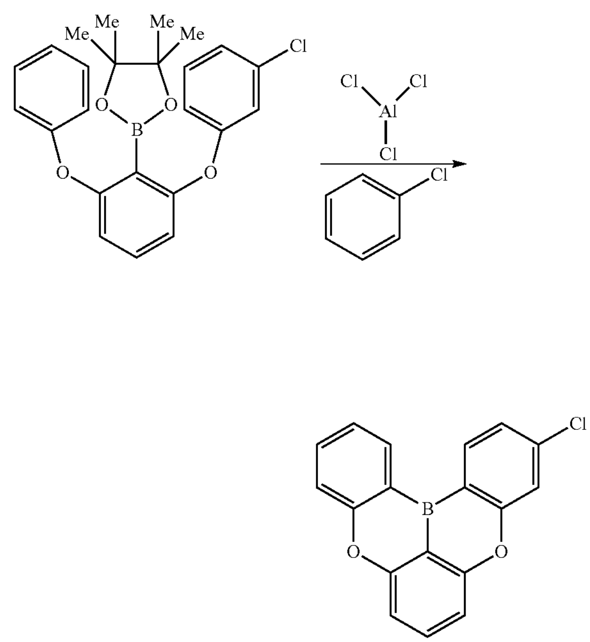

A flask containing 3-chloro-5,9-dioxa-13b-boranaphtho[3,2,1-de]anthracene (3 g), (10-phenyl-anthracen-9-yl) boronic acid (3.5 g), palladium acetate (0.066 g), potassium phosphate (3.1 g), dicyclohexyl (2',6'-dimethoxy-[1,1'-biphenyl]-2-yl) phosphane (0.24 g), cyclopentyl methylether (30 mL), and water (6 mL) was stirred at reflux temperature for six hours. To the reaction mixture, Solmix A-11 (manufactured by Japan Alcohol Trading Co., Ltd.) was added to precipitate a solid. The solid obtained by filtration was washed with water and Solmix. This solid was recrystallized using toluene to obtain light color solid compound (1-1) (1.6 g).

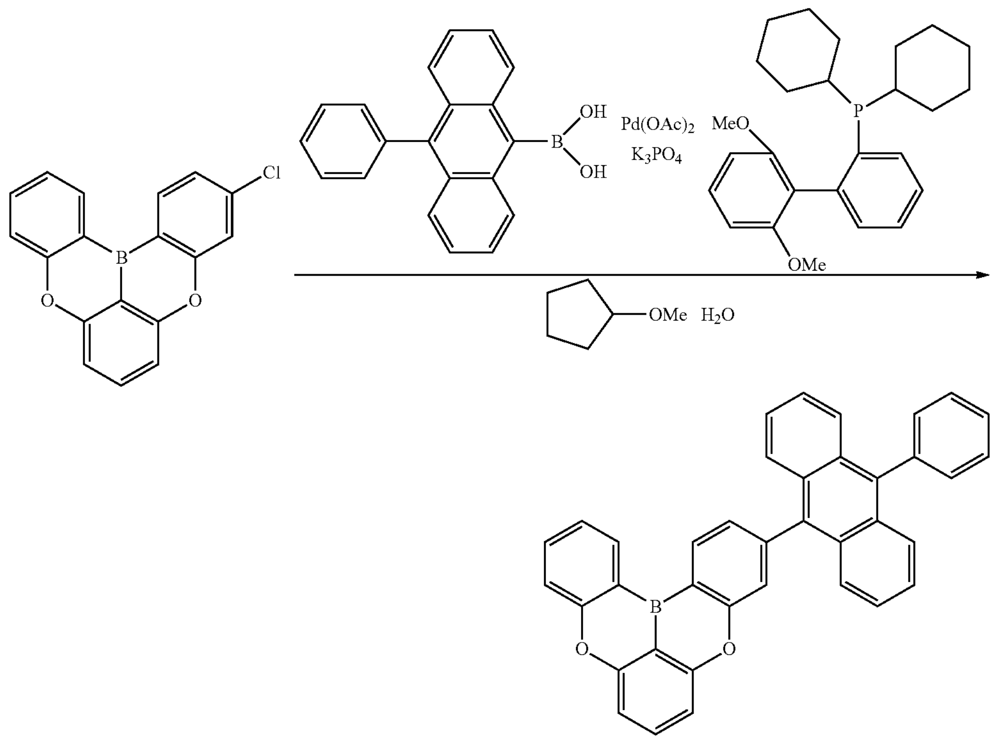

(1-1)

The structure of the resulting compound was confirmed by NMR measurement.

$^1$H-NMR (400 MHz, $CDCl_3$): δ=8.88-8.85 (m, 1H), 8.83-8.80 (m, 1H), 7.83-7.65 (m, 7H), 7.63-7.50 (m, 7H), 7.48-7.42 (m, 1H), 7.40-7.34 (m, 4H), 7.32-7.24 (m, 2H).

Synthesis Example (1-2)

Synthesis of Compound (1-2): 12-(10-phenylanthracen-9-yl)-5,9-dioxa-13b-boranaphtho[3,2,1-de]anthracene (1-2)

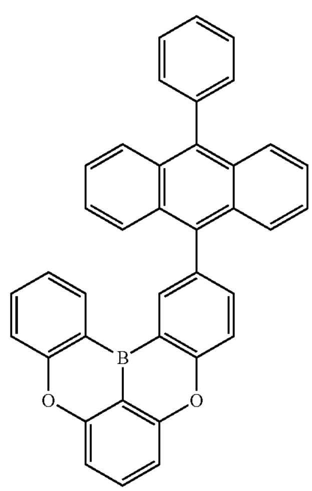

A flask containing 2-bromo-1-fluoro-3-phenoxybenzene (43.3 g), 4-chlorophenol (25 g), potassium carbonate (44.8 g), and N-methylpyrolidone (50 mL) was stirred in a nitrogen atmosphere at reflux temperature for 42 hours. The reaction mixture was cooled, a solid was removed by filtration, and a solvent in a filtrate was condensed under reduced pressure. The resulting oil-like product was diluted with toluene and washed with water. An organic layer was decolored using silica gel and condensed under reduced pressure. The resulting solid was washed with heptane and dried under reduced pressure to obtain white solid 2-bromo-1-(4-chlorophenoxy)-3-phenoxybenzene (54.9 g).

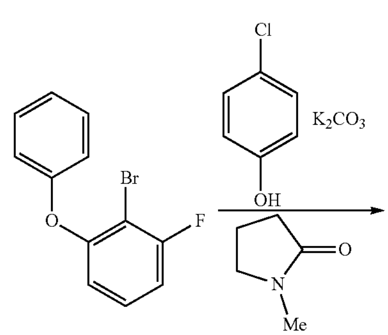

-continued

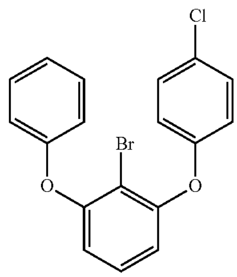

Into a flask containing 2-bromo-1-(4-chlorophenoxy)-3-phenoxybenzene (54.8 g) and tetrahydrofuran (250 mL), a tetrahydrofuran solution of isopropylmagnesium chloride-lithium chloride complex (1.29 mol/L, 169 mL) was dropwise added, and the resulting mixture was stirred at room temperature for two hours. To the reaction mixture, water and toluene were added, and tetrahydrofuran was distilled off under reduced pressure. To the residue, dilute hydrochloric acid was added. An organic layer was separated and washed with water. The organic layer was decolored using silica gel and condensed under reduced pressure to obtain white solid 2-(2-(4-chlorophenoxy)-6-phenoxyphenyl)-4,4,5,5-tetramethyl-1,3,2-dioxaborolane (57.1 g).

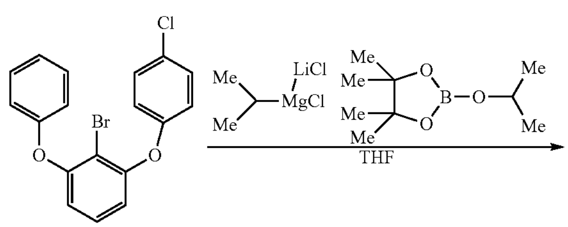

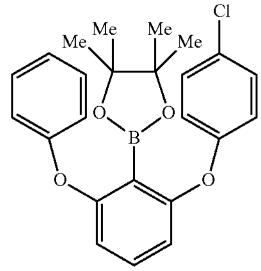

A flask containing chlorobenzene (450 mL) and aluminum chloride (53.9 g) was heated to 120° C. A solution of 2-(2-(4-chlorophenoxy)-6-phenoxyphenyl)-4,4,5,5-tetramethyl-1,3,2-dioxaborolane (57 g) and chlorobenzene (100 mL) was added thereto, and the resulting mixture was stirred at this temperature for two hours. The reaction mixture was cooled and added to ice water. A precipitated solid was filtered and washed with Solmix A-11 to obtain a milky white solid. An organic layer separated from a filtrate was condensed under reduced pressure to obtain a milky white solid. These solids were collected and washed (heptane/toluene=9/1 (volume ratio)) to obtain light color solid 2-chloro-5,9-dioxa-13b-boranaphtho[3,2,1-de]anthracene (19.3 g).

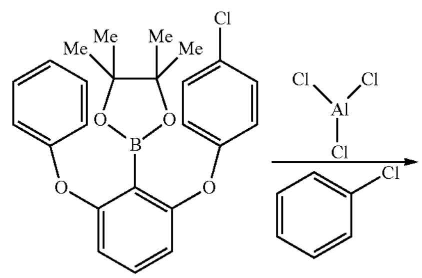

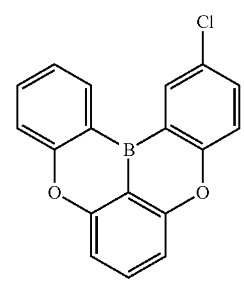

A flask containing 2-chloro-5,9-dioxa-13b-boranaphtho[3,2,1-de]anthracene (3 g), (10-phenyl-anthracen-9-yl) boronic acid (3.5 g), palladium acetate (0.133 g), potassium phosphate (3.1 g), dicyclohexyl (2',6'-dimethoxy-[1,1'-biphenyl]-2-yl) phosphane (0.48 g), cyclopentyl methylether (30 mL), and water (6 mL) was stirred at reflux temperature for two hours. An organic layer was separated from the reaction mixture, and a solvent was distilled off under reduced pressure. Thereafter, the residue was dissolved in toluene and decolored using silica gel to obtain a pale yellow sold. The solid was washed with Solmix A-11 to obtain pale yellow sold compound (1-2) (2.5 g).

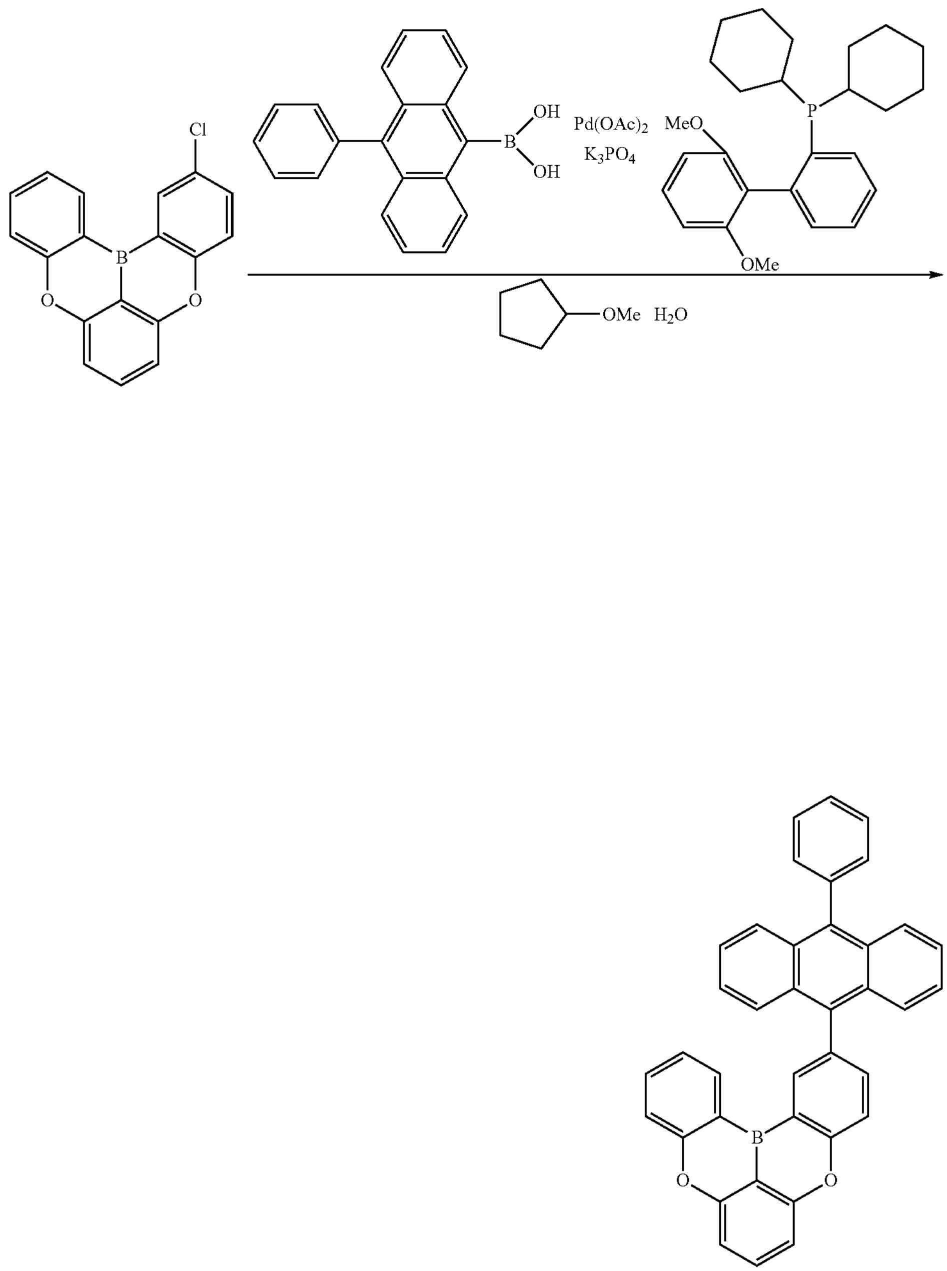
(1-2)
It was confirmed that the resulting compound was a target product by LC-MS measurement.
MS (ACPI) m/z=523 (M+H)
The structure of the resulting compound was confirmed by NMR measurement.
$^1$H-NMR (400 MHz, $CDCl_3$): δ=8.81-8.79 (m, 1H), 8.51-8.47 (m, 1H), 7.90-7.74 (m, 7H), 7.67-7.51 (m, 7H), 7.40-7.33 (m, 5H), 7.32-7.28 (m, 1H), 7.21-7.16 (m, 1H).

Synthesis Example (1-3)

Synthesis of Compound (1-4): 6-(10-phenylanthracen-9-yl)-5,9-dioxa-13b-boranaphtho[3,2,1-de]anthracene (1-4)

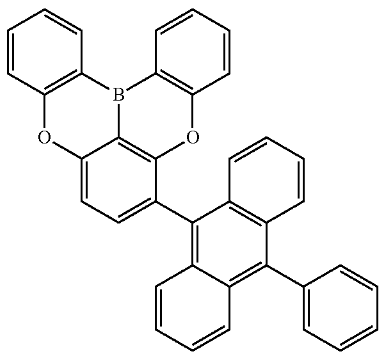

First, into a flask containing diphenoxybenzene (26 g) and o-xylene (300 ml), a 1.6 M n-butyl lithium hexane solution (75 ml) was added in a nitrogen atmosphere at 0° C. The resulting mixture was stirred for 30 minutes, then heated to 70° C., and further stirred for four hours. By heating and stirring the mixture at 100° C.; in a nitrogen stream, hexane was distilled off. Thereafter, the residue was cooled to 20° C., boron tribromide (11.4 ml) was added thereto, and the resulting mixture was stirred for one hour. The mixture was heated to room temperature and stirred for one hour. Thereafter, N,N-diisopropylethylamine (34.2 ml) was added thereto, and the resulting mixture was heated and stirred at 120° C.; for five hours. Thereafter, N,N-diisopropylethylamine (17.1 ml) was added thereto. The resulting mixture was filtered using a florisil short pass column, and a solvent was distilled off under reduced pressure to obtain a crudely purified product. The crude product was washed with methanol to obtain white solid 5,9-dioxa-13b-boranaphtho[3,2,1-de]anthracene (12.1 g).

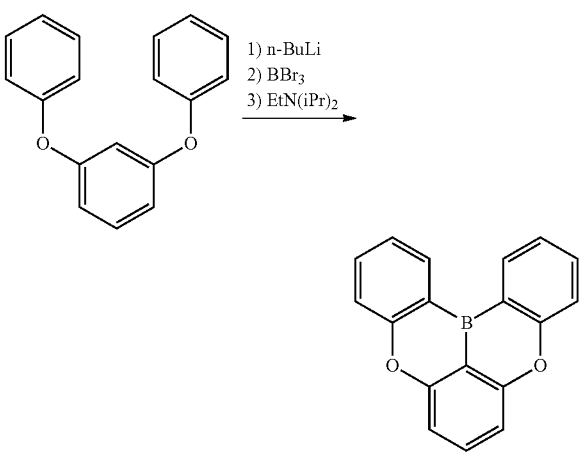

The structure of the resulting compound was confirmed by NMR measurement.

$^1$H-NMR (400 MHz, $CDCl_3$): δ=8.69 (dd, 2H), 7.79 (t, 1H), 7.70 (ddd, 2H), 7.54 (dt, 2H), 7.38 (ddd, 2H), 7.22 (d, 2H).

Next, 5,9-dioxa-13b-boranaphtho[3,2,1-de]anthracene (6 g), N-bromosuccinimide (4.3 g), and tetrahydrofuran (120 mL) were stirred at room temperature for six hours. The reaction mixture was diluted with water. A precipitated solid was filtered and washed with Solmix A-11 to obtain white solid 8-bromo-5,9-dioxa-13b-boranaphtho[3,2,1-de]anthracene (7.8 g).

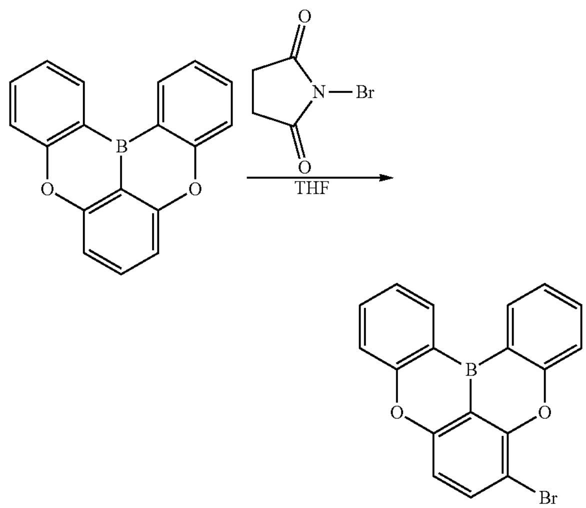

A flask containing 8-bromo-5,9-dioxa-13b-boranaphtho[3,2,1-de]anthracene (2 g), (10-phenyl-anthracen-9-yl) boronic acid (2.6 g), dichlorobis[di-t-butyl (p-dimethylaminophenyl) phosphino]palladium (II) (Pd-132) (0.12 g), potassium carbonate (1.2 g), tetrabutylammonium bromide (TBAB, 0.09 g), water (7 mL), and toluene (70 mL) was stirred at reflux temperature for three hours. The reaction mixture was cooled, and a precipitated light color solid was filtered. This solid was dissolved in chlorobenzene, decolored using silica gel, and condensed under reduced pressure. A precipitated solid was washed with heated toluene to obtain white solid compound (1-4) (1.5 g).

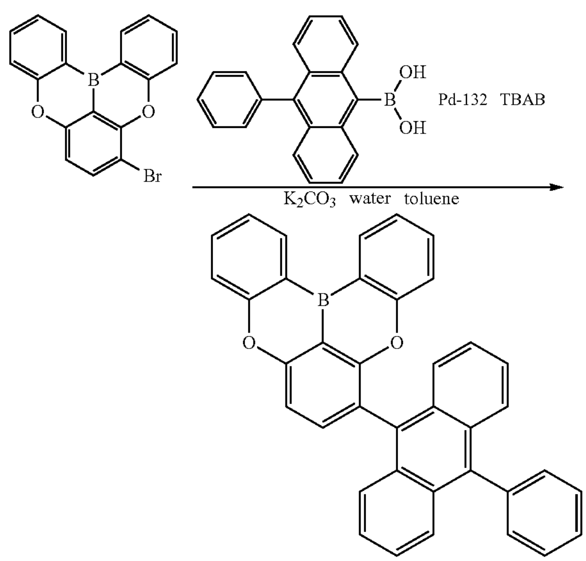

(1-4)

-continued

Pd-132: 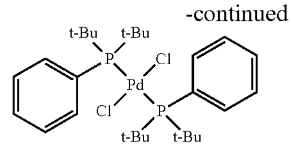

The structure of the resulting compound was confirmed by NMR measurement.

$^1$H-NMR (400 MHz, $CDCl_3$): δ=8.80-8.70 (m, 2H), 7.90-7.85 (m, 1H), 7.82-7.75 (m, 3H), 7.75-7.53 (m, 7H), 7.53-7.43 (m, 4H), 7.37-7.26 (m, 5H), 6.92-6.88 (m, 1H).

Synthesis Example (1-4)

Synthesis of Compound (1-3): 4-(10-phenylanthracen-9-yl)-5,9-dioxa-13b-boranaphtho[3,2,1-de]anthracene (1-3)

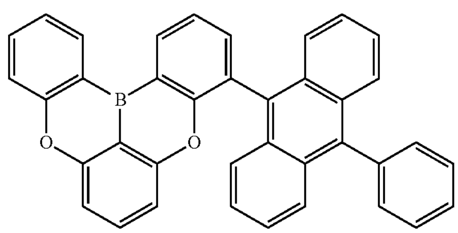

A flask containing 2-bromo-1-fluoro-3-phnoxybenzene (43.3 g), 2-chlorophenol (25 g), potassium carbonate (44.8 g), and N-methylpyrolidone (50 mL) was stirred in a nitrogen atmosphere at reflux temperature for 20 hours. The reaction mixture was cooled, and a solid was removed by filtration. Thereafter, a solvent in a filtrate was condensed under reduced pressure. The resulting oil-like product was diluted with toluene and washed with water. Toluene in an organic layer was distilled off under reduced pressure. The resulting oil-like product was decolored using silica gel to obtain yellow oil-like 2-bromo-1-(2-chlorophenoxy)-3-phenoxybenzene (58 g).

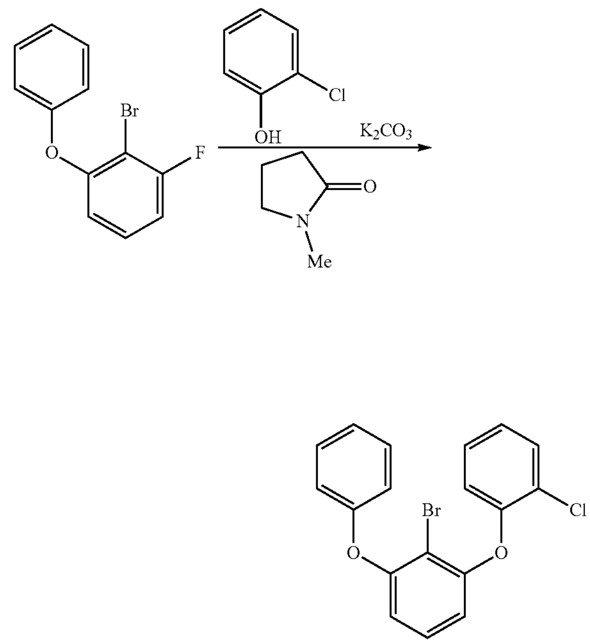

Into a flask containing 2-bromo-1-(2-chlorophenoxy)-3-phenoxybenzene (58 g) and tetrahydrofuran (250 mL), a tetrahydrofuran solution of isopropylmagnesium chloride-lithium chloride complex (1.29 mol/L, 179 mL) was dropwise added, and the resulting mixture was stirred at room temperature for two hours. Furthermore, 2-isopropoxy-4,4,5,5-tetramethyl-1,3,2-dioxaborolane (51.6 g) was dropwise added thereto, and the resulting mixture was stirred at room temperature for two hours. To the reaction mixture, water and toluene were added, and tetrahydrofuran was distilled off under reduced pressure. To the residue, dilute hydrochloric acid was added. An organic layer was separated and then washed with water. The organic layer was decolored using silica gel and condensed under reduced pressure to obtain pale brown oil-like 2-(2-(2-chlorophenoxy)-6-phenoxyphenyl)-4,4,5,5-tetramethyl-1,3,2-dioxaborolane (61.6 g).

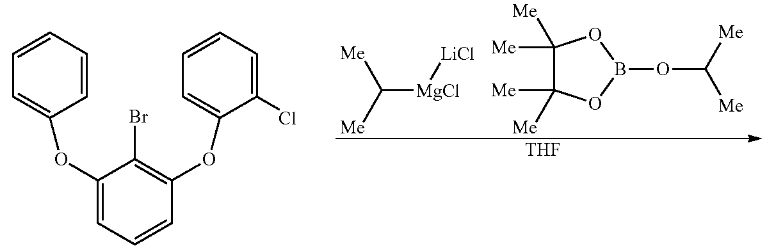

-continued

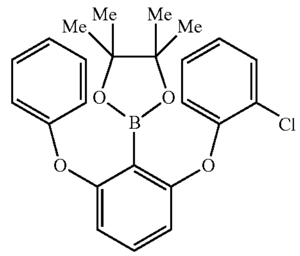

A flask containing chlorobenzene (300 mL) and aluminum chloride (58.3 g) was heated to 120° C. A solution of 2-(2-(2-chlorophenoxy)-6-phenoxyphenyl)-4,4,5,5-tetramethyl-1,3,2-dioxaborolane (61.6 g) and chlorobenzene (150 mL) was added thereto, and the resulting mixture was stirred at this temperature for 2.5 hours. The reaction mixture was cooled and added to ice water. To the mixture, toluene was added, and a toluene layer separated was washed with water. This toluene layer was condensed under reduced pressure, and the resulting ocher solid was washed with Solmix A-11 (manufactured by Japan Alcohol Trading Co., Ltd.) to obtain cream color solid 4-chloro-5,9-dioxa-13b-boranaphtho[3,2,1-de]anthracene (17 g).

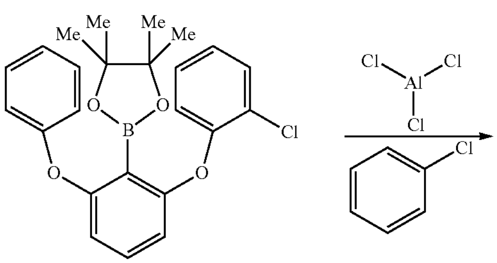

-continued

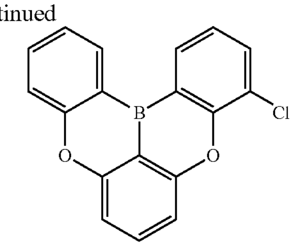

A flask containing 4-chloro-5,9-dioxa-13b-boranaphtho[3,2,1-de]anthracene (3 g), (10-phenyl-anthracen-9-yl) boronic acid (3.5 g), palladium acetate (0.133 g), potassium phosphate (3.1 g), dicyclohexyl (2',6'-dimethoxy-[1,1'-biphenyl]-2-yl) phosphane (0.49 g), cyclopentyl methylether (30 mL), and water (6 mL) was stirred at reflux temperature for one hour. To the reaction mixture, Solmix A-11 (manufactured by Japan Alcohol Trading Co., Ltd.) was added to precipitate a solid. The solid obtained by filtration was washed with water and Solmix A-11. This solid was decolored using silica gel to obtain light color solid compound (1-3) (2.7 g).

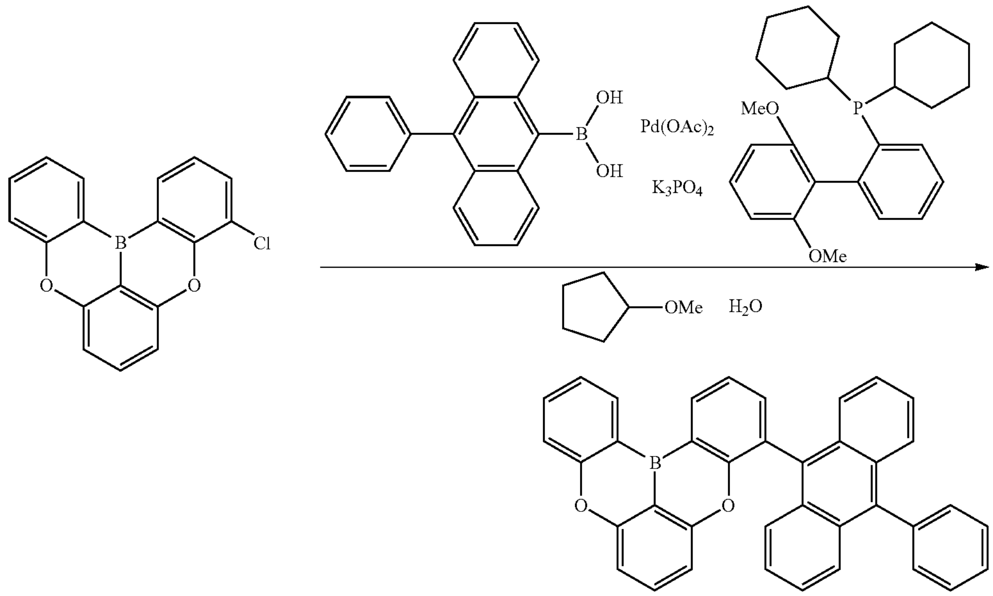

(1-3)

The structure of the resulting compound was confirmed by NMR measurement.

$^1$H-NMR (400 MHz, $CDCl_3$): δ=8.97-8.93 (m, 1H), 8.87-8.83 (m, 1H), 7.80-7.73 (m, 4H), 7.69-7.44 (m, 11H), 7.36-7.26 (m, 4H), 7.16-7.12 (m, 1H), 6.53-6.50 (m, 1H).

Synthesis Example (1-5)

Synthesis of Compound (1-5): 7-(10-phenylanthracen-9-yl)-5,9-dioxa-13b-boranaphtho[3,2,1-de]anthracene (1-5)

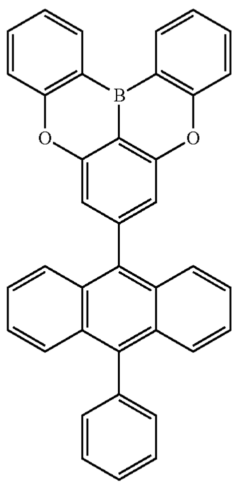

Phenol (65.1 g), potassium carbonate (72.0 g), 1-bromo-4-chloro-2,6-difluorobenzene (59.1 g), and N-methylpyrolidone (NMP, 500 mL) were heated and stirred in a nitrogen atmosphere at 120° C.; for 90 hours. The reaction mixture was cooled, a solid was removed by filtration, and a solvent in a filtrate was condensed under reduced pressure. The resulting oil-like product was diluted with toluene and washed with water, and then toluene in an organic layer was distilled off under reduced pressure. The resulting brown solid was decolored using silica gel to obtain white solid 2-bromo-5-chloro-1,3-diphenoxybenzene (65.3 g).

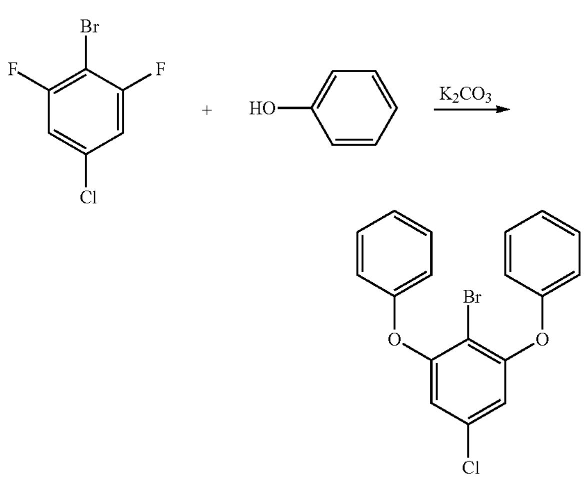

A solution of xylene (300 mL) and 2-bromo-5-chloro-1,3-diphenoxybenzene (31.4 g) was cooled to 40° C.; in a nitrogen atmosphere. To this solution, n-butyl lithium (1.6 mol/L hexane solution, 58 mL) was dropwise added. This mixture was heated to 60° C.; and stirred for three hours. Furthermore, this mixture was cooled to −30° C., and boron tribromide (25 g) was dropwise added thereto. The resulting mixture was heated to room temperature and stirred for 30 minutes. Furthermore, N-ethyl-diisopropylamine (26.9 g) was dropwise added thereto. Thereafter, the resulting mixture was heated to reflux temperature and stirred for two hours. After cooling, the mixture was neutralized with a sodium acetate aqueous solution. Heptane was added thereto to precipitate a solid. This solid was collected by filtration under reduced pressure, decolored using silica gel, and then recrystallized using toluene to obtain light color solid 7-chloro-5,9-dioxa-13b-boranaphtho[3,2,1-de]anthracene (6.3 g).

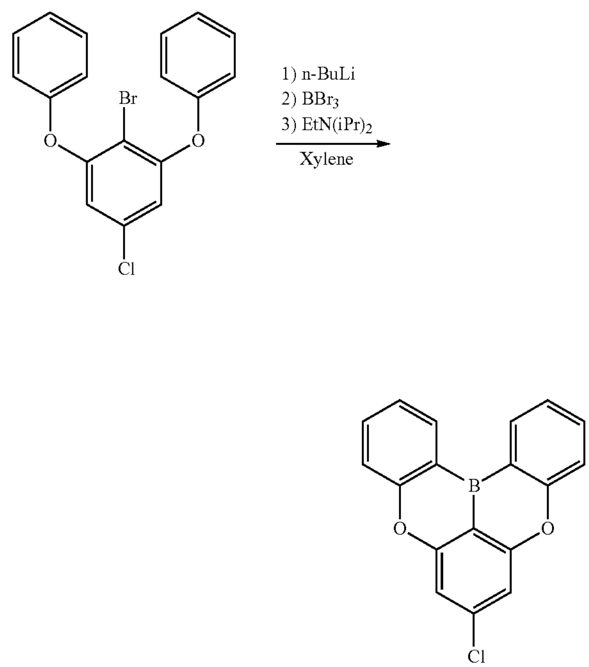

A flask containing 7-chloro-5,9-dioxa-13b-boranaphtho[3,2,1-de]anthracene (2.5 g), (10-phenyl-anthracen-9-yl) boronic acid (3.6 g), palladium acetate (0.055 g), potassium phosphate (2.6 g), dicyclohexyl (2',6'-dimethoxy-[1,1'-biphenyl]-2-yl) phosphane (0.20 g), cyclopentyl methylether (38 mL), and water (8 mL) was stirred at reflux temperature for 2.5 hours. To the reaction mixture, Solmix A-11 (manufactured by Japan Alcohol Trading Co., Ltd.) was added to precipitate a solid. The solid obtained by filtration was washed with water and Solmix A-11. This solid was decolored using silica gel to obtain light color solid compound (1-5) (1.8 g).

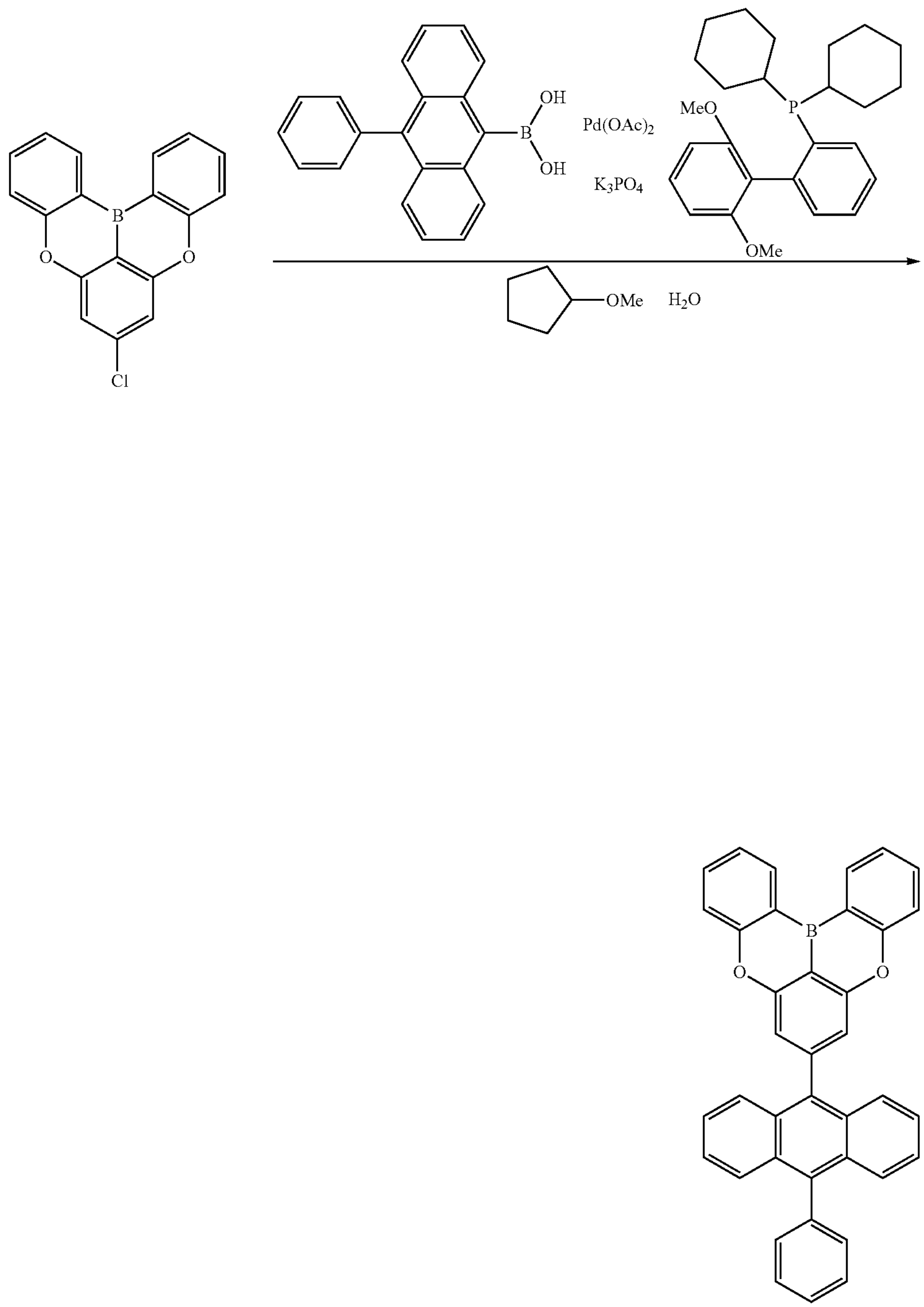
(1-5)
The structure of the resulting compound was confirmed by NMR measurement.
$^{1}$H-NMR (400 MHz, $CDCl_3$): δ=8.82-8.78 (m, 2H), 7.79-7.72 (m, 6H), 7.67-7.52 (m, 7H), 7.49-7.43 (m, 2H), 7.42 (s, 2H), 7.39-7.34 (m, 4H).

Synthesis Example (1-6)

Synthesis of Compound (1-121): 3-(4-10-phenylanthracen-9-yl) phenyl-5,9-dioxa-13b-boranaphtho[3,2,1-de]anthracene (1-121)

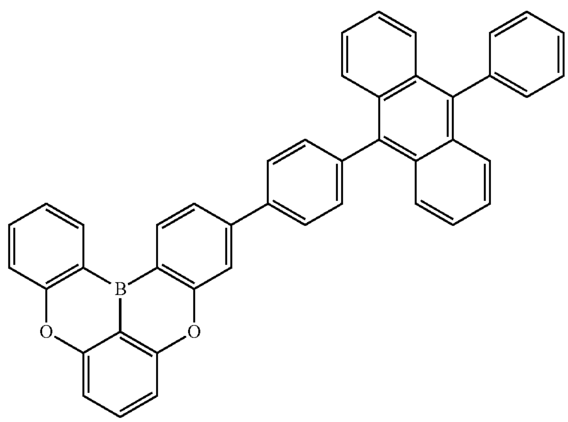

A flask containing 3-chloro-5,9-dioxa-13b-boranaphtho[3,2,1-de]anthracene (6.7 g), 4,4,4',4'-5,5,5',5'-octamethyl-2,2'-bi(1,3,2-dioxaborolane) (14.0 g), palladium acetate (0.10 g), potassium acetate (4.3 g), dicyclohexyl (2',6'-dimethoxy-[1,1'-biphenyl]-2-yl) phosphane (0.72 g), potassium carbonate (3.0 g), and cyclopentyl methylether (60 mL) was stirred at reflux temperature for one hour. The reaction liquid was cooled to room temperature, and a solid was removed by filtration under reduced pressure. Thereafter, a solvent in a filtrate was distilled off under reduced pressure. The resulting solid was decolored using silica gel and washed with Solmix A-11 to obtain pale yellow solid 3-(4,4,5,5-tetramethyl-1,3,2-dioxaborolan-2-yl)-5,9-dioxa-13b-boranaphtho[3,2,1-de]anthracene (7.4 g).

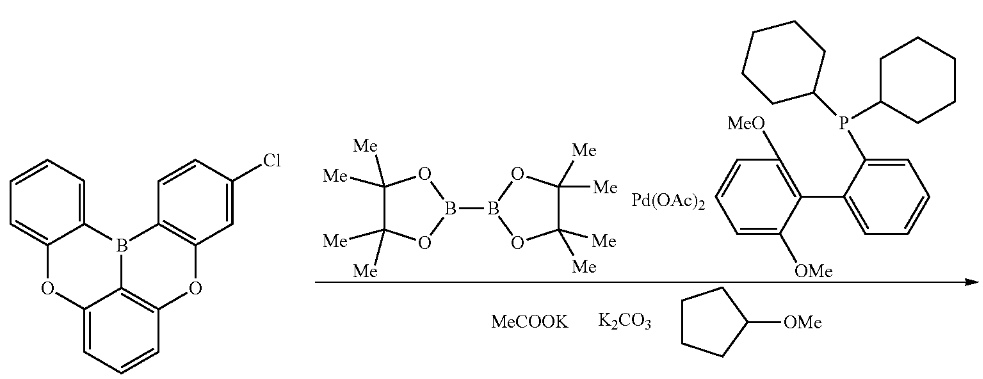

-continued

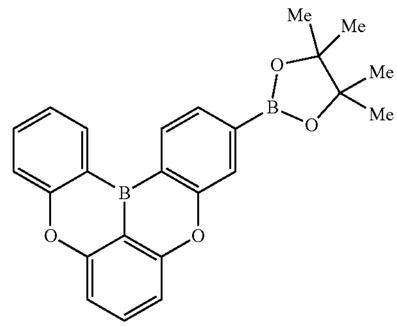

flask containing 3-(4,4,5,5-tetramethyl-1,3,2-dioxaborolan-2-yl)-5,9-dioxa-13b-boranaphtho[3,2,1-de]anthracene (2.5 g), 9-(4-bromophenyl)-10-phenylanthracene (2.4 g), tetrakis(triphenylphosphine) palladium (0.20 g), tetrabutylammonium bromide (TBAB, 0.047 g), potassium carbonate (1.6 g), toluene (20 mL), and water (2 mL) was stirred at reflux temperature for 4.5 hours. To the reaction mixture, Solmix A-11 (manufactured by Japan Alcohol Trading Co., Ltd.) was added to precipitate a solid. The solid obtained by filtration was washed with water and Solmix. The resulting solid was decolored using silica gel and washed with toluene to obtain pale yellowish green solid compound (1-121) (2.3 g).

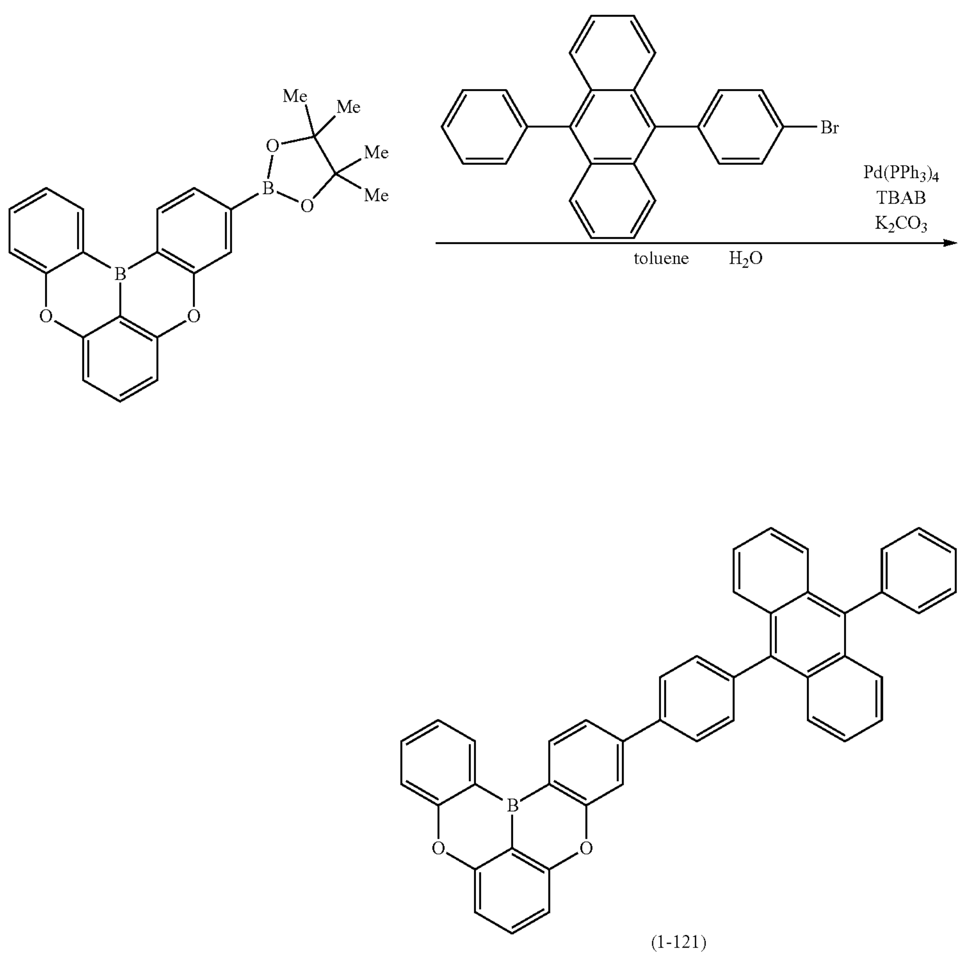

(1-121)

The structure of the resulting compound was confirmed by NMR measurement.

$^1$H-NMR (400 MHz, $CDCl_3$): δ=8.84-8.82 (m, 1H), 8.79-8.76 (m, 1H), 8.04-7.96 (m, 3H), 7.86-7.70 (m, 7H), 7.66-7.53 (m, 6H), 7.52-7.48 (m, 2H), 7.46-7.33 (m, 5H), 7.31-7.26 (m, 2H).

Synthesis Example (1-7)

Synthesis of Compound (1-122): 4-(4-10-phenylanthracen-9-yl) phenyl-5,9-dioxa-13b-boranaphtho[3,2,1-de]anthracene (1-122)

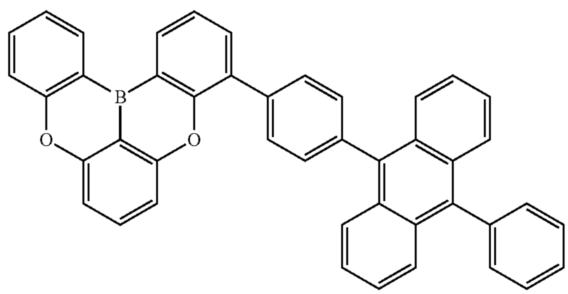

Synthesis was performed in a similar manner to Synthesis Example (1-6) except that this 4-chloro compound was used instead of 3-chloro-5,9-dioxa-13b-boranaphtho[3,2,1-de]anthracene as a raw material.

The structure of the resulting compound was confirmed by NMR measurement.

$^1$H-NMR (400 MHz, $CDCl_3$): δ=8.82-8.78 (m, 2H), 8.00-7.90 (m, 5H), 7.85-7.80 (m, 1H), 7.77-7.72 (m, 3H), 7.67-7.51 (m, 9H), 7.47-7.35 (m, 5H), 7.29-7.23 (m, 2H).

Synthesis Example (1-8)

Synthesis of Compound (1-123): 3-(3-10-phenylanthracen-9-yl) phenyl-5,9-dioxa-13b-boranaphtho[3,2,1-de]anthracene (1-123)

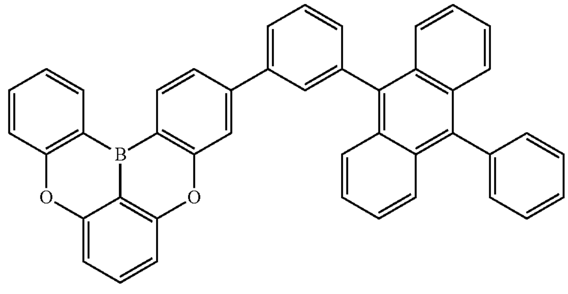

Synthesis was performed in a similar manner to Synthesis Example (1-6) except that this 3-bromo compound was used instead of 9-(4-bromophenyl)-10-phenylanthracene as a raw material.

The structure of the resulting compound was confirmed by NMR measurement.

$^1$H-NMR (400 MHz, $CDCl_3$): δ=8.76-8.68 (m, 2H), 7.99-7.96 (m, 1H), 7.93-7.87 (m, 2H), 7.82-7.68 (m, 8H), 7.64-7.49 (m, 7H), 7.42-7.33 (m, 5H), 7.26-7.19 (m, 2H).

Synthesis Example (1-9)

Synthesis of Compound (1-124): 2-(4-10-phenylanthracen-9-yl) phenyl-5,9-dioxa-13b-boranaphtho[3,2,1-de]anthracene (1-124)

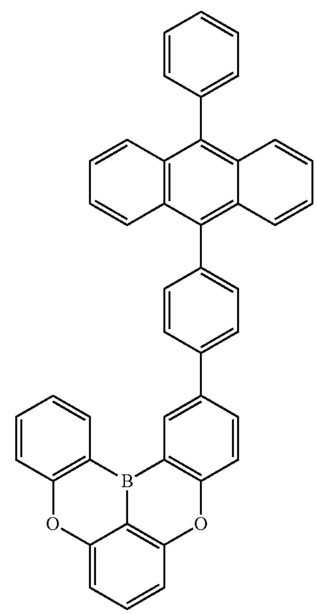

Synthesis was performed in a similar manner to Synthesis Example (1-6) except that this 2-chloro compound was used instead of 3-chloro-5,9-dioxa-13b-boranaphtho[3,2,1-de]anthracene as a starting raw material.

The structure of the resulting compound was confirmed by NMR measurement.

$^1$H-NMR (400 MHz, $CDCl_3$): δ=9.08-9.05 (m, 1H), 8.87-8.83 (m, 1H), 8.14-8.10 (m, 1H), 8.00-7.96 (m, 2H), 7.87-7.81 (m, 3H), 7.78-7.70 (m, 4H), 7.67-7.53 (m, 6H), 7.53-7.44 (m, 3H), 7.41-7.33 (m, 4H), 7.31-7.26 (m, 2H).

Synthesis Example (1-10)

Synthesis of Compound (1-221): 3,11-bis(10-phenylanthracen-9-yl)-5,9-dioxa-13b-boranaphtho[3,2,1-de]anthracene (1-221)

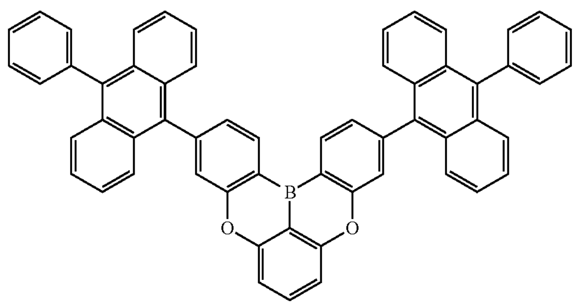

A flask containing 3-chlorophenol (100 g), 2-bromo-1,3-difluorobenzene (62.6 g), potassium carbonate (179 g), and N-methylpyrolidone (300 mL) was stirred in a nitrogen atmosphere at reflux temperature for 15 hours. The reaction mixture was cooled, a solid was removed by filtration, and a solvent in a filtrate was condensed under reduced pressure. The resulting oil-like product was diluted with toluene and washed with water, and then toluene in an organic layer was distilled off under reduced pressure. The resulting oil-like product was decolored using silica gel, and heptane was added thereto to precipitate a solid. This solid was washed with heptane to obtain white solid 2-bromo-1,3-bis(chlorophenoxy) benzene (133 g).

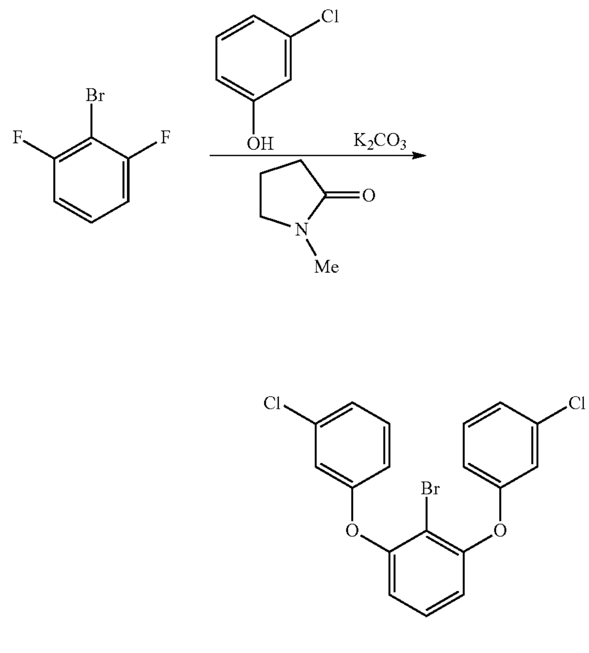

Into a flask containing 2-bromo-1,3-bis(3-chlorophenoxy) benzene (30 g) and tetrahydrofuran (100 mL), a tetrahydrofuran solution of isopropylmagnesium chloride-lithium chloride complex (1.29 mol/L, 68 mL) was dropwise added, and the resulting mixture was stirred at room temperature for two hours. Furthermore, 2-isopropoxy-4,4,5,5-tetramethyl-1,3,2-dioxaborolane (24.5 g) was dropwise added thereto, and the resulting mixture was stirred at room temperature for two hours. To the reaction mixture, water and toluene were added, and tetrahydrofuran was distilled off under reduced pressure. To the residue, dilute hydrochloric acid was added. An organic layer was separated and washed with water. The organic layer was decolored using silica gel and condensed under reduced pressure to obtain pale yellow solid 2-(2,6-bis(3-chlorophenoxy)-phenyl)-4,4,5,5-tetramethyl-1,3,2-dioxaborolane (29.6 g).

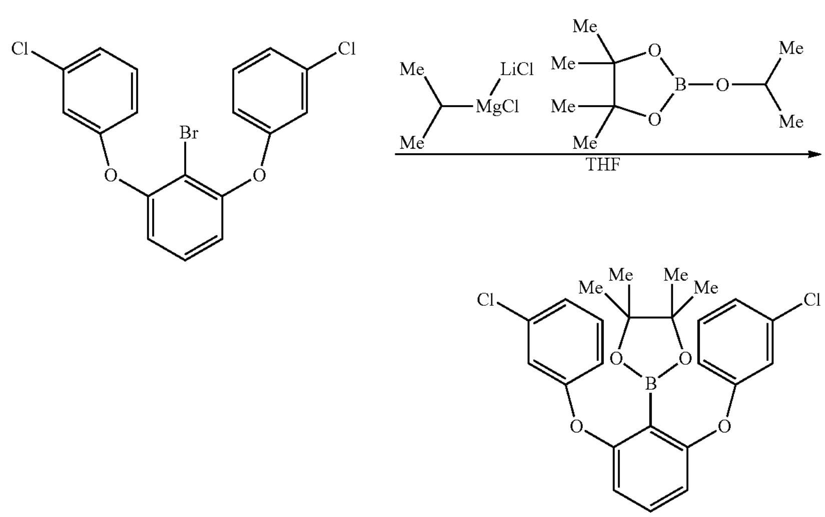

A flask containing chlorobenzene (250 mL) and aluminum chloride (25.8 g) was heated to 120° C. A chlorobenzene solution (40 mL) of 2-(2,6-bis(3-chlorophenoxy)-phenyl)-4,4,5,5-tetramethyl-1,3,2-dioxaborolane (29.6 g) was added thereto, and the resulting mixture was stirred at this temperature for three hours. The reaction mixture was cooled and added to ice water. A precipitated solid was filtered under reduced pressure, and the solid was washed with Solmix A-11 to obtain pale brown solid 3,11-dichloro-5,9-dioxa-13b-boranaphtho[3,2,1-de]anthracene (8.8 g).

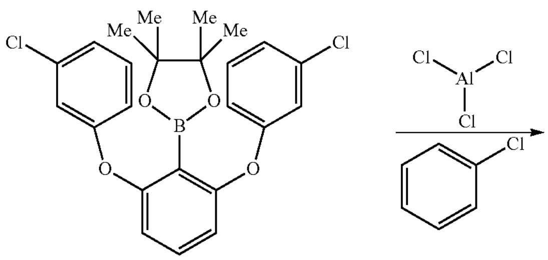

-continued

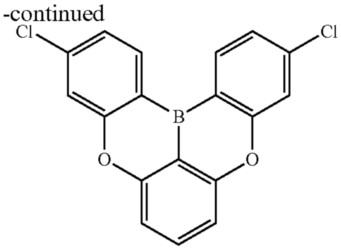

A flask containing 3,11-dichloro-5,9-dioxa-13b-boranaphtho[3,2,1-de]anthracene (8.8 g), 4,4,4',4'-5,5,5',5'-octamethyl-2,2'-bi(1,3,2-dioxaborolane) (32.8 g), palladium acetate (0.23 g), potassium acetate (10.1 g), dicyclohexyl (2',6'-dimethoxy-[1,1'-biphenyl]-2-yl) phosphane (1.7 g), potassium carbonate (7.1 g), and cyclopentyl methylether (180 mL) was stirred at reflux temperature for eight hours. The reaction liquid was cooled to room temperature, and then a solid was removed by filtration under reduced pressure. A solvent in a filtrate was distilled off under reduced pressure. The resulting solid was decolored using silica gel and washed with Solmix A-11 to obtain pale green solid 3,11-bis(4,4,5,5-tetramethyl-1,3,2-dioxaborolan-2-yl)-5,9-dioxa-13b-boranaphtho[3,2,1-de]anthracene (10.6 g).

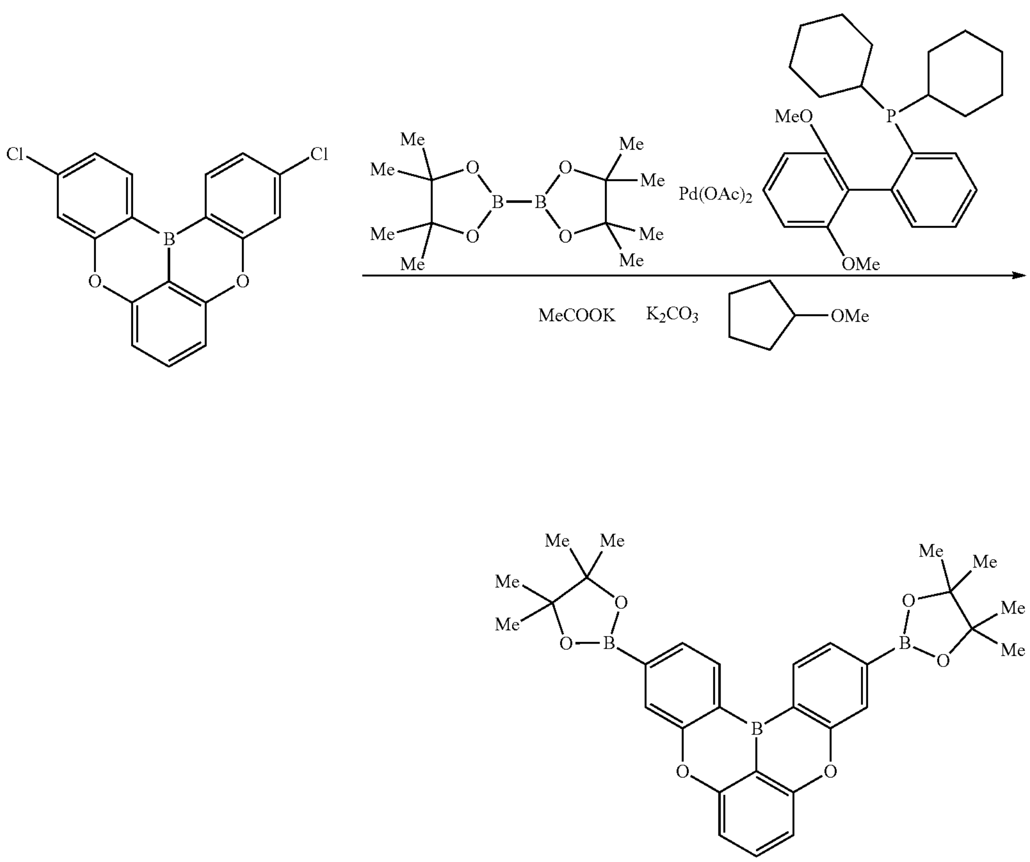

A flask containing 3,11-bis(4,4,5,5-tetramethyl-1,3,2-dioxaborolan-2-yl)-5,9-dioxa-13b-boranaphtho[3,2,1-de]anthracene (3.0 g), tetrakis(triphenylphosphine) palladium (0.40 g), tetrabutylammonium bromide (TBAB, 0.093 g), potassium carbonate (3.2 g), toluene (50 mL), and water (5 mL) was stirred at reflux temperature for three hours. To the reaction mixture, Solmix A-11 was added to precipitate a solid. The solid obtained by filtration was washed with water and Solmix A-11. The resulting solid was decolored using silica gel and washed with toluene to obtain pale yellowish green solid compound (1-221) (1.4 g).

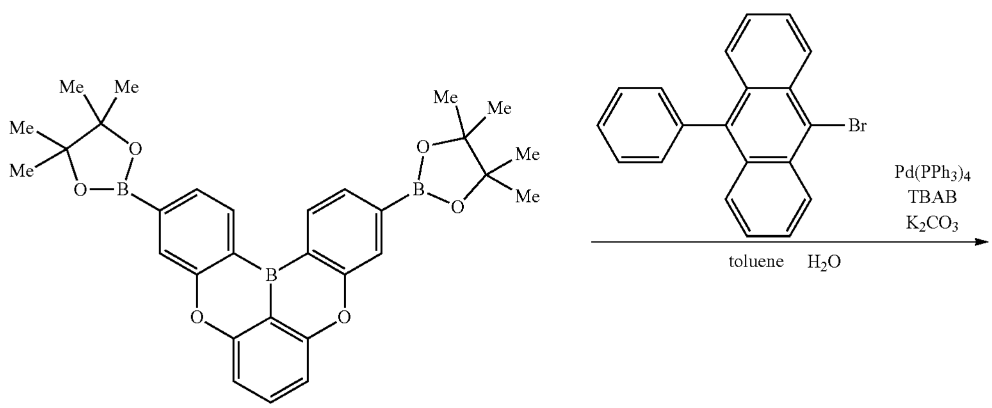

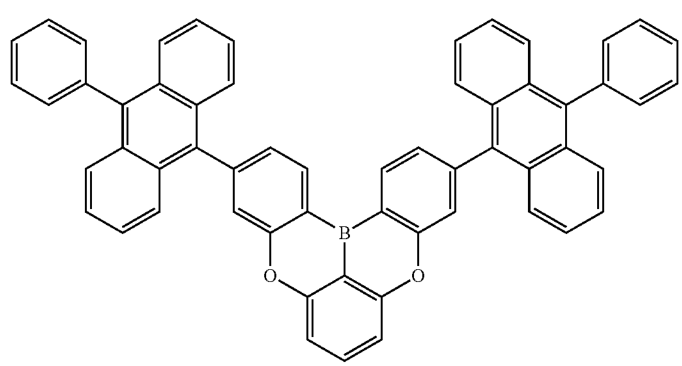

(1-221)

It was confirmed that the resulting compound was a target product by LC-MS measurement.

MS (ACPI) m/z=775 (M+H)

Synthesis Example (1-11)

Synthesis of Compound (1-191): 3-(9,9'-spirobi[fluorene]-2-yl)-5,9-dioxa-13b-boranaphtho[3,2,1-de]anthracene (1-191)

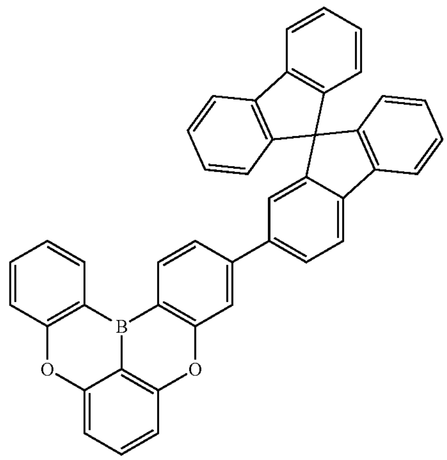

Synthesis was performed in a similar manner to Synthesis Example (1-6) except that 2-bromo-9,9'-spirobi[fluorene] was used instead of 9-(4-bromophenyl)-10-phenylanthracene as a raw material.

The structure of the resulting compound was confirmed by NMR measurement.

$^1$H-NMR (400 MHz, $CDCl_3$): δ=8.64-8.59 (m, 2H), 7.98-7.96 (m, 1H), 7.91-7.87 (m, 3H), 7.81-7.66 (m, 3H), 7.60-7.57 (m, 1H), 7.54-7.46 (m, 2H), 7.42-7.33 (m, 4H), 7.22-7.10 (m, 6H), 6.82-6.74 (m, 3H).

Synthesis Example (1-12)

Synthesis of Compound (1-198): 3-(9,9'-spirobi[fluorene]-4-yl)-5,9-dioxa-13b-boranaphtho[3,2,1-de]anthracene (1-198)

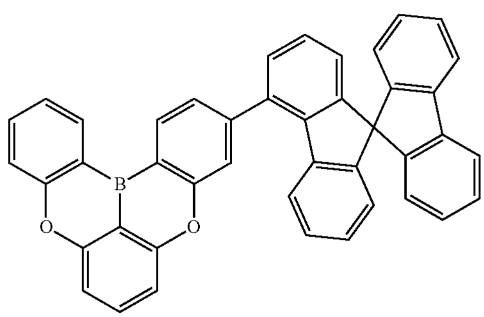

Synthesis was performed in a similar manner to Synthesis Example (1-6) except that 4-bromo-9,9'-spirobi[fluorene] was used instead of 9-(4-bromophenyl)-10-phenylanthracene as a raw material.

The structure of the resulting compound was confirmed by NMR measurement.

$^1$H-NMR (400 MHz, $CDCl_3$): δ=8.90-8.85 (m, 1H), 8.82-8.79 (m, 1H), 7.88-7.81 (m, 4H), 7.78-7.73 (m, 1H), 7.68-7.64 (m, 1H), 7.62-7.58 (m, 1H), 7.47-7.37 (m, 3H), 7.32-7.26 (m, 3H), 7.20-7.13 (m, 4H), 7.06-6.98 (m, 2H), 6.87-6.81 (m, 2H), 6.79-6.75 (m, 1H), 6.73-6.69 (m, 1H).

Synthesis Example (1-13)

Synthesis of Compound (1-174): 3-(dibenzo[g,p]chrysen-2-yl)-5,9-dioxa-13b-boranaphtho[3,2,1-de]anthracene (1-174)

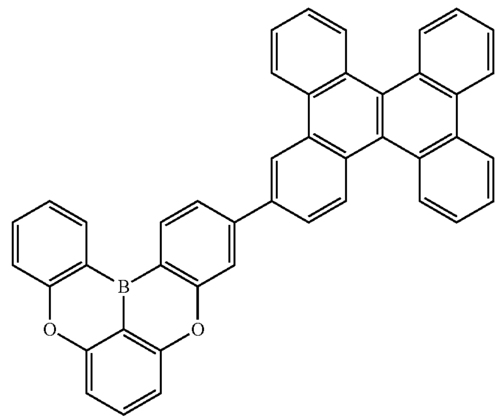

Synthesis was performed in a similar manner to Synthesis Example (1-6) except that dibenzo[g,p]chrysen-2-yl trifluoromethane sulfonate was used instead of 9-(4-bromophenyl)-10-phenylanthracene as a raw material.

The structure of the resulting compound was confirmed by NMR measurement.

$^1$H-NMR (400 MHz, $CDCl_3$): δ=9.11-9.08 (m, 1H), 8.88-8.72 (m, 9H), 8.06-8.02 (m, 2H), 7.91-7.81 (m, 2H), 7.77-7.65 (m, 7H), 7.60-7.57 (m, 1H), 7.46-7.41 (m, 1H), 7.32-7.24 (m, 2H).

Synthesis Example (1-14)

Synthesis of Compound (1-144)

(1-144)

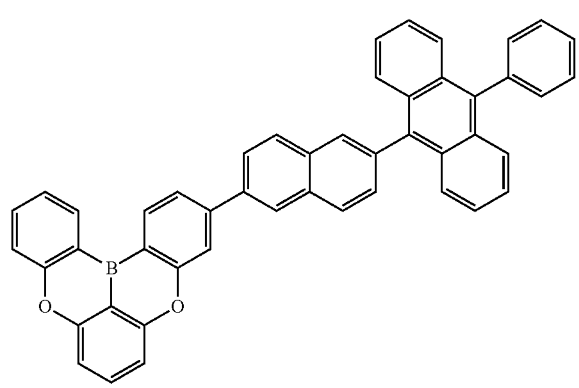

Synthesis was performed in a similar manner to Synthesis Example (1-6) except that 6-(10-phenylanthracen-9-yl) naphthalen-2-yl trifluoromethane sulfonate was used instead of 9-(4-bromophenyl)-10-phenylanthracene as a raw material.

Synthesis Example (1-15)

Synthesis of Compound (1-145)

(1-145)

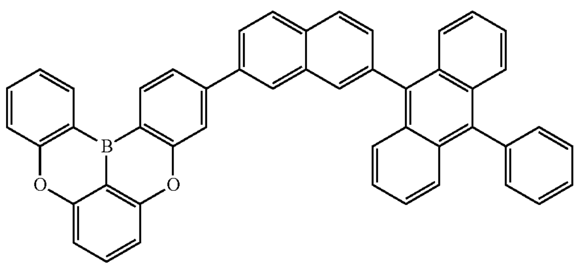

Synthesis was performed in a similar manner to Synthesis Example (1-6) except that 7-(10-phenylanthracen-9-yl) naphthalen-2-yl trifluoromethane sulfonate was used instead of 9-(4-bromophenyl)-10-phenylanthracene as a raw material.

Synthesis Example (1-16)

Synthesis of Compound (1-156)

(1-156)

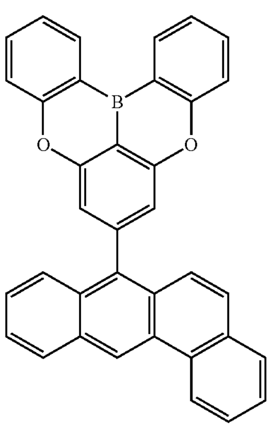

Synthesis was performed in a similar manner to Synthesis Example (1-6) except that this 7-chloro compound was used instead of 3-chloro-5,9-dioxa-13b-boranaphtho[3,2,1-de]anthracene and 7-bromotetraphene was used instead of 9-(4-bromophenyl)-10-phenylanthracene as raw materials.

The structure of the resulting compound was confirmed by NMR measurement.

$^1$H-NMR (400 MHz, $CDCl_3$): δ=9.3 (s, 1H), 8.9 (d, 1H), 8.8 (dd, 2H), 8.2 (d, 1H), 7.8 (d, 1H), 7.7 (m, 4H), 7.6 (t, 1H), 7.6-7.5 (m, 5H), 7.4 (t, 3H), 7.4 (s, 2H).

Synthesis Example (1-17)

Synthesis of Compound (1-146)

(1-146)

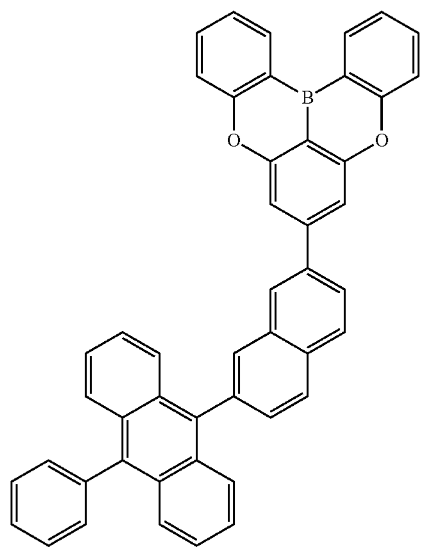

Synthesis was performed in a similar manner to Synthesis Example (1-6) except that this 7-chloro compound was used instead of 3-chloro-5,9-dioxa-13b-boranaphtho[3,2,1-de]anthracene and 7-(10-phenylanthracen-9-yl) naphthalen-2-yl trifluoromethane sulfonate was used instead of 9-(4-bromophenyl)-10-phenylanthracene as raw materials.

The structure of the resulting compound was confirmed by NMR measurement.

$^1$H-NMR (400 MHz, $CDCl_3$): δ=8.8 (d, 1H), 8.7 (dd, 1H), 8.3 (s, 1H), 8.2-8.1 (m, 2H), 8.1 (s, 1H), 8.0 (dd, 1H), 8.0 (d, 1H), 7.8 (m, 2H), 7.8-7.7 (m, 5H), 7.7-7.6 (m, 3H), 7.6 (m, 2H), 7.5 (m, 2H), 7.4 (m, 1H), 7.4-7.3 (m, 4H), 7.3 (m, 2H).

Synthesis Example (1-18)

Synthesis of Compound (1-147)

(1-147)

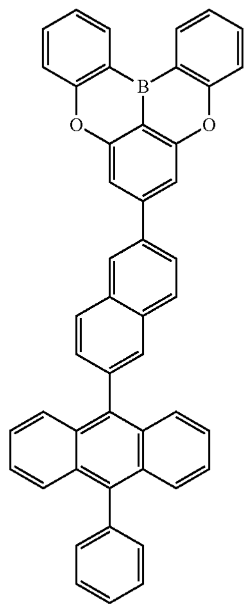

Synthesis was performed in a similar manner to Synthesis Example (1-6) except that a 7-chloro compound was used instead of 3-chloro-5,9-dioxa-13b-boranaphtho[3,2,1-de]anthracene and 6-(10-phenylanthracen-9-yl) naphthalen-2-yl trifluoromethane sulfonate was used instead of 9-(4-bromophenyl)-10-phenylanthracene as raw materials.

The structure of the resulting compound was confirmed by NMR measurement.

$^{1}$H-NMR (400 MHz, $CDCl_3$): δ=8.9 (m, 1H), 8.8 (m, 1H), 8.4 (s, 1H), 8.2 (d, 1H), 8.1-8.0 (m, 4H), 7.9-7.8 (m, 2H), 7.8-7.5 (m, 11H), 7.5-7.4 (m, 1H), 7.4-7.3 (m, 4H), 7.3 (m, 3H).

Synthesis Example (1-19)

Synthesis of Compound (1-148)

(1-148)

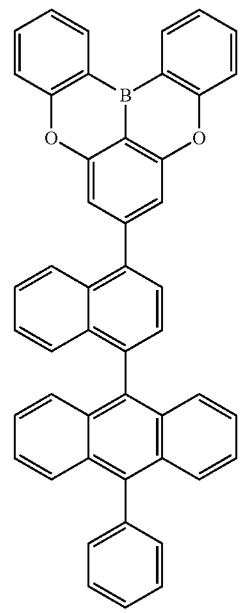

Synthesis was performed in a similar manner to Synthesis Example (1-6) except that this 7-chloro compound was used instead of 3-chloro-5,9-dioxa-13b-boranaphtho[3,2,1-de]anthracene and 4-(10-phenylanthracen-9-yl) naphthalen-1-yl trifluoromethane sulfonate was used instead of 9-(4-bromophenyl)-10-phenylanthracene as raw materials.

The structure of the resulting compound was confirmed by NMR measurement.

$^{1}$H-NMR (400 MHz, $CDCl_3$): δ=8.7 (dd, 2H), 8.2 (d, 1H), 7.8-7.7 (m, 5H), 7.7-7.5 (m, 12H), 7.5 (m, 1H), 7.4 (m, 2H), 7.4-7.3 (m, 6H).

Synthesis Example (1-20)

Synthesis of Compound (1-82): 2-(10-(2-biphenylyl) anthracen-9-yl)-5,9-dioxa-13b-boranaphtho[3,2,1-de]anthracene (1-82)

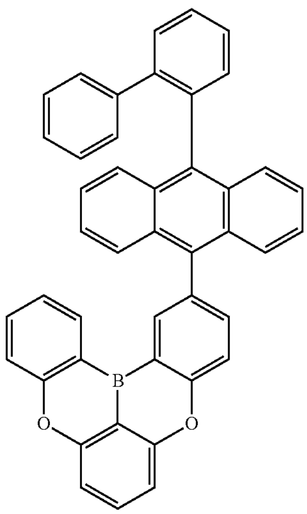

A flask containing 2-chloro-9-dioxa-13b-boranaphtho[3,2,1-de]anthracene (20 g), 4,4,4',4' 5,5,5',5'-octamethyl-2,2'-bi(1,3,2-dioxaborolane) (33 g), palladium acetate (0.29 g), potassium acetate (13 g), dicyclohexyl (2',6'-dimethoxy-[1,1'-biphenyl]-2-yl) phosphane (1.4 g), potassium carbonate (9.1 g), and cyclopentyl methylether (80 mL) was stirred at reflux temperature for 40 minutes. The reaction liquid was cooled to room temperature, and then a solid was removed by filtration under reduced pressure. A solvent in a filtrate was distilled off under reduced pressure. The resulting solid was decolored using silica gel and washed with Solmix A-11 to obtain white solid 2-(4,4,5,5-tetramethyl-1,3,2-dioxaborolan-2-yl)-5,9-dioxa-13b-boranaphtho[3,2,1-de]anthracene (24 g).

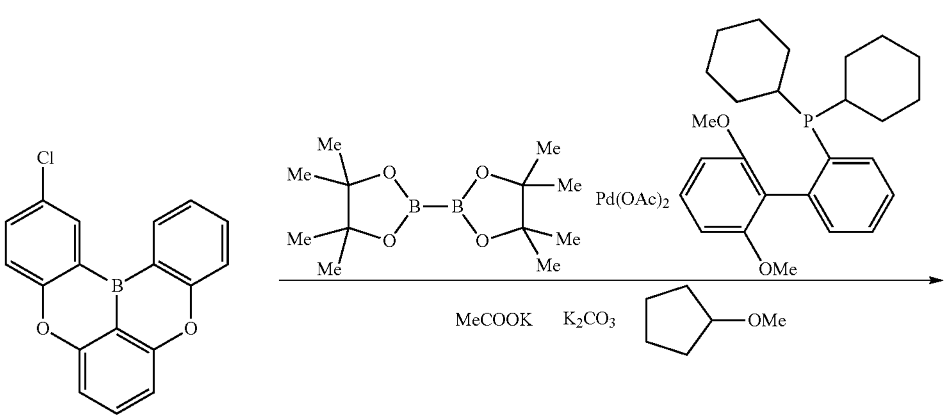

-continued

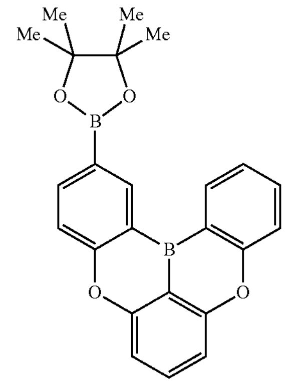

A flask containing 2-(4,4,5,5-tetramethyl-1,3,2-dioxaborolan-2-yl)-5,9-dioxa-13b-boranaphtho[3,2,1-de]anthracene (4.8 g), 9-(2-biphenylyl)-10-bromoanthracene (5 g), dichlorobis(triphenylphosphine) palladium (II) ($Pd(PPh_3)_2Cl_2$, 0.51 g), triphenylphosphine (0.38 g), tetrabutylammonium bromide (TBAB, 0.20 g), potassium carbonate (3.4 g), toluene (50 mL), and water (5 mL) was stirred at reflux temperature for seven hours. The reaction mixture was filtered under reduced pressure, and a solid was collected. The resulting solid was decolored using silica gel and washed twice with heated toluene to obtain pale yellow solid compound (1-82) (3.6 g).

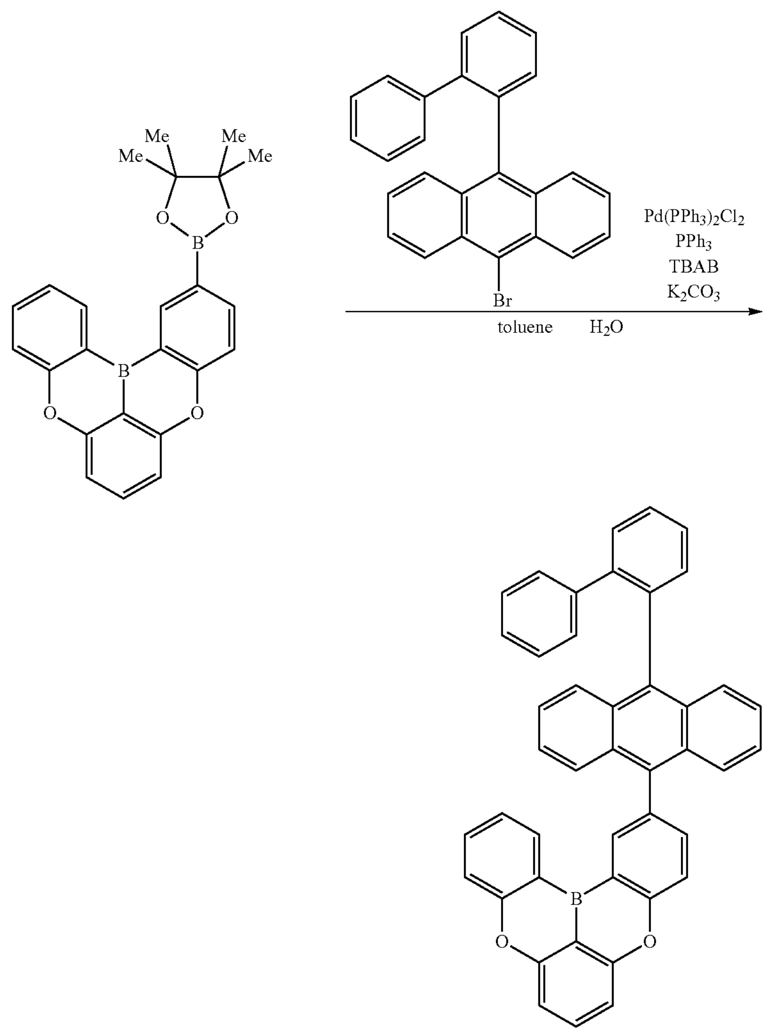

(1-82)

The structure of the resulting compound was confirmed by NMR measurement.

$^{1}$H-NMR (400 MHz, $CDCl_3$): δ=8.75-8.44 (m, 1H), 7.88-7.83 (m, 1H), 7.88-7.82 (m, 1H), 7.78-7.42 (m, 12H), 7.35-6.85 (m, 12H).

Synthesis Example (1-21)

Synthesis of Compound (1-52): 2-(10-(1-naphthyl) anthracen-9-yl)-5,9-dioxa-13b-boranaphtho[3,2,1-de]anthracene (1-52)

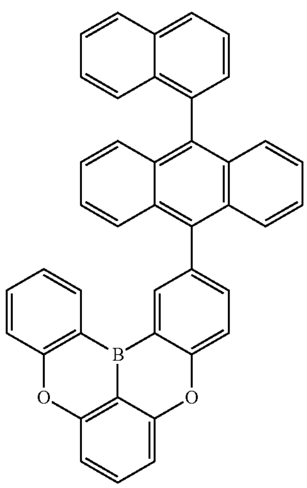

Synthesis was performed in a similar manner to Synthesis Example (1-20) except that 9-(1-naphthyl)-10-bromoanthracene was used instead of 9-(2-biphenylyl)-10-bromoanthracene as a starting raw material.

The structure of the resulting compound was confirmed by NMR measurement.

$^{1}$H-NMR (400 MHz, $CDCl_3$): δ=8.90-8.80 (m, 1H), 8.58-8.49 (m, 1H), 8.11-8.00 (m, 2H), 7.93-7.80 m, 6H), 7.76-7.47 (m, 8H), 7.37-7.26 (m, 7H).

Synthesis Example (1-22)

Synthesis of Compound (1-57): 2-(10-(2-naphthyl) anthracen-9-yl)-5,9-dioxa-13b-boranaphtho[3,2,1-de]anthracene (1-57)

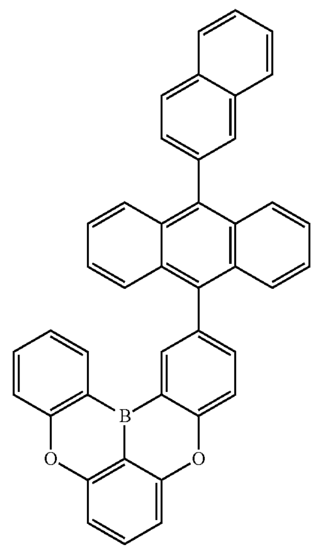

Synthesis was performed in a similar manner to Synthesis Example (1-20) except that 9-(2-naphthyl)-10-bromoanthracene was used instead of 9-(2-biphenylyl)-10-bromoanthracene as a starting raw material.

The structure of the resulting compound was confirmed by NMR measurement.

$^{1}$H-NMR (400 MHz, $CDCl_3$): δ=8.84-8.81 (m, 1H), 8.52-8.49 (m, 1H), 8.14-8.02 (m, 3H), 7.98-7.92 (m, 1H), 7.90-7.75 (m, 7H), 7.70-7.60 (m, 4H), 7.57-7.53 (m, 1H), 7.39-7.27 (m, 6H), 7.22-7.17 (m, 1H).

Synthesis Example (1-23)

Synthesis of Compound (1-12): 2-(9,10-diphenylanthracen-2-yl)-5,9-dioxa-13b-boranaphtho[3,2,1-de] anthracene (1-12)

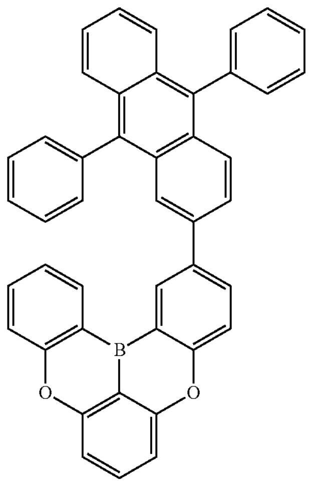

Synthesis was performed in a similar manner to Synthesis Example (1-20) except that 2-bromo-9,10-diphenylanthracene was used instead of 9-(2-biphenylyl)-10-bromoanthracene as a starting raw material.

The structure of the resulting compound was confirmed by NMR measurement.

$^1$H-NMR (400 MHz, $CDCl_3$): δ 8.88-8.85 (m, 1H), 8.56-8.53 (m, 1H), 8.08-8.06 (m, 1H), 7.94-7.90 (m, 1H), 7.88-7.84 (m, 1H), 7.82-7.71 (m, 5H), 7.70-7.52 (m, 12H), 7.43-7.32 (m, 3H), 7.26-7.22 (m, 2H).

Synthesis Example (1-24)

Synthesis of Compound (1-102): 2-(10-(dibenzo[b,d]furan-2-yl) anthracen-9-yl)-5,9-dioxa-13b-boranaphtho[3,2,1-de]anthracene (1-102)

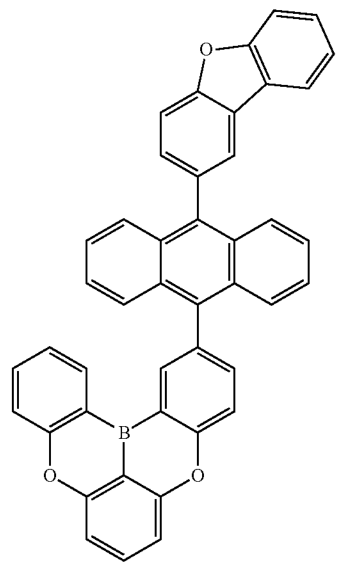

A flask containing 9-bromoanthracene (5 g), dibenzo[b,d]furan-2-boronic acid (4.9 g), [1,1'-bis(diphenylphosphino) ferrocene palladium (II) dichloride ($Pd(dppf)Cl_2$, 0.42 g), triphenylphosphine (0.31 g), tetrabutylphosphonium bromide (0.33 g), potassium carbonate (5.4 g), water (10 mL), and toluene (100 mL) was stirred at reflux temperature for four hours. An organic layer of the reaction mixture was condensed. The resulting solid was decolored using silica gel and washed with heptane to obtain 2-(anthracen-9-yl)-dibenzo[b,d]furan (6.4 g).

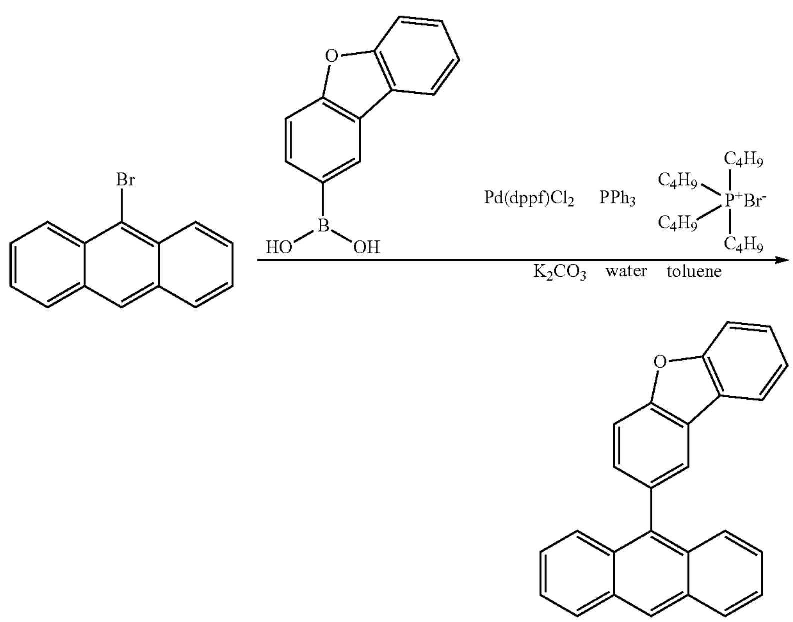

A flask containing 2-(anthracen-9-yl)-dibenzo[b,d]furan (6.4 g), N-bromosuccinimide (3.0 g), and tetrahydrofuran (THF, 100 mL) was heated to 50° C. and stirred for two hours. The reaction mixture was condensed and decolored using silica gel. The resulting solid was washed with Solmix A-11 to obtain pale yellow solid 2-(10-bromoanthracen-9-yl) dibenzo[b,d]furan (7.6 g).

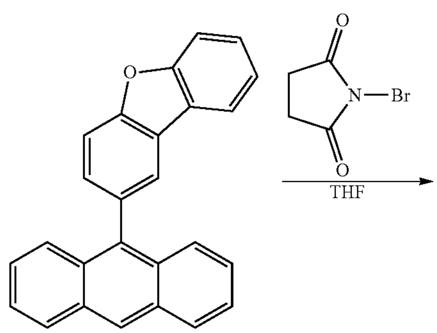

-continued

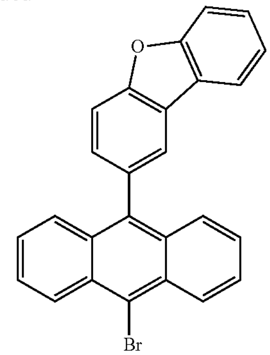

A flask containing 2-(4,4,5,5-tetramethyl-1,3,2-dioxaborolan-2-yl)-5,9-dioxa-13b-boranaphtho[3,2,1-de]anthracene (3.1 g), 2-(10-bromoanthracen-9-yl) dibenzo[b,d]furan (3.7 g), dichlorobis(triphenylphosphine) palladium (II) (Pd $(PPh_3)_2Cl_2$, 0.33 g), triphenyiphosphine (0.25 g), tetrabutylammonium bromide (TBAB, 0.13 g), potassium carbonate (2.2 g), toluene (30 mL), and water (3 mL) was stirred at reflux temperature for 13 hours. A toluene layer of the reaction mixture was condensed and decolored using silica gel. The resulting solid was washed with toluene and then with ethyl acetate to obtain pale yellow solid compound (1-102) (2.8 g).

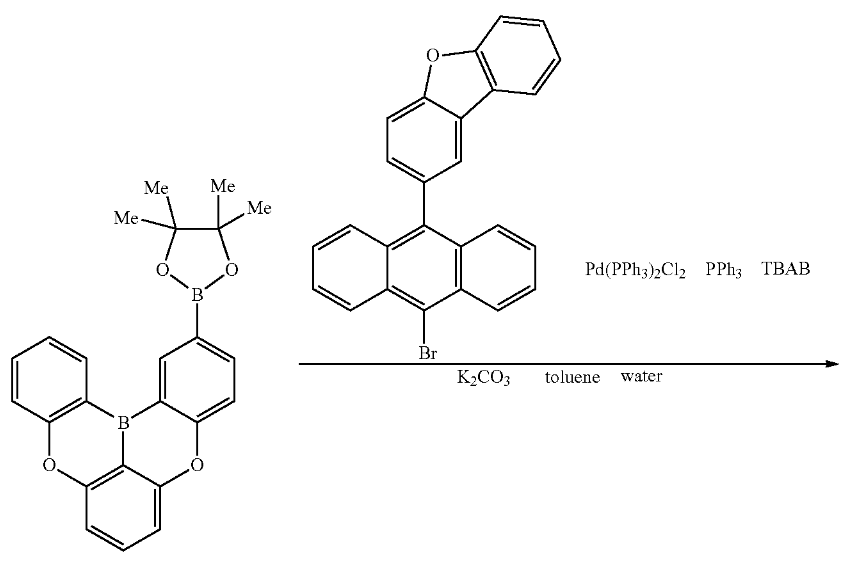

-continued

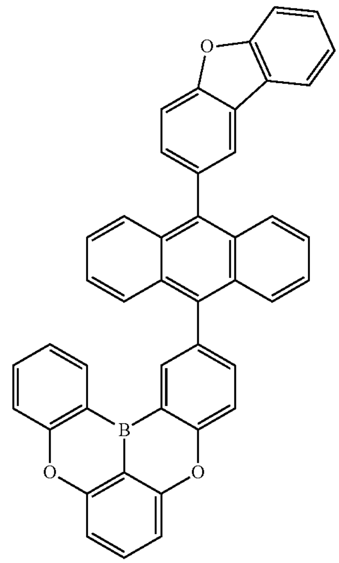

(1-102)

The structure of the resulting compound was confirmed by NMR measurement.

$^1$H-NMR (400 MHz, $CDCl_3$): δ=8.83-8.80 (m, 1H), 8.51-8.48 (m, 1H), 8.13-8.09 (m, 1H), 7.96-7.93 (m, 1H), 7.90-7.74 (m, 8H), 7.70-7.60 (m, 3H), 7.57-7.50 (m, 2H), 7.41-7.28 (m, 7H), 7.22-7.16 (m, 1H).

Synthesis Example (1-25)

Synthesis of Compound (1-182): 2-(bromo-7,7-diphenyl-7H-benzo[c]fluorene-5-yl)-5,9-dioxa-13b-boranaphtho[3,2,1-de]anthracene (1-182)

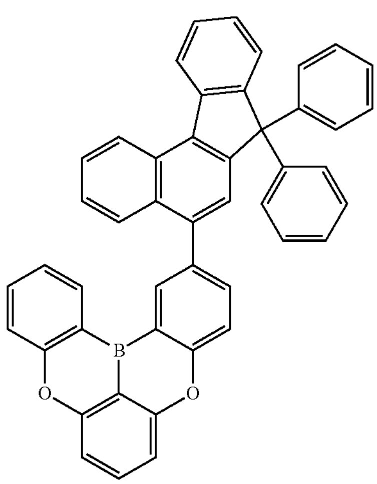

Synthesis was performed in a similar manner to Synthesis Example (1-20) except that 5-bromo-7,7-diphenyl-7H-benzo[c]fluorene was used instead of 9-(2-biphenylyl)-10-bromoanthracene as a starting raw material.

The structure of the resulting compound was confirmed by NMR measurement.

$^1$H-NMR (400 MHz, $CDCl_3$): δ=8.96-8.92 (m, 1H), 8.74-8.72 (m, 1H), 8.50-8.45 (m, 2H), 8.16-8.12 (m, 1H), 7.86-7.80 (m, 2H), 7.73-7.63 (m, 4H), 7.55-7.49 (m, 4H), 7.38-7.22 (m, 14H).

Synthesis Example (1-26)

Synthesis of Compound (1-166): 2-(benzo[a]anthracen-7-yl)-5,9-dioxa-13b-boranaphtho[3,2,1-de]anthracene (1-166)

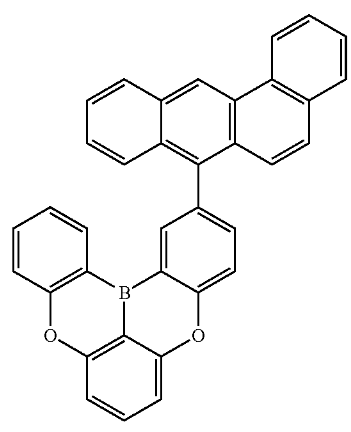

Synthesis was performed in a similar manner to Synthesis Example (1-20) except that 7-bromobenzo[a]anthracene was used instead of 9-(2-biphenylyl)-10-bromoanthracene as a starting raw material.

The structure of the resulting compound was confirmed by NMR measurement.

$^1$H-NMR (400 MHz, $CDCl_3$): δ=9.34 (s, 1H), 8.96-8.93 (m, 1H), 8.74 (s, 1H), 8.47-8.43 (m, 1H), 8.25-8.22 (m, 1H), 7.89-7.71 (m, 6H), 7.66-7.43 (m, 7H), 7.35-7.27 (m, 2H), 7.17-7.12 (m, 1H).

Synthesis Example (1-27)

Synthesis of Compound (1-55): 7-(10-(1-naphthyl) anthracen-9-yl)-5,9-dioxa-13b-boranaphtho[3,2,1-de]anthracene (1-55)

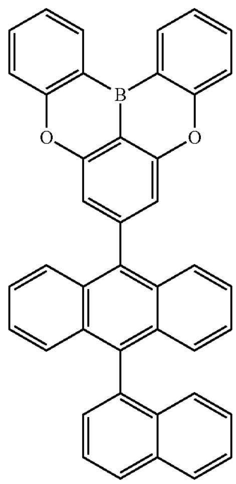

Synthesis was performed in a similar manner to Synthesis Example (1-5) except that 10-(1-naphthyl) anthracen-9-yl) boronic acid was used instead of (10-phenyl-anthracen-9-yl) boronic acid as a starting raw material.

The structure of the resulting compound was confirmed by NMR measurement.

$^1$H-NMR (400 MHz, $CDCl_3$): δ=8.81-8.77 (m, 2H), 8.10-8.00 (m, 2H), 7.82-7.70 (m, 5H), 7.63-7.57 (m, 3H), 7.53-7.43 (m, 7H), 7.35-7.19 (m, 6H).

Synthesis Example (1-28)

Synthesis of Compound (1-85): 2-(10-(2-biphenylyl) anthracen-9-yl)-5,9-dioxa-13b-boranaphtho[3,2,1-de]anthracene (1-85)

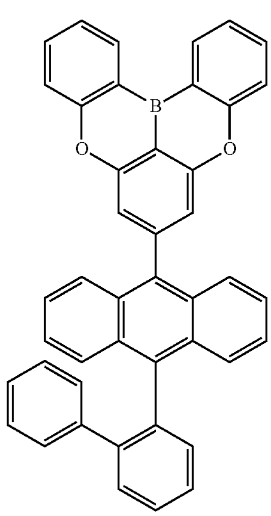

Synthesis was performed in a similar manner to Synthesis Example (1-20) except that 7-chloro-9-dioxa-13b-boranaphtho[3,2,1-de]anthracene was used instead of 2-chloro-9-dioxa-13b-boranaphtho[3,2,1-de]anthracene as a starting raw material.

The structure of the resulting compound was confirmed by NMR measurement.

$^1$H-NMR (400 MHz, $CDCl_3$): δ=8.79-8.75 (m, 2H), 7.76-7.63 (m, 8H), 7.60-7.53 (m, 3H), 7.50-7.41 (m, 3H), 7.37-7.35 (m, 1H), 7.32-7.23 (m, 5H), 7.02-6.99 (m, 2H), 6.95-6.87 (m, 3H).

Synthesis Example (1-29)

Synthesis of Compound (1-46): 9-(10-phenylylanthracen-9-yl)-7,11-dioxa-17c-boranaphtho[2,3,4-no] tetraphene (1-46)

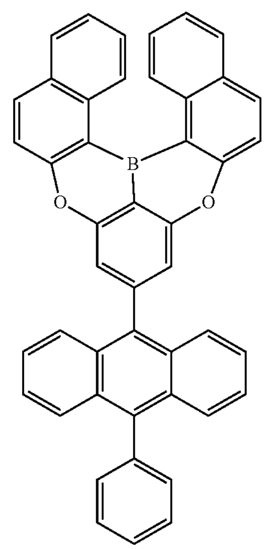

2-Naphthol (7 g), 2-bromo-5-chloro-1,3-difluorobenzene (5 g), potassium carbonate (7.6 g), and N-methylpyrolidone (20 mL) were stirred in a nitrogen atmosphere at reflux temperature for four hours. The reaction mixture was cooled to room temperature, and a solid was removed by filtration under reduced pressure. A filtrate was condensed. The resulting solid was decolored using silica gel and washed with Solmix (A 11) to obtain white solid 2,2'((2-bromo-5-chloro-1,3-phenylene) bis(oxy)) dinaphthalene (9.7 g).

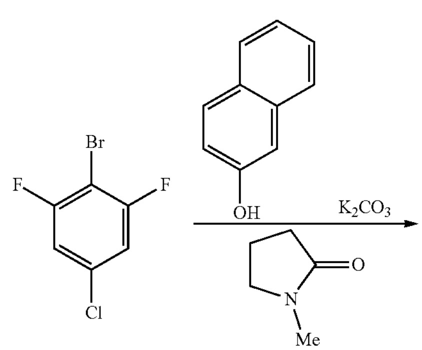

-continued

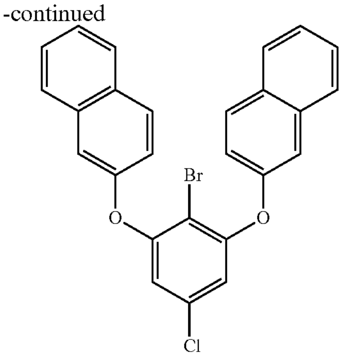

Into a flask containing 2,2'((2-bromo-5-chloro-1,3-phenylene) bis(oxy)) dinaphthalene (8.6 g) and tetrahydrofuran (30 mL), a tetrahydrofuran solution of isopropylmagnesium chloride-lithium chloride complex (1.29 mol/L, 17 mL) was dropwise added, and the resulting mixture was stirred at room temperature for two hours. Furthermore, 2-isopropoxy-4,4,5,5-tetramethyl-1,3,2-dioxaborolane (5.0 g) was dropwise added thereto, and the resulting mixture was stirred at room temperature for two hours. To the reaction mixture, water and toluene were added, and tetrahydrofuran was distilled off under reduced pressure. The resulting solution was washed with dilute hydrochloric acid and then with water. The resulting solution was decolored using silica gel and condensed under reduced pressure to obtain white solid 2-(4-chloro-2,6-bis(naphthalen-2-yloxy) phenyl)-4,4,5,5-tetramethyl-1,3,2-dioxaborolane (8.8 g).

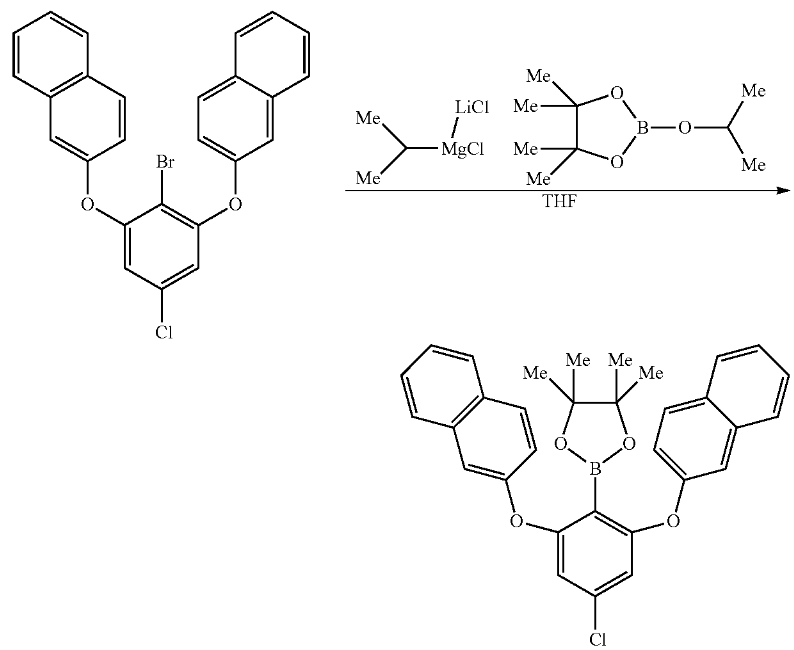

Into a flask containing 2-(4-chloro-2,6-bis(naphthalen-2-yloxy) phenyl)-4,4,5,5-tetramethyl-1,3,2-dioxaborolane (7.8 g), aluminum chloride (20 g), and chlorobenzene (50 mL), N,N-diisopropylethylamine (9.6 g) was dropwise added slowly. The resulting mixture was heated to 130° C.; and stirred for four hours. The reaction mixture was cooled and added to ice water. A precipitated solid was filtered under reduced pressure, and the solid was washed with Solmix (A-11) and toluene to obtain pale brown solid 9-chloro-7,11-dioxa-17c-boranaphtho[2,3,4-no]tetraphene (0.4 g).

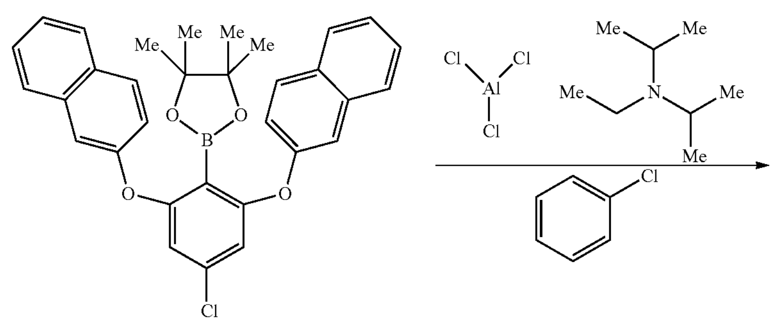

-continued

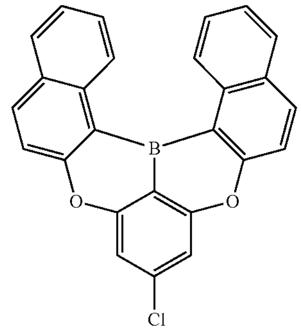

A flask containing 9-chloro-7,11-dioxa-17c-boranaphtho[2,3,4-no]tetraphene (0.4 g), (10-phenyl-anthracen-9-yl) boronic acid (0.59 g), palladium acetate (0.007 g), potassium phosphate (0.31 g), dicyclohexyl (2',6'-dimethoxy-[1,1'-biphenyl]-2-yl) phosphane (0.024 g), cyclopentyl methylether (10 mL), and water (2 mL) was stirred at reflux temperature for six hours. An organic layer of the reaction mixture was condensed and purified with a silica gel column to obtain pale yellow solid compound (1-46) (0.21 g).

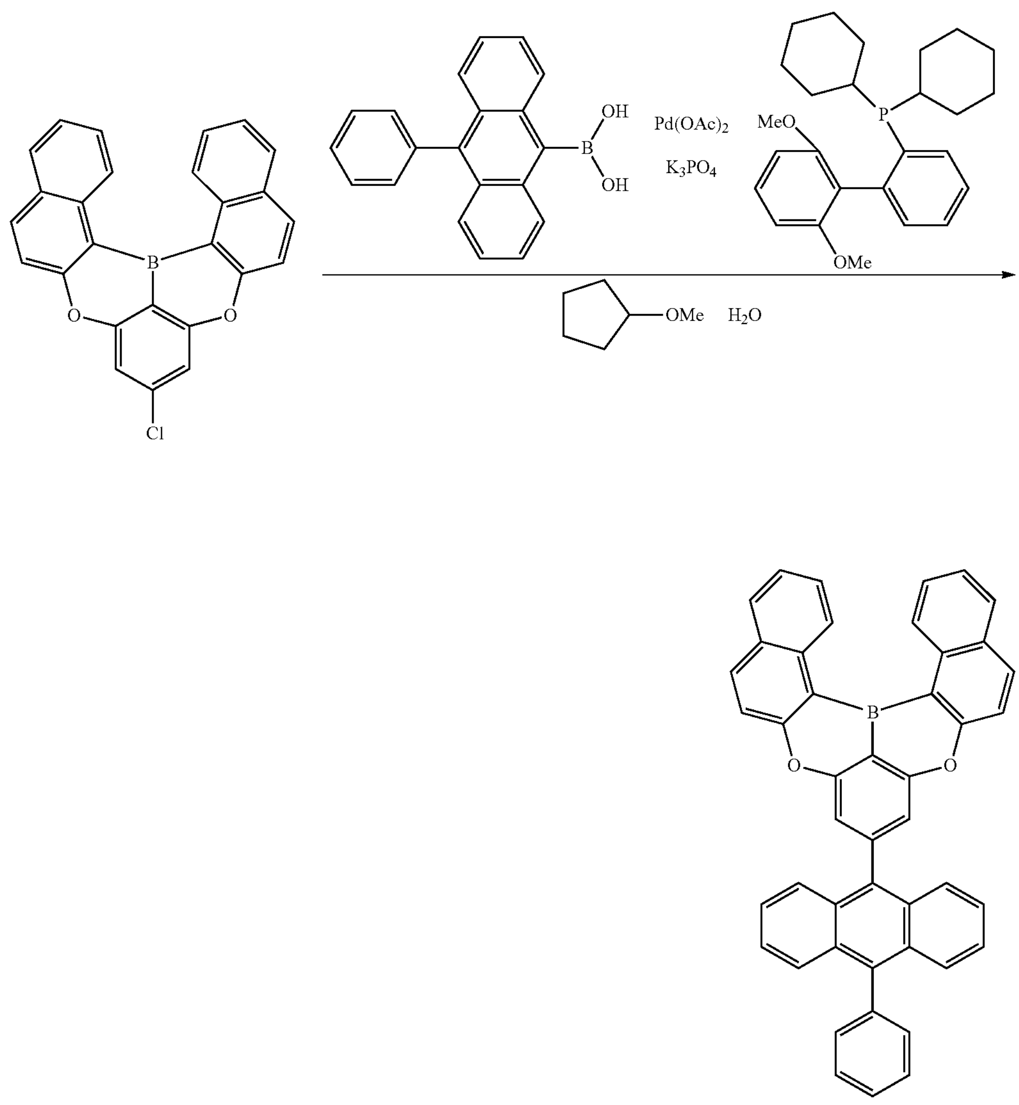

(1-46)

The structure of the resulting compound was confirmed by NMR measurement.

$^1$H-NMR (400 MHz, $CDCl_3$): δ=8.21-8.17 (m, 2H), 7.96-7.92 (m, 2H), 7.87-7.83 (m, 2H), 7.78-7.71 (m, 6H), 7.65-7.43 (m, 9H), 7.37-7.30 (m, 4H), 7.17-7.12 (m, 2H).

Comparative Synthesis Example

Synthesis of Comparative Compound (EM-3)

(EM-3)

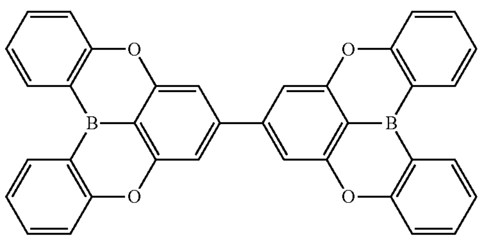

A flask containing 7-chloro-5,9-dioxa-13b-boranaphtho[3,2,1-de]anthracene (1.5 g), 7-(4,4,5,5-tetramethyl-1,3,2-dioxaborolan-2-yl)-5,9-dioxa-13b-boranaphtho[3,2,1-de]anthracene (2.0 g), SPhos Pd G2 (trade name: Sigma-Aldrich and the like) (18 mg) as a palladium catalyst, potassium carbonate (1.4 g), tetrabutylammonium bromide (TBAB, 0.49 g), cyclopentyl methylether (CPME, 30 mL), and water (3 mL) was stirred at reflux temperature for three hours. The reaction liquid was cooled to room temperature, and water was added thereto. The resulting mixture was stirred, and then a solid was filtered. The resulting solid was dissolved in heated o-dichlorobenzene and then filtered with celite. A filtrate was condensed, and the resulting solid was recrystallized with o-dichlorobenzene to obtain white solid comparative compound (EM-3) (1.0 g).

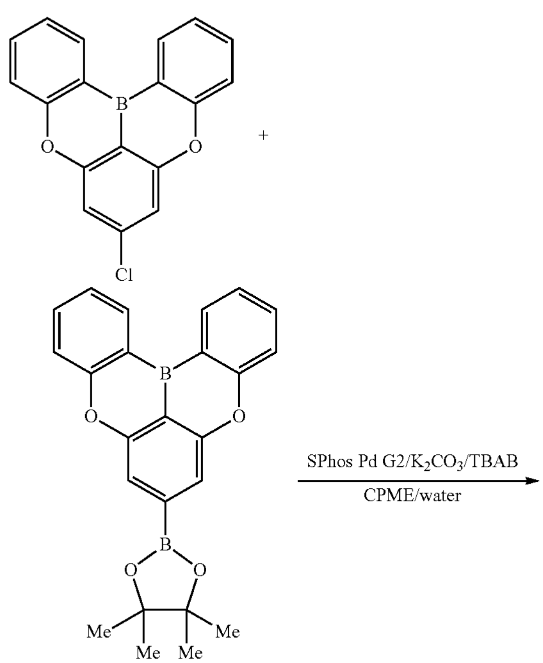

-continued

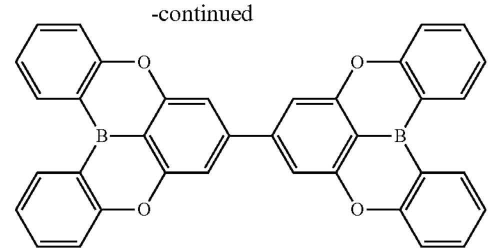

(EM-3)

The structure of the resulting compound was confirmed by NMR measurement.

$^1$H-NMR (400 MHz, 1,1,2,2-tetrachloroethane-d2, 80° C.) δ=7.3-7.4 (m, 4H), 7.5 (dd, 4H), 7.6 (s, 4H), 7.7 (m, 4H), 8.6 (dd, 4H).

Synthesis Example (2-1)

Synthesis of Compound (2-166)

(2-166)

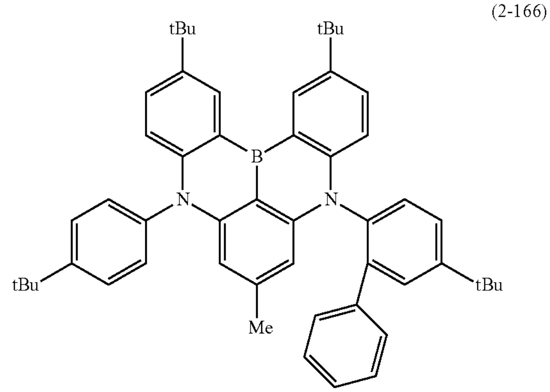 [SMILES: Cc1cc2c3c(c1)N(c1ccc(C(C)(C)C)cc1-c1ccccc1)c1ccc(C(C)(C)C)cc1B3c1cc(C(C)(C)C)ccc1N2c1ccc(C(C)(C)C)cc1]

A flask containing 2,3-dichloro-5-methylaniline (25.0 g), 1-bromo-4-(t-butylbenzene) (75.6 g), Pd-132 (2.5 g), NaOtBu (34.0 g), and xylene (250 ml) was heated and stirred at 120° C.; for four hours. The reaction liquid was cooled to room temperature. Thereafter, water and ethyl acetate were added thereto, and an organic layer was separated. The organic layer was washed with water, and then a solvent was distilled off under reduced pressure. Thereafter, the residue was purified with a silica gel short column (eluent: toluene/heptane=3/7 (volume ratio)), and further purified with an alumina column (eluent: heptane) to obtain intermediate (K) (55.0 g).

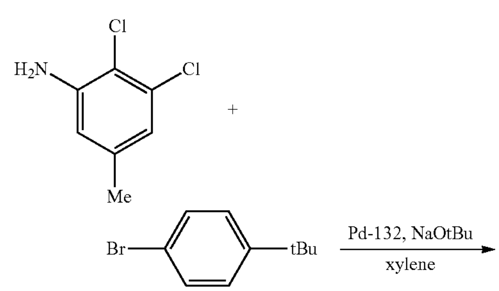

-continued

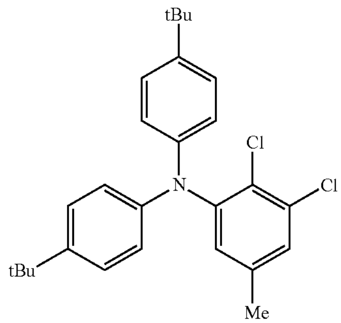

(K)

In a nitrogen atmosphere, a flask containing intermediate (K) (12.0 g), intermediate (L) (9.7 g), Pd-132 (0.19 g), NaOtBu (3.9 g), and xylene (60 ml) was heated and stirred at 120° C.; for one hour. The reaction liquid was cooled to room temperature. Thereafter, water and ethyl acetate were added thereto, and an organic layer was separated. The organic layer was washed with water, and then a solvent was distilled off under reduced pressure. Thereafter, precipitation was caused again with heptane. Furthermore, purification was performed with a silica gel short column (eluent: toluene) to obtain intermediate (M) (19.0 g).

-continued

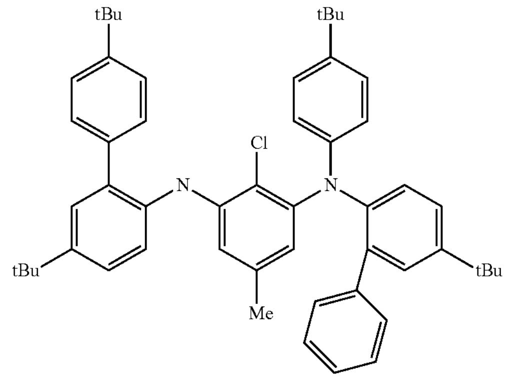

(M)

Into a flask containing intermediate (M) (19.0 g) and t-butyl benzene (100 ml), a t-butyl lithium/pentane solution (1.62 M, 41.6 ml) was added in a nitrogen atmosphere while being cooled in an ice bath. After completion of dropwise addition, the resulting mixture was heated to 70° C.; and stirred for one hour. Thereafter, a component having a lower boiling point than t-butyl benzene was distilled off under reduced pressure. The residue was cooled to −50° C., and boron tribromide (18.8 g) was added thereto. The resulting mixture was heated to room temperature and stirred for 0.5 hours. Thereafter, the mixture was cooled in an ice bath again, and N,N-diisopropylethylamine (6.4 g) was added thereto. The resulting mixture was stirred at room temperature until heat generation stopped. Thereafter, the mixture was heated to 100° C. and heated and stirred for one hour. The reaction liquid was cooled to room temperature. A sodium acetate aqueous solution cooled in an ice bath was added thereto, then ethyl acetate was added thereto, and an organic layer was separated. The organic layer was washed with water, and then a solvent was distilled off under reduced pressure. Thereafter, the residue was purified with a silica gel column (eluent: toluene/heptane=3/7 (volume ratio)). Furthermore, precipitation was caused again with heptane to obtain compound (2-166) (2.6 g).

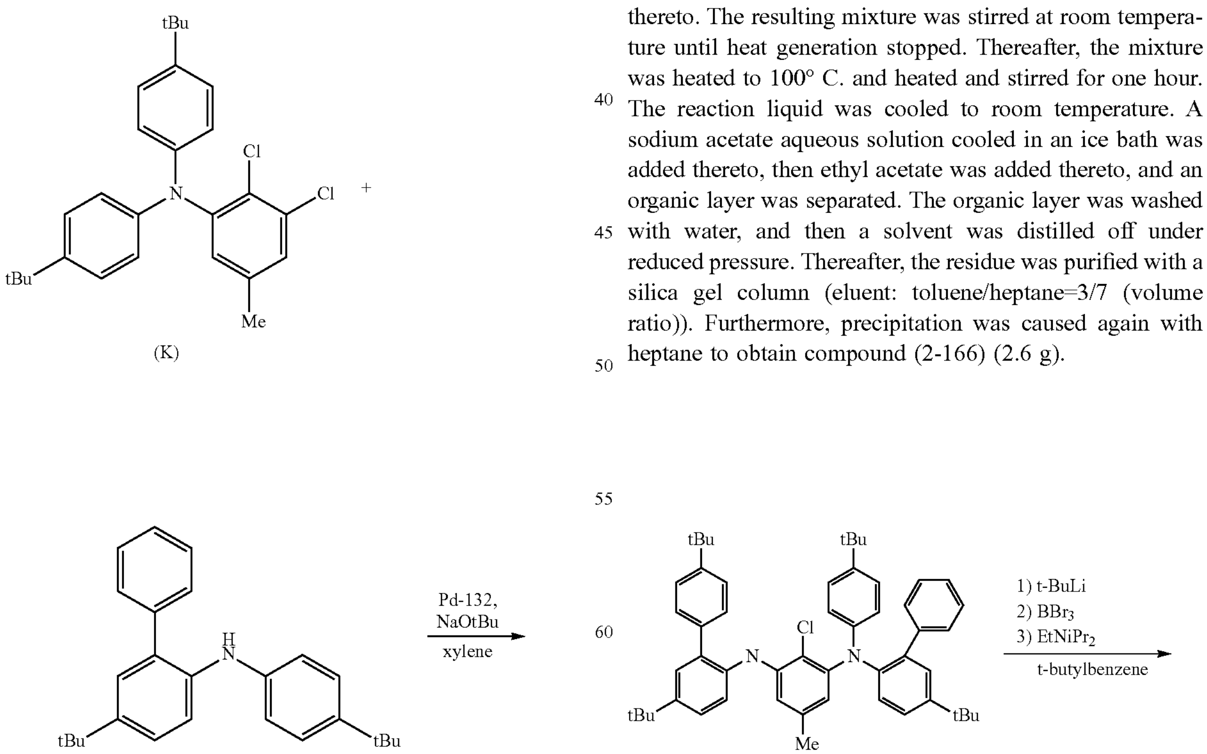

(K) (L) (M)

-continued

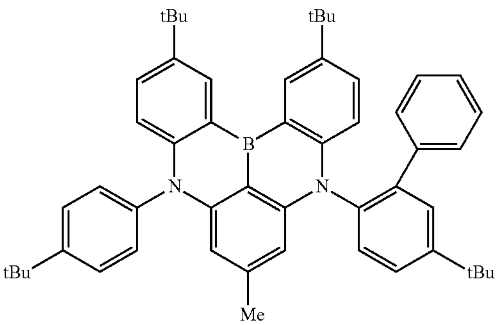

(2-166)

The structure of the resulting compound was confirmed by NMR measurement.

$^{1}$H-NMR: δ=8.92 (s, 1H), 8.86 (s, 1H), 7.68 (s, 1H), 7.67 (d, 2H), 7.64 (d, 1H), 7.48 (dd, 1H), 7.43 (dd, 1H), 7.27-7.14 (m, 5H), 7.00-6.98 (m, 3H), 6.71 (d, 1H), 6.65 (d, 1H), 6.05 (s, 1H), 5.90 (s, 1H), 2.17 (s, 3H), 1.48 (s, 9H), 1.46 (s, 9H), 1.45 (s, 9H), 1.43 (s, 9H).

Synthesis Example (2-2)

Synthesis of Compound (2-170)

(2-170)

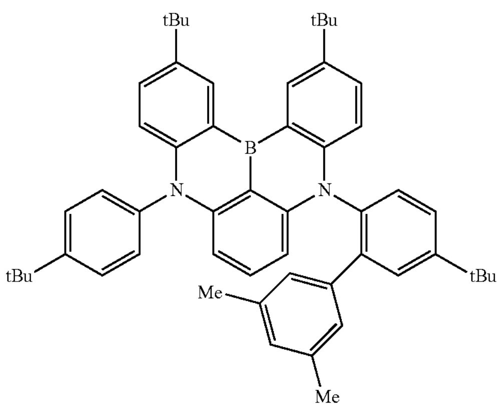

In a nitrogen atmosphere, 2-bromo-4-t-butylaniline (30.0 g), 3,5-dimethylphenyl boronic acid (23.7 g), Pd-132 (0.93 g), tripotassium phosphate (56. 0 g), toluene (400 mL), t-butanol (40 mL), and water (20 mL) were heated and stirred at 100° C. After a reaction, the mixture was cooled. Water and ethyl acetate were added thereto, and the resulting mixture was stirred. Thereafter, an organic layer was separated and washed with water. Furthermore, the organic layer was washed with dilute hydrochloric acid and water, and then condensed to obtain a crude product. The crude product was purified with a silica gel column (eluent: toluene/heptane=1/1 (volume ratio)) to obtain intermediate (N) (30.0 g).

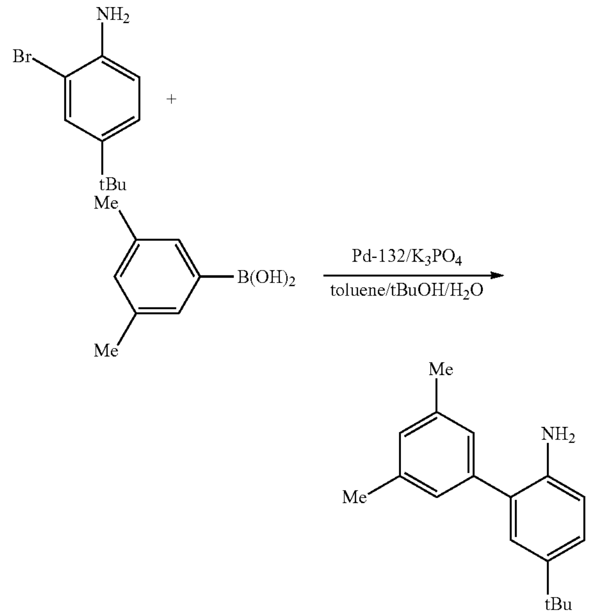

(N)

In a nitrogen atmosphere, intermediate (N) (20.0 g), 4-bromo-t-butylbenzene (16.8 g), Pd-132 (0.56 g), NaOtBu (11.4 g), and xylene (150 mL) were put, and were stirred at 110° C.; for 0.5 hours. After a reaction, water and ethyl acetate were added thereto, and the resulting mixture was stirred. Thereafter, an organic layer was separated, washed with water twice, and condensed to obtain a crude product. The crude product was purified with a silica gel column (eluent: toluene/heptane=2/8 (volume ratio)) to obtain intermediate (O) (28.0 g).

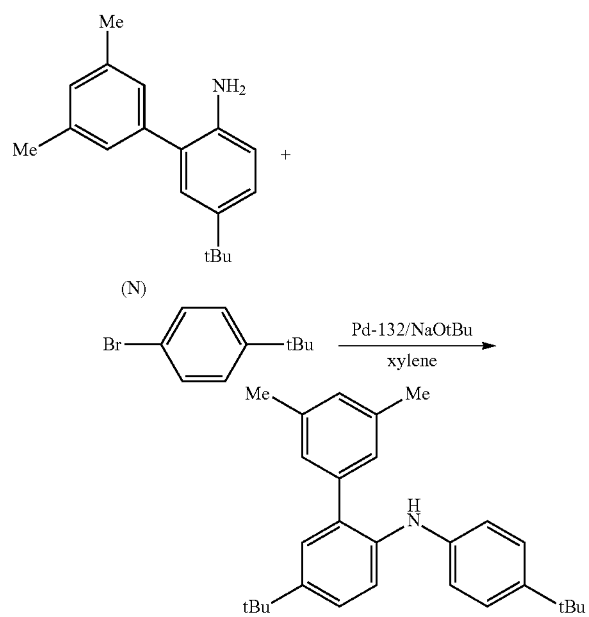

(O)

In a nitrogen atmosphere, intermediate (I) (12.0 g), intermediate (O) (10.3 g), Pd-132 (0.19 g), NaOtBu (3.9 g), and xylene (60 mL) were put, and were stirred at 120° C.; for one hour. After a reaction, water and ethyl acetate were added thereto, and the resulting mixture was stirred. Thereafter, an organic layer was separated, washed with water twice, and condensed to obtain a crude product. The crude product was purified with a silica gel short column (eluent: toluene) to obtain intermediate (P) (17.3 g).

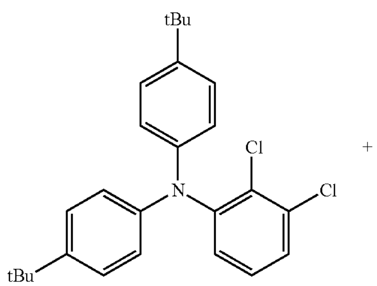

(I)

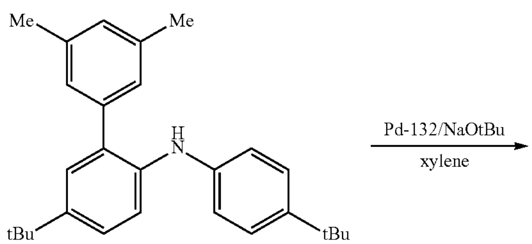

(O)

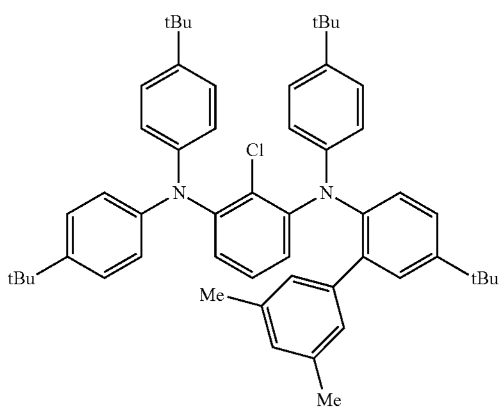

(P)

Into a flask containing intermediate (P) (17.0 g) and t-butyl benzene (100 ml), a t-butyl lithium/pentane solution (1.62 M, 27.1 ml) was added in a nitrogen atmosphere while being cooled in an ice bath. After completion of dropwise addition, the resulting mixture was heated to 70° C.; and stirred for one hour. Thereafter, a component having a lower boiling point than t-butyl benzene was distilled off under reduced pressure. The residue was cooled to −50° C., and boron tribromide (11.0 g) was added thereto. The resulting mixture was heated to room temperature and stirred for 0.5 hours. Thereafter, the mixture was cooled in an ice bath again, and N,N-diisopropylethylamine (5.7 g) was added thereto. The resulting mixture was stirred at room temperature until heat generation stopped. Thereafter, the mixture was heated to 100° C.; and heated and stirred for one hour. The reaction liquid was cooled to room temperature. A sodium acetate aqueous solution cooled in an ice bath was added thereto, then ethyl acetate was added thereto, and an organic layer was separated. The organic layer was washed with water, and then a solvent was distilled off under reduced pressure. Thereafter, the residue was purified with a silica gel column (eluent: toluene/heptane 25/75 (volume ratio)). Furthermore, precipitation was caused again with heptane to obtain compound (2-170) (2.1 g).

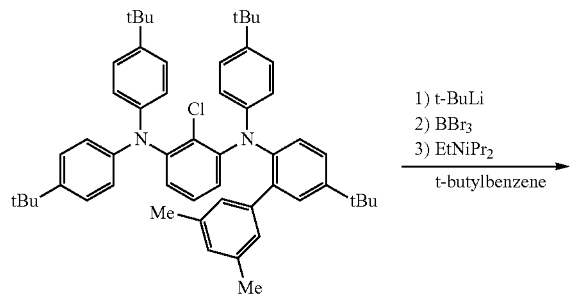

(P)

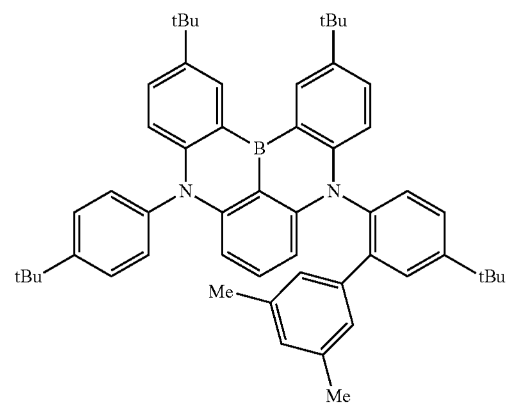

(2-170)

The structure of the resulting compound was confirmed by NMR measurement.

$^1$H-NMR: δ=1.4 (s, 9H), 1.4 (s, 9H), 1.5 (s, 9H), 1.5 (s, 9H), 1.9 (s, 6H), 6.1 (d, 1H), 6.2 (d, 1H), 6.6 (s, 1H), 6.7 (d, 1H), 6.8 (d, 1H), 7.2-7.3 (m, 6H), 7.5 (m, 2H), 7.6 (m, 1H), 7.6-7.7 (m, 3H), 8.9 (d, 1H), 8.9 (d, 1H).

Synthesis Example (2-3)

Synthesis of Compound (2-180)

(2-180)

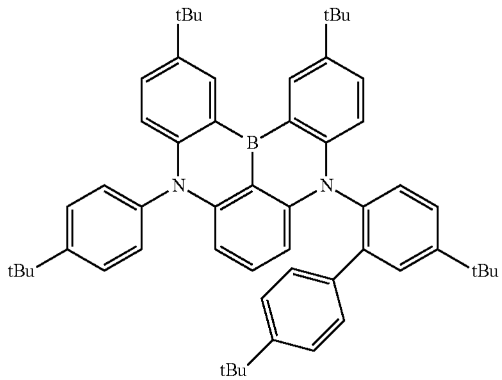

In a nitrogen atmosphere, intermediate (Q) (22.5 g), 4-bromo-t-butylbenzene (17.0 g), Pd-132 (0.57 g), NaOtBu (11.5 g), and xylene (150 mL) were put, and were heated and stirred for one hour. After a reaction, water and ethyl acetate were added thereto, and the resulting mixture was stirred. Thereafter, an organic layer was separated, washed with water twice, and condensed to obtain a crude product. The crude product was purified with a silica gel column (eluent: toluene/heptane=2/8 (volume ratio)) to obtain intermediate (R) (31.0 g).

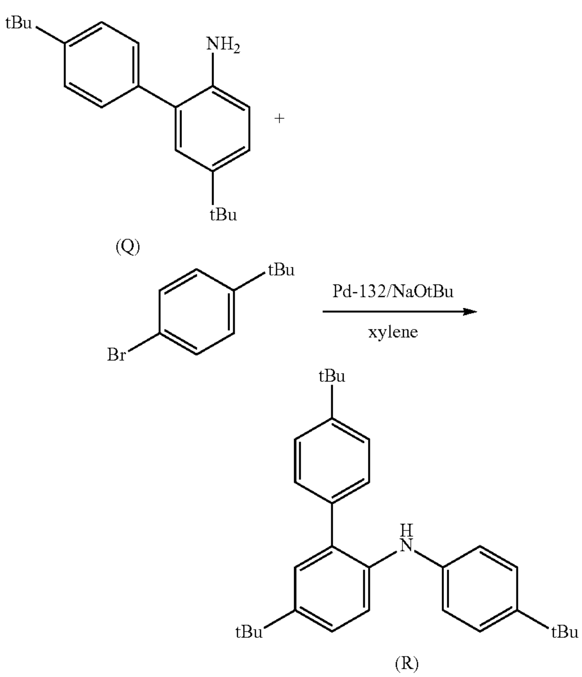

In a nitrogen atmosphere, intermediate (I) (7.6 g), intermediate (R) (7.0 g), Pd-132 (0.12 g), NaOtBu (2.60 g), and xylene (50 mL) were put, and were stirred at 120° C.; for one hour. After a reaction, water and ethyl acetate were added thereto, and the resulting mixture was stirred. Thereafter, an organic layer was separated, washed with water twice, and condensed to obtain a crude product. The crude product was purified with a silica gel column (eluent: toluene/heptane=3/7 (volume ratio)) to obtain intermediate (S) (11.5 g).

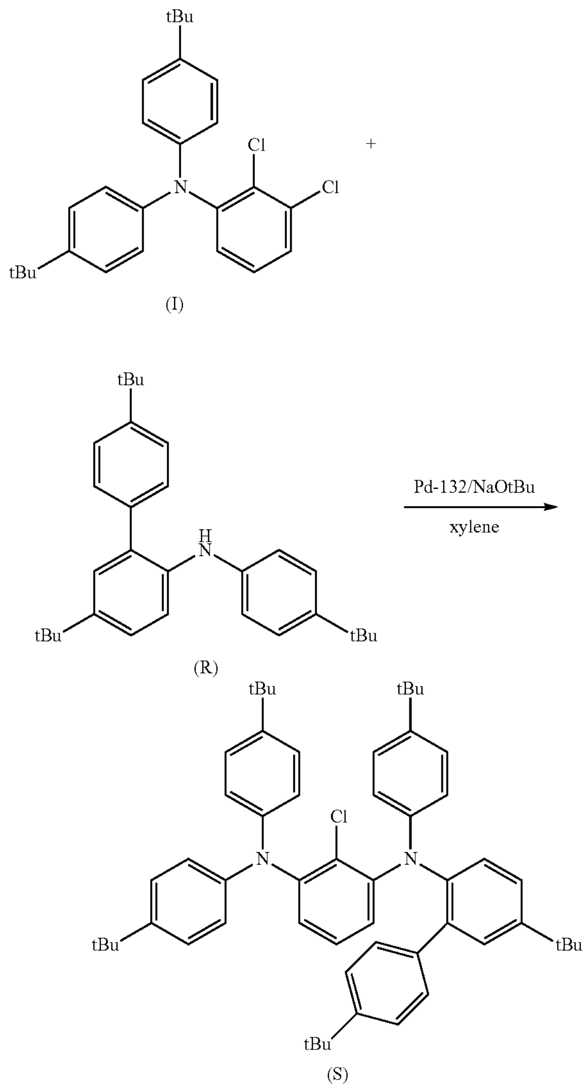

In a nitrogen atmosphere, a flask containing intermediate (S) (10.0 g) and t-butyl benzene (50 mL) was cooled in an ice bath. A t-butyl lithium/heptane solution (1.62 M, 19.2 ml) was added thereto. Thereafter, a component having a low boiling point was distilled off under reduced pressure at 60° C. The residue was cooled to about −50° C.; in a dry ice bath, and boron tribromide (9.4 g) was added thereto. The resulting mixture was heated to room temperature. N,N-diisopropylethylamine (3.2 g) was added thereto in an ice bath. Thereafter, the resulting mixture was stirred at 100° C.; for one hour. After a reaction, a sodium acetate aqueous solution was added to the reaction solution. The resulting mixture was stirred. Furthermore, ethyl acetate was added thereto, and the resulting mixture was stirred. Thereafter, an organic layer was separated. A crude product obtained from the organic layer was purified with a silica gel column (eluent: toluene/heptane=3/7 (volume ratio)) to obtain compound (2-180) (3.4 g).

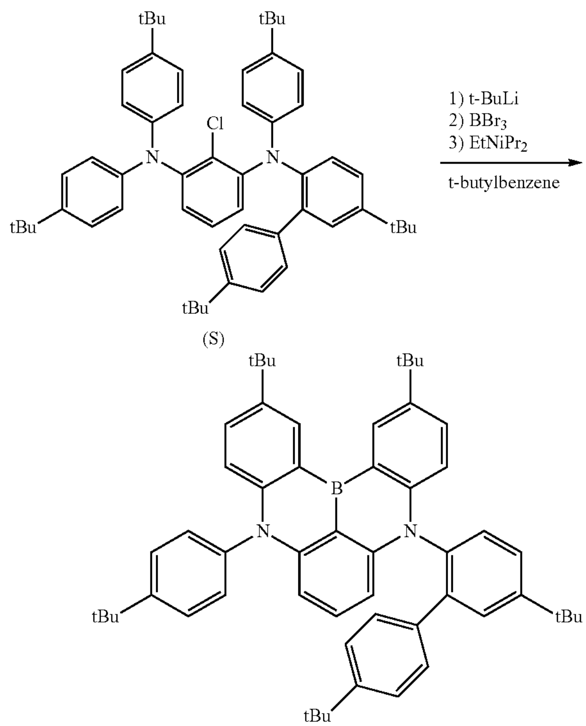

(2-180)

The structure of the resulting compound was confirmed by NMR measurement.

$^{1}$H-NMR: δ=1.1 (s, 9H), 1.4 (s, 9H), 1.5 (s, 9H), 1.5 (s, 9H), 1.5 (s, 9H), 6.1 (d, 1H), 6.2 (d, 1H), 6.7 (d, 1H), 6.8 (d, 1H), 7.0 (d, 1H), 7.1 (d, 1H), 7.2-7.3 (m, 7H), 7.5 (dd, 1H), 7.5 (dd, 1H), 7.7 (m, 3H), 8.9 (d, 1H), 8.9 (d, 1H).

Synthesis Example (2-4)

Synthesis of Compound (2-200)

(2-200)

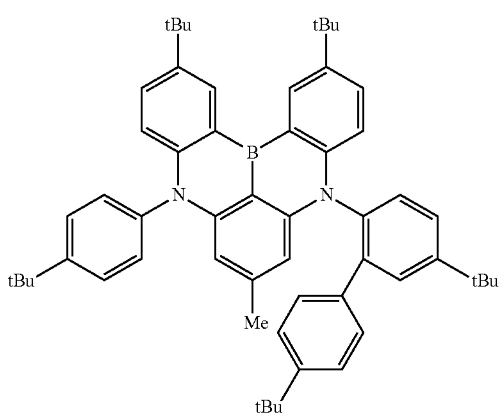

In a nitrogen atmosphere, intermediate (K) (12.0 g), intermediate (R) (10.7 g), Pd-132 (0.19 g), NaOtBu (3.9 g), and xylene (60 mL) were put, and were stirred at 120° C.; for one hour. After a reaction, water and ethyl acetate were added thereto, and the resulting mixture was stirred. Thereafter, an organic layer was separated, washed with water twice, and condensed to obtain a crude product. The crude product was purified with a silica gel column (eluent: toluene/heptane=2/8 (volume ratio)) to obtain intermediate (T) (19.9 g).

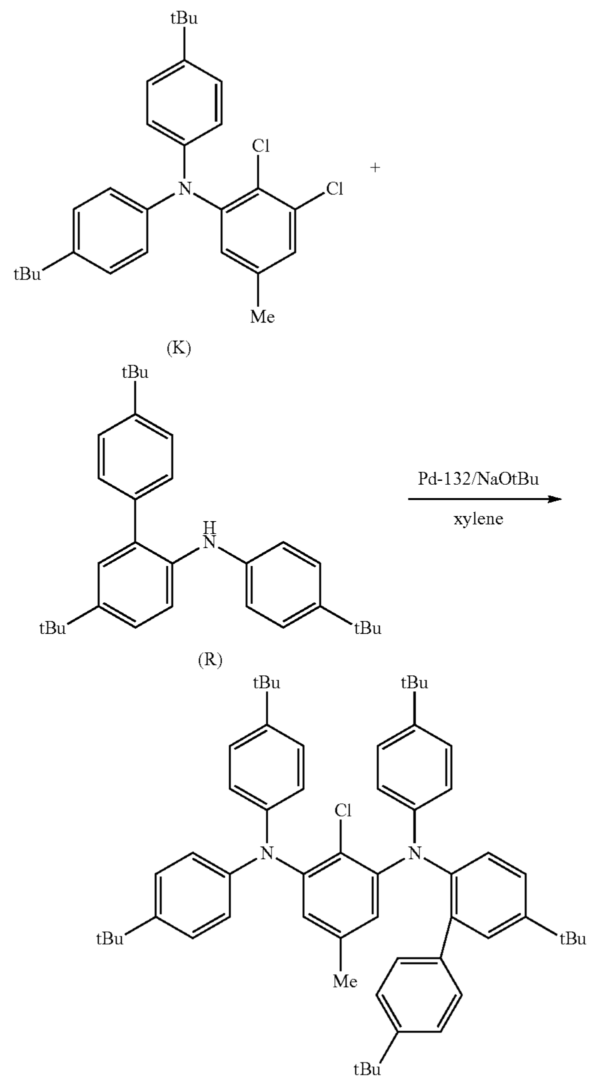

(T)

In a nitrogen atmosphere, a flask containing intermediate (T) (18.0 g) and t-butyl benzene (90 mL) was cooled in an ice bath, and t-butyl lithium (1.62 M, 40.0 mL) was added thereto. Thereafter, a component having a low boiling point was distilled off under reduced pressure at 60° C. The residue was cooled to about −50° C.; in a dry ice bath, and boron tribromide (16.5 g) was added thereto. The resulting mixture was heated to room temperature. N,N-diisopropylethylamine (5.7 g) was added thereto in an ice bath. Thereafter, the resulting mixture was stirred at 100° C.; for one hour. After a reaction, a sodium acetate aqueous solution was added to the reaction solution. The resulting mixture was stirred. Furthermore, ethyl acetate was added thereto, and the resulting mixture was stirred. Thereafter, an organic layer was separated. A crude product obtained from the organic layer was purified with a silica gel column (eluent: toluene/heptane=2/8 (volume ratio)) to obtain compound (2-200) (4.0 g).

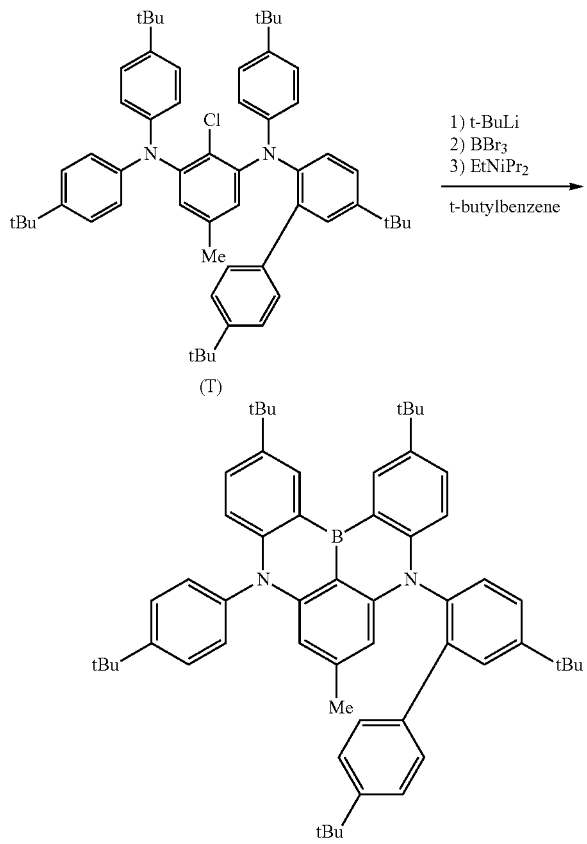

(T)

(2-200)

The structure of the resulting compound was confirmed by NMR measurement.

$^1$H-NMR: δ=1.1 (s, 9H), 1.4 (s, 9H), 1.5 (s, 9H), 1.5 (s, 9H), 1.5 (s, 9H), 2.2 (s, 3H), 5.9 (s, 1H), 6.1 (s, 1H), 6.7 (m, 2H), 7.0 (d, 2H), 7.1 (d, 2H), 7.2 (d, 1H), 7.3 (m, 2H), 7.4 (m, 1H), 7.5 (m, 1H), 7.6 (dd, 1H), 7.7 (m, 3H), 8.9 (d, 1H), 8.9 (d, 1H).

Synthesis Example (2-5)

Synthesis of Compound (2-252)

(2-252)

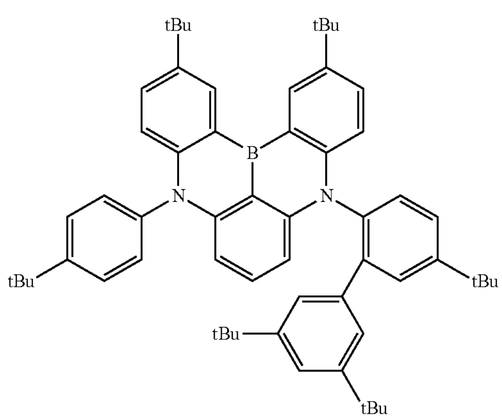

In a nitrogen atmosphere, 1-bromo-3,5-di(t-butyl) benzene (50.0 g), bis(pinacolato) diboron (52.0 g), [1,1'-bis (diphenylphosphino) ferrocene palladium (II) dichloride/dichloromethane adduct ($PdCl_2(dppf)/CH_2Cl_2$, 4.5 g), potassium acetate (55.0 g), and cyclopentyl methylether (CPME, 500 mL) were stirred at 120° C.; for six hours. After a reaction, water and toluene were added thereto, and the resulting mixture was stirred. Thereafter, an organic layer was separated, and further washed with water. The organic layer was condensed to obtain a crude product. The crude product was purified with a silica gel short column (eluent: toluene) to obtain 3,5-di(t-butyl) phenyl bornic acid pinacol ester (56.0 g).

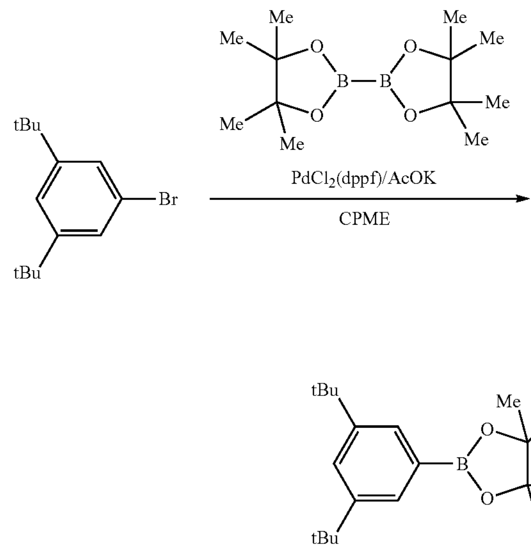

2-Bromo-4-t-butylaniline (15.0 g), 3,5-di(t-butyl) phenyl bornic acid pinacol ester (25.0 g), Pd-132 (0.47 g), tripotassium phosphate (28. 0 g), toluene (300 mL), t-butanol (30 mL), and water (15 mL) were stirred at 100° C.; for one hour. After a reaction, water and ethyl acetate were added thereto, and the resulting mixture was stirred. Thereafter, an organic layer was separated, and washed with water twice. The organic layer was condensed, and heptane was added thereto. The resulting mixture was cooled to obtain a precipitate. The resulting precipitate was filtered to obtain intermediate (N-2) (20.0 g).

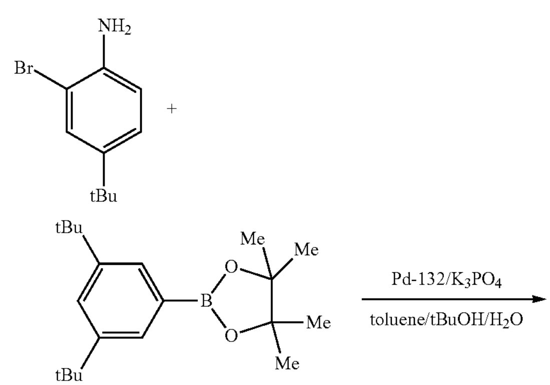

-continued

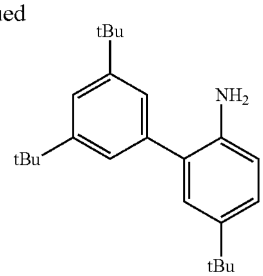

(N-2)

In a nitrogen atmosphere, intermediate (N-2) (18.0 g), 1-bromo-4-t-butylbenzene (11.4 g), Pd-132 (0.38 g), NaOtBu (7.7 g), and xylene (150 mL) were stirred at 110° C.; for 0.5 hours. After a reaction, water and ethyl acetate were added thereto, and the resulting mixture

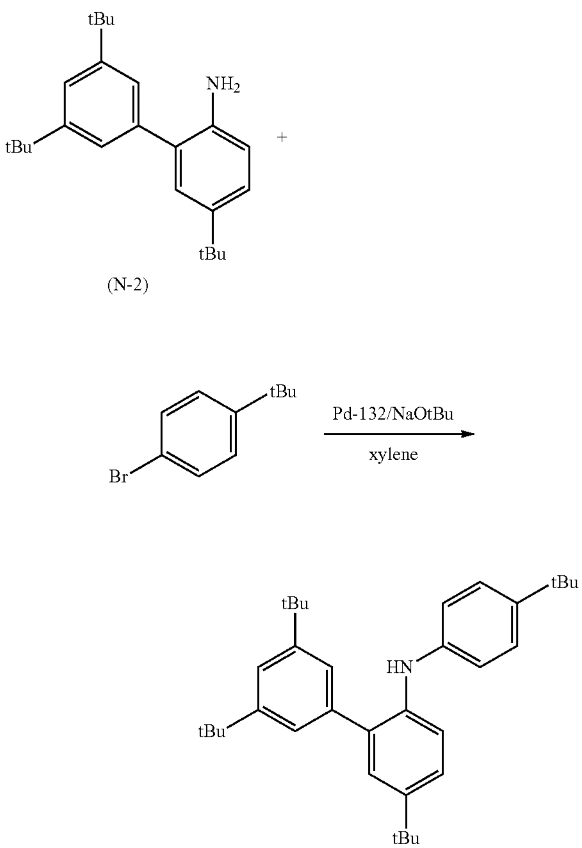

(N-2)

(R-2)

In a nitrogen atmosphere, intermediate (I) (12.0 g), intermediate (R-2) (12.6 g), Pd-132 (0.19 g), NaOtBu (3.9 g), and xylene (60 mL) were stirred at 120° C.; for one hour. After a reaction, water and ethyl acetate were added thereto, and the resulting mixture was stirred. Thereafter, an organic layer was separated, washed with water twice, and condensed to obtain a crude product. The crude product was purified with a silica gel short column (eluent: toluene) to obtain intermediate (S-2) (15.1 g).

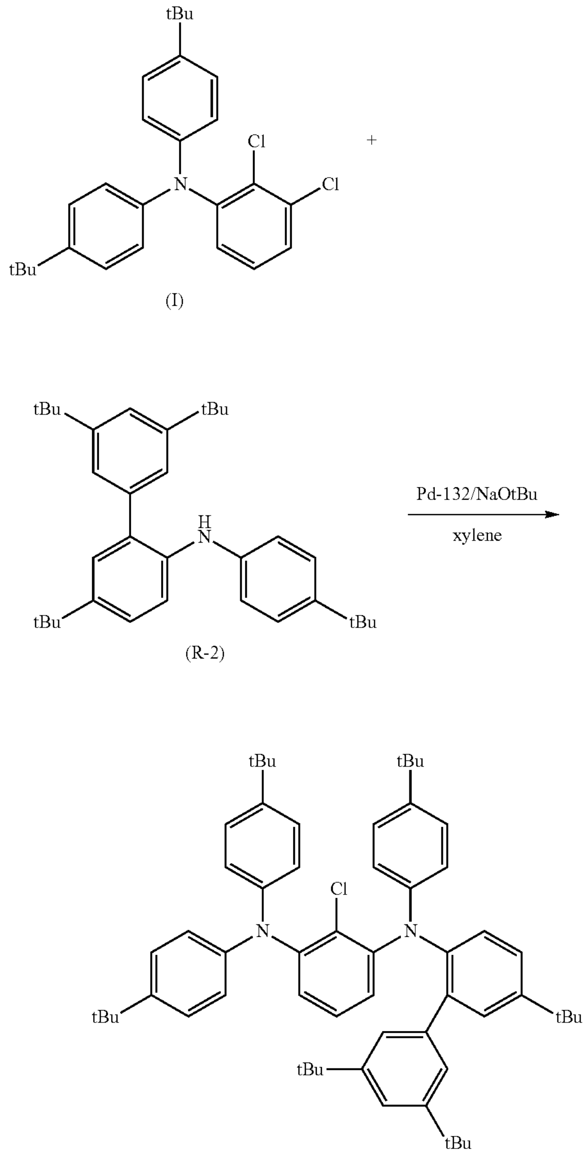

(I)

(R-2)

(S-2)

In a nitrogen atmosphere, a flask containing intermediate (S-2) (16.0 g) and t-butyl benzene (70 mL) was cooled in an ice bath, and t-butyl lithium (1.62 M, 28.7 ml) was added thereto. Thereafter, a component having a low boiling point was distilled off under reduced pressure at 60° C. The residue was cooled to about −50° C.; in a dry ice bath, and boron tribromide (14.0 g) was added thereto. The resulting mixture was heated to room temperature. N,N-diisopropylethylamine (4.8 g) was added thereto in an ice bath. Thereafter, the resulting mixture was stirred at 100° C.; for one hour. After a reaction, a sodium acetate aqueous solution was added to the reaction solution. The resulting mixture was stirred. Furthermore, ethyl acetate was added thereto, and the resulting mixture was stirred. Thereafter, an organic layer was separated. A crude product obtained from the organic layer was purified with a silica gel column (eluent: toluene/heptane=3/7 (volume ratio)) to obtain compound (2-252) (3.1 g).

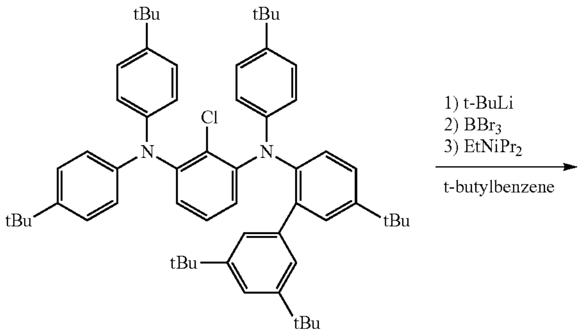

(S-2)

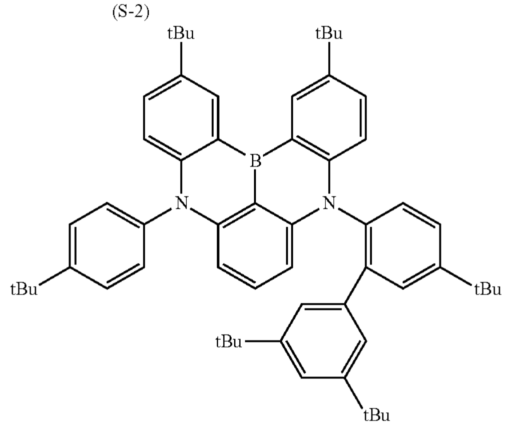

(2-252)

The structure of the resulting compound was confirmed by NMR measurement.

$^1$H-NMR: δ=1.0 (s, 18H), 1.5 (s, 9H), 1.6 (s, 9H), 1.6 (s, 9H), 1.6 (s, 9H), 6.2 (d, 1H), 6.4 (d, 1H), 6.8 (d, 1H), 6.9 (d, 2H), 7.0 (d, 1H), 7.0 (m, 1H), 7.3-7.4 (m, 3H), 7.5 (d, 1H), 7.6 (dd, 1H), 7.6 (m, 1H), 7.8 (m, 4H), 8.9 (d, 1H), 9.0 (d, 1H).

Synthesis Example (2-6)

Synthesis of Compound (2-296)

(2-296)

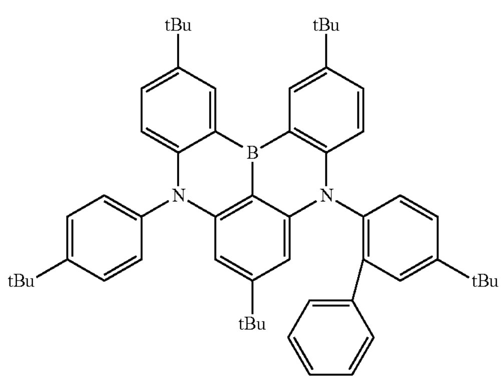

In a nitrogen atmosphere, intermediate (I-1) (10.0 g), intermediate (R-3) (7.1 g), Pd-132 (0.14 g), NaOtBu (2.8 g), and xylene (50 mL) were stirred at 120° C.; for one hour. After a reaction, water and ethyl acetate were added thereto, and the resulting mixture was stirred. Thereafter, an organic layer was separated, washed with water twice, and condensed to obtain a crude product. The crude product was purified with a silica gel short column (eluent: toluene) to obtain intermediate (S-3) (14.2 g).

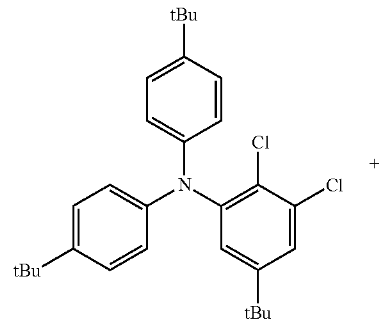

(I-1)

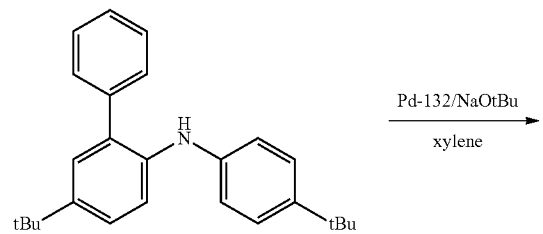

(R-3)

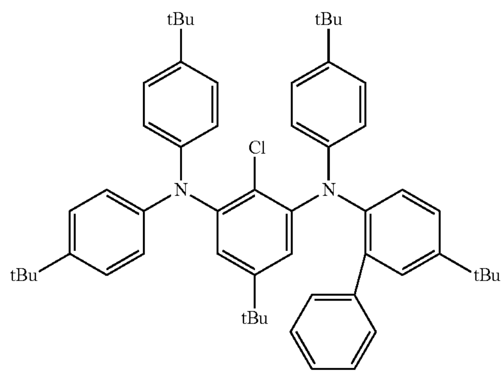

(S-3)

In a nitrogen atmosphere, a flask containing intermediate (S-3) (14.0 g) and t-butyl benzene (90 mL) was cooled in an ice bath, and t-butyl lithium (1.62 M, 28.0 mL) was added thereto. Thereafter, a component having a low boiling point was distilled off under reduced pressure at 60° C. The residue was cooled to about −50° C.; in a dry ice bath, and boron tribromide (13.1 g) was added thereto. The resulting mixture was heated to room temperature. N,N-diisopropylethylamine (4.5 g) was added thereto in an ice bath. Thereafter, the resulting mixture was stirred at 100° C.; for one hour. After a reaction, a sodium acetate aqueous solution was added to the reaction solution. The resulting mixture was stirred. Furthermore, ethyl acetate was added thereto, and the resulting mixture was stirred. Thereafter, an organic layer was separated. A crude product obtained from the organic layer was purified with a silica gel column (eluent: toluene/heptane=3/7 (volume ratio)) to obtain compound (2-296) (1.4 g).

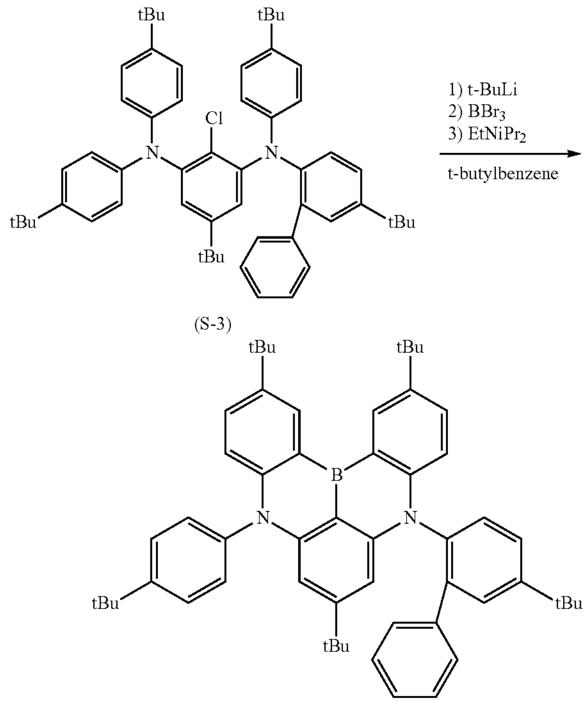

(S-3)

(2-296)

The structure of the resulting compound was confirmed by NMR measurement.

$^1$H-NMR: 6=1.0 (s, 9H), 1.4 (s, 9H), 1.5 (s, 18H), 1.5 (s, 9H), 6.0 (s, 1H), 6.1 (s, 1H), 6.7 (d, 1H), 6.9 (d, 1H), 7.0 (m, 3H), 7.1-7.2 (m, 2H), 7.3 (m, 3H), 7.5 (m, 2H), 7.6-7.7 (m, 4H), 8.9 (d, 1H), 8.9 (d, 1H).

Synthesis Example (2-7)

Synthesis of Compound (2-300)

(2-300)

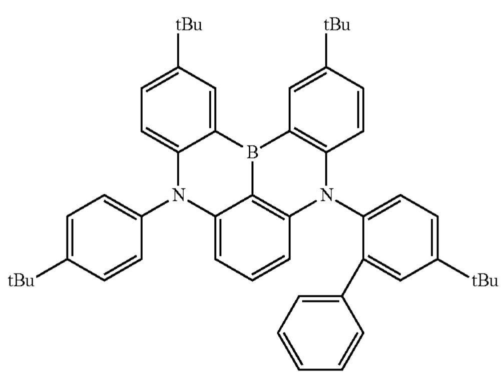

In a nitrogen atmosphere, a flask containing 2-bromo-4-(t-butyl) aniline (25.0 g), phenyl bornic acid (16.0 g), Pd-132 (0.78 g), $K_3PO_4$ (47.0 g), toluene (400 ml) t-BuOH (40 ml), and water (20 ml) was heated and stirred at 100° C.; for one hour. The reaction liquid was cooled to room temperature. Thereafter, water and ethyl acetate were added thereto, and an organic layer was separated. Subsequently, the organic layer was washed with dilute hydrochloric acid and then with water, and a solvent was distilled off under reduced pressure. Thereafter, precipitation was caused again with methanol. Furthermore, purification was performed with a silica gel short column (eluent: toluene/heptane=1/4→1/1→4/1 (volume ratio)) to obtain 5-(t-butyl)-[1,1'-biphenyl]-2-amine (21.1 g).

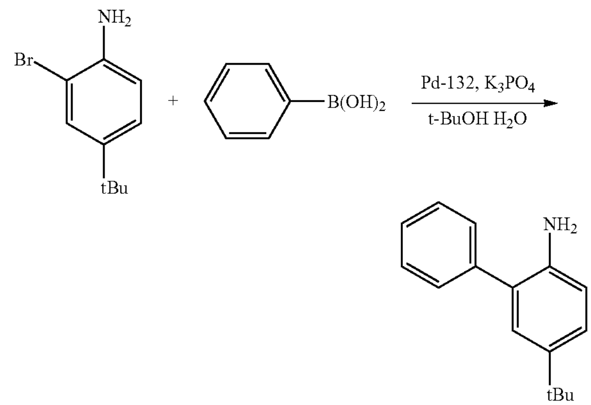

In a nitrogen atmosphere, a flask containing 5-(t-butyl)-[1,1'-biphenyl]-2-amine (21.0 g), 1-bromo-4-(t-butyl) benzene (19.9 g), Pd-132 (0.66 g), NaOtBu (13.4 g), and xylene (200 ml) was heated and stirred at 110° C. for 0.5 hours. The reaction liquid was cooled to room temperature. Thereafter, water and ethyl acetate were added thereto, and an organic layer was separated. The organic layer was washed with water, and then a solvent was distilled off under reduced pressure. Thereafter, purification was performed with a silica gel short column (eluent: toluene/heptane=3/7 (volume ratio)) to obtain 5-(t-butyl)-N-(4-(t-butyl) phenyl)-[1,1'-biphenyl]-2-amine (32.0 g).

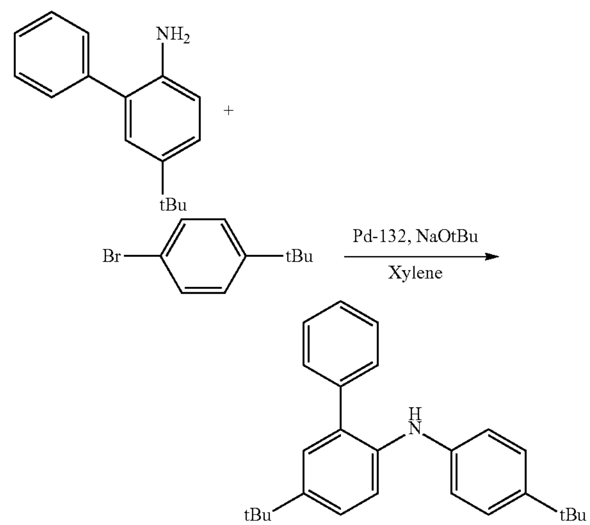

In a nitrogen atmosphere, a flask containing 5-(t-butyl)-N-(4-(t-butyl) phenyl)-[1,1'-biphenyl]-2-amine (10.0 g), N,N-bis(4-t-butyl) phenyl)-2,3-dichloroaniline (12.0 g), Pd-132 (0.20 g), NaOtBu (4.1 g), and xylene (600 ml) was heated and stirred at 120° C. for one hour. The reaction liquid was cooled to room temperature. Thereafter, water and ethyl acetate were added thereto, and an organic layer was separated. The organic layer was washed with water, and then a solvent was distilled off under reduced pressure. Thereafter, precipitation was caused again with heptane. Furthermore, purification was performed with a silica gel short column (eluent: toluene/heptane=1/1 (volume ratio)) to obtain $N^1$-(5-(t-butyl)-[1,1'-biphenyl]-2-yl)-$N^1$,$N^3$,$N^3$-tris (4-(t-butyl) phenyl)-2-chlorobenzene-1,3-diamine (17.0 g).

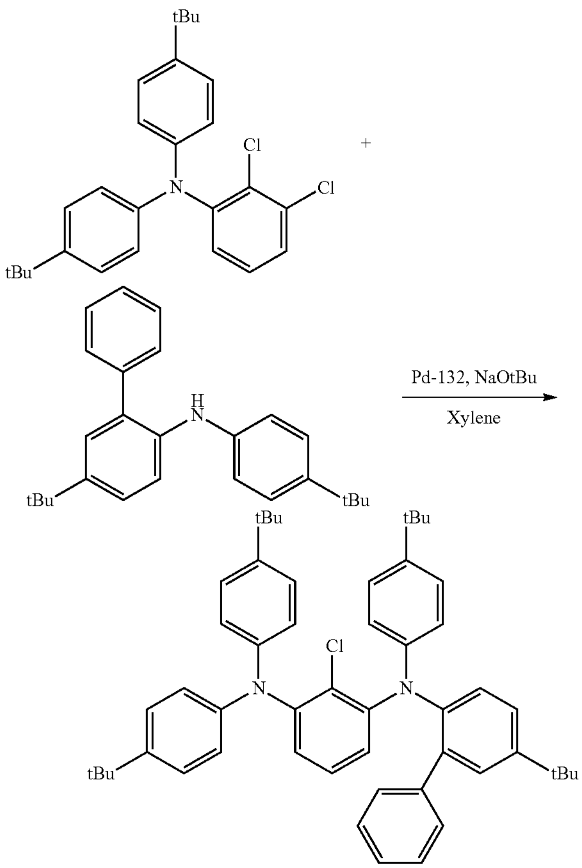

Into a flask containing the above $N^1$-(5-(t-butyl)-[1,1'-biphenyl]-2-yl)-$N^1$,$N^3$,$N^3$-tris(4-(t-butyl) phenyl)-2-chlorobenzene-1,3-diamine (17.0 g) and t-butyl benzene (90 ml), a 1.62 M t-butyl lithium pentane solution (35.1 ml) was added in a nitrogen atmosphere while being cooled in an ice bath. After completion of dropwise addition, the resulting mixture was heated to 70° C.; and stirred for one hour. Thereafter, a component having a lower boiling point than t-butyl benzene was distilled off under reduced pressure. The residue was cooled to −50° C., and boron tribromide (17.1 g) was added thereto. The resulting mixture was heated to room temperature and stirred for 0.5 hours. Thereafter, the mixture was cooled in an ice bath again, and N,N-diisopropylethylamine (5.9 g) was added thereto. The resulting mixture was stirred at room temperature until heat generation stopped. Thereafter, the mixture was heated to 100° C.; and heated and stirred for one hour. The reaction liquid was cooled to room temperature. A sodium acetate aqueous solution cooled in an ice bath was added thereto, then ethyl acetate was added thereto, and an organic layer was separated. The organic layer was washed with water, and then a solvent was distilled off under reduced pressure. Thereafter, the residue was purified with a silica gel column (eluent: toluene/heptane=1/4 (volume ratio)). Furthermore, precipitation was caused again with heptane. Finally, sublimation purification was performed to obtain compound (2-300) (2.4 g).

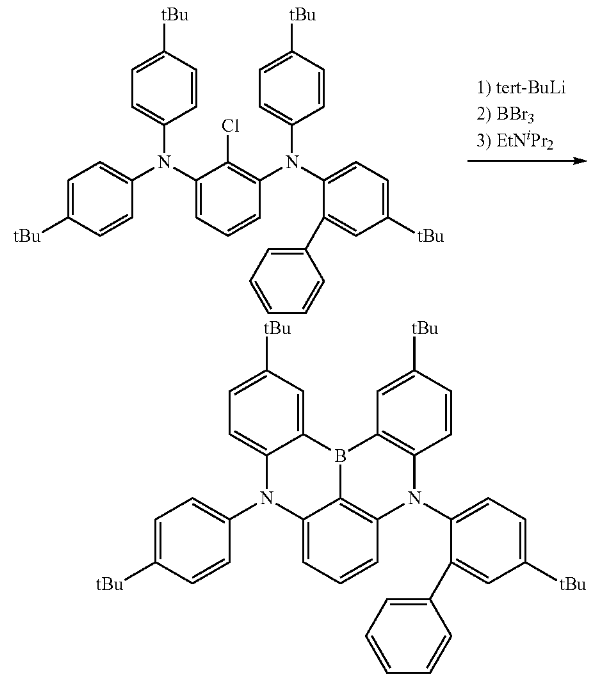

(2-300)

The structure of the resulting compound was confirmed by NMR measurement.

$^1$H-NMR (400 MHz, $CDCl_3$): δ=8.93 (s, 1H), 8.89 (s, 1H), 7.68-7.61 (m, 4H), 7.50-7.47 (m, 2H), 7.28-7.22 (m, 4H), 7.16 (d, 2H), 6.99-6.98 (m, 3H), 6.78 (d, 1H), 6.71 (d, 1H), 6.22 (d, 1H), 6.07 (d, 1H), 1.48 (s, 9H), 1.45 (s, 18H), 1.44 (s, 9H).

Synthesis Example (2-8)

Synthesis of Compound (1-2619)

(1-2619)

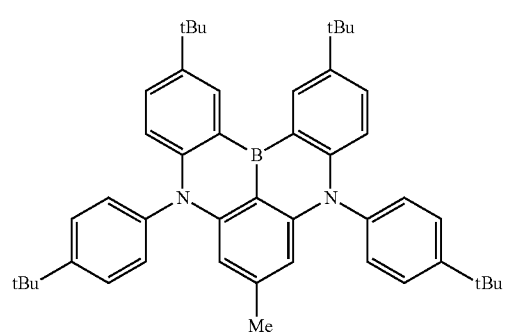

Compound (1-2619) was synthesized using the same method as in the above Synthesis Example. The structure of the compound thus obtained was identified by an NMR analysis.

$^1$H-NMR (500 MHz, $CDCl_3$): δ=1.47 (s, 36H), 2.17 (s, 3H), 5.97 (s, 2H), 6.68 (d, 2H), 7.28 (d, 4H), 7.49 (dd, 2H), 7.67 (d, 4H), 8.97 (d, 2H).

Synthesis Example (2-9)

Synthesis of Compound (2-2710)

(2-2710)

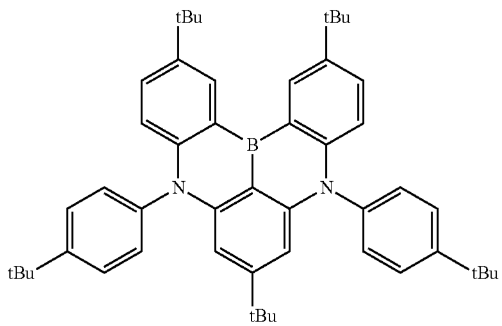

Compound (2-2710) was synthesized using the same method as in the above Synthesis Example. The structure of the compound thus obtained was identified by an NMR analysis.

$^1$H-NMR (500 MHz, $CDCl_3$): δ=8.98-8.96 (m, 2H), 7.70-7.65 (m, 4H), 7.51-7.47 (m, 2H), 7.31-7.26 (m, 4H), 6.78-6.75 (m, 2H), 6.11 (s, 2H), 1.47-1.44 (m, 18H), 0.93 (s, 9H).

Synthesis Example (2-10)

Synthesis of Compound (2-2711)

(2-2711)

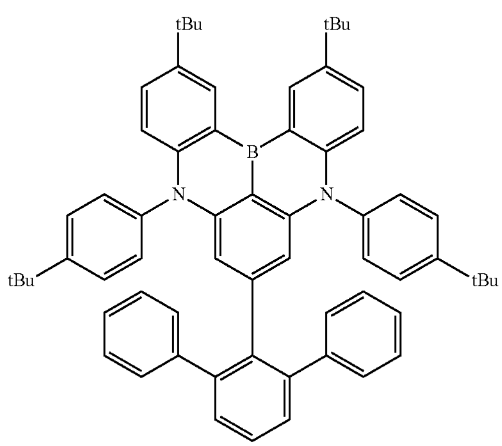

Compound (2-2711) was synthesized using the same method as in the above Synthesis Example. The structure of the compound thus obtained was identified by an NMR analysis.

$^1$H-NMR (500 MHz, $CDCl_3$): δ=9.20-8.60 (m, 2H), 7.65-7.20 (m, 8H), 7.20-7.05 (m, 7H), 6.85-6.50 (m, 10H), 6.20-5.20 (m, 2H), 1.46-1.44 (m, 36H).

Synthesis Example (2-11)

Synthesis of Compound (2-2712)

(2-2712)

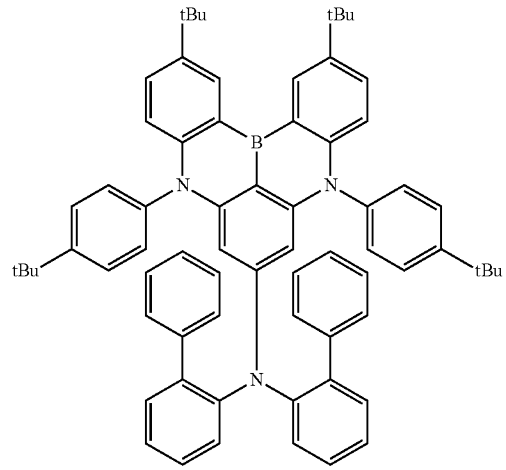

Compound (2-2712) was synthesized using the same method as in the above Synthesis Example. The structure of the compound thus obtained was identified by an NMR analysis.

$^1$H-NMR (500 MHz, $CDCl_3$): δ=9.00-8.95 (m, 2H), 7.48-7.36 (m, 6H), 7.20-6.95 (m, 10H), 6.90-6.52 (m, 12H), 6.48-6.26 (m, 2H), 5.60-5.00 (m, 2H), 1.46 (s, 18H), 1.26 (s, 18H).

Synthesis Example (2-12)

Synthesis of Compound (2-2713)

(2-2713)

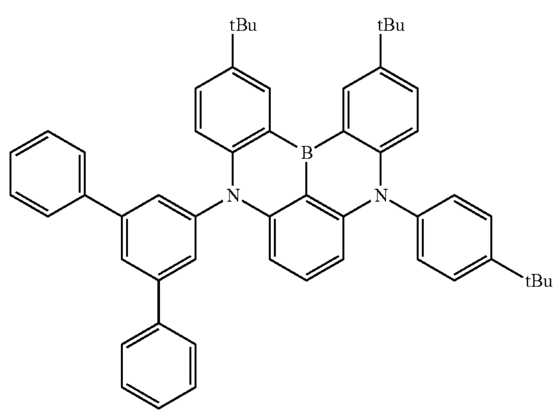

Compound (2-2713) was synthesized using the same method as in the above Synthesis Example.

Synthesis Example (2-13)

Synthesis of Compound (2-301)

(2-301)

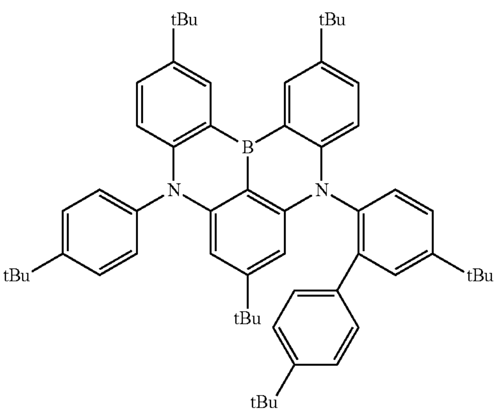

Compound (2-301) was synthesized using the same method as in the above Synthesis Example. The structure of the compound thus obtained was identified by an NMR analysis.

$^1$H-NMR (500 MHz, $CDCl_3$): δ=8.95-8.88 (m, 2H), 7.71-7.64 (m, 3H), 7.61-7.56 (m, 1H), 7.50-7.43 (m, 2H), 7.28-7.20 (m, 3H), 7.11-7.07 (m, 2H), 7.01-6.97 (m, 2H), 6.85-6.80 (m, 1H), 6.76-6.72 (m, 1H), 6.16 (s, 1H), 6.05 (s, 1H), 1.48-1.43 (m, 27H), 1.11 (s, 9H), 0.97 (s, 9H).

Synthesis Example (2-14)

Synthesis of Compound (2-302)

(2-302)

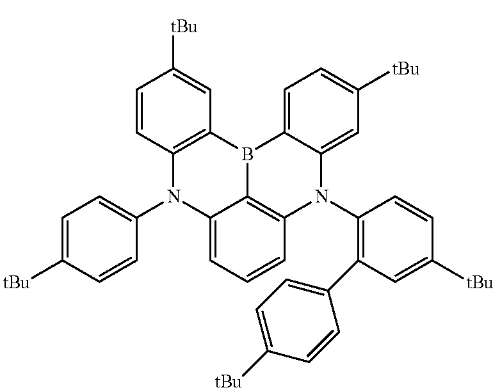

Compound (2-302) was synthesized using the same method as in the above Synthesis Example. The structure of the compound thus obtained was identified by an NMR analysis.

$^1$H-NMR (500 MHz, $CDCl_3$): δ=8.90-8.87 (m, 1H), 8.75-8.72 (m, 1H), 7.73-7.58 (m, 4H), 7.48-7.43 (m, 1H), 7.35-7.19 (m, 5H), 7.11-7.07 (d, 2H), 7.01-6.97 (d, 2H), 6.67-6.64 (m, 2H), 6.17 (s, 1H), 5.94 (s, 1H), 1.50-1.43 (m, 27H), 1.18 (s, 9H), 1.11 (s, 9H).

Synthesis Example (2-15)

Synthesis of Compound (2-2714)

(2-2714)

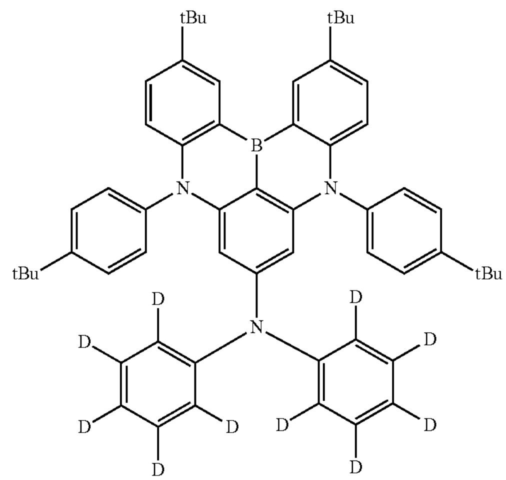

Compound (2-2714) was synthesized using the same method as in the above Synthesis Example. Note that "D" in the chemical formula represents a deuterium. The structure of the compound thus obtained was identified by an NMR analysis.

$^1$H-NMR (500 MHz, $CDCl_3$): δ=8.96-8.95 (m, 2H), 7.47-7.42 (m, 6H), 7.15-7.10 (m, 4H), 6.77-6.74 (m, 2H), 5.56 (s, 2H), 1.46 (m, 9H), 1.33 (s, 9H).

Other polycyclic aromatic compounds and multimers thereof represented by the above general formula (2) can be produced with reference to International Publication WO2015/102118.

By appropriately changing compounds as raw materials, other polycyclic aromatic compounds of the present invention can be synthesized by a method in accordance with the methods in Synthesis Examples described above.

Hereinafter, Examples of an organic EL element using the compound of the present invention will be described in order to describe the present invention in more detail, but the present invention is not limited thereto.

Organic EL elements according to Example A-1 and Comparative examples A-1 to A-2, Examples B-1 to B-15 and Comparative examples B-1 to B-2, and Examples C-1 to C-14 were manufactured. A voltage (V), an EL emission wavelength (nm), and an external quantum efficiency (%) as characteristics during light emission of 1000 cd/m$^2$ were measured for each of the organic EL elements. Subsequently, time to retain luminance of 90% or more of initial luminance as an element lifetime was measured when being emitted at a current value of 10 mA/cm$^2$.

The quantum efficiency of a luminescent element includes an internal quantum efficiency and an external quantum efficiency. However, the internal quantum efficiency indicates a ratio at which external energy injected as electrons (or holes) into a light emitting layer of a luminescent element is purely converted into photons. Meanwhile, the external quantum efficiency is a value calculated based on the amount of photons emitted to an outside of the luminescent element. A part of the photons generated in the light emitting layer is absorbed or reflected continuously inside the luminescent element, and is not emitted to the outside of the luminescent element. Therefore, the external quantum efficiency is lower than the internal quantum efficiency.

A method for measuring the external quantum efficiency is as follows. Using a voltage/current generator R6144 manufactured by Advantest Corporation, a voltage at which luminance of an element was 1000 cd/m$^2$ was applied to cause the element to emit light. Using a spectral radiance meter SR-3AR manufactured by TOPCON Co., spectral radiance in a visible light region was measured from a direction perpendicular to a light emitting surface. Assuming that the light emitting surface is a perfectly diffusing surface, a numerical value obtained by dividing a spectral radiance value of each measured wavelength component by wavelength energy and multiplying the obtained value by n is the number of photons at each wavelength. Subsequently, the number of photons was integrated in the observed entire wavelength region, and this number was taken as the total number of photons emitted from the element. A numerical value obtained by dividing an applied current value by an elementary charge is taken as the number of carriers injected into the element. The external quantum efficiency is a numerical value obtained by dividing the total number of photons emitted from the element by the number of carriers injected into the element.

The material composition of each layer in the organic EL elements according to Example A-1 and Comparative examples A-1 to A-2 thus prepared is shown in Table A1, and EL characteristic data is shown in Table A2.

TABLE A1

| | Hole injection layer 1 | Hole imjection layer 2 | Hole transport layer 1 | Hole transport layer 2 | Liqht emitting layer (25 nm) | | Electron transport layer 1 | Electron transport layer 2 | Negative electrode (1 nm/ |
|---|---|---|---|---|---|---|---|---|---|
| | (40 nm) | (5 nm) | (15 nm) | (10 nm) | Host | Dopant | (5 nm) | (25 nm) | 100 nm) |
| Ex. A-1 | HI | IL | HT-1 | HT-2 | Compound (1-1) | Compound (2-2619) | ET-1 | ET-2 | Liq/MgAg |
| Com. Ex. A-1 | HI | IL | HT-1 | HT-2 | EM-1 | Compound (2-2619) | ET-1 | ET-2 | Liq/MgAg |
| Com. Ex. A-2 | HI | IL | HT-1 | HT-2 | EM-2 | Compound (2-2619) | ET-1 | ET-2 | Liq/MgAg |

TABLE A2

| | Liqht emitting layer | | Wave-length | Voltage | External quantum | Life-time |
|---|---|---|---|---|---|---|
| | Host | Dopant | (nm) | (V) | efficiency (%) | (hr) |
| Ex. A-1 | Compound (1-1) | Compound (2-2619) | 463 | 3.7 | 6.8 | 191 |
| Com. Ex. A-1 | EM-1 | Compound (2-2619) | 460 | 3.8 | 5.4 | 5 |
| Com. Ex. A-2 | EM-2 | Compound (2-2619) | 463 | 3.6 | 4.6 | 19 |

In the above tables, “HI” represents N$^4$,N$^{4'}$-diphenyl-N$^4$,N$^{4'}$-bis(9-phenyl-9H-carbazol-3-yl)-[1,1'-biphenyl]-4,4'-diamine, “IL” represents 1,4,5,8,9,12-hexaazatriphenylene-hexacarbonitrile, “HT-1” represents N-([1,1'-biphenyl]-4-yl)-9,9-dimethyl-N-(4-(9-phenyl-9H-carbazol-3-yl)phenyl)-9H-fluorene-2-amine, “HT-2” represents N,N-bis(4-(dibenzo[b,d]furan-4-yl)phenyl)-[1,1': 4',1"-terphenyl]-4-amine, “EM-1” represents 9-(5,9-dioxa-13b-boranaphto[3,2,1-de]anthracene-7-yl)-9H-carbazole, “EM-2” represents 9-(4-(5,9-dioxa-13b-boranaphto[3,2,1-de]anthracene-7-yl)phenyl)-9H-carbazole, Compound (2-2619) is 2,12-di-t-butyl-5,9-bis(4-(t-butyl)phenyl)-7-methyl-5,9-dihydro-5,9-diaza-13b-boranaphto[3,2,1-de]anthracene, “ET-1” represents 4,6,8,10-tetraphenyl[1,4]benzoxabolinino[2,3,4-kl]phenoxaborinine, and “ET-2” represents 3,3'-((2-phenylanthracene-9,10-diyl)bis(4,1-phenylene))bis(4-methylpyridine). Chemical structures are indicated below together with “Liq”.

HI

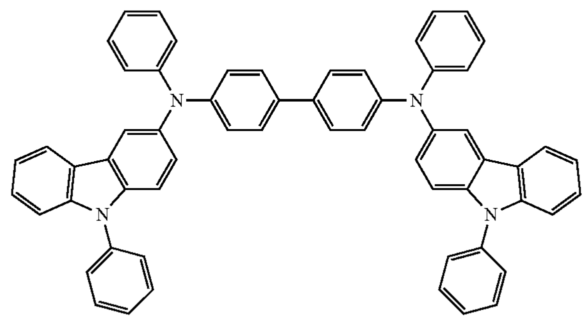

-continued

IL

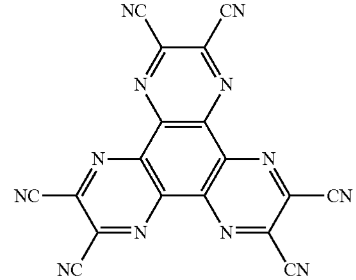

-continued
HT-1
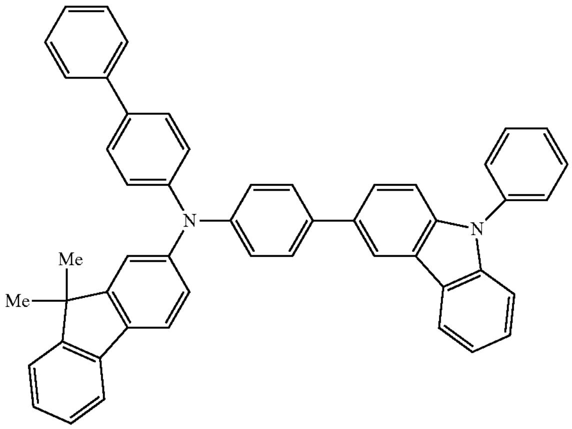
HT-2
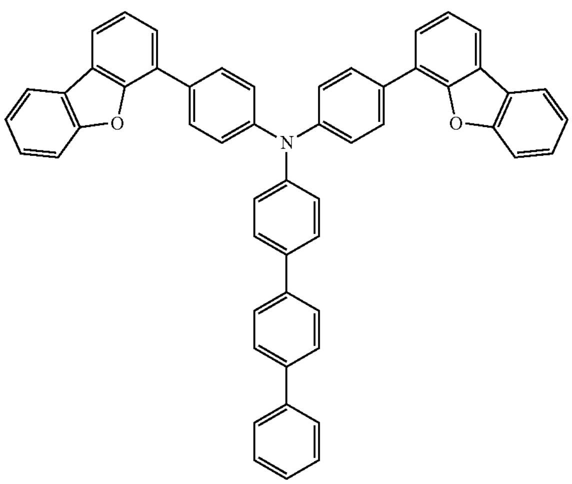
EM-1
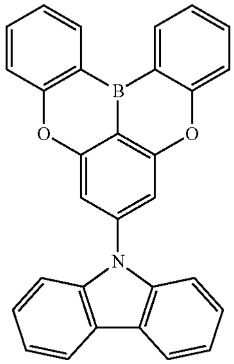
-continued
EM-2
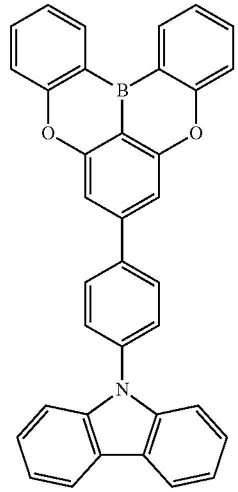
Compound (2-2619)
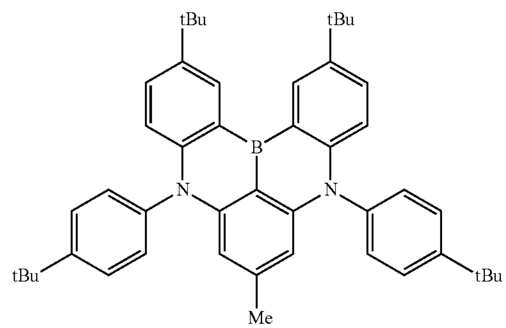
ET-1
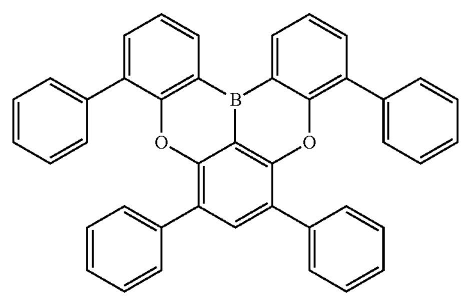
ET-2
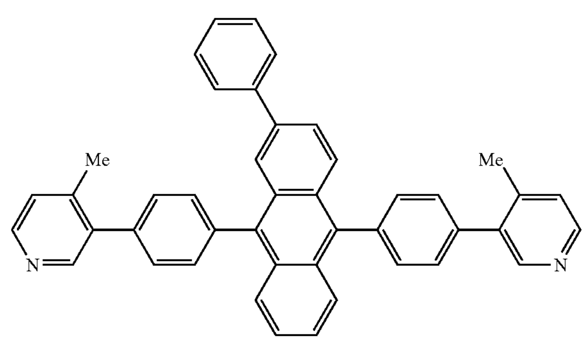

-continued

Liq

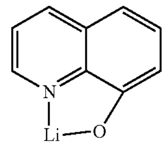

Example A-1

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Showa Shinku Co., Ltd.), and a vapor deposition boats made of molybdenum and containing HI, IL, HT-1, HT-2, compound (1-1), compound (2-2619), ET-1, and ET-2 respectively, a vapor deposition boats made of aluminum nitride and containing Liq, magnesium and silver respectively, were mounted in the apparatus.

Various layers as described below were formed sequentially on the ITO film of the transparent supporting substrate. The pressure in a vacuum chamber was reduced to $5\times10^{-4}$ Pa. First, HI was heated and vapor-deposited so as to have a film thickness of 40 nm. Subsequently, IL was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, Compound (1-1) and Compound (2-2619) were simultaneously heated and vapor-deposited so as to have a film thickness of 25 nm. Thus, a light emitting layer was formed. The vapor deposition rate was regulated such that a weight ratio between Compound (1-1) and Compound (2-2619) was approximately 98:2. Moreover, ET-1 was heated and vapor-deposited so as to have a film thickness of 5 nm. Subsequently, ET-2 was heated and vapor-deposited so as to have a film thickness of 25 nm. Thus an electron transport layer formed of two layers was formed.

Thereafter, Liq was heated and vapor-deposited at a vapor deposition rate of 0.01 to 0.1 nm/sec so as to have a film thickness of 1 nm. Subsequently, magnesium and silver were simultaneously heated and vapor-deposited so as to have a film thickness of 100 nm. Thus, a negative electrode was formed to obtain an organic EL element. At this time, the rate of deposition was regulated in a range between 0.1 nm to 10 nm/sec such that the ratio of the numbers of atoms between magnesium and silver was 10:1.

A direct current voltage was applied using an ITO electrode as a positive electrode and a magnesium/silver electrode as a negative electrode, and characteristics at the time of light emission at 1000 cd/m$^2$ were measured. Further, time (hr) to retain luminance of 90% or more of initial luminance was measured when being emitted at a current value of 10 mA/cm$^2$.

Comparative Examples A-1 and A-2

Organic EL elements were produced according to Example A-1 except that the host material and the dopant material were changed to the materials described in the above table, and organic EL characteristics were measured in the same manner.

The material composition of each layer in the organic EL elements according to Examples B-1 to B-15 and Comparative examples B-1 to B-2 thus prepared is shown in Table B1, and EL characteristic data is shown in Table B2.

TABLE B1

| | Hole injection layer 1 (40 nm) | Hole injection layer 2 (5 nm) | Hole transport layer 1 (15 nm) | Hole transport layer 2 (10 nm) | Liqht emitting layer (25 nm) Host | Dopant | Electron transport layer 1 (5 nm) | Electron transport layer 2 (25 nm) | Negative electrode (1 nm/ 100 nm) |
|---|---|---|---|---|---|---|---|---|---|
| Ex. B-1 | HI | IL | HT-1 | HT-2 | Compound (1-1) | Compound (2-2619) | ET-1 | ET-2 + Liq | LiF/ Al |
| Ex. B-2 | HI | IL | HT-1 | HT-2 | Compound (1-2) | Compound (2-2619) | ET-1 | ET-2 + Liq | LiF/ Al |
| Ex. B-3 | HI | IL | HT-1 | HT-2 | Compound (1-3) | Compound (2-2619) | ET-1 | ET-2 + Liq | LiF/ Al |
| Ex. B-4 | HI | IL | HT-1 | HT-2 | Compound (1-4) | Compound (2-2619) | ET-1 | ET-2 + Liq | LiF/ Al |
| Ex. B-5 | HI | IL | HT-1 | HT-2 | Compound (1-5) | Compound (2-2619) | ET-1 | ET-2 + Liq | LiF/ Al |
| Ex. B-6 | HI | IL | HT-1 | HT-2 | Compound (1-121) | Compound (2-2619) | ET-1 | ET-2 + Liq | LiF/ Al |
| Ex. 8-7 | HI | IL | HT-1 | HT-2 | Compound (1-123) | Compound (2-2619) | ET-1 | ET-2 + Liq | LiF/ Al |
| Ex. B-6 | HI | IL | HT-1 | HT-2 | Compound (1-124) | Compound (2-2619) | ET-1 | ET-2 + Liq | LiF/ Al |
| Ex. B-9 | HI | IL | HT-1 | HT-2 | Compound (1-174) | Compound (2-2619) | ET-1 | ET-2 + Liq | LiF/ Al |
| Ex. B-10 | HI | IL | HT-1 | HT-2 | Compound (1-191) | Compound (2-2619) | ET-1 | ET-2 + Liq | LiF/ Al |
| Ex. B-11 | III | IL | HT-1 | HT-2 | Compound (1-145) | Compound (2-2619) | ET-1 | ET-2 + Liq | LiF/ Al |
| Ex. B-12 | HI | IL | HT-1 | HT-2 | Compound (1-156) | Compound (2-2619) | ET-1 | ET-2 + Liq | LiF/ Al |
| Ex. B-13 | HI | IL | HT-1 | HT-2 | Compound (1-146) | Compound (2-2619) | ET-1 | ET-2 + Liq | LiF/ Al |

TABLE B1-continued

| | Hole injection layer 1 (40 nm) | Hole injection layer 2 (5 nm) | Hole transport layer 1 (15 nm) | Hole transport layer 2 (10 nm) | Light emitting layer (25 nm) Host | Dopant | Electron transport layer 1 (5 nm) | Electron transport layer 2 (25 nm) | Negative electrode (1 nm/ 100 nm) |
|---|---|---|---|---|---|---|---|---|---|
| Ex. B-14 | HI | IL | HT-1 | HT-2 | Compound (1-147) | Compound (2-2619) | ET-1 | ET-2 + Liq | LiF/ Al |
| Ex. B-15 | HI | IL | HT-1 | HT-2 | Compound (1-148) | Compound (2-2619) | ET-1 | ET-2 + Liq | LiF/ Al |
| Com. Ex. B-1 | HI | IL | HT-1 | HT-2 | EM-1 | Compound (2-2619) | ET-1 | ET-2 + Liq | LiF/ Al |
| Com. Ex. B-2 | HI | IL | HT-1 | HT-2 | EM-2 | Compound (2-2619) | ET-1 | ET-2 + Liq | LiF/ Al |

TABLE B2

| | Light emitting layer Host | Dopant | Wave length (nm) | Voltage (V) | External quantum efficiency (%) | Life-time (hr) |
|---|---|---|---|---|---|---|
| Ex. 3-1 | Compound (1-1) | Compound (2-2619) | 464 | 3.7 | 7.4 | 147 |
| Ex. 3-2 | Compound (1-2) | Compound (2-2619) | 462 | 3.6 | 8.3 | 142 |
| Ex. 13-3 | Compound (1-3) | Compound (2-2619) | 463 | 4.1 | 8.3 | 20 |
| Ex. 3-4 | Compound (1-4) | Compound (2-2619) | 463 | 3.9 | 8.7 | 18 |
| Ex. 3-5 | Compound (1-5) | Compound (2-2619) | 464 | 4.1 | 7.9 | 308 |
| Ex. 3-6 | Compound . (1-121) | Compound (2-2619) | 464 | 3.8 | 7.7 | 178 |
| Ex. 3-7 | Compound (1-123) | Compound (2-2619) | 464 | 3.9 | 7.9 | 51 |
| Ex. 3-8 | Compound (1-124) | Compound (2-2619) | 462 | 3.7 | 7.2 | 237 |
| Ex. 3-9 | Compound (1-174) | Compound (2-2619) | 466 | 3.8 | 6.1 | 81 |
| Ex. B-10 | Compound (1-191) | Compound (2-2619) | 464 | 4.0 | 5.8 | 24 |
| Ex. B-11 | Compound (1-145) | Compound (2-2619) | 466 | 4.0 | 6.9 | 338 |
| Ex. B-12 | Compound (1-156) | Compound (2-2619) | 463 | 3.8 | 7.3 | 93 |
| Ex. B-13 | Compound (1-146) | Compound (2-2619) | 465 | 3.6 | 6.9 | 405 |
| Ex. 3-14 | Compound (1-147) | Compound (2-2619) | 465 | 3.9 | 6.8 | 252 |
| Ex. B-15 | Compound (1-148) | Compound (2-2619) | 464 | 4.1 | 7.7 | 34 |
| Com. Ex. B-1 | EM-1 | Compound (2-2619) | 460 | 3.9 | 6.6 | 3 |
| Com. Ex. B-9 | EM-2 | Compound (2-2619) | 463 | 3.7 | 5.6 | 12 |

Example B-1

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Showa Shinku Co., Ltd.), and a vapor deposition boats made of tantalum and containing HI, IL, HT-1, HT-2, compound (1-1), compound (2-2619), ET-1, and ET-2 respectively, a vapor deposition boats made of aluminum nitride and containing Liq, LiF and aluminum respectively, were mounted in the apparatus.

Various layers as described below were formed sequentially on the ITO film of the transparent supporting substrate. The pressure in a vacuum chamber was reduced to $5\times10^{-4}$ Pa. First, HI was heated and vapor-deposited so as to have a film thickness of 40 nm. Subsequently, IL was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, Compound (1-1) and Compound (2-2619) were simultaneously heated and vapor-deposited so as to have a film thickness of 25 nm. Thus, a light emitting layer was formed. The vapor deposition rate was regulated such that a weight ratio between Compound (1-1) and Compound (2-2619) was approximately 98:2. Moreover, ET-1 was heated and vapor-deposited so as to have a film thickness of 5 nm. Subsequently, ET-2 and Liq was simultaneously heated and vapor-deposited so as to have a film thickness of 25 nm. Thus an electron transport layer formed of two layers was formed. The vapor deposition rate was regulated such that a weight ratio between ET-2 and Liq was approximately 50:50. Thereafter, LiF was heated and vapor-deposited so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/Al electrode as a negative electrode, and characteristics at the time of light emission at 1000 cd/m$^2$ were measured. Further, time (hr) to retain luminance of 90% or more of initial luminance was measured when being emitted at a current value of 10 mA/cm$^2$.

Examples B-2 to B-15 and Comparative Examples B-1 to B-2

Organic EL elements were produced according to Example B-1 except that the host material and the dopant material were changed to the materials described in the above table, and organic EL characteristics were measured in the same manner.

The material composition of each layer in the organic EL elements according to Examples B-16 to B-23 and Comparative examples B-3 thus prepared is shown in Table B3, and EL characteristic data is shown in Table B4.

TABLE B3

| | Hole injection layer 1 (40 nm) | Hole injection layer 2 (5 nm) | Hole transport layer 1 (15 nm) | Hole transport layer 2 (10 nm) | Light emitting layer (25 nm) Host | Dopant | Electron transport layer 1 (5 nm) | Electron transport layer 2 (25 nm) | Negative electrode (1 nm/ 100 nm) |
|---|---|---|---|---|---|---|---|---|---|
| Ex. B-16 | HI | IL | HT-1 | HT-2 | Compound (1-82) | Compound (2-2619) | ET-1 | ET-2 + Liq | LIF/ Al |
| Ex. B-17 | HI | IL | HT-1 | HT-2 | Compound (1-52) | Compound (2-2619) | ET-1 | ET-2 + Liq | LiF/ Al |
| Ex. B-18 | HI | IL | HT-1 | HT-2 | Compound (1-55) | Compound (2-2619) | ET-1 | ET-2 + Liq | LiF/ Al |
| Ex. B-19 | HI | IL | HT-1 | HT-2 | Compound (1-85) | Compound (2-2619) | ET-1 | ET-2 + Liq | LiF/ Al |
| Ex. B-20 | HI | IL | HT-1 | HT-2 | Compound (1-12) | Compound (2-2619) | ET-1 | ET-2 + Liq | LiF/ Al |
| Ex. B-21 | HI | IL | HT-1 | HT-2 | Compound (1-57) | Compound (2-2619) | ET-1 | ET-2 + Liq | LiF/ Al |
| Ex. B-22 | HI | IL | HT-1 | HT-2 | Compound (1-102) | Compound (2-2619) | ET-1 | ET-2 + Liq | LiF/ Al |
| Ex. B-23 | HI | IL | HT-1 | HT-2 | Compound (1-166) | Compound (2-2619) | ET-I | ET-2 + Liq | LiF/ Al |
| Com. Ex. B-3 | HI | IL | HT-1 | HT-2 | EM-3 | Compound (2-2619) | ET-1 | ET-2 + Liq | LitF/ Al |

TABLE B4

| | Light emitting layer Host | Dopant | Wave-length (nm) | Voltage (V) | External quantum efficiency (%) | Life-time (hr) |
|---|---|---|---|---|---|---|
| Ex. B-16 | Compound (1-82) | Compound (2-2619) | 462 | 4.0 | 8.1 | 220 |
| Ex. 3-17 | Compound (1-52) | Compound (2-2619) | 463 | 4.0 | 8.1 | 120 |
| Ex. B-18 | Compound (1-55) | Compound (2-2619) | 464 | 4.0 | 7.7 | 160 |
| Ex. B-19 | Compound (1-85) | Compound (2-2619) | 464 | 4.2 | 7.7 | 240 |
| Ex. 3-20 | Compound (1-12) | Compound (2-2619) | 467 | 3.9 | 7.3 | 450 |
| Ex. 3-21 | Compound (1-57) | Compound (2-2619) | 464 | 4.1 | 7.7 | 150 |
| Ex. 3-22 | Compound (1-102) | Compound (2-2619) | 463 | 4.1 | 7.4 | 50 |
| Ex. B-23 | Compound (1-166) | Compound (2-2619) | 462 | 4.0 | 7.9 | 40 |
| Com. Ex. B-3 | EM-3 | Compound (2-2619) | 510 | 5.4 | 0.8 | 15 |

Example B-16

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Chosyu Industry Co., Ltd.), and a vapor deposition boats made of tantalum and containing HI, IL, HT-1, HT-2, compound (1-82), compound (2-2619), ET-1, and ET-2 respectively, a vapor deposition boats made of aluminum nitride and containing Liq, LiF and aluminum respectively, were mounted in the apparatus.

Various layers as described below were formed sequentially on the ITO film of the transparent supporting substrate. The pressure in a vacuum chamber was reduced to $5\times10^{-4}$ Pa. First, HI was heated and vapor-deposited so as to have a film thickness of 40 nm. Subsequently, IL was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, Compound (1-82) and Compound (2-2619) were simultaneously heated and vapor-deposited so as to have a film thickness of 25 nm. Thus, a light emitting layer was formed. The vapor deposition rate was regulated such that a weight ratio between Compound (1-82) and Compound (2-2619) was approximately 98:2. Moreover, ET-1 was heated and vapor-deposited so as to have a film thickness of 5 nm. Subsequently, ET-2 and Liq was simultaneously heated and vapor-deposited so as to have a film thickness of 25 nm. Thus an electron transport layer formed of two layers was formed. The vapor deposition rate was regulated such that a weight ratio between ET-2 and Liq was approximately 50:50. Thereafter, LiF was heated and vapor-deposited so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/Al electrode as a negative electrode, and characteristics at the time of light emission at 1000 cd/m² were measured. Further, time (hr) to retain luminance of 90% or more of initial luminance was measured when being emitted at a current value of 10 mA/cm².

Examples B-17 to B-23 and Comparative Example B-3

Organic EL elements were produced according to Example B-16 except that the host material and the dopant material were changed to the materials described in the above table, and organic EL characteristics were measured in the same manner.

The material composition of each layer in the organic EL elements according to Examples C-1 to C-14 thus prepared is shown in Table C1, and EL characteristic data is shown in Table C2.

TABLE C1

| | Hole injection layer 1 (40 nm) | Hole injection layer 2 (5 nm) | Hole transport layer 1 (15 nm) | Hole transport layer 2 (10 nm) | Light emitting layer (25 nm) | | Electron transport layer 1 (5 nm) | Electron transport layer 2 (25 nm) | Negative electrode (1 nm/ 100 nm) |
|---|---|---|---|---|---|---|---|---|---|
| | | | | | Host | Dopant | | | |
| Ex. C-1 | HI | IL | HT-1 | HT-2 | Compound (1-2) | Compound (2-166) | ET-1 | ET-2 + Liq | LiF/ Al |
| Ex. C-2 | HI | IL | HT-1 | HT-2 | Compound (1-2) | Compound (2-170) | ET-1 | ET-2 + Liq | LiF/ Al |
| Ex. C-3 | HI | IL | HT-1 | HT-2 | Compound (1-2) | Compound (2-180) | ET-1 | ET-2 + Liq | LiF/ Al |
| Ex. C-4 | HI | IL | HT-1 | HT-2 | Compound (1-2) | Compound (2-200) | ET-1 | ET-2 + Liq | LiF/ Al |
| Ex. C-5 | HI | IL | HT-1 | HT-2 | Compound (1-2) | Compound (2-252) | ET-1 | ET-2 + Liq | LiF/ Al |
| Ex. C-6 | HI | IL | HT-1 | HT-2 | Compound (1-2) | Compound (2-296) | ET-1 | ET-2 + Liq | LiF/ Al |
| Ex. C-7 | HI | IL | HT-1 | HT-2 | Compound (1-2) | Compound (2-300) | ET-1 | ET-2 + Liq | LiF/ Al |
| Ex. C-8 | HI | IL | HT-1 | HT-2 | Compound (1-2) | Compound (2-2710) | ET-1 | ET-2 + Liq | LiF/ Al |
| Ex. C-9 | HI | IL | HT-1 | HT-2 | Compound (1-2) | Compound (2-2711) | ET-1 | ET-2 + Liq | LiF/ Al |
| E. C-10 | HI | IL | HT-1 | HT-2 | Compound (1-2) | Compound (2-2712) | ET-1 | ET-2 + Liq | LiF/ Al |
| Ex. C-11 | HI | IL | HT-1 | HT-2 | Compound (1-2) | Compound (2-2713) | ET-1 | ET-2 + Liq | LiF/ Al |
| Ex. C-12 | HI | IL | HT-1 | HT-2 | Compound (1-2) | Compound (2-301) | ET-1 | ET-2 + Liq | LiF/ Al |
| Ex. C-13 | HI | IL | HT-1 | HT-2 | Compound (1-2) | Compound (2-302) | ET-1 | ET-2 + Liq | LiF/ Al |
| Ex. C-14 | HI | IL | HT-I | HT-2 | Compound (1-2) | Compound (2-2714) | ET-1 | ET-2 + Liq | LiF/ Al |

TABLE C2

| | Light emitting layer | | Wave-length (nm) | Voltage (V) | External quantum efficiency (%) | Life-time (hr) |
|---|---|---|---|---|---|---|
| | Host | Dopant | | | | |
| Ex. C-1 | Compound (1-2) | Compound (2-166) | 462 | 3.7 | 8.4 | 149 |
| E. C-2 | Compound (1-2) | Compound (2-170) | 462 | 4.0 | 7.8 | 215 |
| Ex. C-3 | Compound (1-2) | Compound (2-180) | 463 | 3.7 | 7.4 | 153 |
| Ex. C-4 | Compound (1-2) | Compound (2-200) | 462 | 3.8 | 8.3 | 146 |
| Ex. C-5 | Compound (1-2) | Compound (2-252) | 461 | 4.0 | 7.6 | 200 |
| Ex. C-6 | Compound (1-2) | Compound (2-296) | 464 | 3.9 | 8.7 | 198 |
| Ex. C-7 | Compound (1-2) | Compound (2-300) | 462 | 3.7 | 7.5 | 160 |
| Ex. C-8 | Compound (1-2) | Compound (2-2710) | 464 | 3.6 | 7.9 | 182 |
| Ex. C-9 | Compound (1-2) | Compound (2-2711) | 472 | 3.6 | 8.0 | 100 |
| Ex. C-10 | Compound (1-2) | Compound (2-2712) | 458 | 3.9 | 7.6 | 160 |
| Ex. C-11 | Compound (1-2) | Compound (2-2713) | 463 | 3.7 | 8.1 | 155 |
| Ex. C-12 | Compound (1-2) | Compound (2-301) | 464 | 4.0 | 8.0 | 149 |
| Ex. C-13 | Compound (1-2) | Compound (2-302) | 458 | 4.1 | 7.5 | 165 |
| Ex. C-14 | Compound (1-2) | Compound (2-2714) | 457 | 4.0 | 7.8 | 250 |

Example C-1

A glass substrate (manufactured by Opto Science, Inc.) having a size of 26 mm×28 mm×0.7 mm, which was obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Showa Shinku Co., Ltd.), and a vapor deposition boats made of tantalum and containing HI, IL, HT-1, HT-2, compound (1-2), compound (2-166), ET-1, and ET-2 respectively, a vapor deposition boats made of aluminum nitride and containing Liq, LiF and aluminum respectively, were mounted in the apparatus.

Various layers as described below were formed sequentially on the ITO film of the transparent supporting substrate. The pressure in a vacuum chamber was reduced to $5\times10^{-4}$ Pa. First, HI was heated and vapor-deposited so as to have a film thickness of 40 nm. Subsequently, IL was heated and vapor-deposited so as to have a film thickness of 5 nm. Subsequently, HT-1 was heated and vapor-deposited so as to have a film thickness of 15 nm. Subsequently, HT-2 was heated and vapor-deposited so as to have a film thickness of 10 nm. Thus, a hole layer formed of four layers was formed. Subsequently, Compound (1-2) and Compound (2-166) were simultaneously heated and vapor-deposited so as to have a film thickness of 25 nm. Thus, a light emitting layer was formed. The vapor deposition rate was regulated such that a weight ratio between Compound (1-2) and Compound (2-166) was approximately 98:2. Moreover, ET-1 was heated and vapor-deposited so as to have a film thickness of 5 nm. Subsequently, ET-2 and Liq was simultaneously heated and vapor-deposited so as to have a film thickness of 25 nm. Thus an electron transport layer formed of two layers was formed. The vapor deposition rate was regulated such that a weight ratio between ET-2 and Liq was approximately 50:50. Thereafter, LiF was heated and vapor-deposited so as to have a film thickness of 1 nm. Subsequently, aluminum was heated and vapor-deposited so as to have a film thickness of 100 nm. Thus, a negative electrode was formed to obtain an organic EL element.

A direct current voltage was applied using an ITO electrode as a positive electrode and a LiF/Al electrode as a negative electrode, and characteristics at the time of light emission at 1000 cd/$m^2$ were measured. Further, time (hr) to retain luminance of 90% or more of initial luminance was measured when being emitted at a current value of 10 mA/$cm^2$.

Examples C-2 to C-14

Organic EL elements were produced according to Example C-1 except that the host material and the dopant material were changed to the materials described in the above table, and organic EL characteristics were measured in the same manner.

As described above, some of the compounds according to the present invention have been evaluated as organic EL element materials and shown to be excellent organic device materials. However other compounds not evaluated have the same basic skeleton and have a similar structure as a whole, and a skilled person can be understood that they are an excellent organic device material too.

In the present invention, a group represented by the formula (Ar-1) to the formula (Ar-12) is bonded to the structure represented by the formula (1) directly or via a group represented by the formula (Z-2) to the formula (Z-6), so that the above-mentioned specific effects are obtained. It can be understood that the above-mentioned effects cannot be obtained by using only the structural portion represented by the formula (1), such as comparative compounds EM-1 to EM-3. In addition, it is also difficult to find a compound that exhibits the above-mentioned effects from among compounds derived from structures represented by formulas (Ar-1) to (Ar-12).

INDUSTRIAL APPLICABILITY

According to a preferred embodiment of the present invention, an organic EL element having one or more excellent quantum efficiency and element lifetime can be provided by producing an organic EL element using a material for an emission layer containing a polycyclic aromatic compound represented by the formula (1), especially containing at least one of a polycyclic aromatic compound represented by the formula (2) and a multimer of a polycyclic aromatic compound having a plurality of structures represented by the formula (2) capable obtaining optimum light emission characteristics in combination with a polycyclic aromatic compound represented by the formula (1).

REFERENCE NUMERALS OF FIGURES

100 Organic electroluminescent element
101 Substrate
102 Positive electrode
103 Hole injection layer
104 Hole transport layer
105 Light emitting layer
106 Electron transport layer
107 Electron injection layer
108 Negative electrode

The invention claimed is:

1. A polycyclic aromatic compound represented by the following formula (1):

(1)

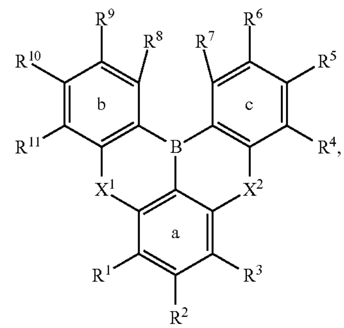

wherein in the above formula (1), $X^1$ and $X^2$ each independently represent O, S or Se, $R^1$, $R^2$, $R^3$, $R^4$, $R^5$, $R^6$, $R^7$, $R^8$, $R^9$, $R^{10}$, and $R^{11}$ each independently represents a hydrogen atom, an alkyl, or an aryl optionally substituted by an alkyl, adjacent groups of $R^1$ to $R^{11}$ may be bonded to each other to form an aryl ring together with ring a, ring b, or ring c, at least one hydrogen atom in the aryl ring thus formed may be substituted by an alkyl, at least one of $R^1$ to $R^{11}$ each independently represent a group represented by the following formula (Z-1), (Z-2), (Z-3), (Z-4), (Z-5), or (Z-6):

(Z-1)

*—Ar (Z-2)

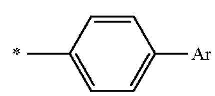

(Z-3)

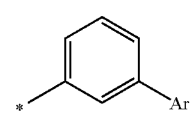

(Z-4)

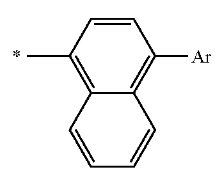

(Z-5)

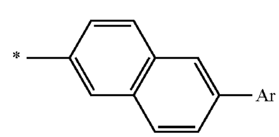

(Z-6)

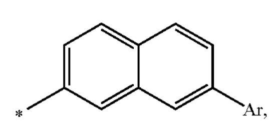

the group represented by each of the above formulas (Z-1) to (Z-6) is bonded to the compound represented by the above formula (1) at * in each of the formulas, Ar's in the above formulas (Z-1) to (Z-6) each independently represent a group represented by the following formula (Ar-1), (Ar-2), (Ar-3), (Ar-4), (Ar-5), (Ar-6), (Ar-7), (Ar-8), (Ar-9), (Ar-10), (Ar-11), or (Ar-12):
(Ar-1)
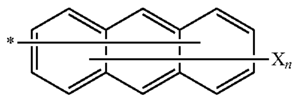
(Ar-2)
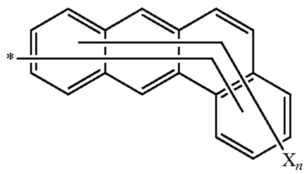
(Ar-3)
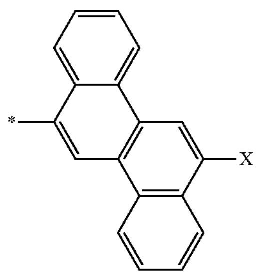
(Ar-4)
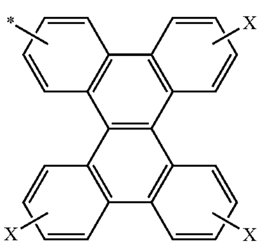
(Ar-5)
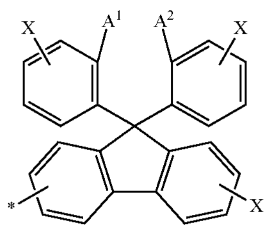
(Ar-6)
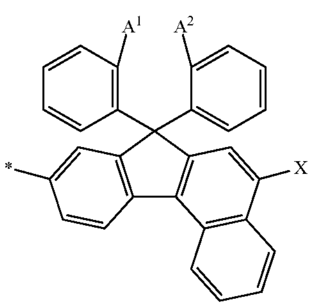
-continued
(Ar-7)
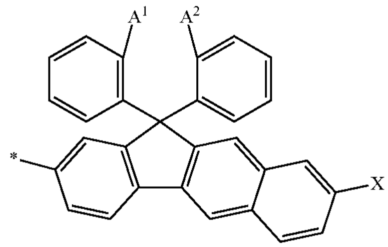
(Ar-8)
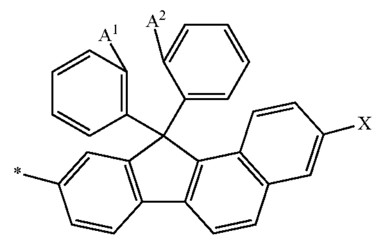
(Ar-9)
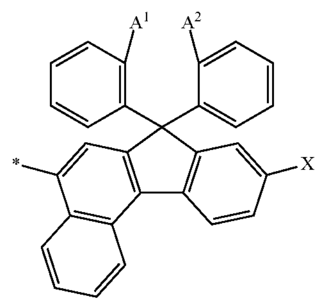
(Ar-10)
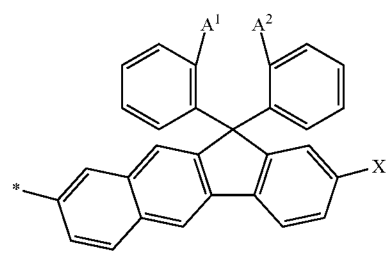
(Ar-11)
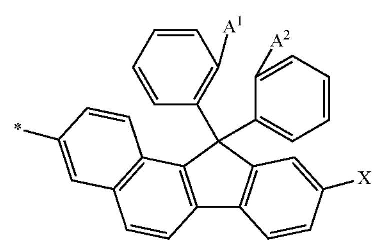
(Ar-12)
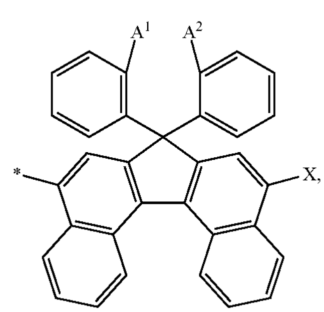

the group represented by each of the above formulas (Ar-1) to (Ar-12) is bonded to the group represented by each of the above formulas (Z-1) to (Z-6) at * in each of the formulas, in the above formulas (Ar-1) to (Ar-12), X's each independently represent a hydrogen atom, an alkyl having 1 to 4 carbon atoms, an aryl having 6 to 18 carbon atoms optionally substituted by an alkyl having 1 to 4 carbon atoms, or a heteroaryl having 2 to 18 carbon atoms optionally substituted by an alkyl having 1 to 4 carbon atoms, $A^1$ and $A^2$ both represent hydrogen atoms or may be bonded to each other to form a spiro ring, "—Xn" in formulas (Ar-1) and (Ar-2) indicates that nX's are each independently bonded to an arbitrary position, n represents an integer of 1 to 4, and at least one hydrogen atom in the compound represented by the above formula (1) may be substituted by a deuterium atom.

2. The polycyclic aromatic compound according to claim 1, wherein in the above formula (1), $X^1$ and $X^2$ each independently represent O, S or Se, $R^1$ to $R^{11}$ each independently represent a hydrogen atom, an alkyl having 1 to 12 carbon atoms, or an aryl having 6 to 24 carbon atoms optionally substituted by an alkyl having 1 to 12 carbon atoms, adjacent groups of $R^1$ to $R^{11}$ may be bonded to each other to form an aryl ring having 10 to 20 carbon atoms together with ring a, ring b, or ring c, at least one hydrogen atom in the aryl ring thus formed may be substituted by an alkyl having 1 to 12 carbon atoms, one or two of $R^1$ to $R^{11}$ each independently represent a group represented by the above formula (Z-1), (Z-2), (Z-3), (Z-4), (Z-5), or (Z-6), Ar's in the above formulas (Z-1) to (Z-6) each independently represent a group represented by the above formula (Ar-1), (Ar-2), (Ar-3), (Ar-4), (Ar-5), (Ar-6), (Ar-7), (Ar-8), (Ar-9), (Ar-10), (Ar-11), or (Ar-12), in the above formulas (Ar-1) to (Ar-12), X's each independently represent a hydrogen atom, an alkyl having 1 to 4 carbon atoms, an aryl having 6 to 18 carbon atoms optionally substituted by an alkyl having 1 to 4 carbon atoms, or a heteroaryl having 4 to 16 carbon atoms optionally substituted by an alkyl having 1 to 4 carbon atoms, $A^1$ and $A^2$ both represent hydrogen atoms or may be bonded to each other to form a spiro ring, "—Xn" in formulas (Ar-1) and (Ar-2) indicates that nX's are each independently bonded to an arbitrary position, n represents an integer of 1 to 4, and at least one hydrogen atom in the compound represented by the above formula (1) may be substituted by a deuterium atom.

3. The polycyclic aromatic compound according to claim 1, which is represented by any one of the following formulas:

(1-1)

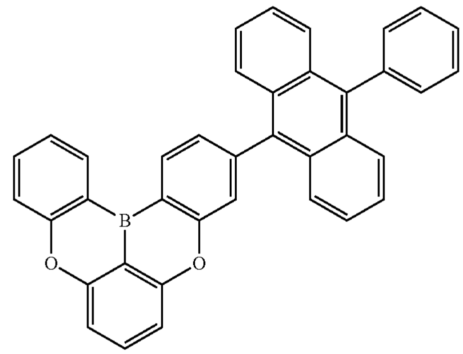

(1-2)

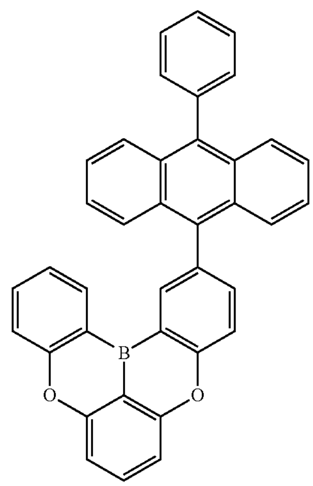

(1-4)

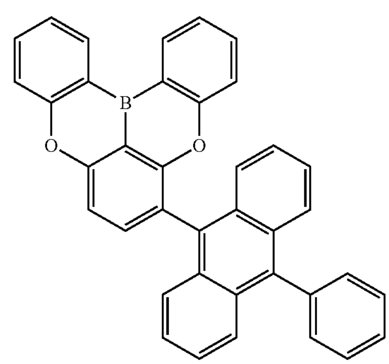

(1-3)

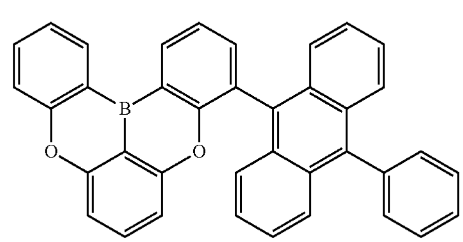

-continued
(1-5)
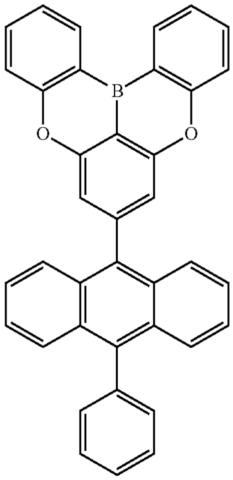
(1-121)
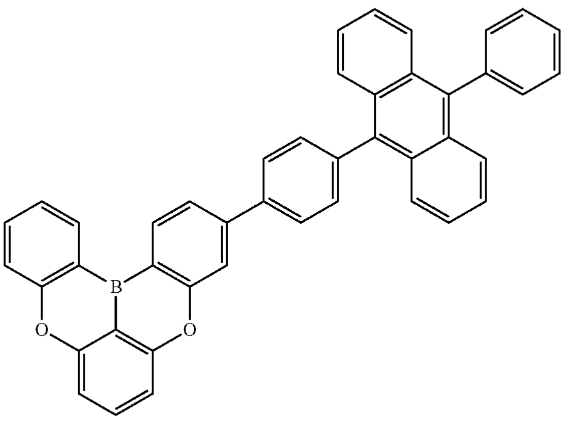
(1-122)
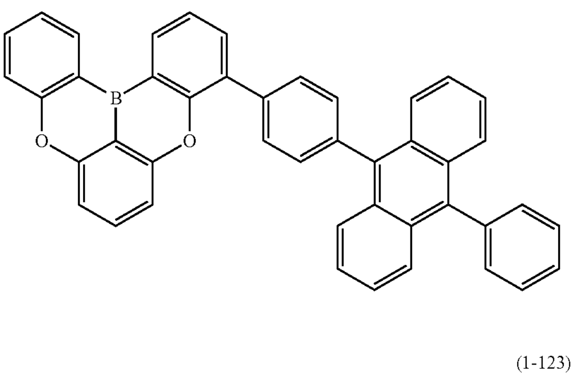
(1-123)
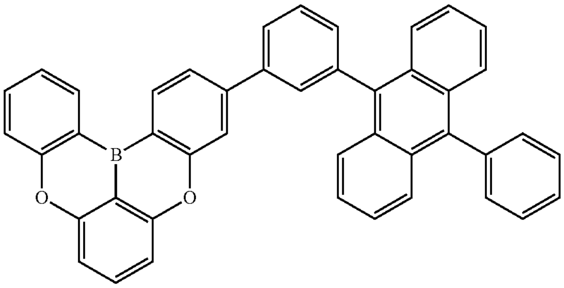
-continued
(1-124)
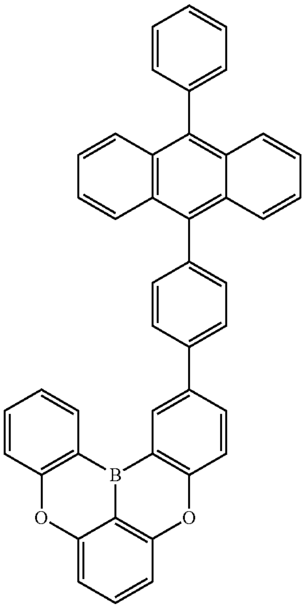
(1-144)
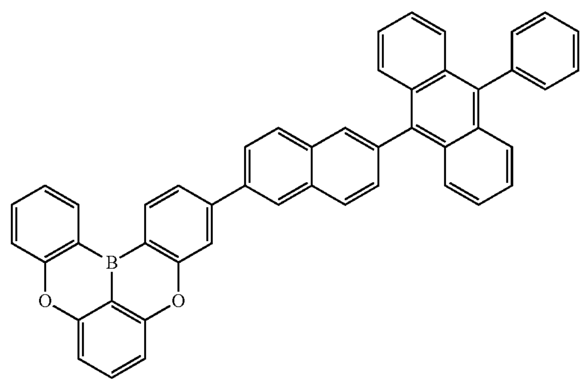
(1-145)
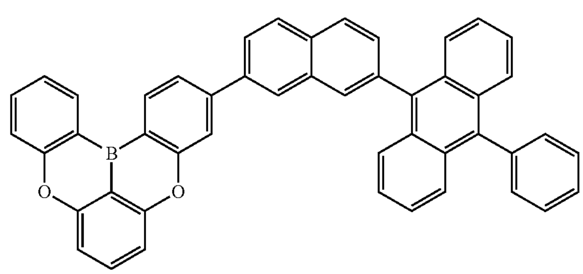

-continued
(1-146)
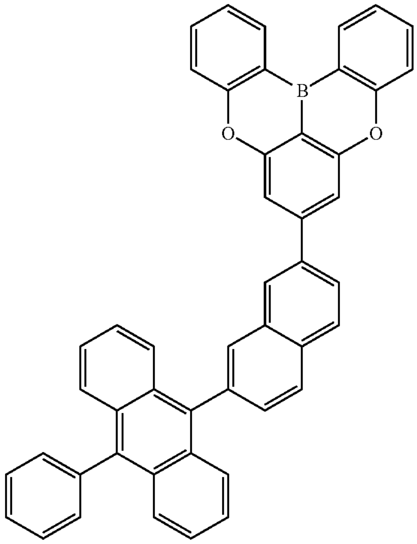
(1-147)
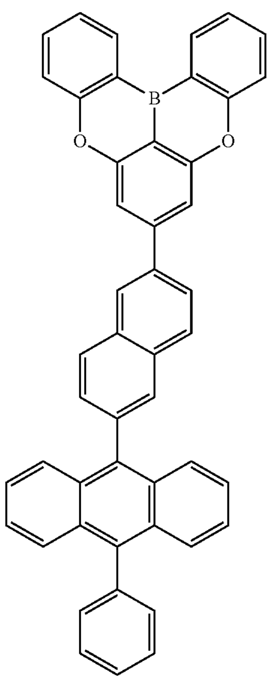
-continued
(1-148)
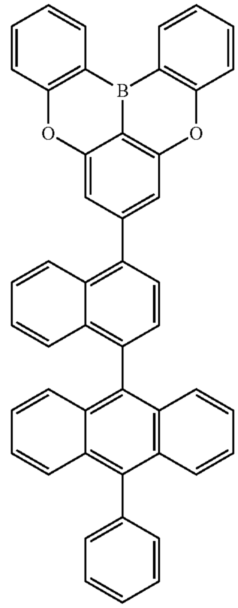
(1-156)
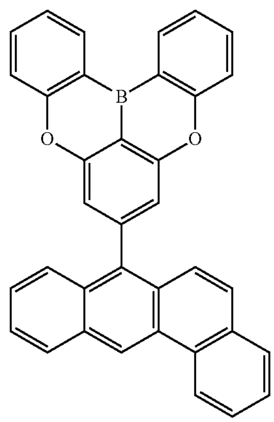
(1-174)
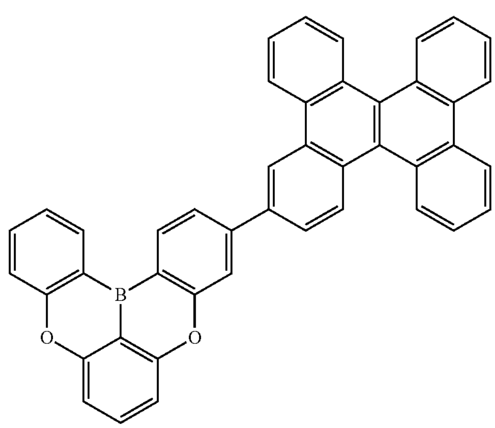

-continued
(1-191)
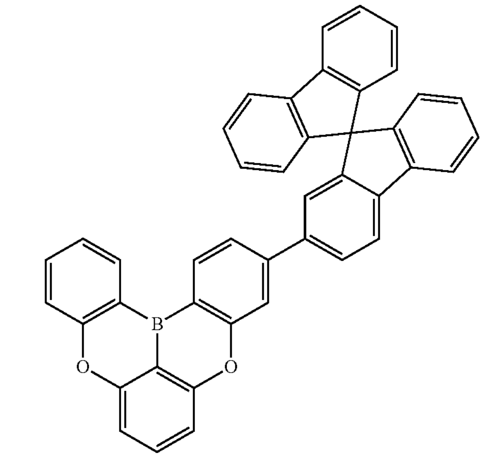
(1-198)
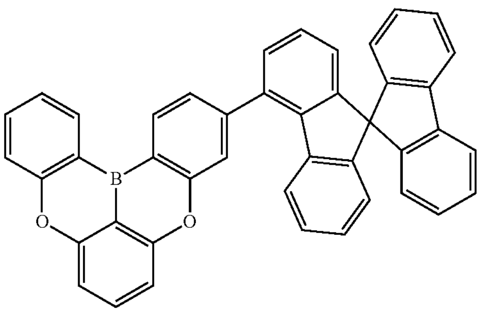
(1-221)
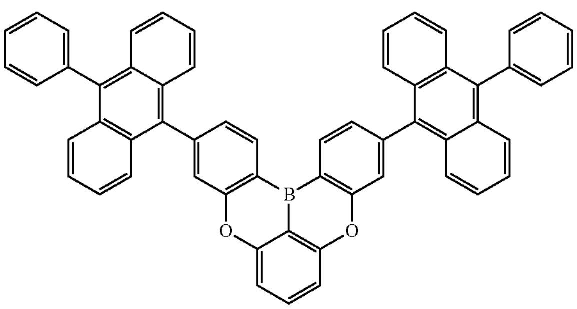
(1-12)
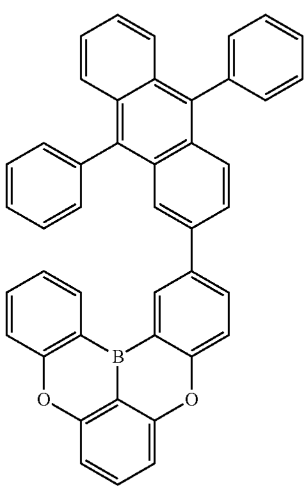
-continued
(1-46)
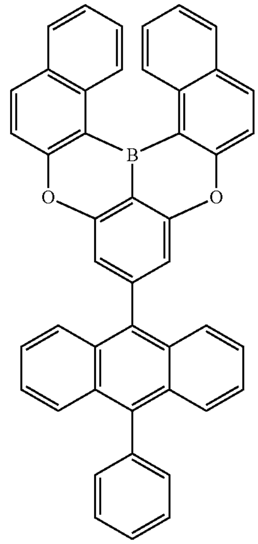
(1-52)
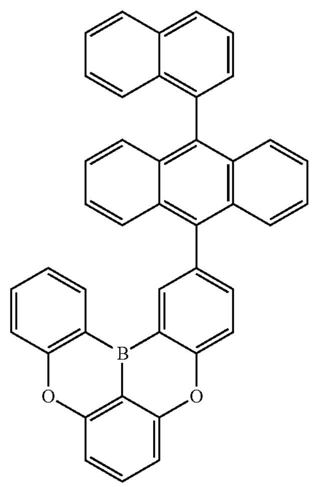
(1-55)
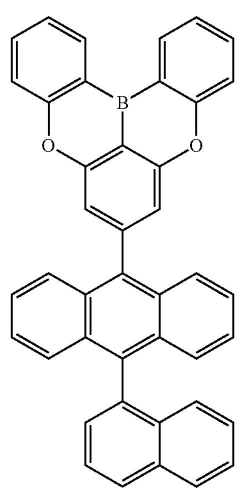

-continued
(1-57)
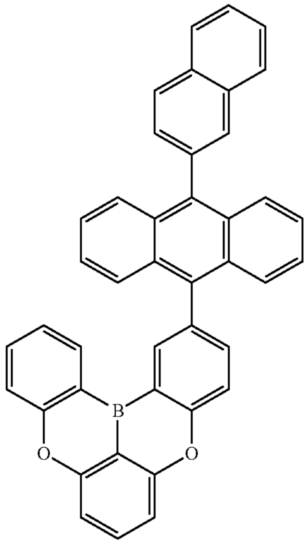
(1-82)
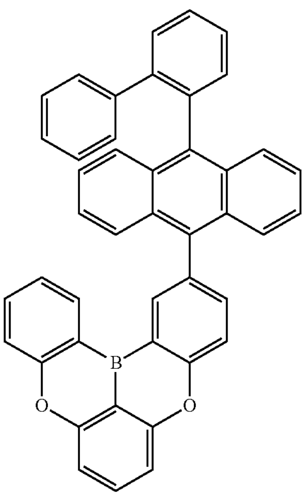
(1-85)
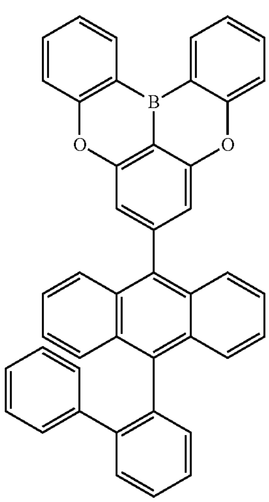
-continued
(1-102)
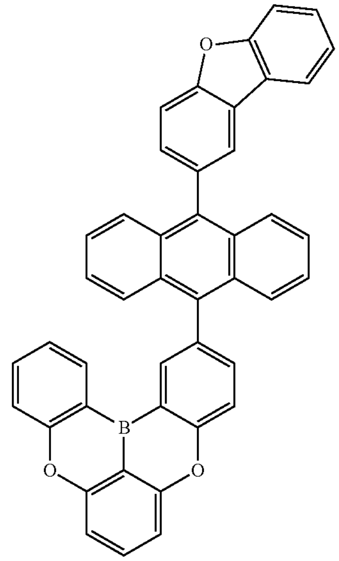
(1-166)
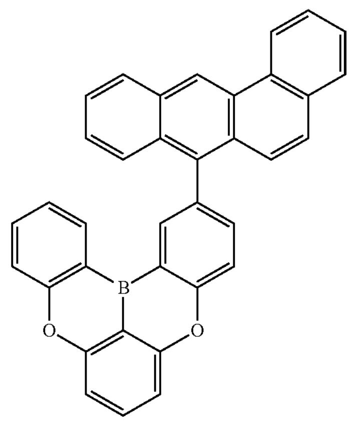
(1-182)
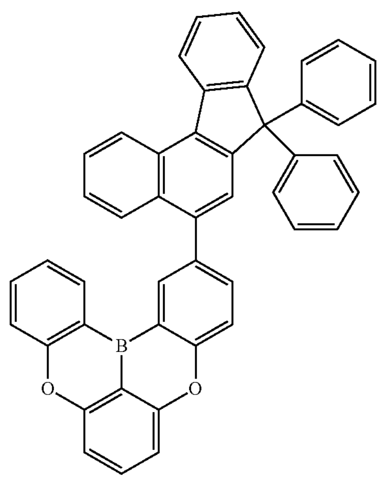
4. The polycyclic aromatic compound according to claim 1, wherein
in the above formula (1),
$X^1$ and $X^2$ each represent O,
$R^1$ to $R^{11}$ each independently represent a hydrogen atom, an alkyl having 1 to 6 carbon atoms, or an aryl having 6 to 18 carbon atoms optionally substituted by an alkyl having 1 to 6 carbon atoms, adjacent groups of $R^1$ to $R^{11}$ may be bonded to each other to form an aryl ring having 10 to 18 carbon atoms together with ring a, ring b, or ring c, at least one hydrogen atom in the aryl ring thus formed may be substituted by an alkyl having 1 to 6 carbon atoms, one or two of $R^1$ to $R^{11}$ each independently represent a group represented by the above formula (Z-1), (Z-2), (Z-3), (Z-4), (Z-5), or (Z-6), Ar's in the above formulas (Z-1) to (Z-6) each independently represent a group represented by the following formula (Ar-1-1), (Ar-1-2), (Ar-2-1), (Ar-2-2), (Ar-2-3), (Ar-3), (Ar-4-1), (Ar-5-1), (Ar-5-2), (Ar-5-3), (Ar-6), (Ar-7), (Ar-8), (Ar-9), (Ar-10), (Ar-11), or (Ar-12):

(Ar-1-1)

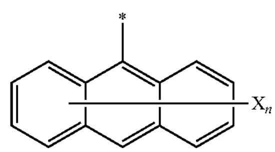

(Ar-1-2)

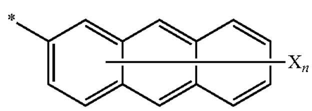

(Ar-3)

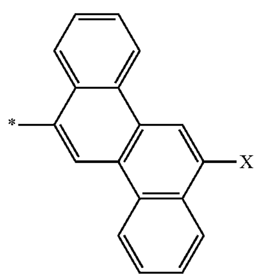

(Ar-2-1)

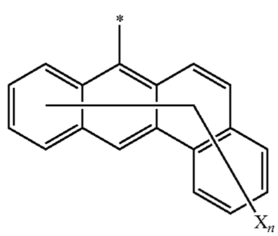

(Ar-2-2)

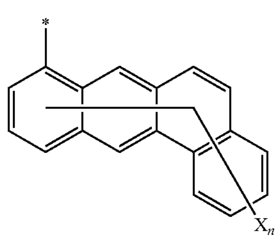

(Ar-2-3)

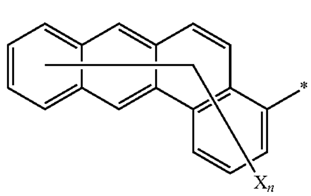

-continued (Ar-4-1)

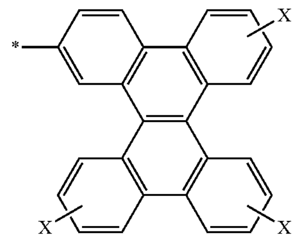

(Ar-5-1)

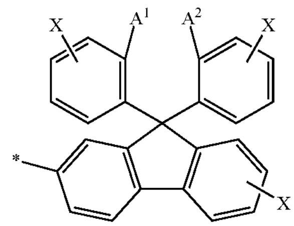

(Ar-5-2)

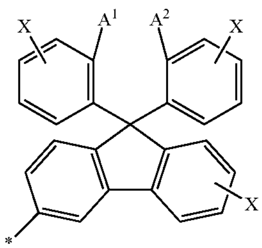

(Ar-5-3)

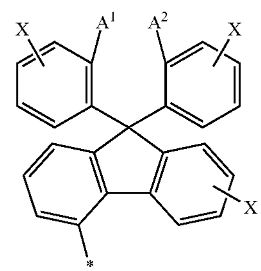

(Ar-6)

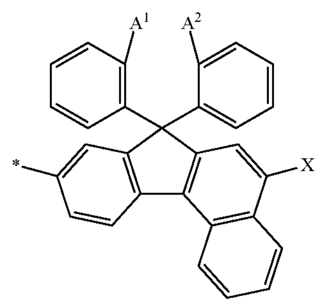

(Ar-7)

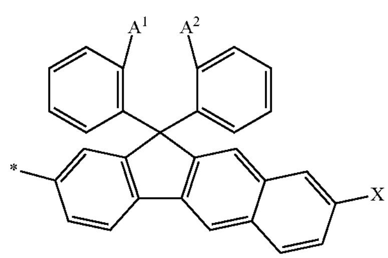

-continued (Ar-8)

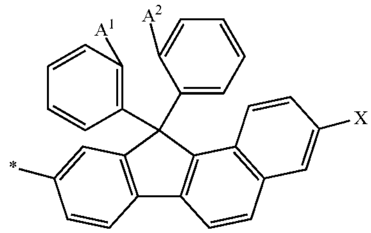

(Ar-9)

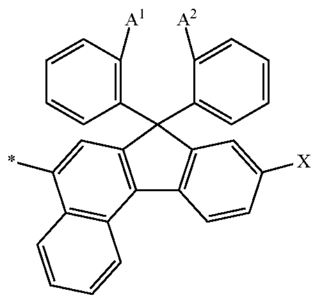

(Ar-10)

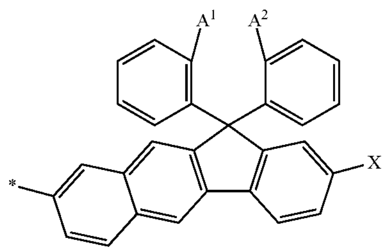

(Ar-11)

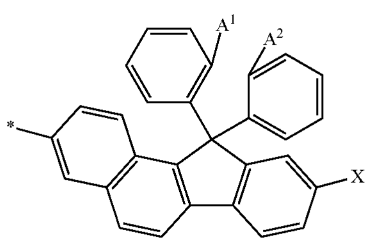

(Ar-12)

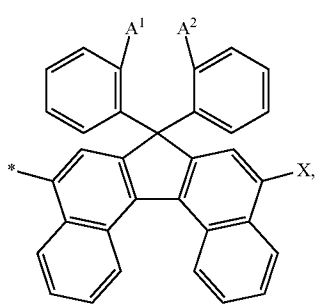

in the above formulas (Ar-1-1) to (Ar-12), X's each independently represent a hydrogen atom, an alkyl having 1 to 4 carbon atoms, or an aryl having 6 to 10 carbon atoms, $A^1$ and $A^2$ both represent hydrogen atoms or may be bonded to each other to form a spiro ring, "—Xn" in formulas (Ar-1-1), (Ar-1-2), (Ar-2-1), (Ar-2-2), and (Ar-2-3) indicates that nX's are each independently bonded to an arbitrary position, n represents an integer of 1 or 2.

5. A material for an organic device, comprising the polycyclic aromatic compound according to claim 1.

6. The material for an organic device according to claim 5, wherein the material for an organic device is a material for an organic electroluminescent element, a material for an organic field effect transistor, or a material for an organic thin film solar cell.

7. The material for an organic electroluminescent element according to claim 6, which is a material for a light emitting layer.

8. The material for a light emitting layer according to claim 7, wherein further comprising at least one of a polycyclic aromatic compound represented by the following general formula (2) and a multimer having a plurality of structures with each structure of the plurality of structures represented by the following general formula (2):

(2)

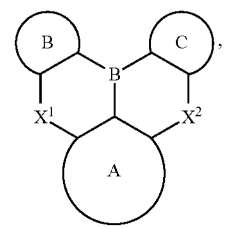

wherein

In the above formula (2), ring A, ring B and ring C each independently represent an aryl ring or a heteroaryl ring, while at least one hydrogen atom in these rings may be substituted, $X^1$ and $X^2$ each independently represent O or N—R, R of the N—R is an optionally substituted aryl, an optionally substituted heteroaryl or an optionally substituted alkyl, R of the N—R may be bonded to the ring A, ring B, and/or ring C with a linking group or a single bond, and at least one hydrogen atom in a compound or a structure represented by formula (2) may be substituted by a halogen atom, a cyano or a deuterium atom, wherein the multimer is in a form in which the plurality of unit structures each represented by the general formula (2) are bonded with a linking group, which is a single bond, an alkylene group having 1 to 3 carbon atoms, a phenylene group, or a naphthylene group; in a form in which the plurality of unit structures each represented by the general formula (2) are linked such that any ring contained in the unit structure is shared by the plural unit structures; or in a form in which the plurality of unit structures each represented by the general formula (2) are linked such that any rings contained in the unit structures are fused.

9. An organic electroluminescent element comprising: a pair of electrodes composed of a positive electrode and a negative electrode; and a light emitting layer disposed between the pair of electrodes and comprising the material for a light emitting layer according to claim 7.

10. The organic electroluminescent element according to claim 9, further comprising an electron transport layer and/or an electron injection layer disposed between the negative electrode and the light emitting layer, wherein at least one of the electron transport layer and the electron injection layer contains at least one selected from the group consisting of a borane derivative, a pyridine derivative, a fluoranthene derivative, a BO-based derivative, an anthracene derivative, a benzofluorene derivative, a phosphine oxide derivative, a pyrimidine derivative, a carbazole derivative, a triazine derivative, a benzimidazole derivative, a phenanthroline derivative, and a quinolinol-based metal complex.

11. The organic electroluminescent element according to claim 10, wherein the electron transport layer and/or electron injection layer further include/includes at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

12. A display apparatus comprising the organic electroluminescent element according to claim 9.

13. A lighting apparatus comprising the organic electroluminescent element according to claim 9.

* * * * *